US012615960B2

(12) United States Patent
Cho et al.

(10) Patent No.: US 12,615,960 B2
(45) Date of Patent: Apr. 28, 2026

(54) ORGANIC LIGHT-EMITTING DEVICE

(71) Applicant: SFC CO., LTD, Cheongju-si (KR)

(72) Inventors: Jin-hwi Cho, Cheongju-si (KR); Se-jin Yu, Cheongju-si (KR); So-young Shim, Cheongju-si (KR); Yong-woon Yang, Cheongju-si (KR)

(73) Assignee: SFC CO., LTD, Cheongju-si (KR)

(*) Notice: Subject to any disclaimer, the term of this patent is extended or adjusted under 35 U.S.C. 154(b) by 938 days.

(21) Appl. No.: 17/881,124

(22) Filed: Aug. 4, 2022

(65) Prior Publication Data

US 2023/0112324 A1 Apr. 13, 2023

(30) Foreign Application Priority Data

Aug. 5, 2021 (KR) ........................ 10-2021-0103046

(51) Int. Cl.

| | |
|---|---|
| ***H01L 51/54*** | (2006.01) |
| ***H10K 85/60*** | (2023.01) |
| *H10K 50/11* | (2023.01) |
| *H10K 50/16* | (2023.01) |

(52) U.S. Cl.

CPC ......... *H10K 85/615* (2023.02); *H10K 85/631* (2023.02); *H10K 85/654* (2023.02); *H10K 85/657* (2023.02); *H10K 85/6572* (2023.02); *H10K 85/6574* (2023.02); *H10K 85/6576* (2023.02); *H10K 50/11* (2023.02); *H10K 50/16* (2023.02)

(58) Field of Classification Search

None

See application file for complete search history.

(56) References Cited

U.S. PATENT DOCUMENTS

2019/0198766 A1* 6/2019 Suh ...................... H10K 85/654

FOREIGN PATENT DOCUMENTS

| | | | | |
|---|---|---|---|---|
| EP | 3 498 804 | A1 | 6/2019 | |
| KR | 10-2018-0103738 | A | 9/2018 | |
| KR | 10-2020-0034649 | A | 3/2020 | |
| KR | 10-2021-0015720 | A | 2/2021 | |
| KR | 10-2022-0042160 | A | 4/2022 | |
| KR | 10-2022-0100362 | A | 7/2022 | |
| WO | WO-2020060359 | A1 * | 3/2020 | ........... H10K 85/657 |
| WO | WO 2020/159275 | A1 | 8/2020 | |
| WO | WO 2020/231021 | A1 | 11/2020 | |
| WO | WO 2021/021840 | A1 | 2/2021 | |
| WO | WO 2021/107694 | A1 | 6/2021 | |

OTHER PUBLICATIONS

Machine translation of WO 2020/060359 (Year: 2020).*

Extended European search report issued on Jan. 12, 2023, in counterpart European Patent Application No. 22189000.7 (6 pages in English).

Third Party opinion issued on Oct. 6, 2023, in counterpart European Patent Application No. 22189000.7 (27 pages).

Korean Office Action Issued on Aug. 21, 2024, in Counterpart Korean Patent Application No. 10-2021-0103046 (2 Pages in English, 2 Pages in Korean).

* cited by examiner

*Primary Examiner* — Andrew K Bohaty

(74) *Attorney, Agent, or Firm* — NSIP Law

(57) ABSTRACT

Disclosed is an organic light-emitting device with high efficiency and long lifespan that uses an anthracene derivative having a characteristic structure as a host compound in a light-emitting layer of the organic light-emitting device and uses a compound having a characteristic structure as a compound for an electron transport layer.

20 Claims, No Drawings

ORGANIC LIGHT-EMITTING DEVICE

CROSS REFERENCE TO RELATED APPLICATIONS

This application claims the benefit under 35 U.S.C. § 119(a) of Korean Patent Application No. 10-2021-0103046 filed on Aug. 5, 2021 in the Korean Intellectual Property Office, the entire disclosures of which is incorporated herein by reference for all purposes.

BACKGROUND OF THE INVENTION

Field of the Invention

The present invention relates to an organic light-emitting device with high efficiency and long lifespan, and more specifically, to an organic light-emitting device with high efficiency and long lifespan that uses an anthracene derivative having a characteristic structure as a host compound in a light-emitting layer of the organic light-emitting device and uses a compound having a characteristic structure as a compound for an electron transport layer.

Description of the Related Art

An organic light-emitting device is a self-luminous device that emits light when energy is released from excitons which are formed by recombination of electrons injected from an electron injection electrode (cathode) and holes injected from a hole injection electrode (anode) in a light-emitting layer. Such an organic light-emitting device attracts a great deal of attention as a next-generation light source due to applicability to full-color flat panel light-emitting displays based on advantages such as low driving voltage, high luminance, wide viewing angle, and rapid response speed thereof.

In order for the organic light-emitting device to exhibit the characteristics, the structure of the organic layer in the organic light-emitting device should be optimized, and the material constituting each organic layer, namely, a hole injection material, a hole transport material, a light-emitting material, an electron transport material, an electron injection material, or an electron blocking material should be based on stable and efficient ingredients. However, there is a continuing need to develop organic layer structures and respective materials thereof for stable and efficient organic light-emitting devices.

In particular, the energy bandgap between the host and the dopant should be properly balanced so that holes and electrons can form excitons through stable electrochemical paths in order to obtain maximum efficiency of the light-emitting layer.

As such, there is a continuing need for the development of the structure of an organic light-emitting device capable of improving the luminous characteristics thereof and the development of novel materials supporting the structure.

SUMMARY OF THE INVENTION

Therefore, the present invention has been made in view of the above problems, and it is one object of the present invention to provide an organic light-emitting device with high efficiency and long lifespan that uses an anthracene derivative having a characteristic structure as a material for a light-emitting layer in combination with a material for an electron transport layer having a characteristic structure.

In accordance with the present invention, the above and other objects can be accomplished by the provision of an organic light-emitting device characterized in that:

(i) the organic light-emitting device includes a first electrode, a second electrode facing the first electrode, a light-emitting layer interposed between the first electrode and the second electrode, and at least one organic layer interposed between the second electrode and the light-emitting layer, wherein the organic layer includes an electron injection layer, an electron transport layer, or a layer capable of injecting and transporting electrons;

(ii) the light-emitting layer includes at least one selected from compounds represented by the following [Formula A]; and (iii) the electron injection layer, the electron transport layer, or the layer capable of injecting and transporting electrons includes at least one selected from compounds represented by the following [Formula B] to [Formula D]:

[Formula A]

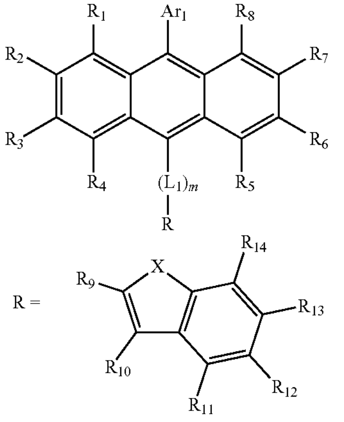

[Formula B]

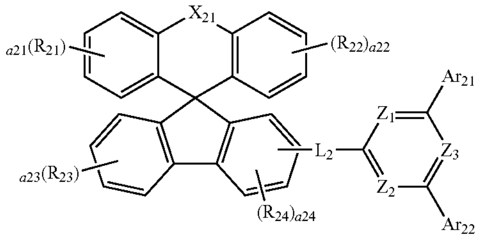

[Formula C]

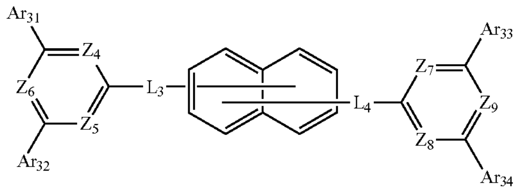

[Formula D]

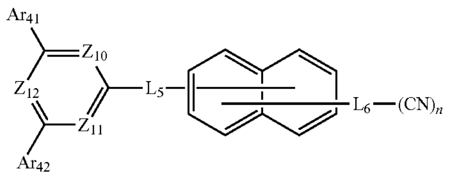

Structures and substituents of [Formula A] to [Formula D], specific compounds thereof, and an organic light-emitting device including the same will be described later.

DETAILED DESCRIPTION OF THE INVENTION

Hereinafter, the present invention will be described in detail with reference to the annexed drawings.

The organic light-emitting device according to the present invention includes a first electrode, a second electrode facing the first electrode, a light-emitting layer interposed between the first electrode and the second electrode, and at least one organic layer interposed between the second electrode and the light-emitting layer, wherein the organic layer includes an electron injection layer, an electron transport layer, or a layer capable of injecting and transporting electrons.

In the organic light-emitting device according to the present invention, the light-emitting layer includes at least one selected from compounds represented by the following [Formula A]:

[Formula A]

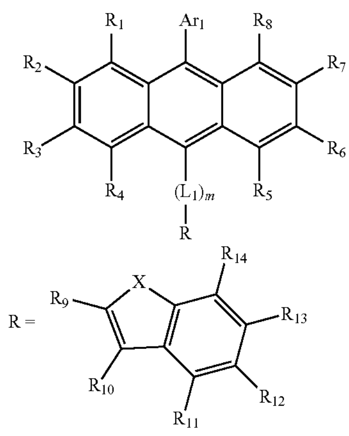

wherein $L_1$ is a divalent linker and is a single bond or is selected from a substituted or unsubstituted C6-C50 arylene group, a substituted or unsubstituted C2-C50 heteroarylene group, and a substituted or unsubstituted C3-C50 mixed aliphatic-aromatic ring group;

m is an integer from 1 to 3, provided that when m is 2 or more, a plurality of $L_1$ are identical to or different from each other;

X is an oxygen atom (0) or a sulfur atom (S);

$Ar_1$ is selected from a substituted or unsubstituted C6-C50 aryl group, a substituted or unsubstituted C2-C50 heteroaryl group, and a substituted or unsubstituted C3-C50 mixed aliphatic-aromatic ring group; and $R_1$ to $R_{14}$ are identical to or different from each other, and are each independently hydrogen, deuterium, a substituted or unsubstituted C1-C30 alkyl group, a substituted or unsubstituted C6-C50 aryl group, a substituted or unsubstituted C2-C30 alkenyl group, a substituted or unsubstituted C2-C30 alkynyl group, a substituted or unsubstituted C3-C30 cycloalkyl group, a substituted or unsubstituted C3-C30 cycloalkenyl group, a substituted or unsubstituted C2-C50 heteroaryl group, a substituted or unsubstituted C2-C30 heterocycloalkyl group, a substituted or unsubstituted C1-C30 alkoxy group, a substituted or unsubstituted C6-C50 aryloxy group, a substituted or unsubstituted C1-C30 alkylthioxy group, a substituted or unsubstituted C6-C50 arylthioxy group, a substituted or unsubstituted amine group, a substituted or unsubstituted silyl group, a substituted or unsubstituted C3-C50 mixed aliphatic-aromatic ring group, a cyano group, a nitro group and a halogen group, with the proviso that any one of $R_9$ to $R_{14}$ is bonded to the linker $L_1$.

According to an embodiment of the present invention, the compound of [Formula A] may be represented by any one selected from the following [Formula A-1] to [Formula A-6]:

[Formula A-1]

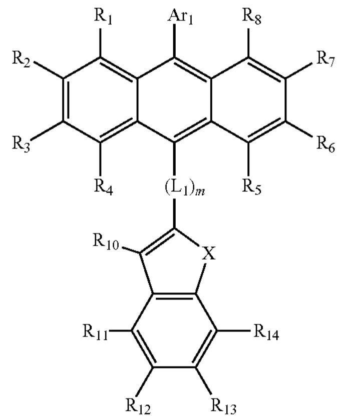

[Formula A-2]

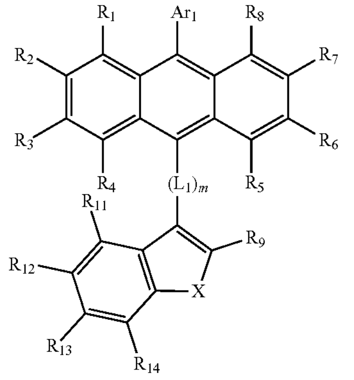

[Formula A-3]

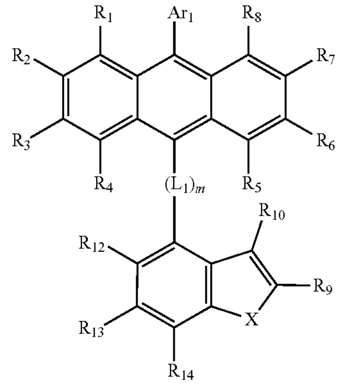

-continued

[Formula A-4]

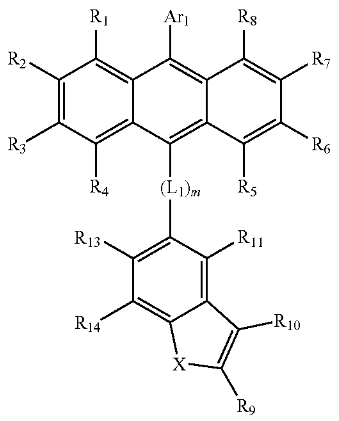

[Formula A-5]

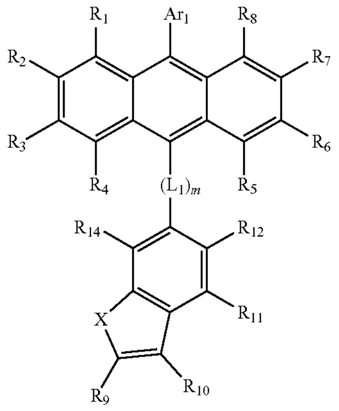

[Formula A-6]

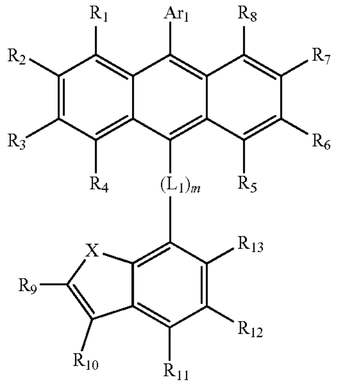

wherein $Ar_1$, $R_1$ to $R_{14}$, $L_1$, X and m are as defined in [Formula A] above.

The compound represented by [Formula A] according to the present invention has a structure including at least one benzofuran or benzothiophene, and is used as a host compound for a light-emitting layer of an organic light-emitting device based thereon. Therefore, it is possible to realize an organic light-emitting device having a high efficiency and long lifespan.

According to an embodiment of the present invention, each of the compounds represented by [Formula A-1] to [Formula A-6] includes at least one deuterium atom (D). That is, at least one of $Ar_1$, $R_1$ to $R_{14}$ and $L_1$ or substituents thereof in each of [Formula A-1] to [Formula A-6] is a deuterium atom (D).

According to one embodiment of the present invention, the degree of deuteration of each of the compounds represented by [Formula A-1] to [Formula A-6] is 10% or more, which means that 10% or more of the substituents introduced into the respective skeletons are deuterium.

In addition, according to an embodiment of the present invention, each of the compounds represented by [Formula A-1] to [Formula A-6] has a degree of deuteration of 30% or more.

In addition, according to an embodiment of the present invention, each of the compounds represented by [Formula A-1] to [Formula A-6] has a degree of deuteration of 50% or more.

At least one of $R_{11}$ to $R_{14}$ in each of the compounds represented by [Formula A-1] to [Formula A-6] of the present invention may be selected from a substituted or unsubstituted C6-C20 aryl group, a substituted or unsubstituted C3-C20 cycloalkyl group, and a substituted or unsubstituted C3-C20 heteroaryl group.

In addition, according to an embodiment of the present invention, at least one of $R_{11}$ to $R_{14}$ may be a deuterium-substituted or unsubstituted C6-C20 aryl group.

The organic light-emitting device according to the present invention further includes at least one organic layer interposed between the second electrode and the light-emitting layer, wherein the organic layer includes an electron injection layer, an electron transport layer, or a layer capable of injecting and transporting electrons, and the organic layer includes at least one compound represented by the following [Formula B] to [Formula D]:

[Formula B]

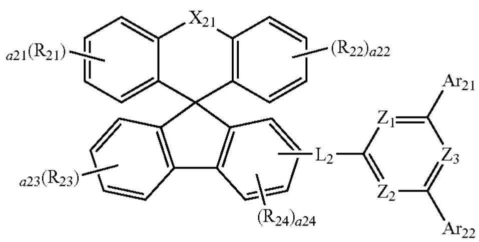

wherein $X_{21}$ is a single bond, or O or S, $R_{21}$ to $R_{24}$ are identical to or different from each other, and are each independently selected from hydrogen, deuterium, a substituted or unsubstituted C1-C30 alkyl group, a substituted or unsubstituted C6-C50 aryl group, a substituted or unsubstituted C2-C30 alkenyl group, a substituted or unsubstituted C2-C30 alkynyl group, a substituted or unsubstituted C3-C30 cycloalkyl group, a substituted or unsubstituted C3-C30 cycloalkenyl group, a substituted or unsubstituted C2-C50 heteroaryl group, a substituted or unsubstituted C2-C30 heterocycloalkyl group, a substituted or unsubstituted C1-C30 alkoxy group, a substituted or unsubstituted C6-C50 aryloxy group, a substituted or unsubstituted C1-C30 alkylthioxy group, a substituted or unsubstituted C6-C50 arylthioxy group, a substituted or unsubstituted amine group, a substituted or unsubstituted silyl group, a substituted or unsubstituted C3-C50 mixed aliphatic-aromatic ring group, a cyano group, a nitro group, and a halogen group, with the proviso that one or more of $R_{21}$ to $R_{24}$, which may be present in plural, are bonded to each other to further form an alicyclic or aromatic monocyclic or polycyclic ring, at least one carbon atom of which is substituted with at least one heteroatom selected from nitrogen, oxygen, and sulfur, $L_2$ is a single bond, a substituted or unsubstituted C6-C50 arylene group, or a substituted or unsubstituted C2-C50 heteroarylene group, $Z_1$ to $Z_3$ are each independently N or CR, with the proviso that at least one of $Z_1$ to $Z_3$ is N, wherein R's are identical to or different from each other, and are each independently hydrogen, a substituted or unsubstituted C1-C30 alkyl group, or a substituted or unsubstituted C2-C30 alkenyl group, or each R is bonded to $Ar_{21}$ or $Ar_{22}$ to form a substituted or unsubstituted aromatic hydrocarbon or a substituted or unsubstituted aromatic heterocycle, $Ar_{21}$ and $Ar_{22}$ are identical to or different from each other, and are each independently hydrogen, a substituted or unsubstituted C1-C30 alkyl group, a substituted or unsubstituted C2-C30 alkenyl group, a substituted or unsubstituted C2-C30 alkynyl group, a substituted or unsubstituted C6-C50 aryl group, a substituted or unsubstituted C2-C50 heteroaryl group, or are bonded to R to form a substituted or unsubstituted aromatic hydrocarbon or a substituted or unsubstituted aromatic heterocycle, $a_{21}$ to $a_{23}$ are integers from 0 to 4, provided that when $a_{21}$ to $a_{23}$ are 2 or more, a plurality of $R_{21}$ to $R_{23}$ are identical to or different from each other, and $a_{24}$ is an integer from 0 to 3, provided that when $a_{24}$ is 2 or more, a plurality of $R_{24}$ are identical to or different from each other,

[Formula C]

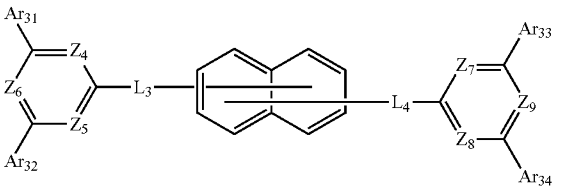

wherein at least one of $Z_4$ to $Z_6$ is N and the remainder is CH, and at least one of $Z_7$ to $Z_9$ is N and the remainder is CH, $L_3$ and $L_4$ are identical to or different from each other, and are each independently a single bond, a substituted or unsubstituted C6-C30 arylene group, or a substituted or unsubstituted C2-C30 heteroarylene group, $Ar_{31}$ to $Ar_{34}$ are identical to or different from each other, and are each independently a substituted or unsubstituted C6-C30 aryl group or a substituted or unsubstituted C2-C30 heteroaryl group,

[Formula D]

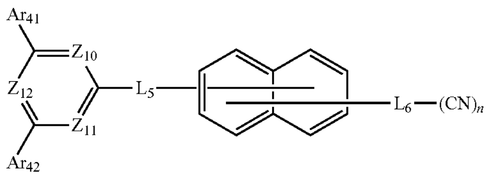

wherein at least one of $Z_{10}$ to $Z_{12}$ is N, and the remainder is CH, $L_5$ and $L_6$ are identical to or different from each other, and are each independently a single bond, a substituted or unsubstituted C6-C30 arylene group, or a substituted or unsubstituted C2-C30 heteroarylene group, $Ar_{41}$ and $Ar_{42}$ are identical to or different from each other, and are each independently a substituted or unsubstituted C6-C30 aryl group or a substituted or unsubstituted C2-C30 heteroaryl group, and n is 1 or 2.

In addition, in the organic light-emitting device according to the present invention, the light-emitting layer includes a host and a dopant, the compound represented by [Formula A] is used as the host, and the light-emitting layer may include a combination or stack of one of the host compound represented by [Formula A] and at least one additional host compound.

The light-emitting layer may also include a combination or stack of two or more different compounds.

In addition, as used in [Formula A], [Formula B], [Formula C], and [Formula D], the term "substituted" indicates substitution of various substituents defined in each of the formulas with one or more substituents selected from deuterium, a cyano group, a halogen group, a hydroxyl group, a nitro group, an alkyl group, a halogenated alkyl group, a cycloalkyl group, an alkenyl group, an alkynyl group, a heteroalkyl group, an aryl group, an arylalkyl group, an alkylaryl group, a heteroaryl group, a heteroarylalkyl group, an alkoxy group, an amine group, a silyl group, an aryloxy group and a mixed aliphatic-aromatic ring group, or substitution with a substituent including two or more of the substituents linked to each other. The term "unsubstituted" in the same definition indicates having no substituent.

In addition, the range of the number of the carbon atoms of the alkyl group or aryl group in the term "substituted or unsubstituted C1-C30 alkyl group", "substituted or unsubstituted C6-C50 aryl group" or the like refers to the total number of carbon atoms constituting the alkyl or aryl moiety when the corresponding group is not substituted without considering the number of carbon atoms in the substituent(s). For example, a phenyl group substituted at the para position with a butyl group corresponds to an aryl group having 6 carbon atoms substituted with a butyl group having 4 carbon atoms.

In addition, as used herein, the expression "a substituent is bonded to an adjacent substituent to form a ring" means that the corresponding substituent is bonded to the adjacent substituent to form a substituted or unsubstituted alicyclic or aromatic ring, and the term "adjacent substituent" may mean a substituent substituted for an atom which is directly attached to an atom substituted with the corresponding substituent, a substituent sterically disposed at the nearest position to the corresponding substituent, or another substituent substituted for an atom which is substituted with the corresponding substituent. For example, two substituents substituted at the ortho position in a benzene ring and two substituents substituted at the same carbon in the aliphatic ring may be considered "adjacent" to each other.

As used herein, the alkyl group may be a linear or branched alkyl group. Examples of the alkyl group include, but are not limited to, a methyl group, an ethyl group, a propyl group, an n-propyl group, an isopropyl group, a butyl group, an n-butyl group, an isobutyl group, a tert-butyl group, a sec-butyl group, a 1-methylbutyl group, a 1-ethylbutyl group, a pentyl group, an n-pentyl group, an isopentyl group, a neopentyl group, a tert-pentyl group, a hexyl group, an n-hexyl group, a 1-methylpentyl group, a 2-methylpentyl group, a 4-methyl-2-pentyl group, a 3,3-dimethylbutyl group, a 2-ethylbutyl group, a heptyl group, an n-heptyl group, a 1-methylhexyl group, a cyclopentylmethyl group, a cyclohexylmethyl group, an octyl group, an n-octyl group, a tert-octyl group, a 1-methylheptyl group, a 2-ethylhexyl group, a 2-propylpentyl group, an n-nonyl group, a 2,2-dimethylheptyl group, a 1-ethyl-propyl group, a 1,1-dimethyl-propyl group, an isohexyl group, a 2-methylpentyl group, a 4-methylhexyl group, a 5-methylhexyl group, and the like.

As used herein, the alkenyl group may include a linear or branched alkenyl group and may be further substituted with another substituent. Specifically, examples of the alkenyl group include, but are not limited to, a vinyl group, a 1-propenyl group, an isopropenyl group, a 1-butenyl group, a 2-butenyl group, a 3-butenyl group, a 1-pentenyl group, a 2-pentenyl group, a 3-pentenyl group, a 3-methyl-1-butenyl group, a 1,3-butadienyl group, an allyl group, a 1-phenylvinyl-1-yl group, a 2-phenylvinyl-1-yl group, a 2,2-diphenylvinyl-1-yl group, a 2-phenyl-2-(naphthyl-1-yl)vinyl-1-yl group, a 2,2-bis(diphenyl-1-yl)vinyl-1-yl group, a stilbenyl group, a styrenyl group, and the like.

As used herein, the alkynyl group may also include a linear or branched alkynyl group, and may be further substituted with another substituent, and examples of the substituent may include, but are not limited to, ethynyl, 2-propynyl, and the like.

As used herein, the aromatic hydrocarbon ring or the aryl group may be monocyclic or polycyclic, examples of the monocyclic aryl group include a phenyl group, a biphenyl group, a terphenyl group, a stilbene group, and the like, and examples of the polycyclic aryl group include, but are not limited to, a naphthyl group, an anthracenyl group, a phenanthrenyl group, a pyrenyl group, a perylenyl group, a tetracenyl group, a chrysenyl group, a fluorenyl group, an acenaphthcenyl group, a triphenylene group, a fluoranthene group, and the like, but the scope of the present invention is not limited thereto.

As used herein, the aromatic heterocyclic or heteroaryl group is an aromatic ring containing at least one heteroatom and examples thereof include, but are not limited to, thiophene, furan, pyrrole, imidazole, triazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phthalazinyl, pyridopyrimidinyl, pyridopyrazinyl, pyrazinopyrazinyl, isoquinoline, indole, carbazole, benzoxazole, benzimidazole, benzothiazole, benzocarbazole, benzothiophene, dibenzothiophene, benzofuranyl, dibenzofuranyl, phenanthroline, thiazolyl, isoxazolyl, oxadiazolyl, thiadiazolyl, benzothiazolyl, and phenothiazinyl groups and the like.

As used herein, the aliphatic hydrocarbon ring refers to a non-aromatic ring that contains only carbon and hydrogen atoms, for example, includes a monocyclic or polycyclic ring, and may be further substituted with another substituent. The term "polycyclic" means that the polycyclic group may be directly attached to or fused with at least one other cyclic group, the other cyclic group may be an aliphatic hydrocarbon ring, or a different type of ring group, for example, an aliphatic heterocyclic group, an aryl group, a heteroaryl group, and the like. Specifically, examples thereof include, but are not limited to, cycloalkyls such as a cyclopropyl group, a cyclobutyl group, a cyclopentyl group, an adamantyl group, a 3-methylcyclopentyl group, a 2,3-dimethylcyclopentyl group, a cyclohexyl group, a 3-methylcyclohexyl group, a 4-methylcyclohexyl group, a 2,3-dimethylcyclohexyl group, a 3,4,5-trimethylcyclohexyl group, a 4-tert-butylcyclohexyl group, a cycloheptyl group, and a cyclooctyl group, cycloalkanes such as cyclohexane and cyclopentane, and cycloalkenes such as cyclohexene and cyclobutene.

As used herein, the aliphatic heterocyclic ring refers to an aliphatic ring that contains at least one of heteroatoms such as O, S, Se, N and Si, also includes a monocyclic or polycyclic ring, and may be further substituted with another substituent. The term "polycyclic" means that the polycyclic group may be directly attached to or fused with at least one other cyclic group, and the other cyclic group may be an aliphatic hydrocarbon ring, or a different type of ring group, for example, an aliphatic heterocyclic group, an aryl group, a heteroaryl group, or the like.

As used herein, the mixed aliphatic-aromatic ring group refers to a ring in which two or more rings are attached to and fused with each other, and aliphatic and aromatic rings are fused together to be overall non-aromatic, and a polycyclic mixed aliphatic-aromatic ring may contain a heteroatom selected from N, O, P and S, in addition to C.

As used herein, specifically, the alkoxy group may be methoxy, ethoxy, propoxy, isobutyloxy, sec-butyloxy, pentyloxy, iso-amyloxy, hexyloxy, or the like, but is not limited thereto.

As used herein, the silyl group is represented by $-SiH_3$, and may be an alkylsilyl group, an arylsilyl group, an alkylarylsilyl group, an arylheteroarylsilyl group, or the like, and specific examples of the silyl group include trimethylsilyl, triethylsilyl, triphenylsilyl, trimethoxysilyl, dimethoxyphenylsilyl, diphenylmethylsilyl, diphenylvinylsilyl, methylcyclobutylsilyl, dimethylfurylsilyl, and the like.

As used herein, the amine group is represented by $-NH_2$, or may be an alkylamine group, an arylamine group, an arylheteroarylamine group, or the like. The arylamine group refers to amine substituted with aryl, the alkylamine group refers to amine substituted with alkyl, and the arylheteroarylamine group refers to an amine substituted with aryl and heteroaryl. For example, the arylamine group includes a substituted or unsubstituted monoarylamine group, a substituted or unsubstituted diarylamine group, or a substituted or unsubstituted triarylamine group. The aryl group and the heteroaryl group in the arylamine group and the arylheteroarylamine group may be a monocyclic aryl group or a monocyclic heteroaryl group, or a polycyclic aryl group or a polycyclic heteroaryl group. The arylamine group and the arylheteroarylamine group that contain two or more aryl groups and two or more heteroaryl groups, respectively, include a monocyclic aryl group (heteroaryl group), a polycyclic aryl group (heteroaryl group), or both of the monocyclic aryl group (heteroaryl group) and the polycyclic aryl group (heteroaryl group). In addition, the aryl group and the heteroaryl group in the arylamine group and the arylheteroarylamine group may be selected from examples of aryl groups and heteroaryl groups described above.

As used herein, examples of the aryl group in the aryloxy group and the arylthioxy group are the same as examples of the aryl group described above and specifically, examples of the aryloxy group include a phenoxy group, a p-tolyloxy group, an m-tolyloxy group, a 3,5-dimethylphenoxy group, a 2,4,6-trimethylphenoxy group, a p-tert-butylphenoxy group, a 3-biphenyloxy group, a 4-biphenyloxy group, a 1-naphthyloxy group, a 2-naphthyloxy group, a 4-methyl-1-naphthyloxy group, a 5-methyl-2-naphthyloxy group, a 1-anthryloxy group, a 2-anthryloxy group, a 9-anthryloxy group, a 1-phenanthryloxy group, a 3-phenanthryloxy group, a 9-phenanthryloxy group, and the like, and examples of the arylthioxy group include, but are not limited to, a phenylthioxy group, a 2-methylphenylthioxy group, a 4-tert-butylphenylthioxy group, and the like.

In the present invention, examples of the halogen group include fluorine, chlorine, bromine, and iodine.

The compound represented by [Formula A] contained in the light-emitting layer in the organic light-emitting device according to the present invention is selected from compounds represented by the following [A-1] to [A-218], but is not limited thereto.

A-1

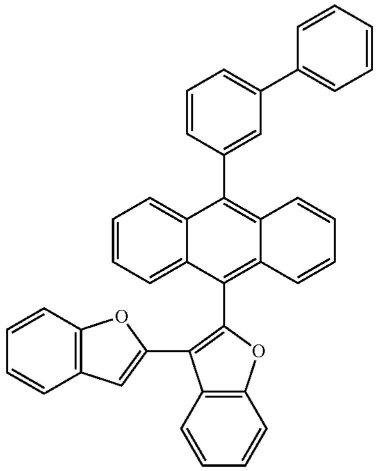

A-2

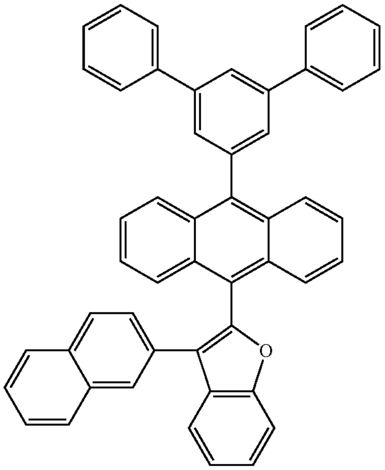

A-3

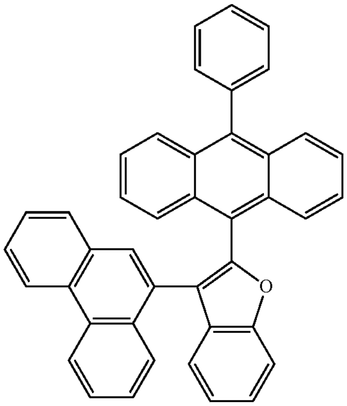

-continued

A-4

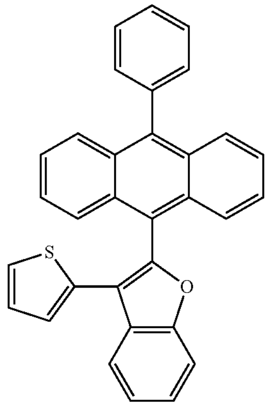

A-5

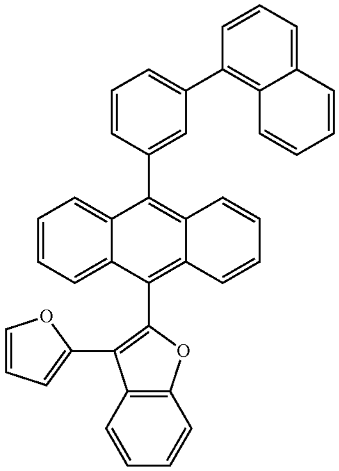

A-6

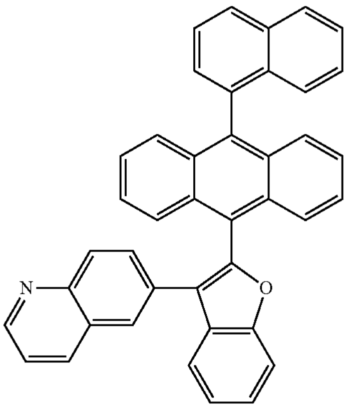

-continued
A-7
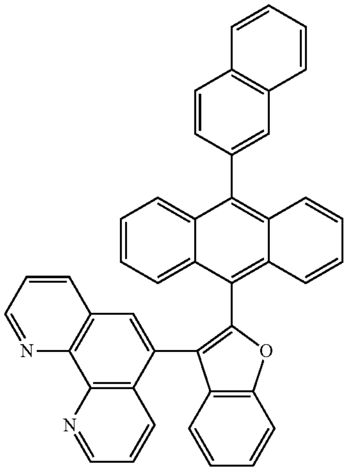
A-8
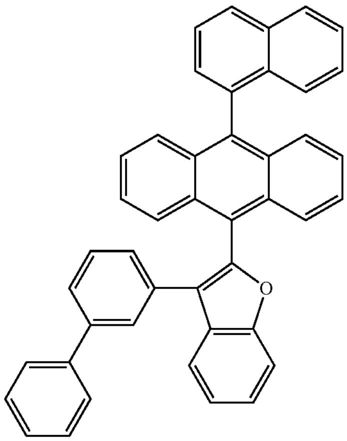
A-9
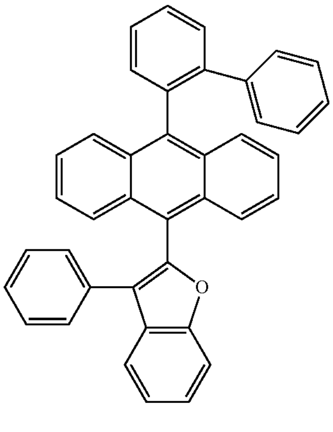
-continued
A-10
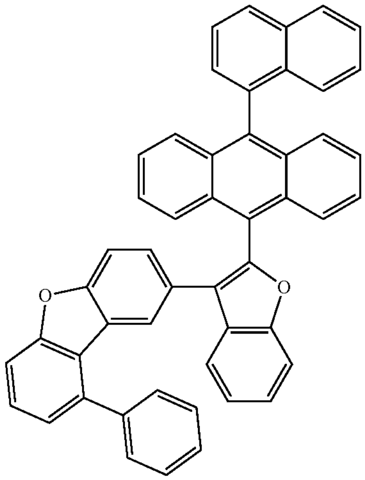
A-11
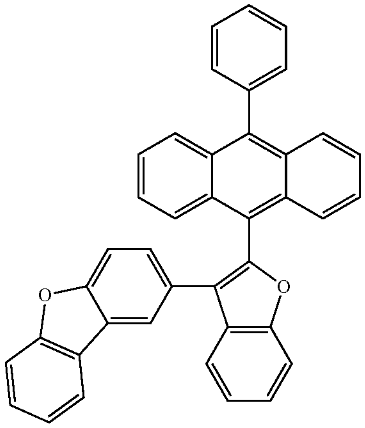
A-12
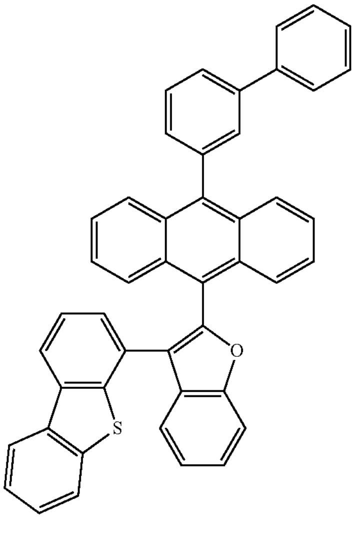

-continued
A-13
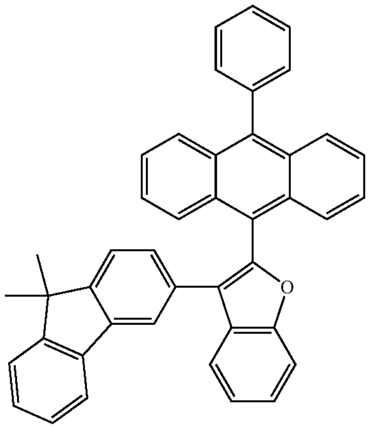
A-14
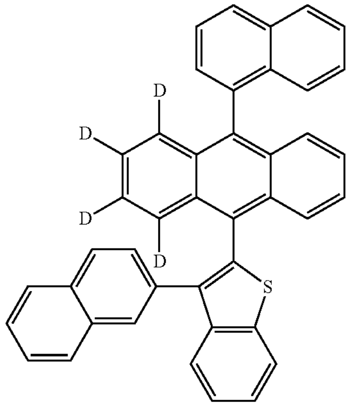
A-15
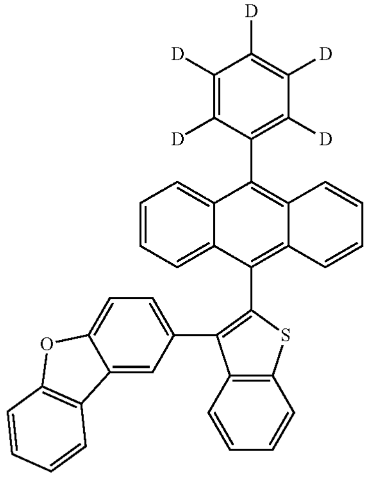
-continued
A-16
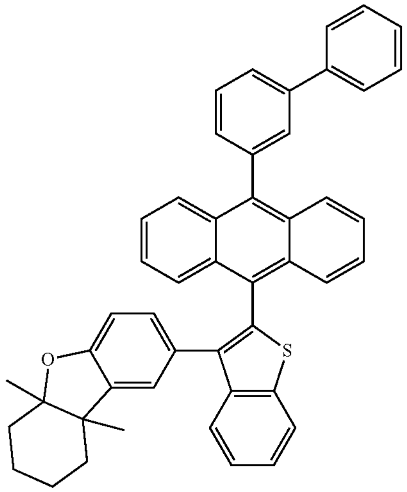
A-17
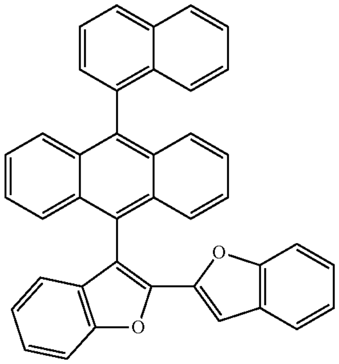
A-18
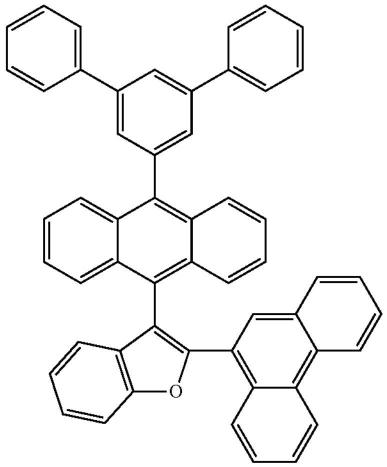

-continued
A-19
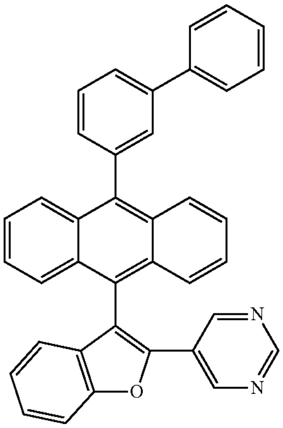
A-20
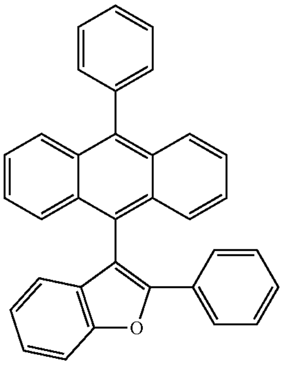
A-21
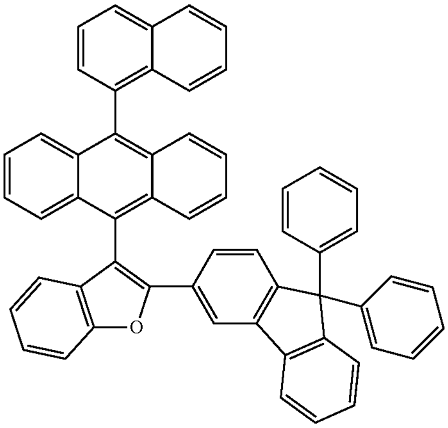
A-22
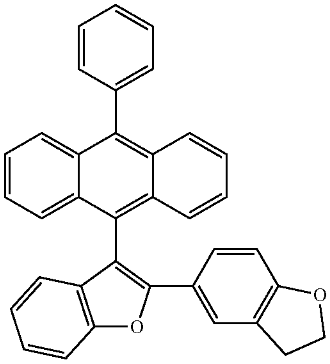
-continued
A-23
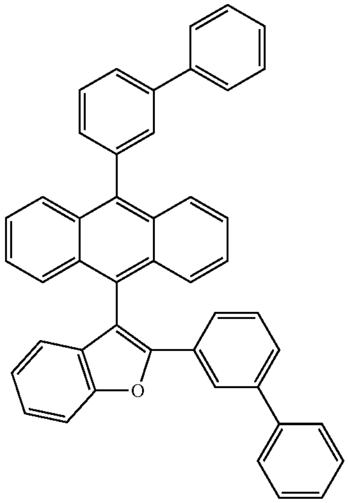
A-24
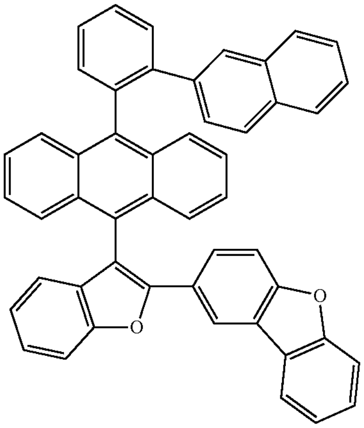
A-25
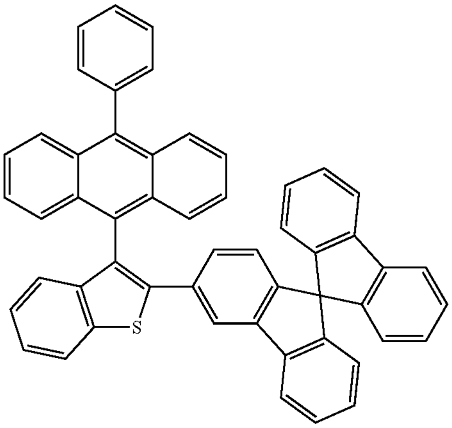

-continued
A-26
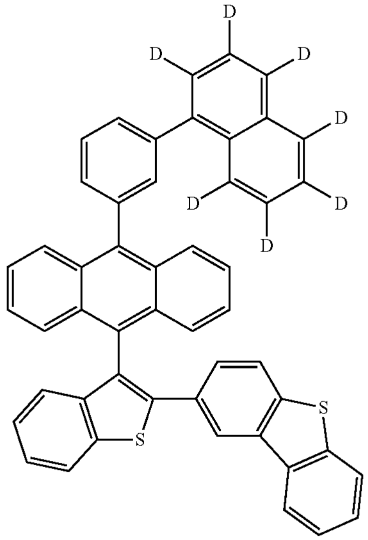
A-27
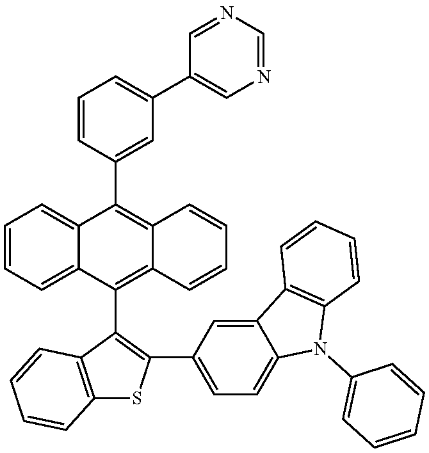
A-28
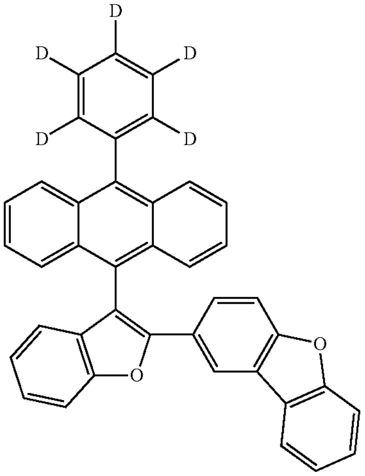
-continued
A-29
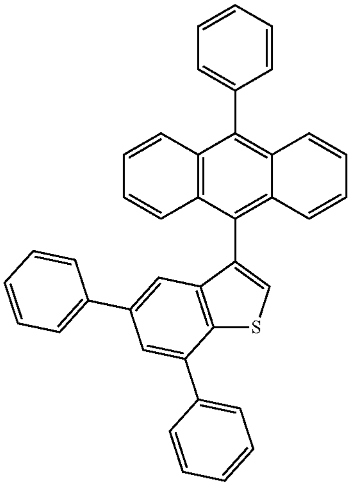
A-30
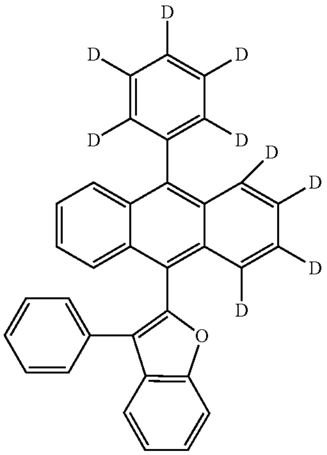
A-31
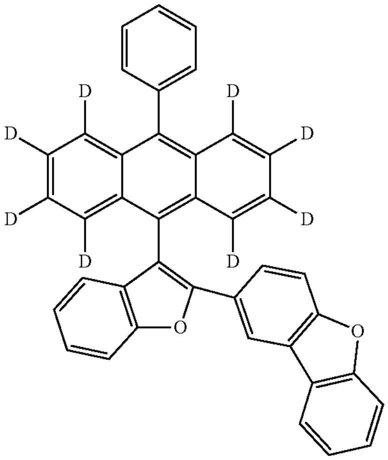

-continued
A-32
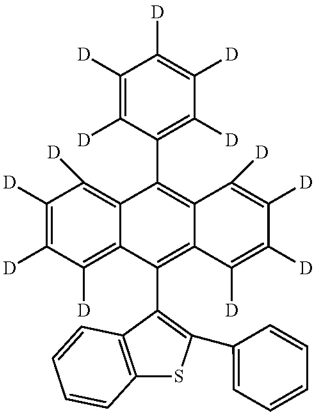
A-33
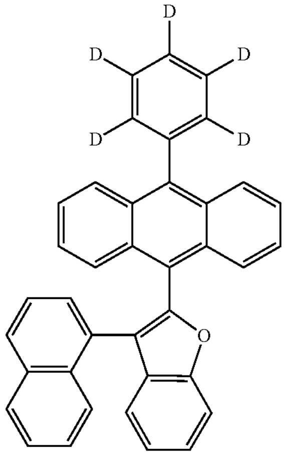
A-34
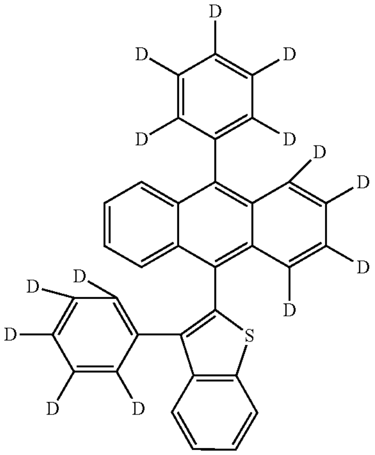
-continued
A-35
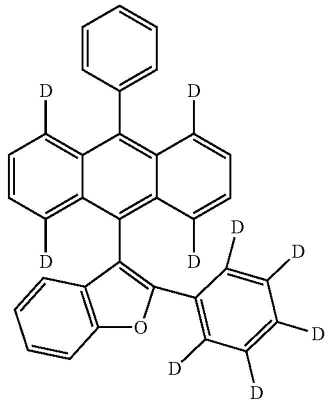
A-36
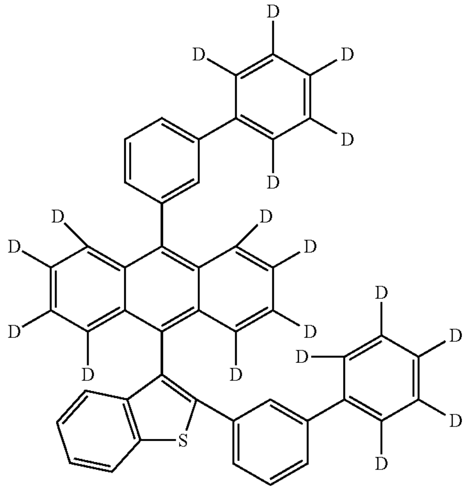
A-37
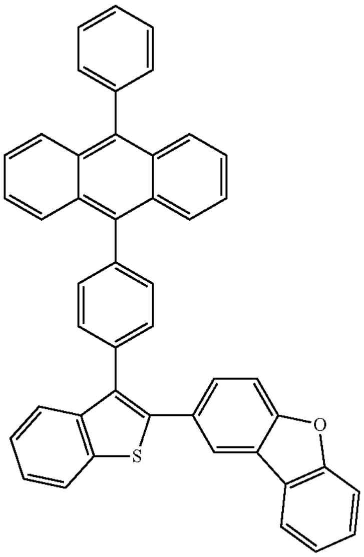

-continued
A-38
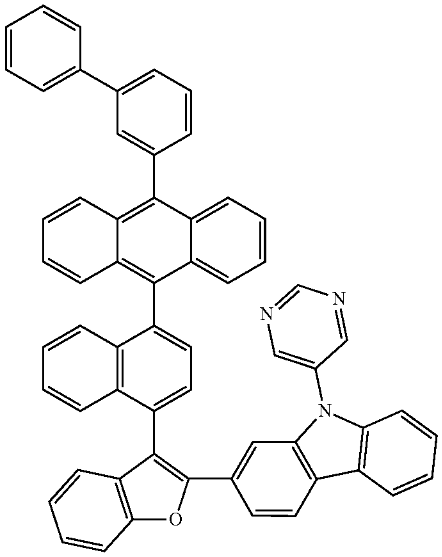
A-39
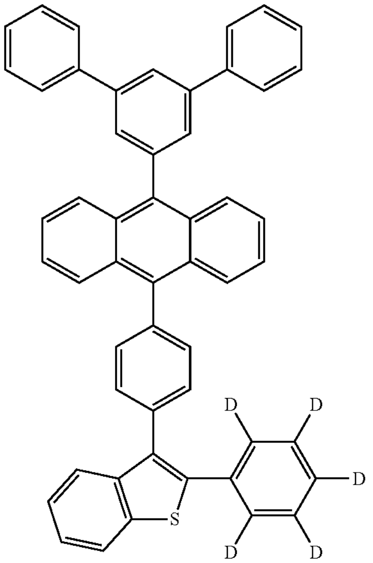
A-40
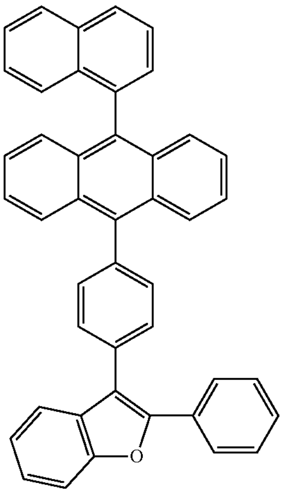
-continued
A-41
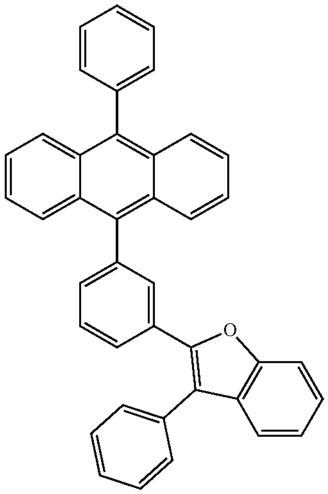
A-42
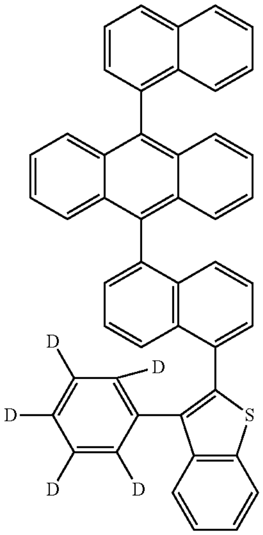
A-43
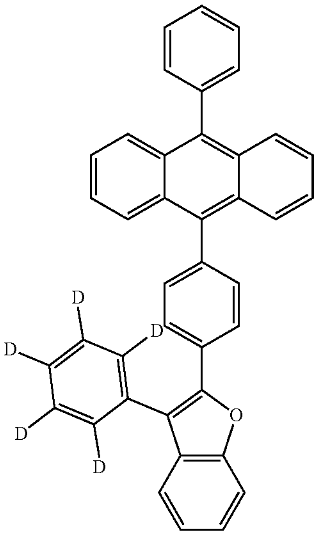

-continued
A-44
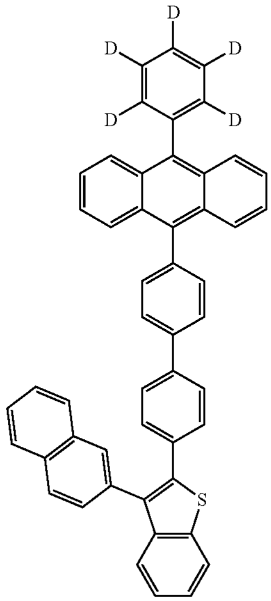
A-45
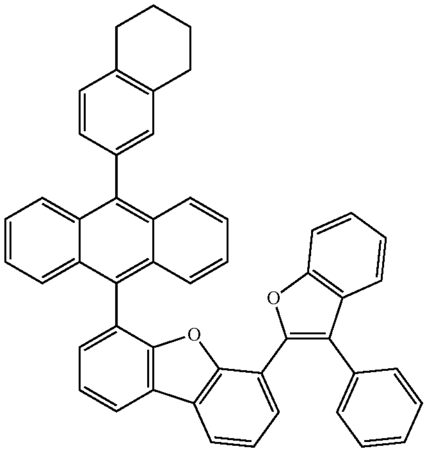
A-46
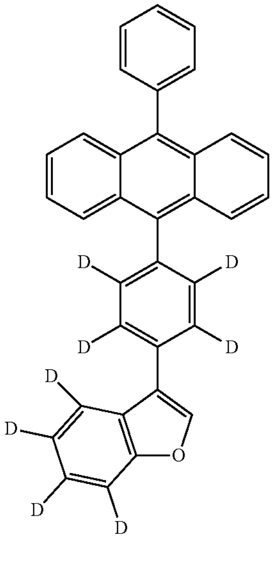
-continued
A-47
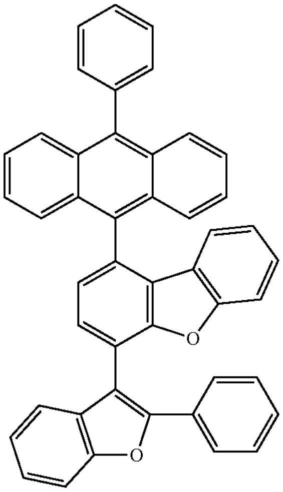
A-48
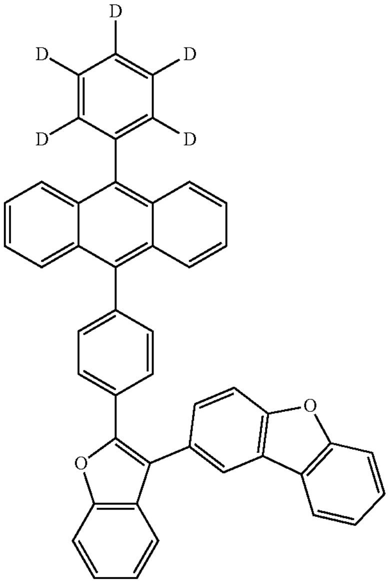
A-49
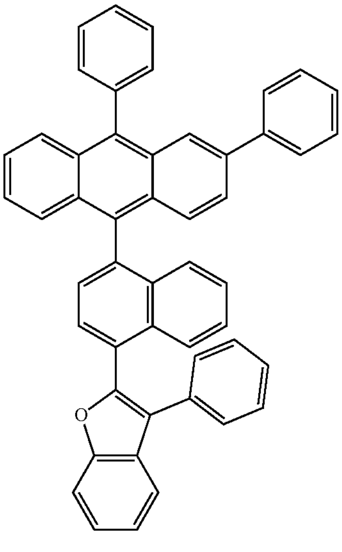

-continued
A-50
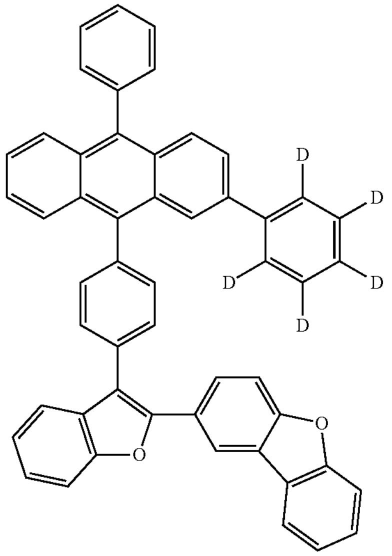
A-51
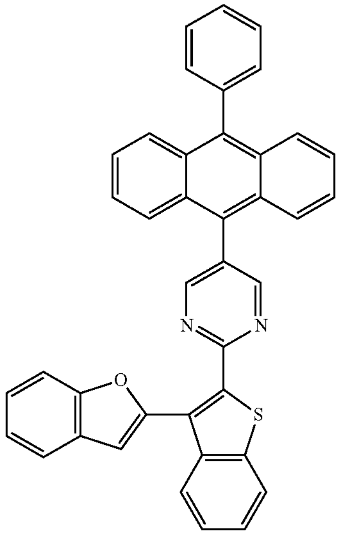
-continued
A-52
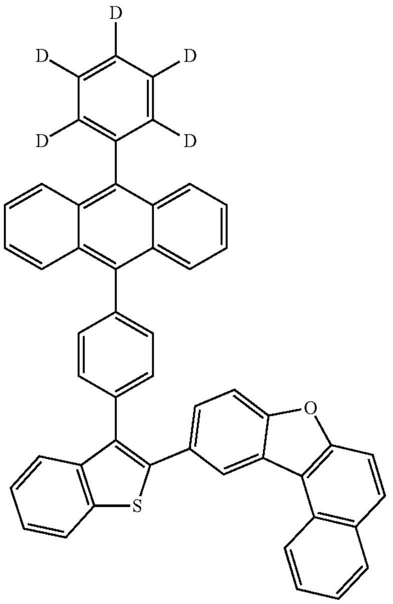
A-53
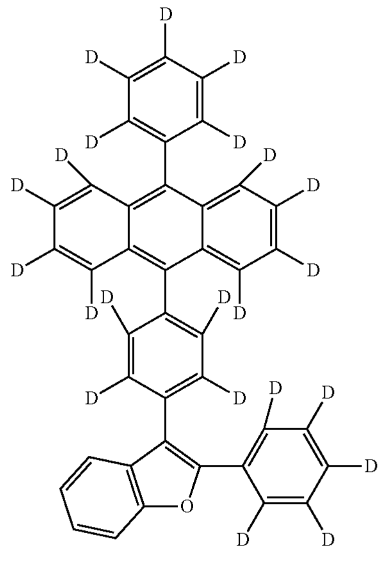
A-54
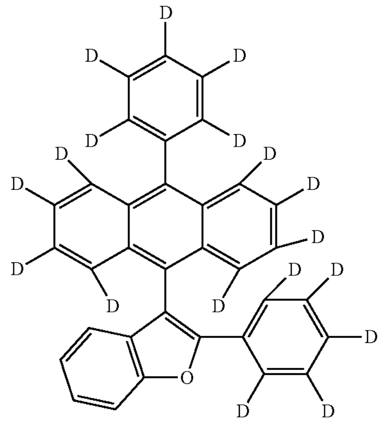

-continued
A-55
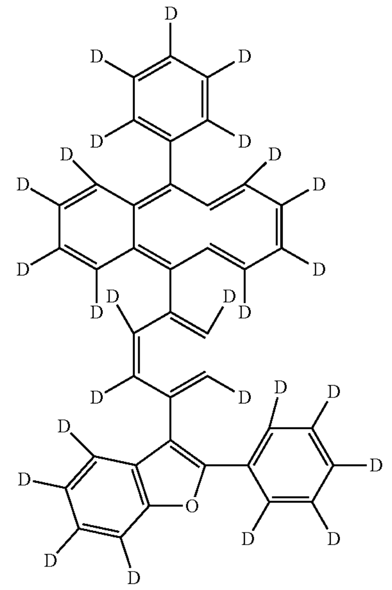
A-56
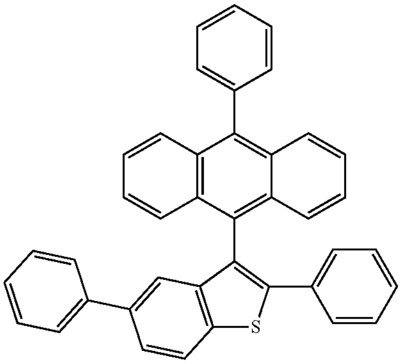
A-57
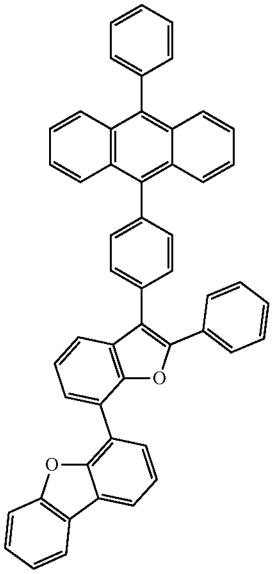
-continued
A-58
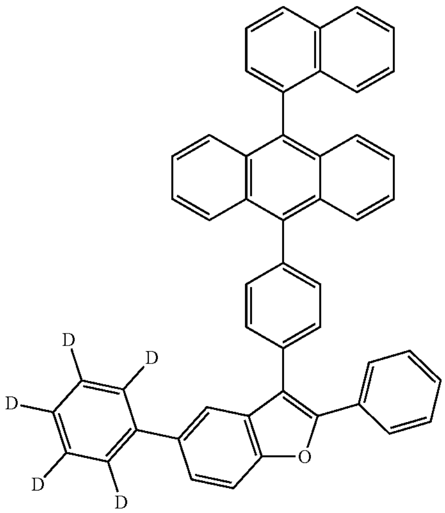
A-59
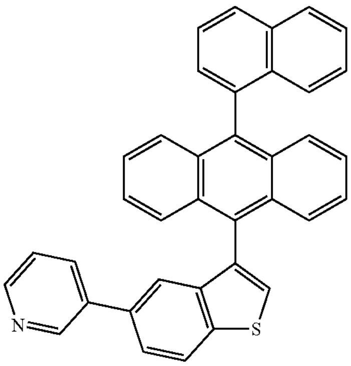
A-60
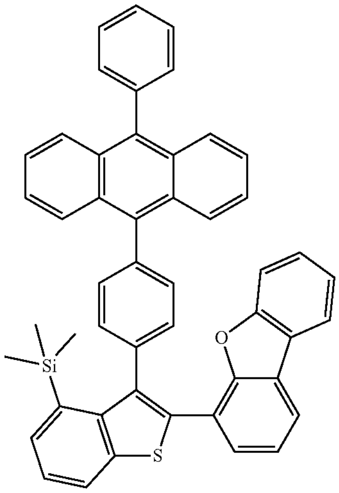

-continued
A-61
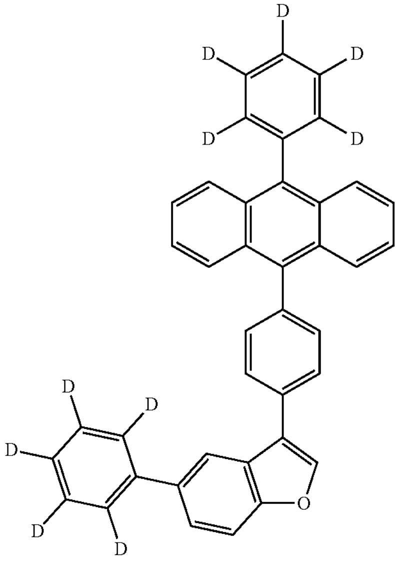
A-62
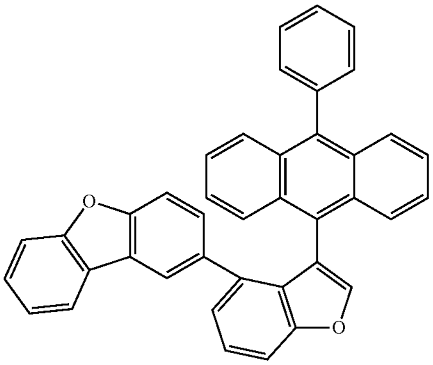
A-63
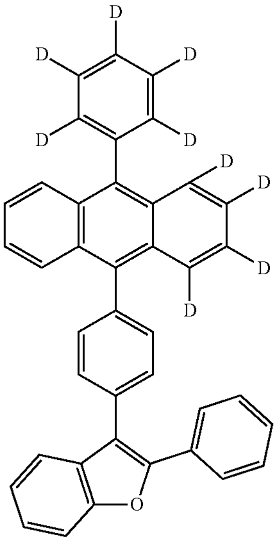
-continued
A-64
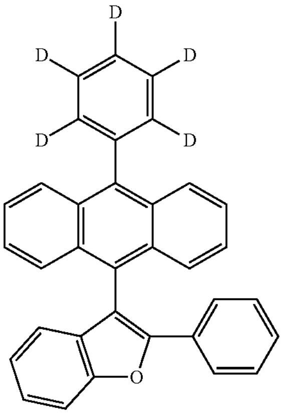
A-65
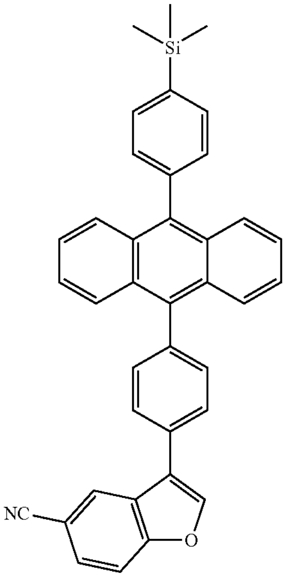
A-66
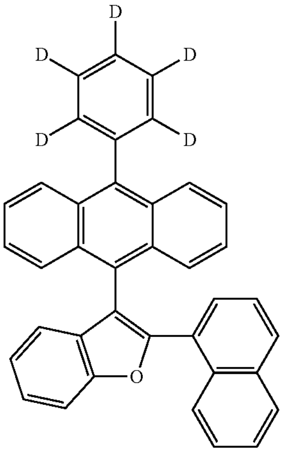

-continued
A-67
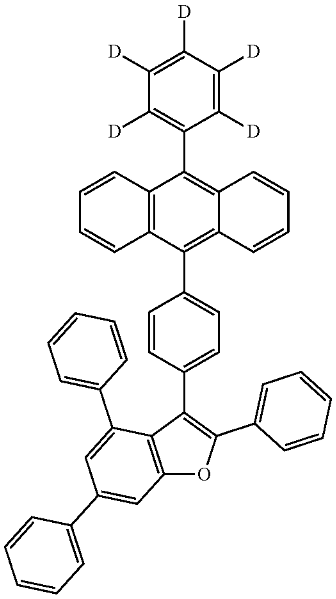
A-68
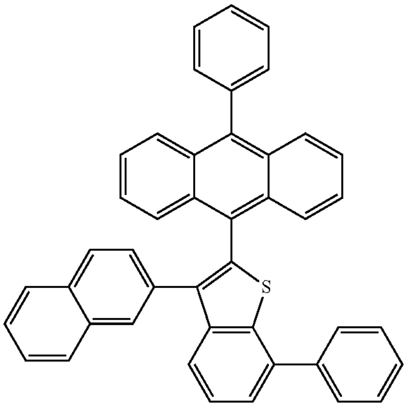
A-69
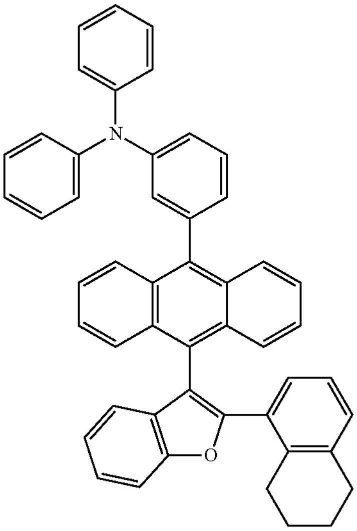
-continued
A-70
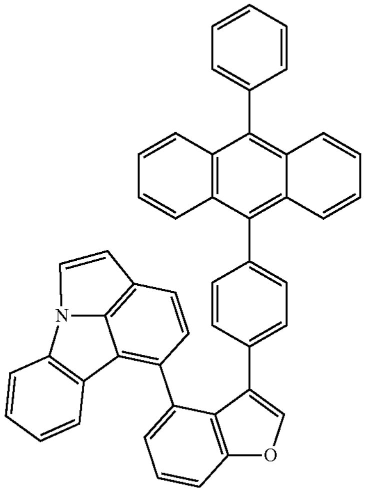
A-71
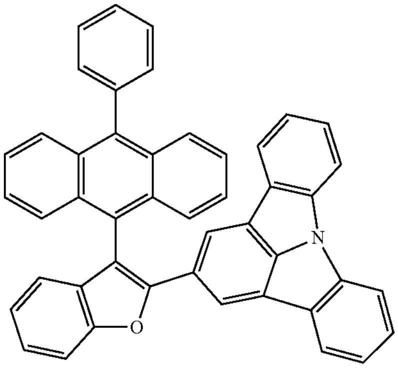
A-72
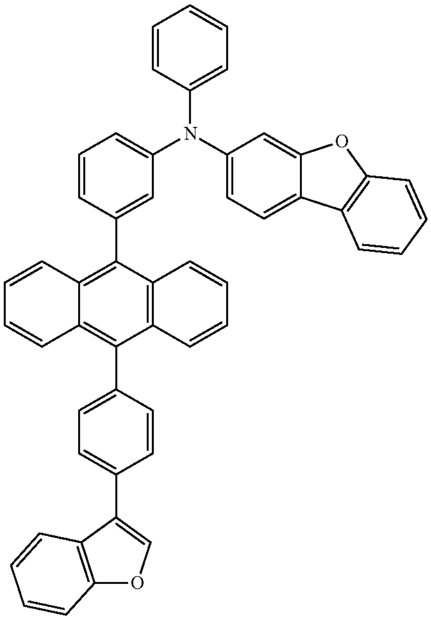

-continued
A-73
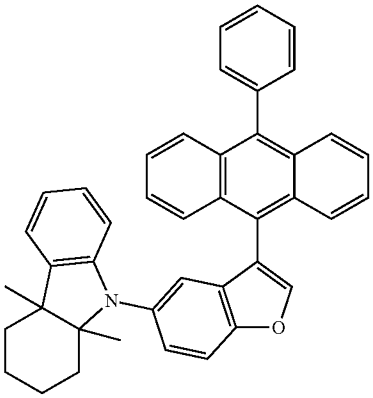
A-74
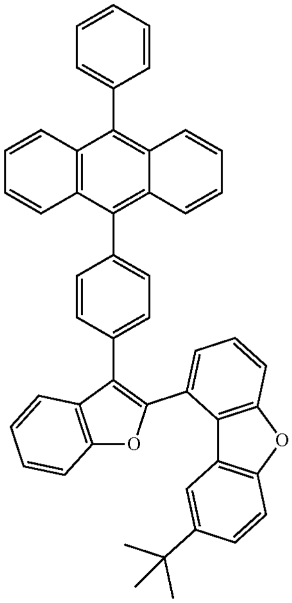
A-75
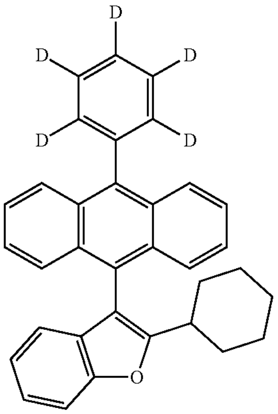
-continued
A-76
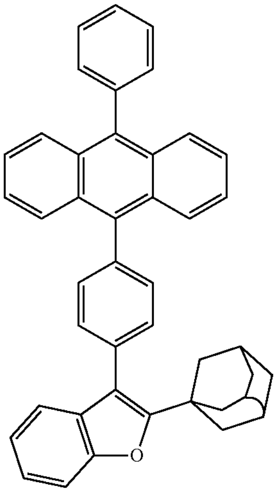
A-77
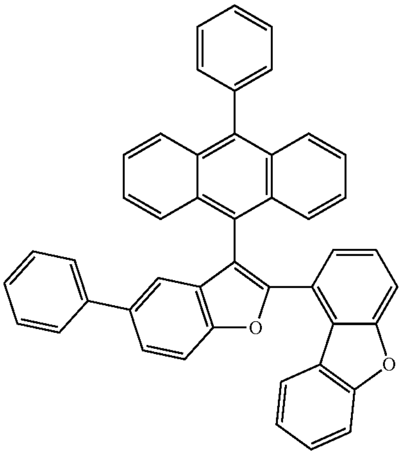
A-78
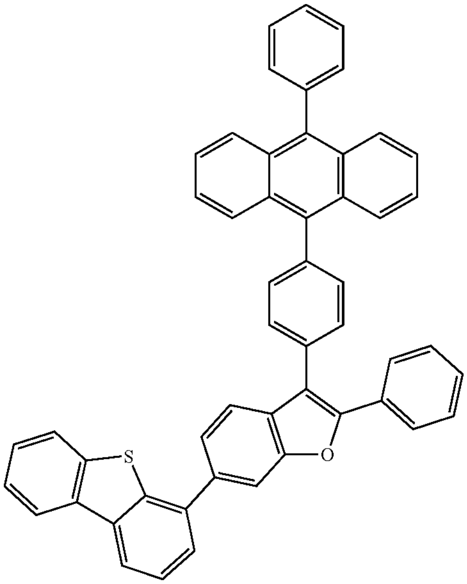

-continued
A-79
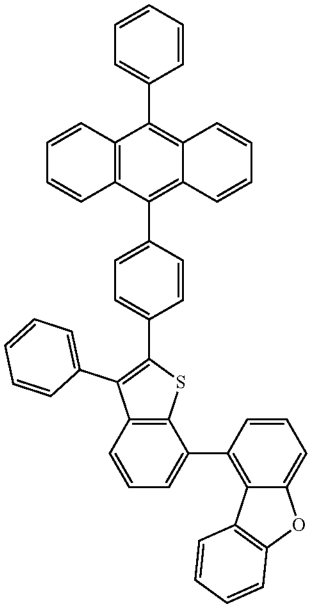
A-80
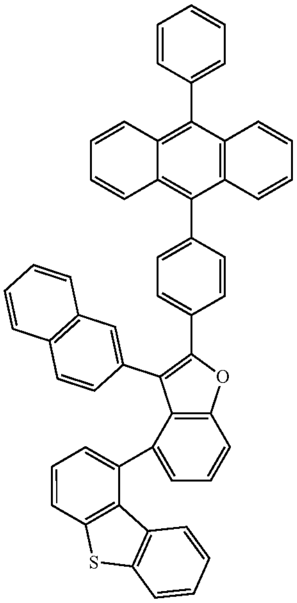
-continued
A-81
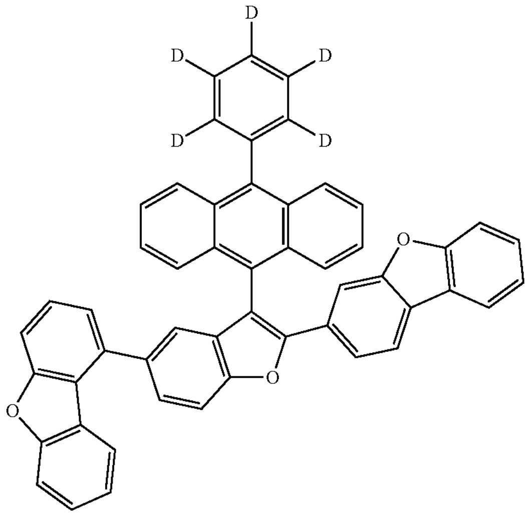
A-82
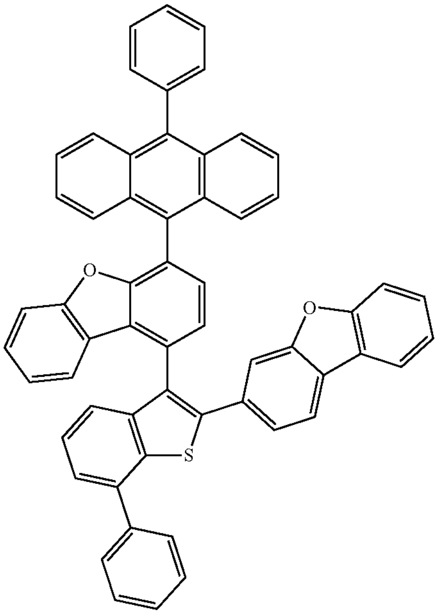
A-83
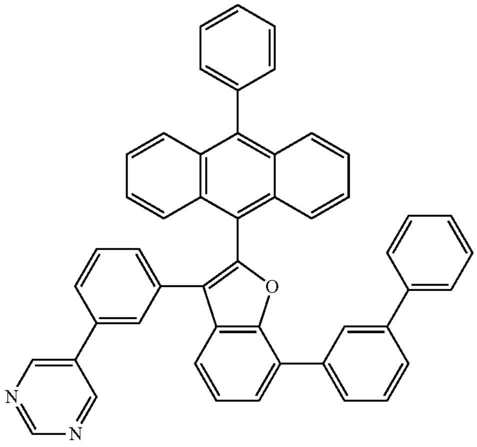

-continued
A-84
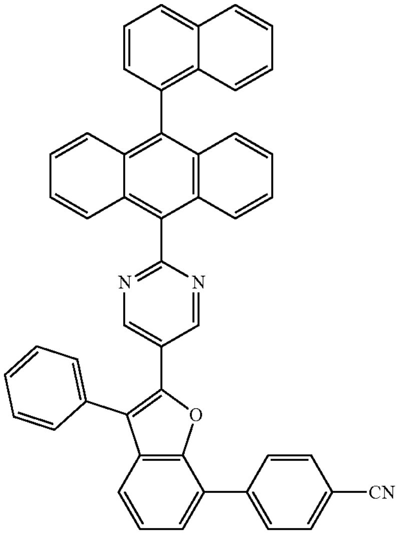
A-85
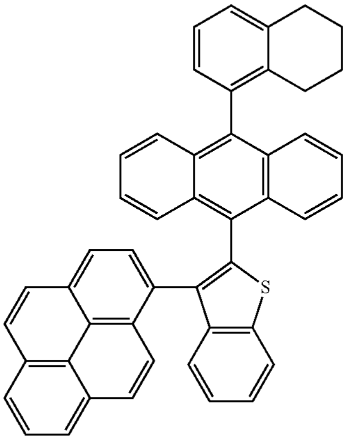
A-86
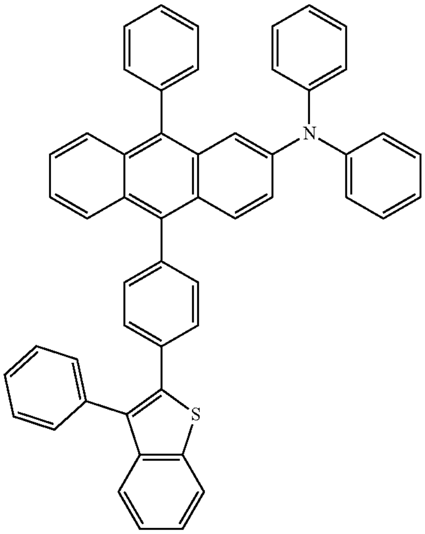
-continued
A-87
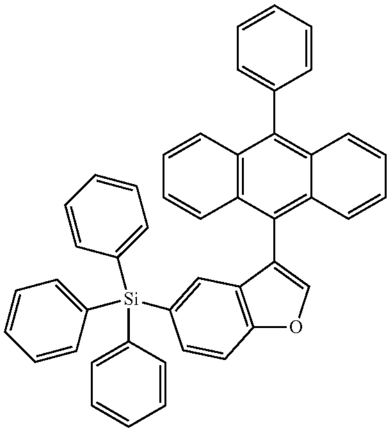
A-88
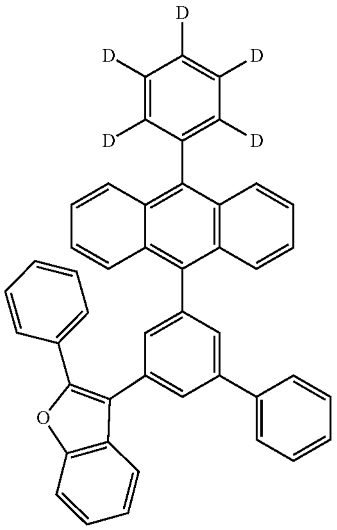
A-89
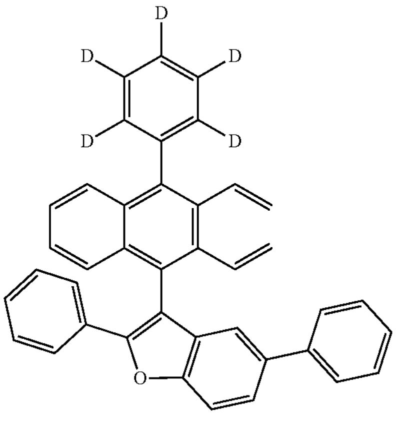

-continued
A-90
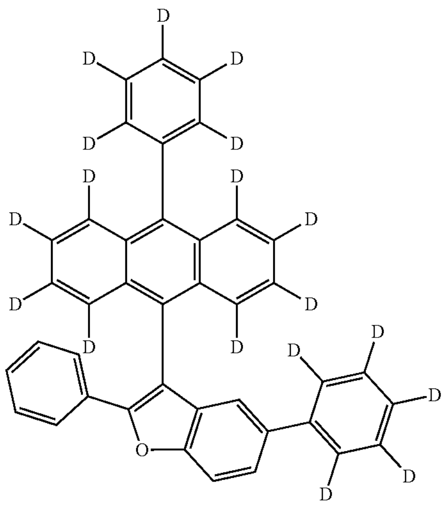
A-91
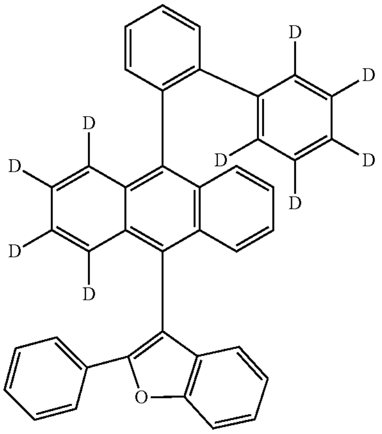
A-92
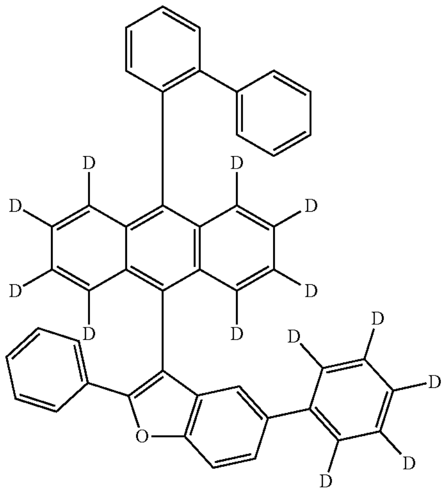
-continued
A-93
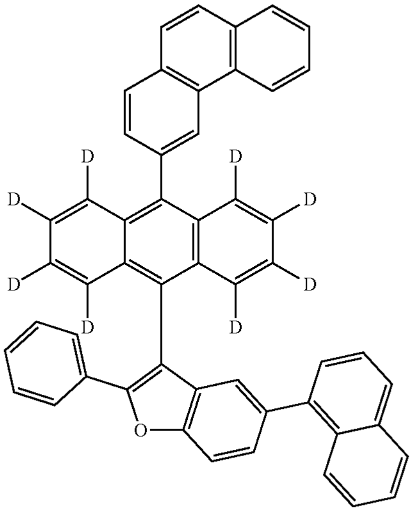
A-94
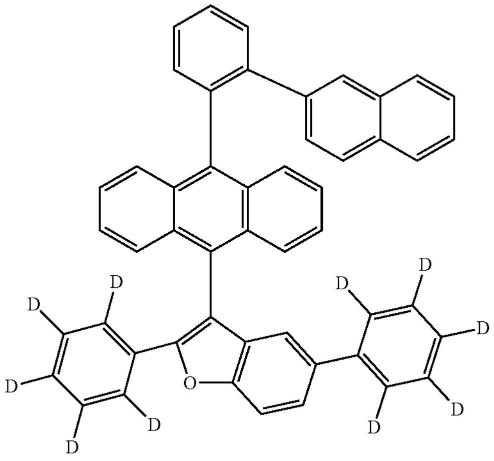
A-95
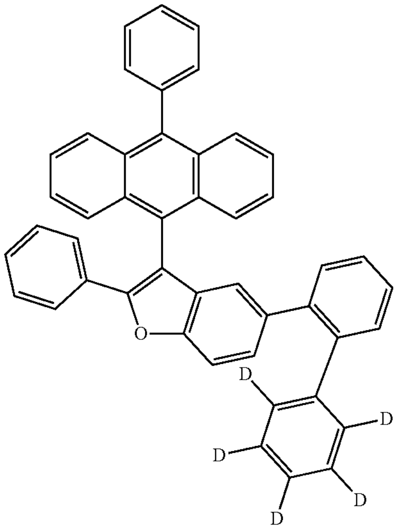

-continued
A-96
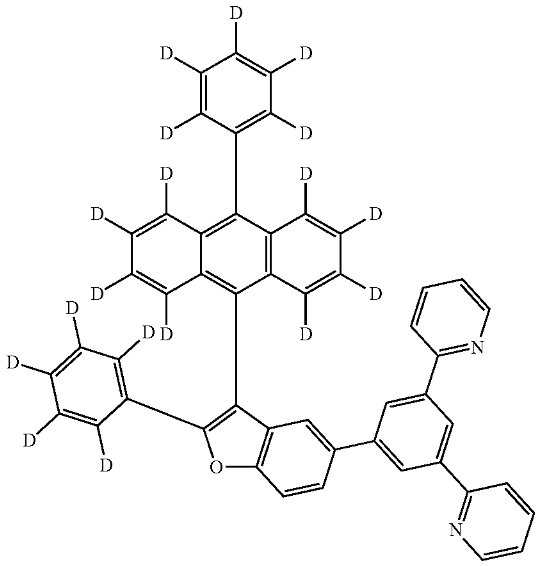
A-97
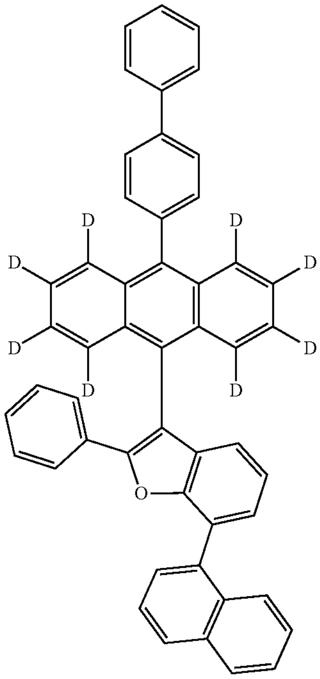
-continued
A-98
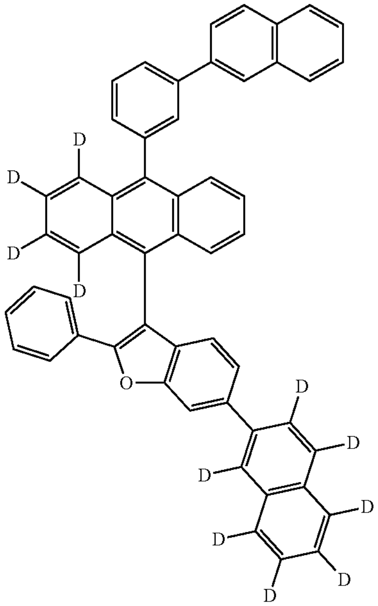
A-99
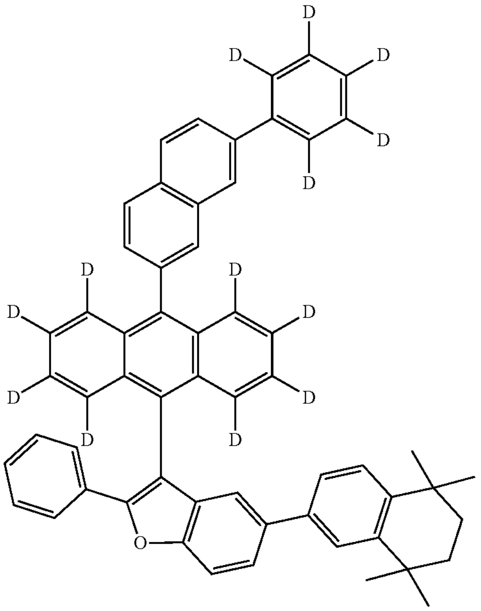

-continued
A-100
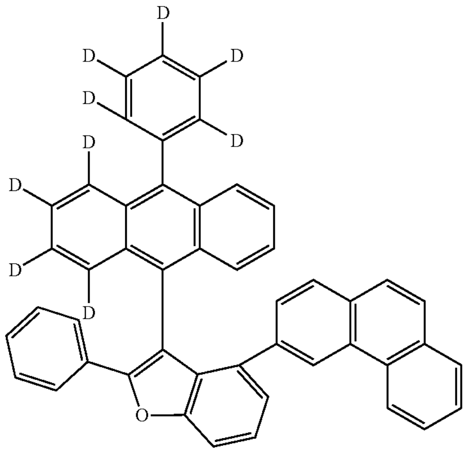
A-101
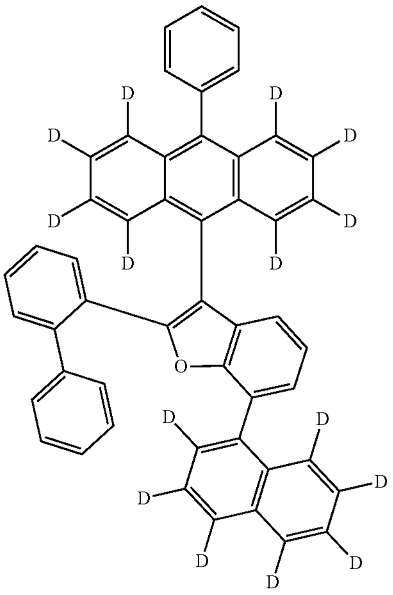
A-102
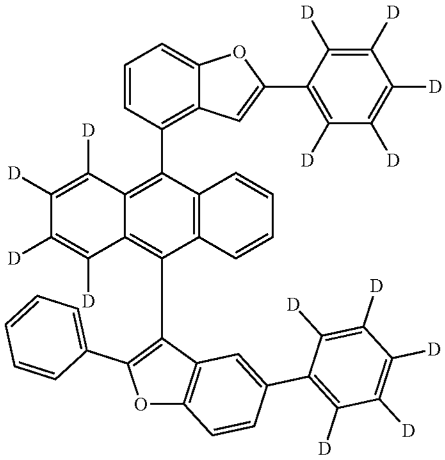
-continued
A-103
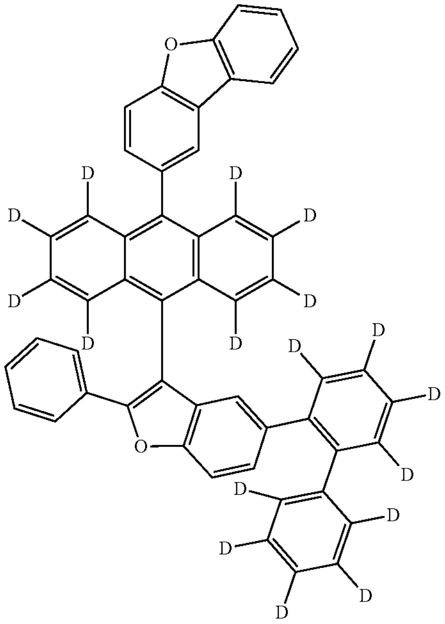
A-104
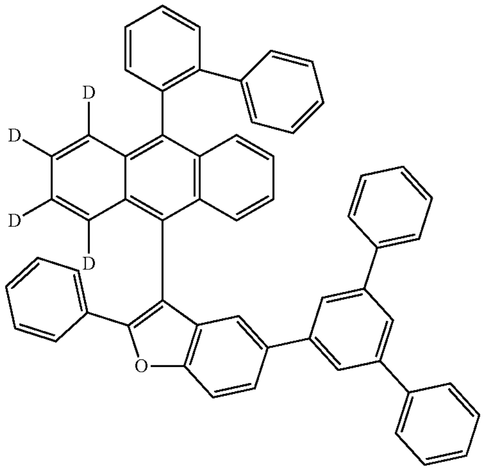

-continued
A-105
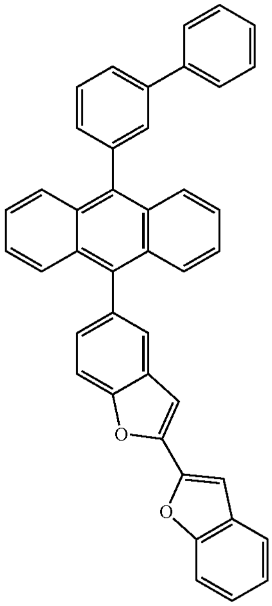
A-106
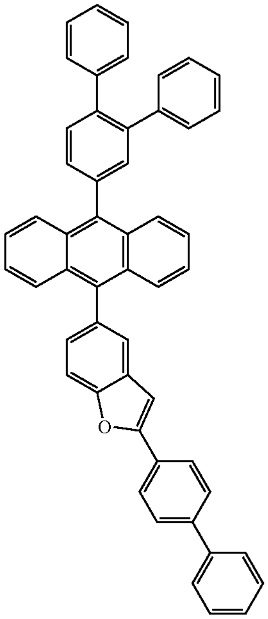
-continued
A-107
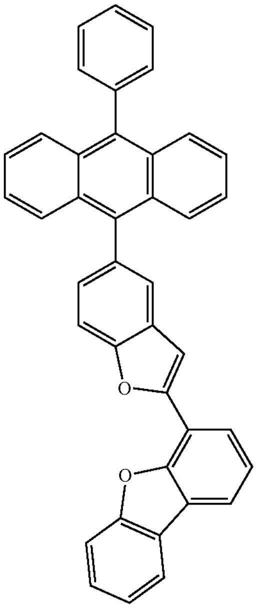
A-108
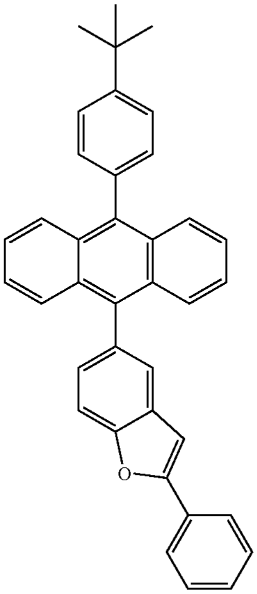

-continued
A-109
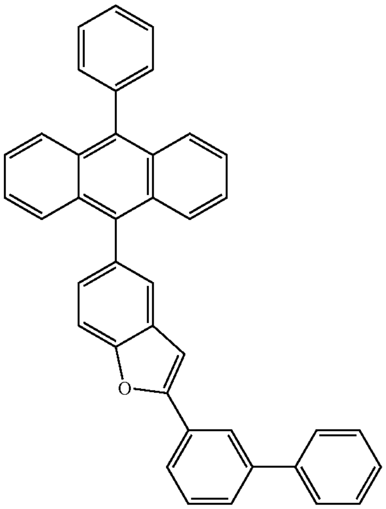
A-110
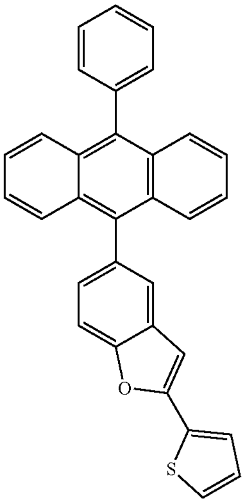
A-111
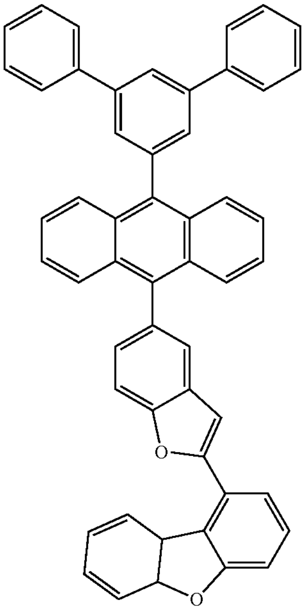
-continued
A-112
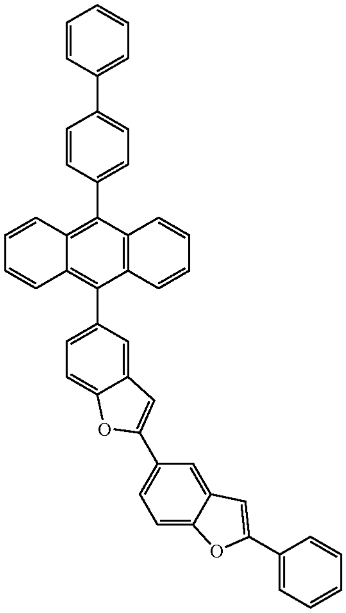
A-113
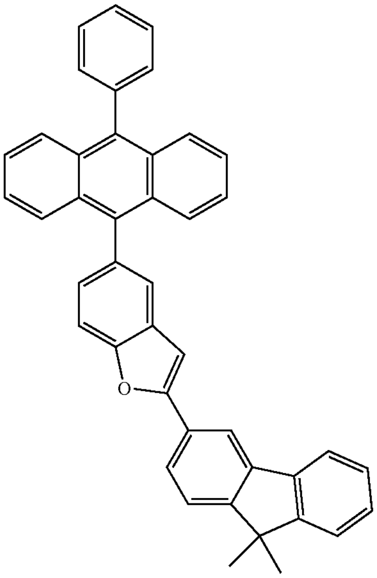

-continued
A-114
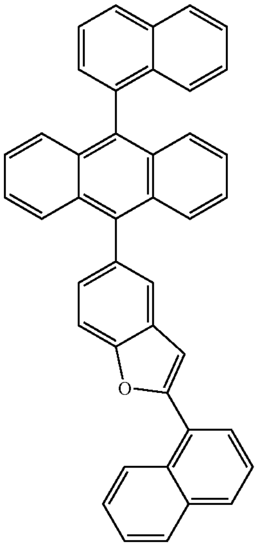
A-115
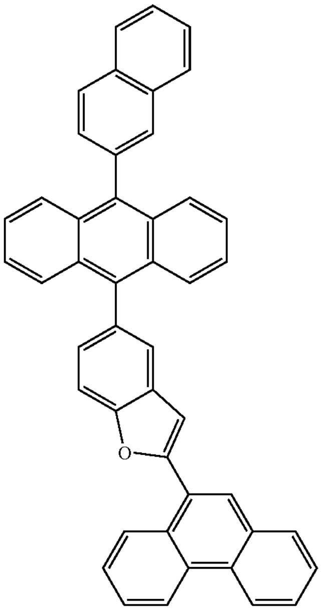
A-116
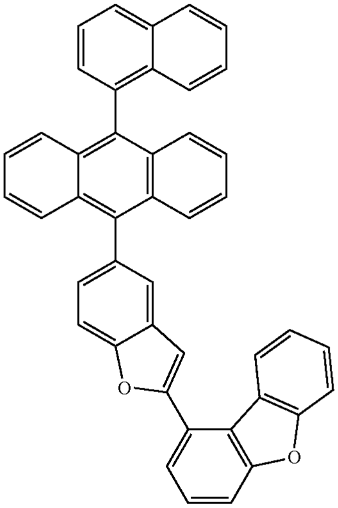
-continued
A-117
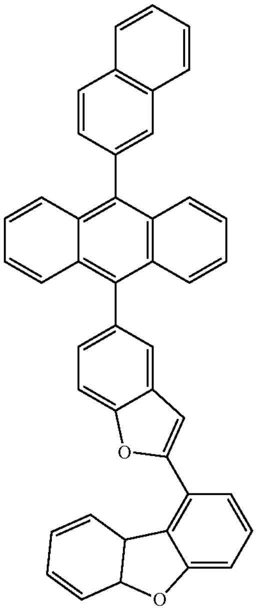
A-118
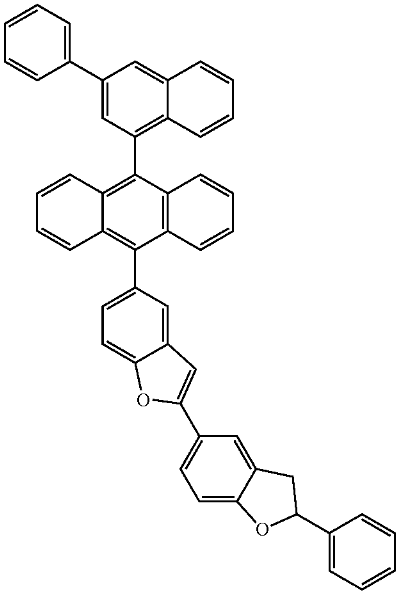
A-119
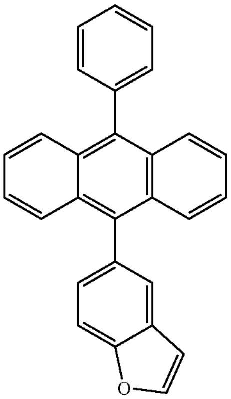

-continued
A-120
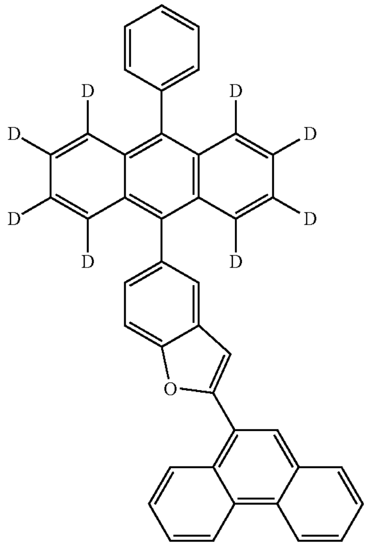
A-121
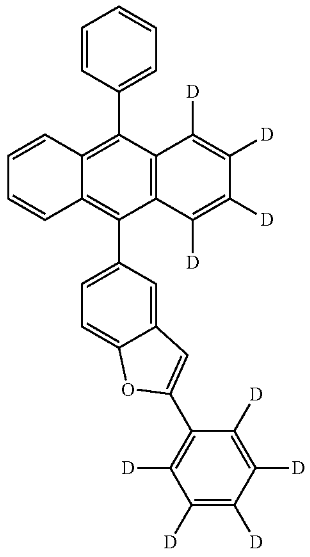
-continued
A-122
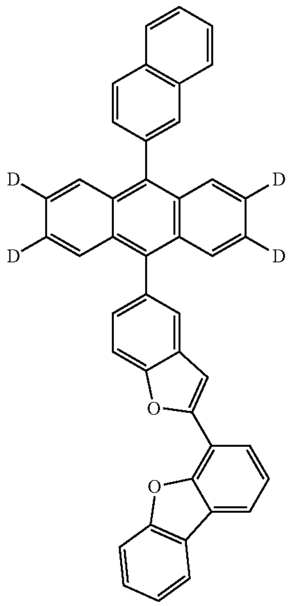
A-123
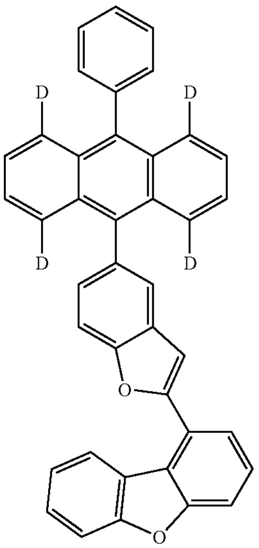

-continued
A-124
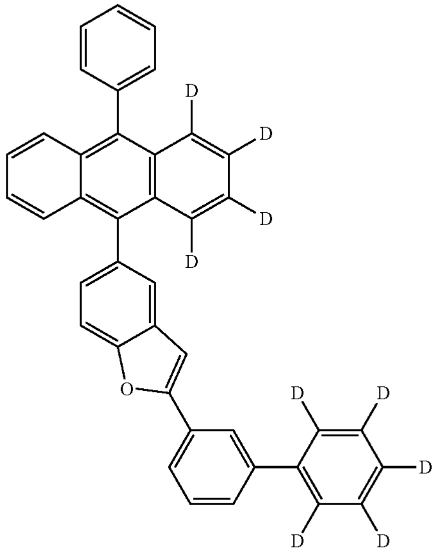
A-125
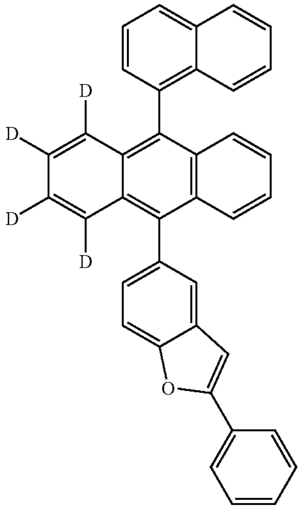
A-126
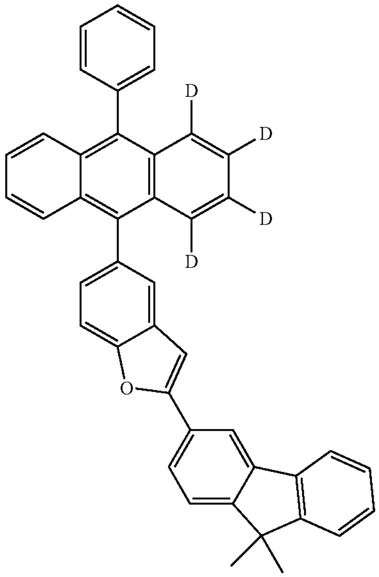
-continued
A-127
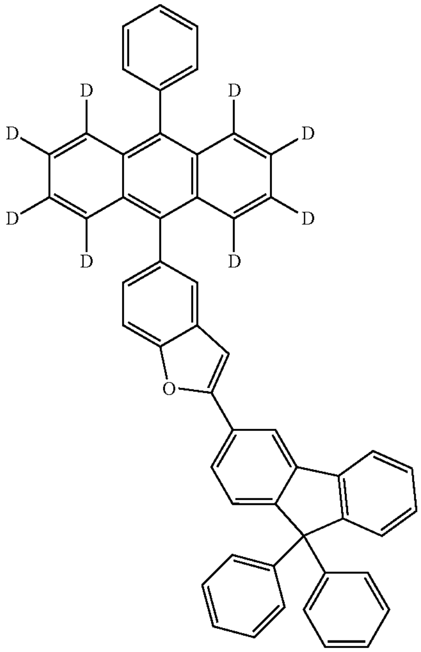
A-128
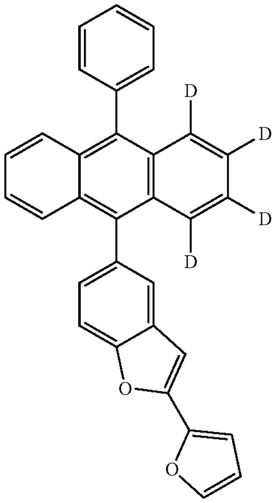

-continued
A-129
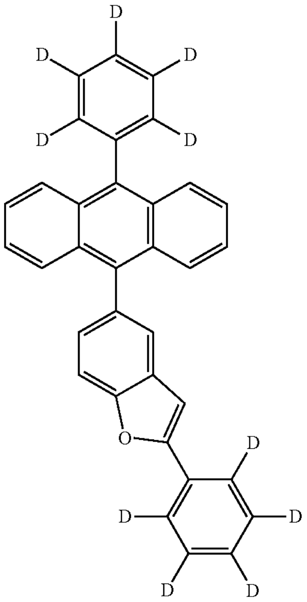
A-130
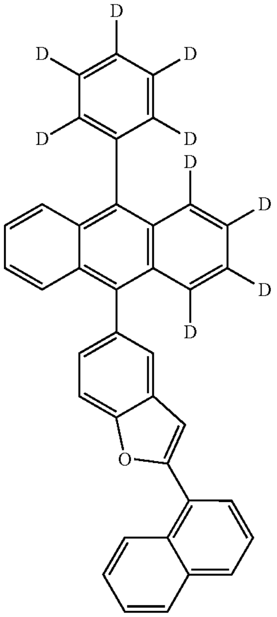
-continued
A-131
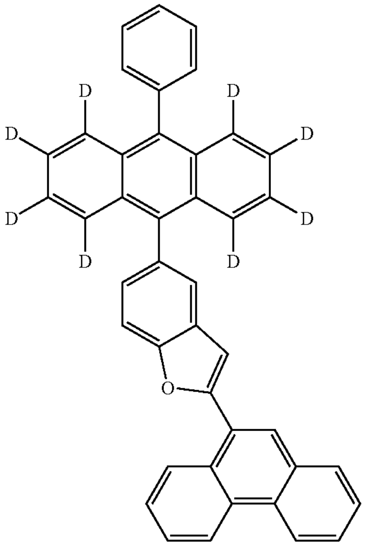
A-132
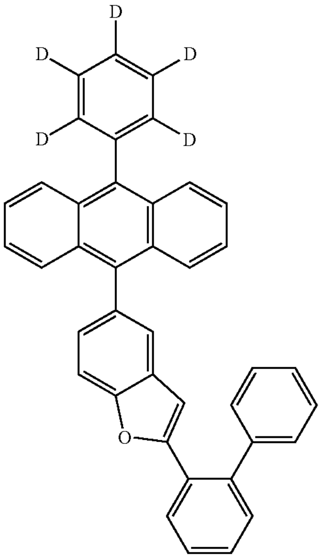

-continued
A-133
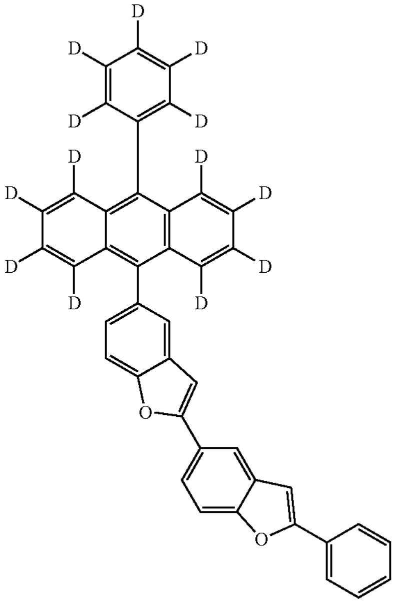
A-134
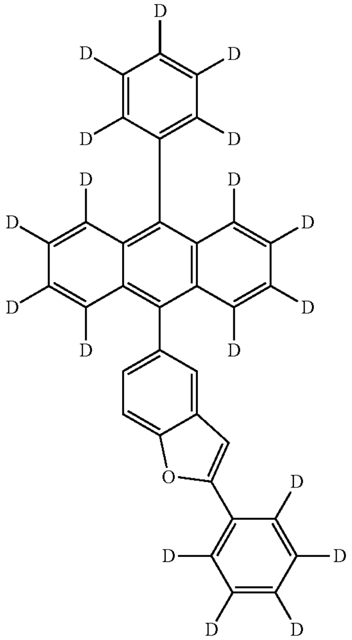
-continued
A-135
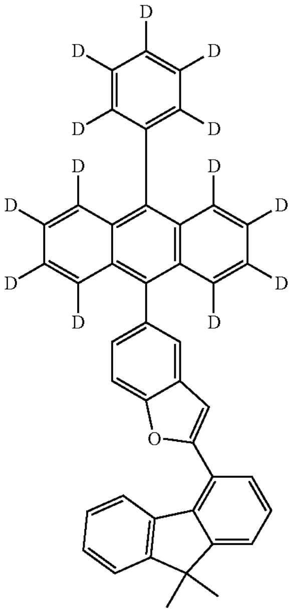
A-136
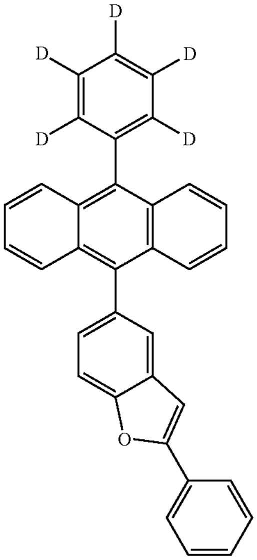

-continued
A-137
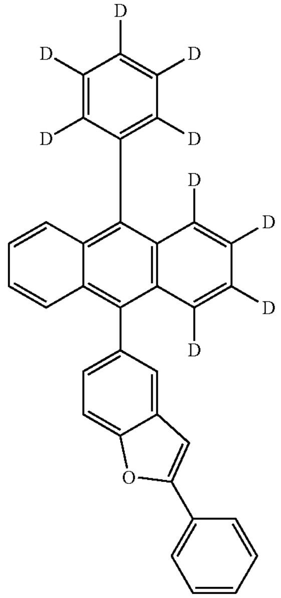
A-138
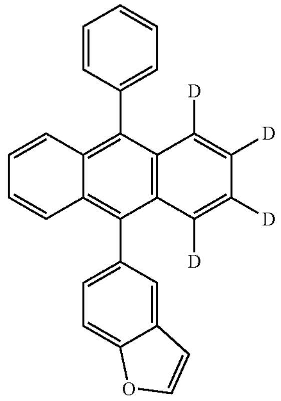
A-139
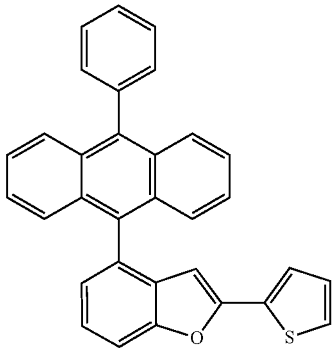
-continued
A-140
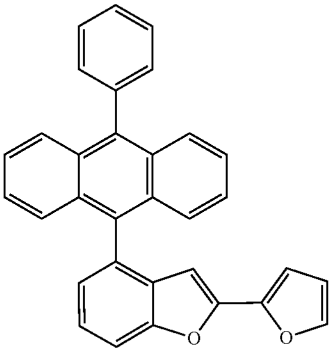
A-141
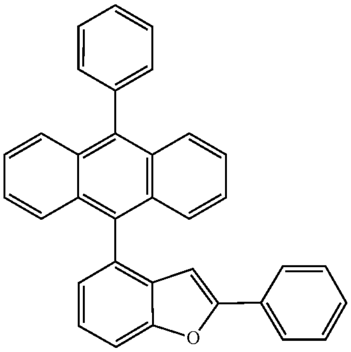
A-142
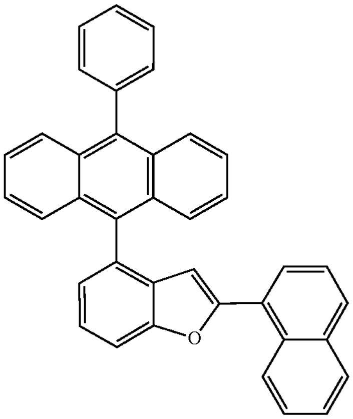
A-143
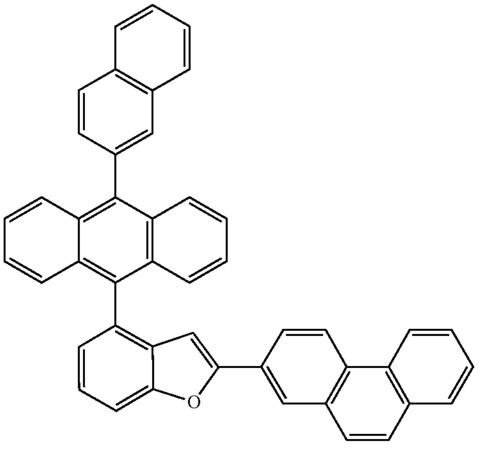

-continued
A-144
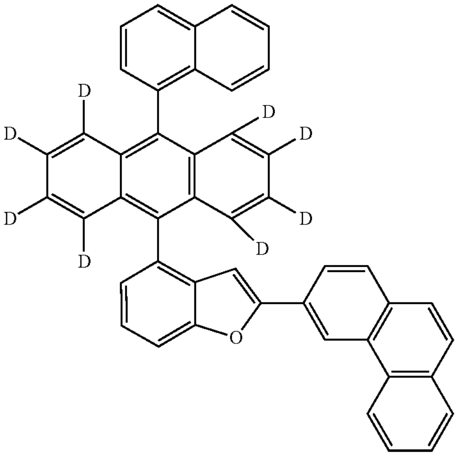
A-145
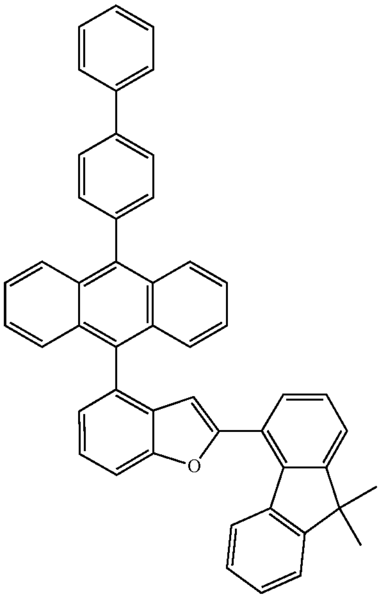
A-146
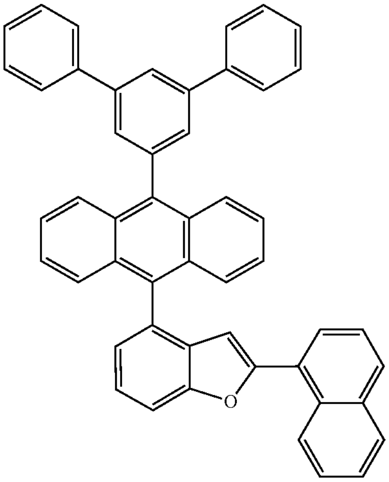
-continued
A-147
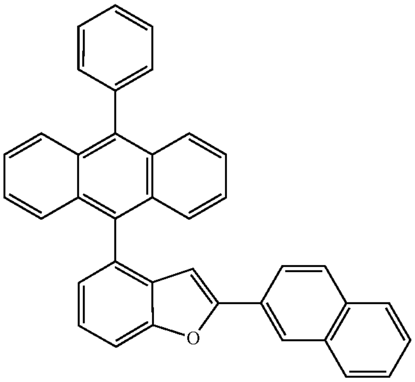
A-148
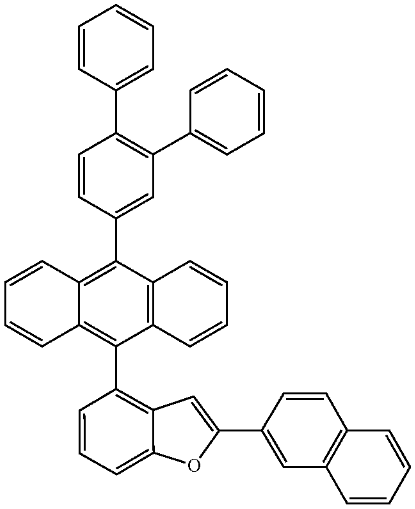
A-149
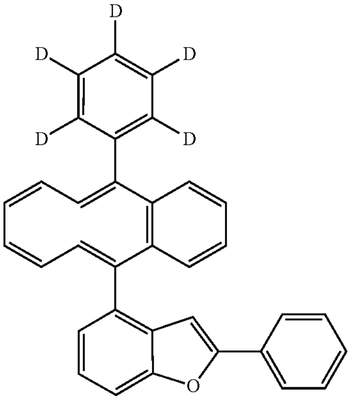

-continued
A-150
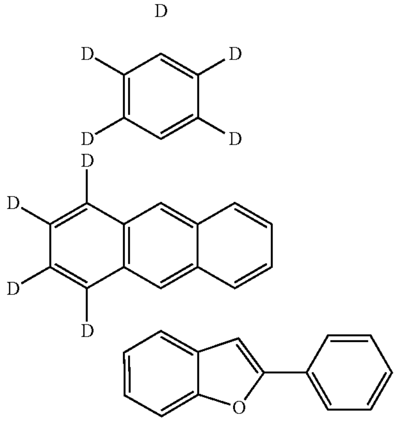
A-151
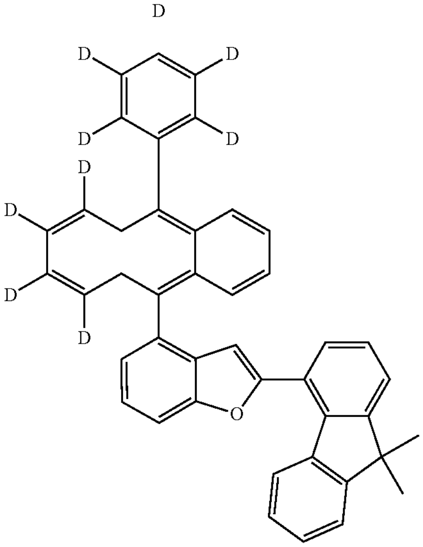
A-152
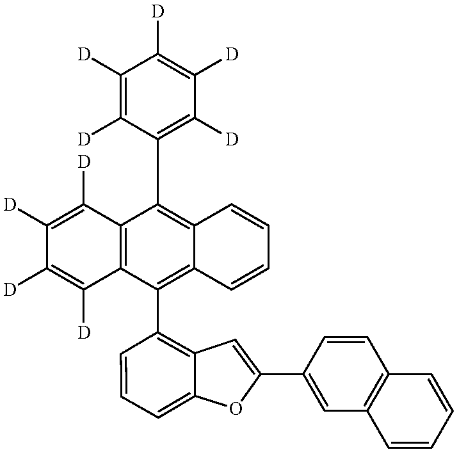
-continued
A-153
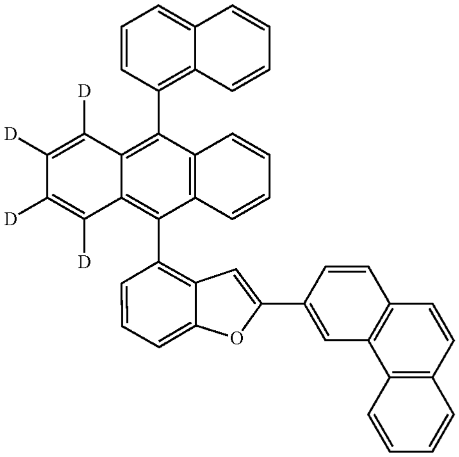
A-154
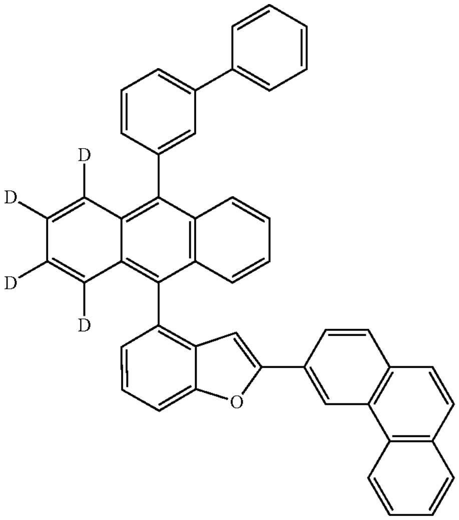
A-155
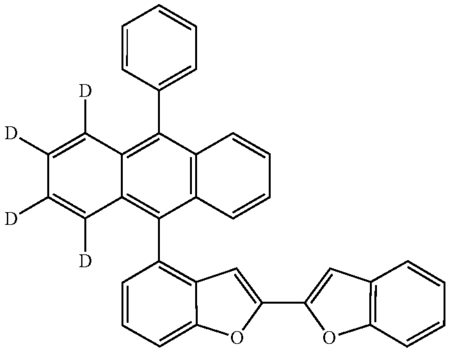

-continued
A-156
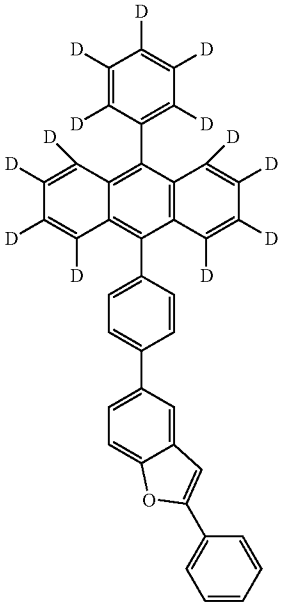
A-157
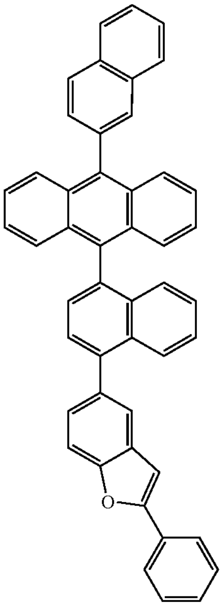
-continued
A-158
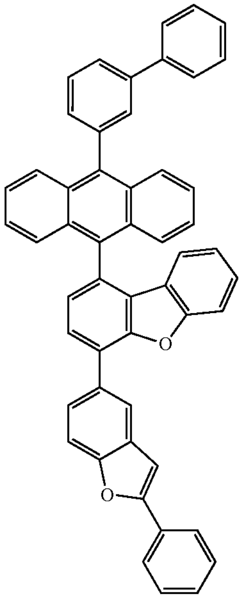
A-159
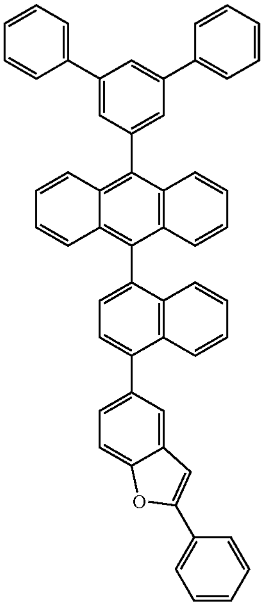

-continued
A-160
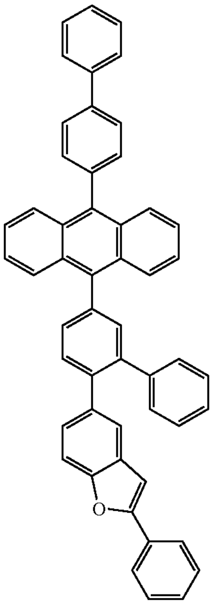
A-161
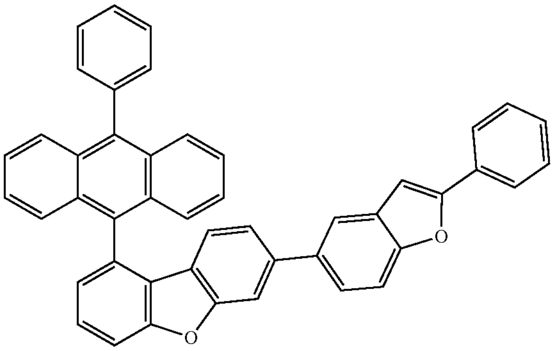
A-162
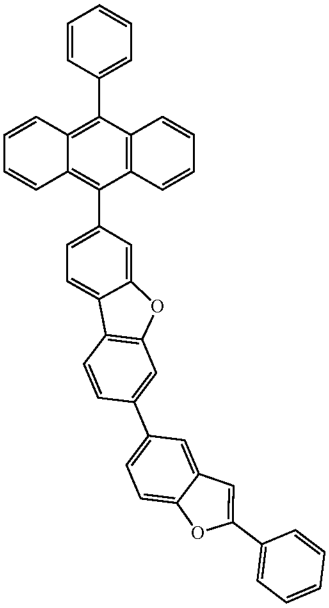
-continued
A-163
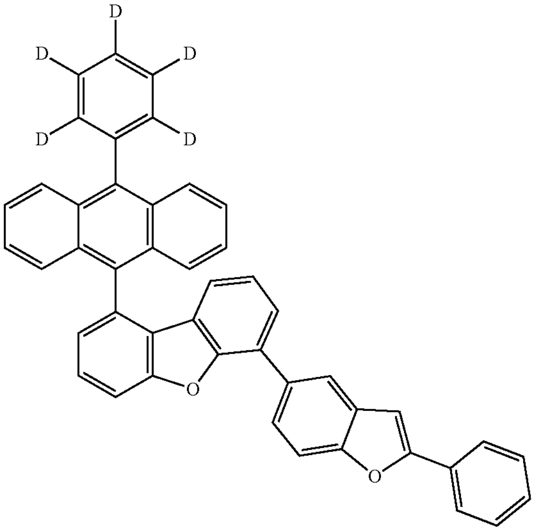
A-164
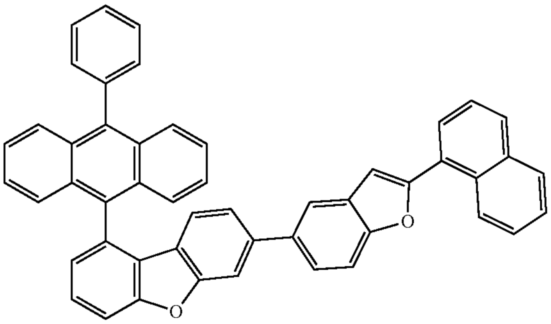
A-165
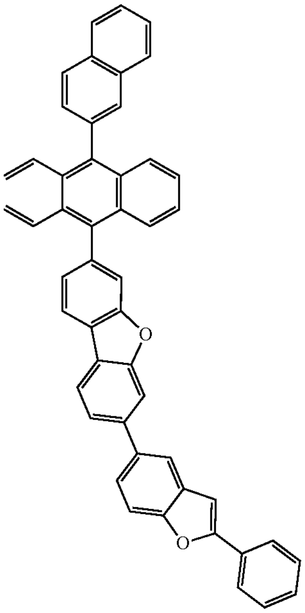

-continued
A-166
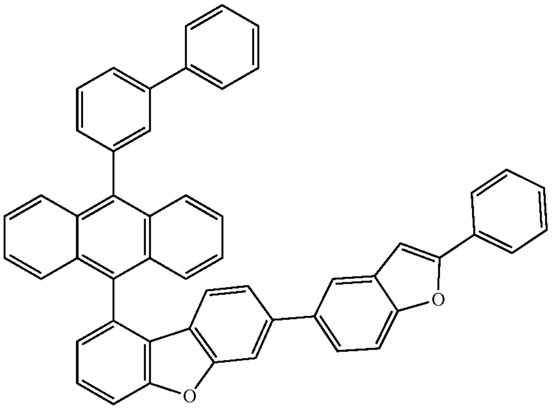
A-167
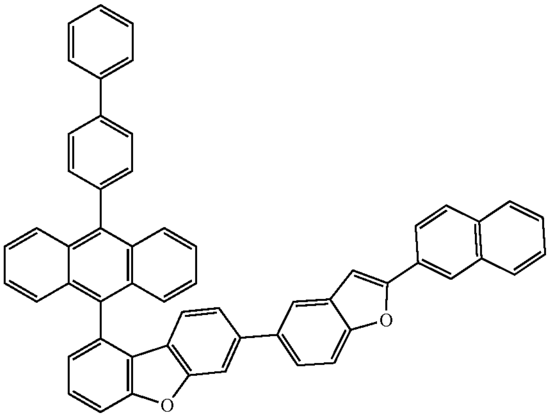
A-168
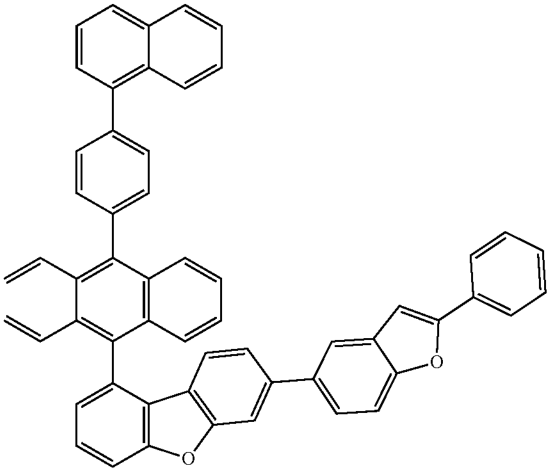
-continued
A-169
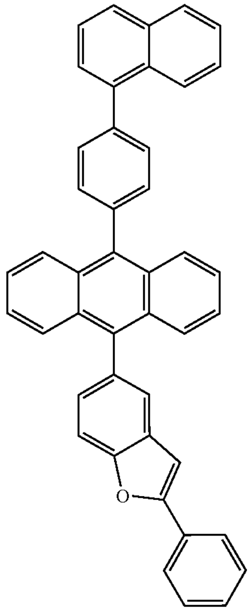
A-170
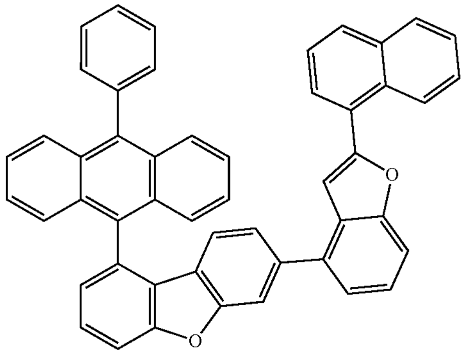
A-171
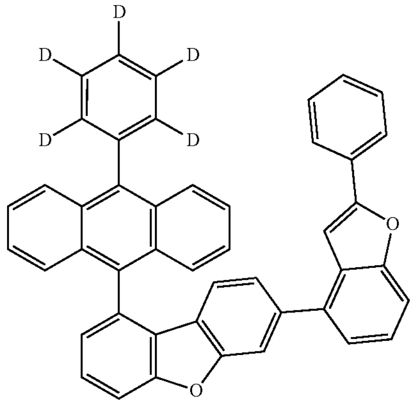

-continued
A-172
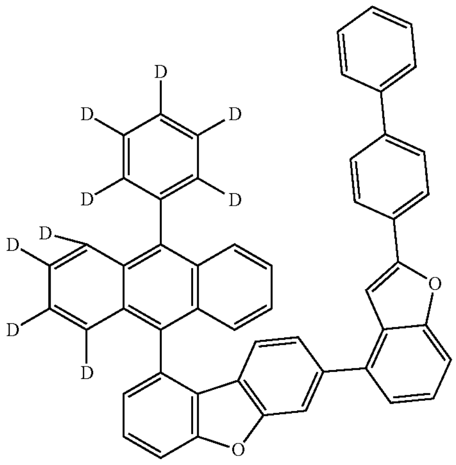
A-173
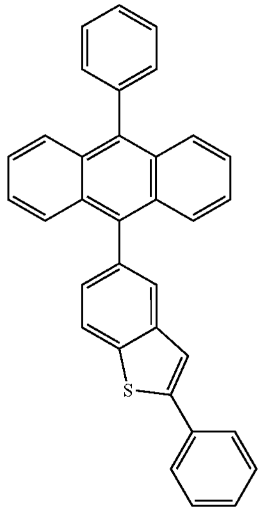
A-174
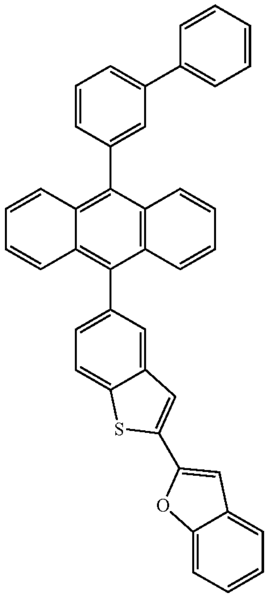
-continued
A-175
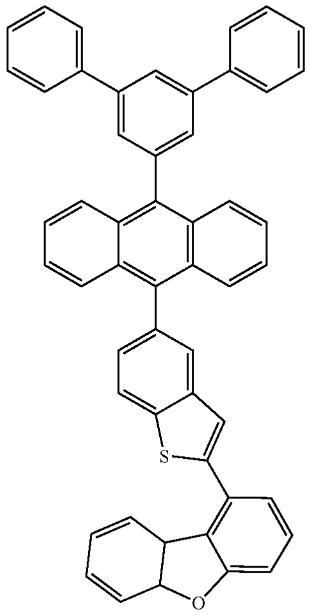
A-176
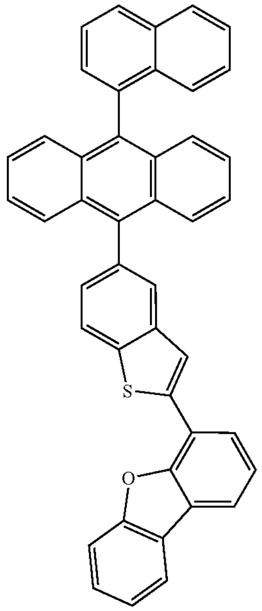

-continued
A-177
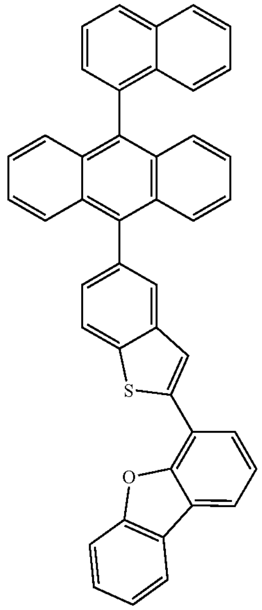
A-178
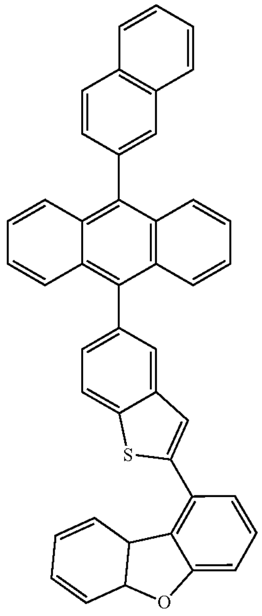
-continued
A-179
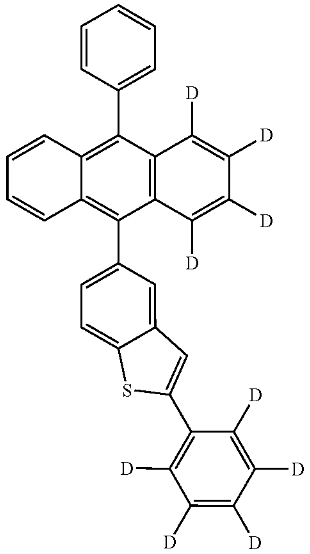
A-180
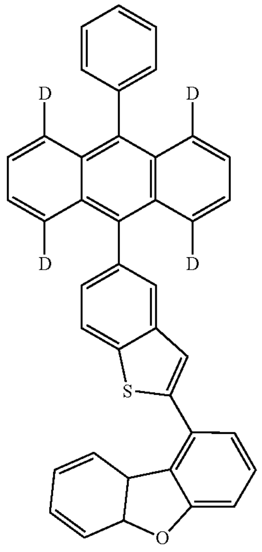
A-181
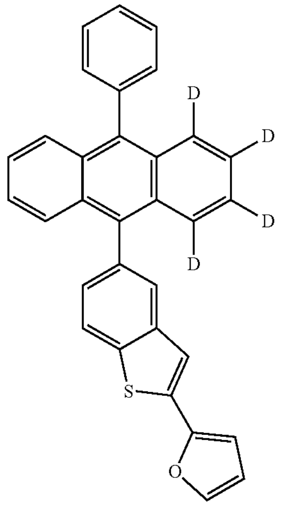

-continued
A-182
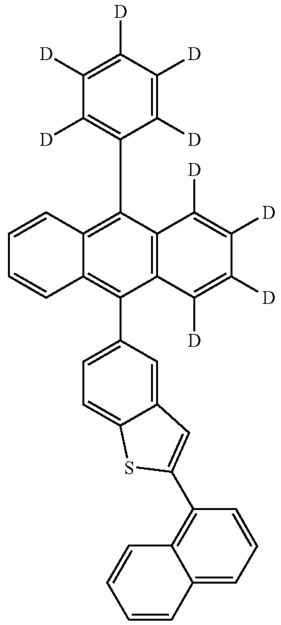
A-183
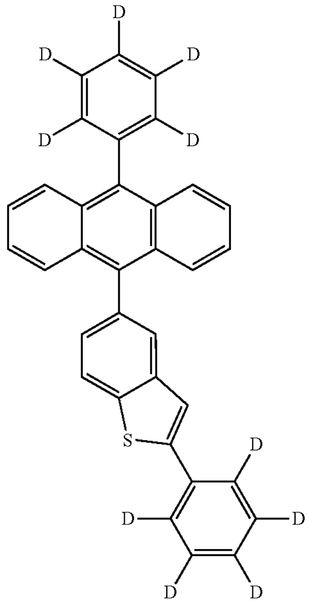
-continued
A-184
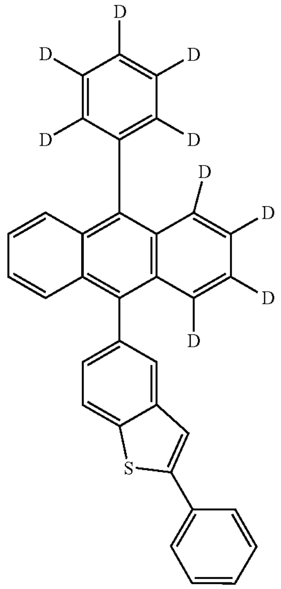
A-185
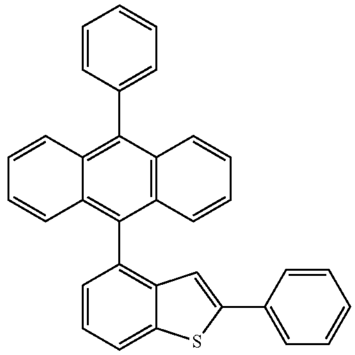
A-186
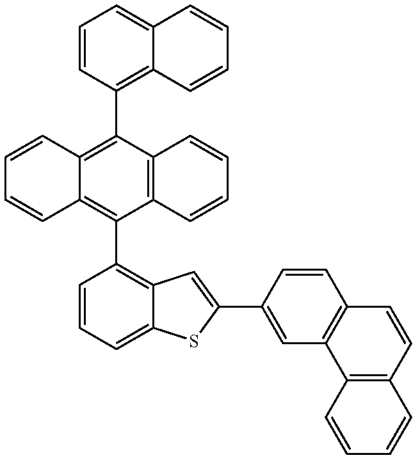

-continued
A-187
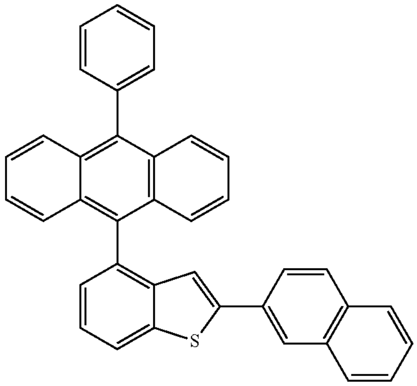
A-188
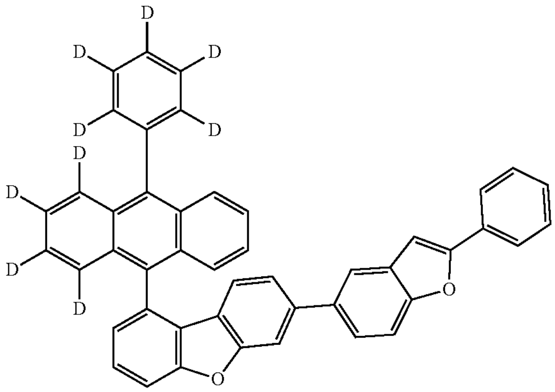
A-189
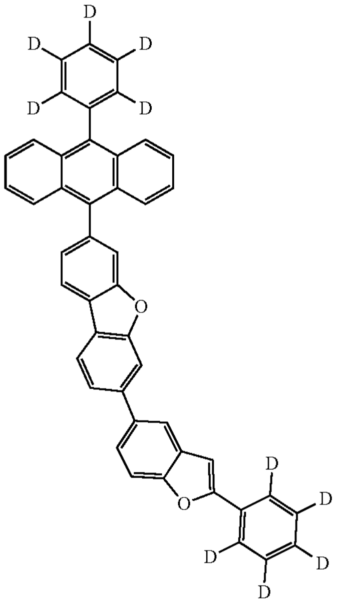
-continued
A-190
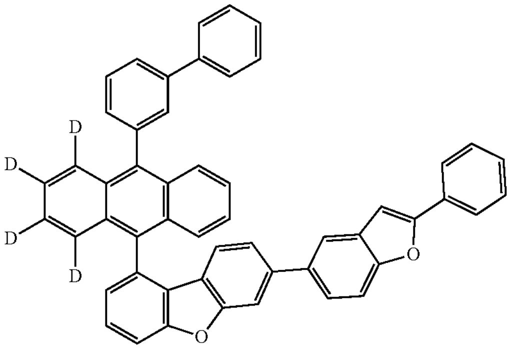
A-191
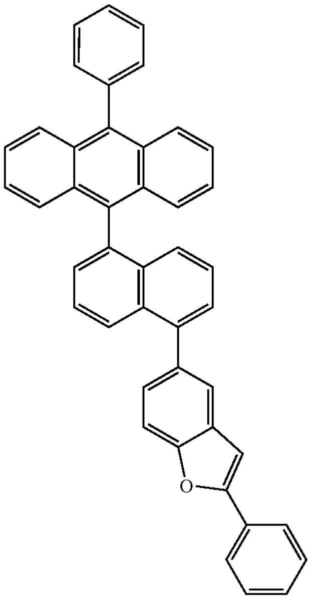
A-192
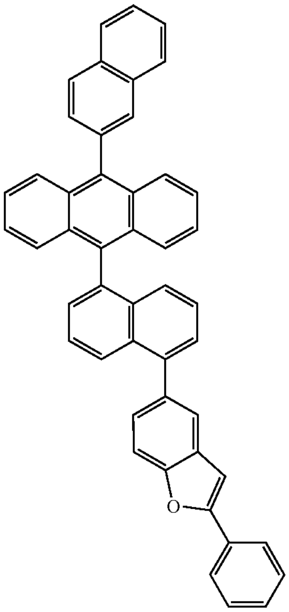

-continued
A-193
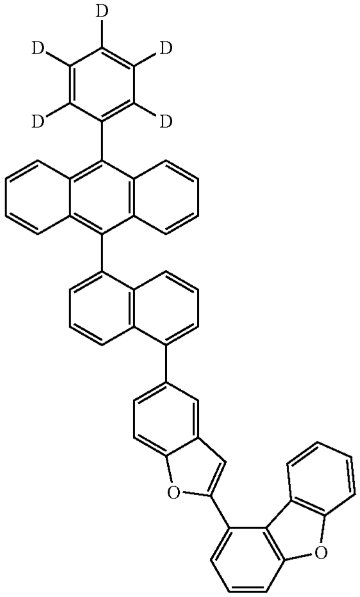
A-194
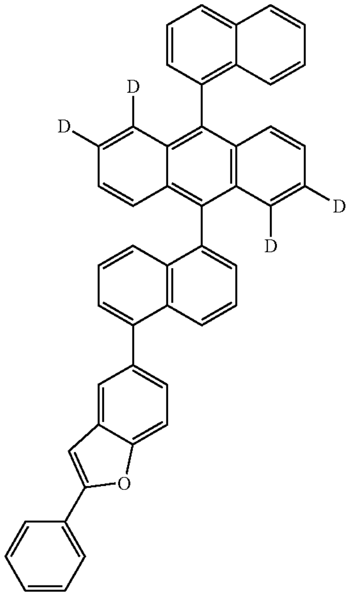
-continued
A-195
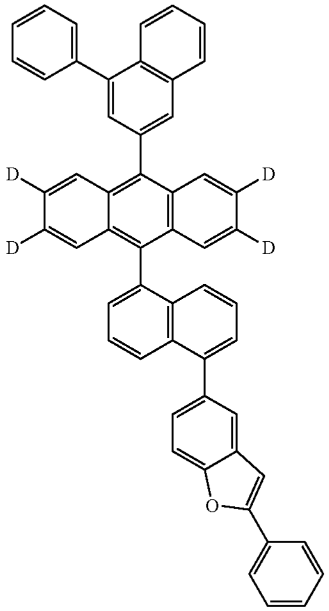
A-196
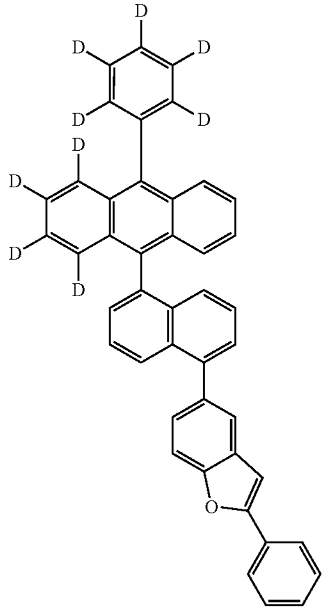

-continued
A-197
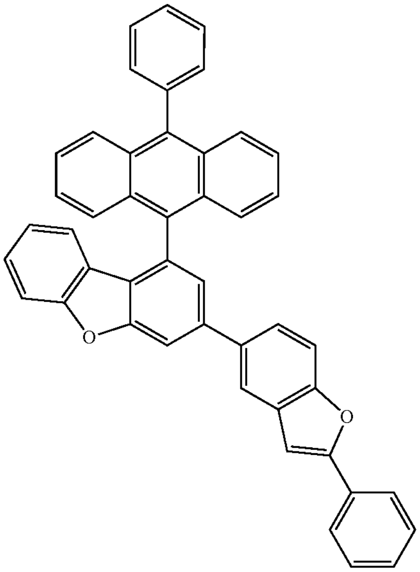
A-198
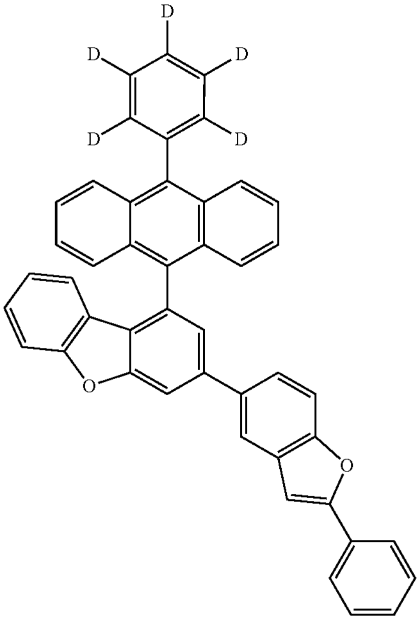
-continued
A-199
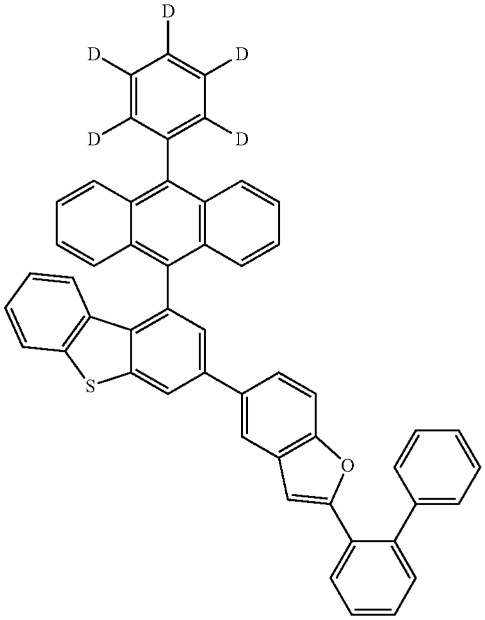
A-200
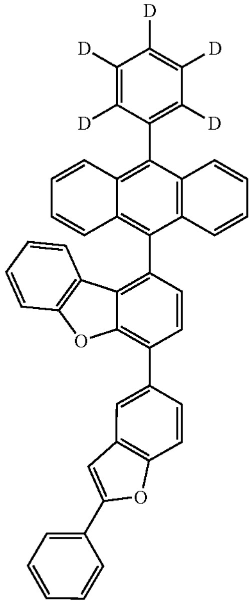

-continued
A-201
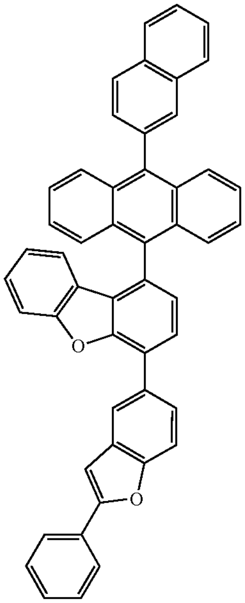
A-202
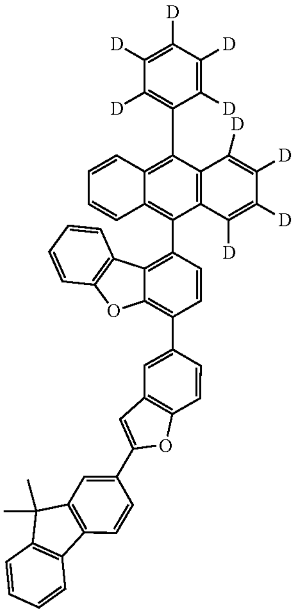
-continued
A-203
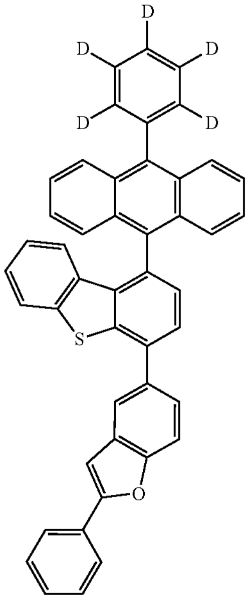
A-204
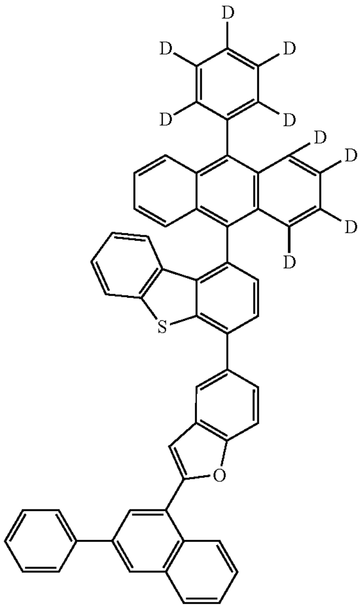

-continued
A-205
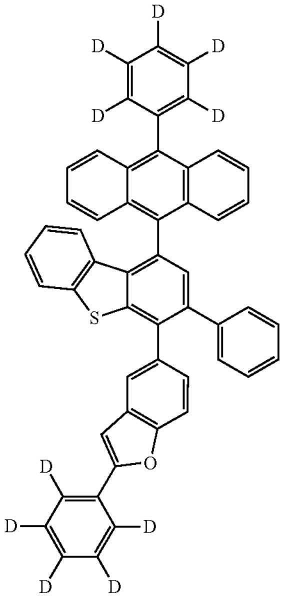
A-206
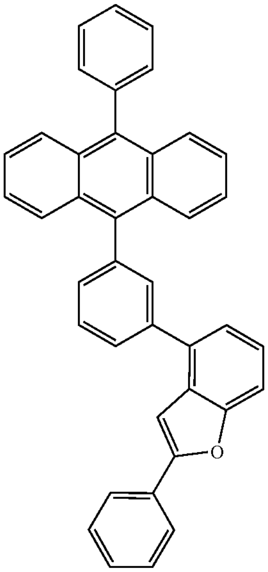
-continued
A-207
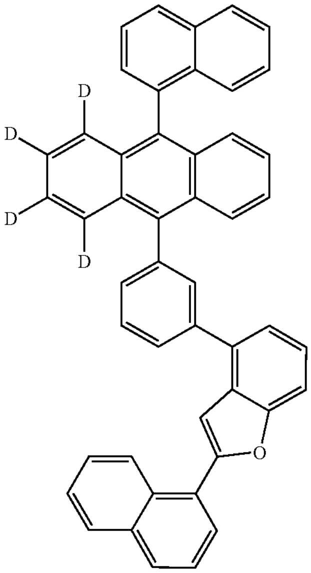
A-208
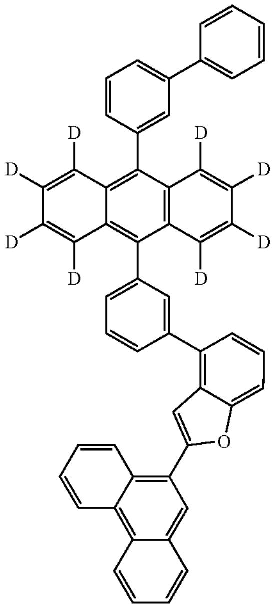

-continued
A-209
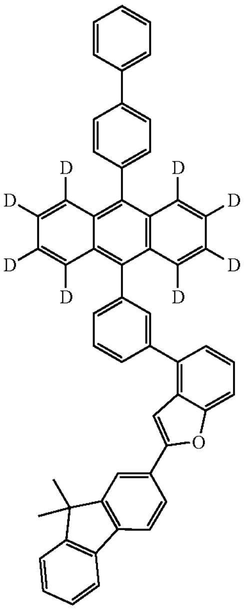
A-210
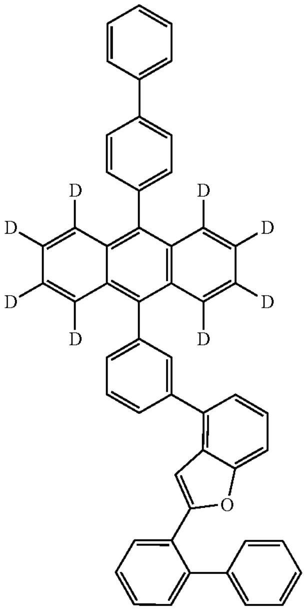
-continued
A-211
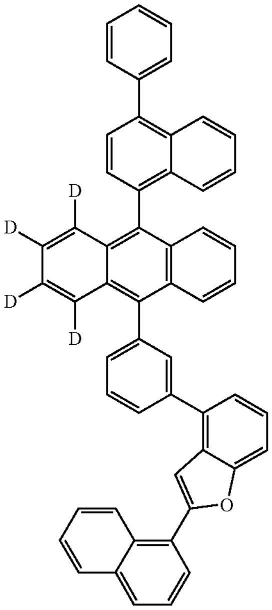
A-212
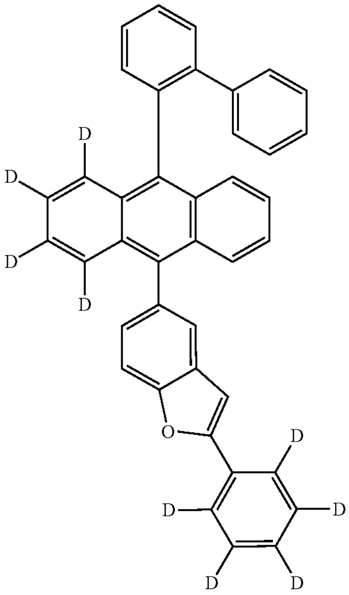
A-213
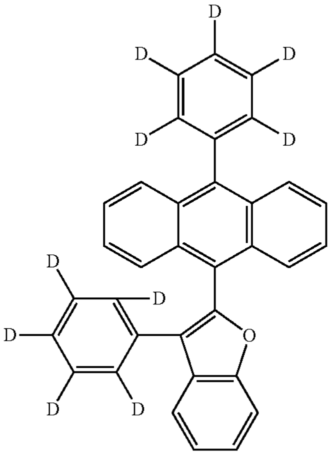

-continued

A-214

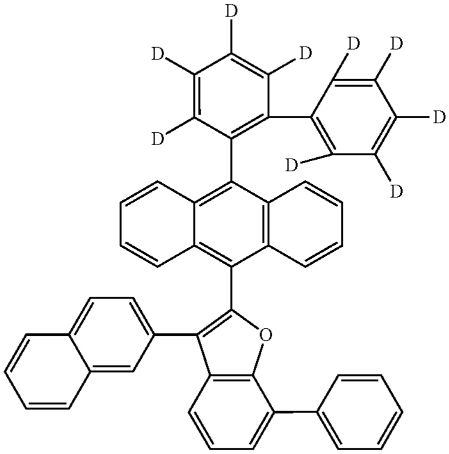

A-215

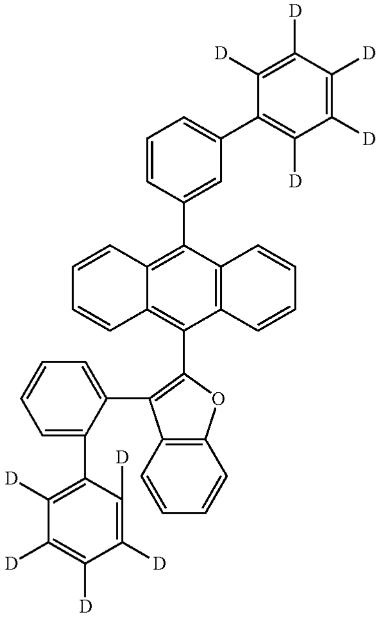

A-216

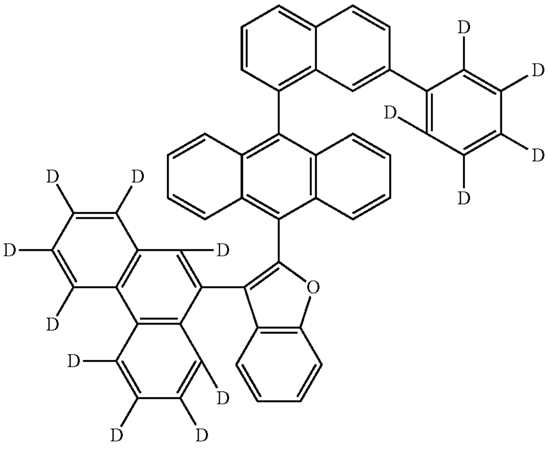

-continued

A-217

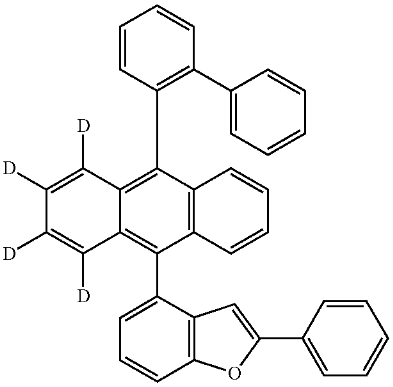

A-218

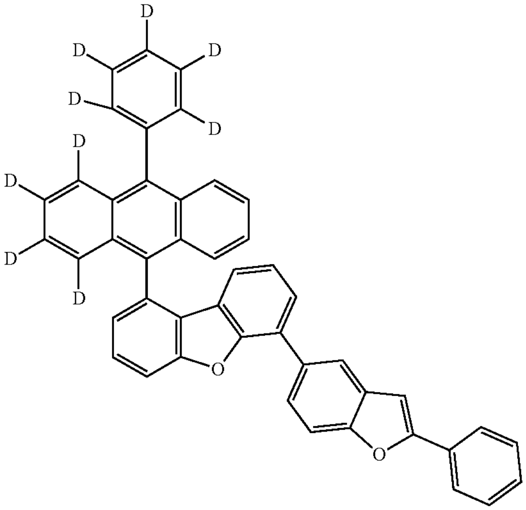

The compounds represented by the following [Formula B] to [Formula D] used in the electron injection layer, the electron transport layer, or the layer that injects and transports electrons as an organic layer in the organic light-emitting device according to the present invention may include at least one selected from the following compounds, but are not limited thereto.

The compound represented by [Formula B] above may be any one selected from the following compounds [B-1] to [B-196]:

B-1

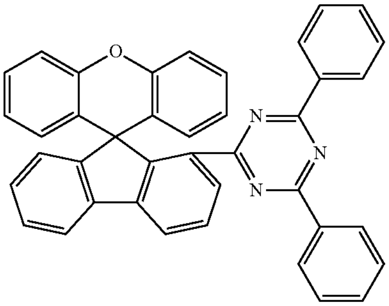

-continued
B-2
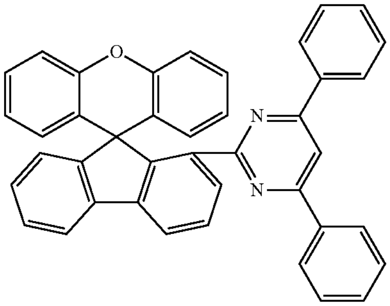
B-3
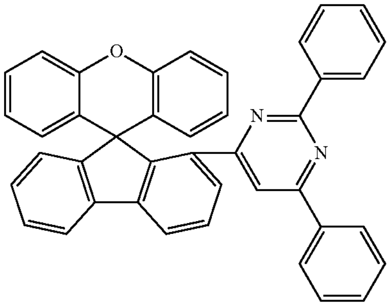
B-4
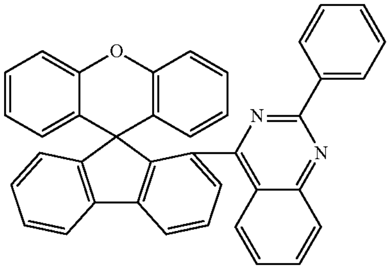
B-5
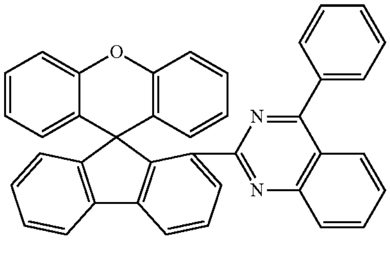
B-6
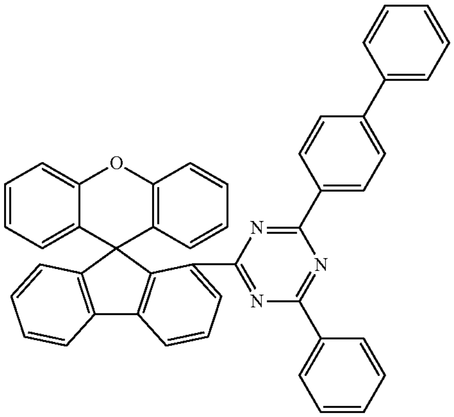
-continued
B-7
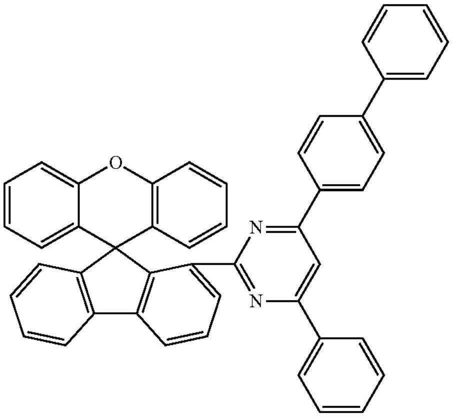
B-8
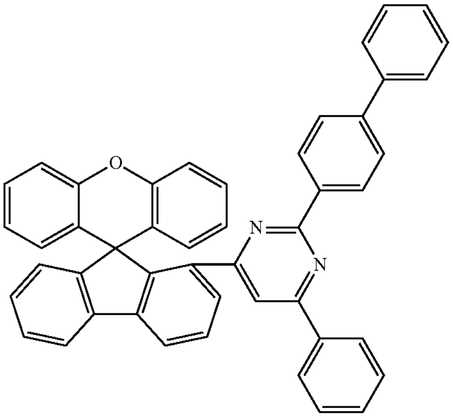
B-9
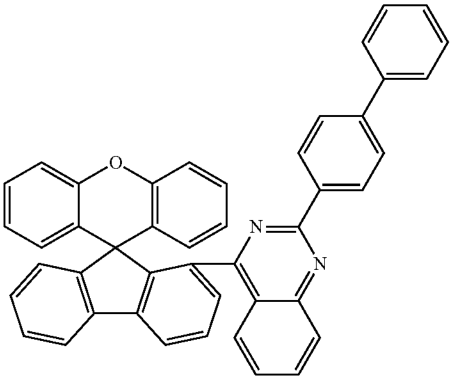
B-10
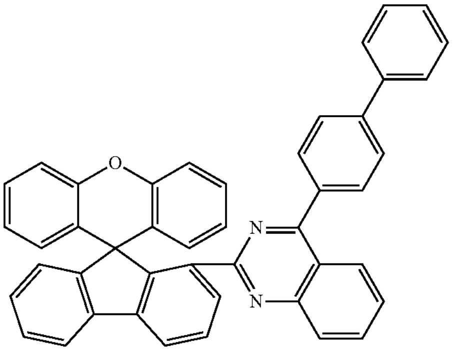

-continued
B-11
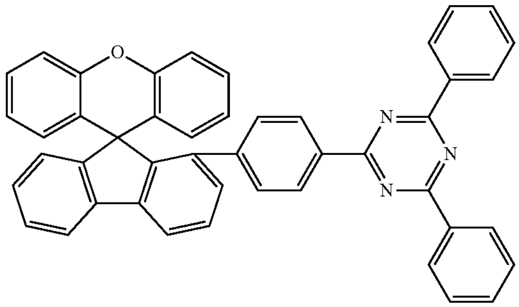
B-12
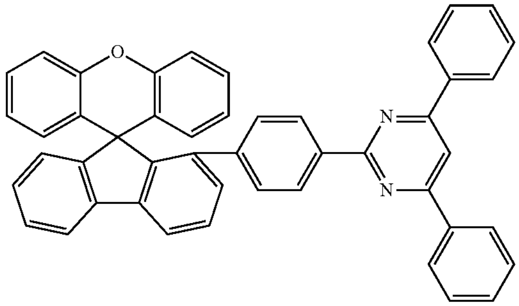
B-13
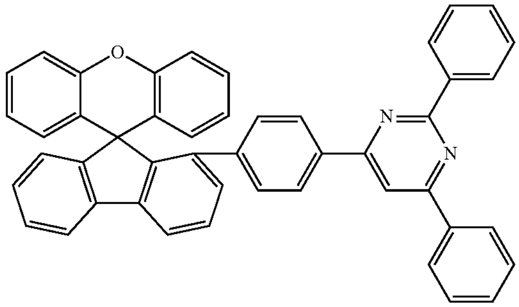
B-14
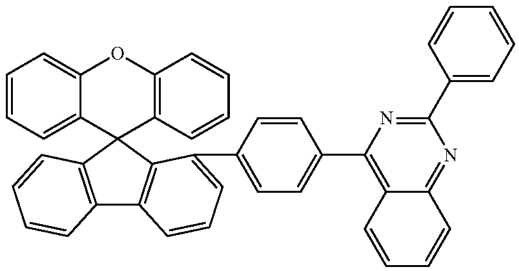
B-15
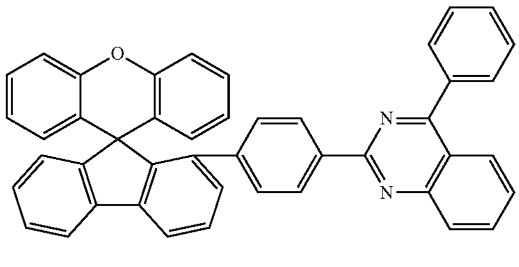
-continued
B-16
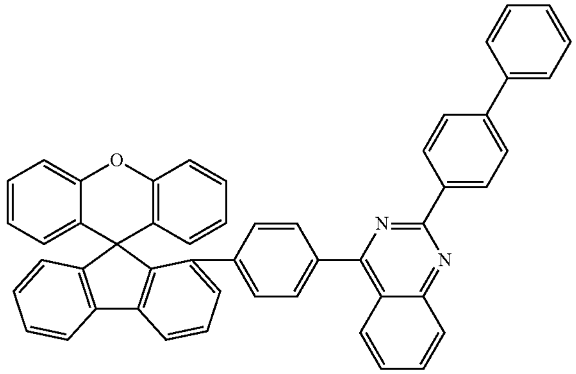
B-17
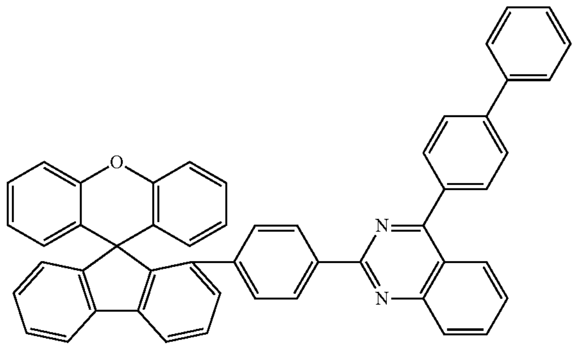
B-18
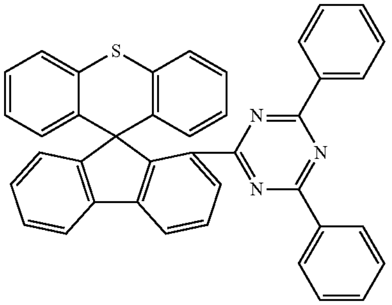
B-19
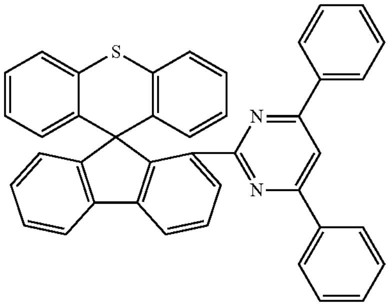

-continued
B-20
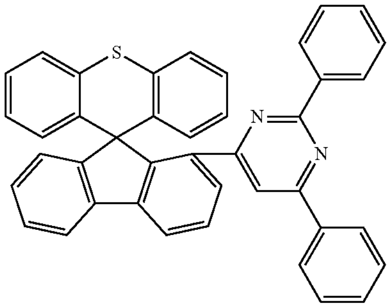
B-21
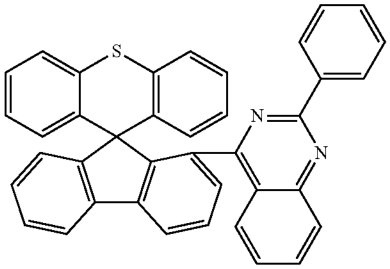
B-22
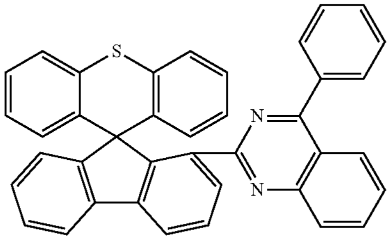
B-23
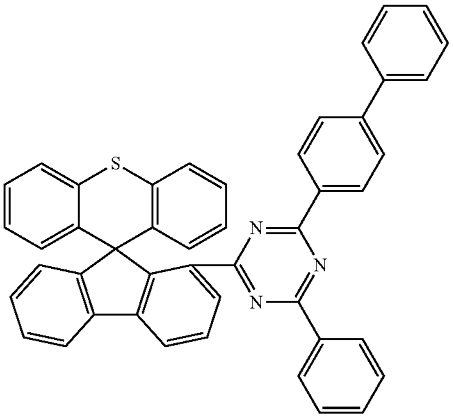
-continued
B-24
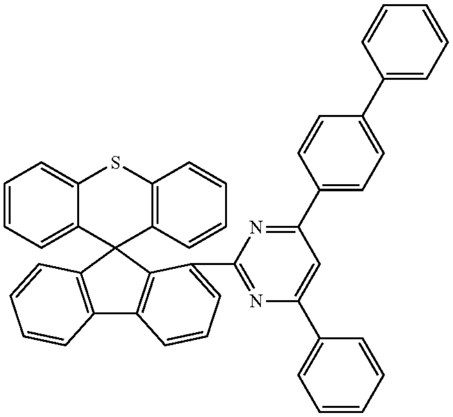
B-25
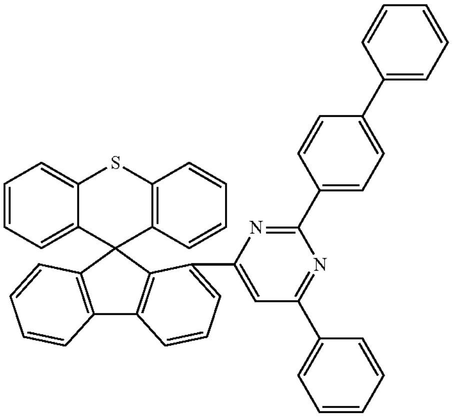
B-26
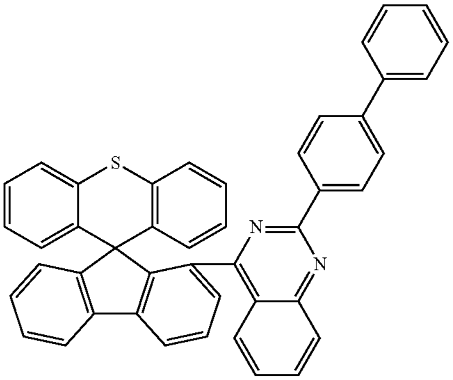
B-27
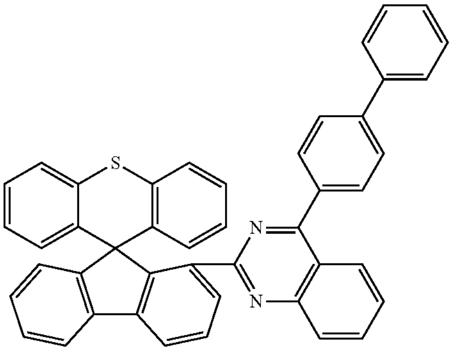

-continued
B-28
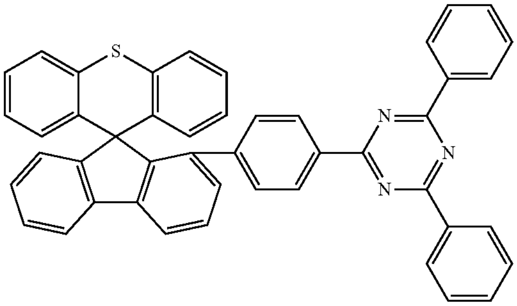
B-29
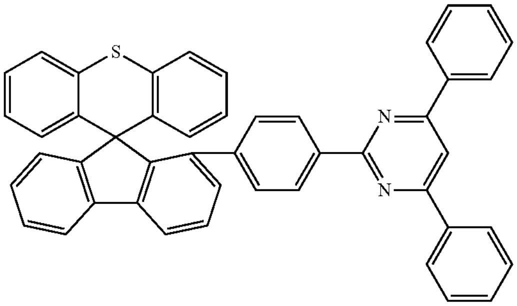
B-30
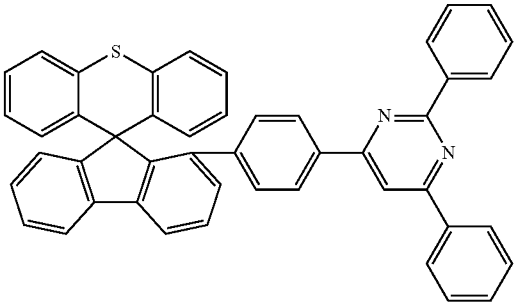
B-31
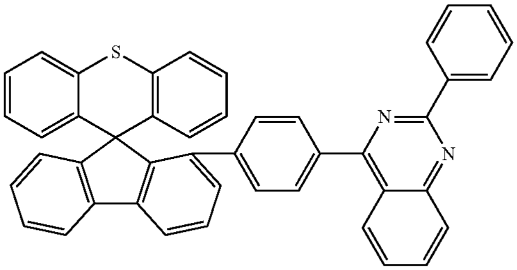
B-32
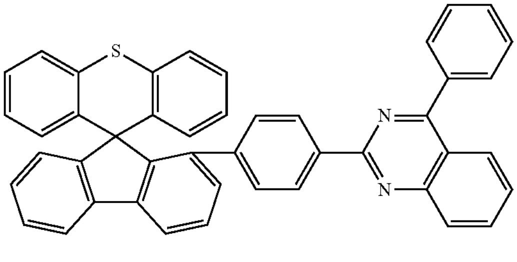
-continued
B-33
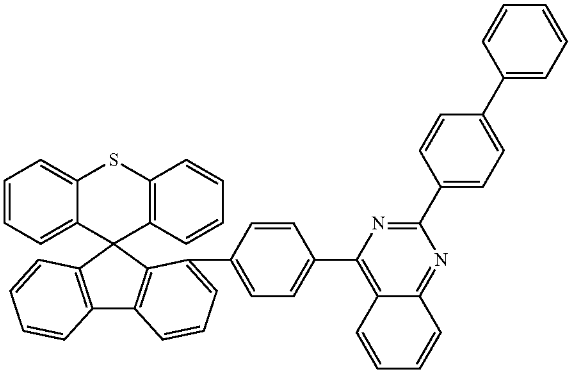
B-34
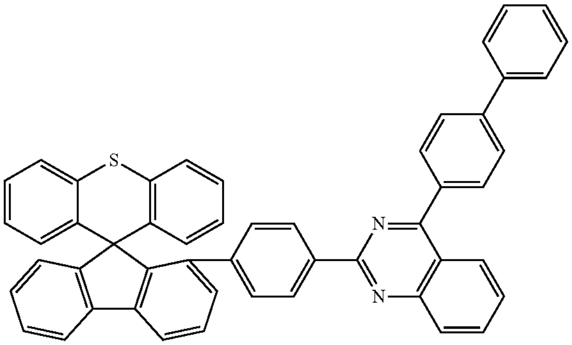
B-35
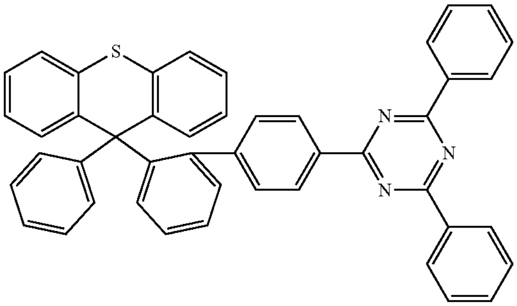
B-36
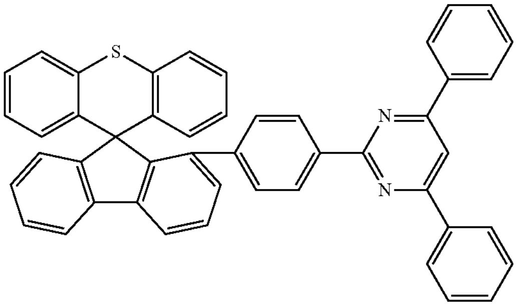

-continued
B-37
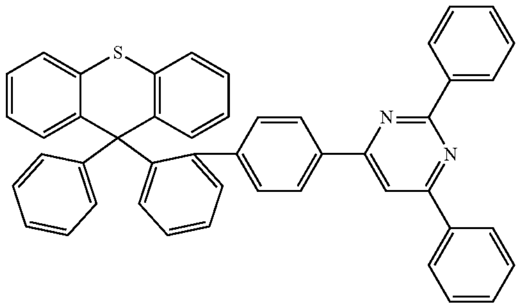
B-38
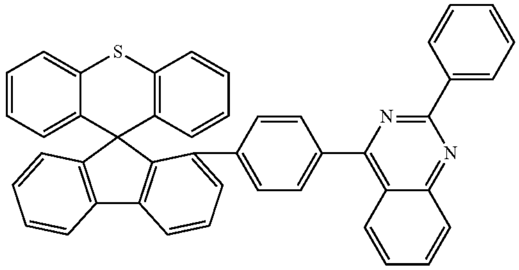
B-39
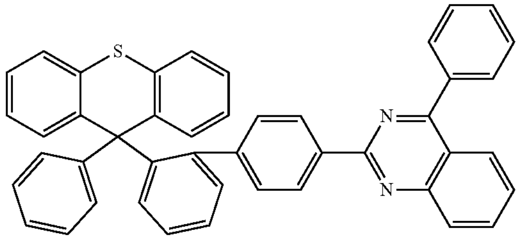
B-40
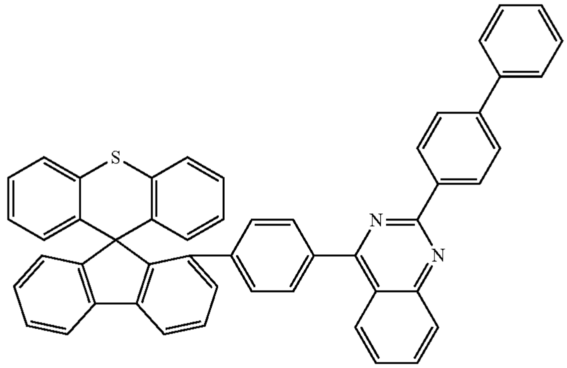
B-41
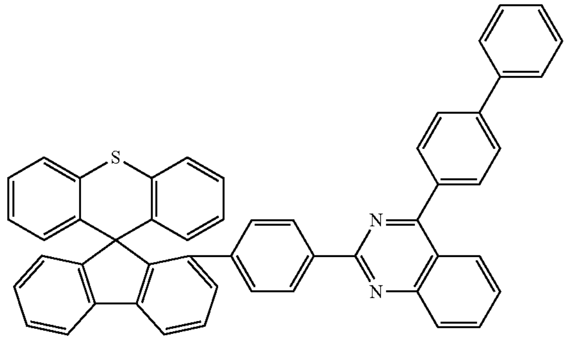
-continued
B-42
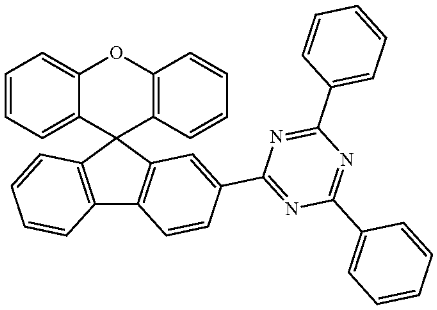
B-43
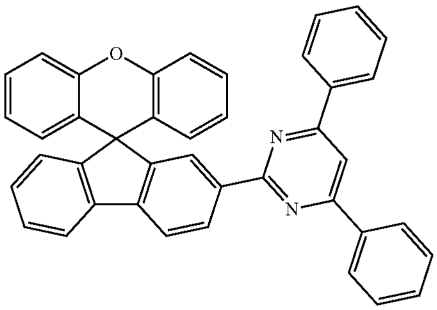
B-44
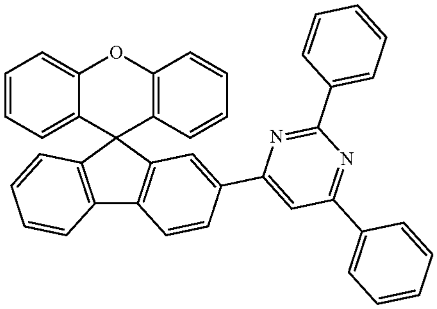
B-45
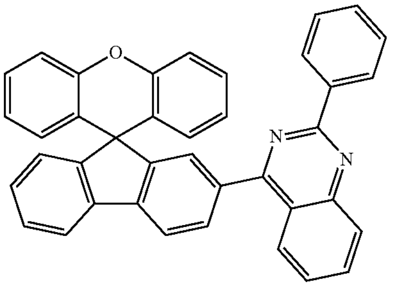
B-46
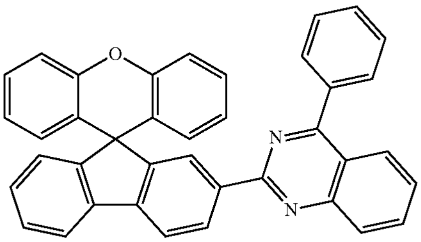

-continued
B-47
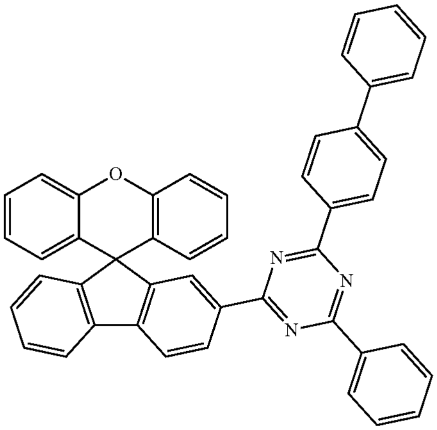
B-48
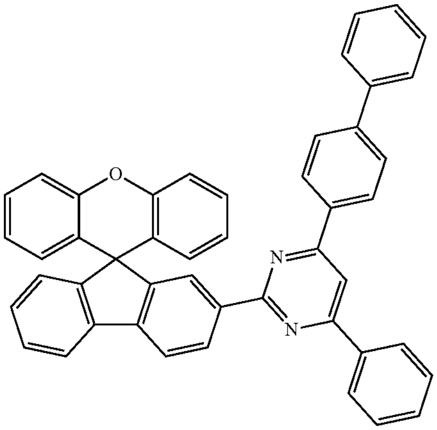
B-49
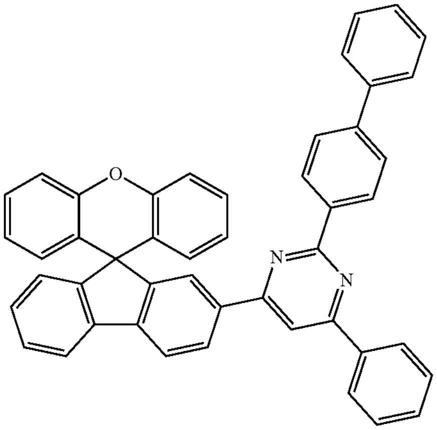
-continued
B-50
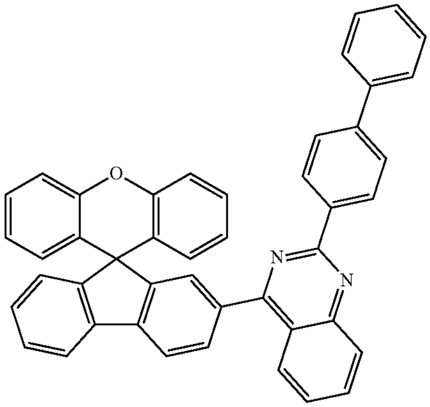
B-51
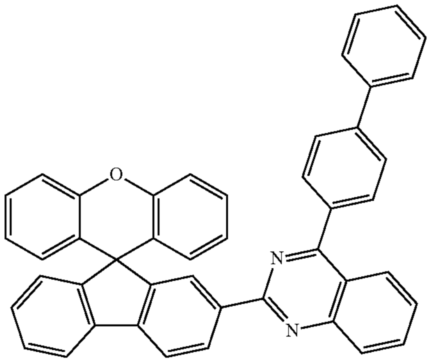
B-52
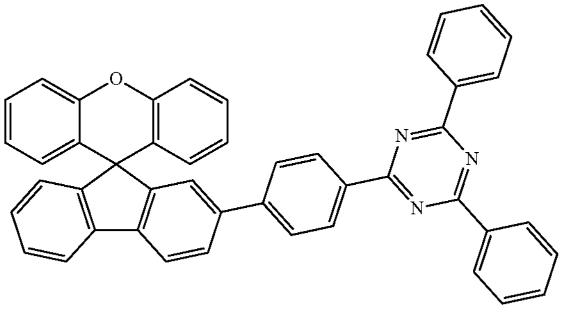
B-53
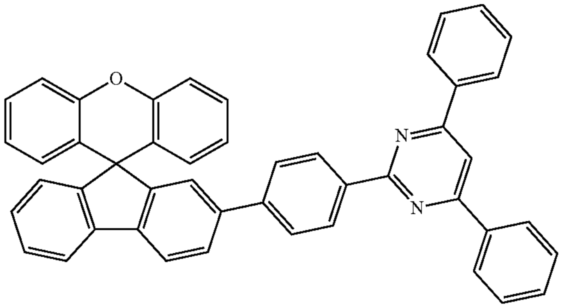

B-54
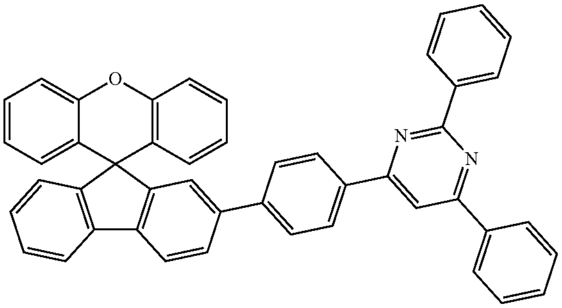
B-55
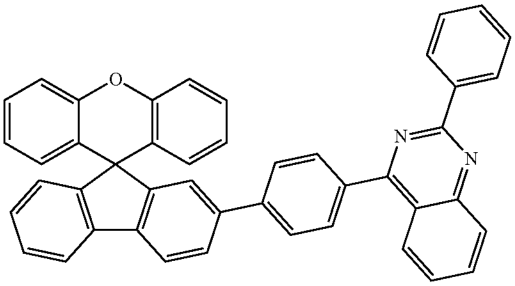
B-56
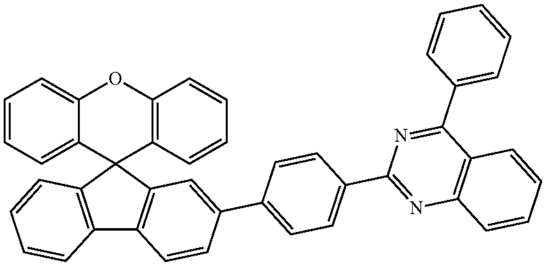
B-57
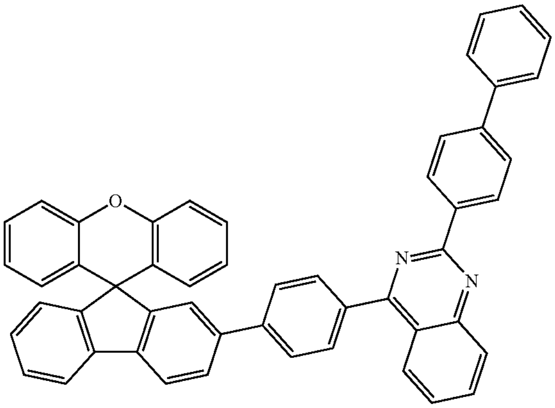
B-58
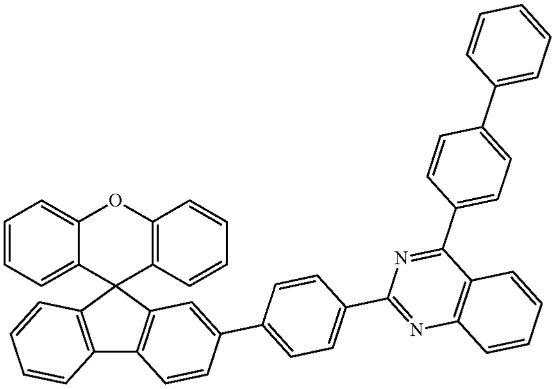
B-59
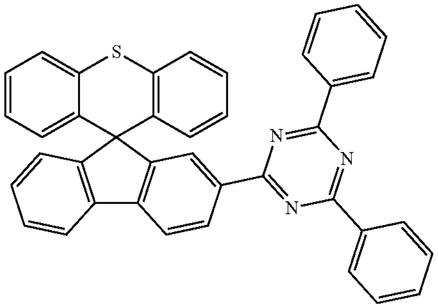
B-60
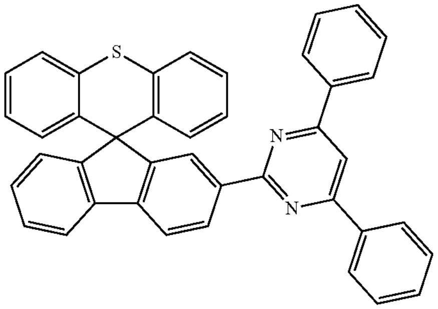
B-61
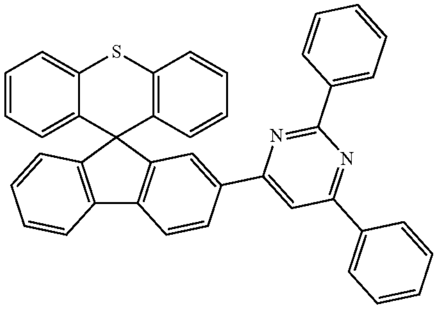
B-62
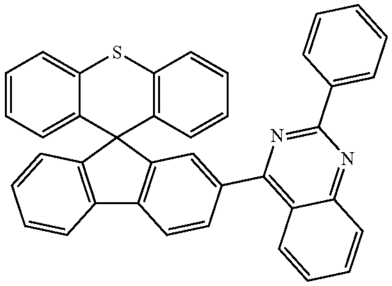

-continued
B-63
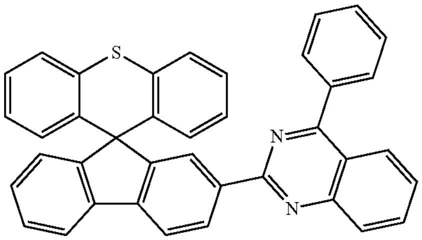
B-64
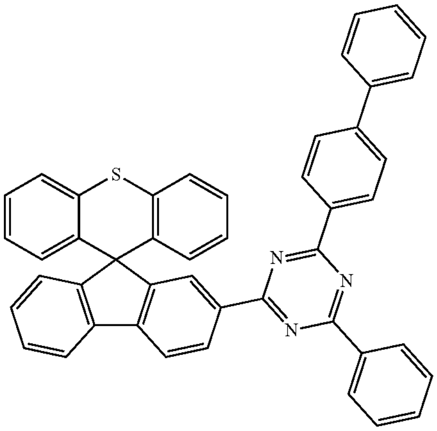
B-65
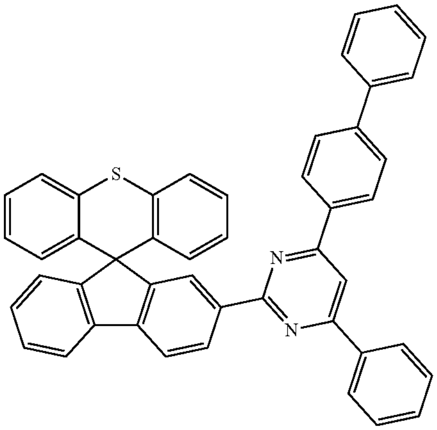
B-66
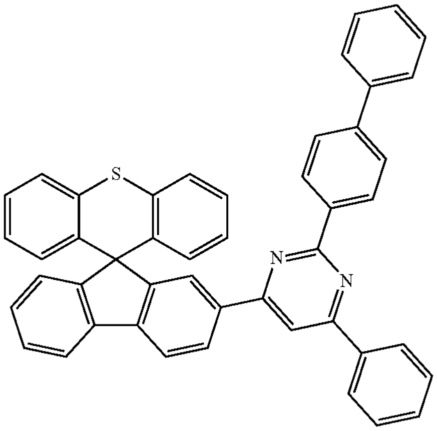
-continued
B-67
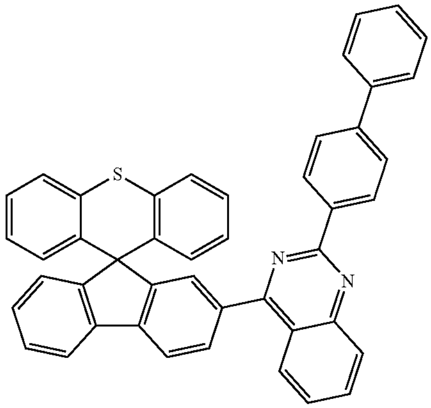
B-68
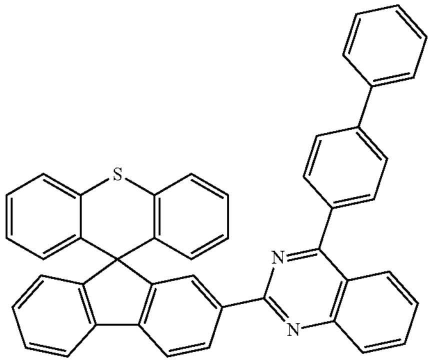
B-69
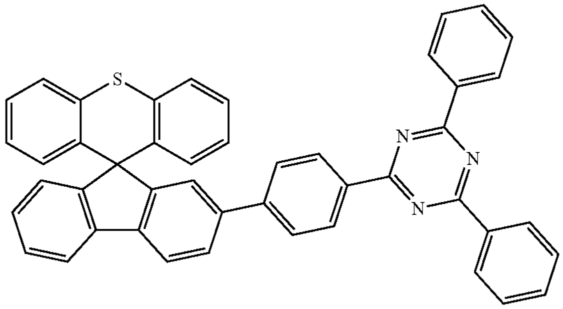
B-70
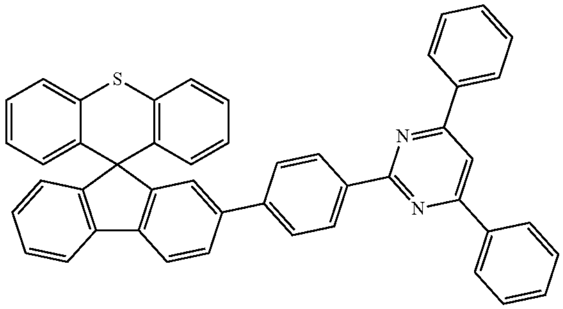

-continued
B-71
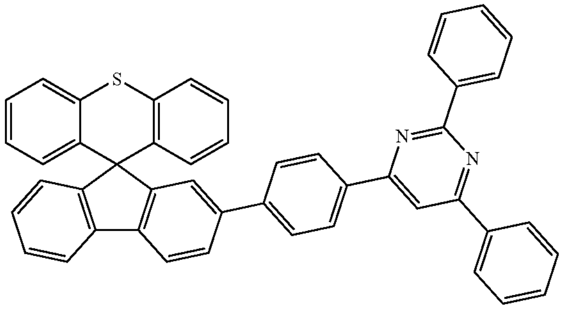
B-72
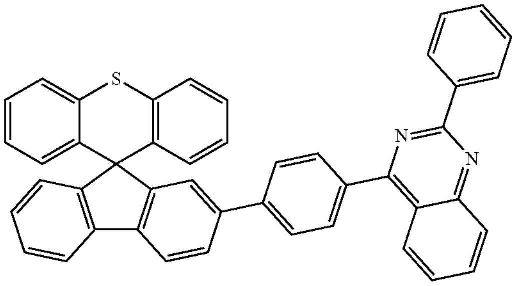
B-73
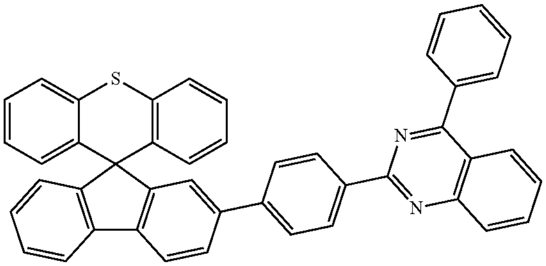
B-74
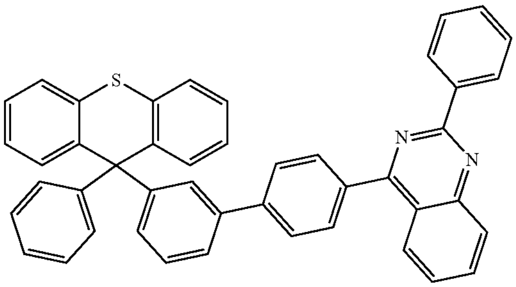
-continued
B-75
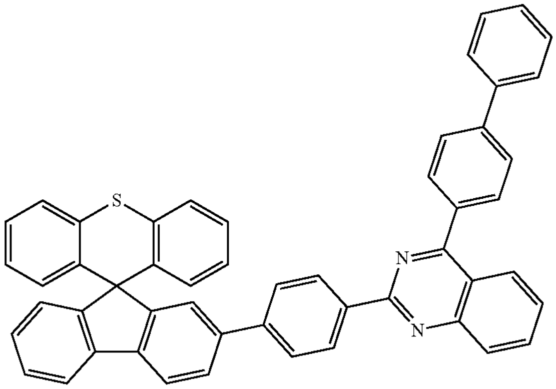
B-76
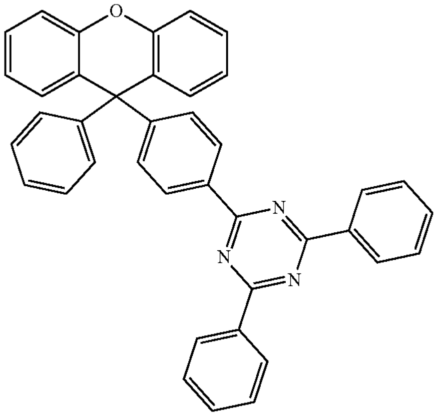
B-77
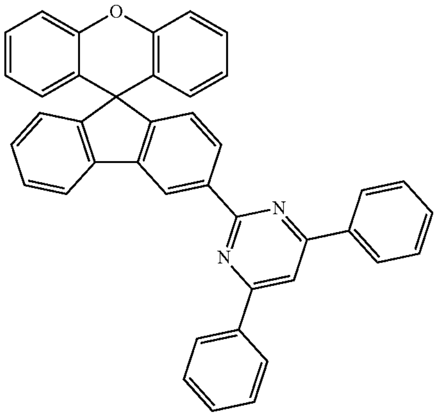

-continued
B-78
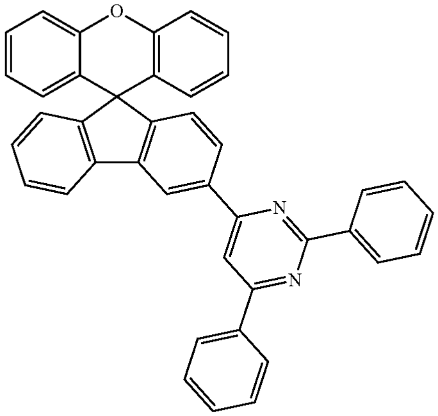
B-79
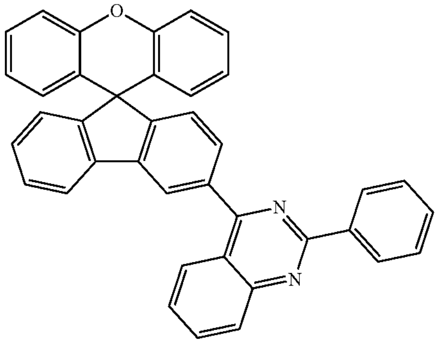
B-80
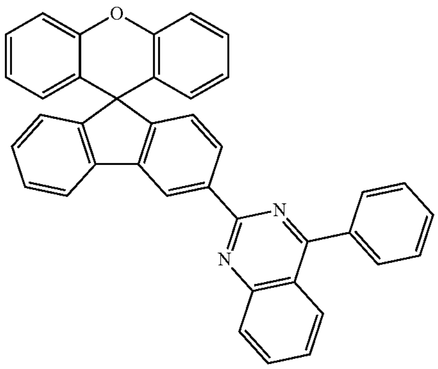
B-81
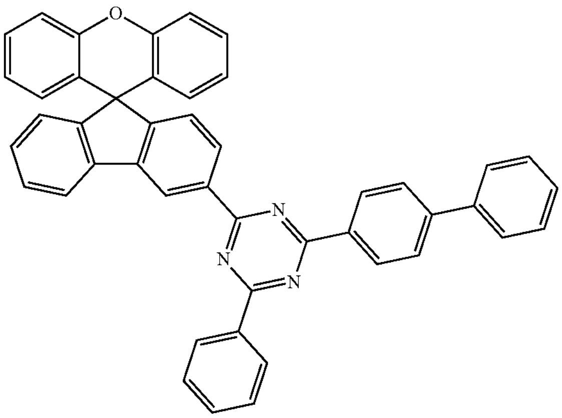
-continued
B-82
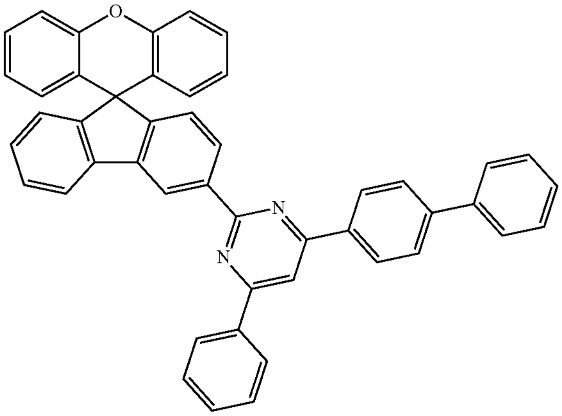
B-83
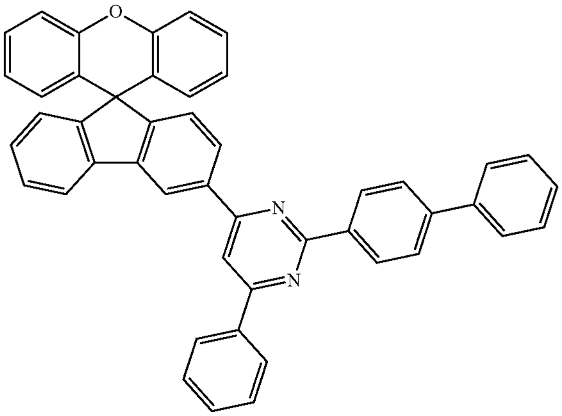
B-84
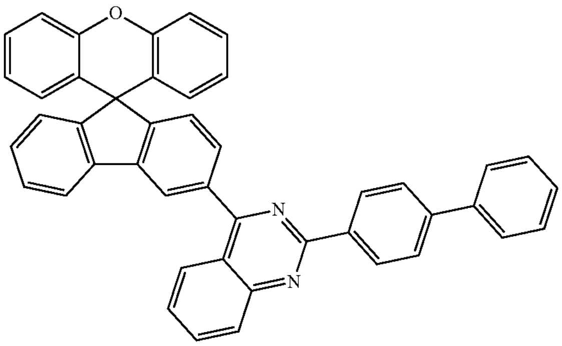
B-85
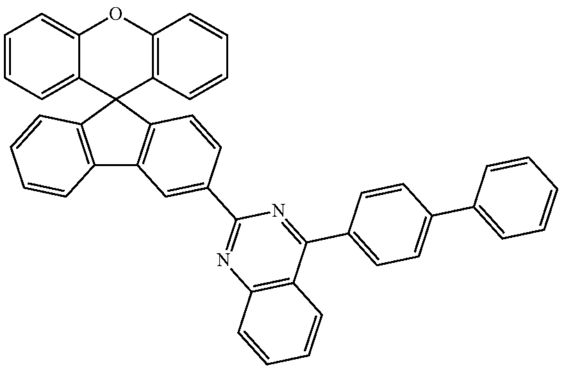

-continued
B-86
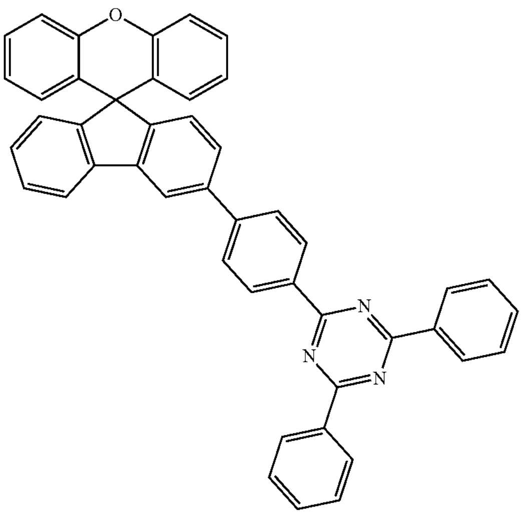
B-87
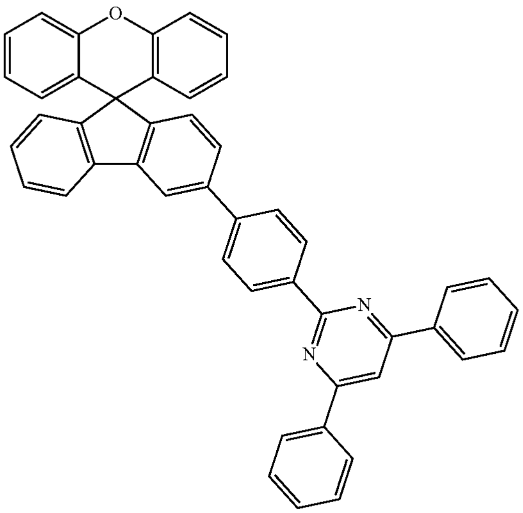
B-88
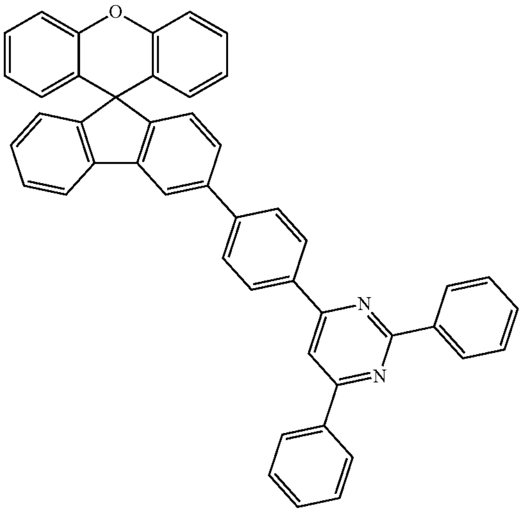
-continued
B-89
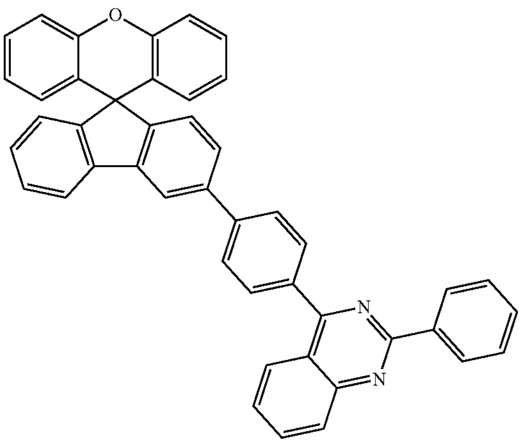
B-90
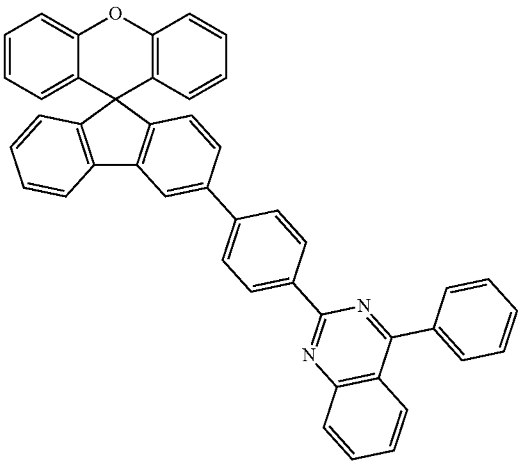
B-91
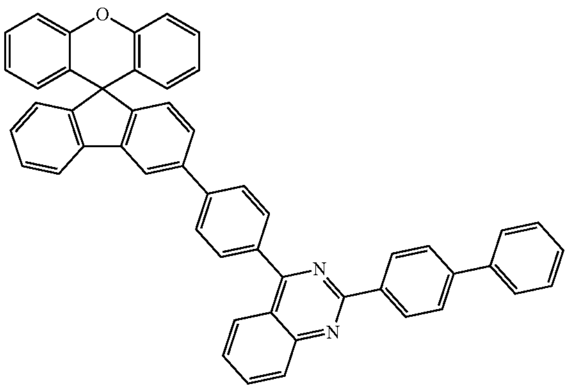

-continued
B-92
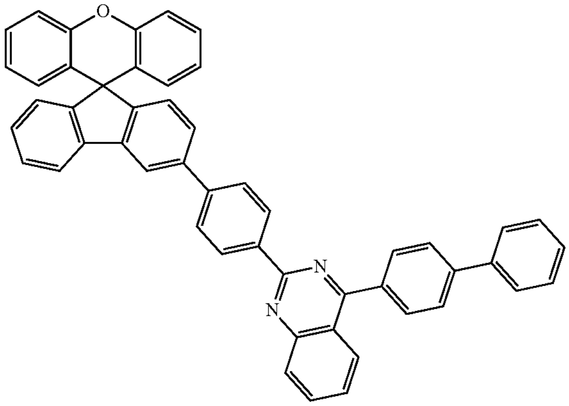
B-93
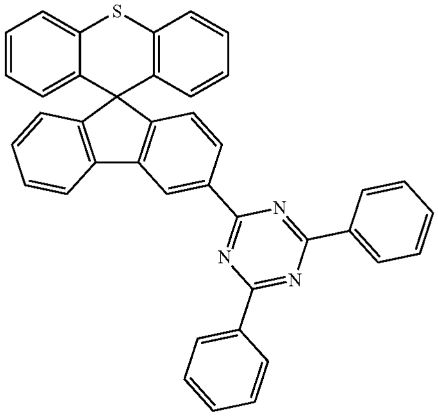
B-94
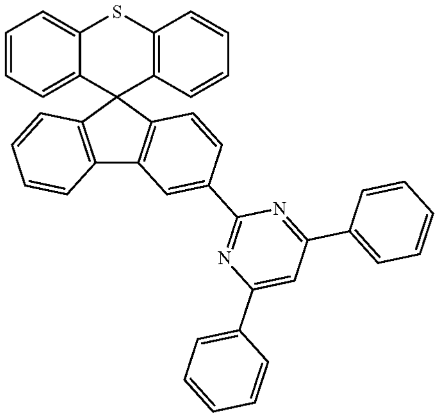
-continued
B-95
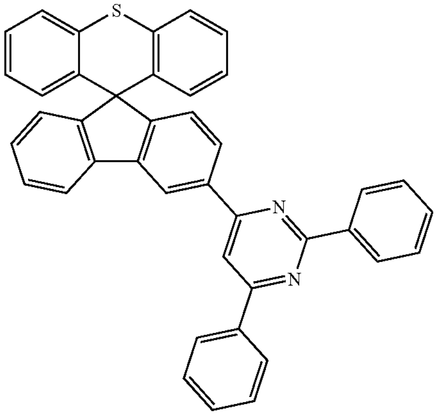
B-96
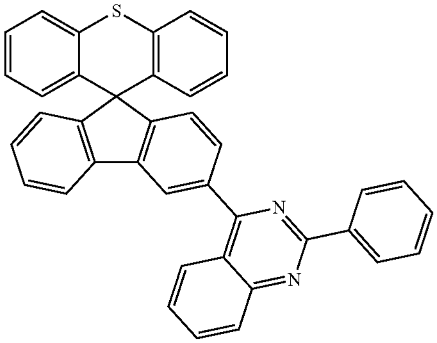
B-97
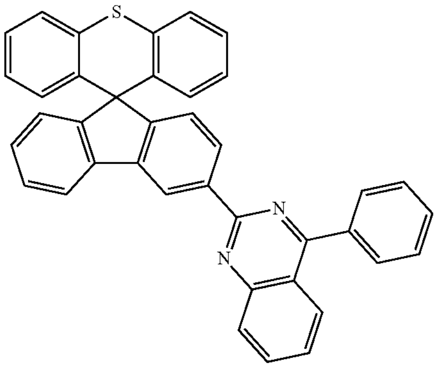
B-98
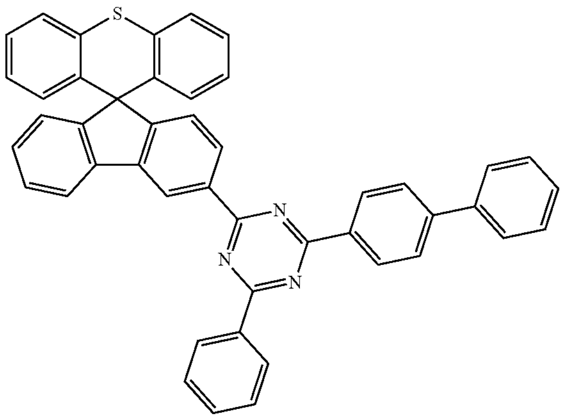

-continued
B-99
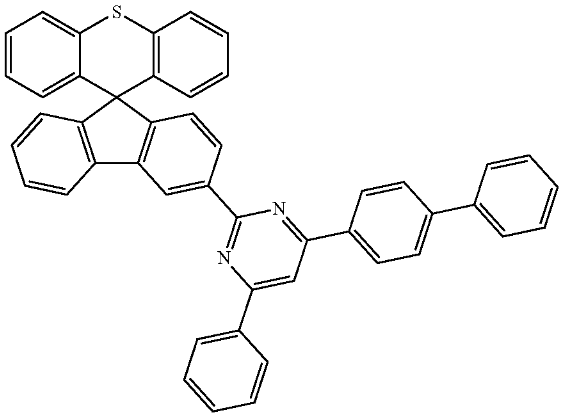
B-100
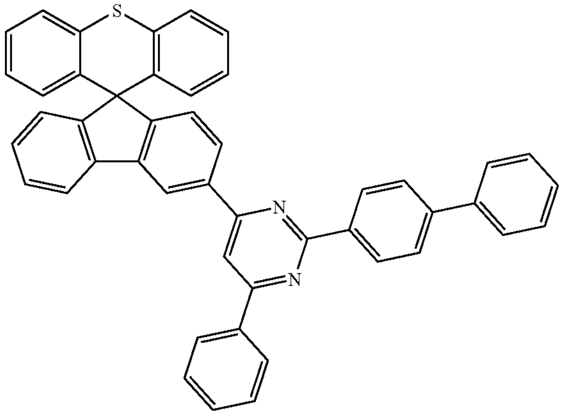
B-101
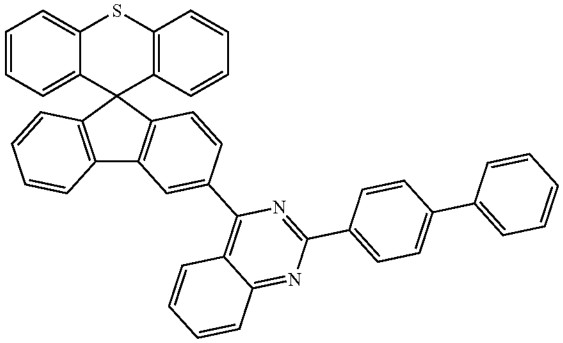
B-102
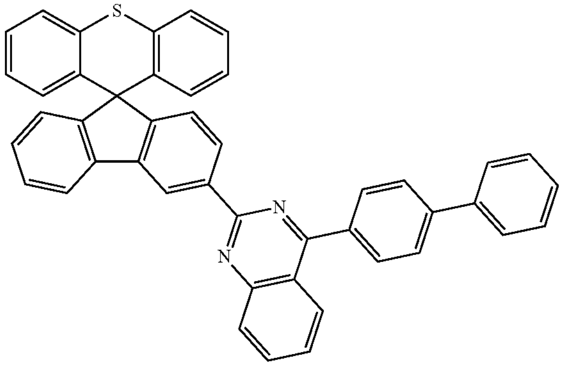
-continued
B-103
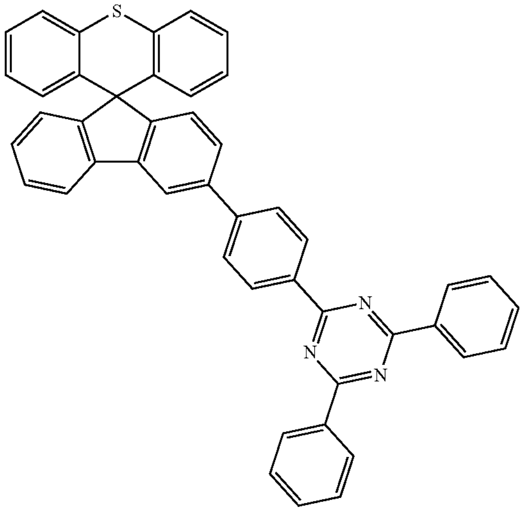
B-104
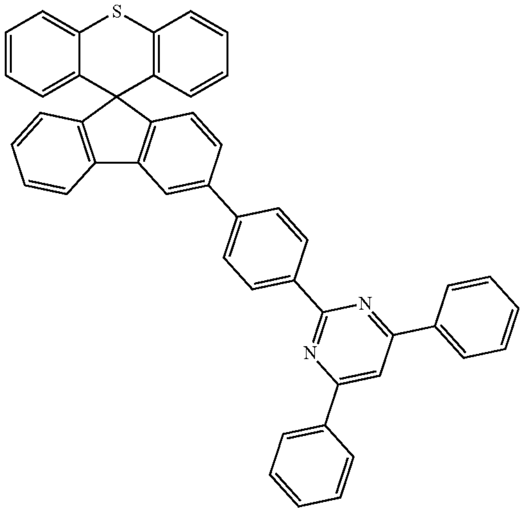
B-105
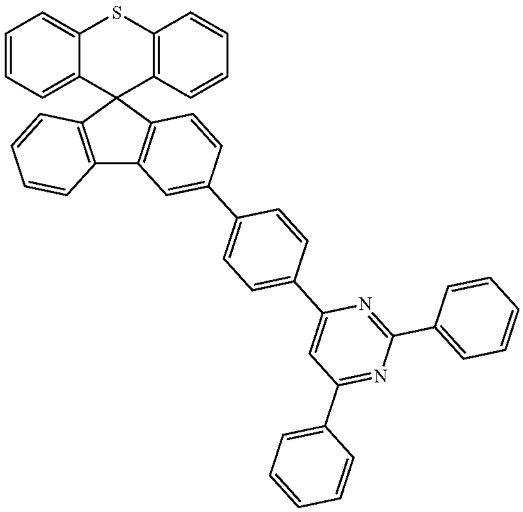

-continued
B-106
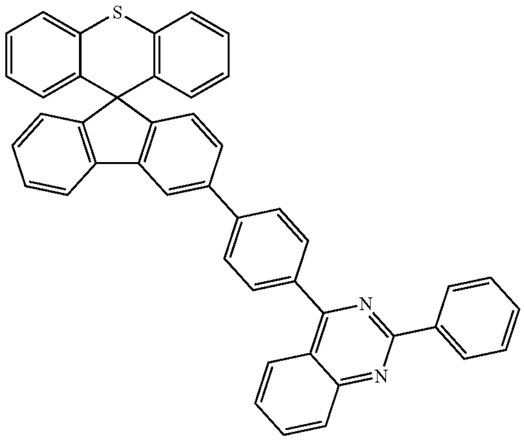
B-107
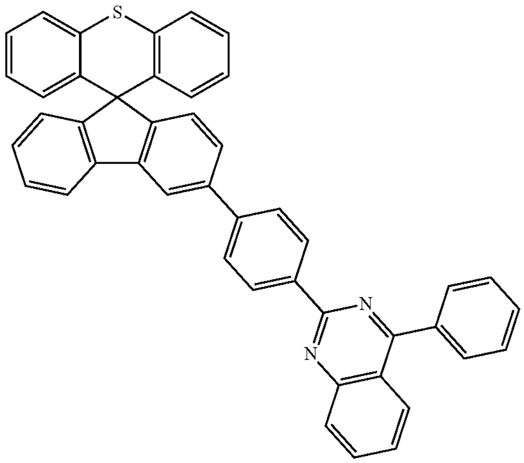
B-108
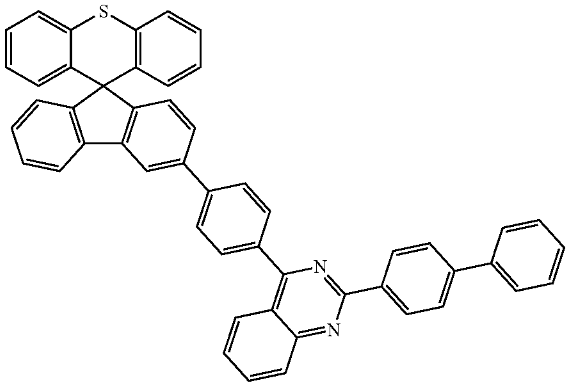
-continued
B-109
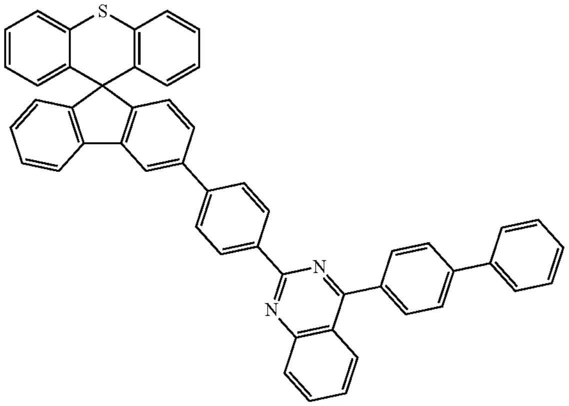
B-110
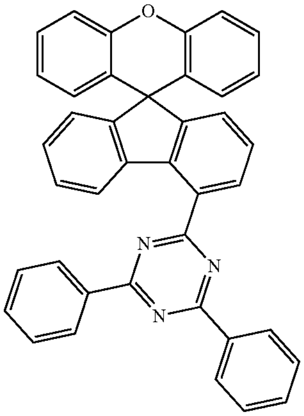
B-111
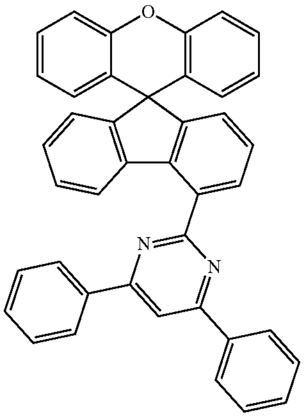

-continued
B-112
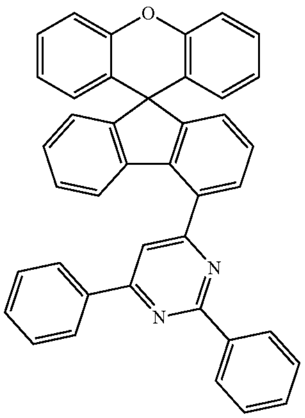
B-113
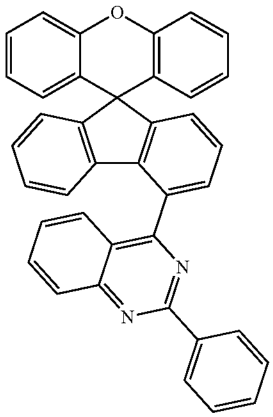
B-114
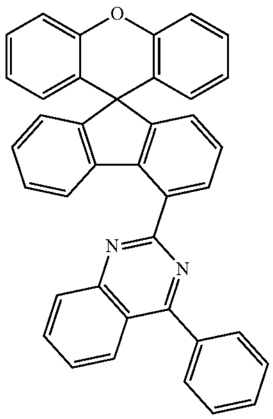
B-115
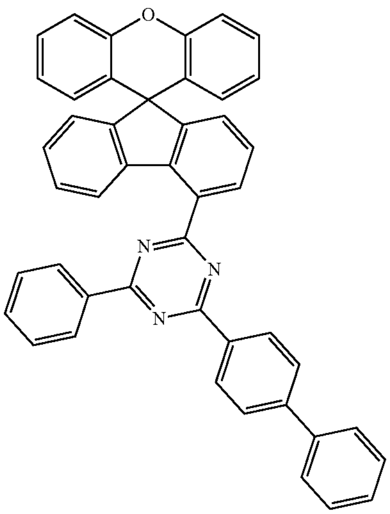
B-116
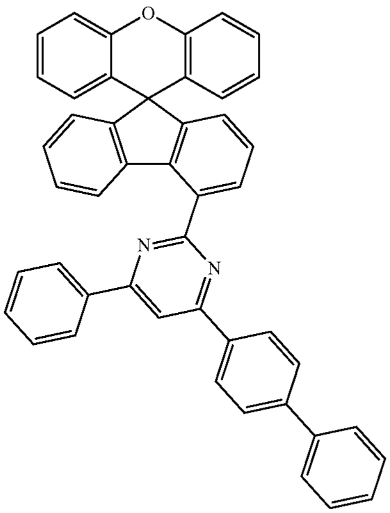
B-117
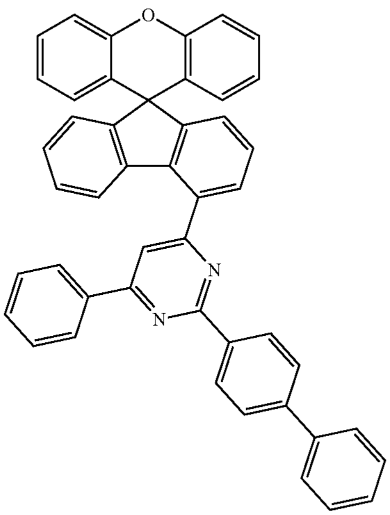

-continued
B-118
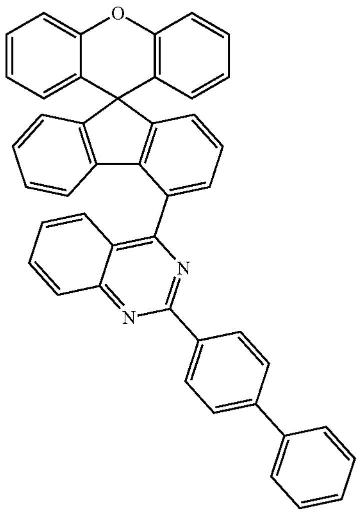
B-119
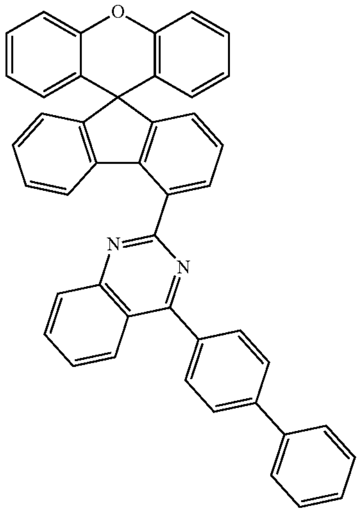
B-120
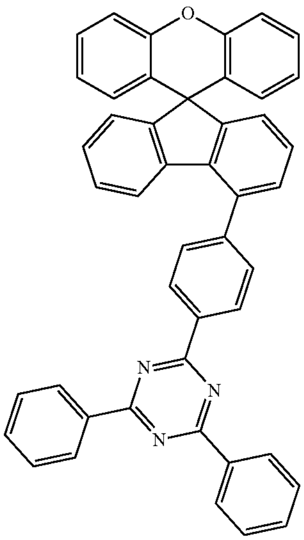
-continued
B-121
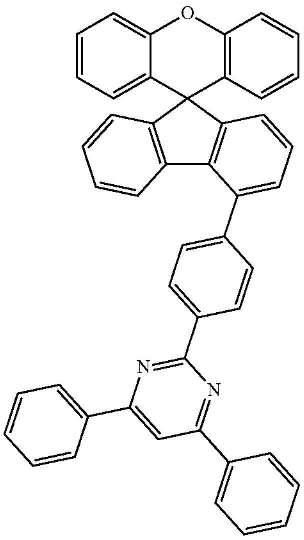
B-122
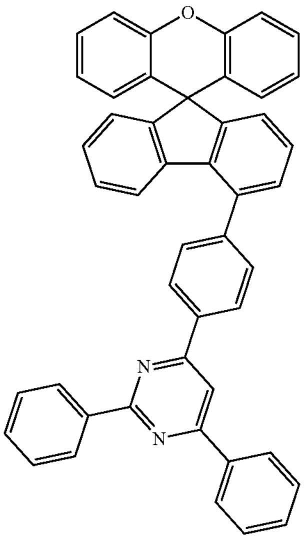
B-123
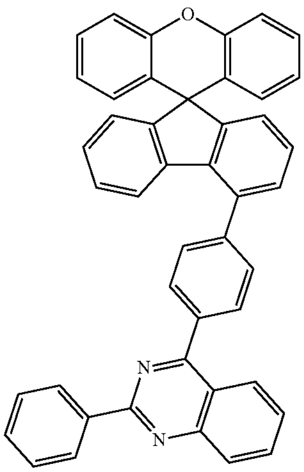

-continued
B-124
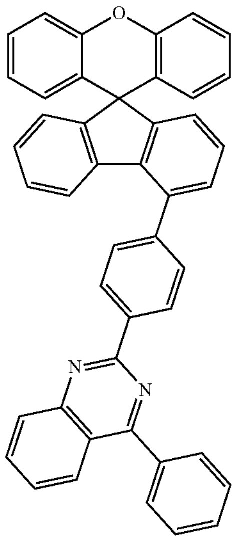
B-125
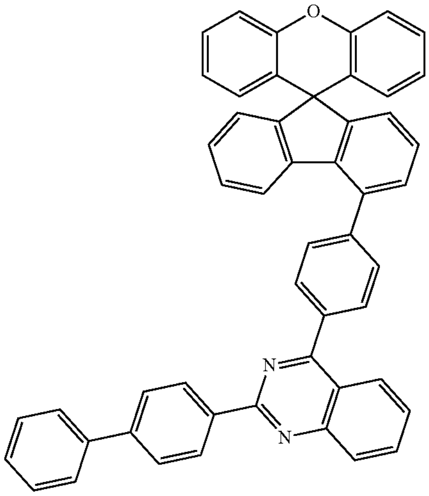
B-126
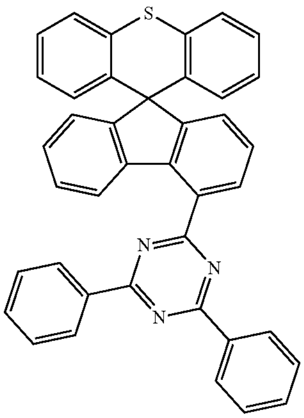
-continued
B-127
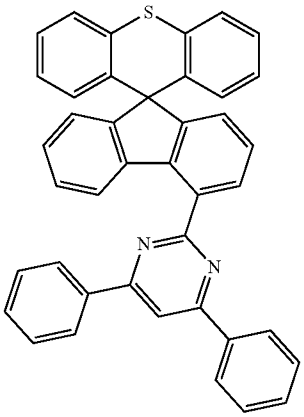
B-128
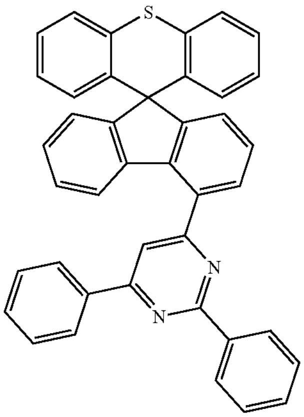
B-129
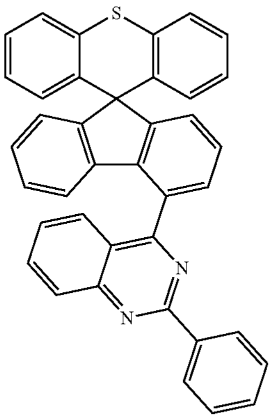

-continued
B-130
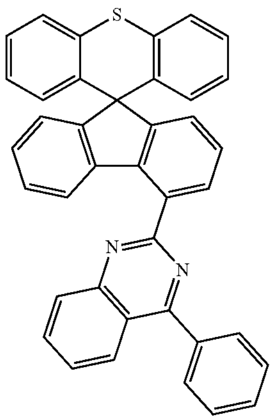
B-131
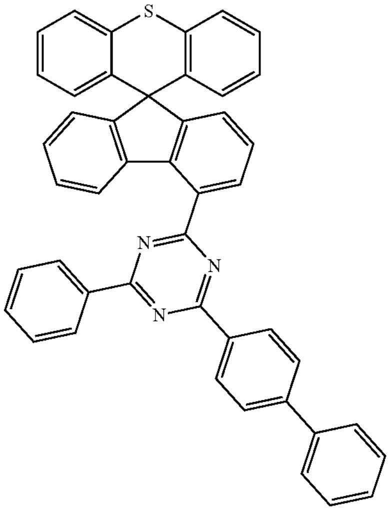
B-132
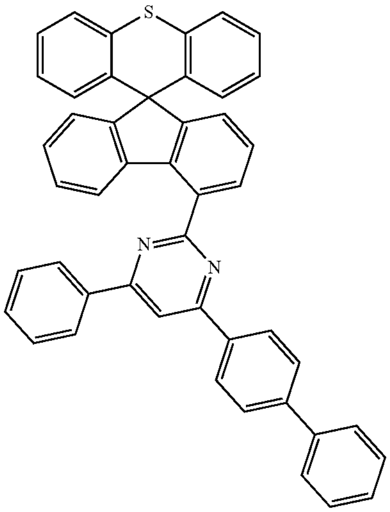
-continued
B-133
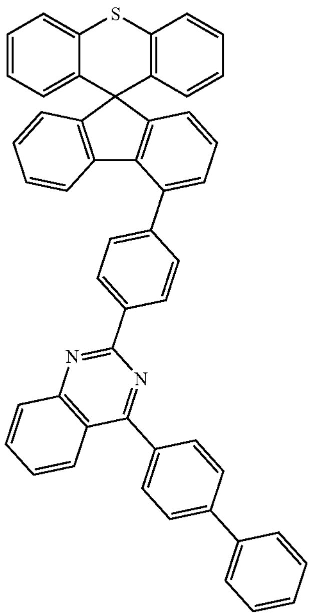
B-134
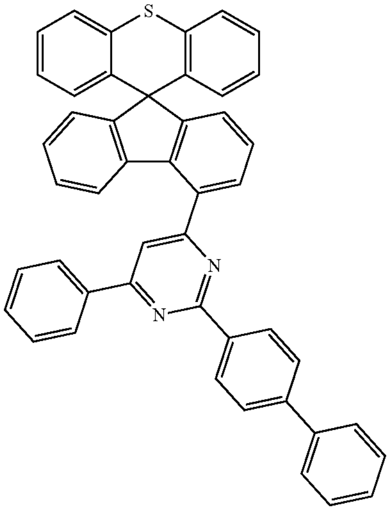
B-135
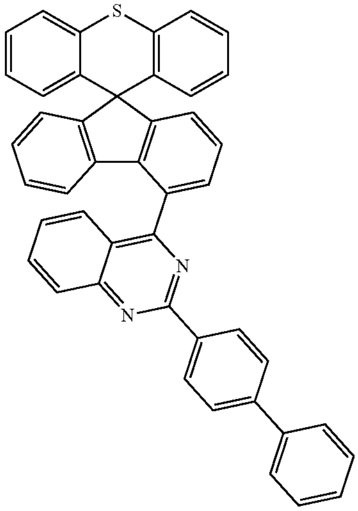

-continued
B-136
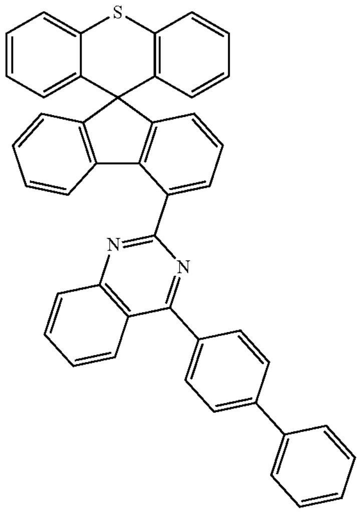
B-137
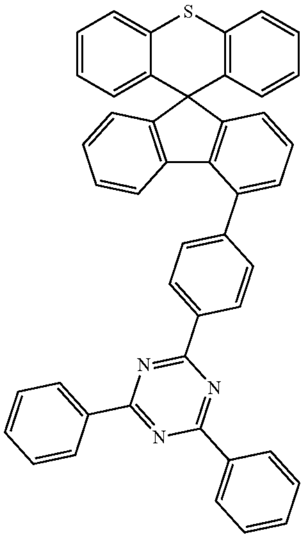
B-138
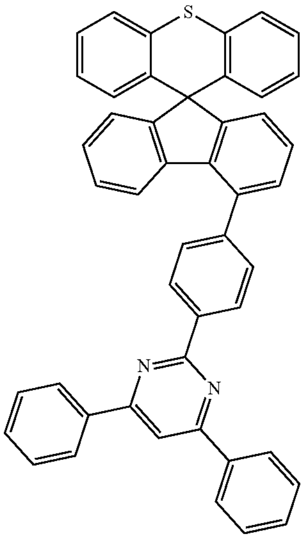
-continued
B-139
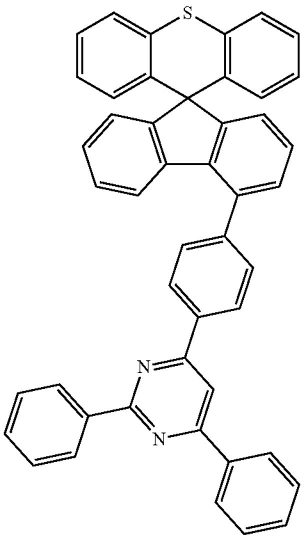
B-140
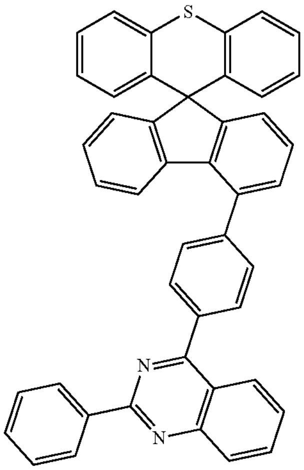
B-141
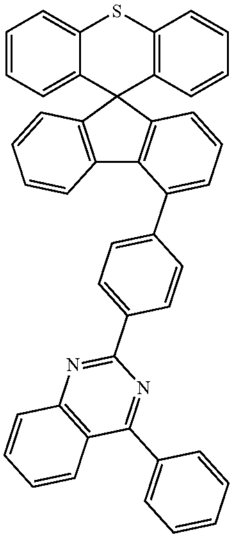

-continued
B-142
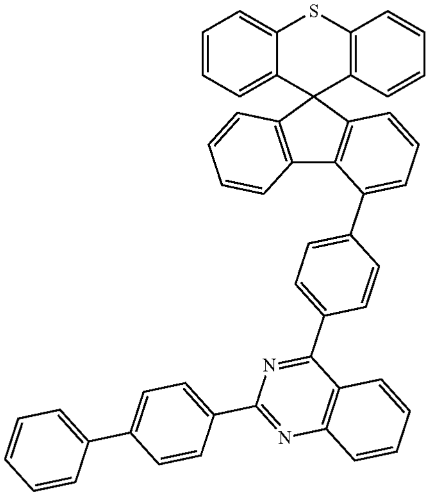
B-143
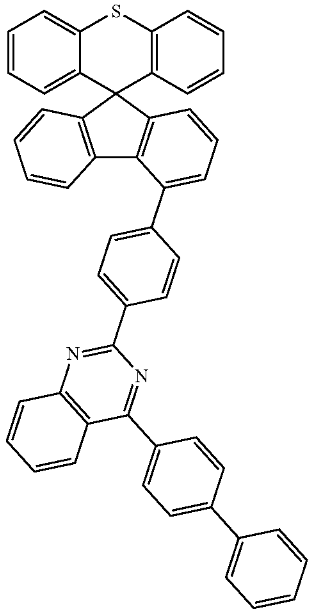
B-144
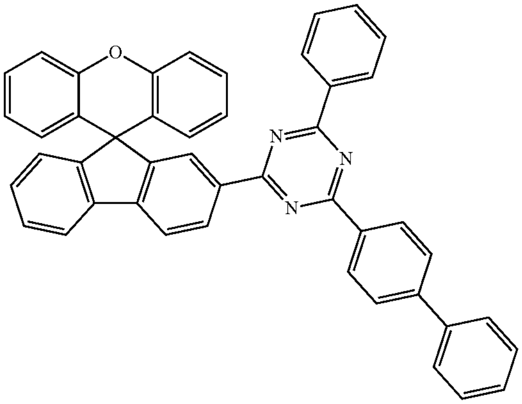
-continued
B-145
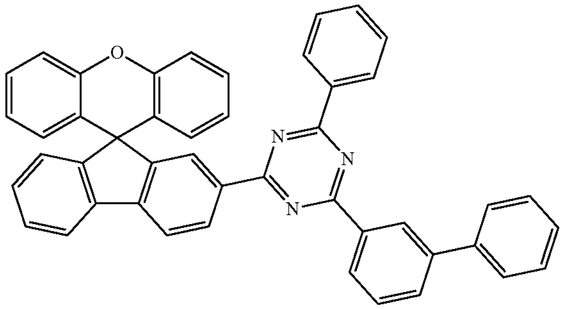
B-146
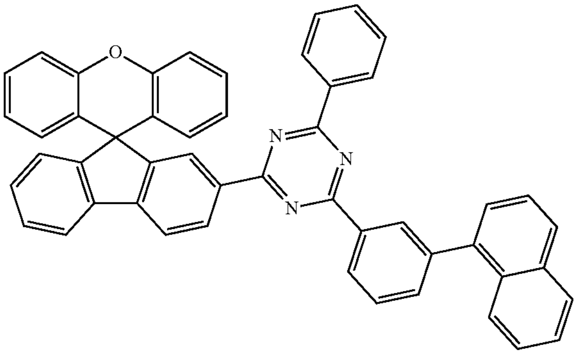
B-147
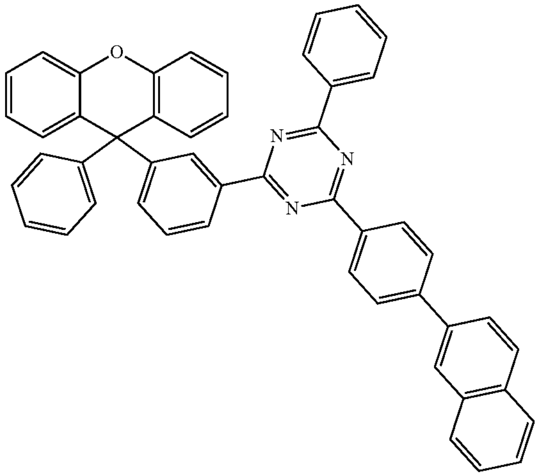
B-148
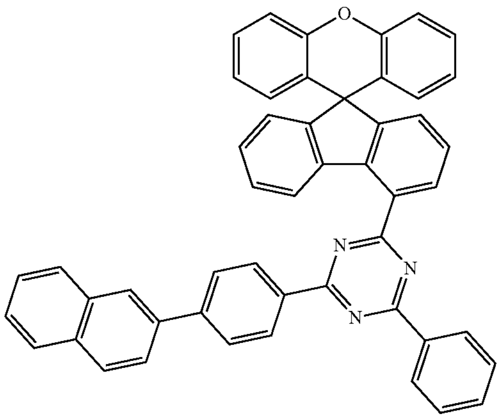

-continued
B-149
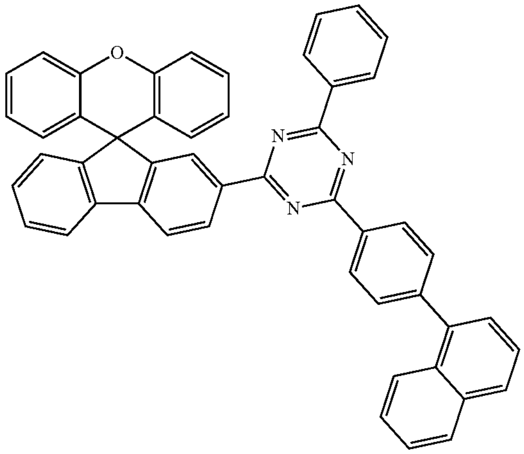
B-150
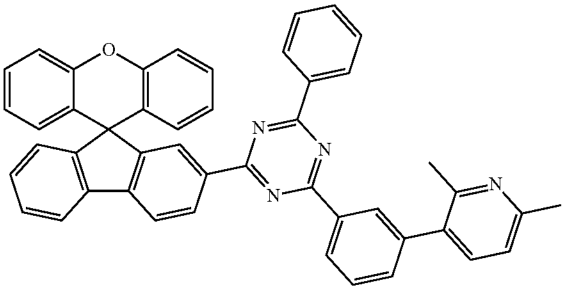
B-151
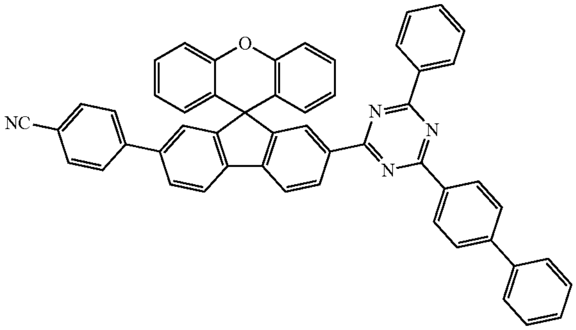
B-152
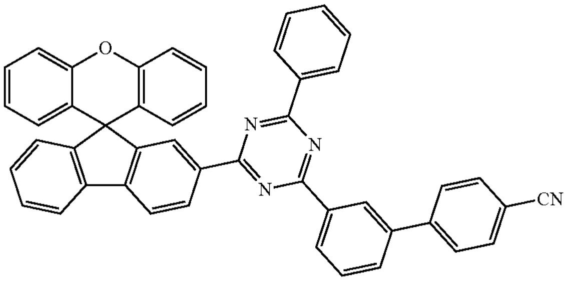
-continued
B-153
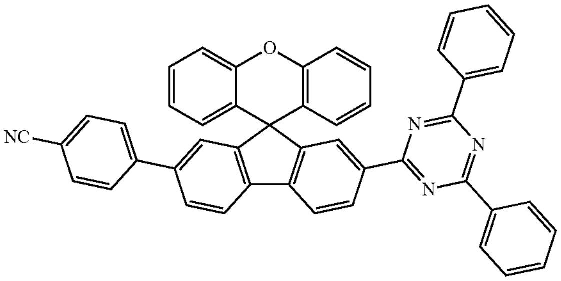
B-154
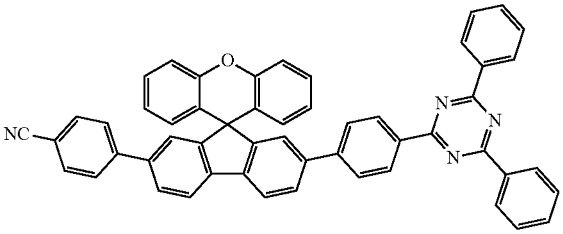
B-155
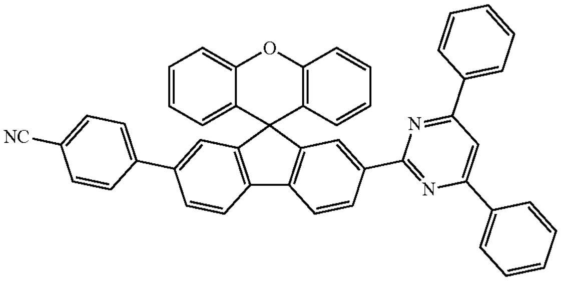
B-156
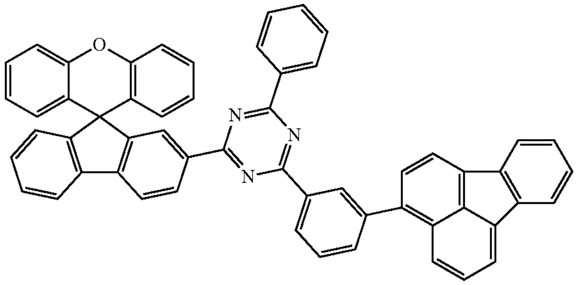
B-157
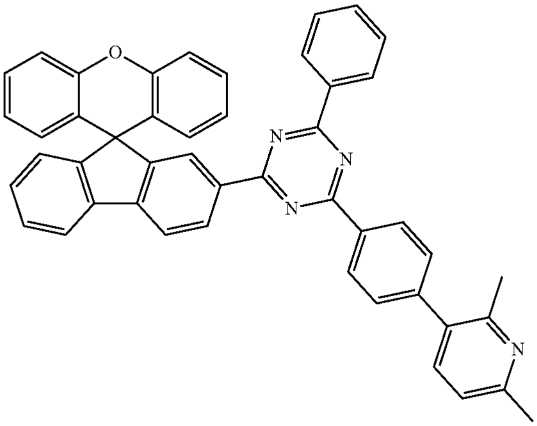

-continued
B-158
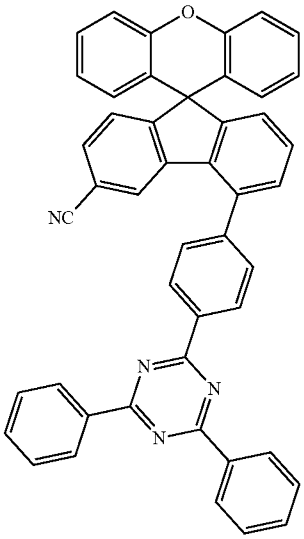
B-159
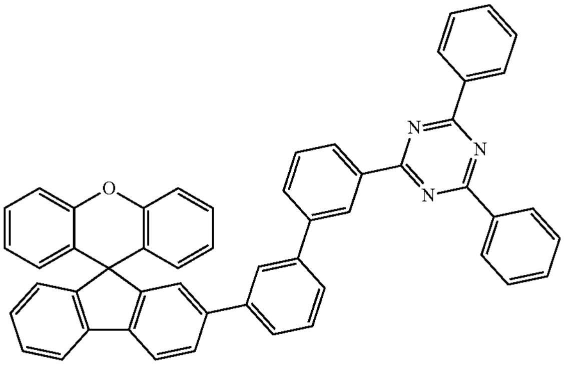
B-160
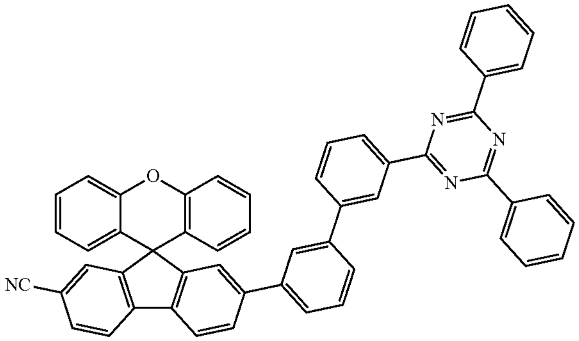
-continued
B-161
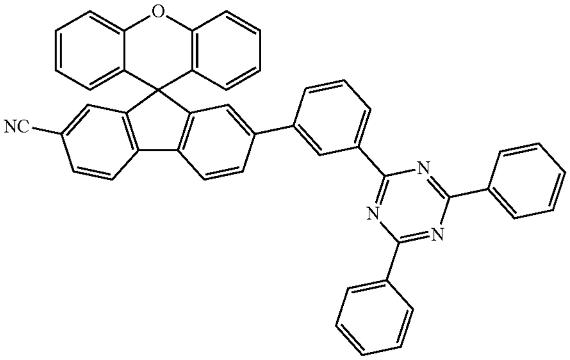
B-162
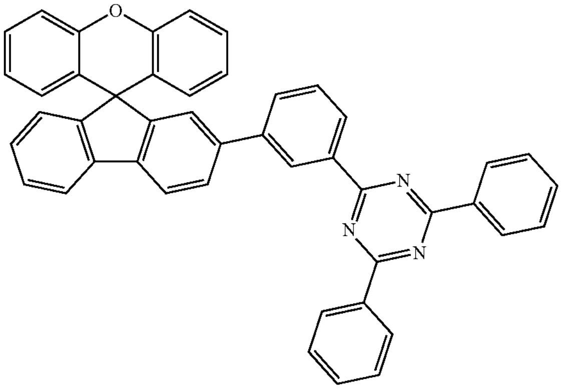
B-163
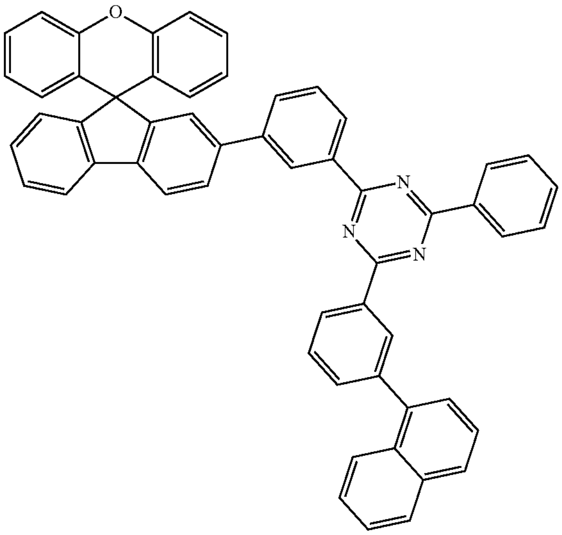

-continued
B-164
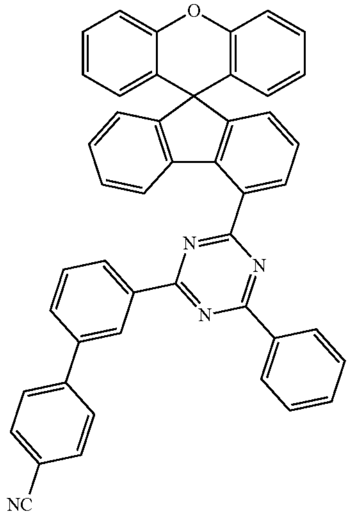
B-165
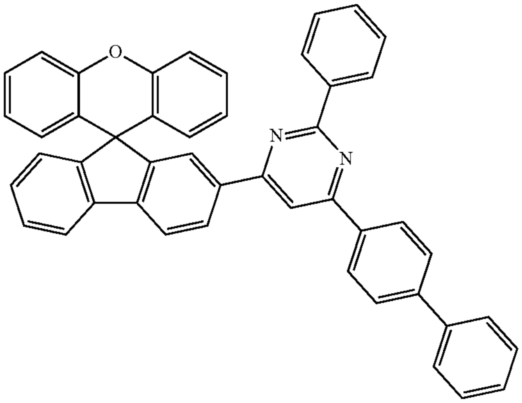
B-166
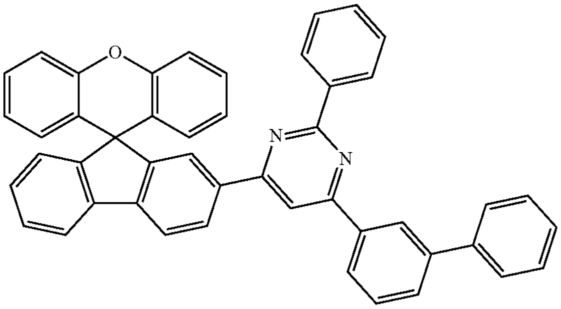
B-167
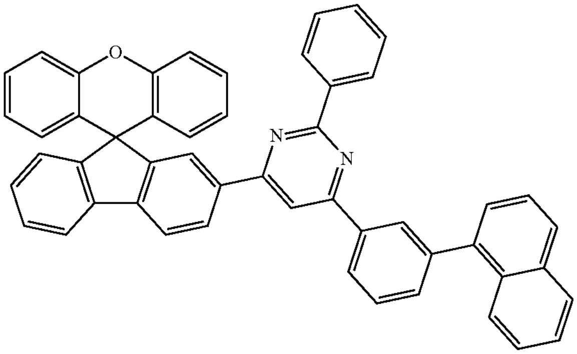
-continued
B-168
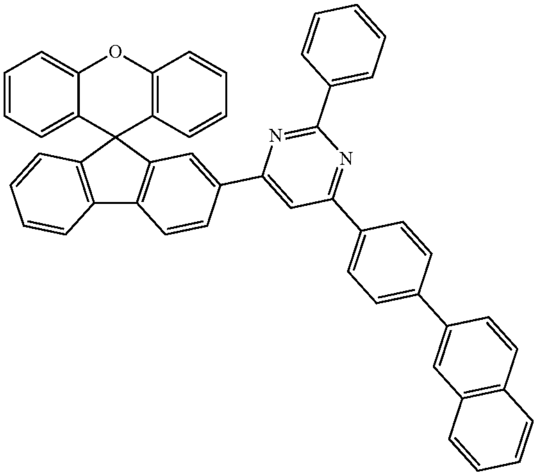
B-169
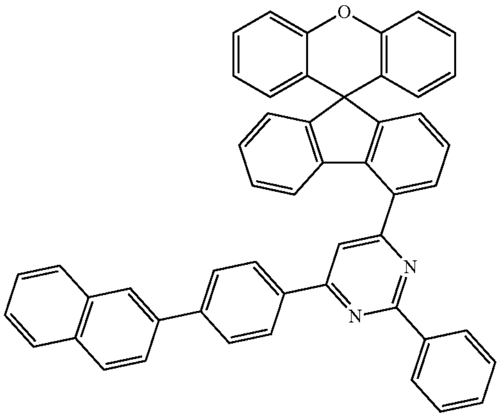
B-170
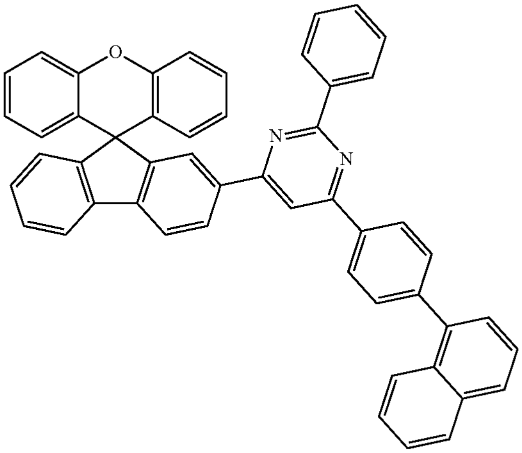

-continued
B-171
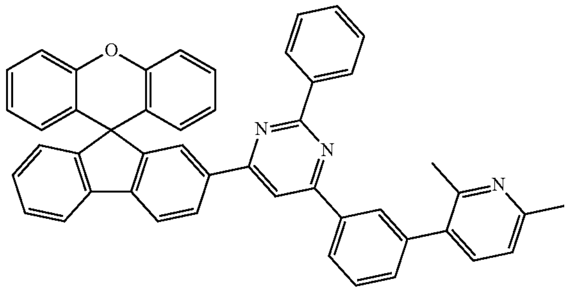
B-172
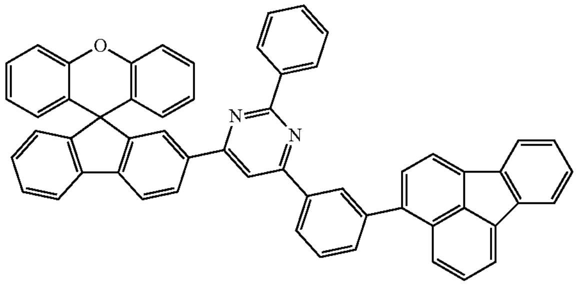
B-173
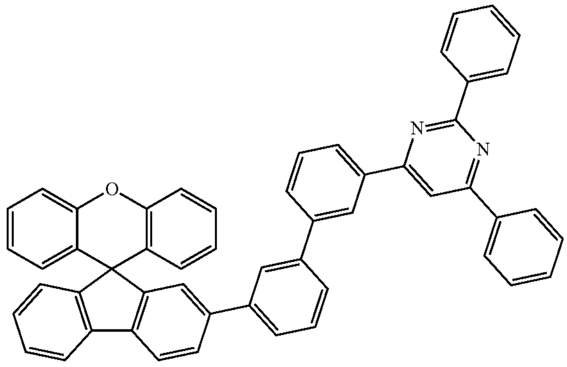
B-174
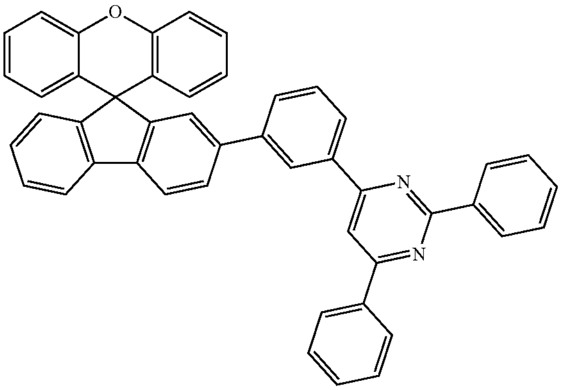
-continued
B-175
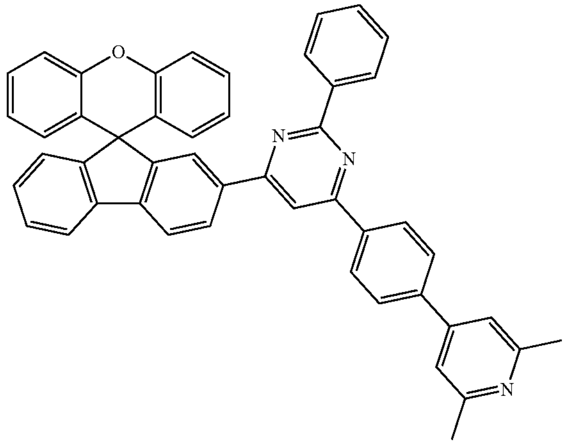
B-176
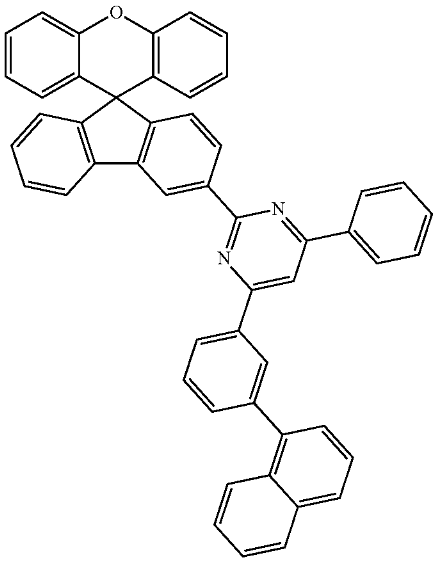
B-177
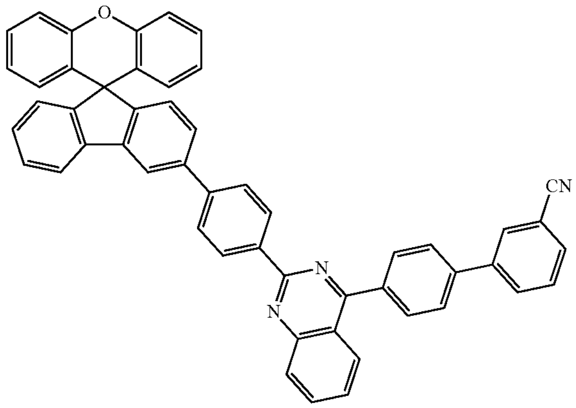

-continued
B-178
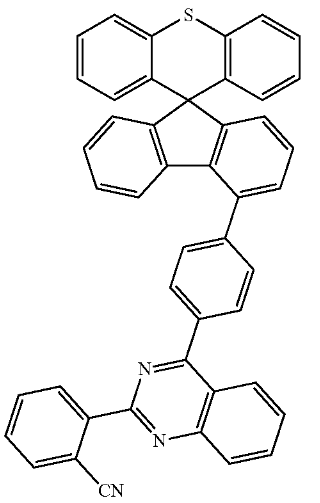
B-179
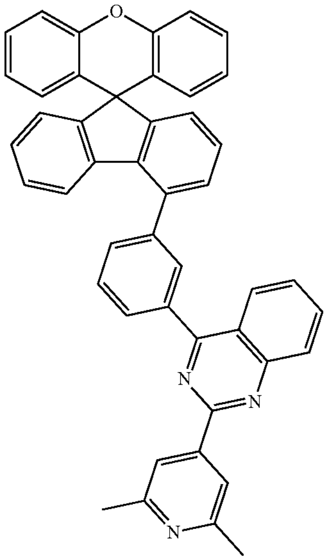
B-180
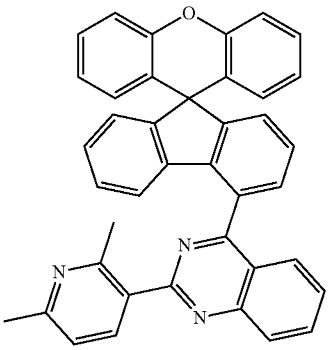
-continued
B-181
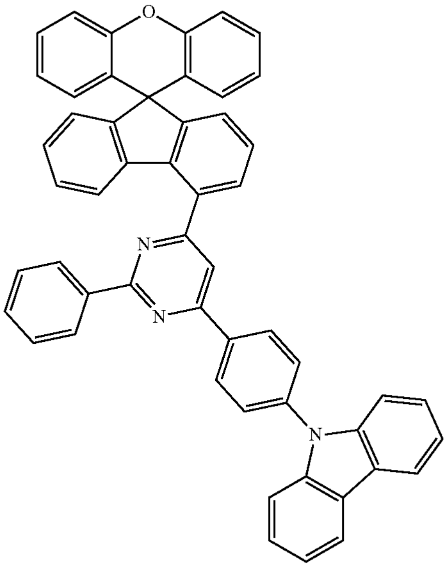
B-182
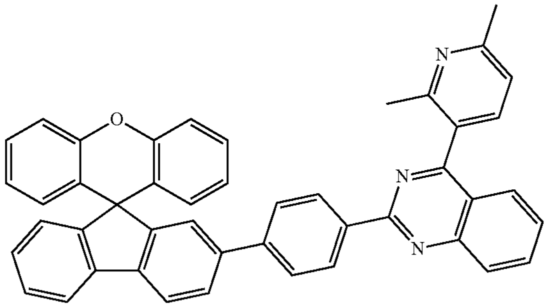
B-183
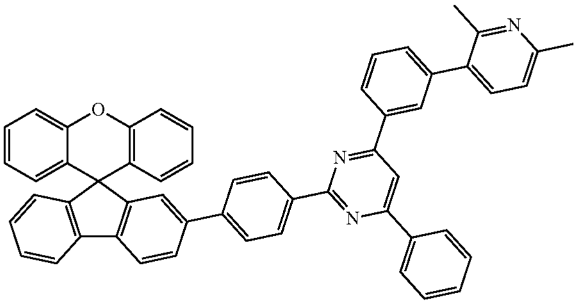

-continued
B-184
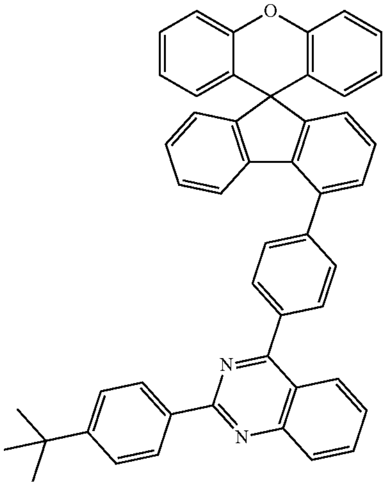
B-185
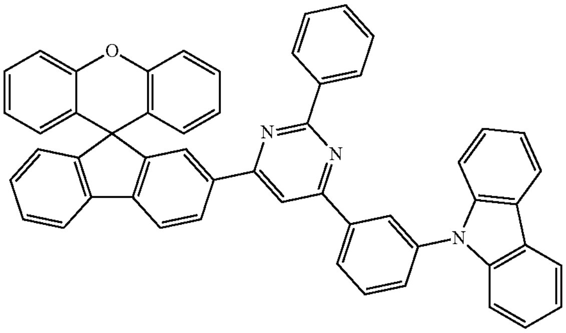
B-186
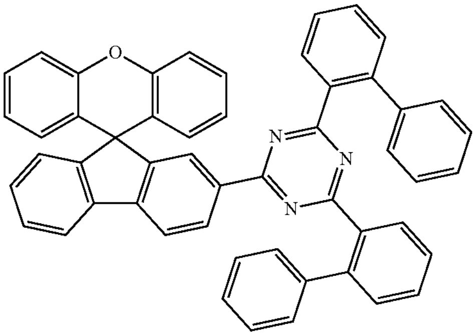
B-187
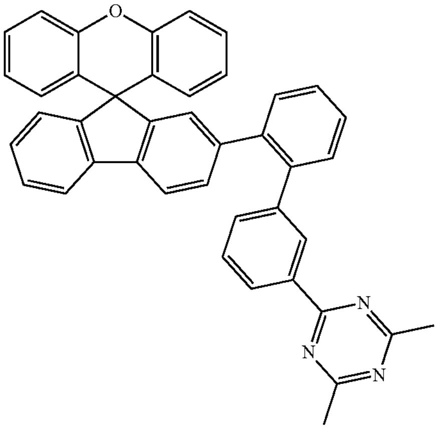
-continued
B-188
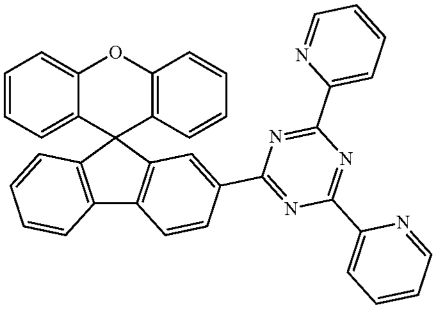
B-189
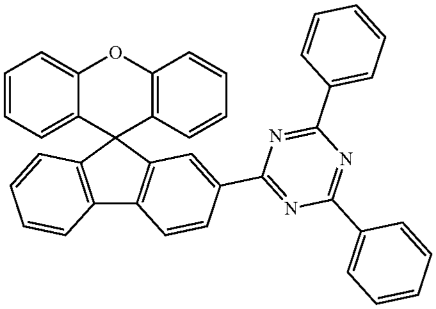
B-190
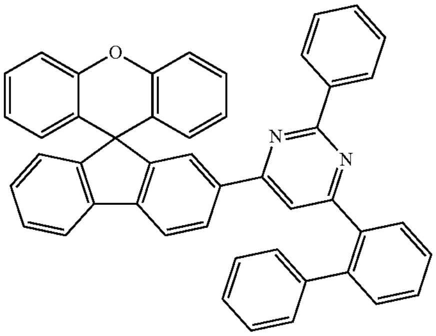
B-191
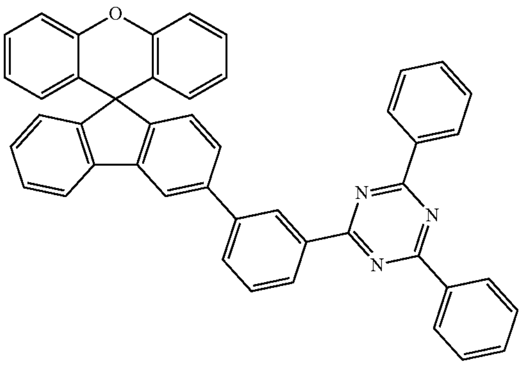

B-192
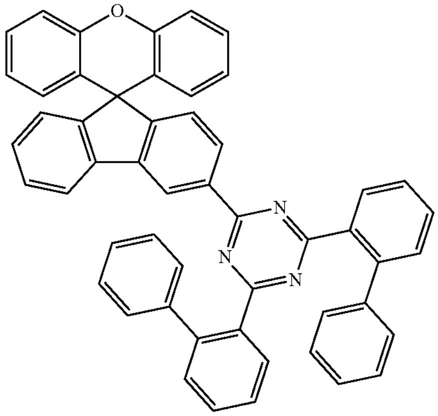
B-193
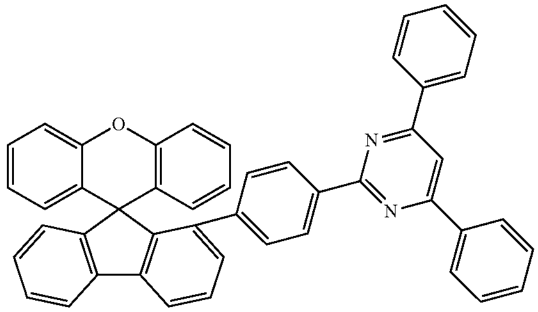
B-194
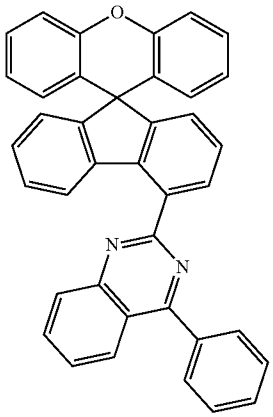
B-195
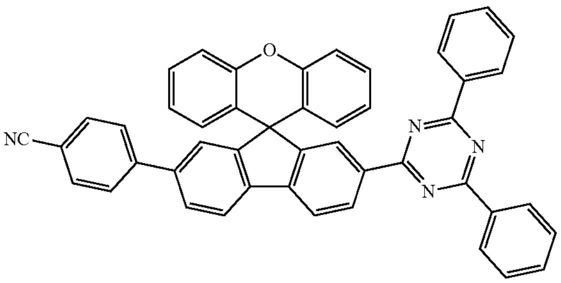
B-196
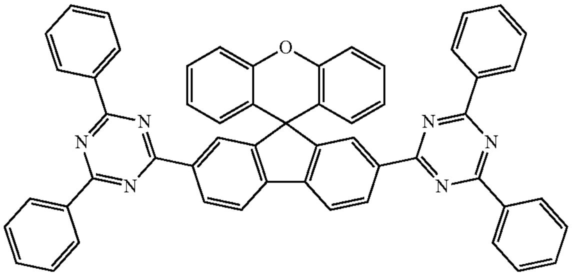
In addition, the compound represented by [Formula B] above may be selected from the following compounds [B-201] to [B-344]:
B-201
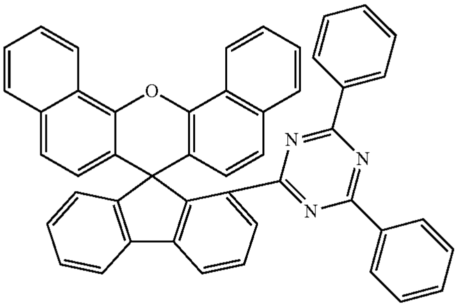
B-202
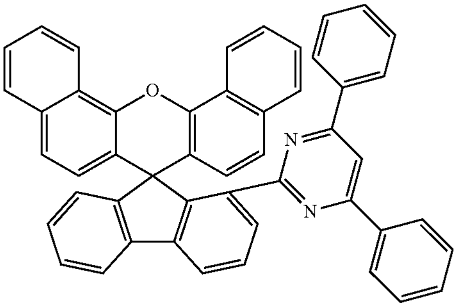
B-203
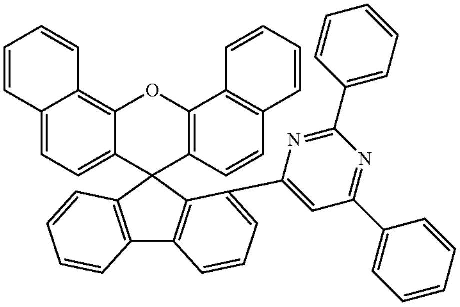

-continued
B-204
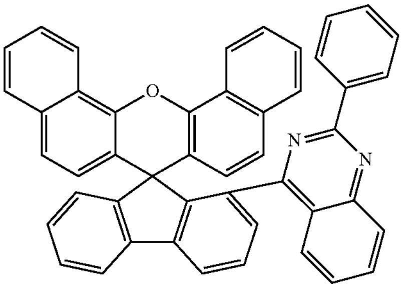
B-205
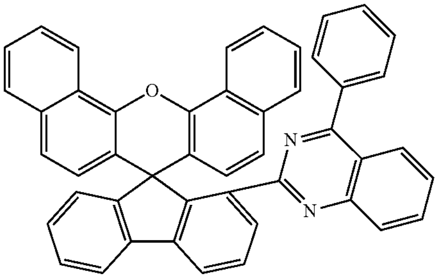
B-206
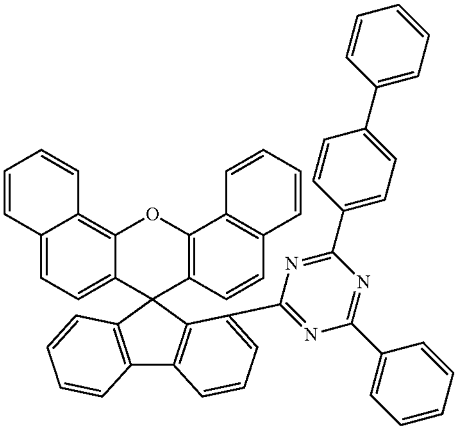
B-207
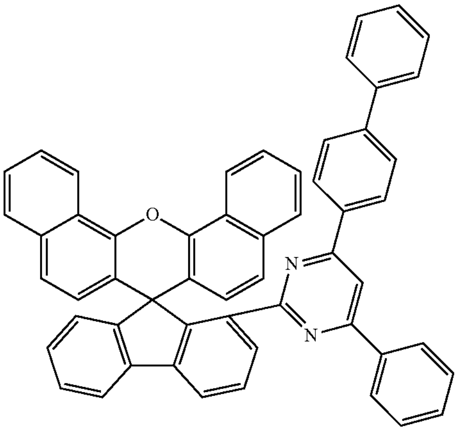
-continued
B-208
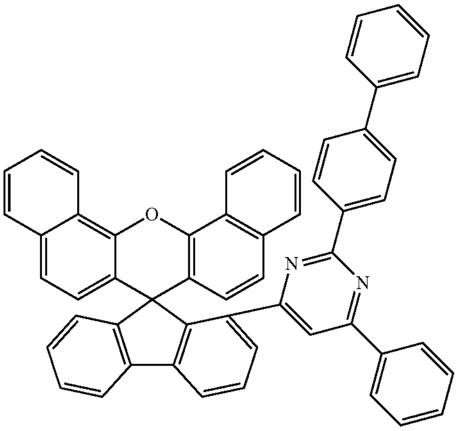
B-209
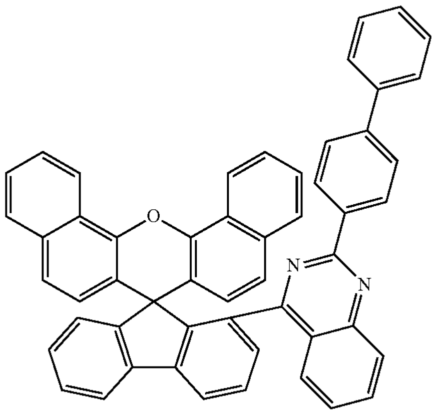
B-210
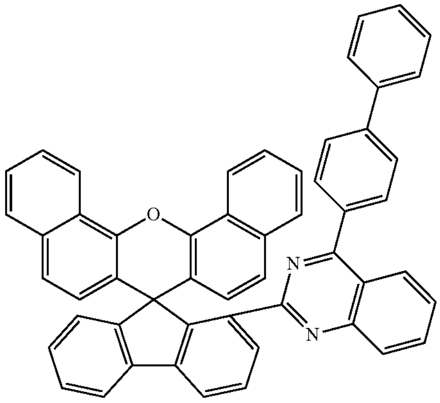
B-211
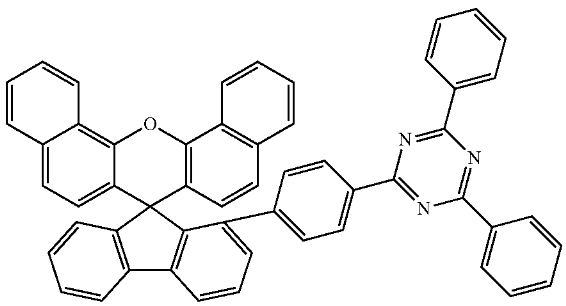

-continued
B-212
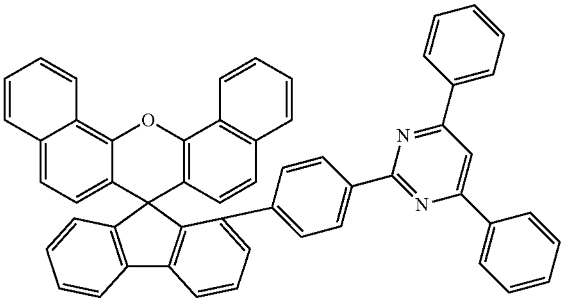
B-213
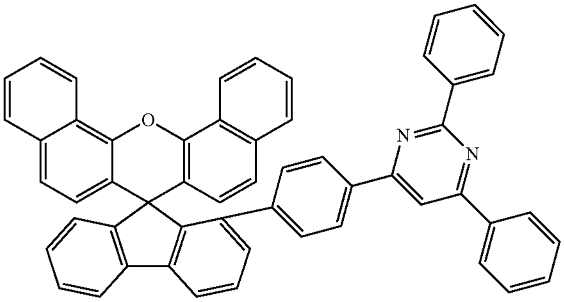
B-214
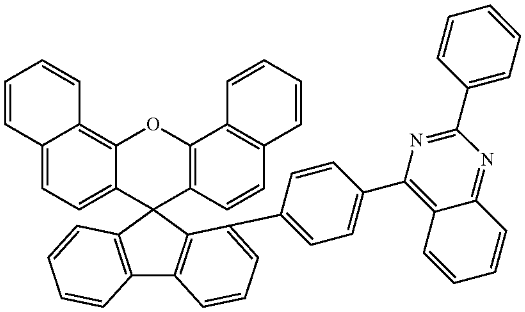
B-215
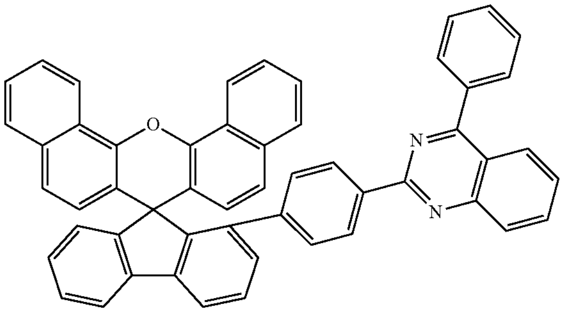
-continued
B-216
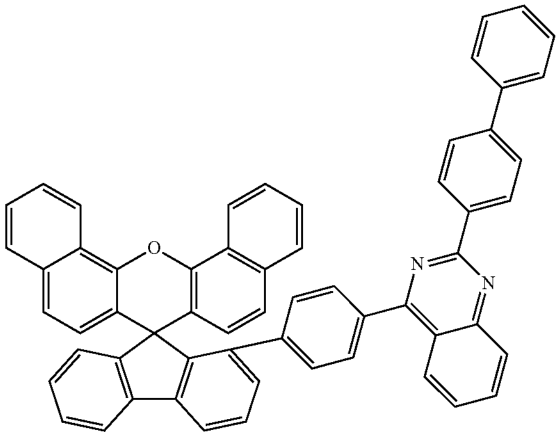
B-217
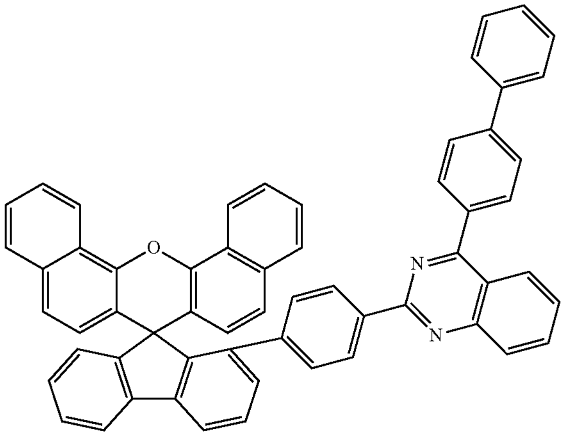
B-218
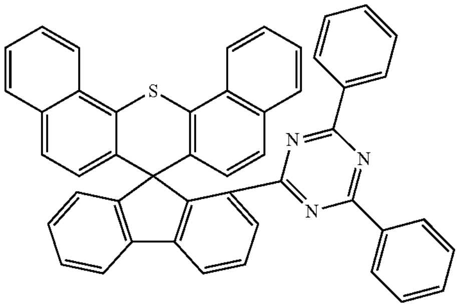
B-219
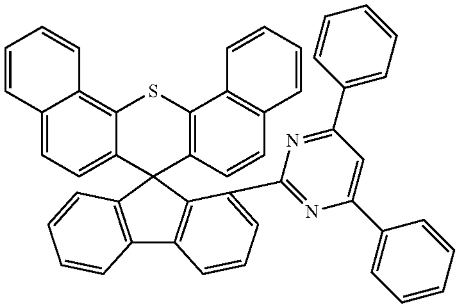

-continued
B-220
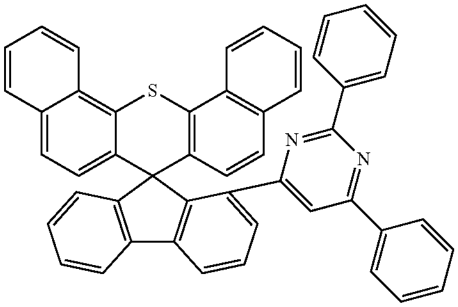
B-221
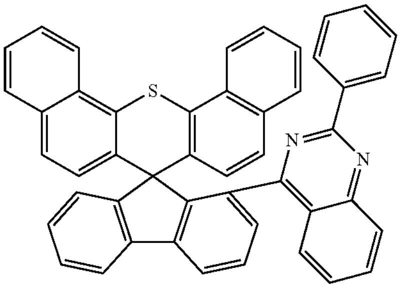
B-222
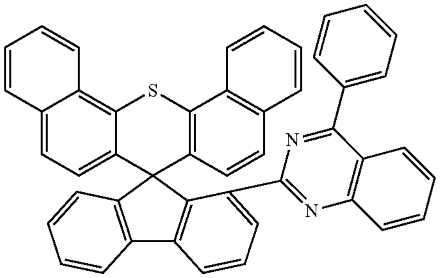
B-223
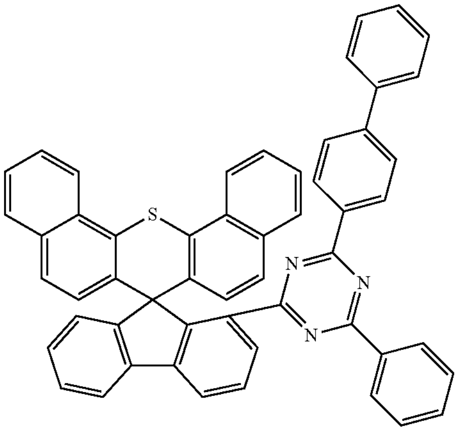
-continued
B-224
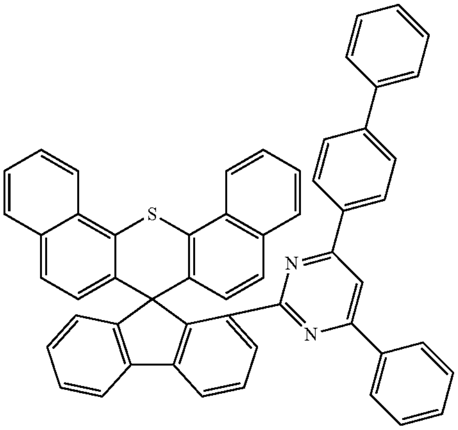
B-225
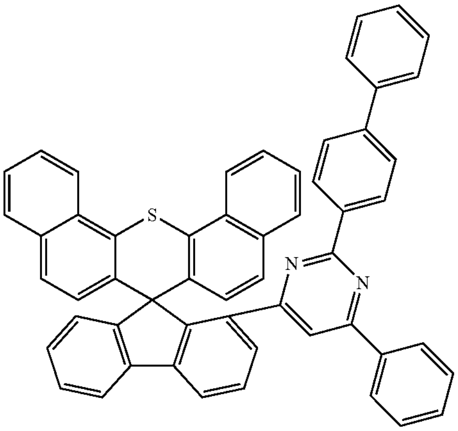
B-226
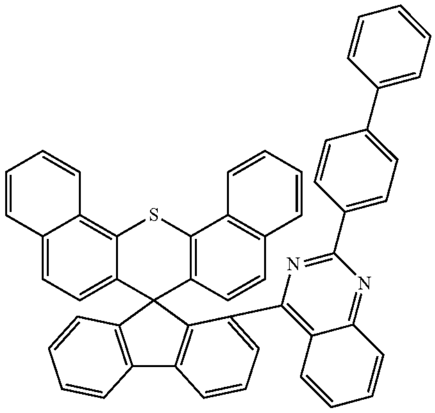

-continued
B-227
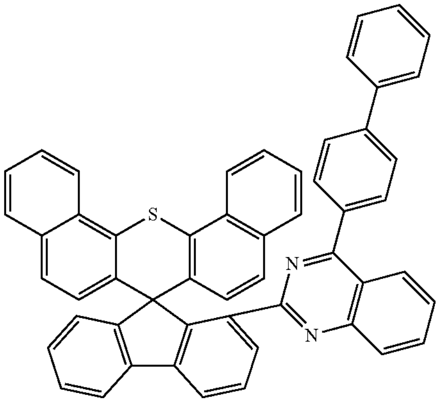
B-228
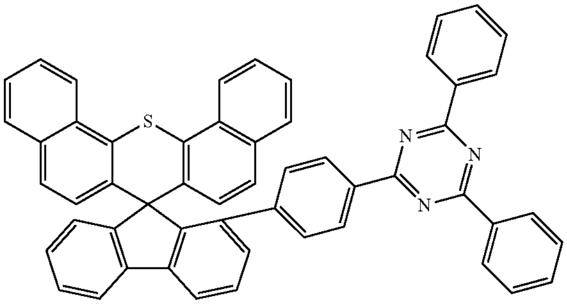
B-229
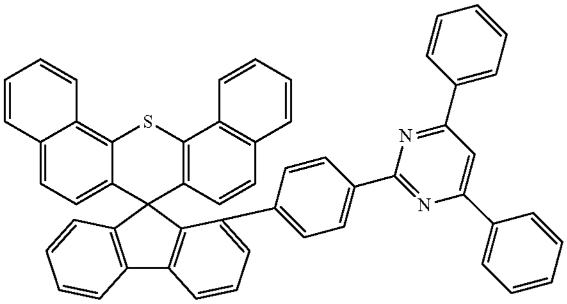
B-230
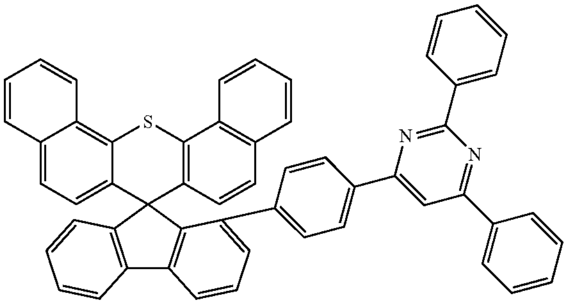
-continued
B-231
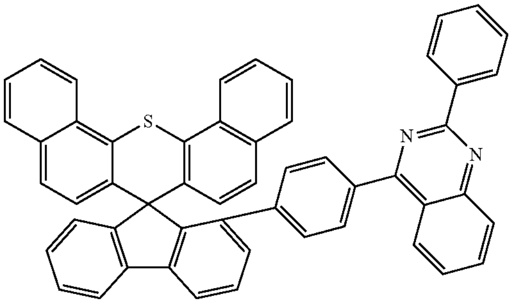
B-232
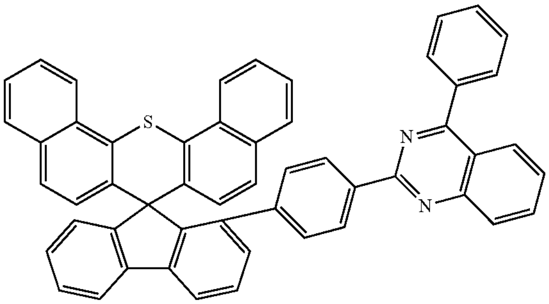
B-233
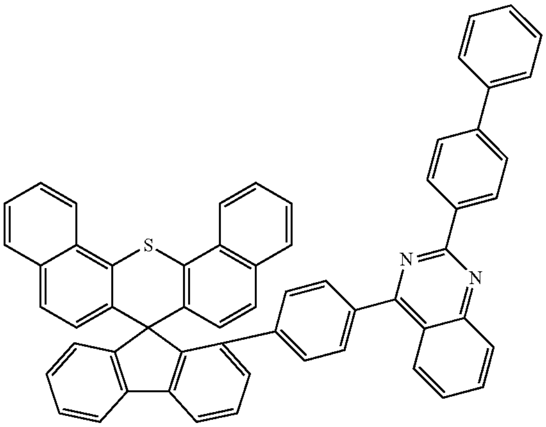
B-234
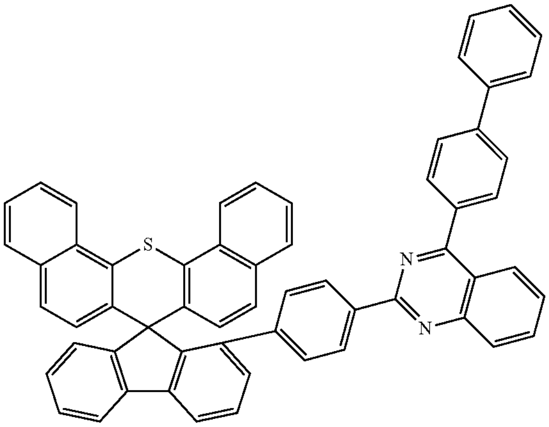

-continued
B-235
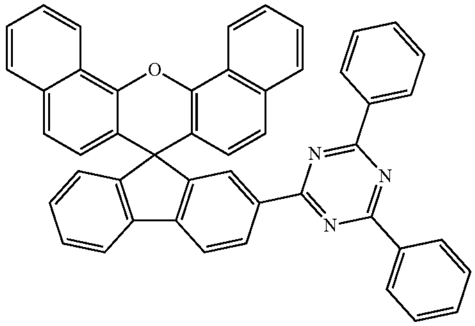
B-236
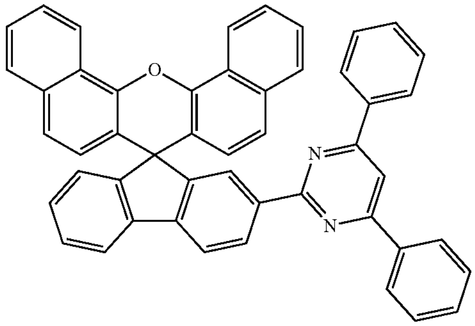
B-237
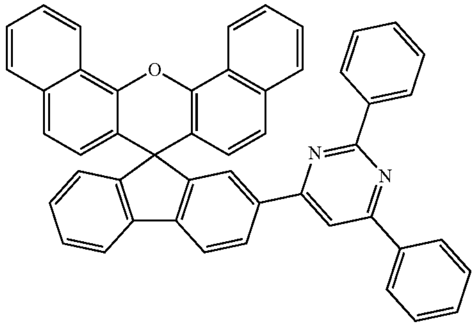
B-238
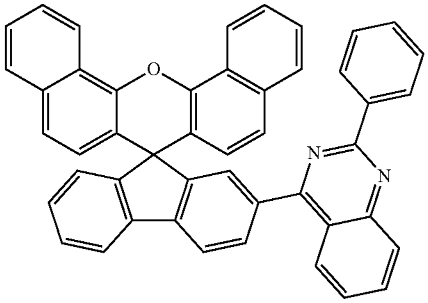
B-239
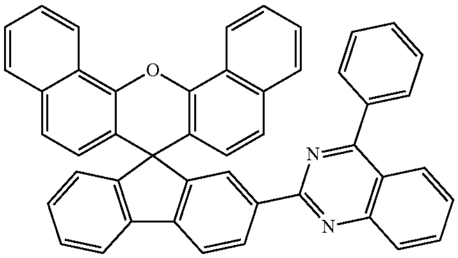
-continued
B-240
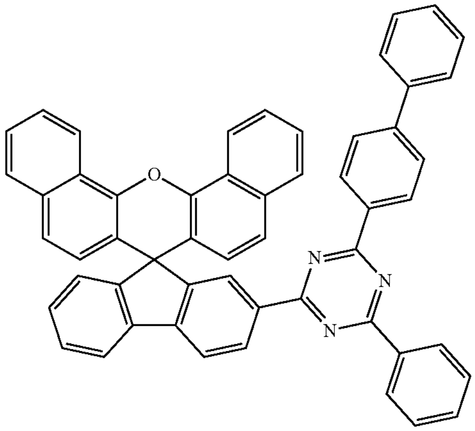
B-241
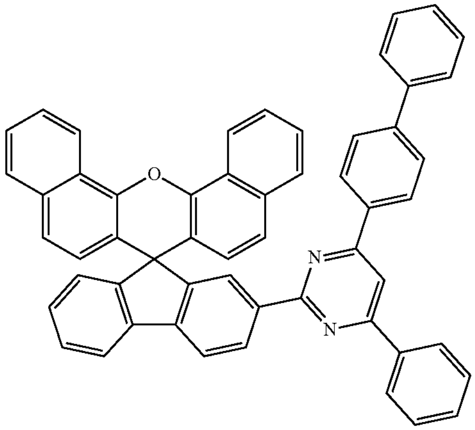
B-242
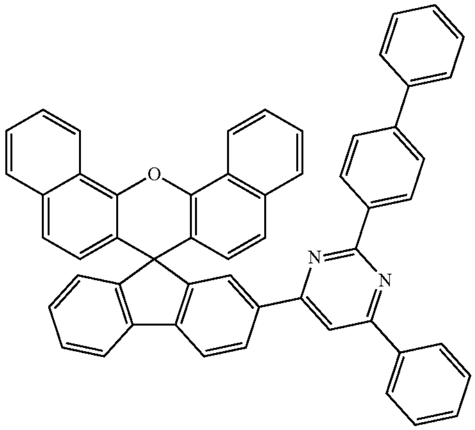

-continued
B-243
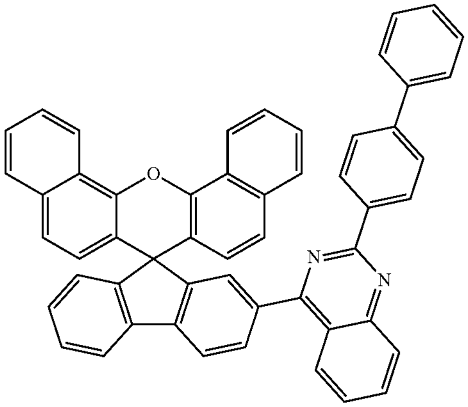
B-244
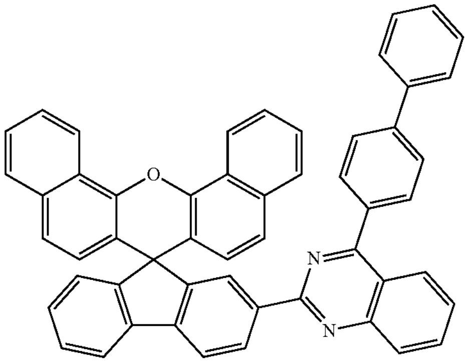
B-245
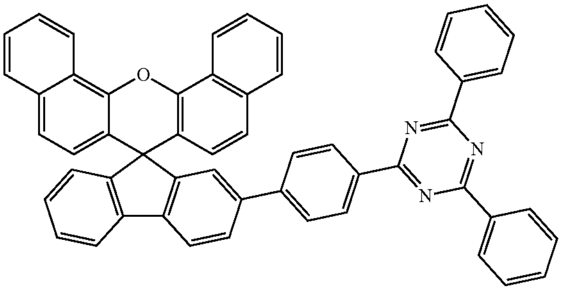
B-246
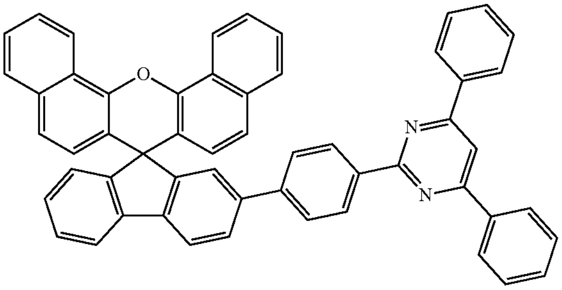
-continued
B-247
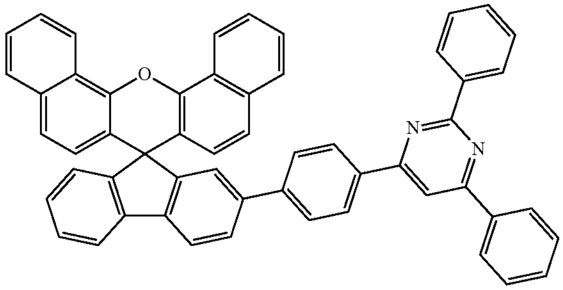
B-248
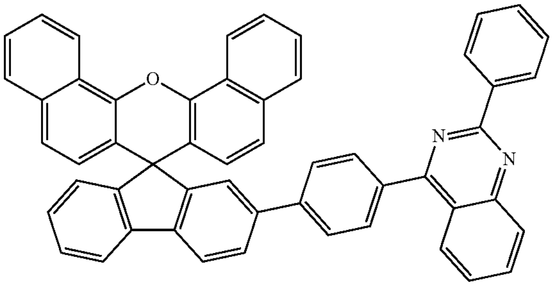
B-249
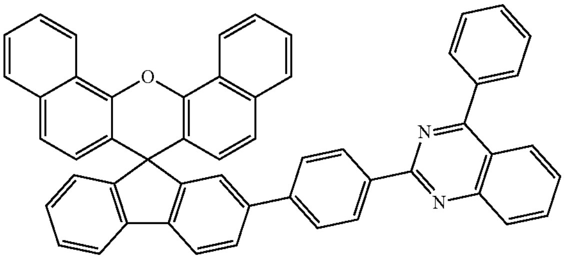
B-250
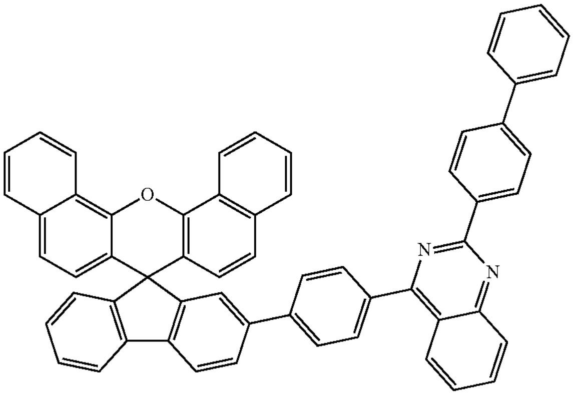

-continued
B-251
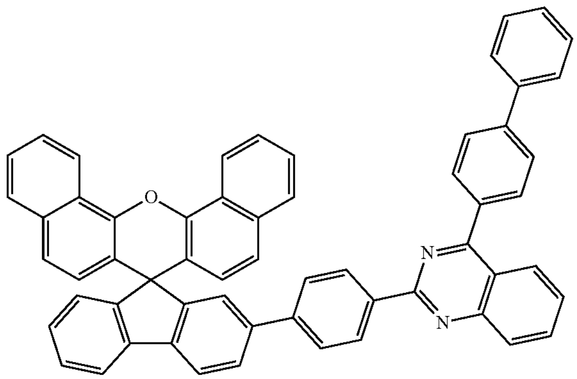
B-252
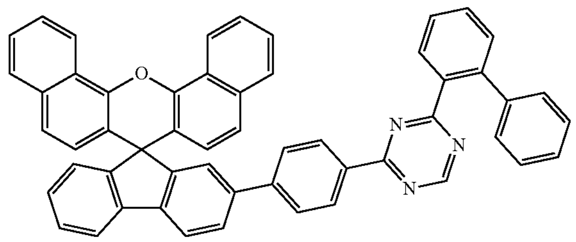
B-253
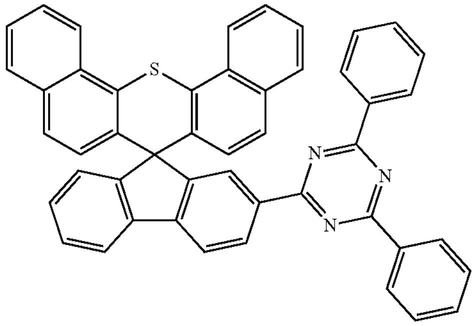
B-254
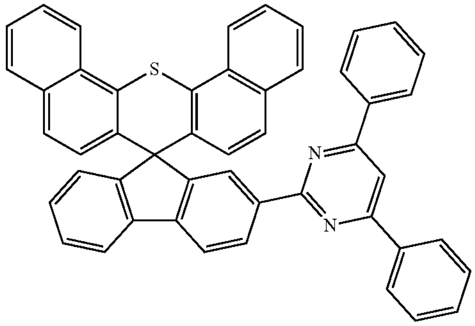
-continued
B-255
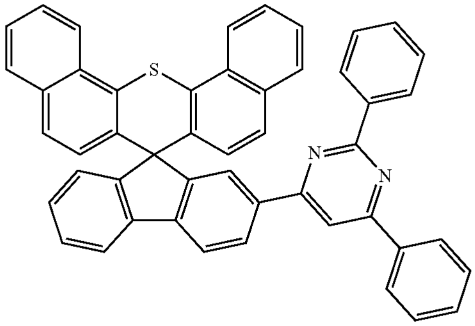
B-256
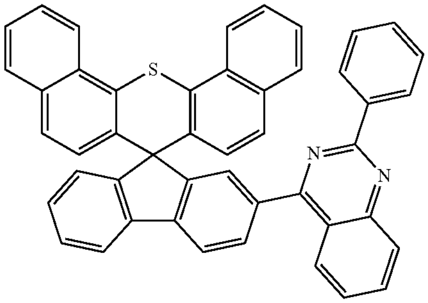
B-257
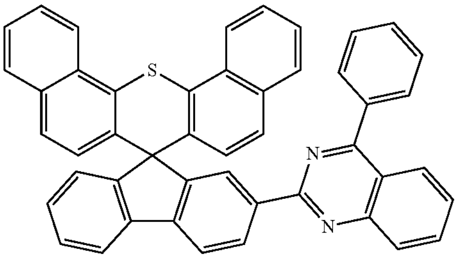
B-258
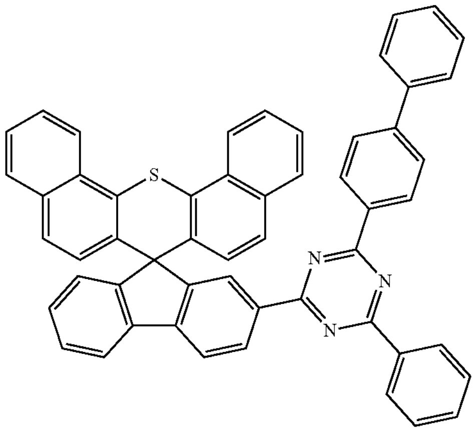

-continued
B-259
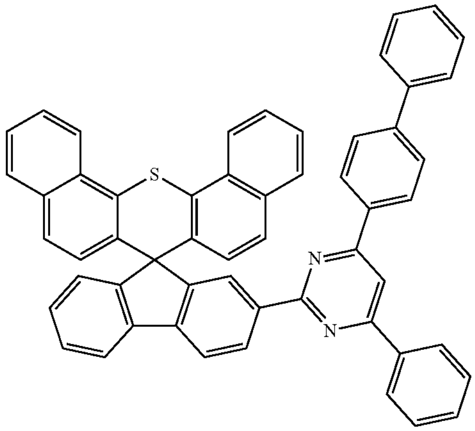
B-260
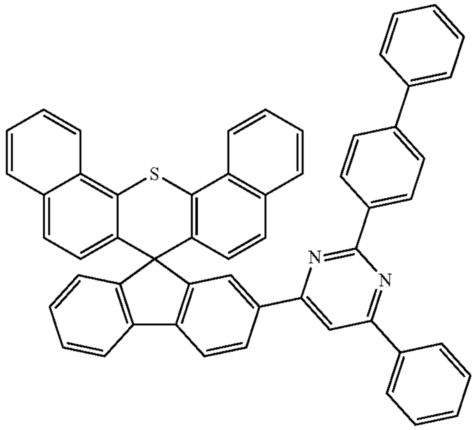
B-261
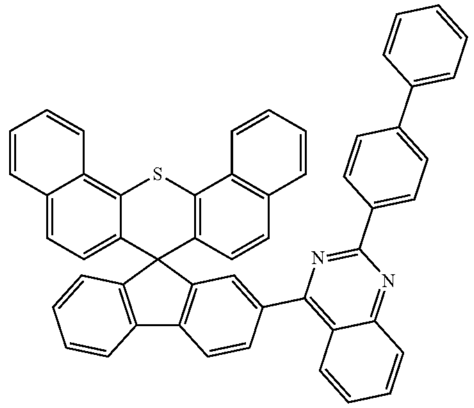
B-262
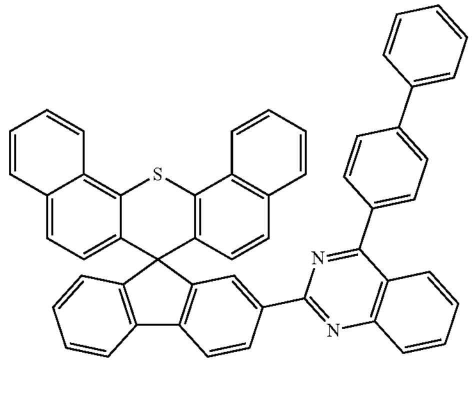
-continued
B-263
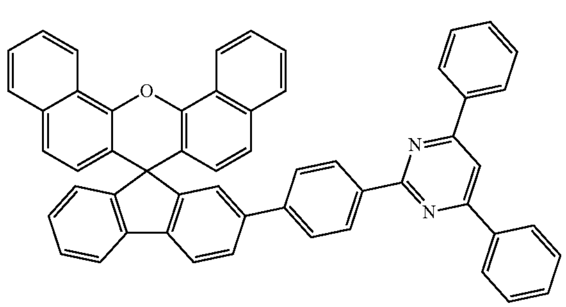
B-264
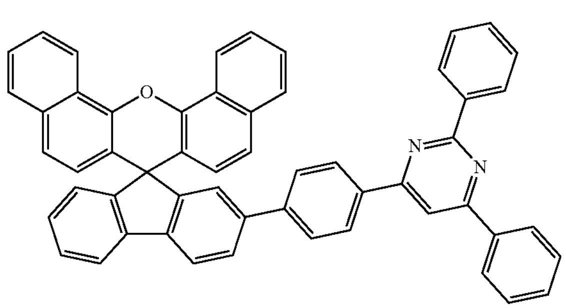
B-265
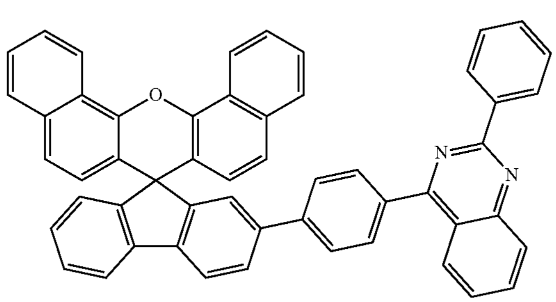
B-266
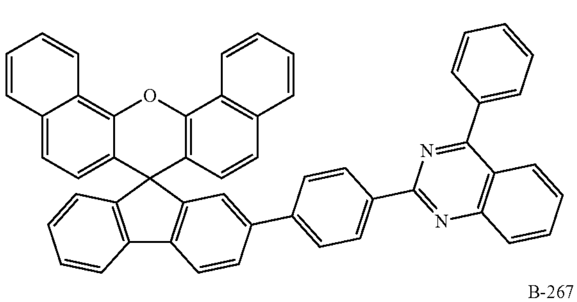
B-267
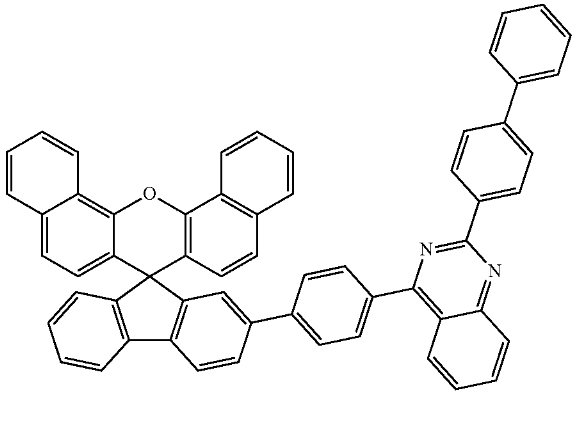

-continued
B-268
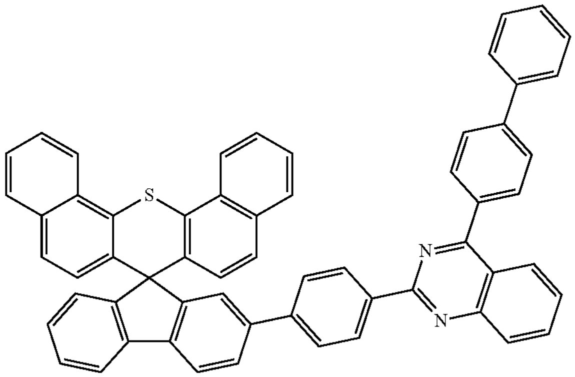
B-269
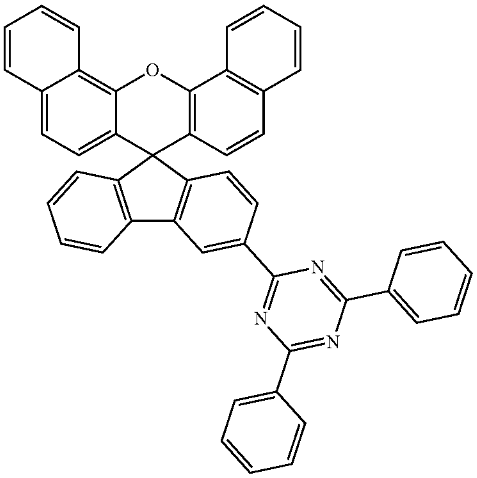
B-270
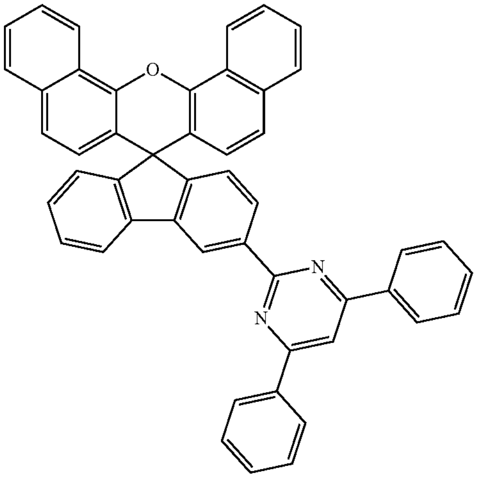
-continued
B-271
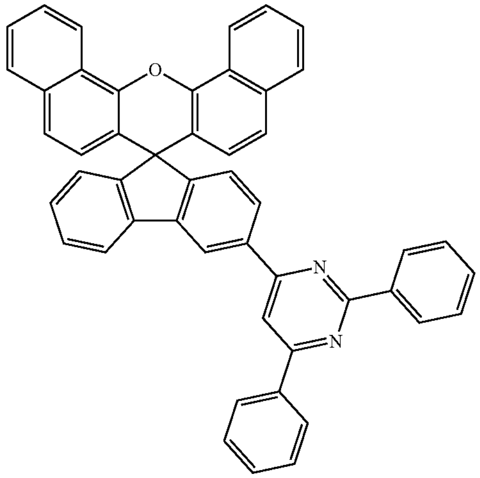
B-272
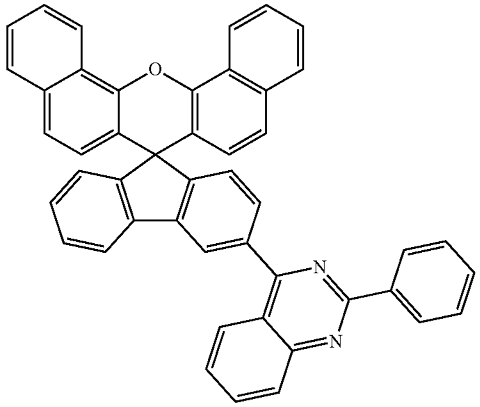
B-273
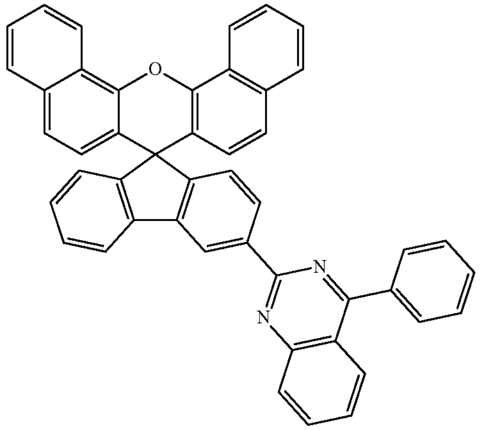

-continued
B-274
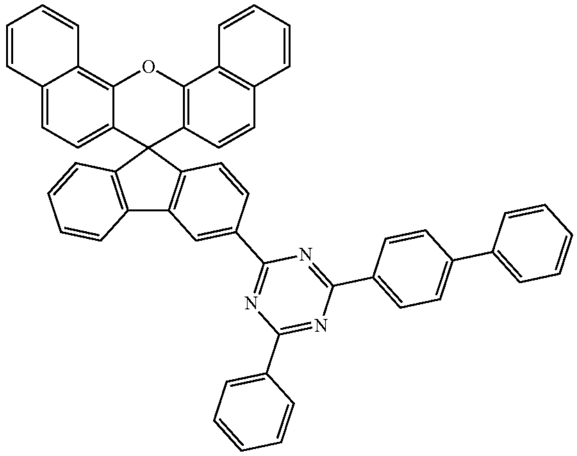
B-275
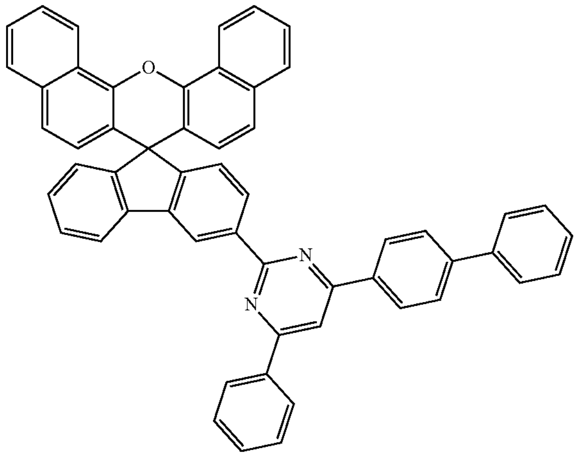
B-276
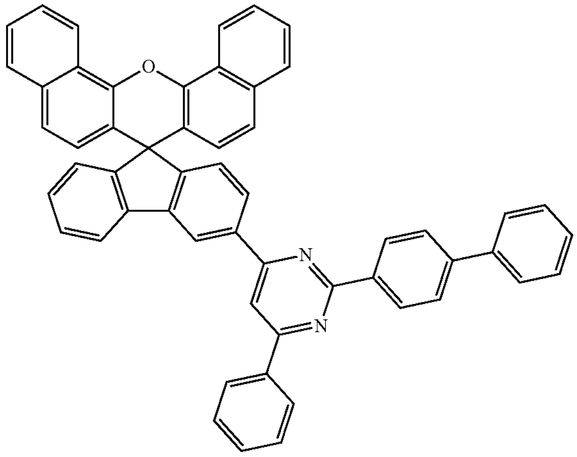
-continued
B-277
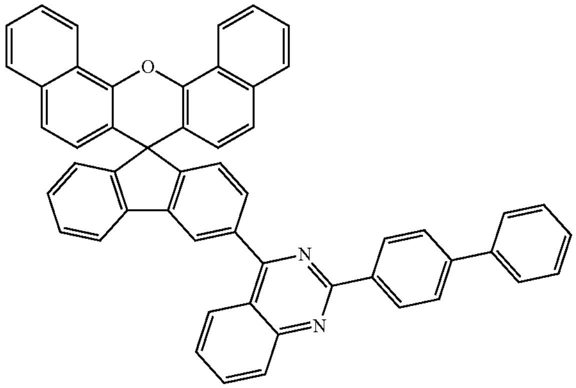
B-278
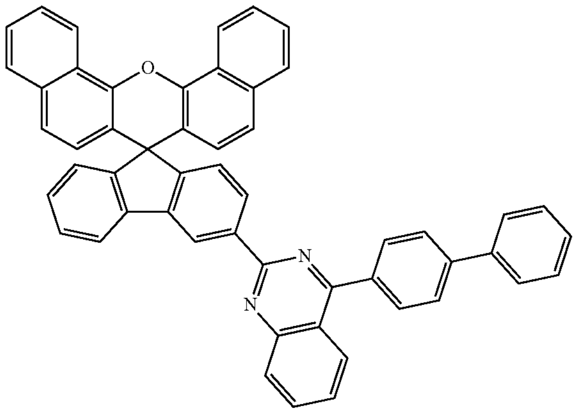
B-279
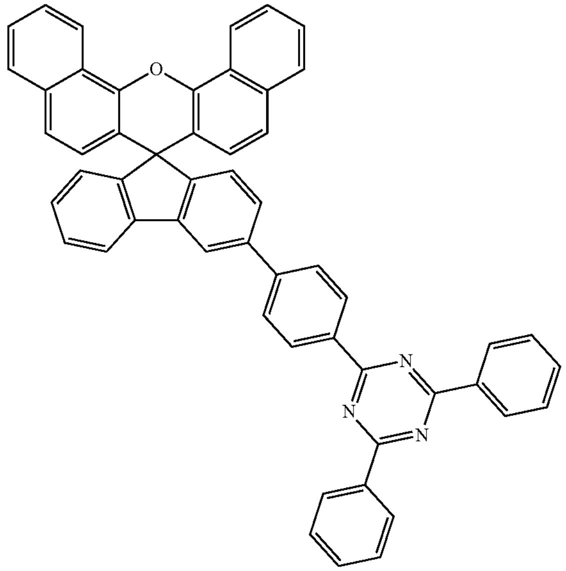

-continued
B-280
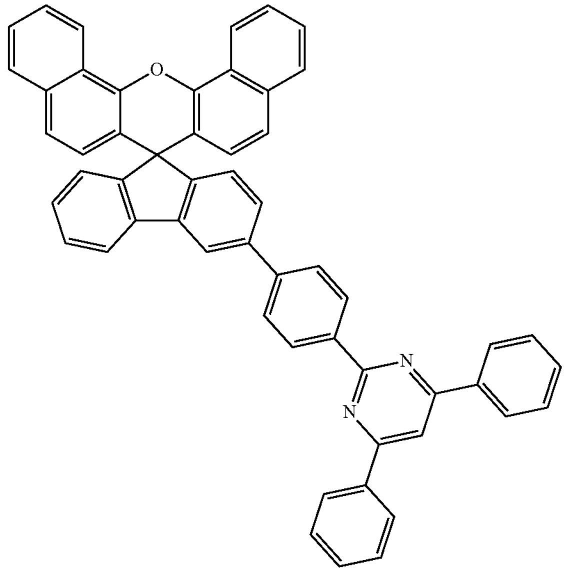
B-281
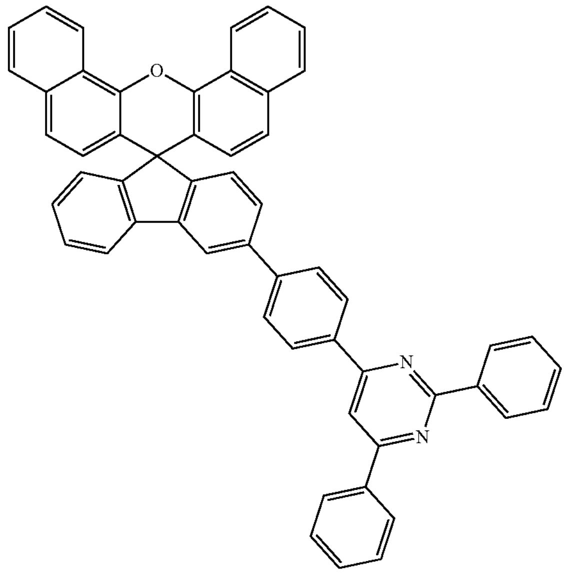
-continued
B-282
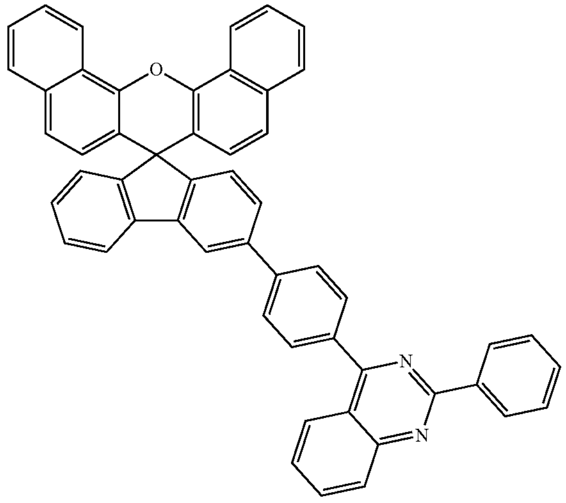
B-283
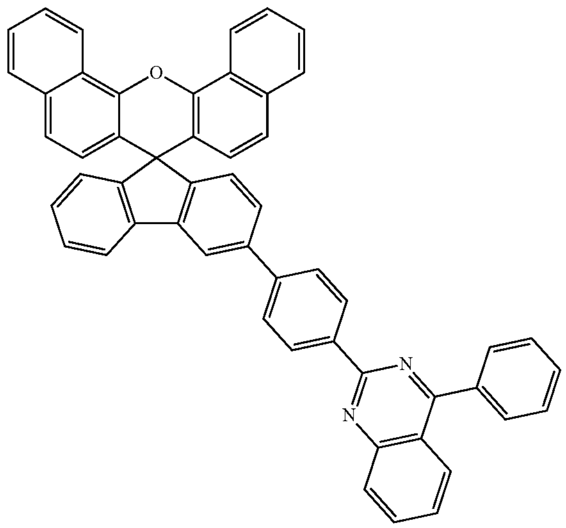
B-284
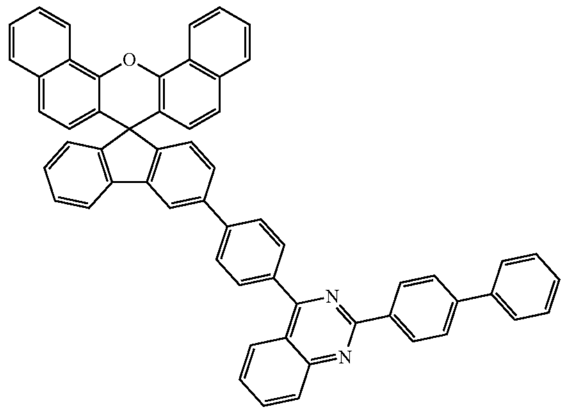

-continued
B-285
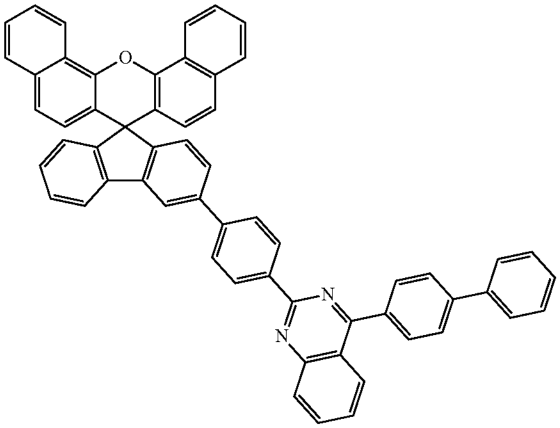
B-286
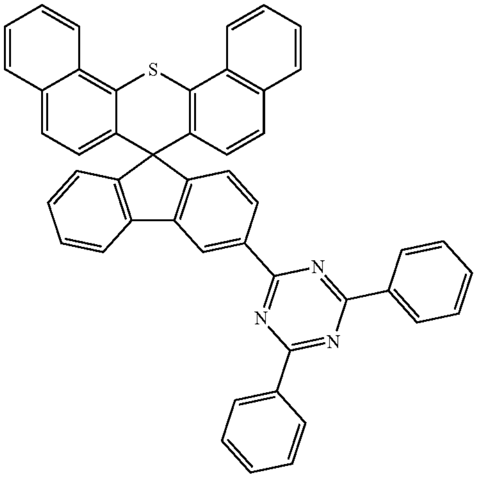
B-287
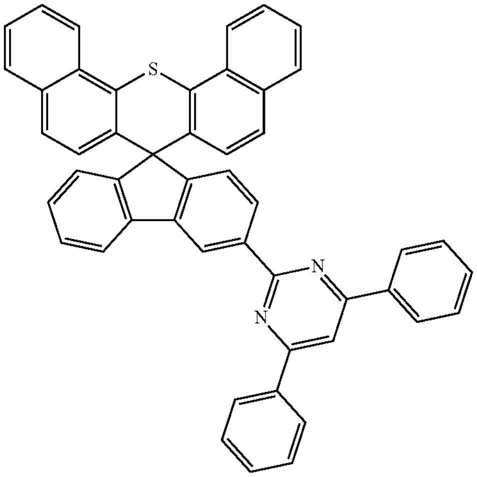
-continued
B-288
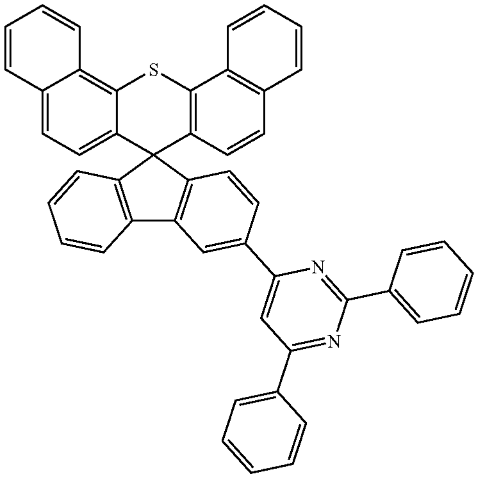
B-289
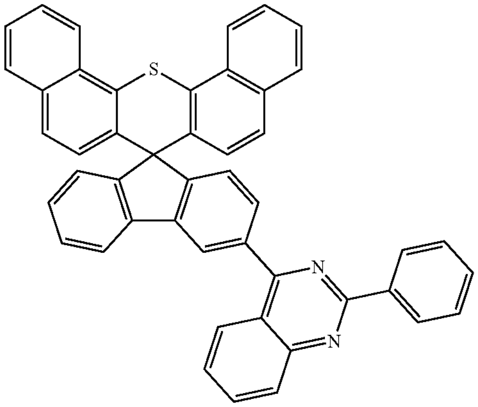
B-290
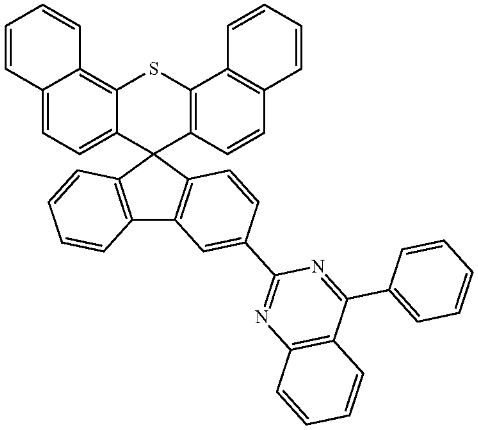

-continued
B-291
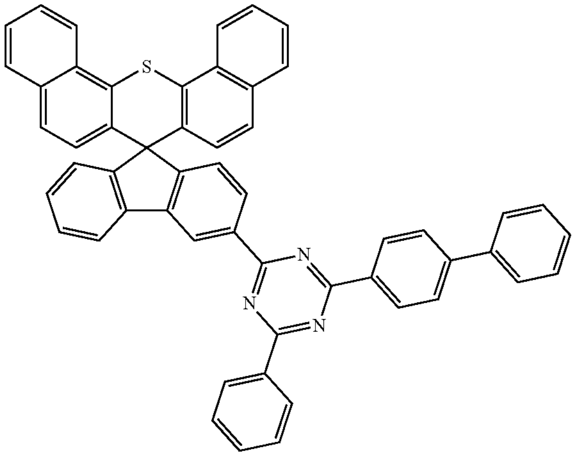
B-292
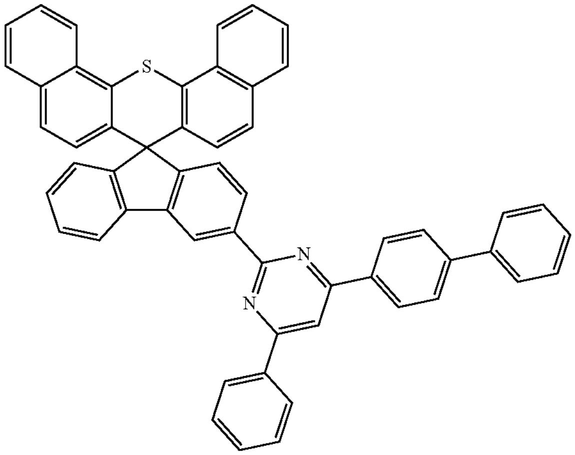
B-293
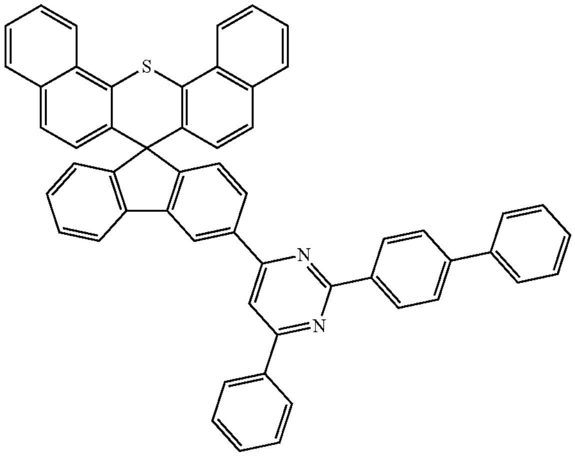
-continued
B-294
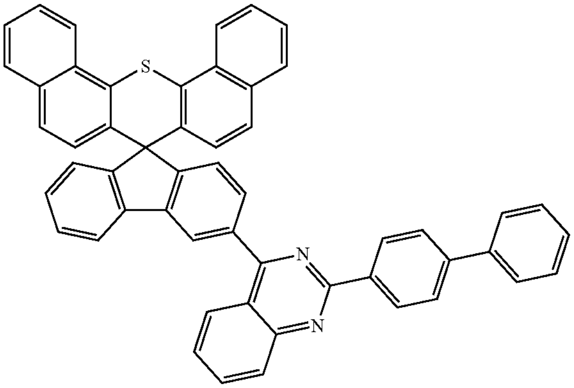
B-295
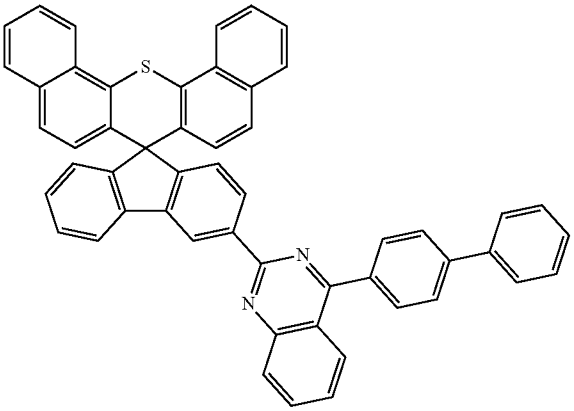
B-296
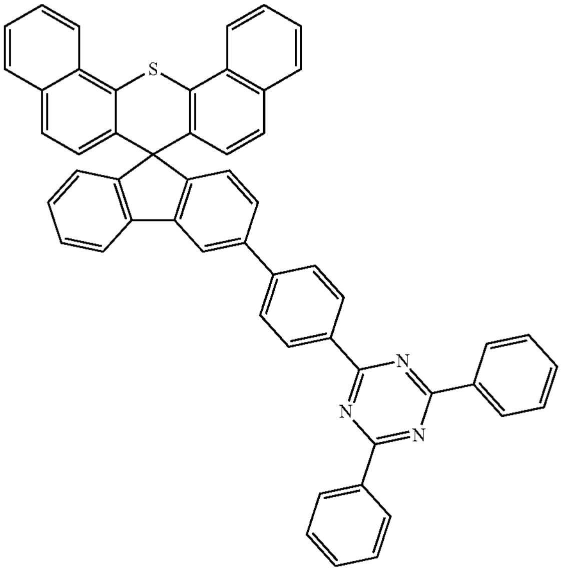

-continued
B-297
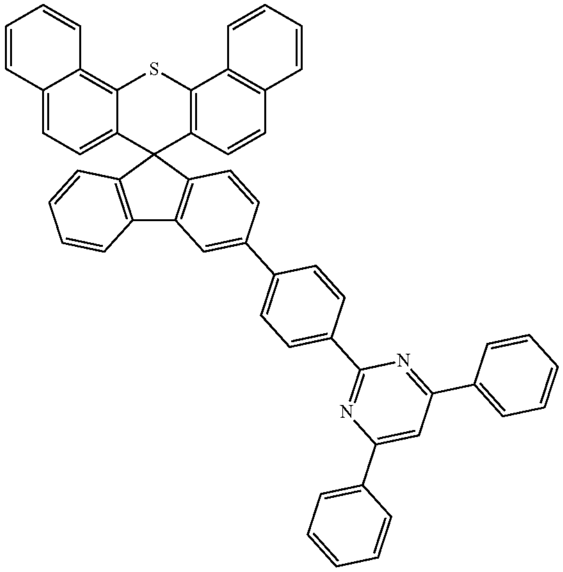
B-298
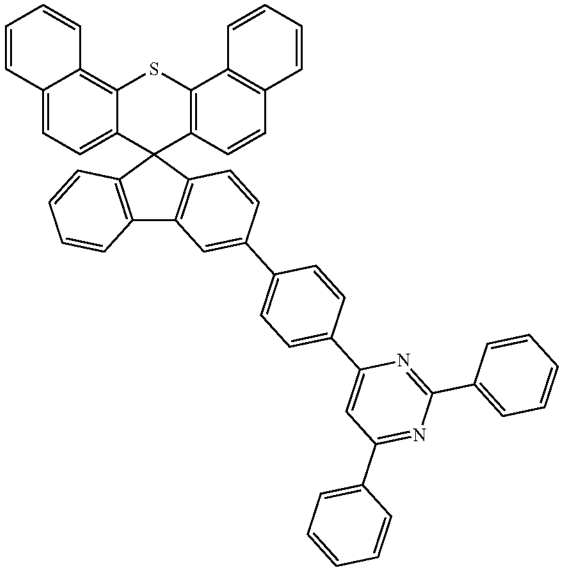
-continued
B-299
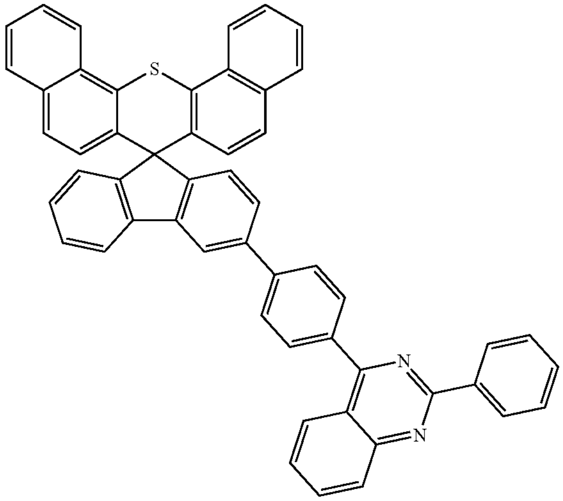
B-300
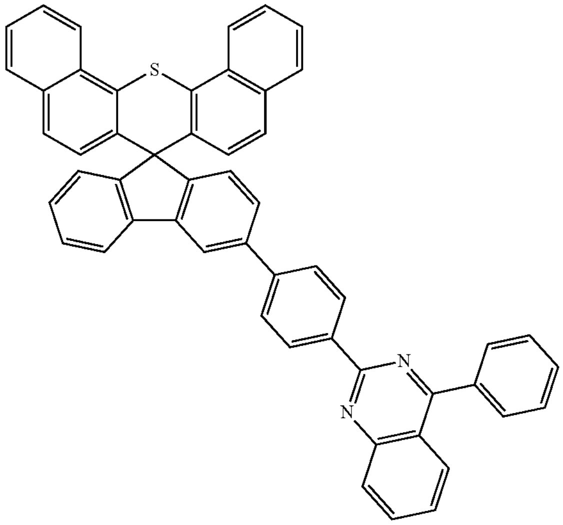
B-301
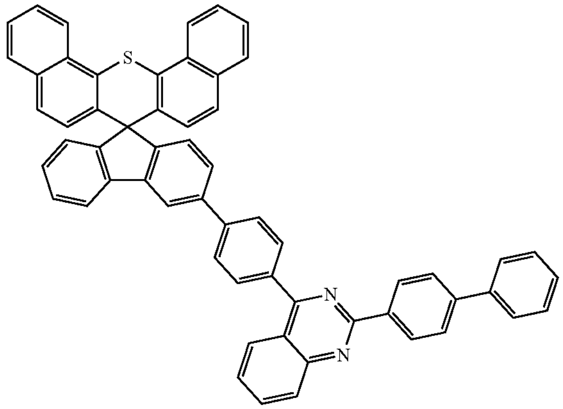

-continued
B-302
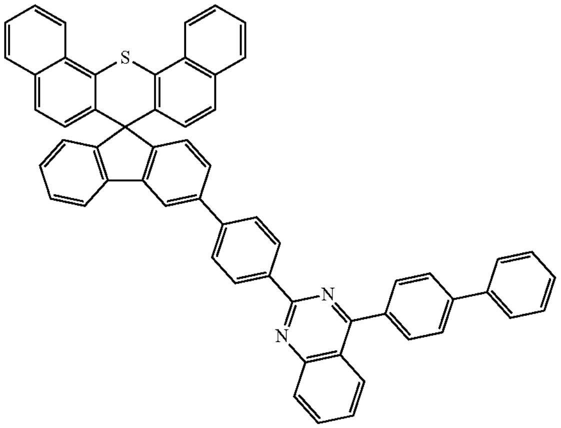
B-303
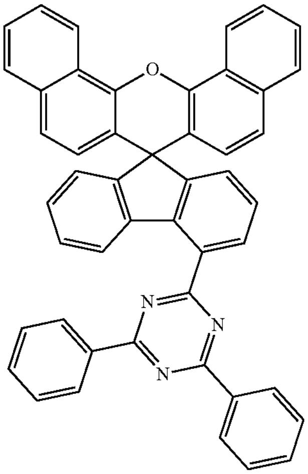
B-304
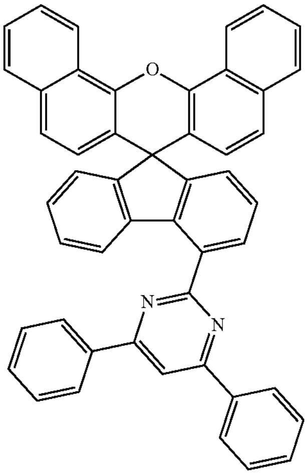
-continued
B-305
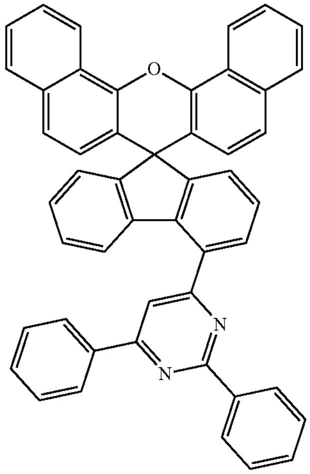
B-306
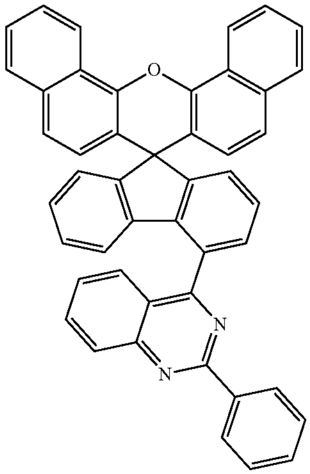
B-307
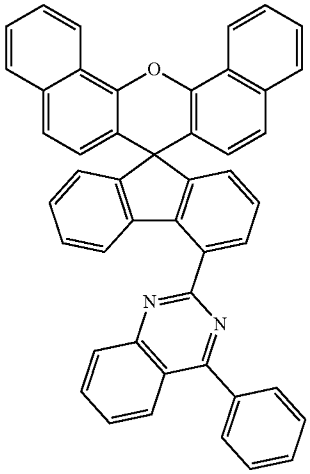

-continued
B-308
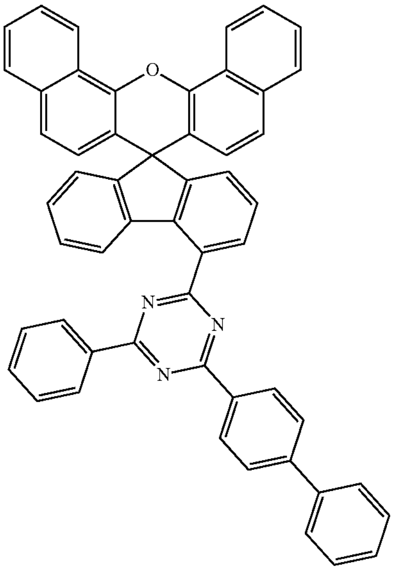
B-309
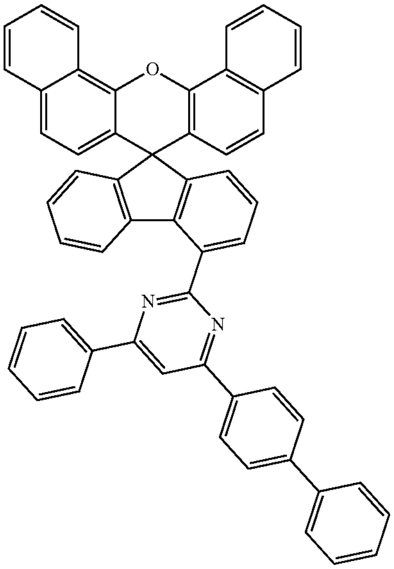
-continued
B-310
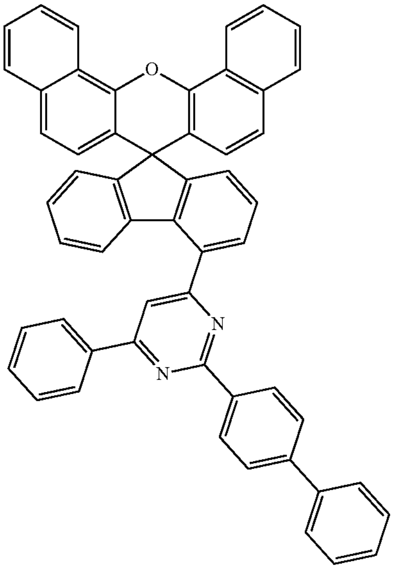
B-311
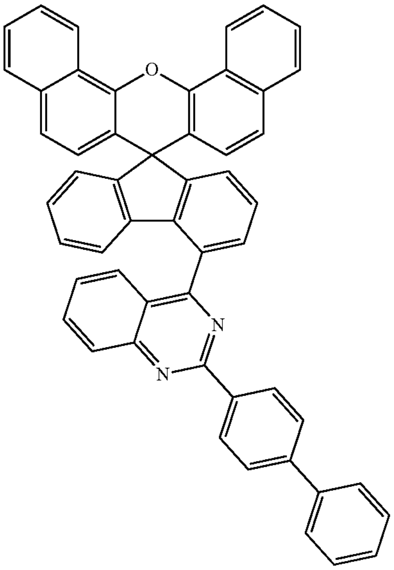

-continued
B-312
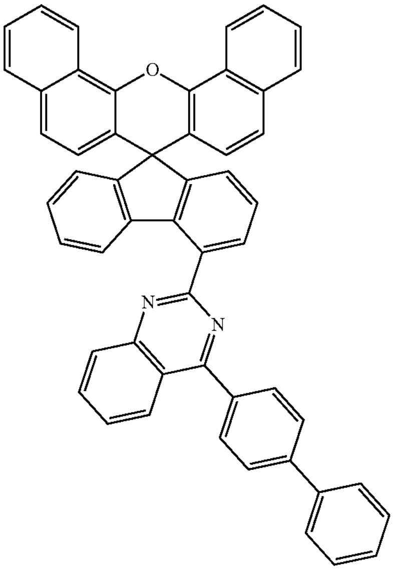
B-313
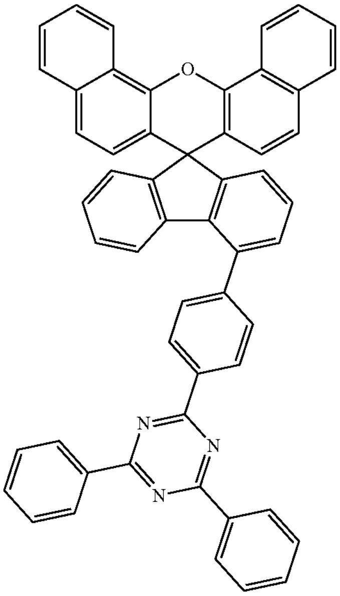
-continued
B-314
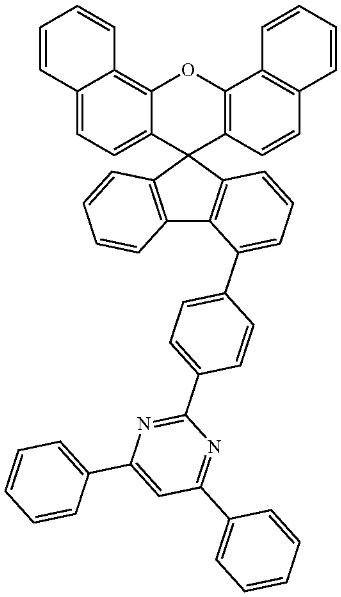
B-315
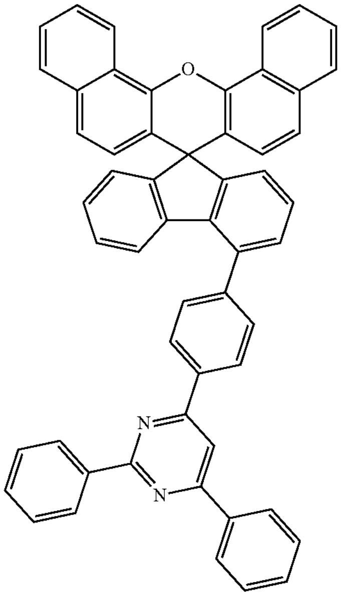

-continued
B-316
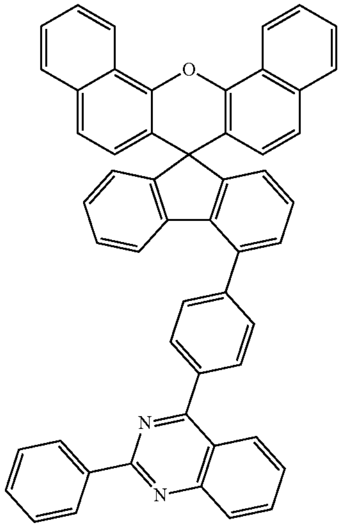
B-317
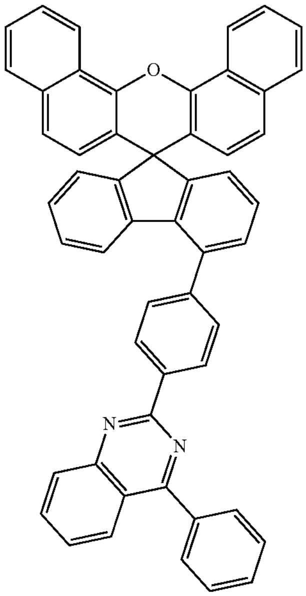
-continued
B-318
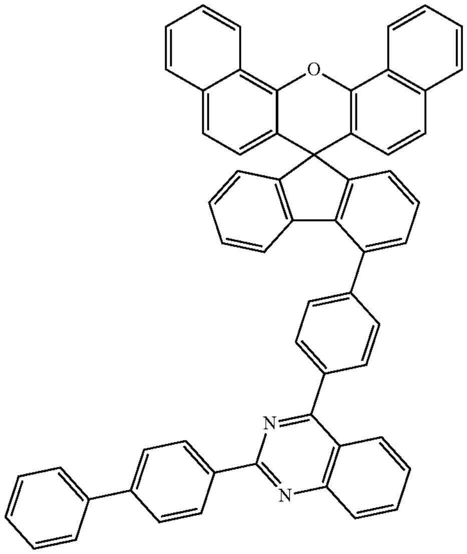
B-319
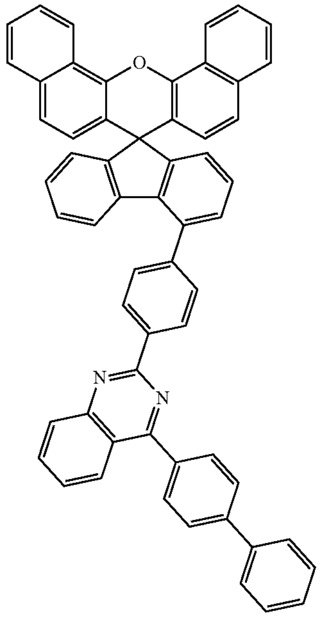
B-320
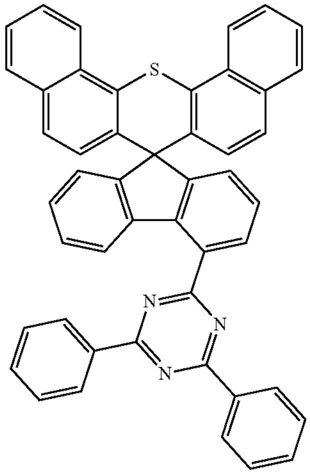

-continued
B-321
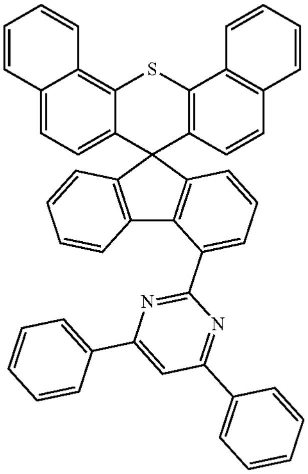
B-322
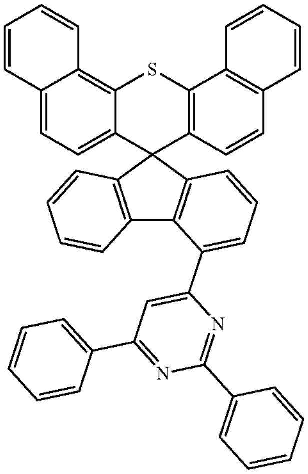
B-323
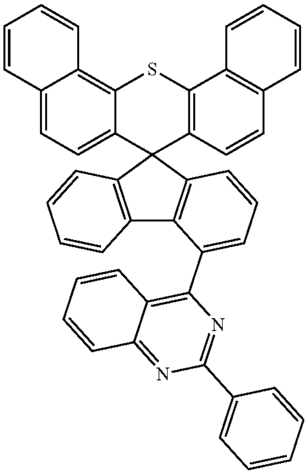
-continued
B-324
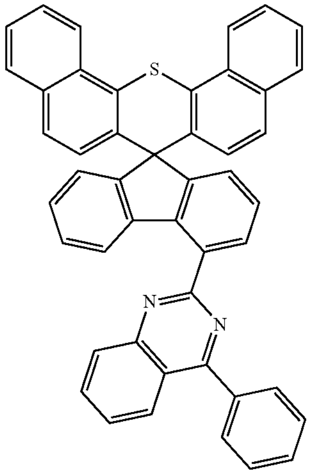
B-325
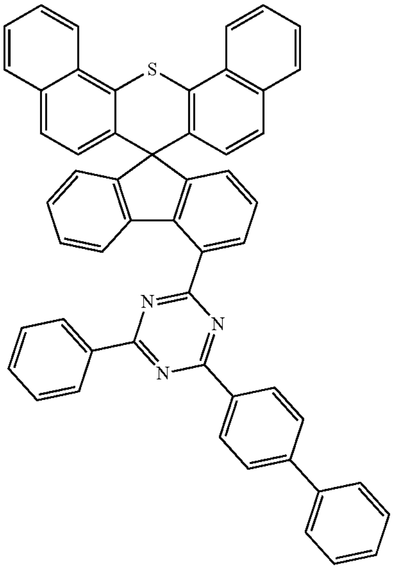
B-326
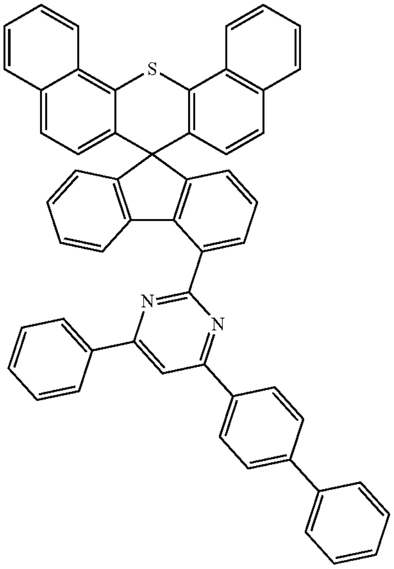

-continued
B-327
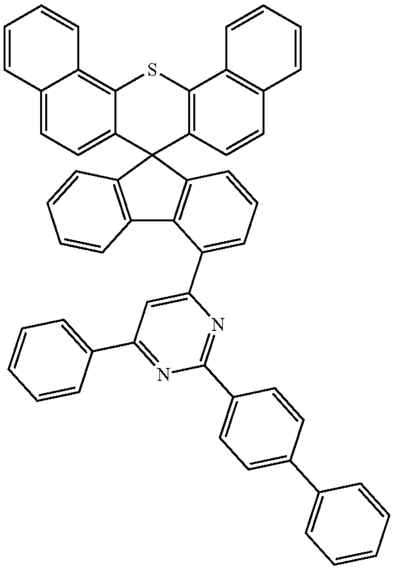
B-328
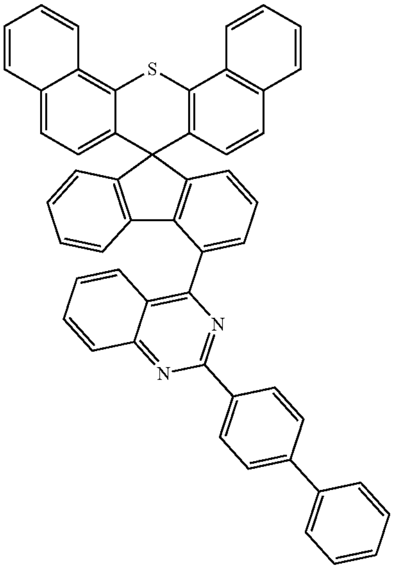
-continued
B-329
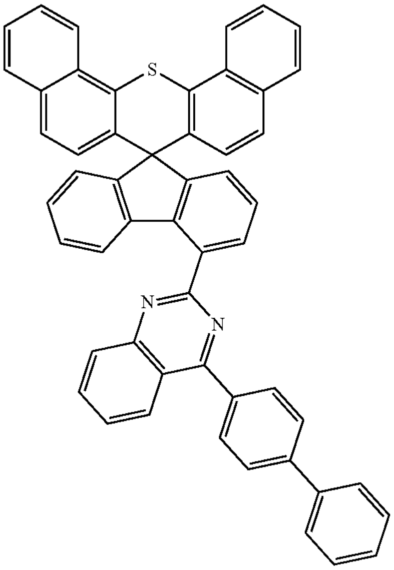
B-330
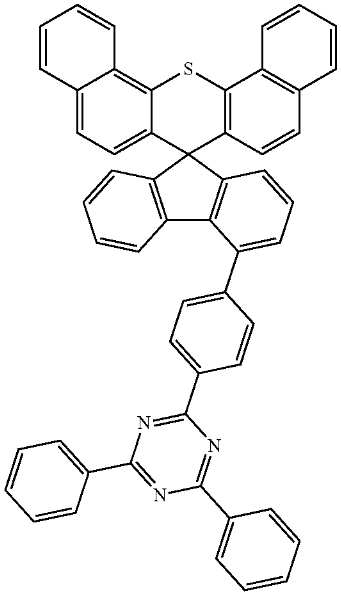

-continued
B-331
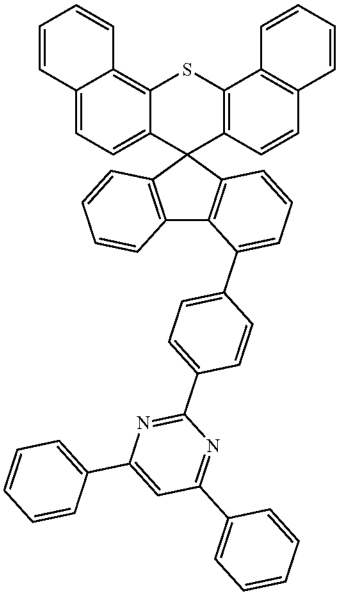
B-332
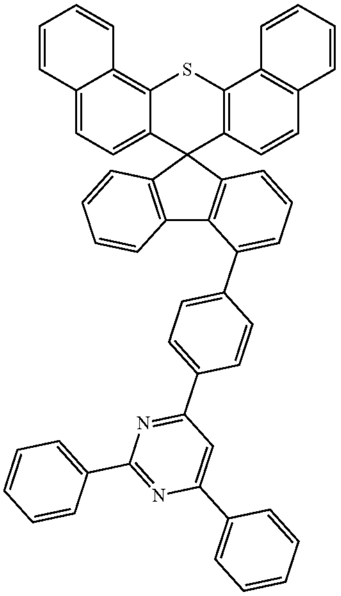
-continued
B-333
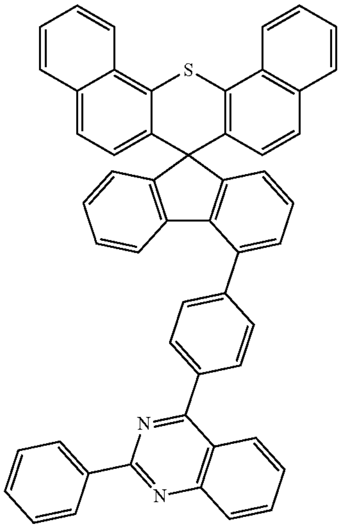
B-334
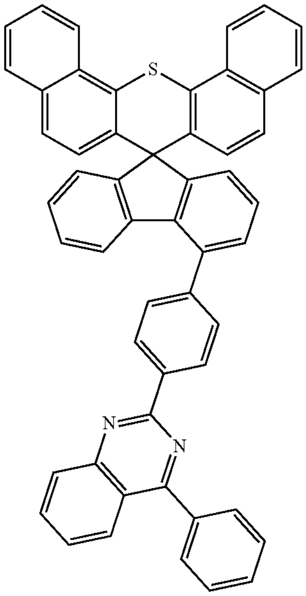

-continued
B-335
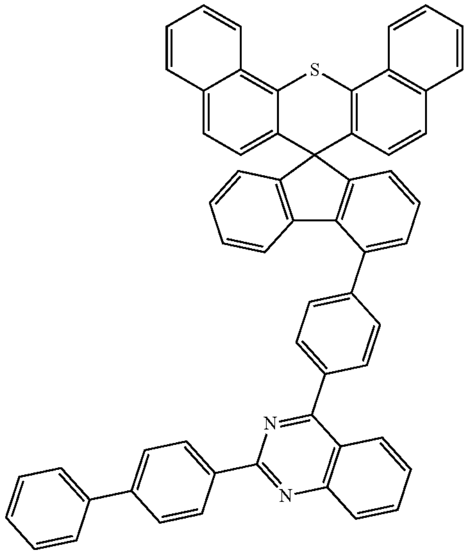
B-336
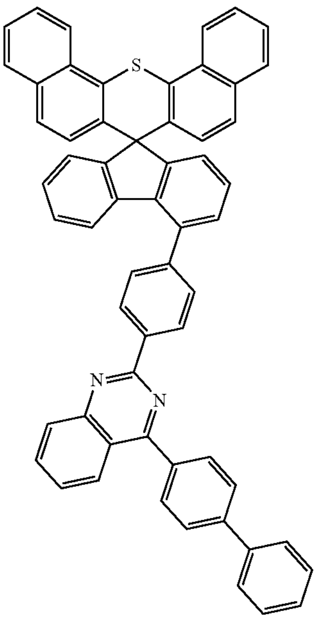
B-337
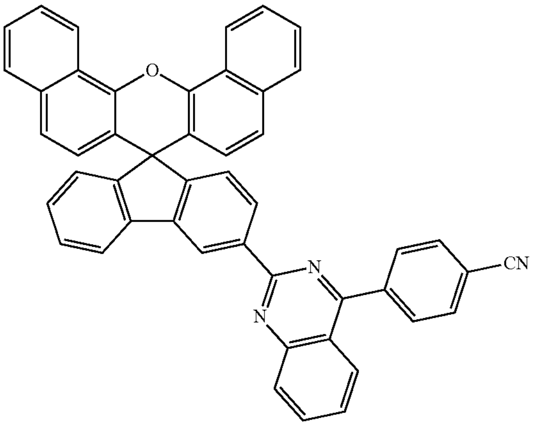
-continued
B-338
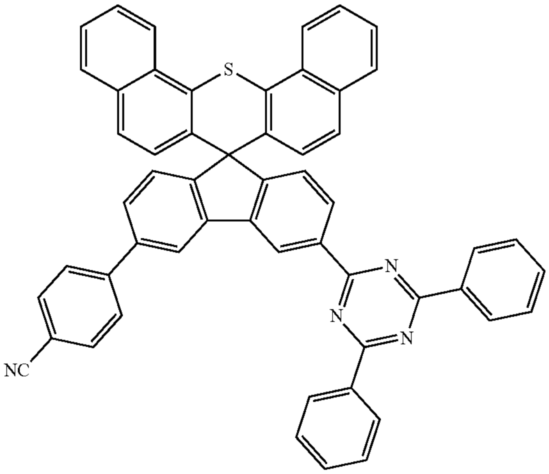
B-339
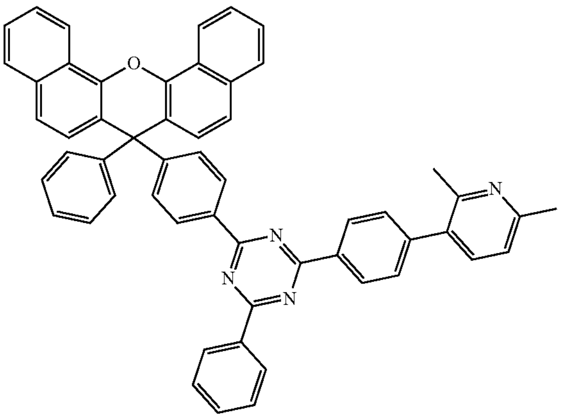
B-340
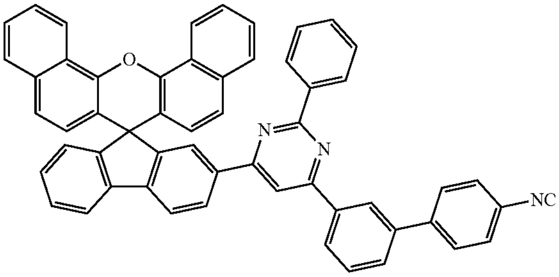

-continued
B-341
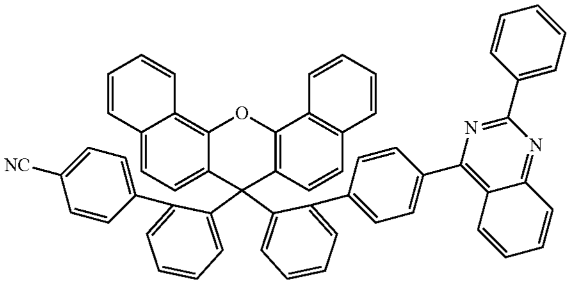
B-342
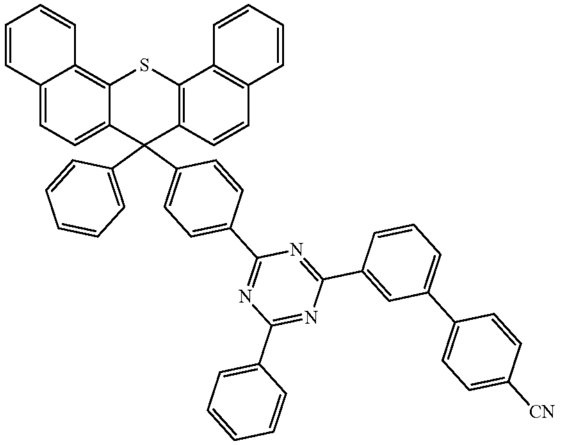
-continued
B-343
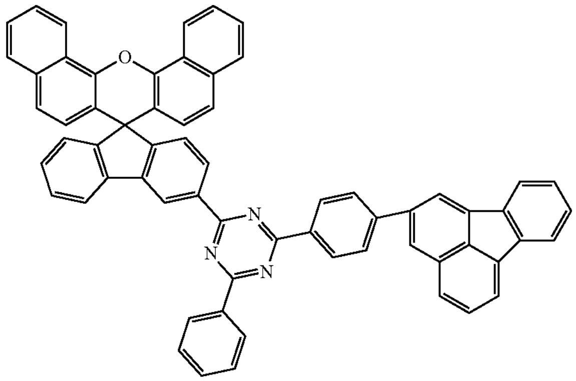
B-344
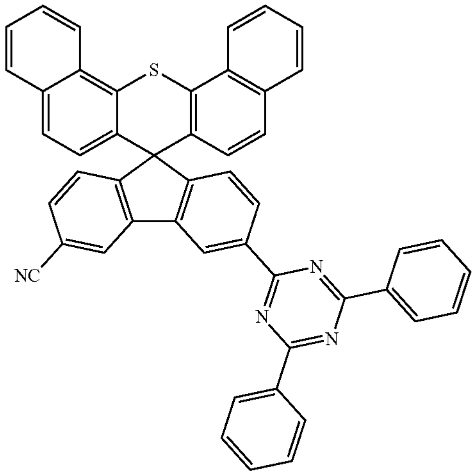
In addition, the compound represented by [Formula C] above may be any one selected from the following compounds [C-1] to [C-60]:
C-1
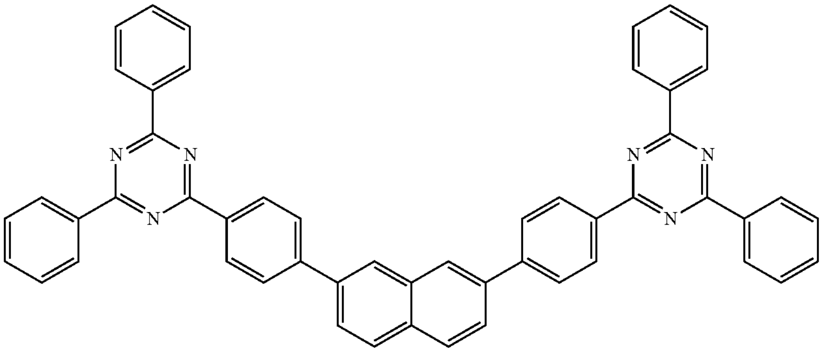

-continued
C-2
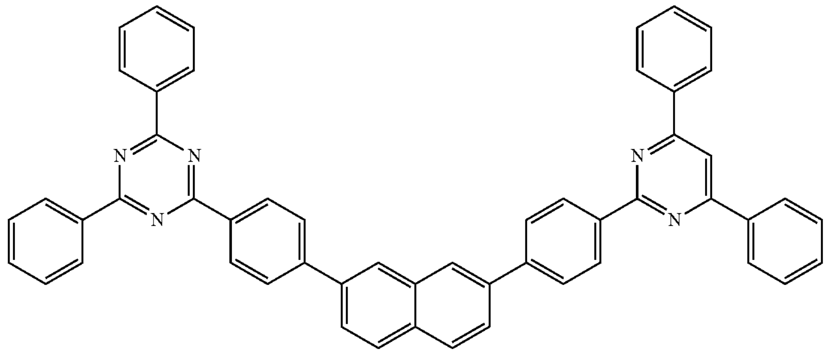
C-3
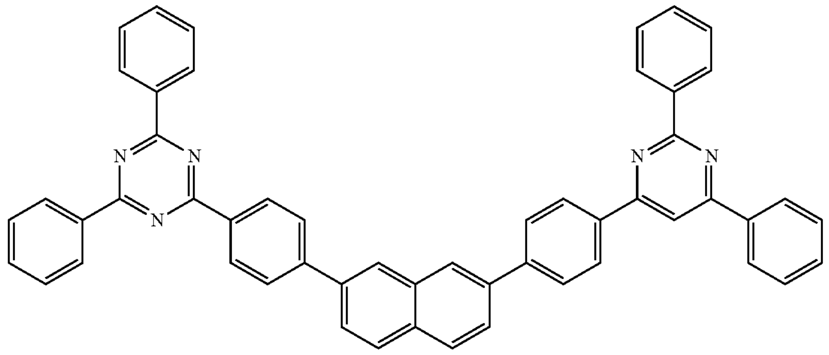
C-4
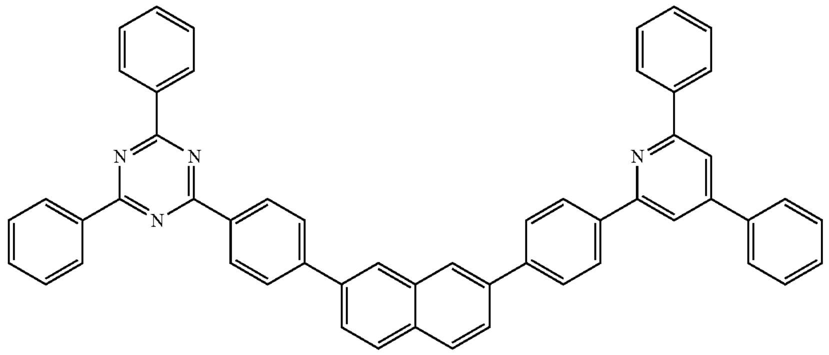
C-5
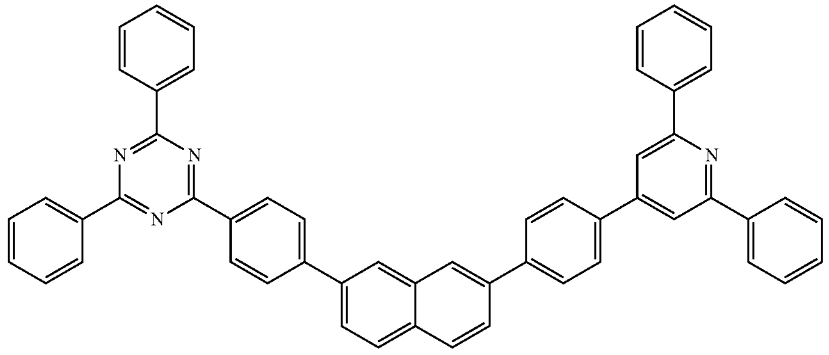

-continued
C-6
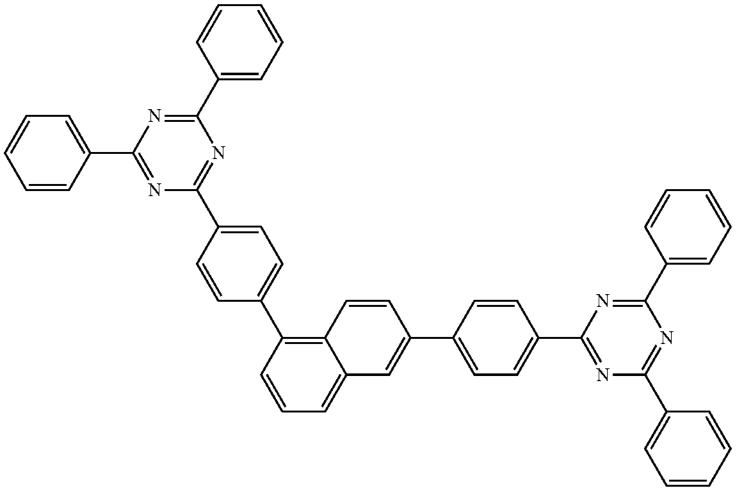
C-7
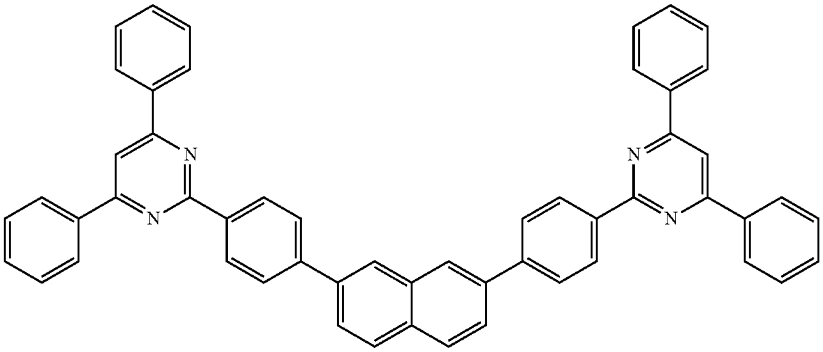
C-8
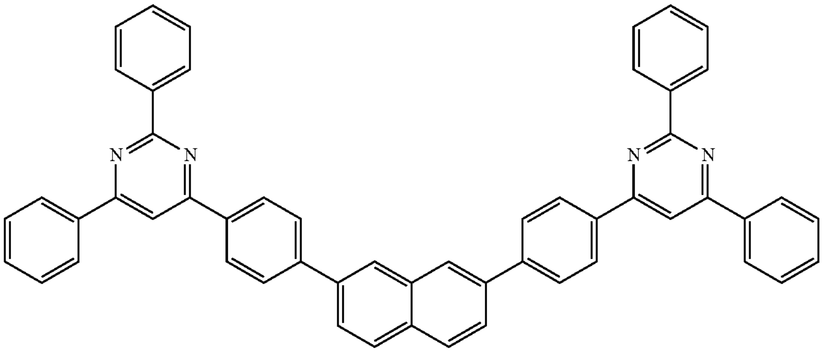
C-9
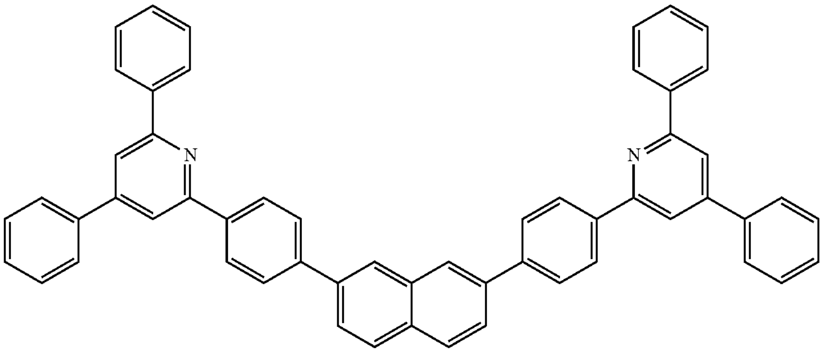

-continued
C-10
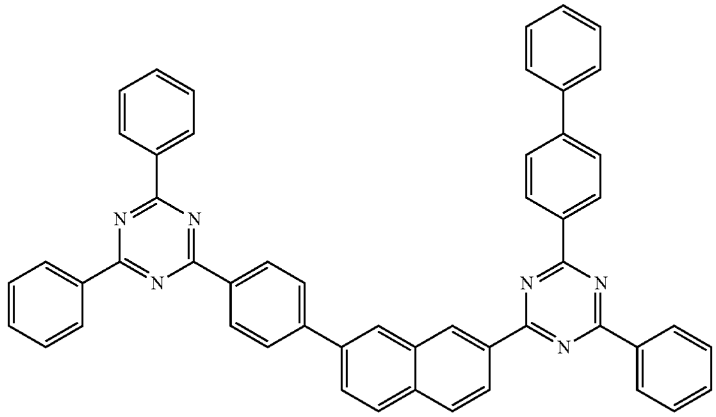
C-11
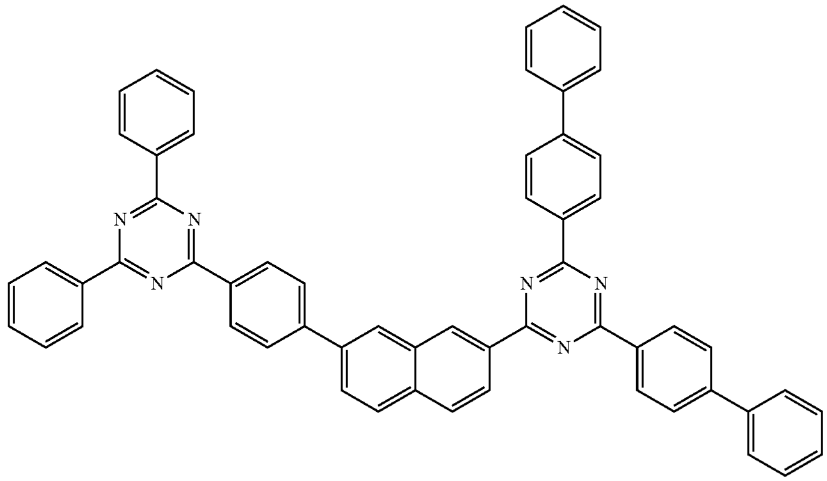
C-12
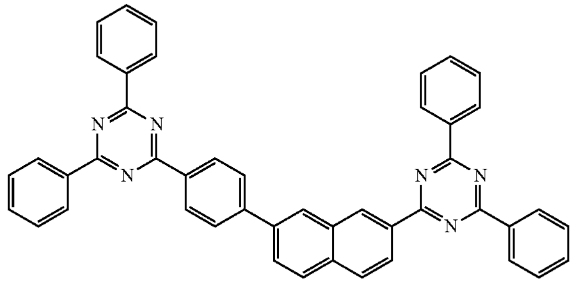
C-13
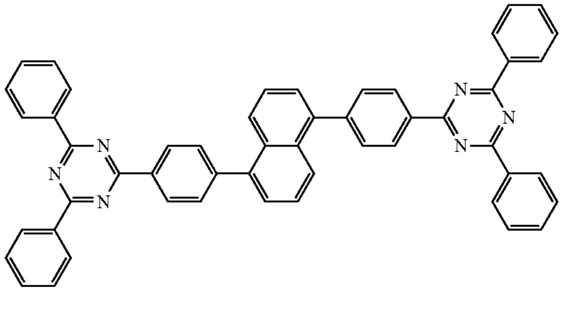

-continued
C-14
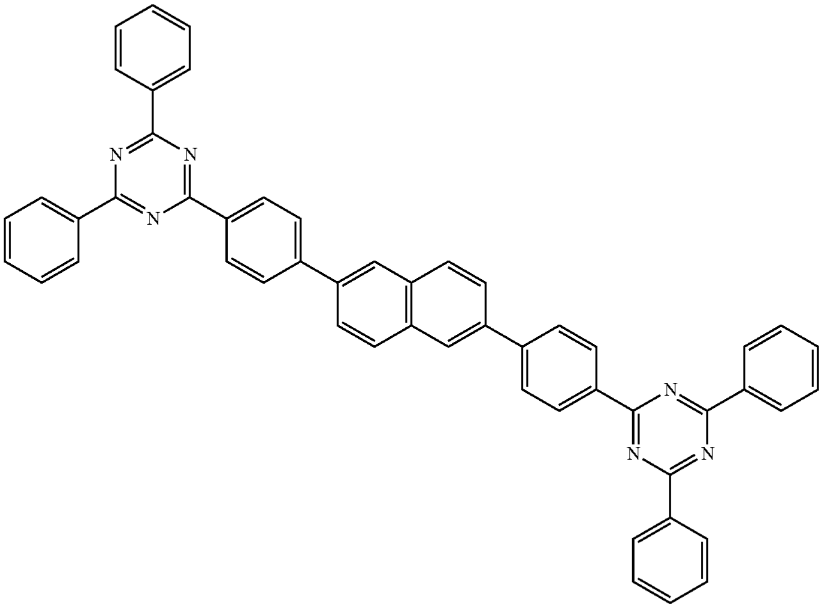
C-15
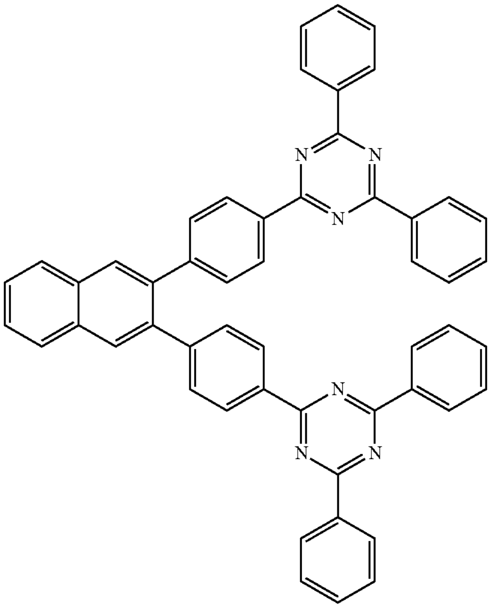
C-16
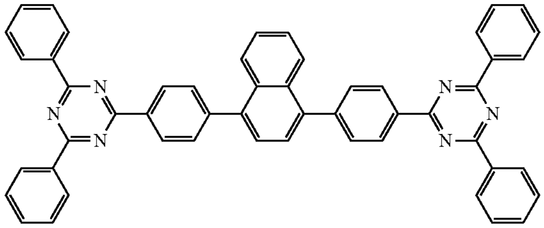
C-17
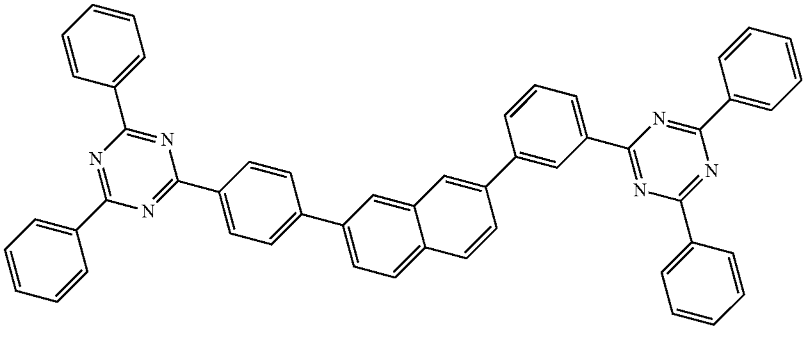

-continued
C-18
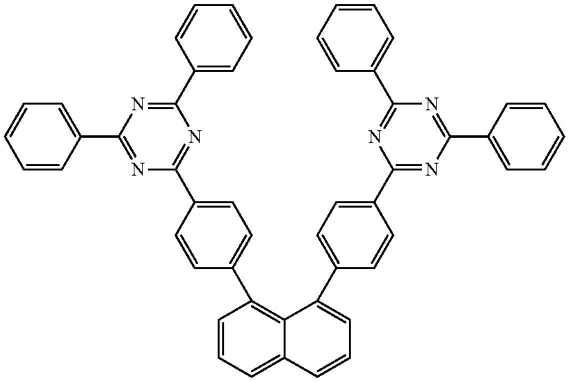
C-19
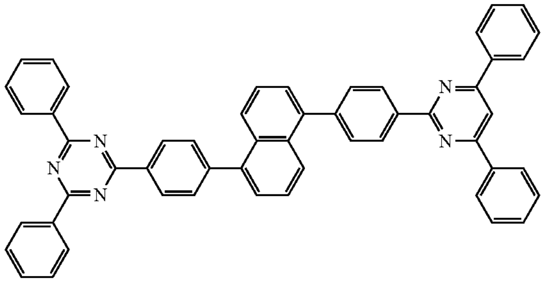
C-20
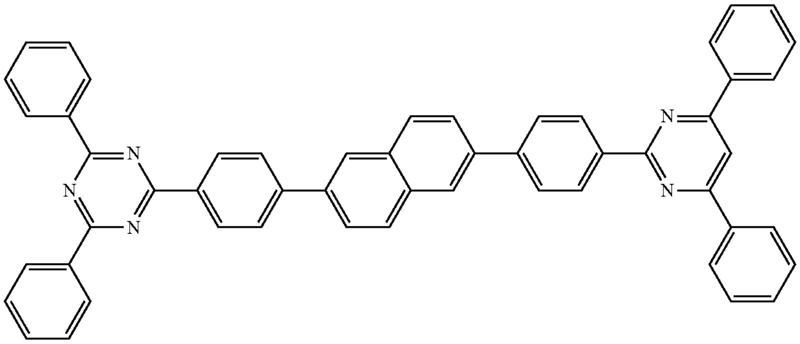
C-21
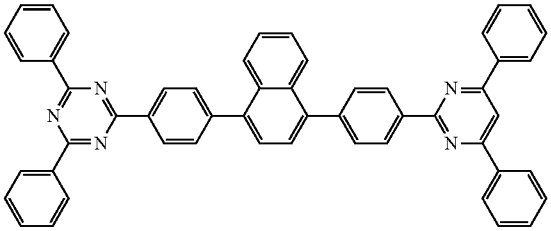
C-22
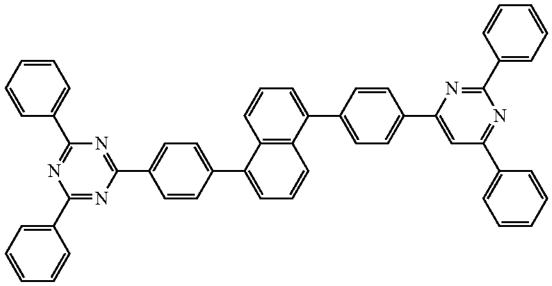
C-23
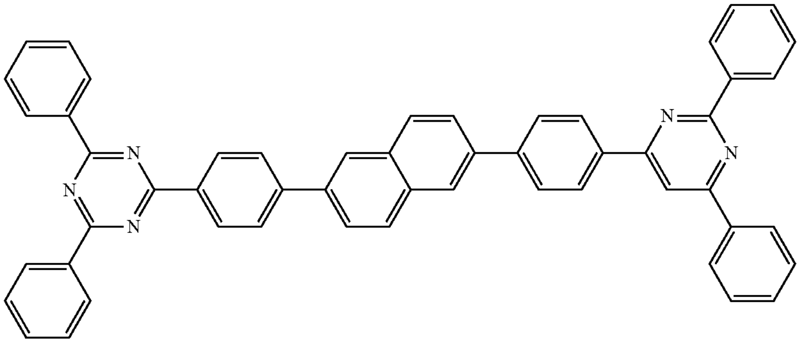

-continued
C-24
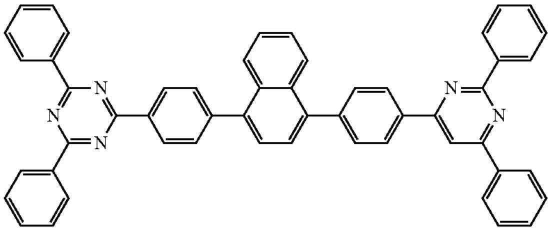
C-25
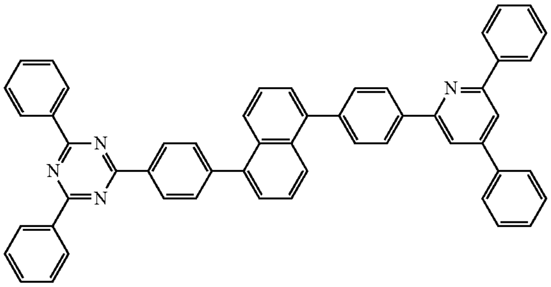
C-26
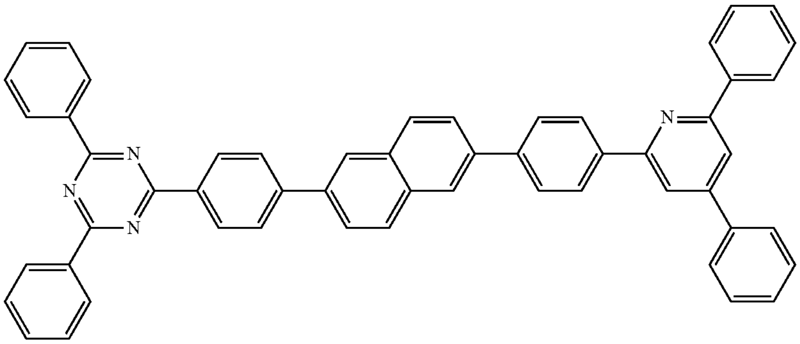
C-27
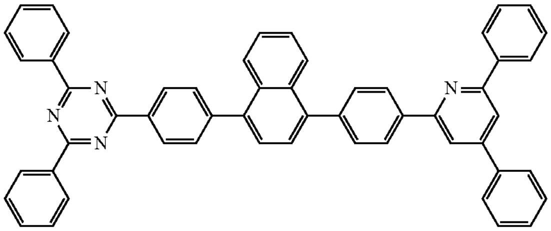
C-28
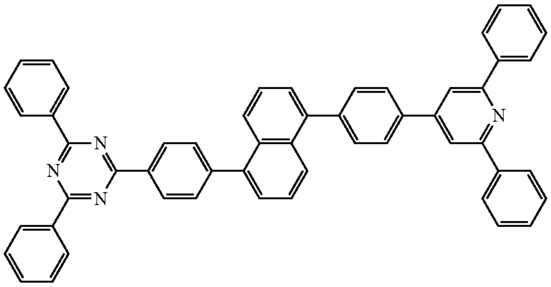
C-29
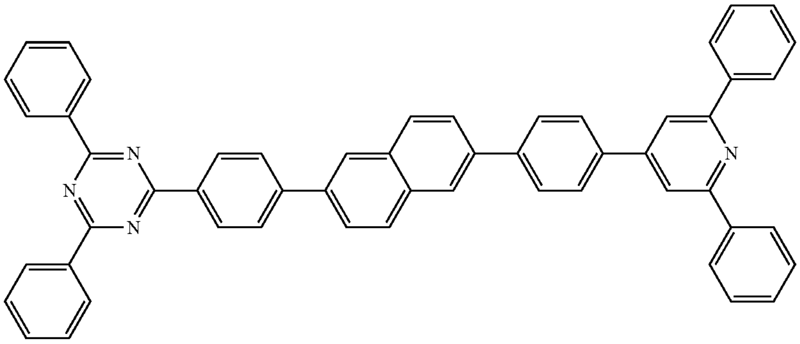

-continued
C-30
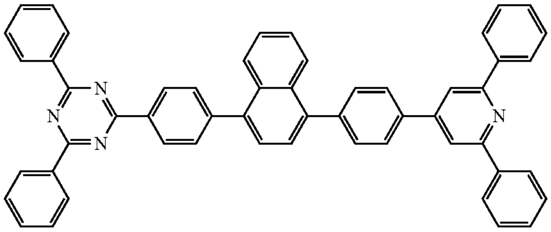
C-31
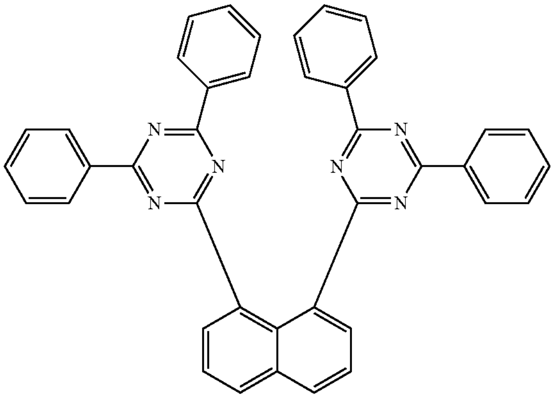
C-32
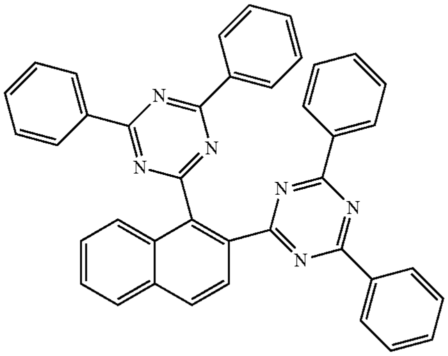
C-33
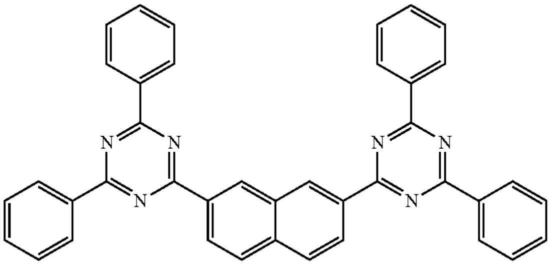
C-34
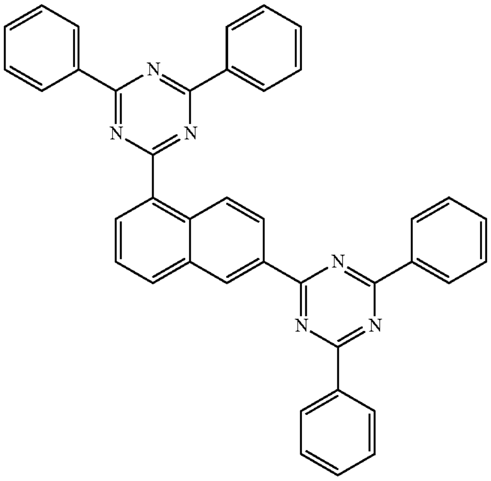
C-35
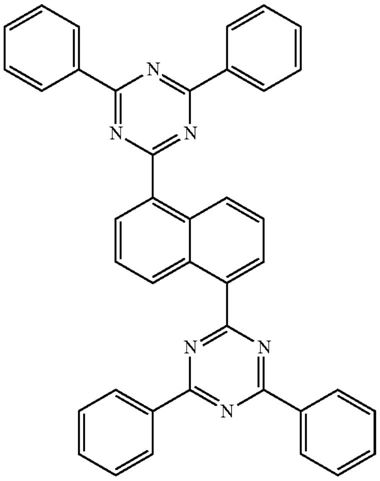

-continued
C-36
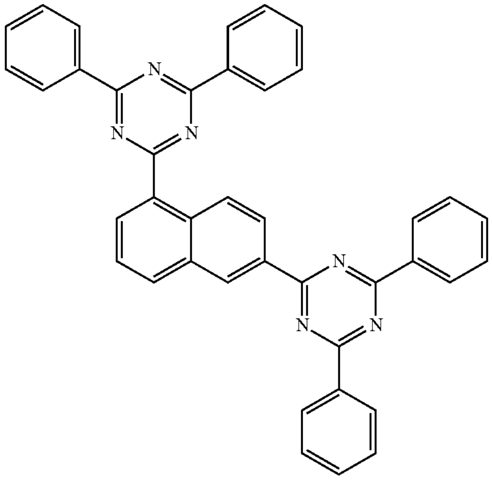
C-37
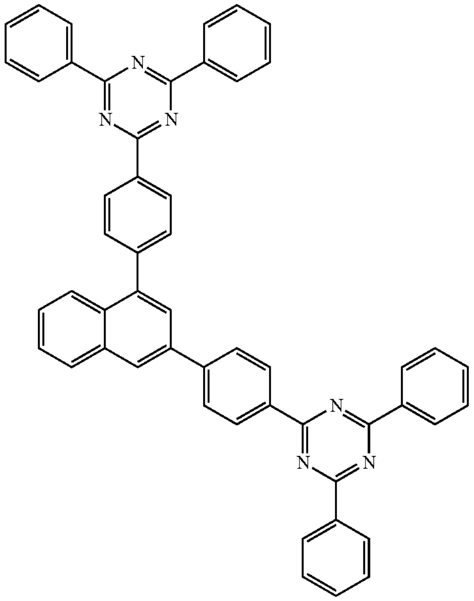
C-38
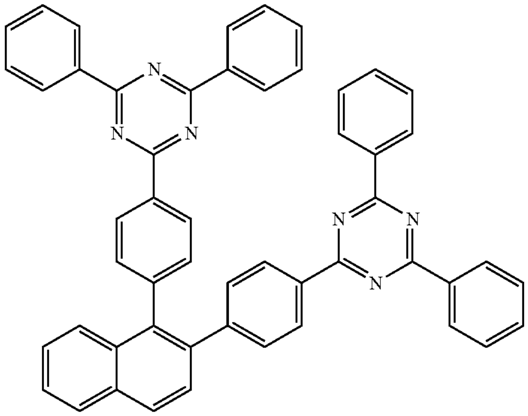
C-39
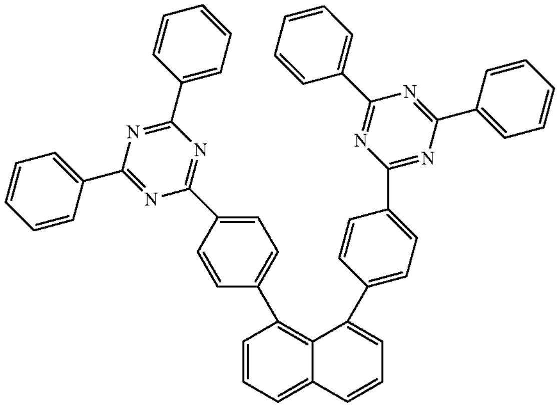
C-40
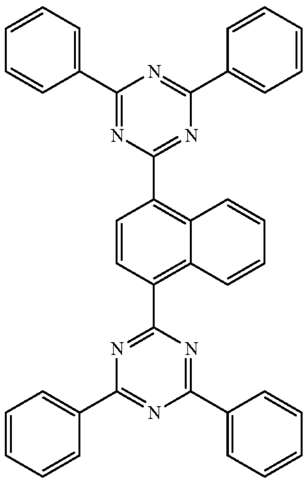
C-41
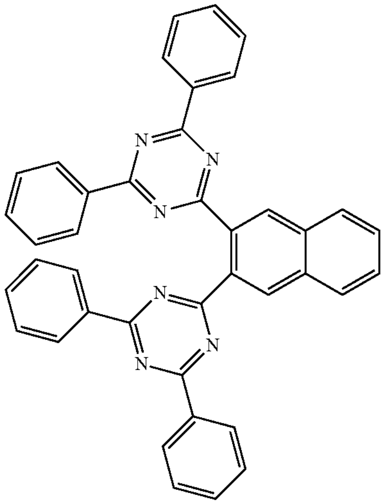

-continued
C-42
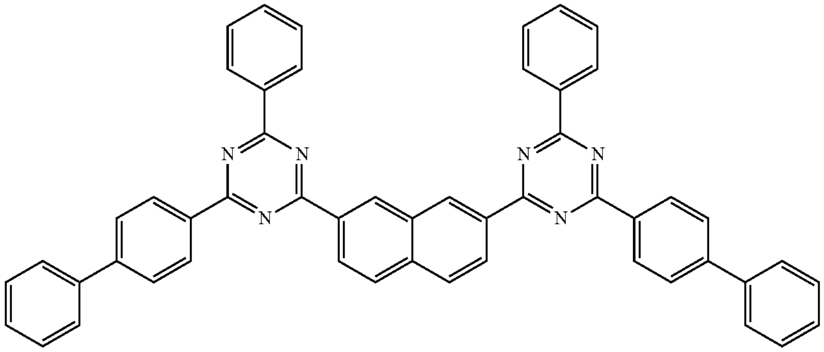
C-43
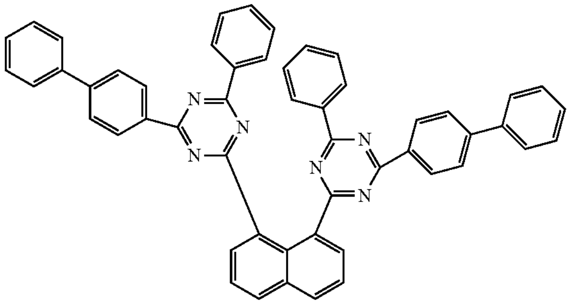
C-44
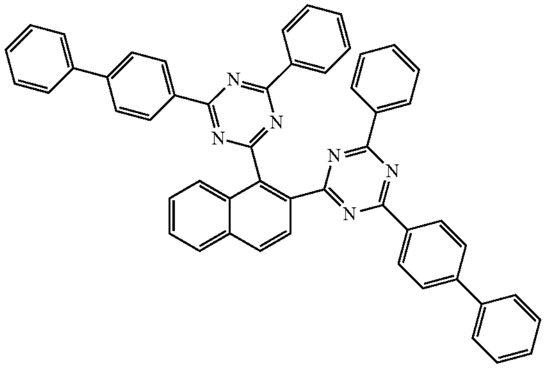
C-45
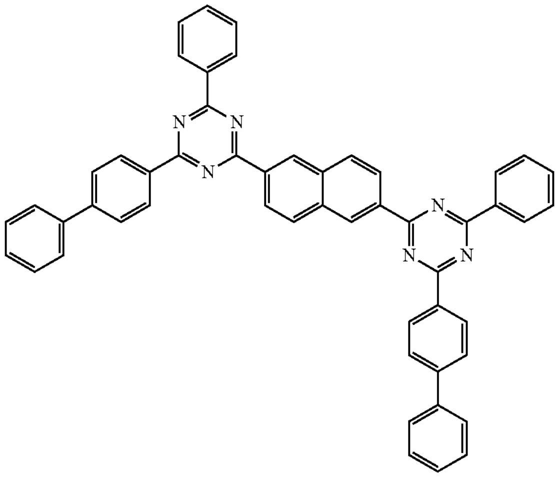
C-46
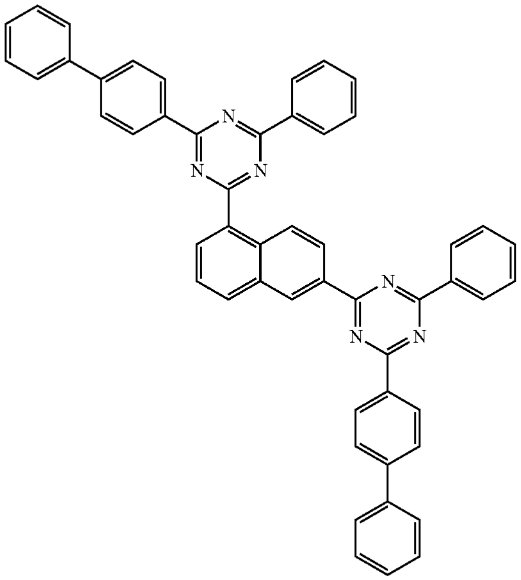

-continued
C-47
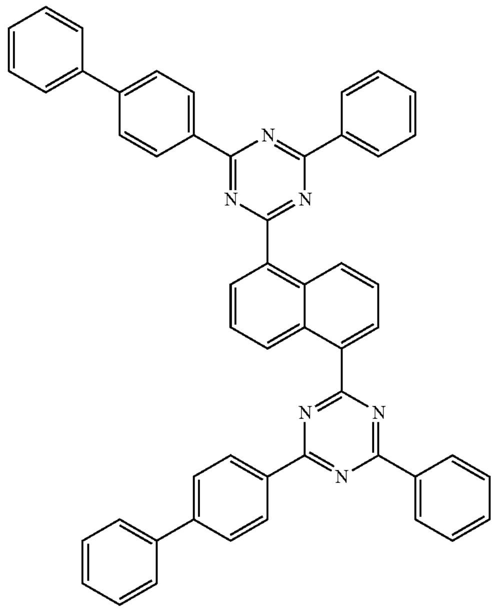
C-48
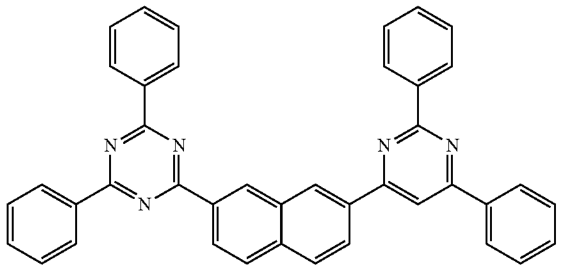
C-49
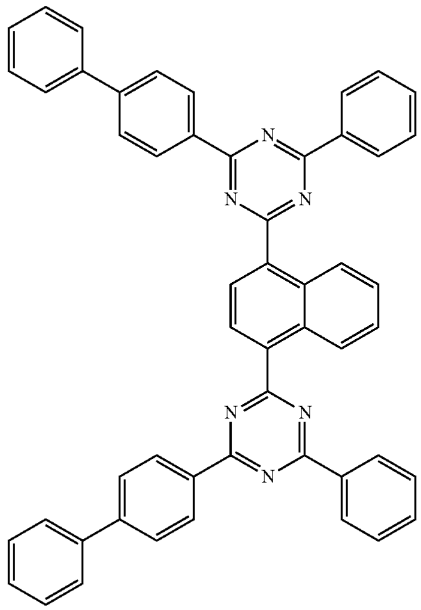
C-50
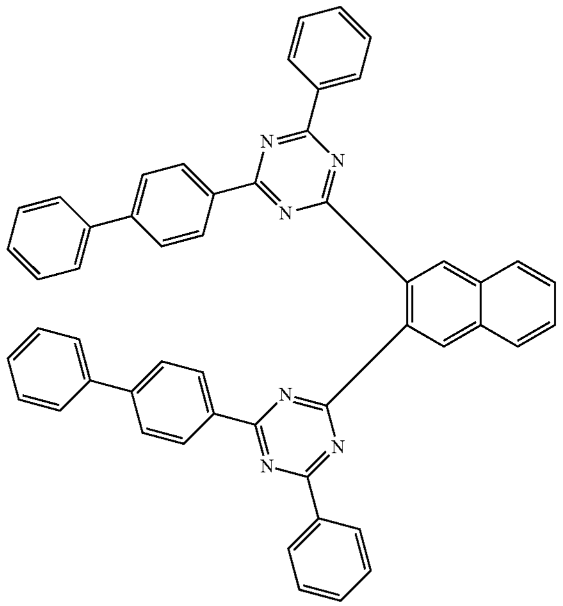

-continued
C-51
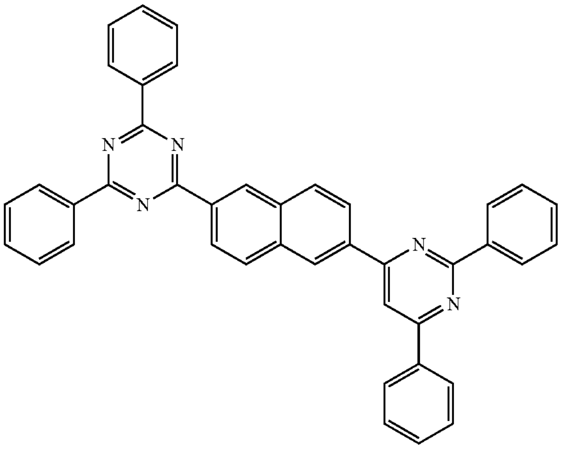
C-52
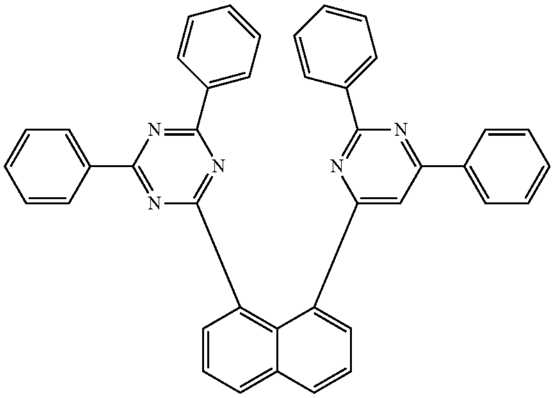
C-53
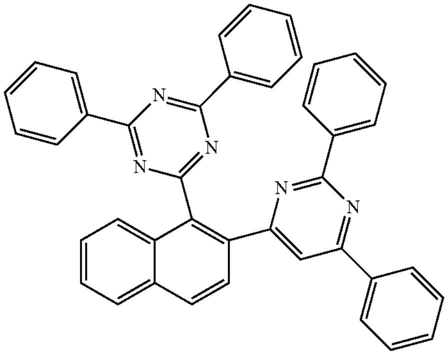
C-54
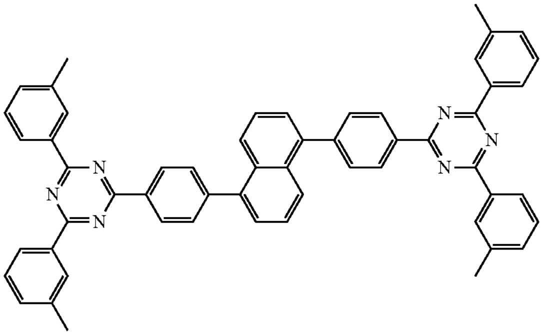
C-55
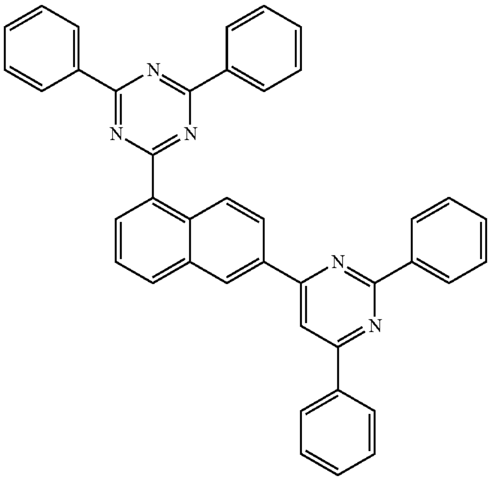
C-56
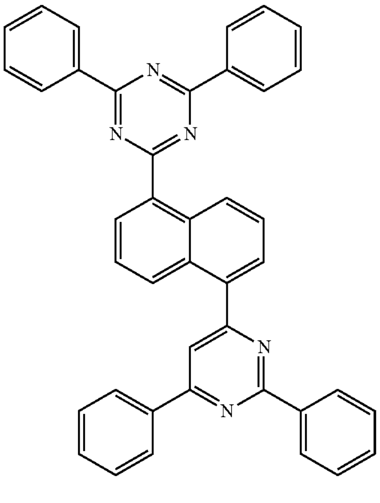

-continued
C-57
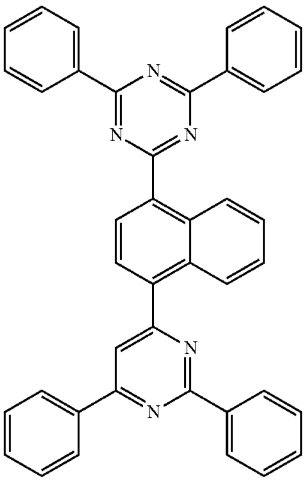
C-58
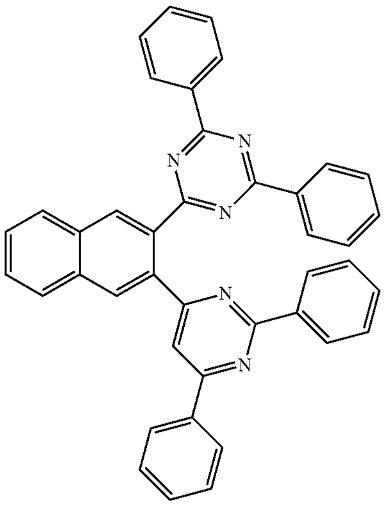
C-59
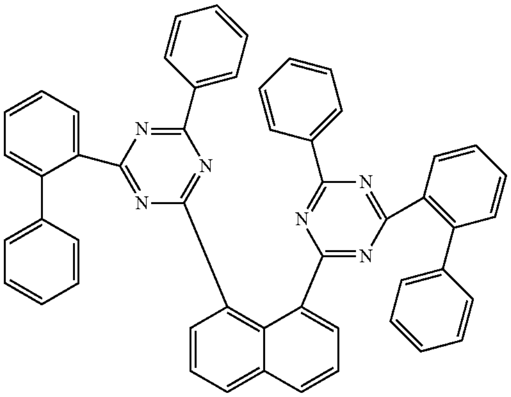
C-60
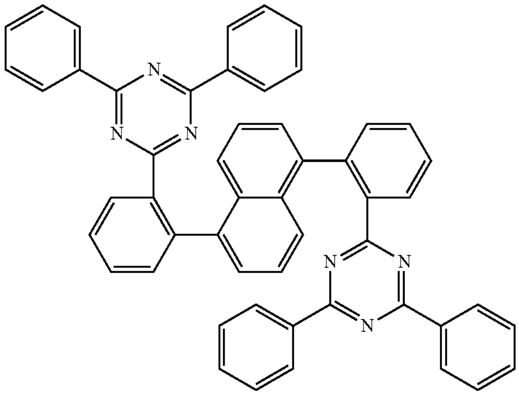
In addition, the compound represented by [Formula D] above may be any one selected from the following compounds [D-1] to [D-90]:
D-1
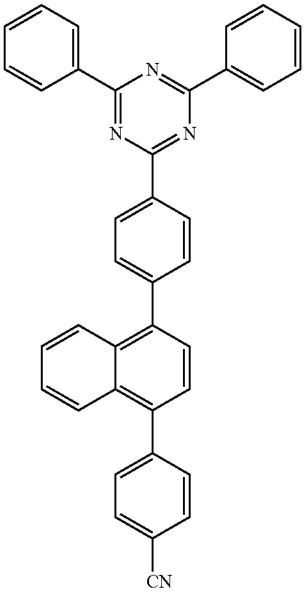

-continued
D-2
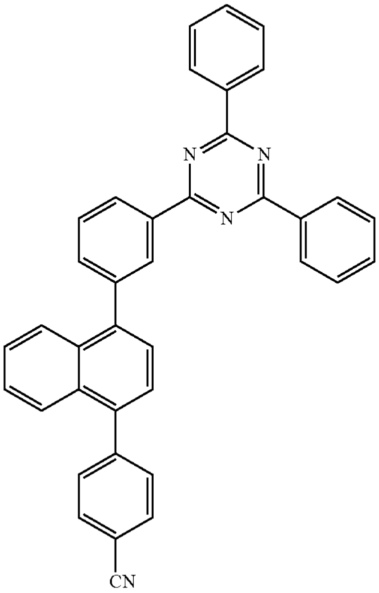
D-3
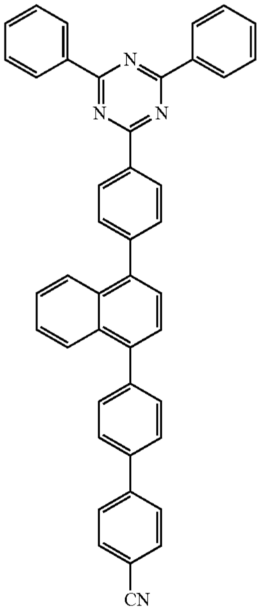
D-4
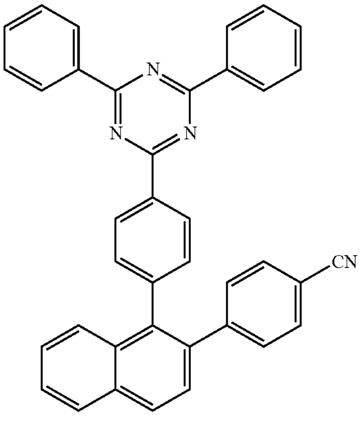
-continued
D-5
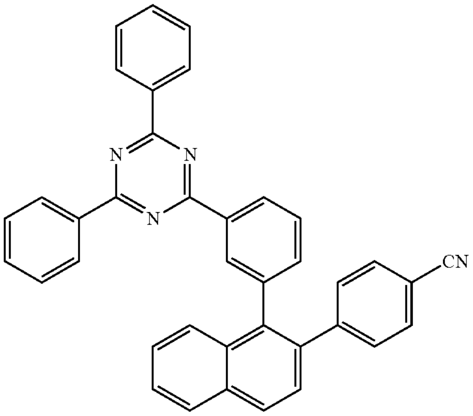
D-6
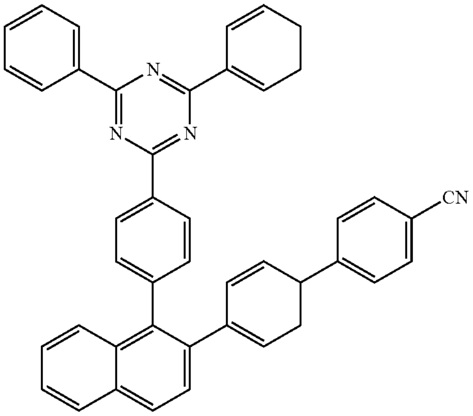
D-7
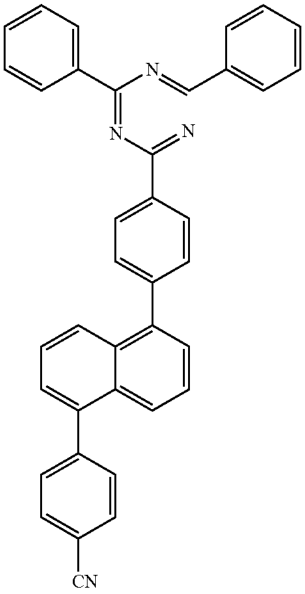

-continued
D-8
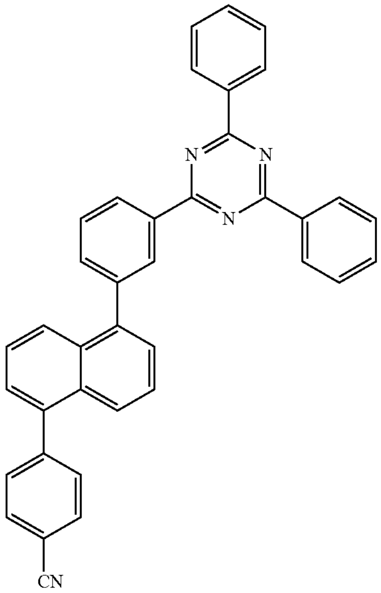
D-9
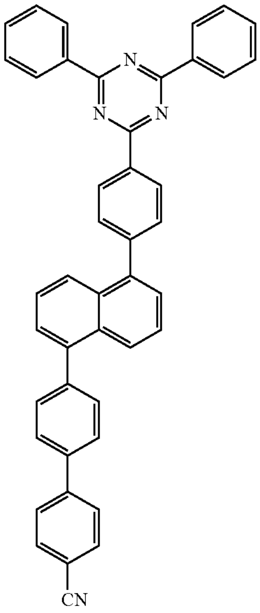
-continued
D-10
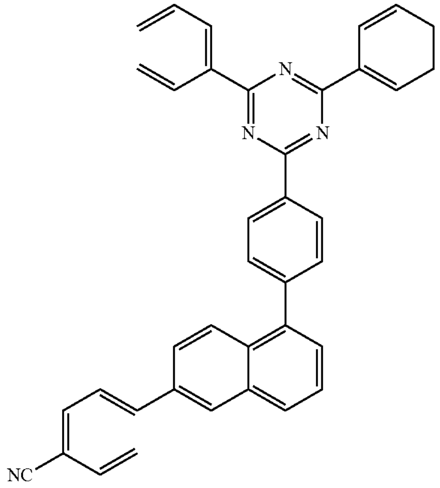
D-11
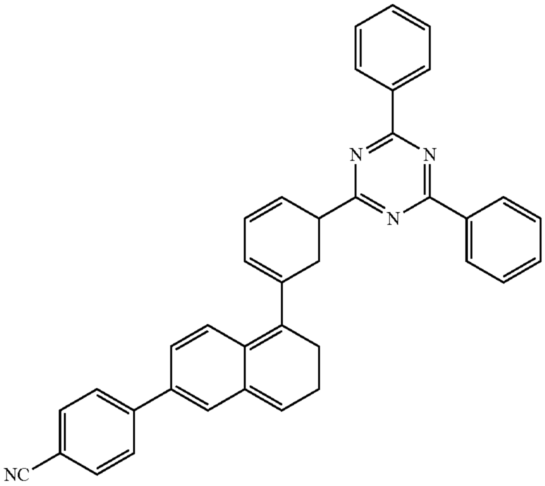
D-12
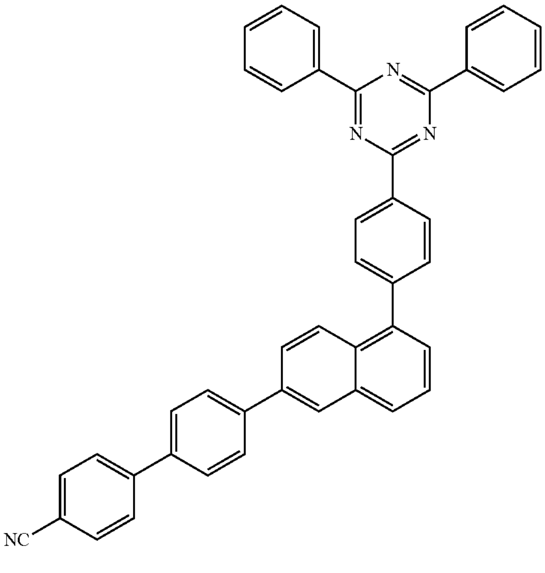

-continued
D-13
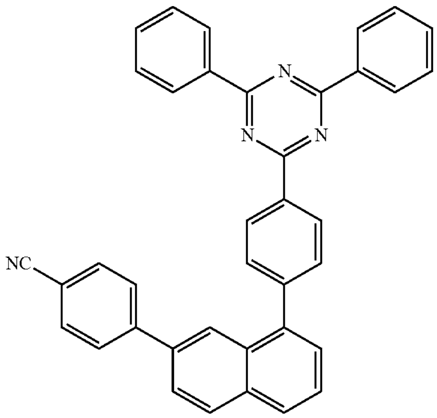
D-14
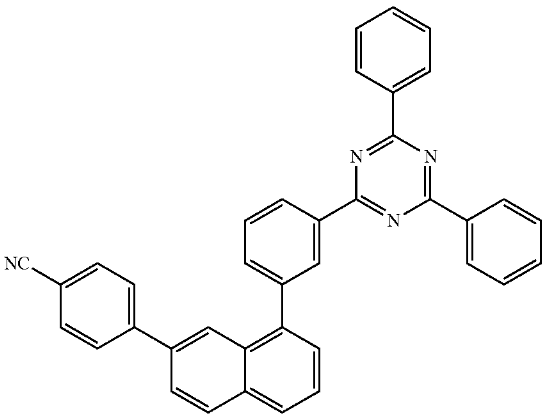
D-15
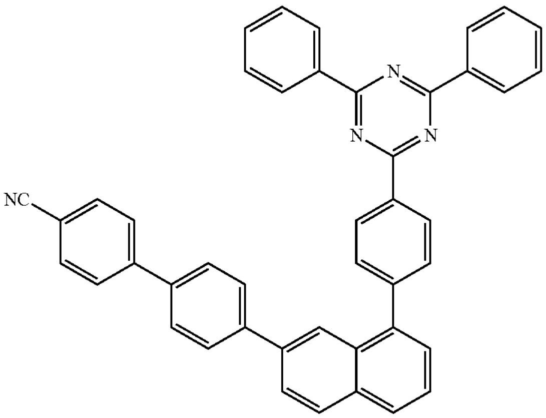
-continued
D-16
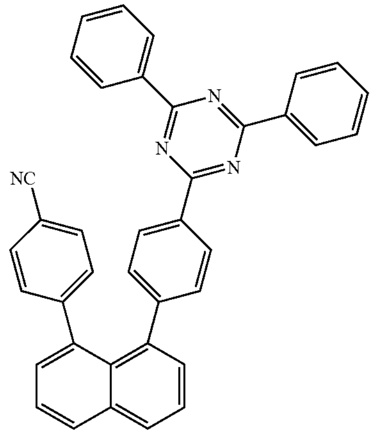
D-17
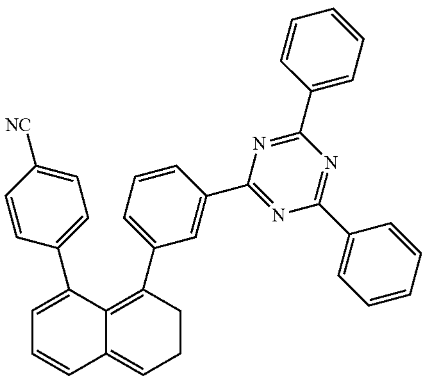
D-18
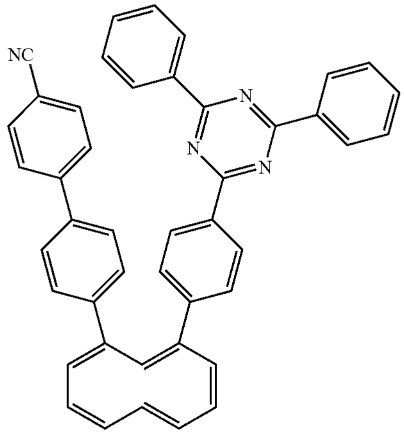

-continued
D-19
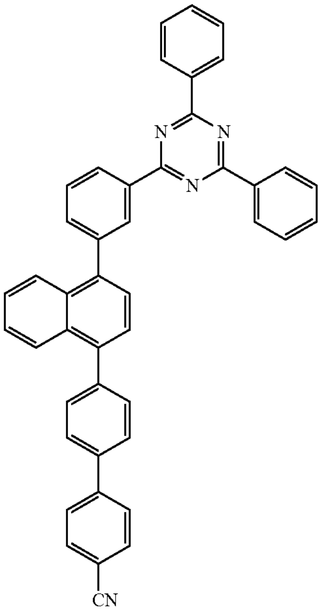
D-20
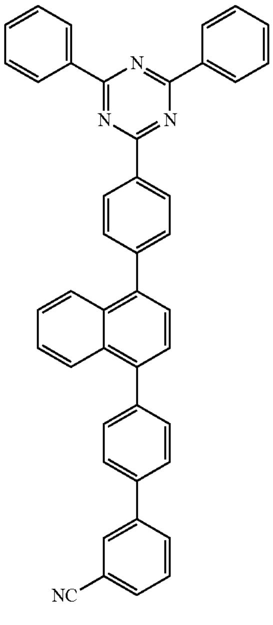
-continued
D-21
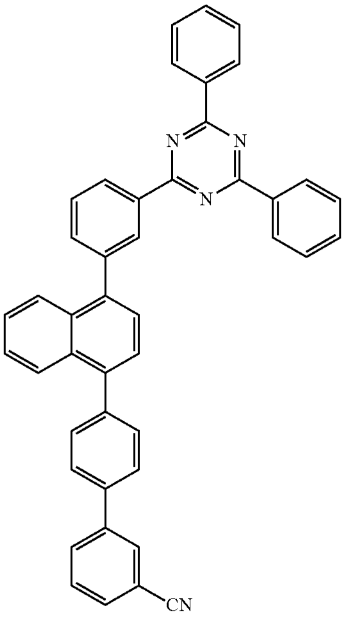
D-22
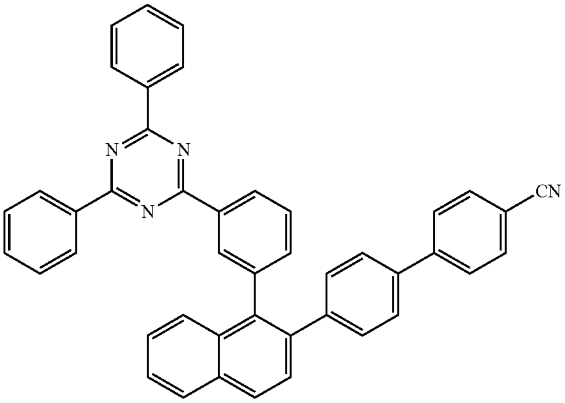
D-23
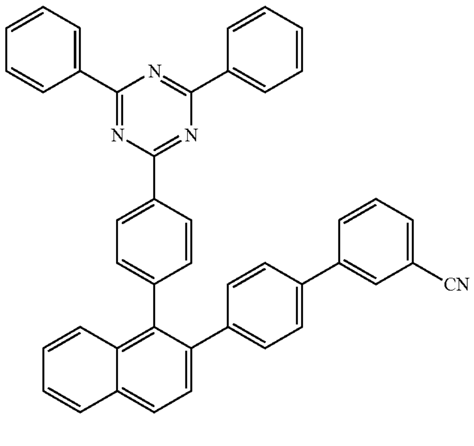

-continued
D-24
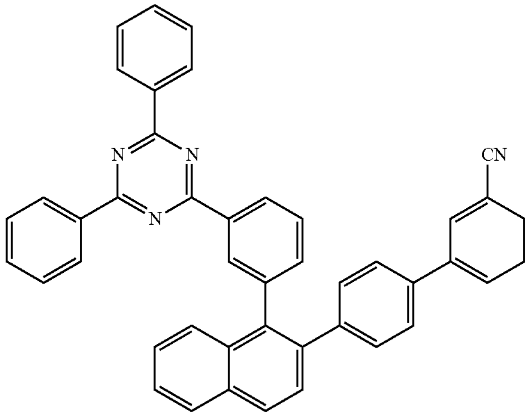
D-25
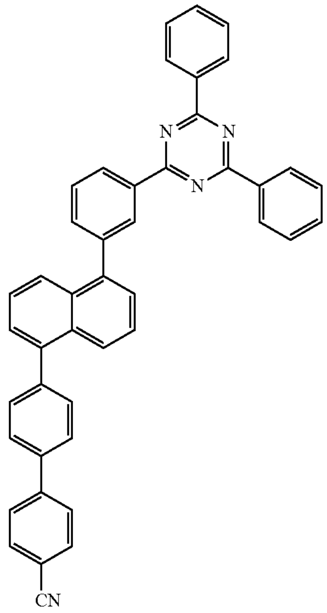
D-26
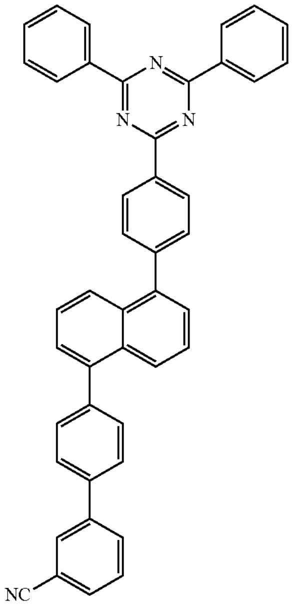
-continued
D-27
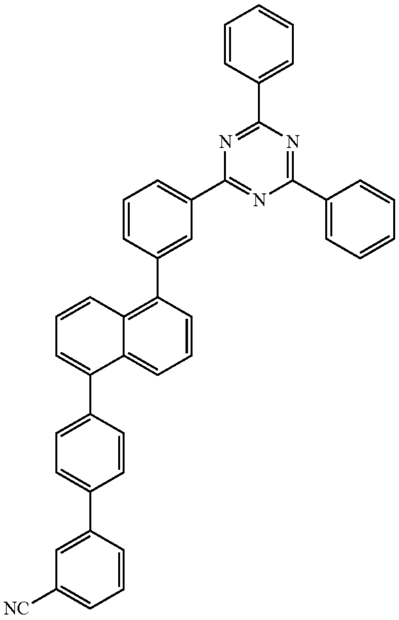
D-28
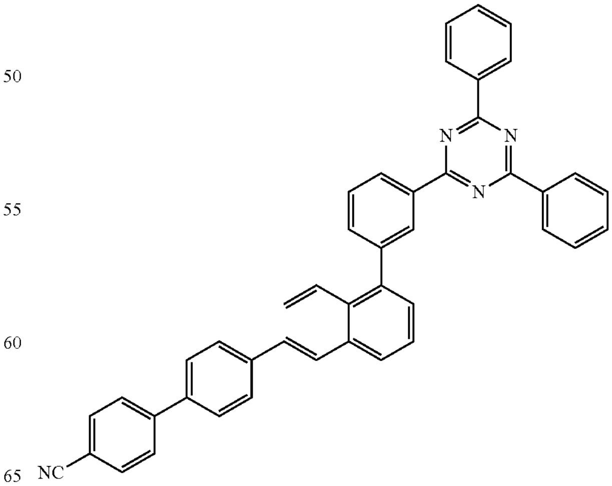

-continued
D-29
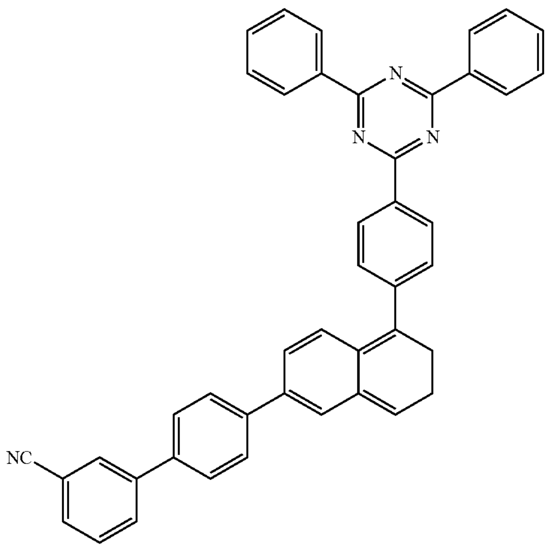
D-30
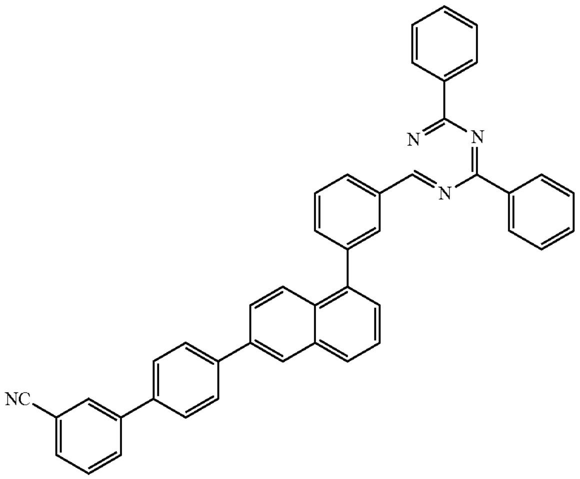
D-31
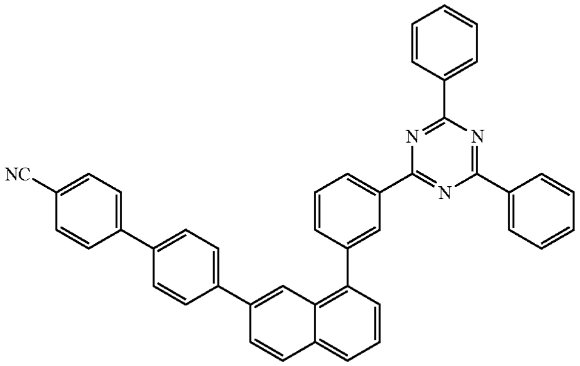
-continued
D-32
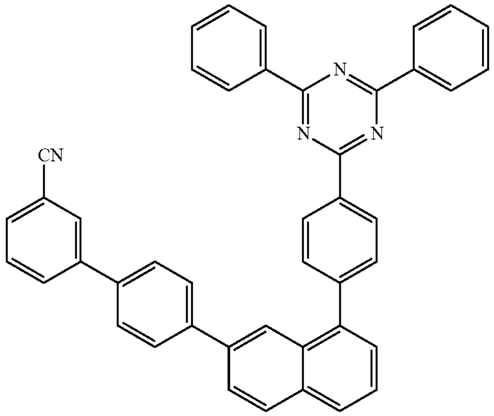
D-33
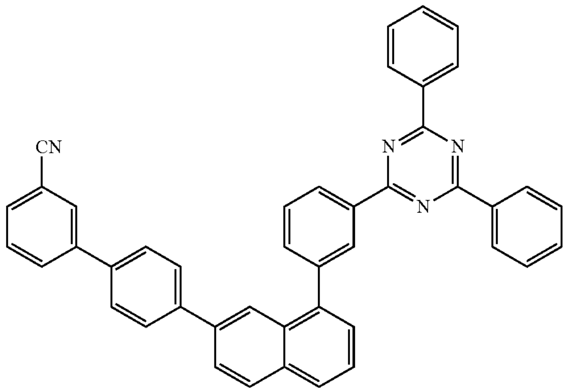
D-34
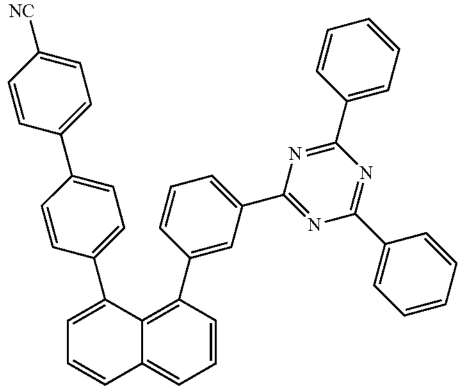
D-35
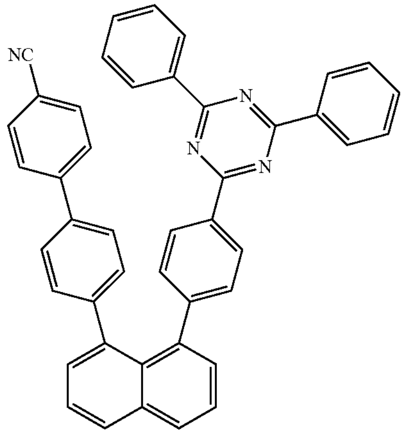

-continued
D-36
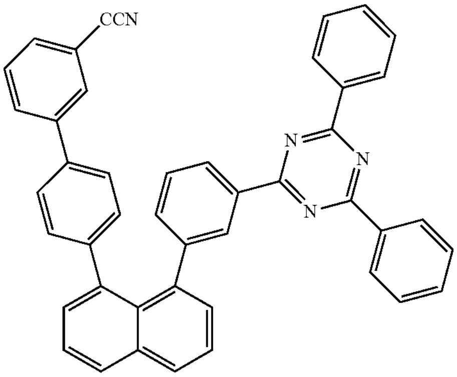
D-37
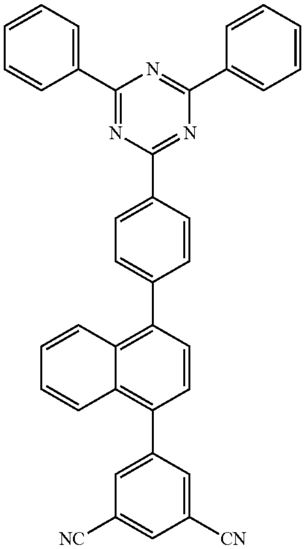
D-38
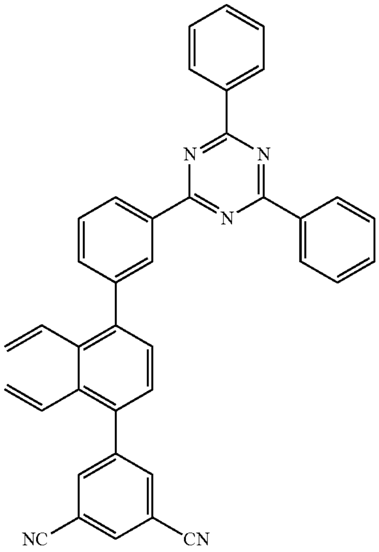
-continued
D-39
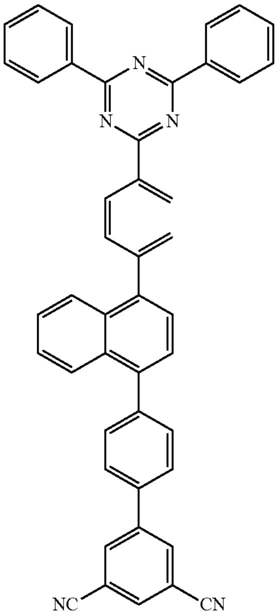
D-40
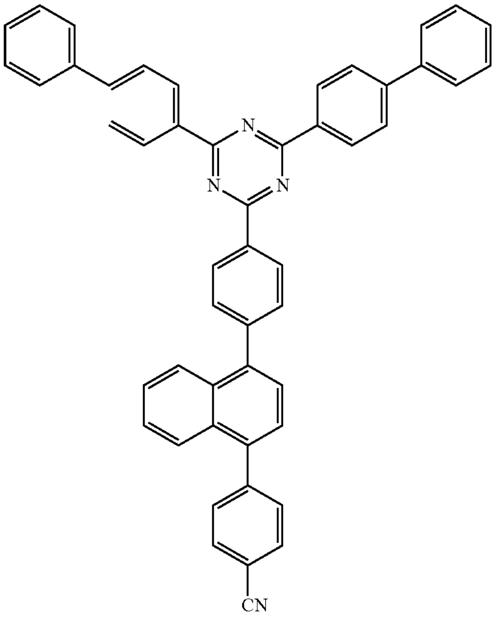

-continued
D-41
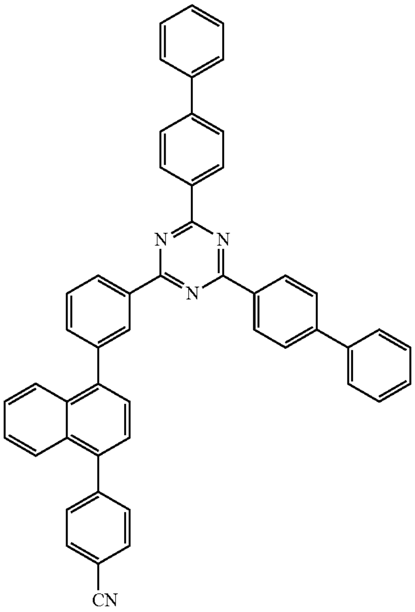
D-43
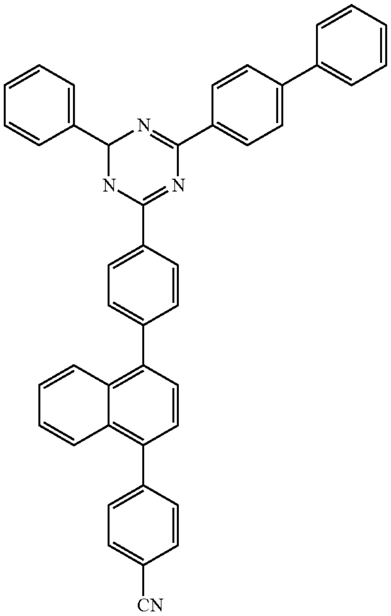
D-42
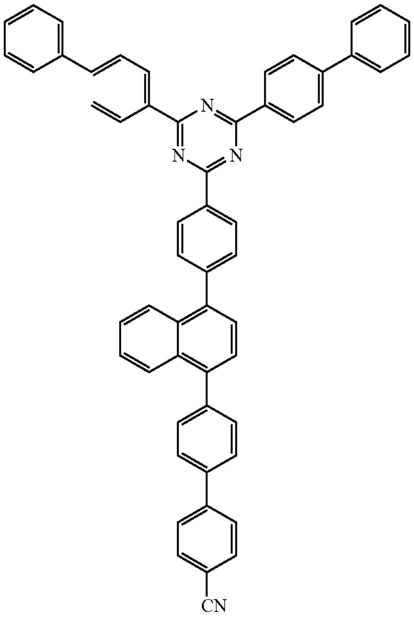
D-44
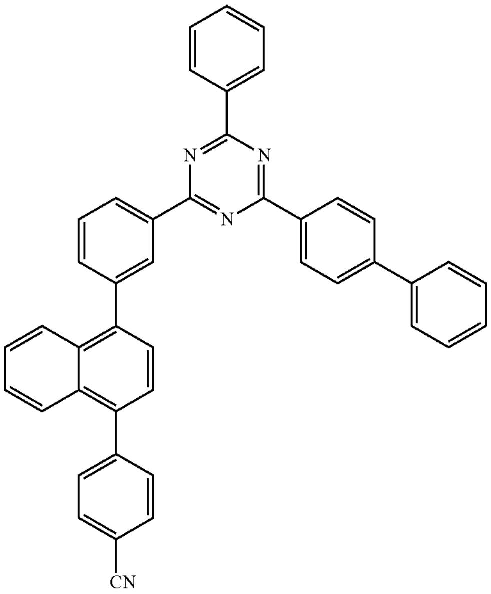

D-45
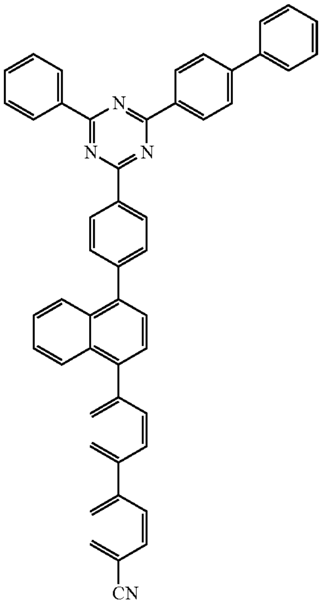
D-46
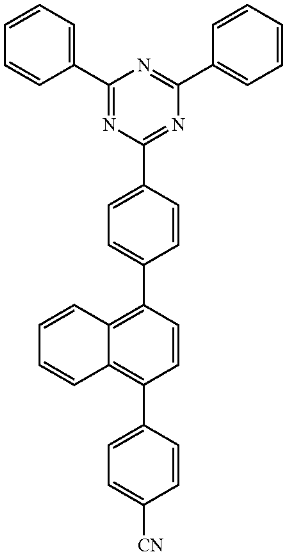
D-47
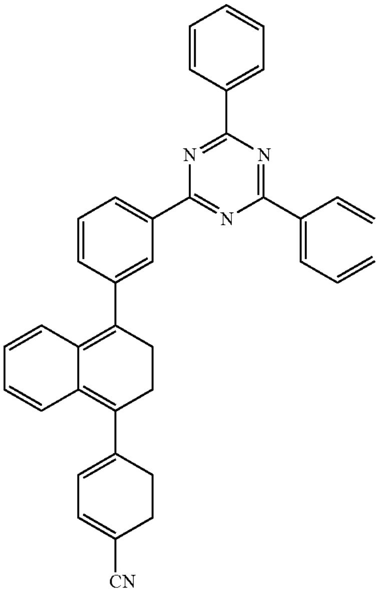
D-48
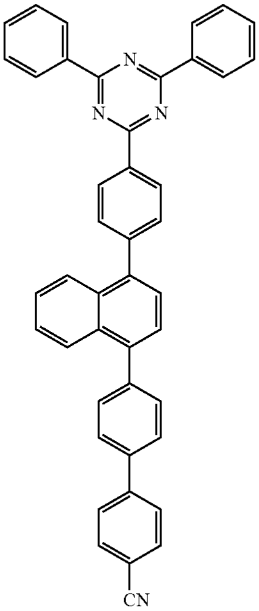

-continued
D-49
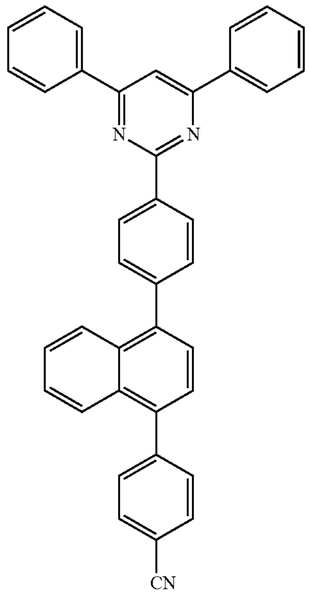
D-50
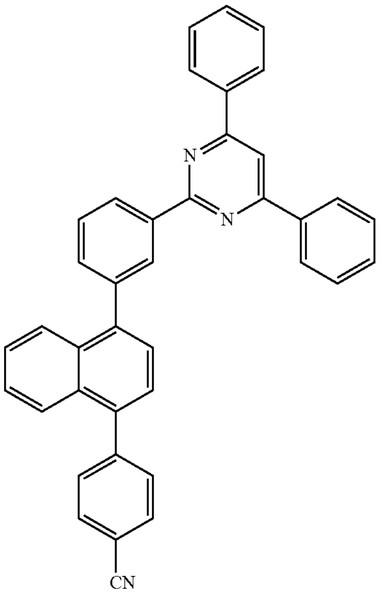
-continued
D-51
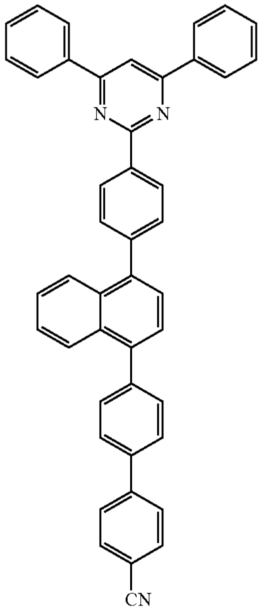
D-52
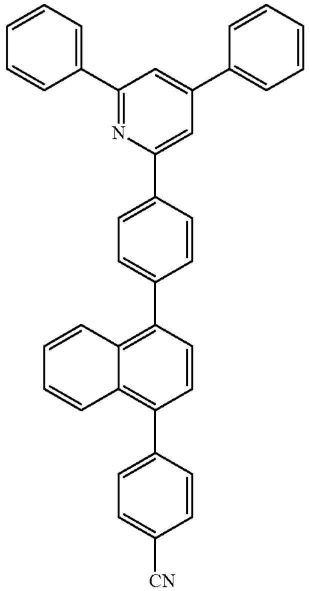

D-53
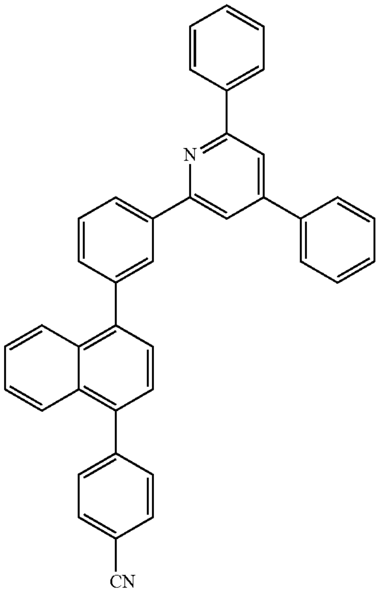
D-54
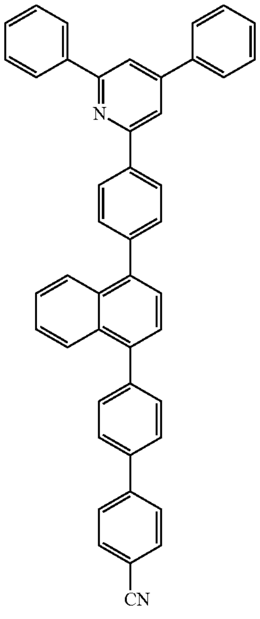
D-55
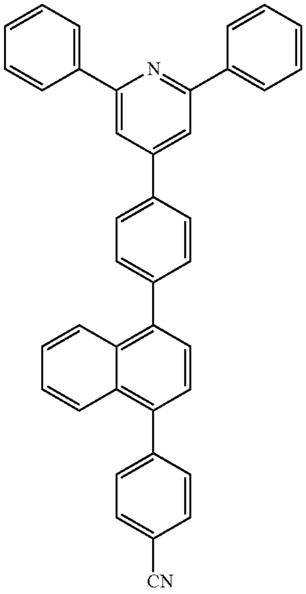
D-56
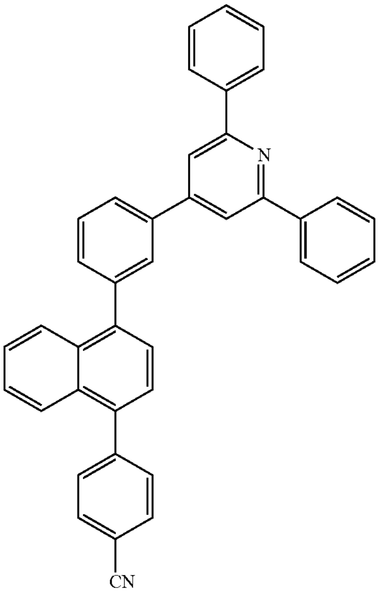

-continued
D-57
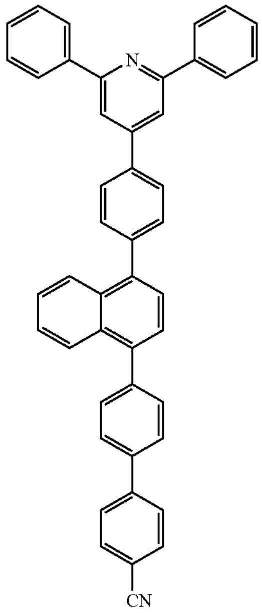
-continued
D-59
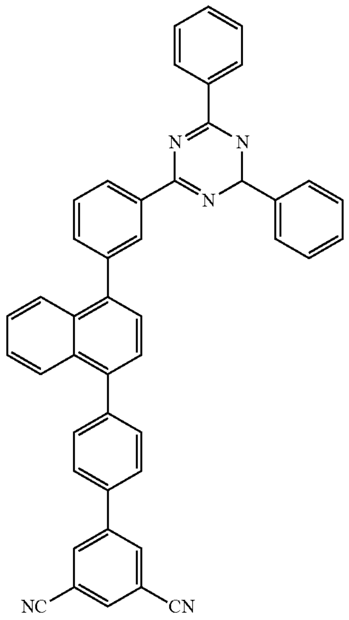
D-58
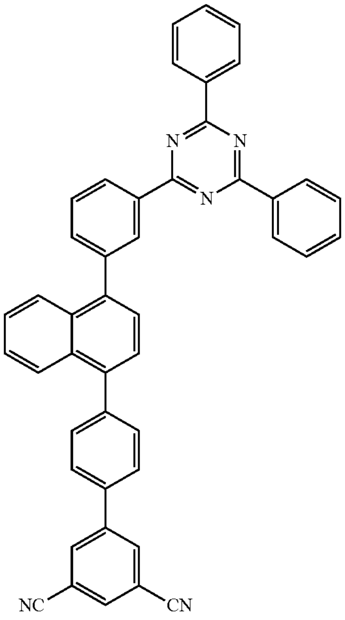
D-60
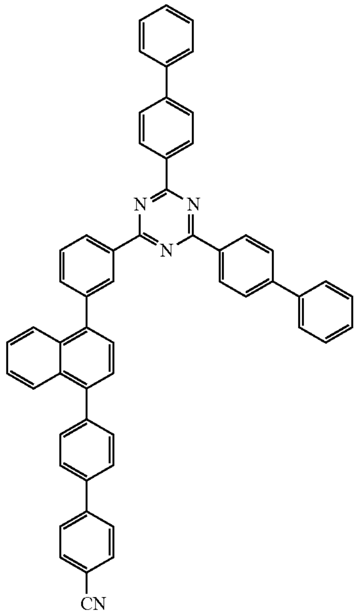

-continued
D-61
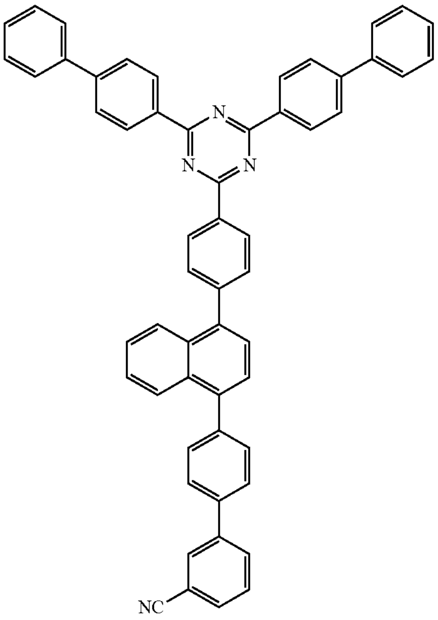
-continued
D-63
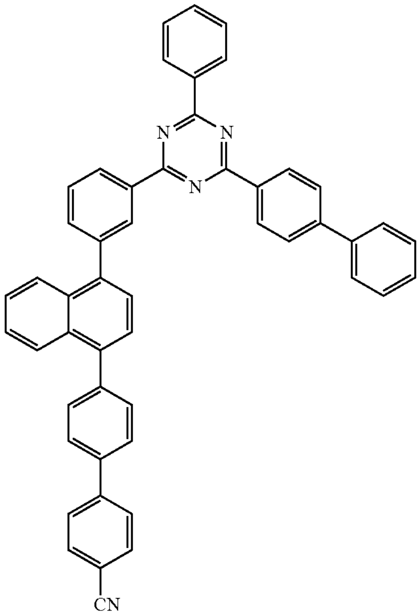
D-62
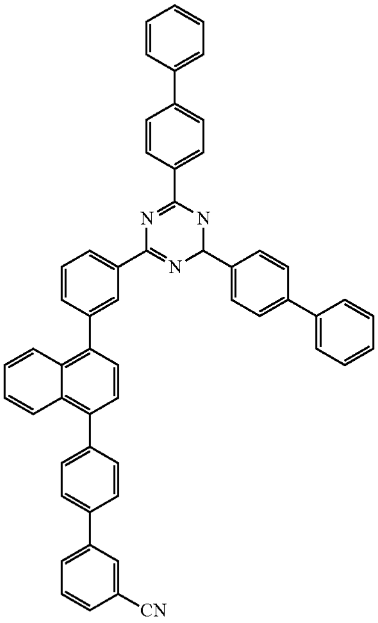
D-64
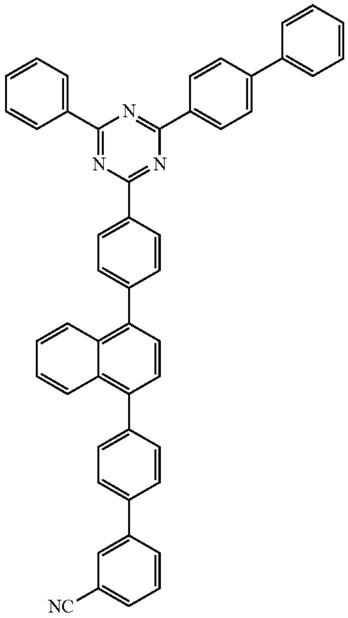

-continued
D-65
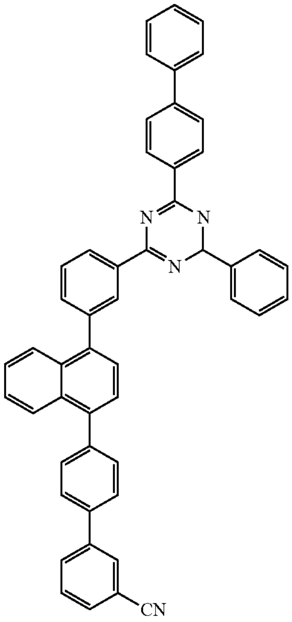
D66
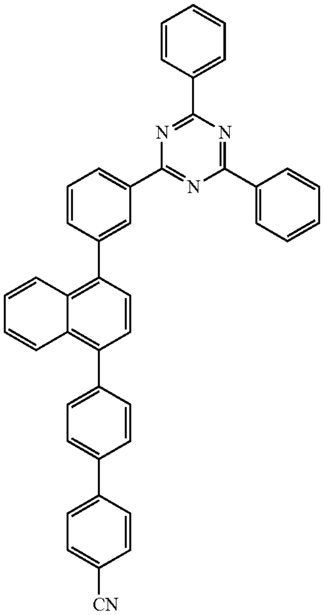
-continued
D-67
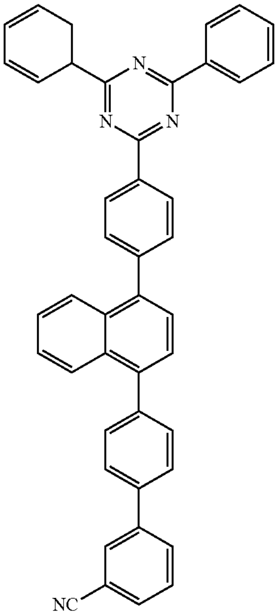
D-68
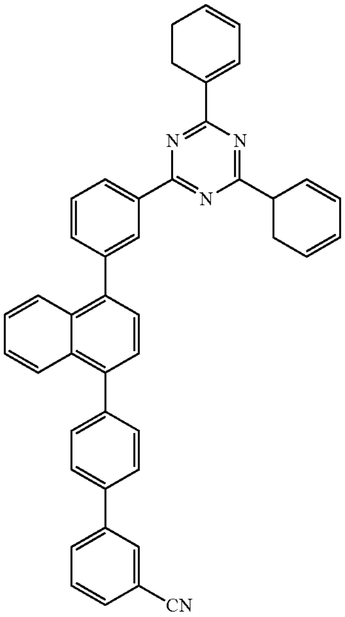

-continued
D-69
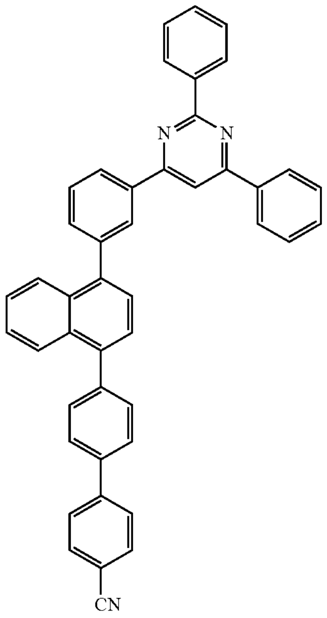
D-70
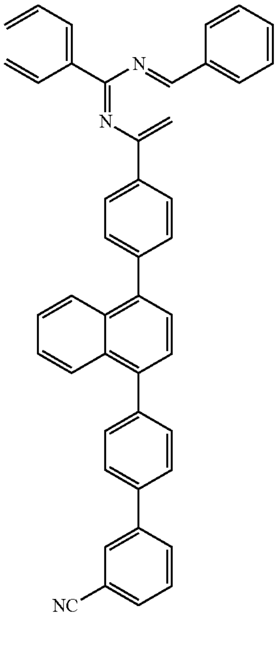
-continued
D-71
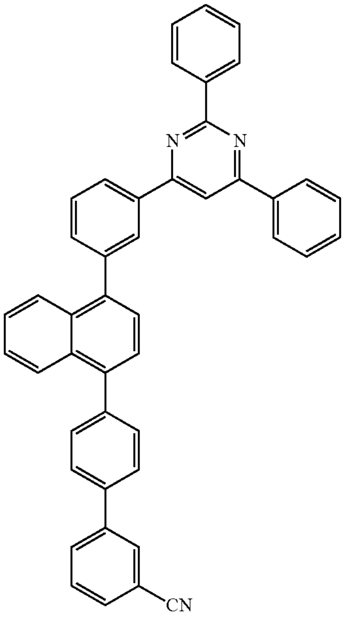
D-72
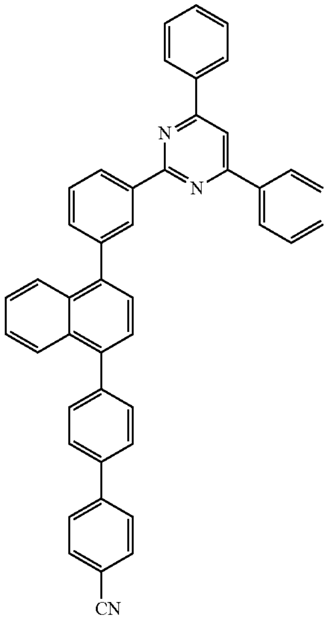

-continued
D-73
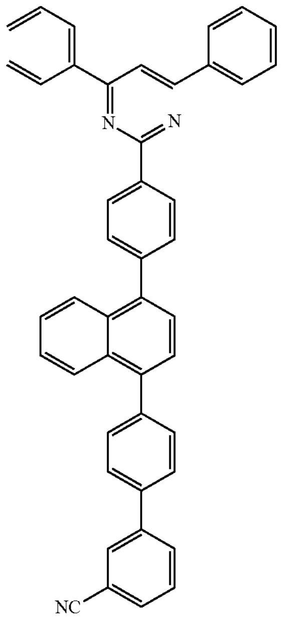
D-74
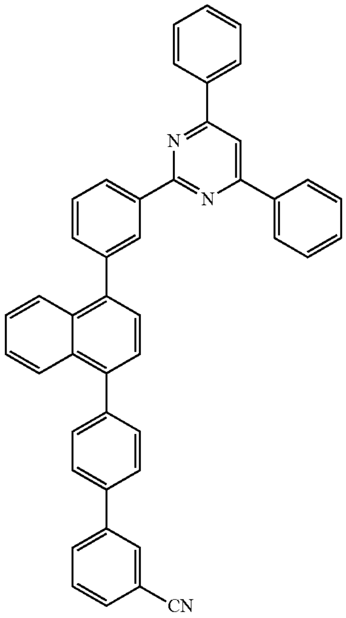
-continued
D-75
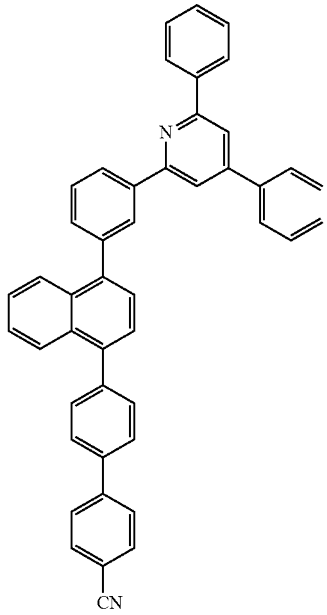
D-76
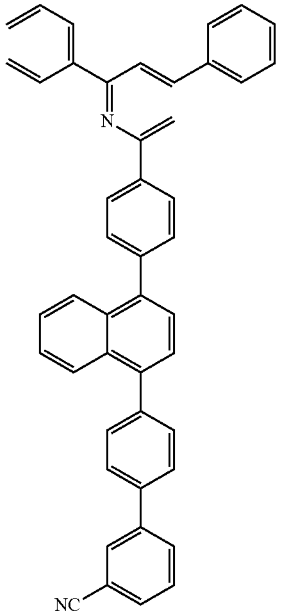

-continued
D-77
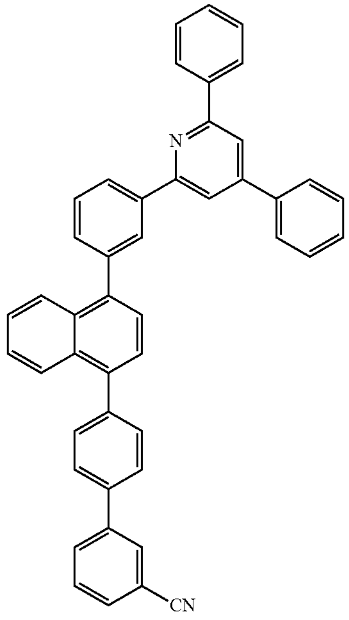
-continued
D-79
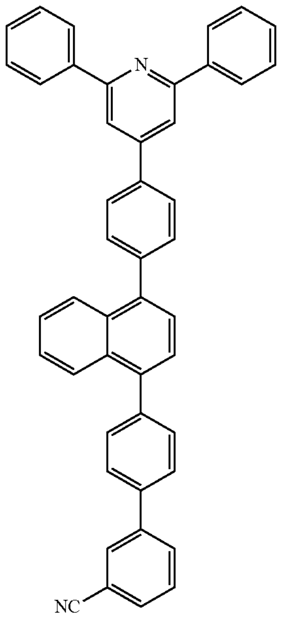
D-78
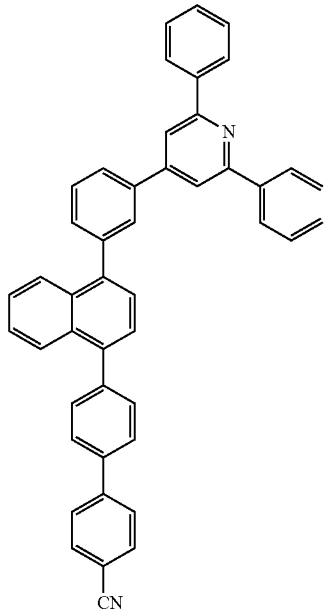
D-80
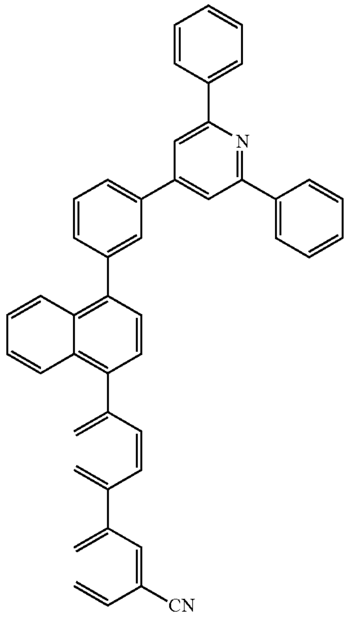

-continued
D-81
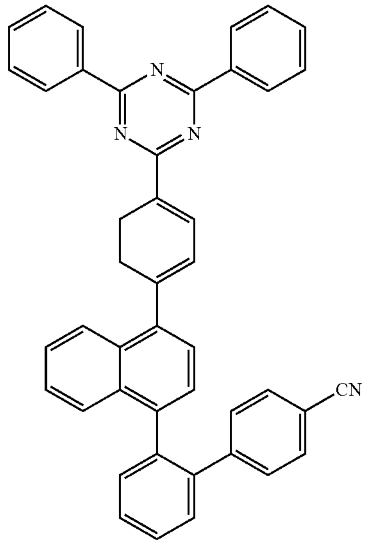
D-82
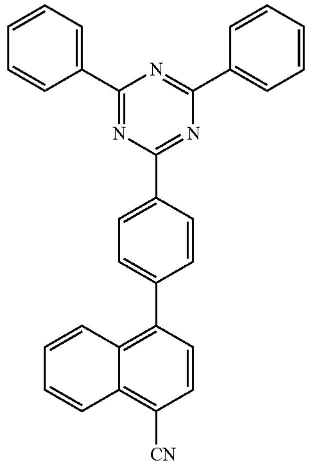
D-83
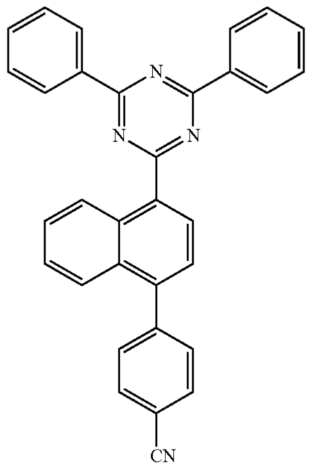
-continued
D-84
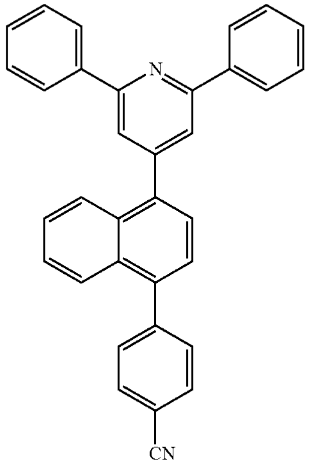
D-85
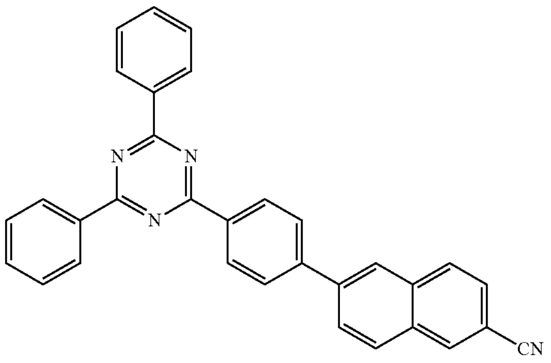
D-86
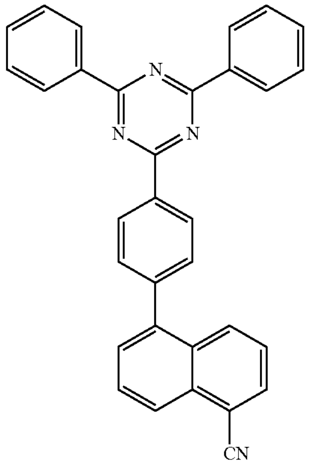

-continued

D-87

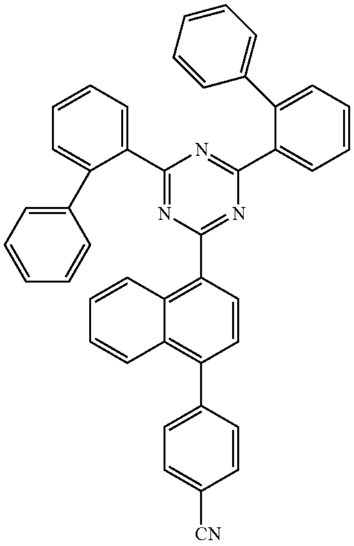

D-88

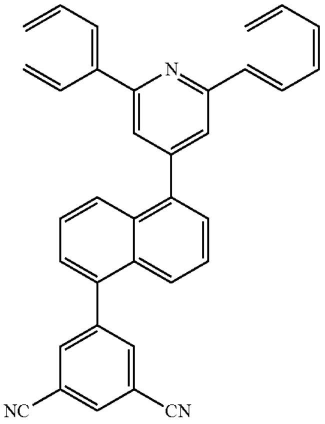

D-89

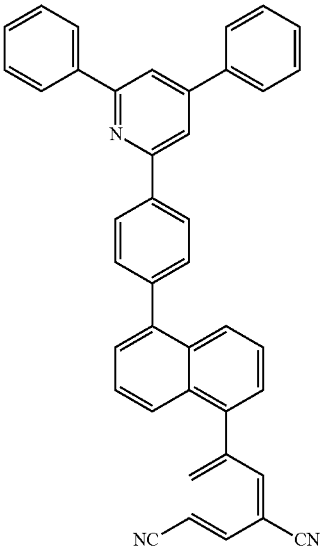

-continued

D-90

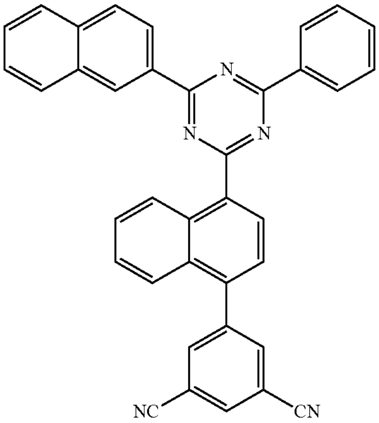

As can be seen from the above specific compounds, the compounds used for the light-emitting layer and the electron transport layer in the organic light-emitting device according to the present invention have intrinsic characteristics based on the specific skeleton structures thereof and the substituents introduced into the structures and thus can be used to obtain an organic light-emitting device with high efficacy and long lifespan.

The organic light-emitting device according to the present invention may have a structure including a first electrode, a second electrode and an organic layer disposed therebetween, and the organic layer of the organic light-emitting device according to the present invention may have a single layer structure or a multilayer structure in which two or more organic layers are stacked. For example, the organic layer may have a structure including a hole injection layer, a hole transport layer, a hole blocking layer, a light-emitting layer, an electron blocking layer, an electron transport layer, an electron injection layer, and the like. However, the structure of the organic layer is not limited thereto and may include a smaller or larger number of organic layers, and the preferred organic material layer structure of the organic light-emitting device according to the present invention will be described in more detail in Example which will be described later.

In addition, the organic light-emitting device according to the present invention includes a light-emitting layer interposed between the first electrode and the second electrode, and the light-emitting layer includes a host and a dopant. In this case, the content of the dopant in the light-emitting layer may be determined from about 0.01 to about 20 parts by weight based on about 100 parts by weight of the host, but is not limited thereto.

Hereinafter, an embodiment of the organic light-emitting device according to the present invention will be described in more detail.

The organic light-emitting device according to the present invention includes an anode, a hole transport layer, a light-emitting layer, an electron transport layer and a cathode, and if necessary, may further include a hole injection layer between the anode and the hole transport layer, may further include an electron injection layer between the electron transport layer and the cathode, may further include one or two intermediate layers, and may further include a hole blocking layer or an electron blocking layer. As described above, the organic light-emitting device may further include an organic layer having various functions depending on characteristics thereof.

Meanwhile, a detailed structure of an organic light-emitting device according to an embodiment of the present invention, a method for manufacturing the same, and the material for each organic layer will be described as follows.

First, a substrate is coated with a material for an anode to form the anode. The substrate used herein is a substrate generally used for organic light-emitting devices and is preferably an organic substrate or a transparent plastic substrate that has excellent transparency, surface evenness, handleability and waterproofness. In addition, a material for the anode is indium tin oxide (ITO), indium zinc oxide (IZO), tin oxide ($SnO_2$), zinc oxide (ZnO), or the like, which is transparent and has excellent conductivity.

A hole injection layer is formed on the anode by vacuum thermal evaporation or spin coating using a material for the hole injection layer, and then a hole transport layer is formed on the hole injection layer by vacuum thermal evaporation or spin coating using a material for the hole transport layer.

The material for the hole injection layer may be used without particular limitation as long as it is commonly used in the art and specific examples thereof include 2-TNATA [4,4',4"-tris(2-naphthylphenyl-phenylamino)-triphenylamine], NPD [N,N'-di(1-naphthyl)-N,N'-diphenylbenzidine)], TPD [N,N'-diphenyl-N,N'-bis(3-methylphenyl)-1,1'-biphenyl-4,4'-diamine], DNTPD [N,N'-diphenyl-N,N'-bis-[4-(phenyl-m-tolyl-amino)-phenyl]-biphenyl-4,4'-diamine], and the like.

In addition, the material for the hole transport layer is also used without particular limitation as long as it is commonly used in the art and is, for example, N,N'-bis(3-methylphenyl)-N,N'-diphenyl-[1,1-biphenyl]-4,4'-diamine (TPD) or N,N'-di(naphthalen-1-yl)-N,N'-diphenylbenzidine (α-NPD).

Subsequently, a hole auxiliary layer and a light-emitting layer are sequentially stacked on the hole transport layer, and a hole blocking layer is selectively deposited on the light-emitting layer by vacuum deposition or spin coating to form a thin film. Because the lifetime and efficiency of the device are reduced when holes are introduced into the cathode through the organic light-emitting layer, the hole blocking layer is formed using a material having a very low HOMO (highest occupied molecular orbital) level so as to prevent this problem. The hole blocking material used herein is not particularly limited and is typically BAlq, BCP or TPBI that has an electron transport ability and has an ionization potential higher than that of a light-emitting compound.

The material used for the hole blocking layer may be BAlq, BCP, Bphen, TPBI, NTAZ, $BeBq_2$, OXD-7, Liq, or the like, but is not limited thereto.

An electron transport layer is deposited on the hole blocking layer through vacuum deposition or spin coating and a metal for forming a cathode is formed on the electron injection layer through vacuum thermal evaporation to form a cathode. As a result, an organic light-emitting device according to an embodiment is completed.

Here, the metal for forming the cathode may be lithium (Li), magnesium (Mg), aluminum (Al), aluminum-lithium (Al—Li), calcium (Ca), magnesium-indium (Mg—In), magnesium-silver (Mg—Ag) or the like. A transmissive cathode using ITO or IZO may be used in order to obtain a top-emission type light-emitting device.

The material for the electron transport layer functions to stably transport electrons injected from the cathode and may be a well-known electron transport material. Examples of the well-known electron transport material include quinoline derivatives, especially, tris(8-quinolinolate)aluminum (Alq3), TAZ, BAlq, beryllium bis(benzoquinolin-10-olate: Bebq2) and oxadiazole derivatives (PBD, BMD, BND, etc.).

In addition, each of the organic layers may be formed by a monomolecular deposition or solution process. The deposition is a method of forming a thin film by evaporating a material for forming each layer through heating in the presence of a vacuum or low pressure and the solution process is a method of forming a thin film by mixing a material for forming each layer with a solvent and forming the thin film from the mixture through a method such as inkjet printing, roll-to-roll coating, screen printing, spray coating, dip coating, or spin coating.

In addition, the organic light-emitting device according to the present invention may further include a light-emitting layer of a blue light-emitting material, a green light-emitting material, or a red light-emitting material that emits light in a wavelength range of 380 nm to 800 nm. That is, the light-emitting layer of the present invention includes a plurality of light-emitting layers, and a blue light-emitting material, a green light-emitting material, or a red light-emitting material in the additionally formed light-emitting layer may be a fluorescent material or a phosphorescent material.

In addition, the organic light-emitting device is used for a display or lighting system selected from flat panel displays, flexible displays, monochromatic or white flat panel lighting systems, monochromatic or white flexible lighting systems, vehicle displays, and displays for virtual or augmented reality.

Hereinafter, the present invention will be described in more detail with reference to preferred examples. However, it will be obvious to those skilled in the art that these examples are merely provided for illustration of the present invention, and should not be construed as limiting the scope of the present invention.

Synthesis Example 1. Synthesis of A-90

Synthesis Example 1-1: Synthesis of Intermediate 1-a

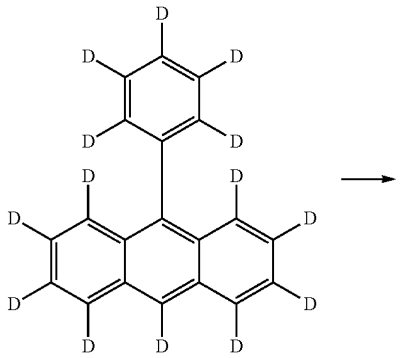

-continued

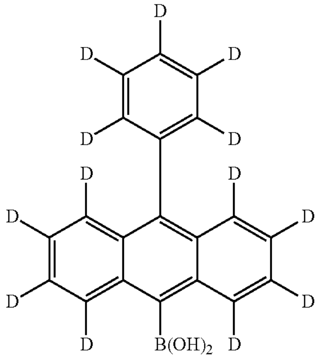

<Intermediate 1-a>

(Anthracene-d8)-9-bromo-10-(phenyl-d5) (50 g, 0.144 mol) was dissolved in 500 mL of tetrahydrofuran in a 500 mL reactor, the solution was cooled to −78° C. and n-butyllithium (100 ml, 0.158 mol) was added dropwise to the resulting solution. The resulting mixture was stirred for 5 hours and trimethyl borate (18 mL, 0.158 mol) was further added thereto, followed by stirring at room temperature overnight. After completion of the reaction, the resulting product was acidified with 2N hydrochloric acid and recrystallized to obtain <Intermediate 1-a>. (25 g, 55%)

Synthesis Example 1-2: Synthesis of Intermediate 1-b

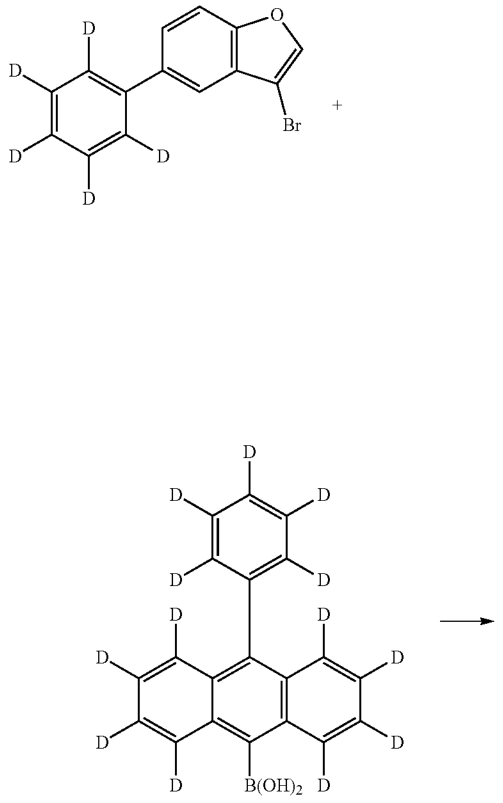

-continued

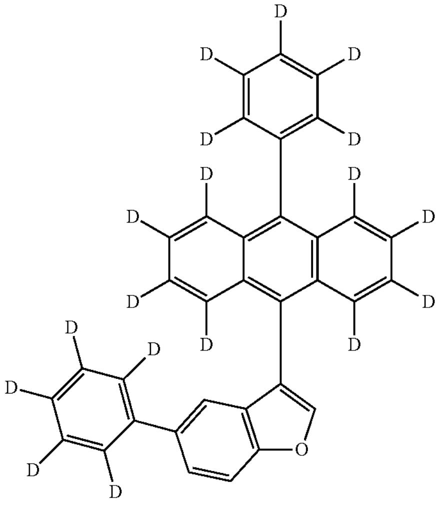

<Intermediate 1-b>

<Intermediate 1-a> (30 g, 0.096 mol), 3-bromo-5-(phenyl-d5)benzofuran (25.5 g, 0.916 mol), cesium carbonate (26.6 g, 0.193 mol), tetrakis(triphenylphosphine)palladium (0) (2.23 g, 0.002 mol), 210 mL of toluene, and 90 mL of ethanol were added to a 1 L reactor, followed by reflux at 110° C. overnight. The reaction product was cooled to room temperature and then was extracted with ethyl acetate/distilled water, and the organic layer was concentrated and then was separated by column chromatography to obtain <Intermediate 1-b>. (24.5 g, 55%)

Synthesis Example 1-3: Synthesis of Intermediate 1-c

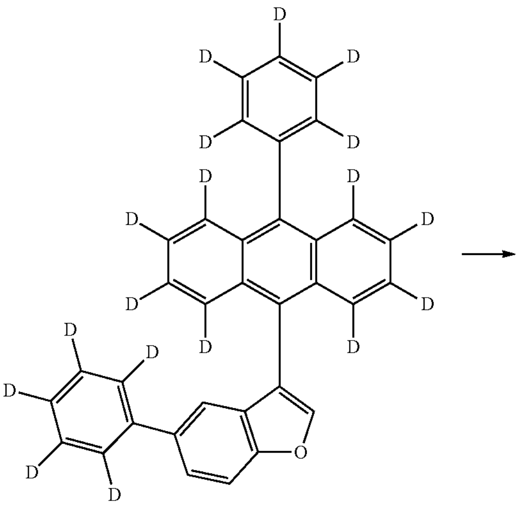

-continued

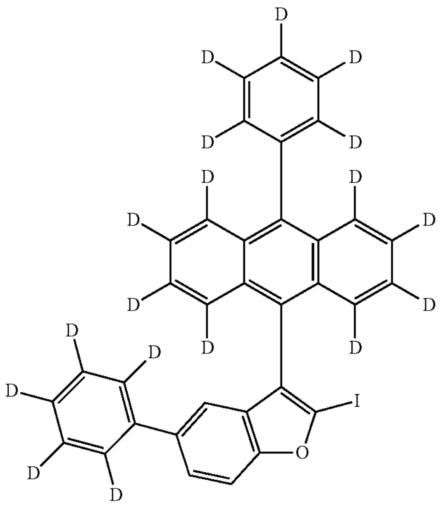

<Intermediate 1-c>

<Intermediate 1-b> (20 g, 0.043 mol) was dissolved in 250 mL of THF in a 500 mL reactor, followed by cooling to −50° C. and addition of n-butyllithium (1.6M) thereto. One hour later, iodine was slowly added to the resulting solution, followed by allowing to warm at room temperature. An aqueous sodium thiosulfate solution was further added thereto at room temperature, followed by layer separation. The organic layer was concentrated under reduced pressure and then was separated by column chromatography to obtain <Intermediate 1-c>. (17 g, 67%)

Synthesis Example 1-4: Synthesis of A-90

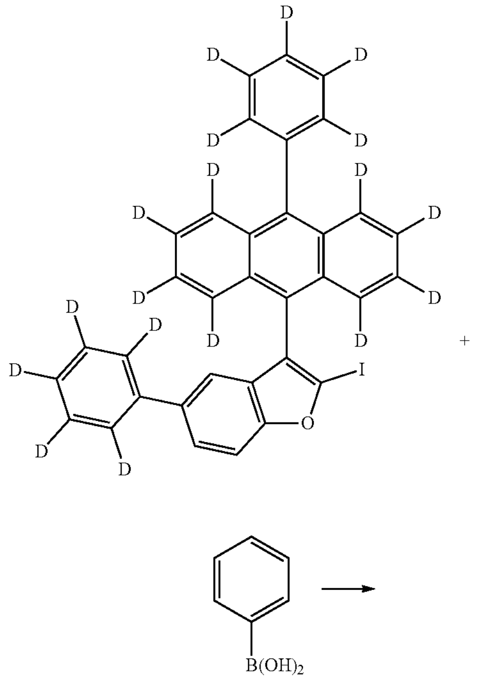

-continued

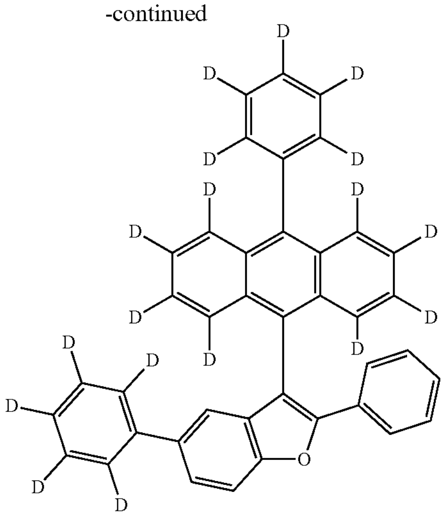

[A-90]

[A-90] was obtained in the same manner as in Synthesis Example 1-2 above, except that phenylboronic acid was used instead of <Intermediate 1-a> and <Intermediate 1-c> was used instead of 3-bromo-5-(phenyl-d5)benzofuran. (yield 47%)

MS (MALDI-TOF): m/z 540.31 [$M^+$]

Synthesis Example 2. Synthesis of A-137

Synthesis Example 2-1: Synthesis of Intermediate 2-a

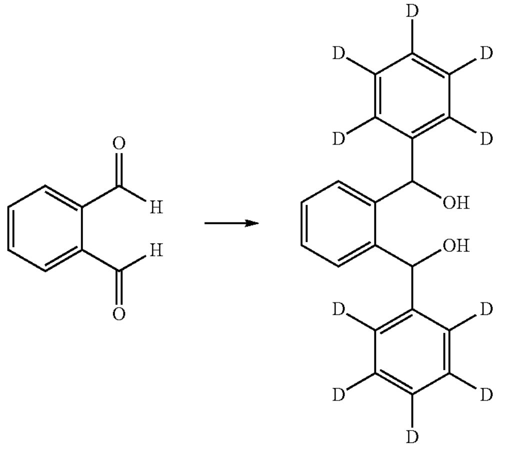

<Intermediate 2-a>

Bromobenzene(d5) (60.4 g, 0.373 mol) and 480 mL of tetrahydrofuran were added to a 2 L reactor, followed by cooling to −78° C. and stirring. N-butyllithium (223.6 mL, 0.357 mol) was added dropwise to the cooled reaction solution, followed by stirring at the same temperature for 1 hour. 0-phthalaldehyde (20 g, 0.149 mol) was dissolved in 100 mL of tetrahydrofuran, and the solution was added dropwise to the reaction solution, followed by stirring at room temperature. After completion of the reaction, 200 mL of an aqueous ammonium chloride solution was added thereto to terminate the reaction. The reaction solution was extracted with ethyl acetate, concentrated under reduced pressure and then separated by column chromatography to obtain <Intermediate 2-a>. (40 g, 89%)

Synthesis Example 2-2: Synthesis of Intermediate 2-b

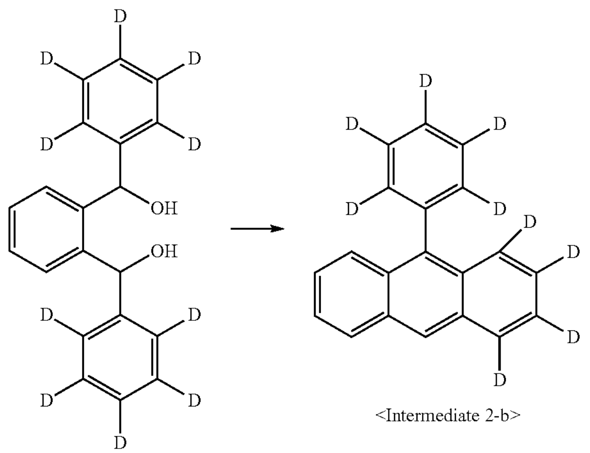 [SMILES: [2H]c1c([2H])c([2H])c(C(O)c2ccccc2C(O)c2c([2H])c([2H])c([2H])c([2H])c2[2H])c([2H])c1[2H] ; [2H]c1c([2H])c([2H])c(-c2c3ccccc3cc3c([2H])c([2H])c([2H])c([2H])c23)c([2H])c1[2H]]

<Intermediate 2-b>

<Intermediate 2-a> (40 g, 0.133 mol) was dissolved in 200 mL of acetic acid in a 500 mL reactor, followed by stirring. 2 mL of hydrogen bromide was added to the reaction solution, followed by stirring at 80° C. for 2 hours. After completion of the reaction, the reaction product was cooled to room temperature and the reaction solution was slowly poured into a beaker containing 500 mL of distilled water, followed by stirring. The resulting solid was filtered and washed with distilled water. The solid was separated by column chromatography to obtain <Intermediate 2-b> (13 g, 37%).

Synthesis Example 2-3: Synthesis of Intermediate 2-c

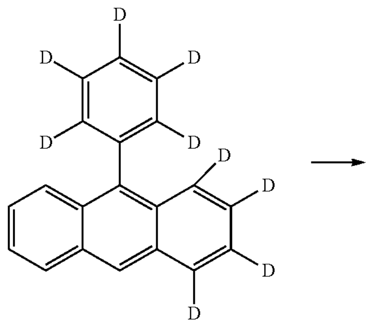

-continued

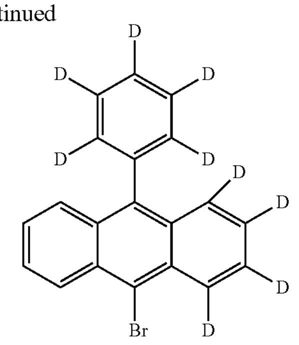

<Intermediate 2-c>

<Intermediate 2-b> (13 g, 0.049 mol) was dissolved in 130 mL of N,N-dimethylamide in a 500 mL reactor, followed by stirring at room temperature. N-bromosuccinimide (10.5 g, 0.059 mol) was dissolved in 40 mL of N,N-dimethylamide and the resulting solution was added dropwise to the reaction solution. Completion of the reaction was determined by thin film chromatography. The reaction solution was slowly poured into a beaker containing 500 mL of distilled water, followed by stirring. The resulting solid was filtered and washed with distilled water. The result was separated by column chromatography to obtain <Intermediate 2-c>. (14 g, 83%)

Synthesis Example 2-4: Synthesis of Intermediate 2-d

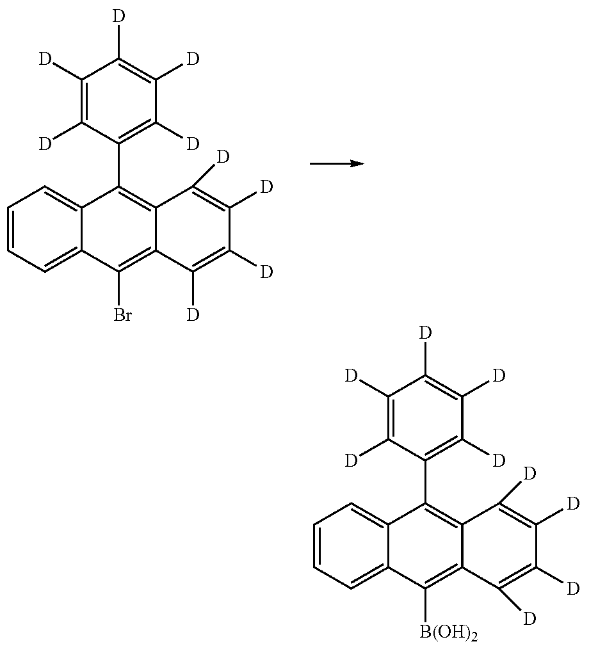

<Intermediate 2-d>

<Intermediate 2-c> (50 g, 0.146 mol) was dissolved in 500 mL of tetrahydrofuran in a 500 mL reactor, the resulting solution was cooled to −78° C., and n-butyllithium (100 ml, 0.161 mol) was added dropwise to the resulting solution. The resulting mixture was stirred for 5 hours and trimethyl borate (18 mL, 0.161 mol) was added thereto, followed by stirring at room temperature overnight. After completion of the reaction, the reaction product was acidified with 2N hydrochloric acid and then recrystallized to obtain <Intermediate 2-d> (25 g, 56%).

Synthesis Example 2-5: Synthesis of A-137

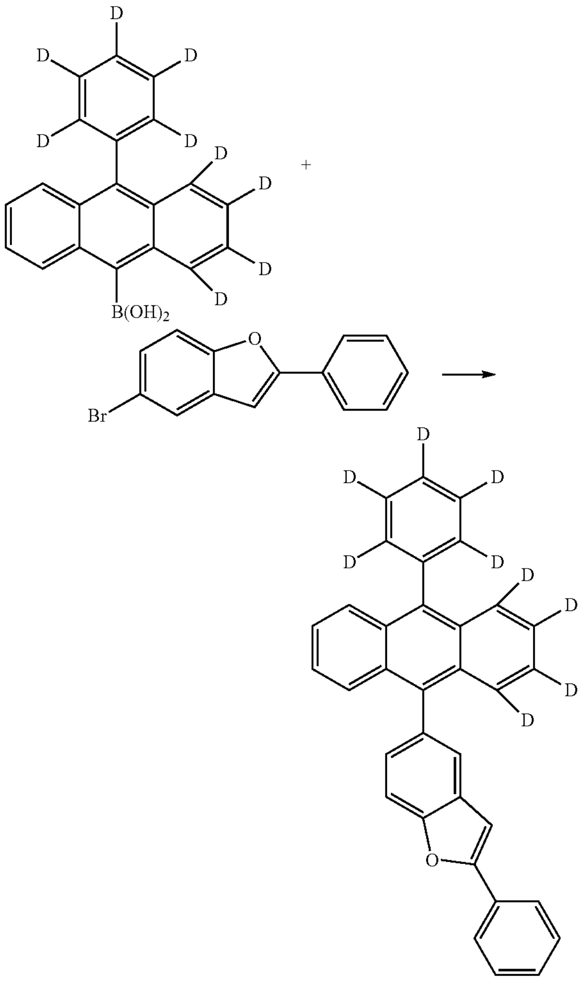

[A-137]

[A-137] was obtained in the same manner as in Synthesis Example 1-2, except that <Intermediate 2-d> was used instead of <Intermediate 1-a> and 5-bromo-2-phenylbenzofuran was used instead of 3-bromo-5-(phenyl-d5)-benzofuran. (yield 53%)

MS (MALDI-TOF): m/z 455.22 $[M^+]$

Examples 1 to 12: Fabrication of Organic Light-Emitting Device

ITO glass was patterned such that a light-emitting area of the ITO glass was adjusted to 2 mm×2 mm and was then washed. The ITO glass was mounted in a vacuum chamber, a base pressure was set to $1\times10^{-7}$ torr, and 2-TNATA (700 Å) and α-NPD (300 Å) were sequentially deposited on ITO. Then, a mixture of the host compound according to the present invention and BD-1 (3 wt %) was deposited thereon to form a 300 Å thick light-emitting layer. Then, the compound according to the present invention was deposited thereon to form a 300 Å thick electron transport layer, [Formula E-1] was deposited thereon to form a 10 Å thick electron injection layer, and Ag was deposited thereon to a thickness of 1,000 Å, thereby completing fabrication of an organic light-emitting device. The luminescent properties of the organic light-emitting device were measured at 10 $mA/cm^2$.

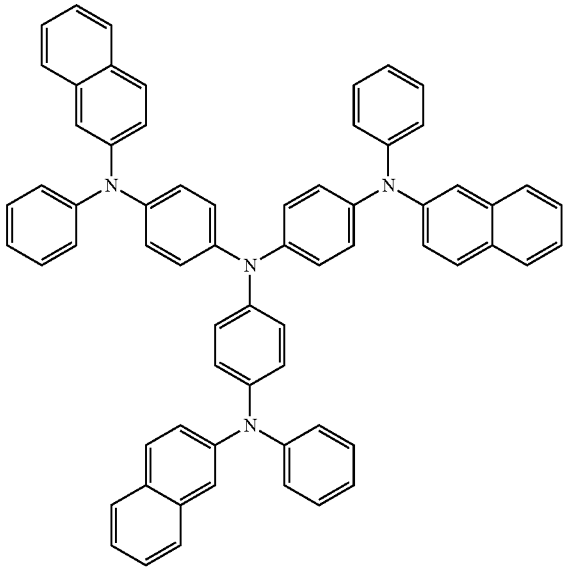

[2-TNATA]

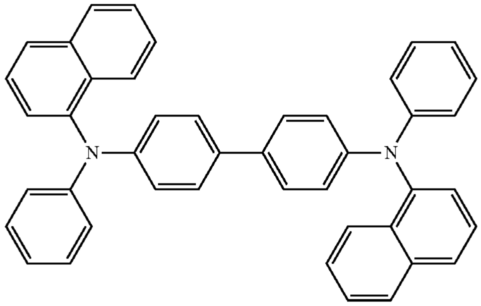

[α-NPD)

[Formula E-1]

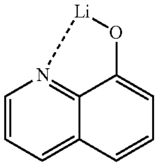

[BD-1]

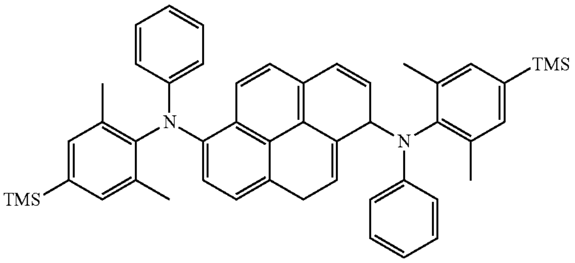

Comparative Examples 1 to 14

An organic light-emitting device was fabricated in the same manner as in Example above, except that [BH-1] and [BH-2] were used instead of the host compound according to the present invention used in Example above, and [ET-1] and [ET-2] were used instead of the compound for the electron transport layer, and the luminescent properties of the organic light-emitting device were measured at 10 $mA/cm^2$. The structures of [BH-1], [BH-2], [ET-1] and [ET-2] are as follows:

[BH-1]

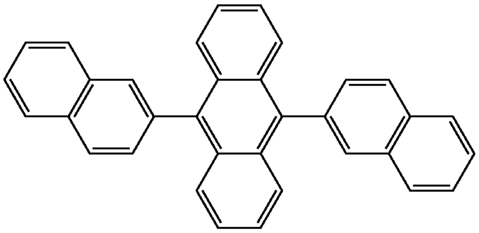

[BH-2]

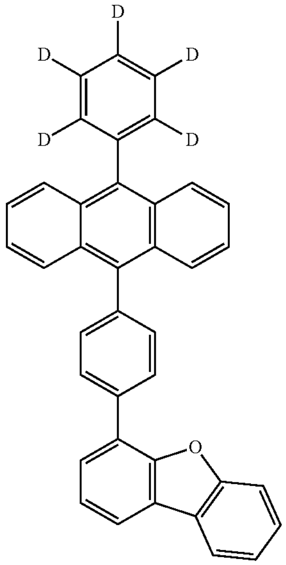

[ET-1]

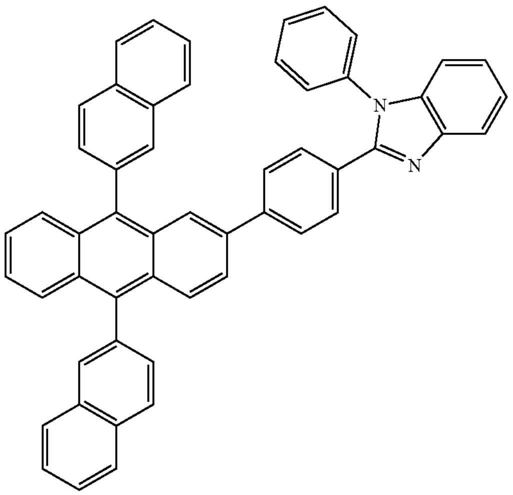

-continued

[ET-2]

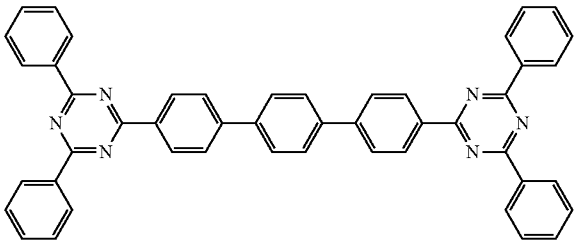

TABLE 1

| Item | Host | Electron transport layer | Current density ($mA/cm^2$) | Efficiency (cd/A) | Lifespan (T97, hr) |
|---|---|---|---|---|---|
| Example 1 | A-90 | B-42 | 10 | 7.8 | 122 |
| Example 2 | A-90 | B-201 | 10 | 8.0 | 125 |
| Example 3 | A-90 | C-1 | 10 | 8.1 | 112 |
| Example 4 | A-90 | C-38 | 10 | 8.4 | 118 |
| Example 5 | A-90 | D-3 | 10 | 7.4 | 144 |
| Example 6 | A-90 | D-49 | 10 | 7.2 | 142 |
| Example 7 | A-137 | B-42 | 10 | 7.5 | 118 |
| Example 8 | A-137 | B-201 | 10 | 7.3 | 120 |
| Example 9 | A-137 | C-1 | 10 | 7.7 | 108 |
| Example 10 | A-137 | C-38 | 10 | 8.0 | 114 |
| Example 11 | A-137 | D-3 | 10 | 7.1 | 139 |
| Example 12 | A-137 | D-49 | 10 | 7.0 | 135 |
| Comparative Example 1 | BH-1 | B-42 | 10 | 5.3 | 61 |
| Comparative Example 2 | BH-1 | C-38 | 10 | 5.5 | 58 |
| Comparative Example 3 | BH-1 | D-3 | 10 | 5.1 | 67 |
| Comparative Example 4 | BH-1 | ET-1 | 10 | 4.7 | 35 |
| Comparative Example 5 | BH-1 | ET-2 | 10 | 4.5 | 32 |
| Comparative Example 6 | BH-2 | B-42 | 10 | 5.8 | 67 |
| Comparative Example 7 | BH-2 | C-38 | 10 | 5.9 | 62 |
| Comparative Example 8 | BH-2 | D-3 | 10 | 5.5 | 72 |
| Comparative Example 9 | BH-2 | ET-1 | 10 | 4.9 | 47 |
| Comparative Example 10 | BH-2 | ET-2 | 10 | 4.8 | 42 |
| Comparative Example 11 | A-90 | ET-1 | 10 | 6.5 | 83 |
| Comparative Example 12 | A-90 | ET-2 | 10 | 6.4 | 80 |
| Comparative Example 13 | A-137 | ET-1 | 10 | 6.2 | 67 |
| Comparative Example 14 | A-137 | ET-2 | 10 | 6.0 | 64 |

As can be seen from [Table 1] above, the organic light-emitting device that contains the compound according to [Formula A] of the present invention as a host compound for the light-emitting layer in the organic light-emitting device, and the compound according to [Formula B] to [Formula D] of the present invention as a material for an electron transport layer provided in the organic light-emitting device can exhibit remarkably improved efficiency and prolonged lifespan, compared to an organic light-emitting device containing the compounds ([BH-1], [BH-2], [ET-1] and [ET-2]) structurally different from the specific structure of the compound according to the present invention.

According to the present invention, a high-efficiency and long-lifespan organic light-emitting device can be realized using an anthracene derivative compound having a characteristic structure as a host for a light-emitting layer, and using a compound having a characteristic structure and moiety as an electron transport material and is thus useful for lighting systems as well as various displays such as flat panel displays, flexible displays and wearable displays.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An organic light-emitting device comprising:

a first electrode;

a second electrode facing the first electrode;

a light-emitting layer interposed between the first electrode and the second electrode; and an organic layer interposed between the second electrode and the light-emitting layer, wherein the light-emitting layer comprises at least one selected from compounds represented by the following [Formula A] and the organic layer comprises at least one selected from compounds represented by the following [Formula B] to [Formula D], the organic layer comprises an electron injection layer, an electron transport layer, or a layer capable of injecting and transporting electrons,

[Formula A]

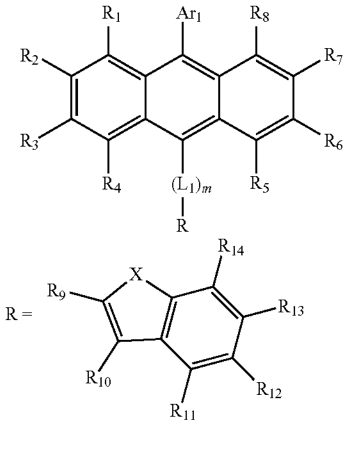

wherein $L_1$ is a divalent linker and is a single bond or is selected from a substituted or unsubstituted C6-C50 arylene group, a substituted or unsubstituted C2-C50 heteroarylene group, and a substituted or unsubstituted C3-C50 mixed aliphatic-aromatic ring group, m is an integer from 1 to 3, provided that when m is 2 or more, a plurality of $L_1$ are identical to or different from each other, X is an oxygen atom (O) or a sulfur atom(S), $Ar_1$ is selected from a substituted or unsubstituted C6-C50 aryl group, a substituted or unsubstituted C2-C50 heteroaryl group, and a substituted or unsubstituted C3-C50 mixed aliphatic-aromatic ring group, $R_1$ to $R_{14}$ are identical to or different from each other, and are each independently hydrogen, deuterium, a substituted or unsubstituted C1-C30 alkyl group, a substituted or unsubstituted C6-C50 aryl group, a substituted or unsubstituted C2-C30 alkenyl group, a substituted or unsubstituted C2-C30 alkynyl group, a substituted or unsubstituted C3-C30 cycloalkyl group, a substituted or unsubstituted C3-C30 cycloalkenyl group, a substituted or unsubstituted C2-C50 heteroaryl group, a substituted or unsubstituted C2-C30 heterocycloalkyl group, a substituted or unsubstituted C1-C30 alkoxy group, a substituted or unsubstituted C6-C50 aryloxy group, a substituted or unsubstituted C1-C30 alkylthioxy group, a substituted or unsubstituted C6-C50 arylthioxy group, a substituted or unsubstituted amine group, a substituted or unsubstituted silyl group, a substituted or unsubstituted C3-C50 mixed aliphatic-aromatic ring group, a cyano group, a nitro group and a halogen group, with the proviso that any one of Re to $R_{14}$ is bonded to the linker $L_1$,

[Formula B]

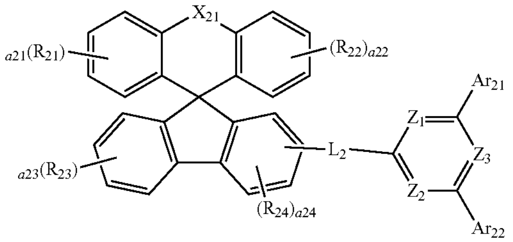

wherein $X_{21}$ is a single bond, or O or S, $R_{21}$ to $R_{24}$ are identical to or different from each other, and are each independently selected from hydrogen, deuterium, a substituted or unsubstituted C1-C30 alkyl group, a substituted or unsubstituted C6-C50 aryl group, a substituted or unsubstituted C2-C30 alkenyl group, a substituted or unsubstituted C2-C30 alkynyl group, a substituted or unsubstituted C3-C30 cycloalkyl group, a substituted or unsubstituted C3-C30 cycloalkenyl group, a substituted or unsubstituted C2-C50 heteroaryl group, a substituted or unsubstituted C2-C30 heterocycloalkyl group, a substituted or unsubstituted C1-C30 alkoxy group, a substituted or unsubstituted C6-C50 aryloxy group, a substituted or unsubstituted C1-C30 alkylthioxy group, a substituted or unsubstituted C6-C50 arylthioxy group, a substituted or unsubstituted amine group, a substituted or unsubstituted silyl group, a substituted or unsubstituted C3-C50 mixed aliphatic-aromatic ring group, a cyano group, a nitro group, and a halogen group, with the proviso that one or more of $R_{21}$ to $R_{24}$ are bonded to each other to further form a substituted or unsubstituted alicyclic or aromatic monocyclic or polycyclic ring, at least one carbon atom of which is substituted with at least one heteroatom selected from nitrogen, oxygen, and sulfur, $L_2$ is a single bond, a substituted or unsubstituted C6-C50 arylene group, or a substituted or unsubstituted C2-C50 heteroarylene group, $Z_1$ to $Z_3$ are each independently N or CR, with the proviso that at least one of $Z_1$ to $Z_3$ is N, wherein R's are identical to or different from each other, and are each independently hydrogen, a substituted or unsubstituted C1-C30 alkyl group, or a substituted or unsubstituted C2-C30 alkenyl group, or each R is bonded to $Ar_{21}$ or $Ar_{22}$ to form a substituted or unsubstituted aromatic hydrocarbon or a substituted or unsubstituted aromatic heterocycle, $Ar_{21}$ and $Ar_{22}$ are identical to or different from each other, and are each independently hydrogen, a substituted or unsubstituted C1-C30 alkyl group, a substituted or unsubstituted C2-C30 alkenyl group, a substituted or unsubstituted C2-C30 alkynyl group, a substituted or unsubstituted C6-C50 aryl group, a substituted or unsubstituted C2-C50 heteroaryl group, or are bonded to R to form a substituted or unsubstituted aromatic hydrocarbon or a substituted or unsubstituted aromatic heterocycle, $a_{21}$ to $a_{23}$ are integers from 0 to 4, provided that when $a_{21}$ to $a_{23}$ are 2 or more, a plurality of $R_{21}$ to $R_{23}$ are identical to or different from each other, and $a_{24}$ is an integer from 0 to 3, provided that when $a_{24}$ is 2 or more, a plurality of $R_{24}$ are identical to or different from each other,

[Formula C]

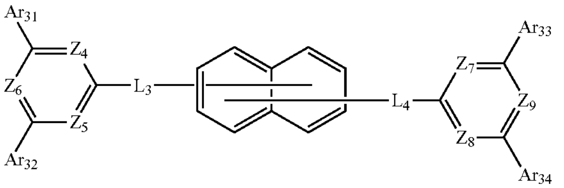

wherein at least one of $Z_4$ to $Z_6$ is N and the remainder is CH, and at least one of $Z_7$ to $Z_9$ is N and the remainder is CH, $L_3$ and $L_4$ are identical to or different from each other, and are each independently a single bond, a substituted or unsubstituted C6-C30 arylene group, or a substituted or unsubstituted C2-C30 heteroarylene group, and $Ar_{31}$ to $Ar_{34}$ are identical to or different from each other, and are each independently a substituted or unsubstituted C6-C30 aryl group or a substituted or unsubstituted C2-C30 heteroaryl group,

[Formula D]

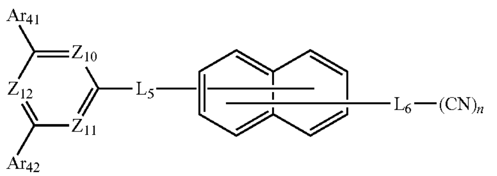

wherein at least one of $Z_{10}$ to $Z_{12}$ is N and the remainder is CH, $L_5$ and $L_6$ are identical to or different from each other, and are each independently a single bond, a substituted or unsubstituted C6-C30 arylene group, or a substituted or unsubstituted C2-C30 heteroarylene group, and $Ar_{41}$ and $Ar_{42}$ are identical to or different from each other, and are each independently a substituted or unsubstituted C6-C30 aryl group or a substituted or unsubstituted C2-C30 heteroaryl group, and n is 1 or 2, wherein at least one of $R_{11}$ to $R_{14}$ in R is a substituted or unsubstituted C3-C20 cycloalkyl group.

2. The organic light-emitting device according to claim 1, wherein the compound of [Formula A] is represented by any one selected from the following compounds [Formula A-1] to [Formula A-6]:

[Formula A-1]

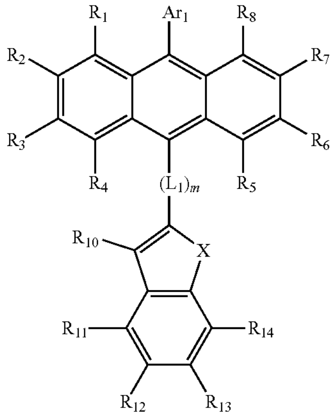

[Formula A-2]

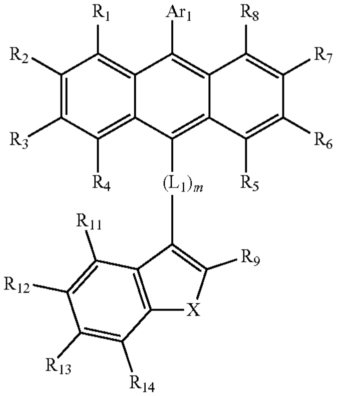

[Formula A-3]

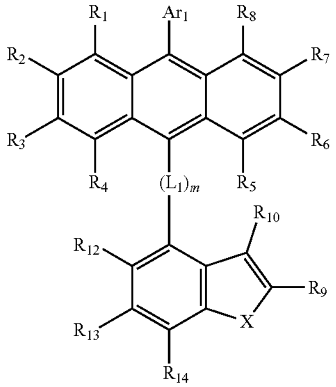

[Formula A-4]

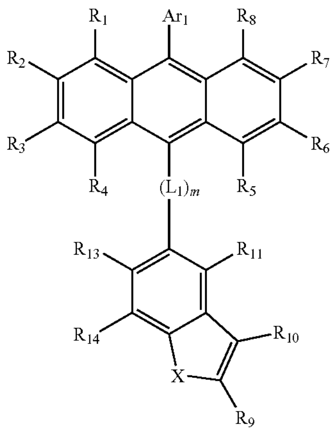

-continued

[Formula A-5]

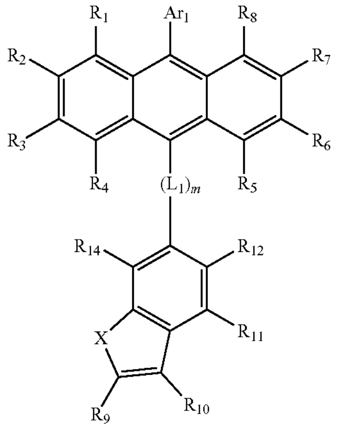

[Formula A-6]

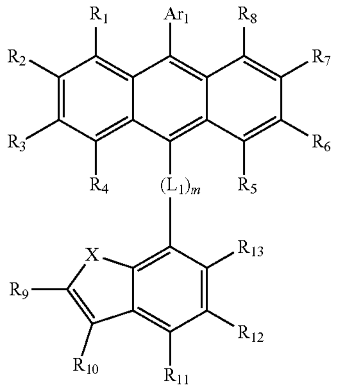

wherein $Ar_1$, $R_1$ to $R_{14}$, $L_1$, X and m are as defined in [Formula A] above.

3. The organic light-emitting device according to claim 2, wherein each of the compounds represented by [Formula A-1] to [Formula A-6] comprises at least one deuterium atom (D) as a substituent.

4. The organic light-emitting device according to claim 2, wherein each of the compounds represented by [Formula A-1] to [Formula A-6] has a degree of deuteration of 10% or more.

5. The organic light-emitting device according to claim 1, wherein the compound of [Formula B] is any one selected from the following compounds [B-1] to [B-196]:

B-1

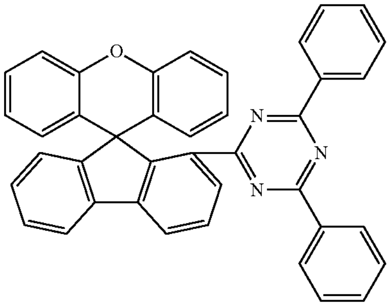

-continued

B-2

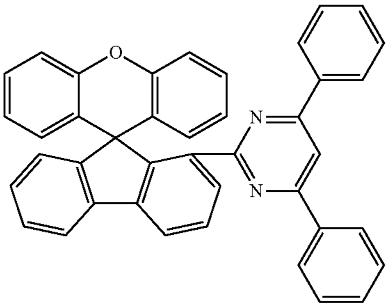

B-3

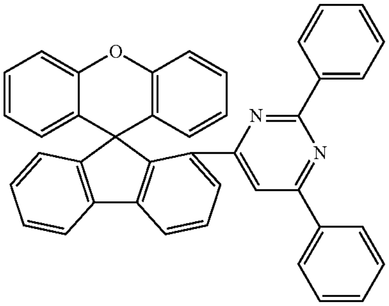

B-4

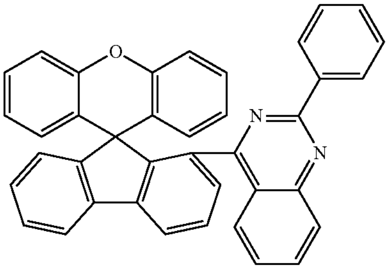

B-5

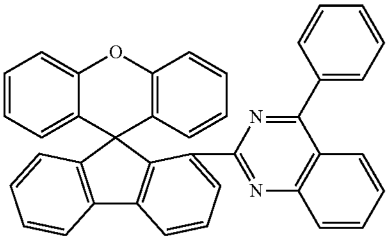

B-6

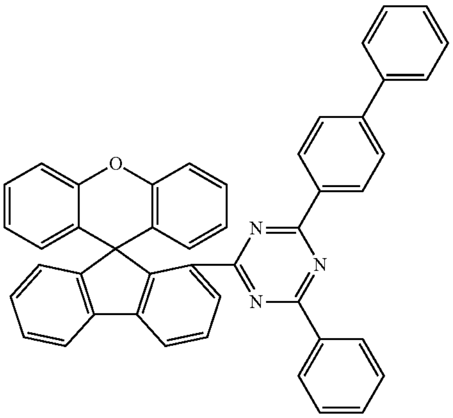

-continued
B-7
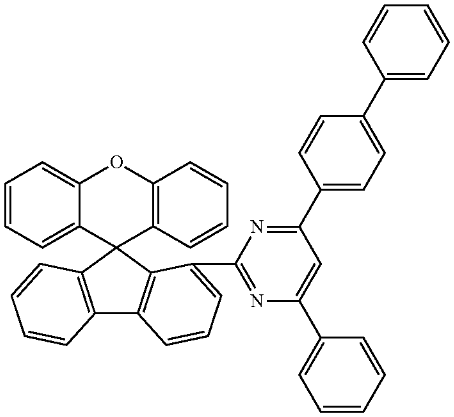
B-8
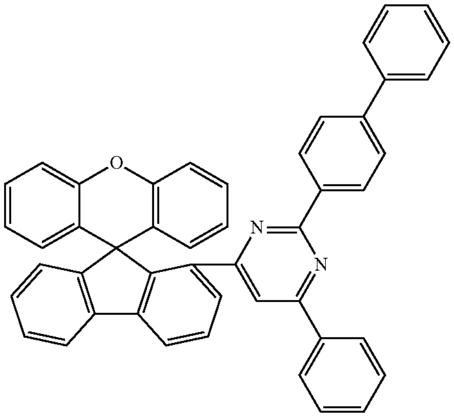
B-9
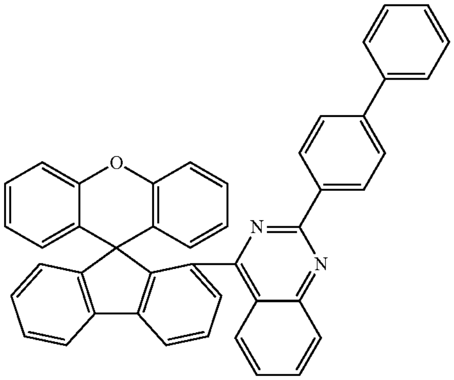
B-10
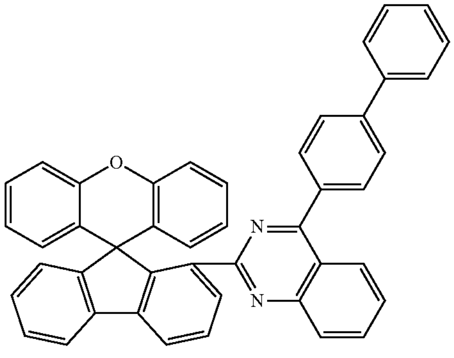
-continued
B-11
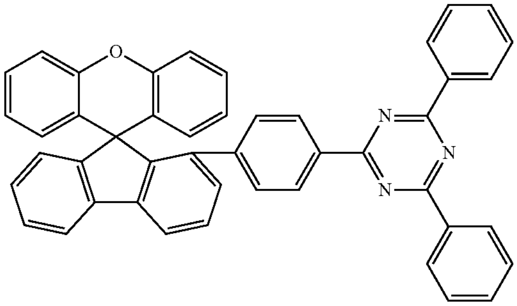
B-12
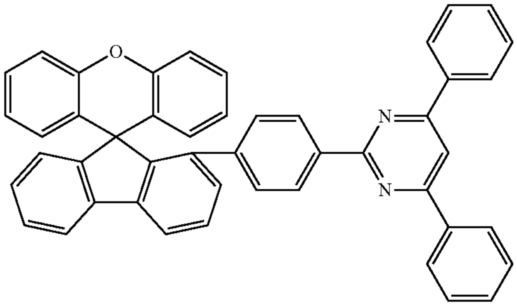
B-13
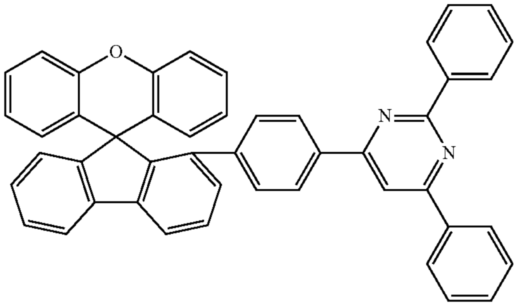
B-14
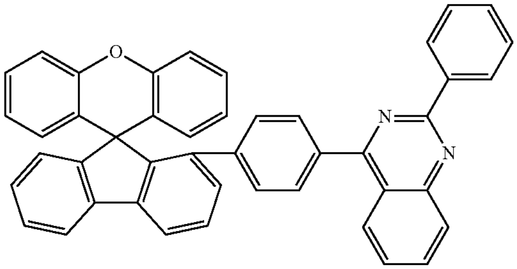
B-15
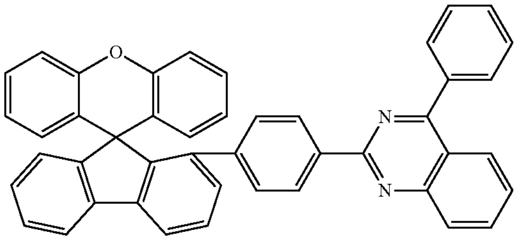

-continued
B-16
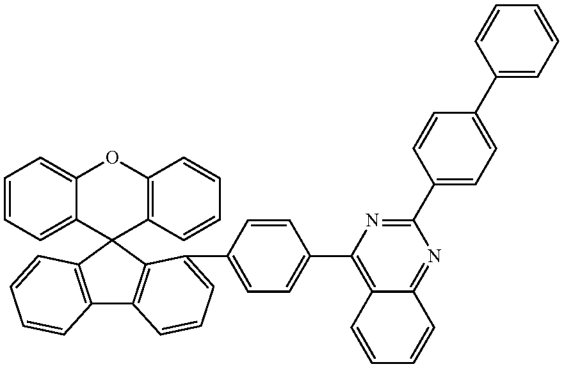
B-17
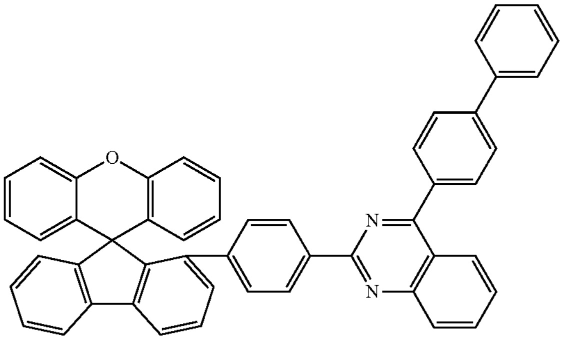
B-18
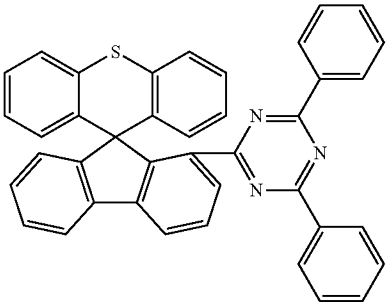
B-19
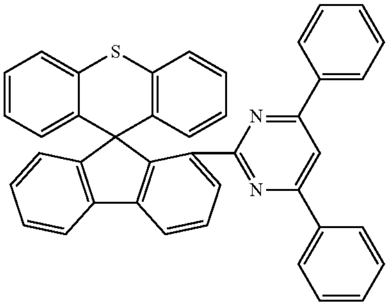
-continued
B-20
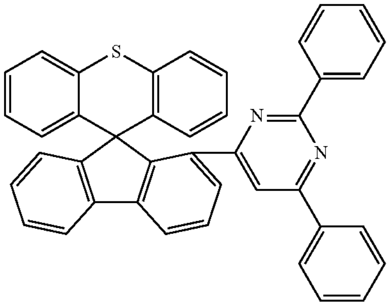
B-21
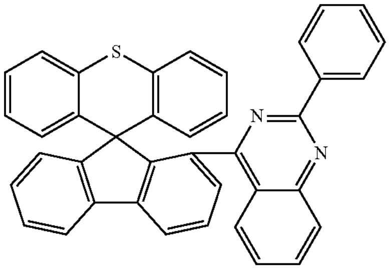
B-22
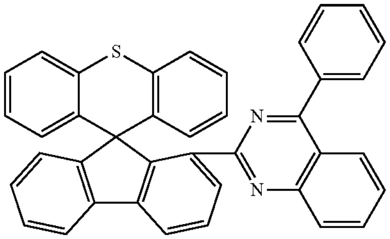
B-23
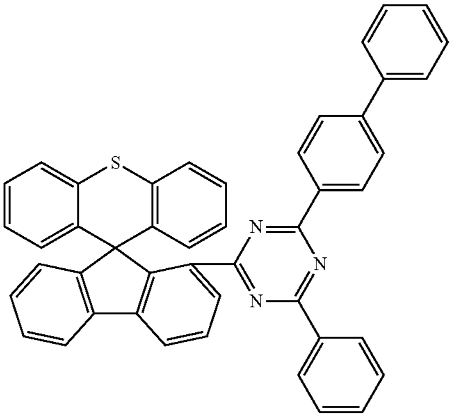

-continued
B-24
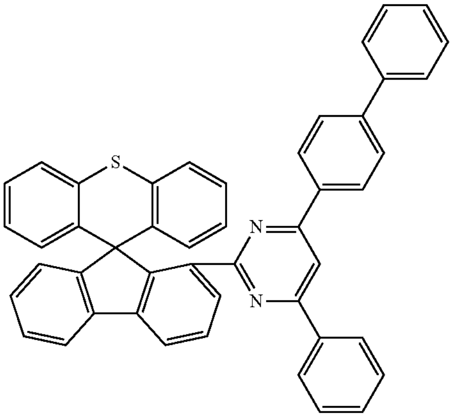
B-25
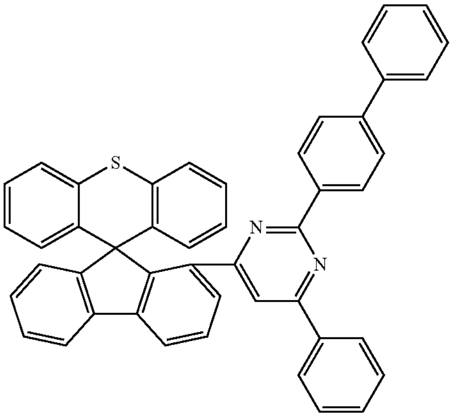
B-26
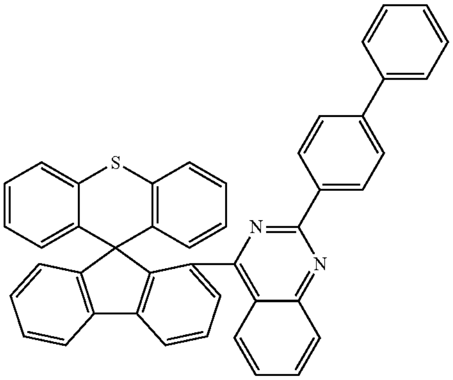
B-27
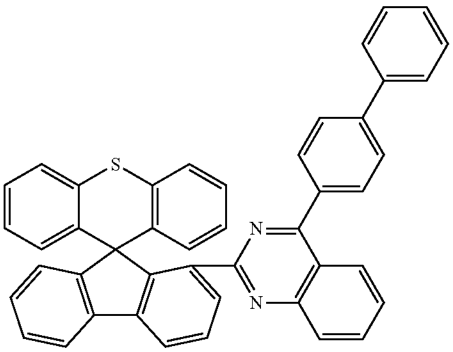
-continued
B-28
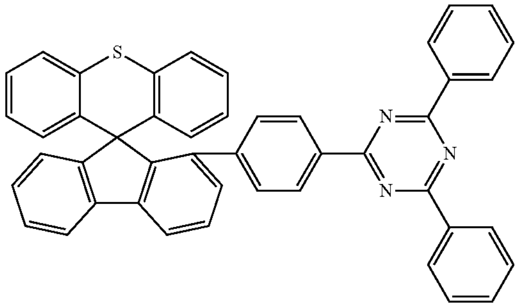
B-29
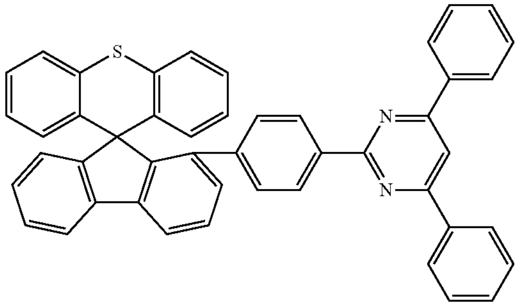
B-30
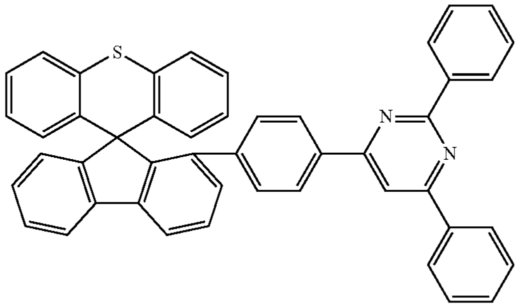
B-31
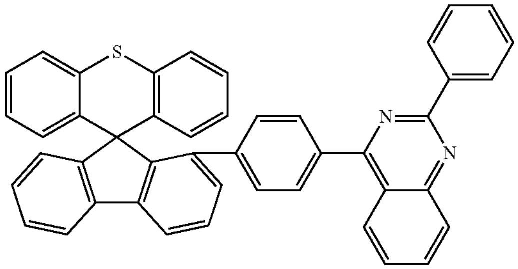
B-32
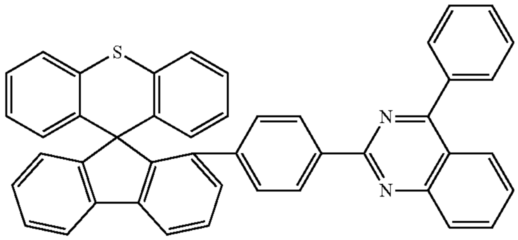

-continued
B-33
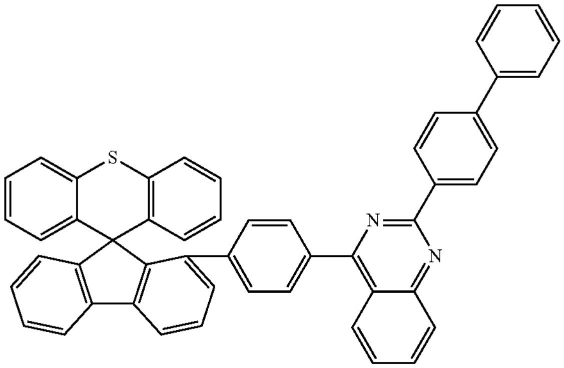
B-34
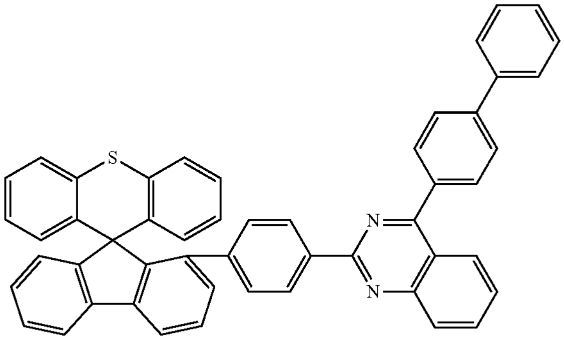
B-35
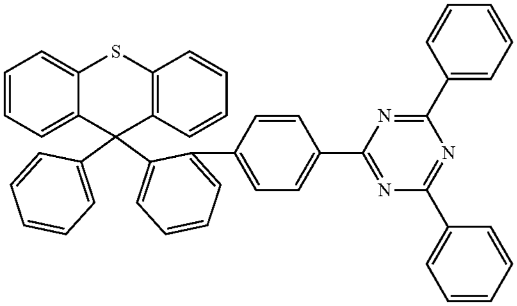
B-36
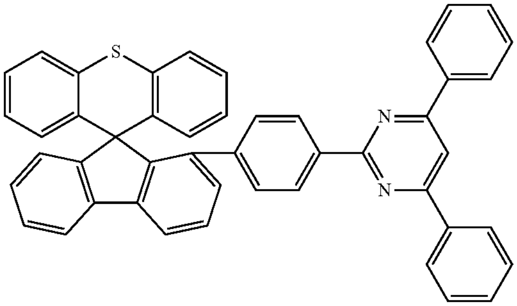
-continued
B-37
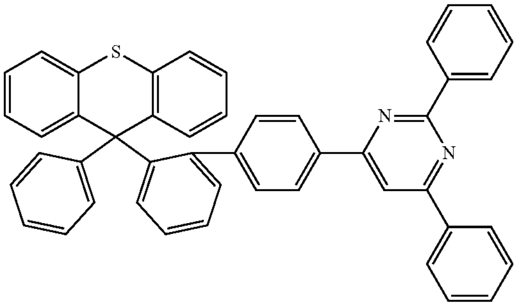
B-38
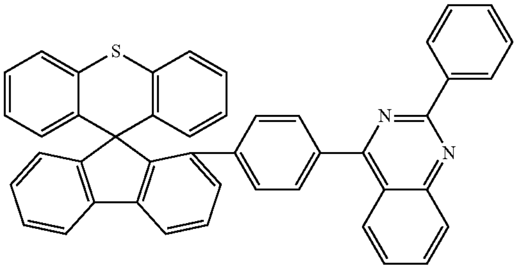
B-39
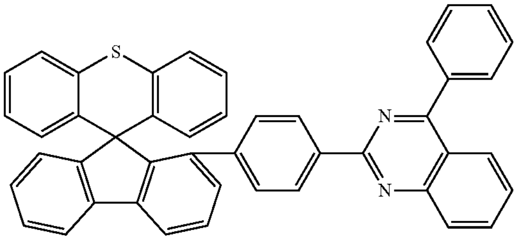
B-40
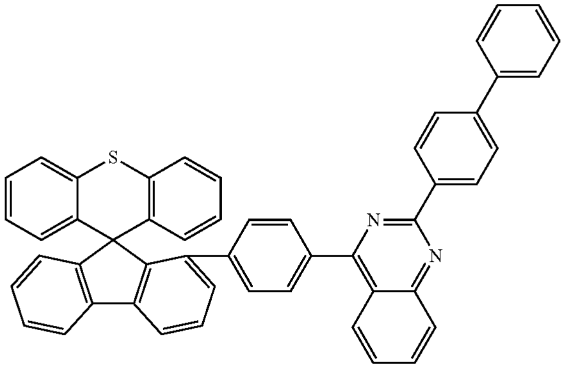
B-41
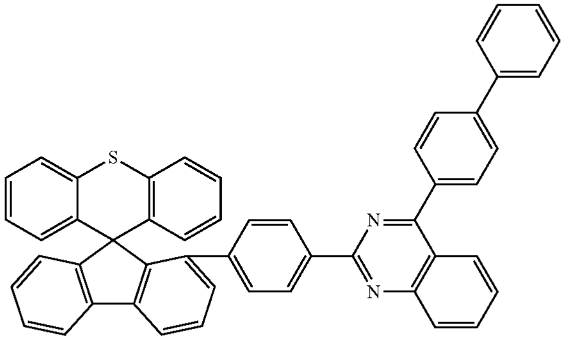

-continued
B-42
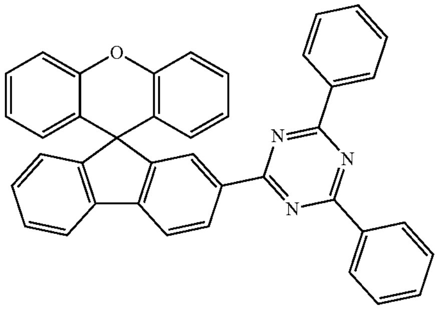
B-43
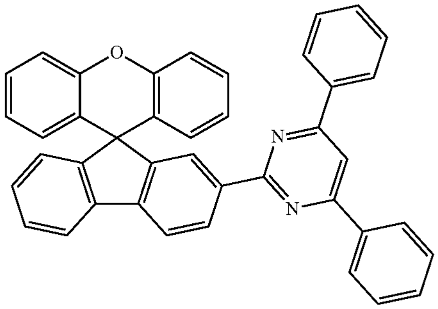
B-44
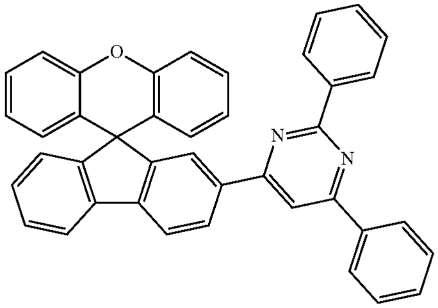
B-45
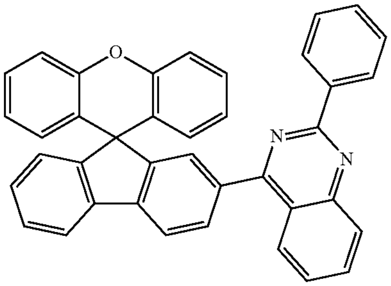
B-46
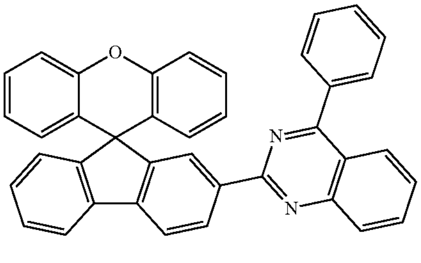
-continued
B-47
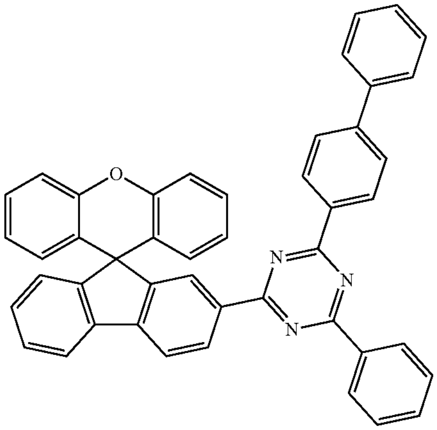
B-48
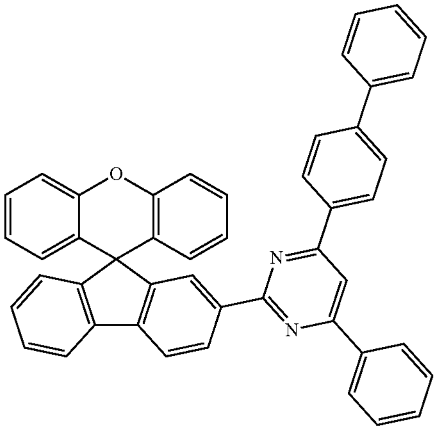
B-49
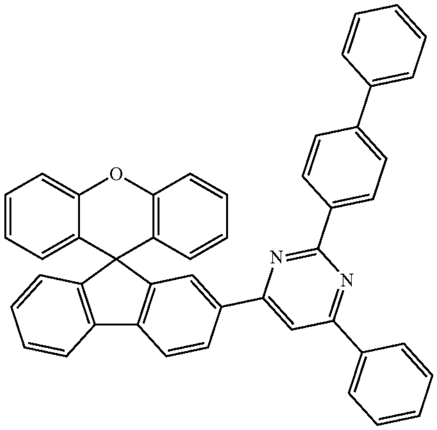

-continued
B-50
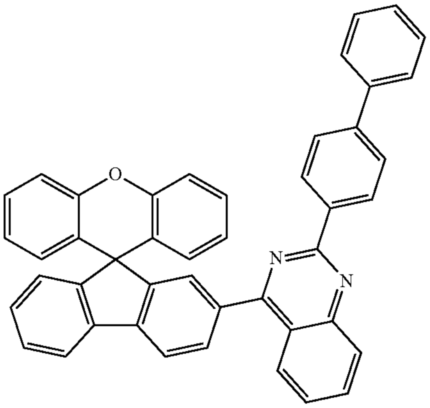
B-51
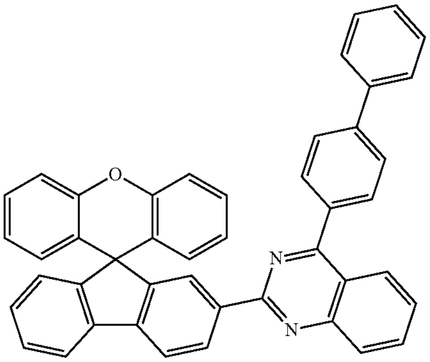
B-52
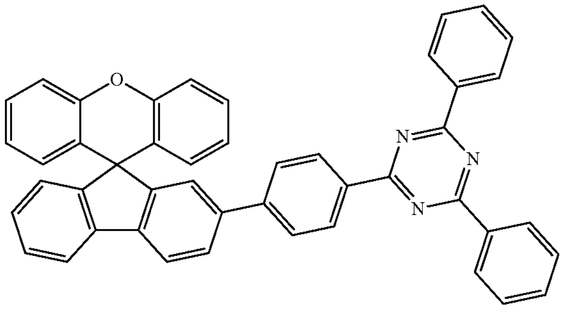
B-53
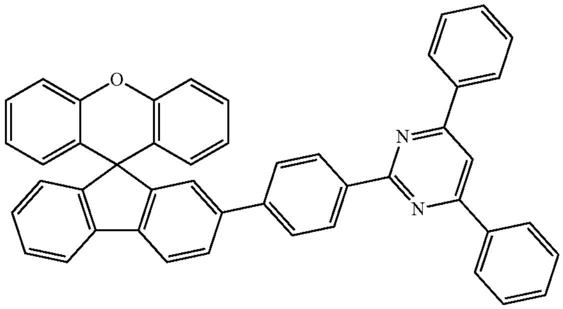
-continued
B-54
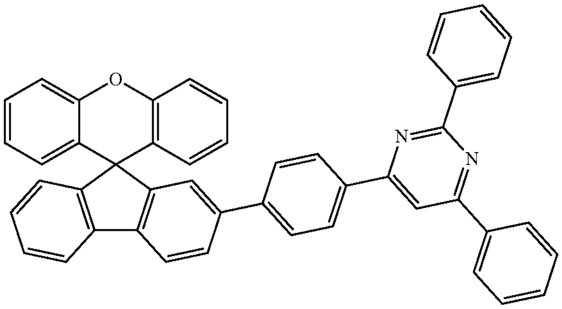
B-55
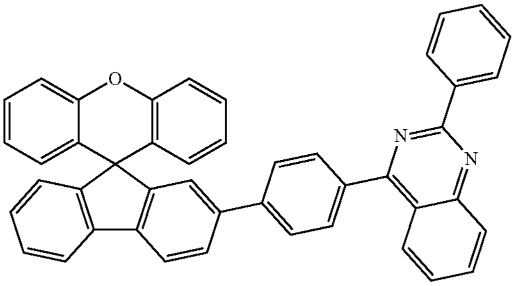
B-56
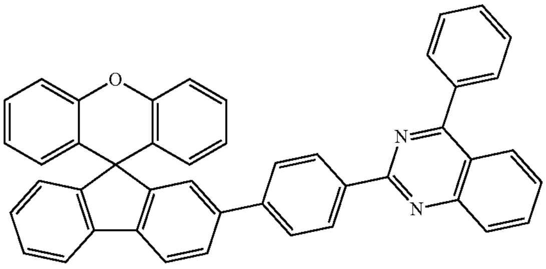
B-57
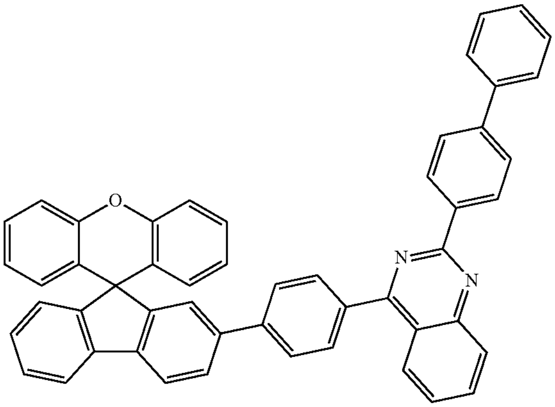

-continued
B-58
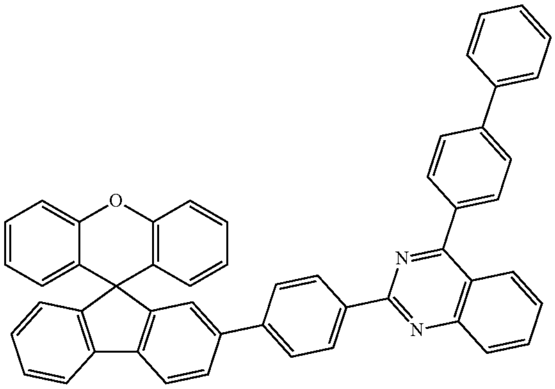
B-59
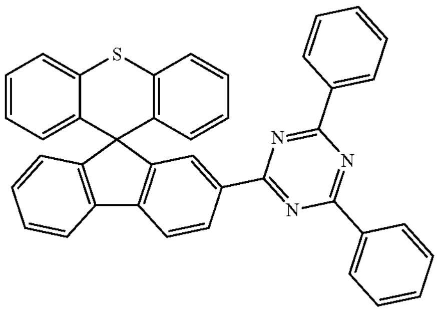
B-60
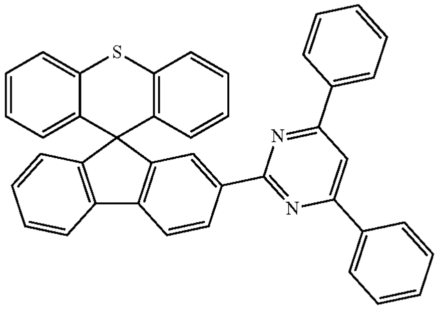
B-61
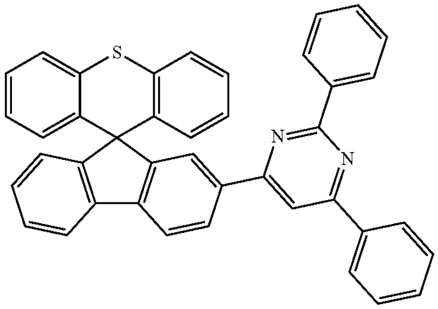
B-62
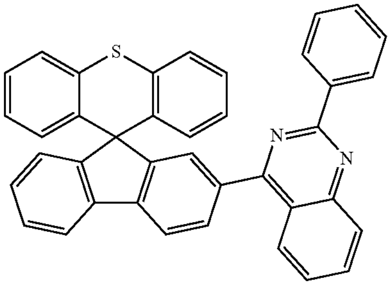
-continued
B-63
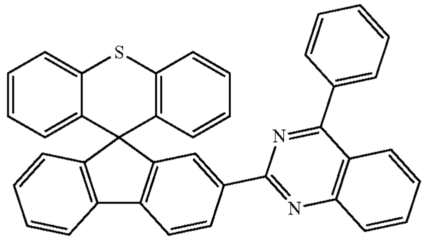
B-64
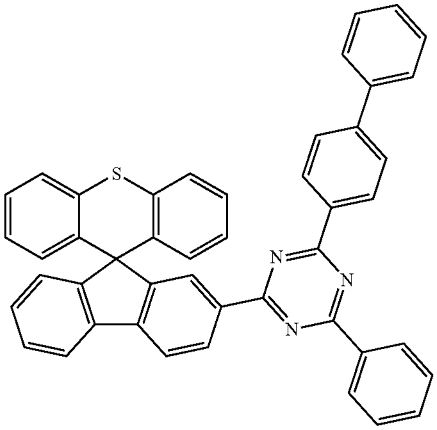
B-65
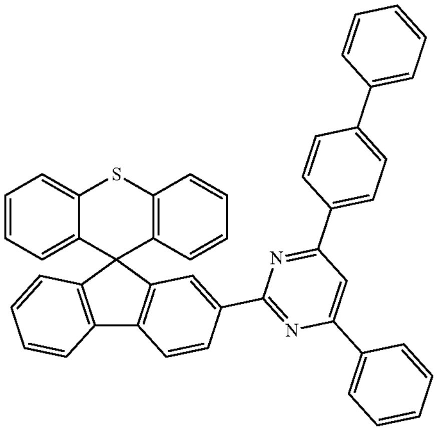
B-66
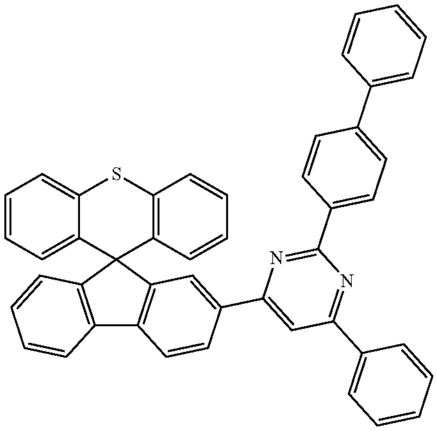

-continued
B-67
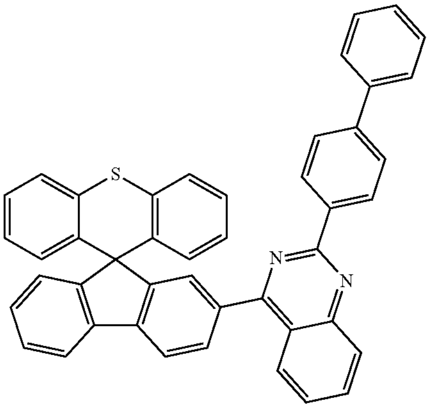
B-68
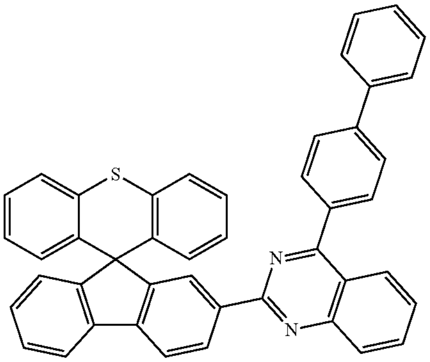
B-69
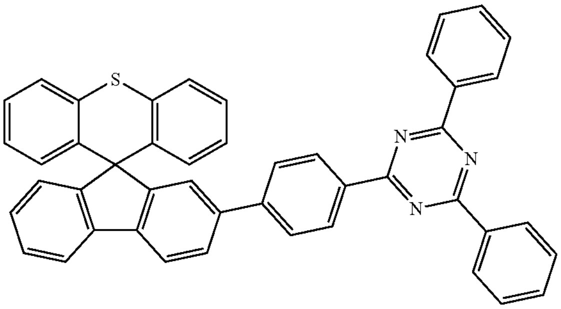
B-70
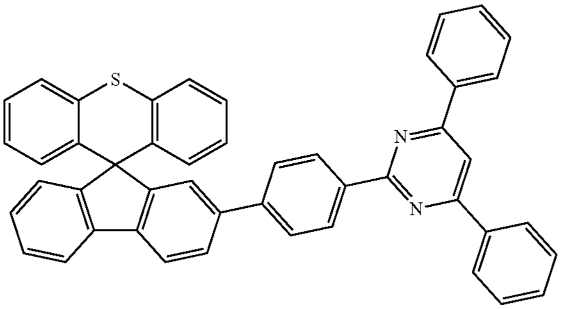
-continued
B-71
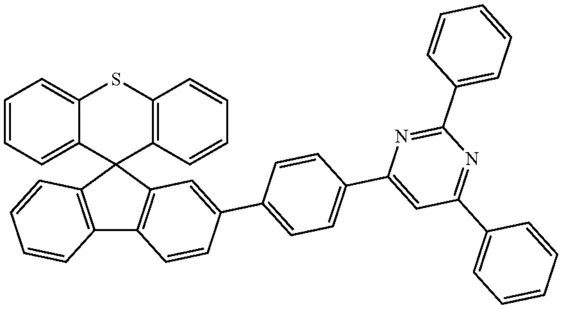
B-72
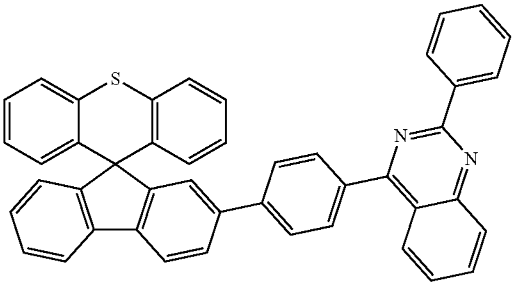
B-73
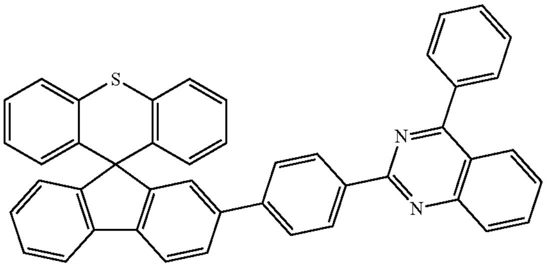
B-74
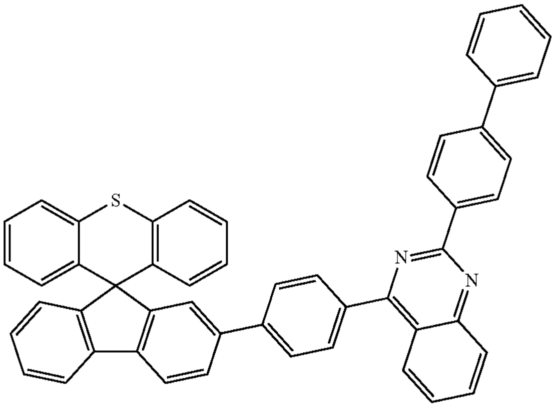

-continued
B-75
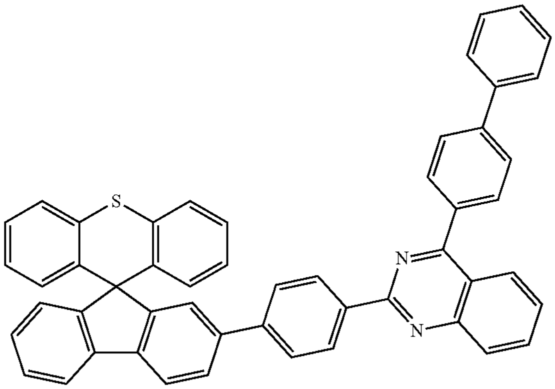
B-76
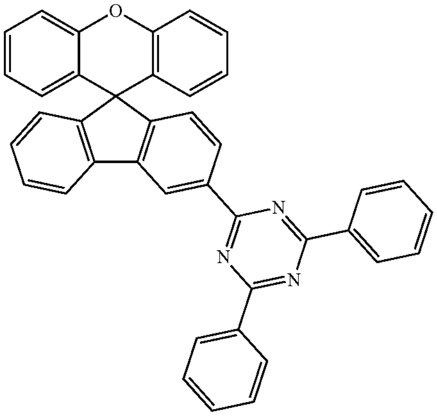
B-77
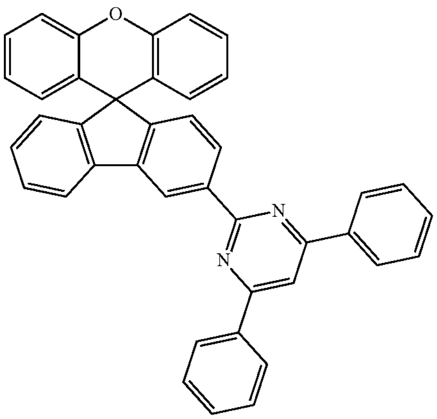
-continued
B-78
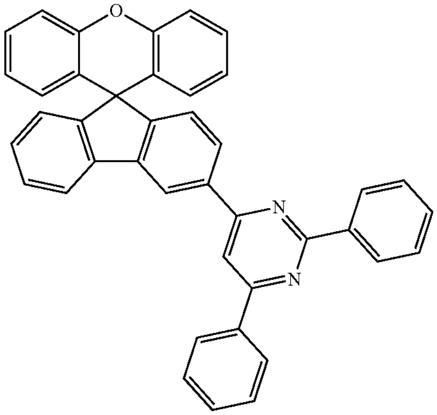
B-79
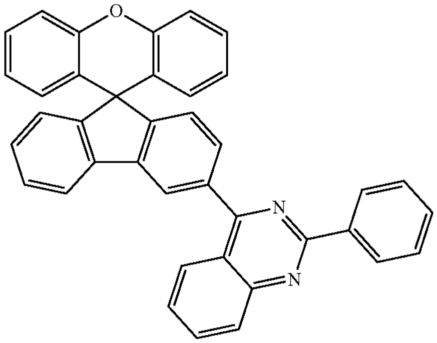
B-80
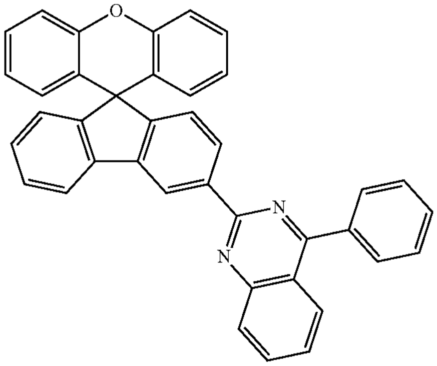
B-81
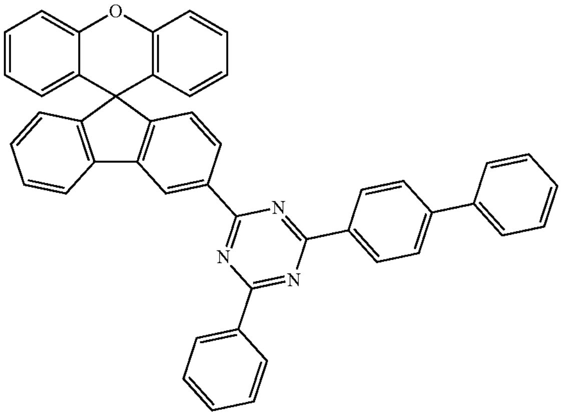

-continued
B-82
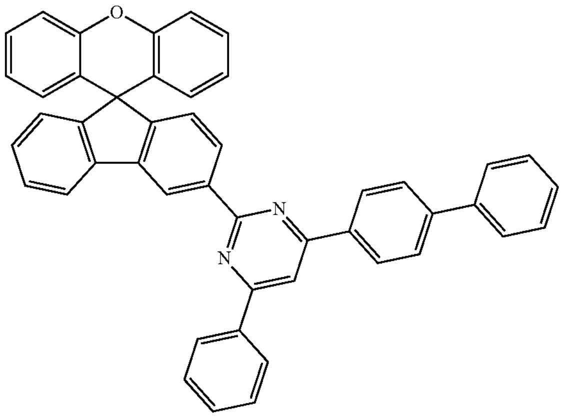
B-83
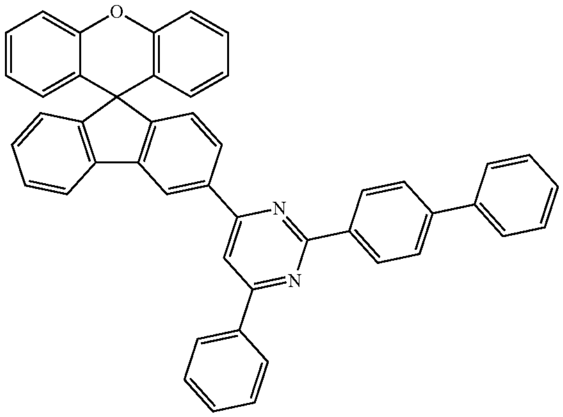
B-84
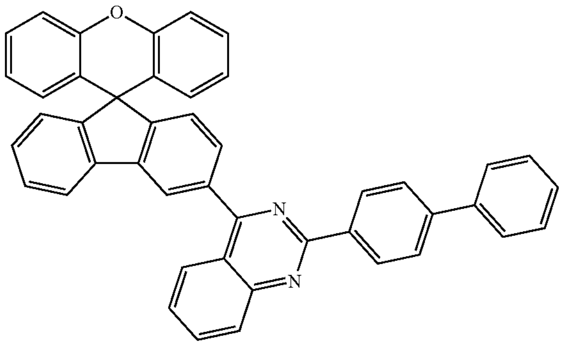
B-85
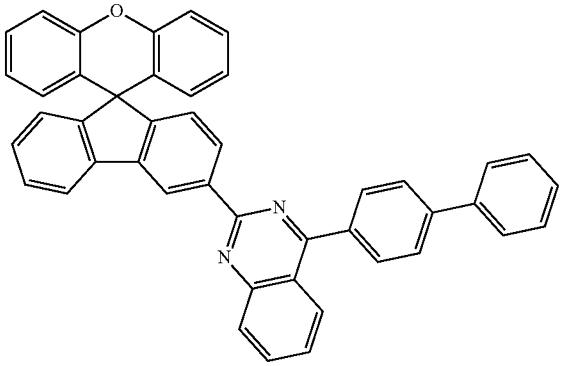
-continued
B-86
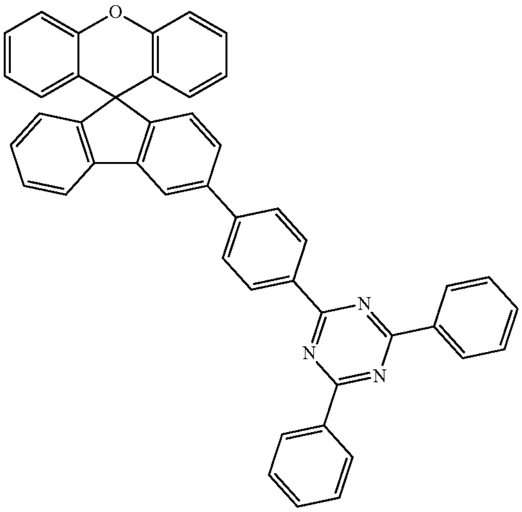
B-87
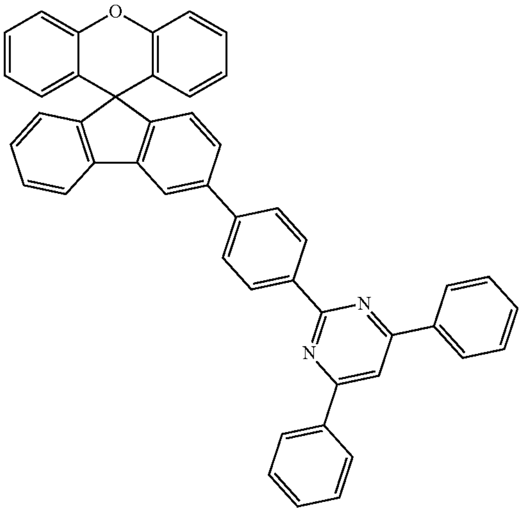
B-88
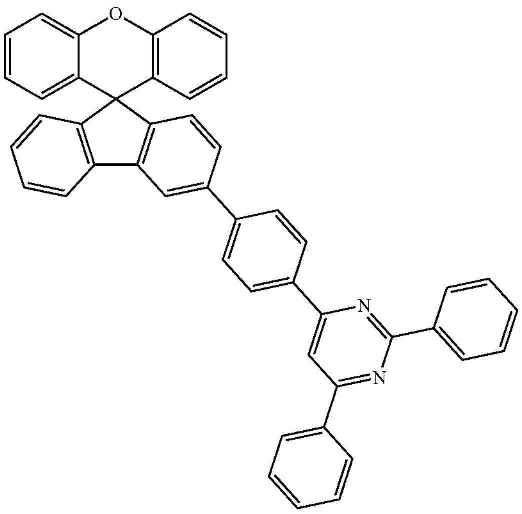

-continued
B-89
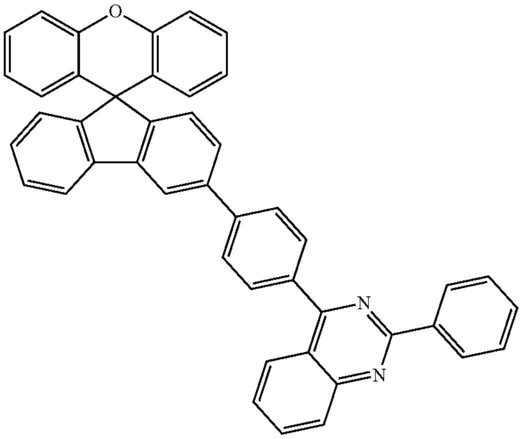
B-90
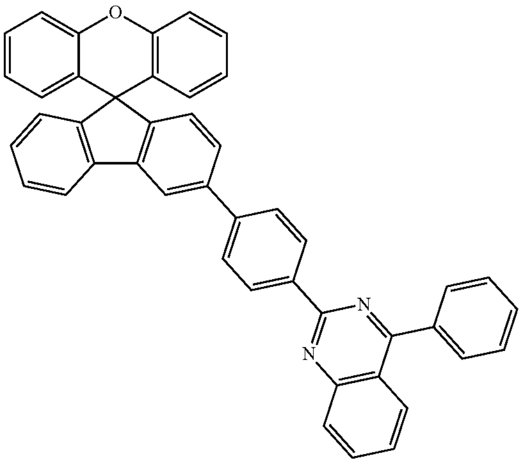
B-91
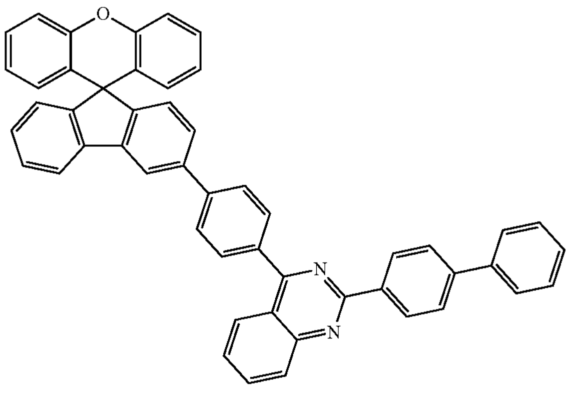
-continued
B-92
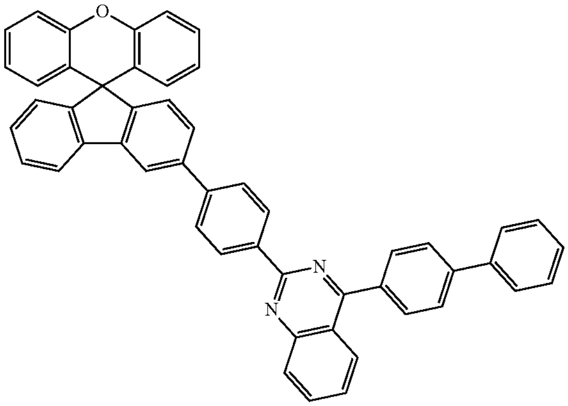
B-93
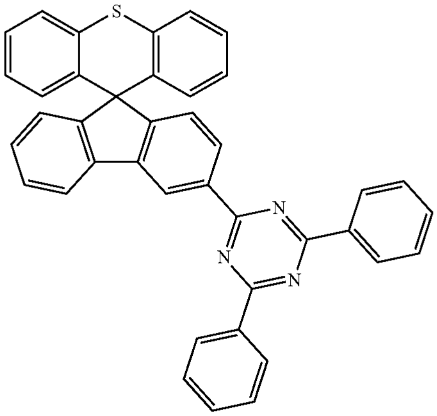
B-94
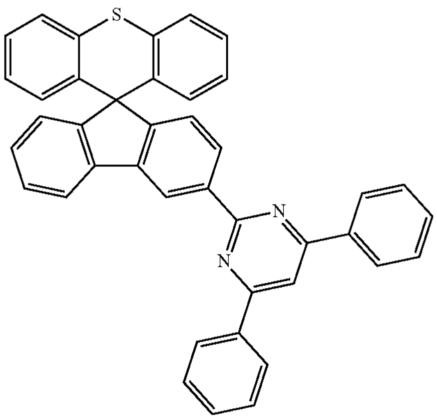

-continued
B-95
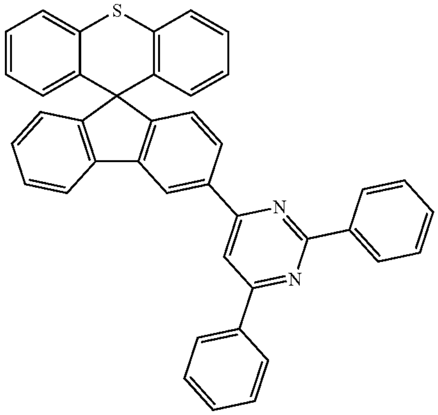
B-96
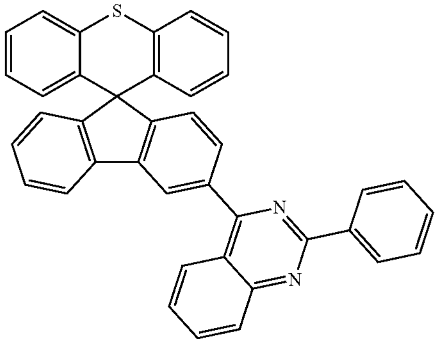
B-97
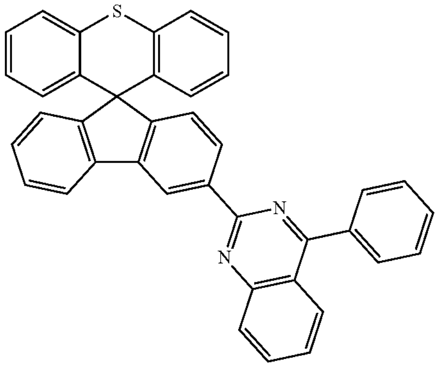
B-98
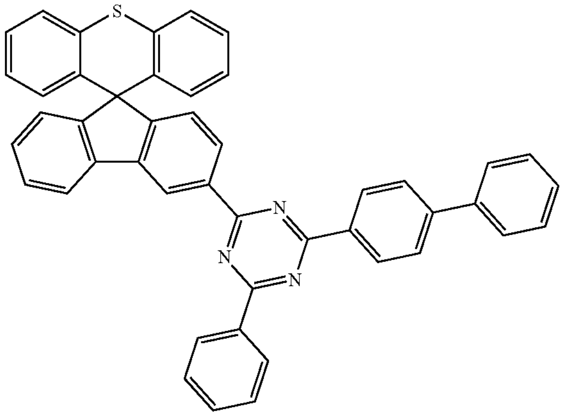
-continued
B-99
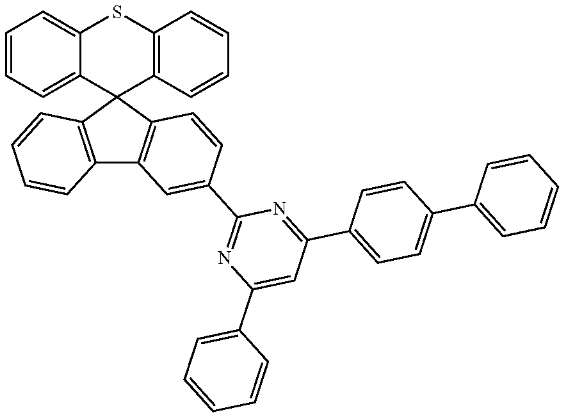
B-100
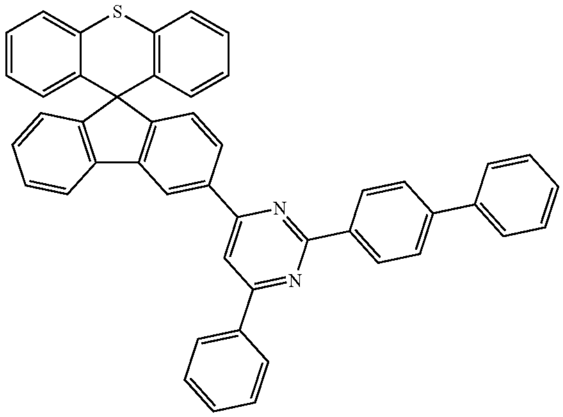
B-101
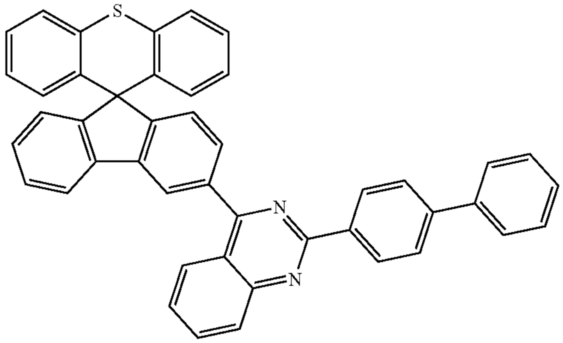
B-102
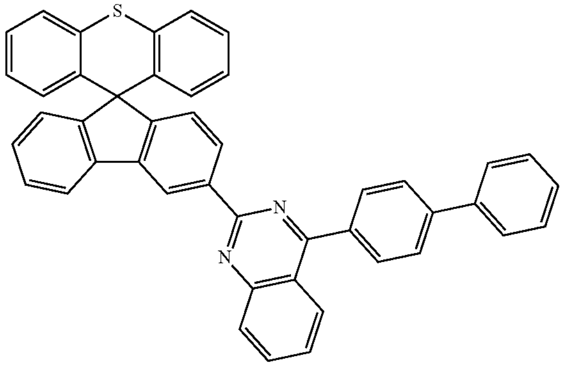

-continued
B-103
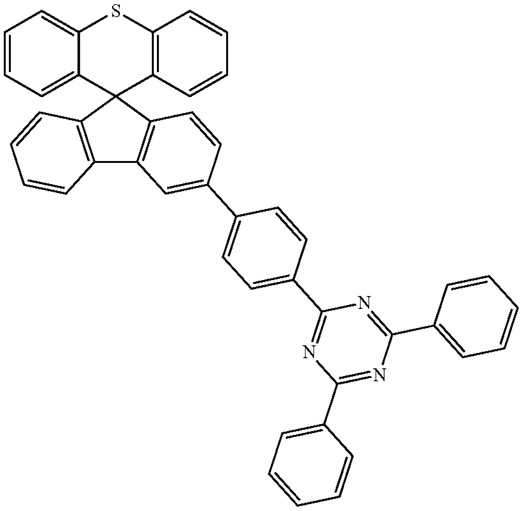
B-104
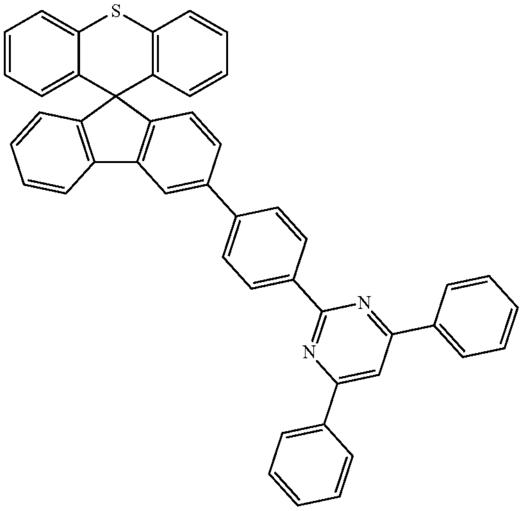
B-105
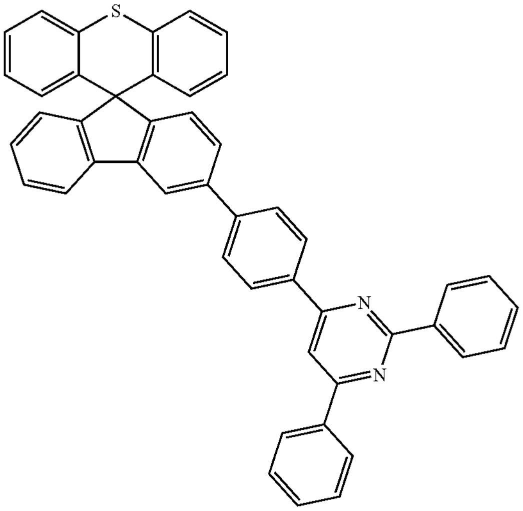
-continued
B-106
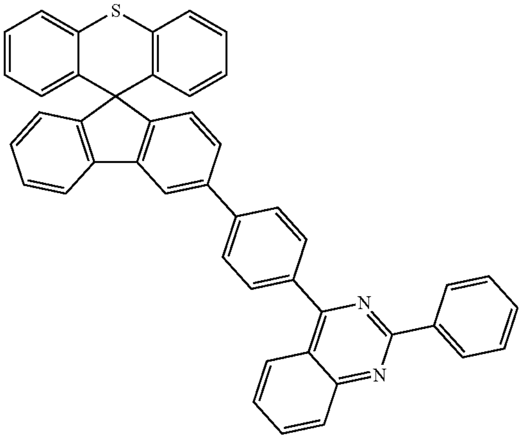
B-107
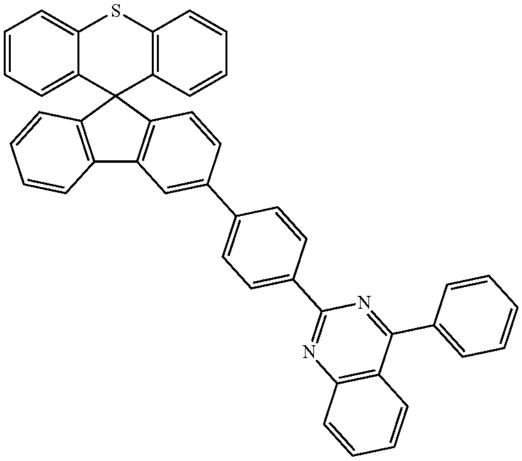
B-108
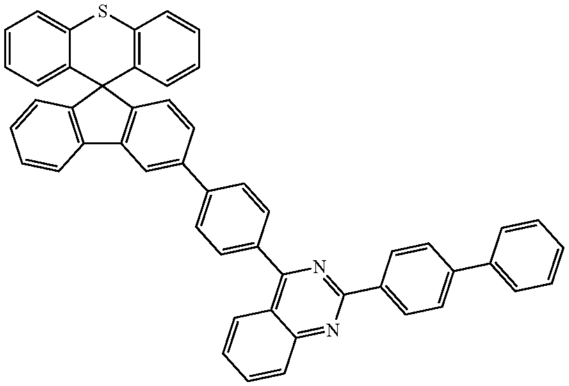

-continued
B-109
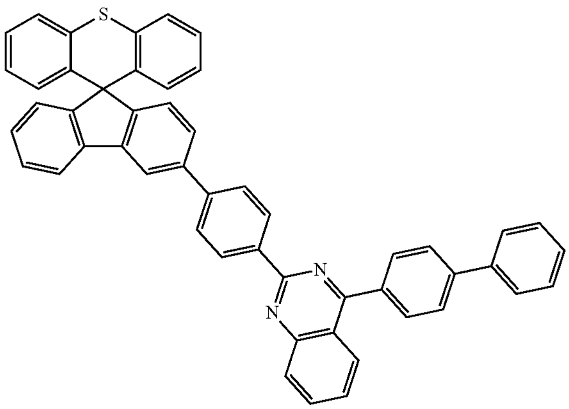
B-110
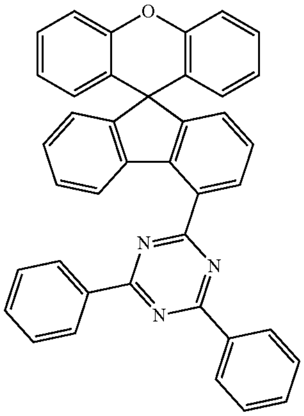
B-111
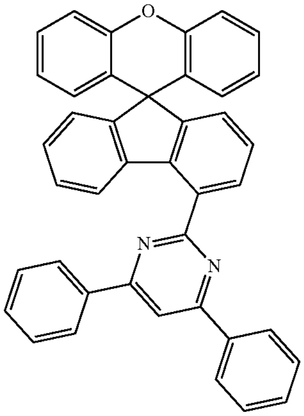
-continued
B-112
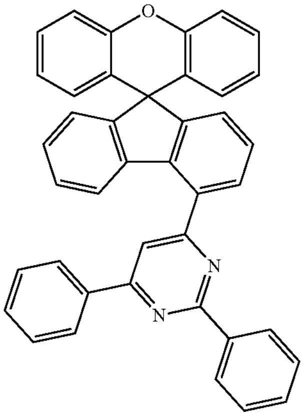
B-113
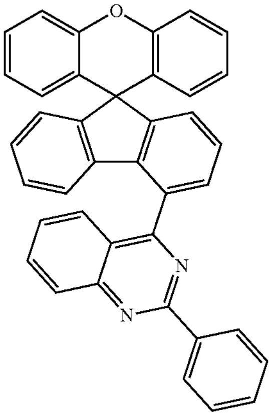
B-114
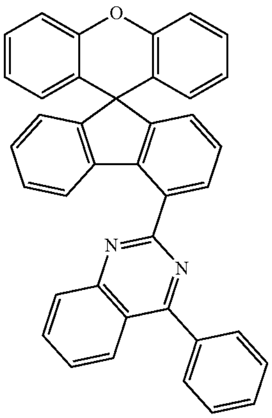

-continued
B-115
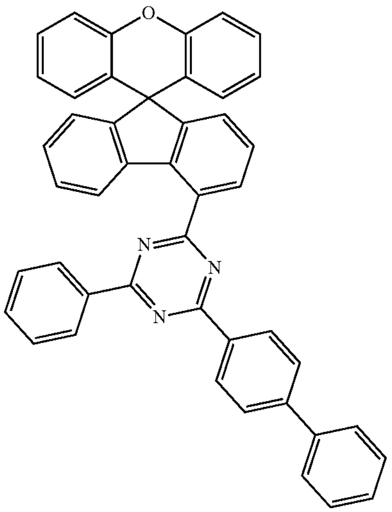
B-116
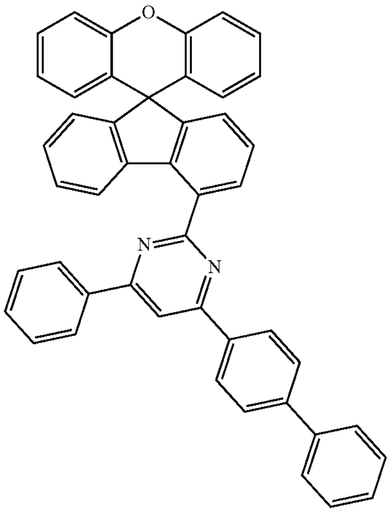
B-117
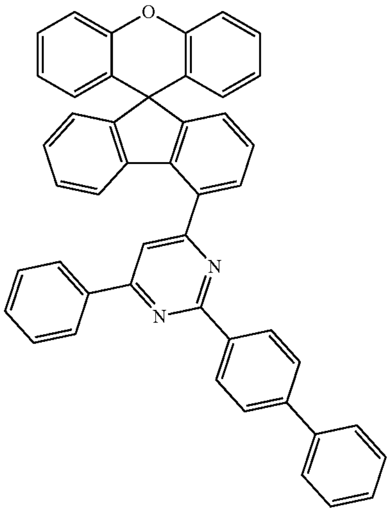
-continued
B-118
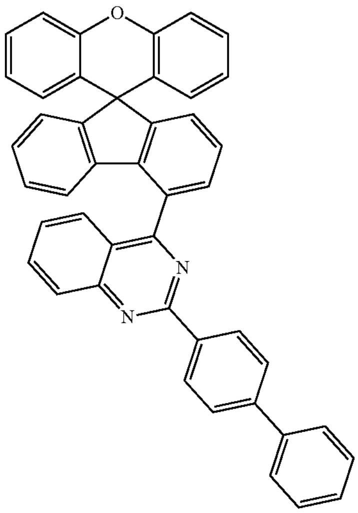
B-119
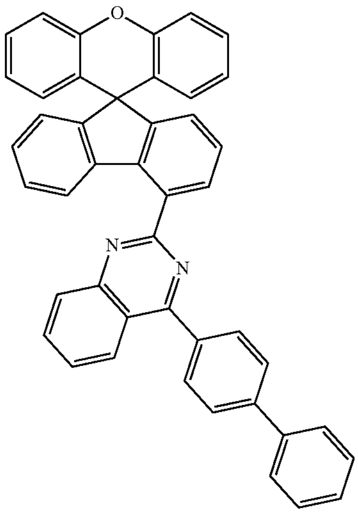
B-120
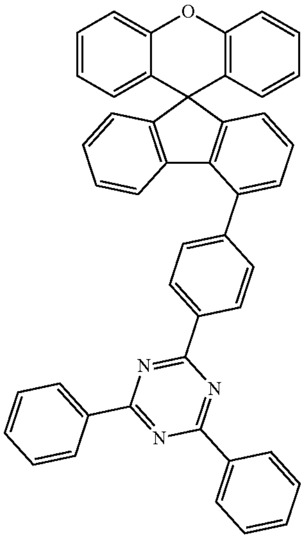

-continued
B-121
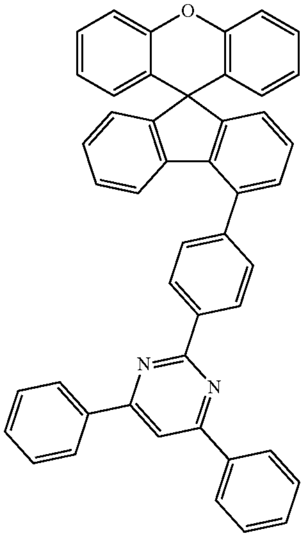
B-122
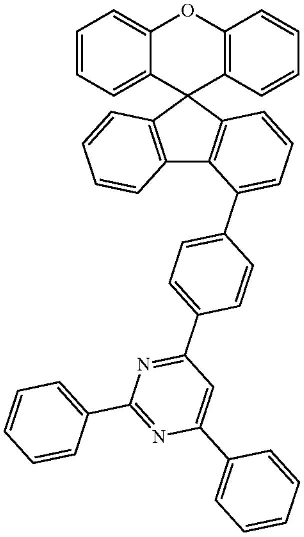
B-123
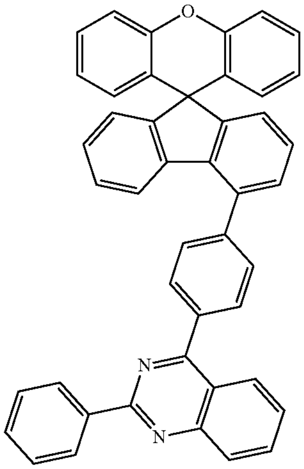
-continued
B-124
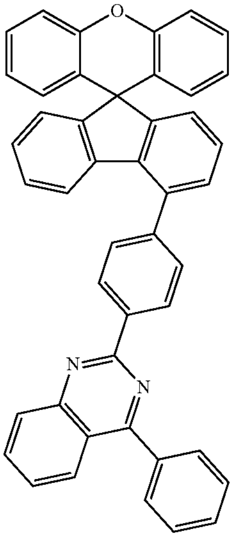
B-125
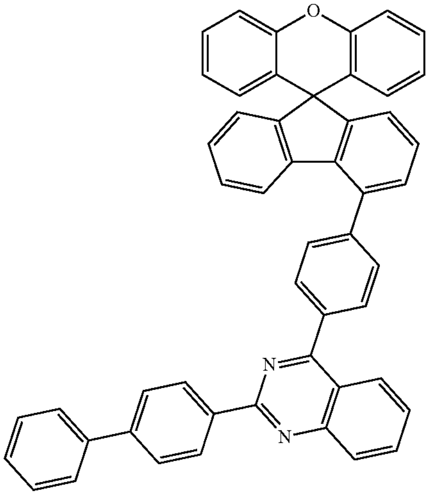
B-126
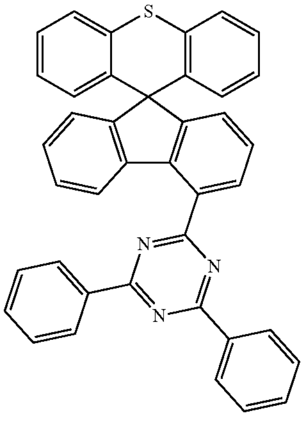

-continued
B-127
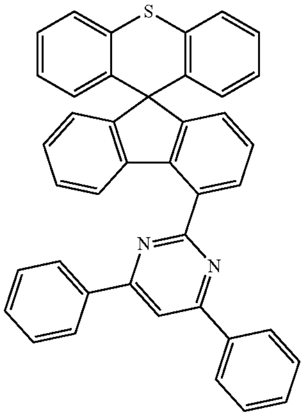
B-128
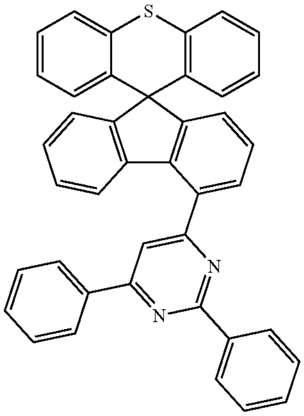
B-129
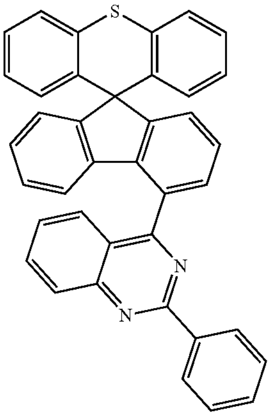
-continued
B-130
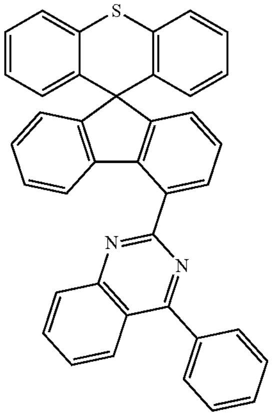
B-131
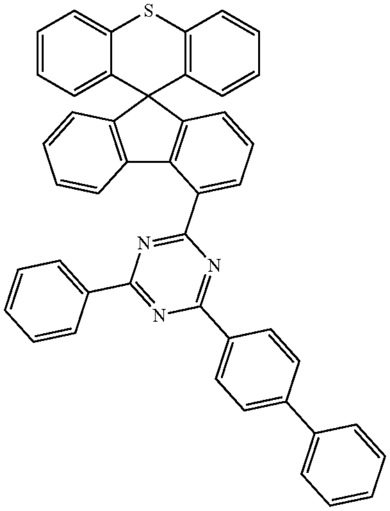
B-132
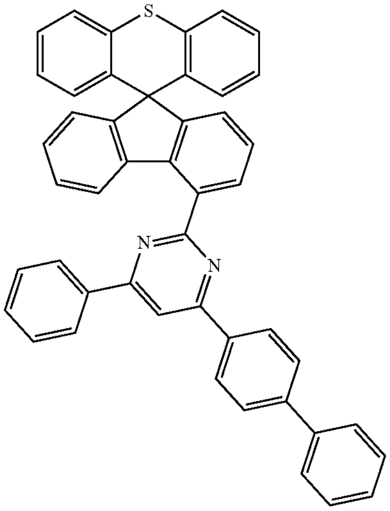

-continued
B-133
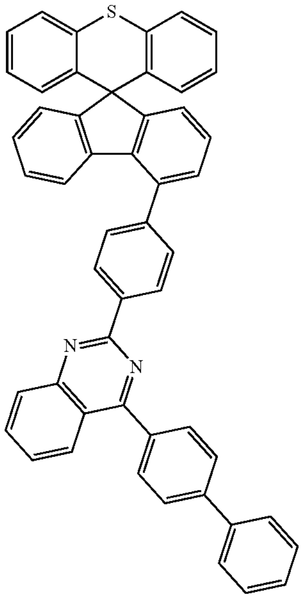
B-134
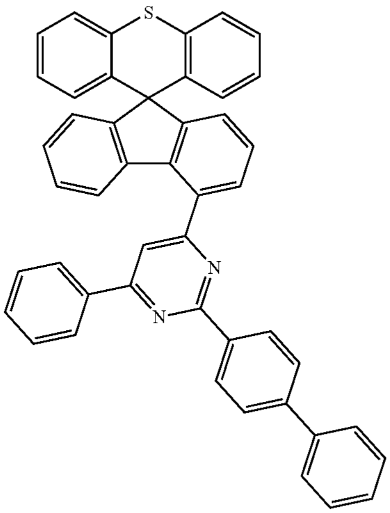
B-135
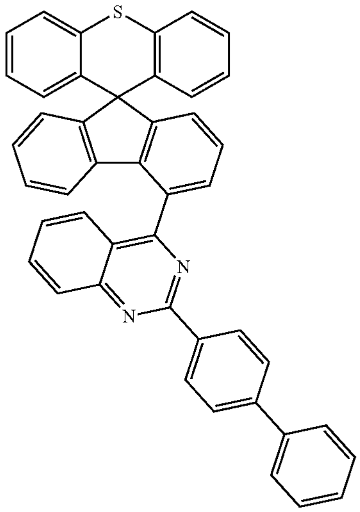
-continued
B-136
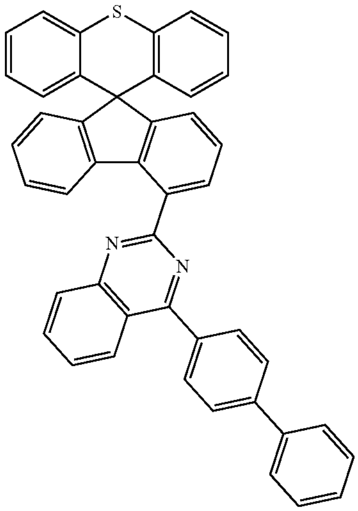
B-137
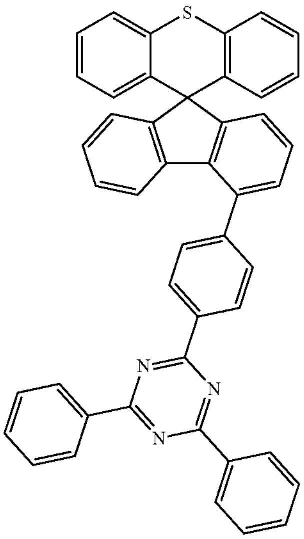
B-138
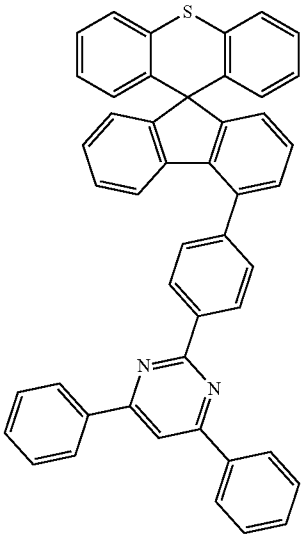

-continued
B-139
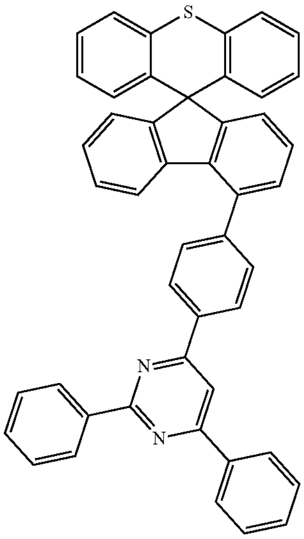
B-140
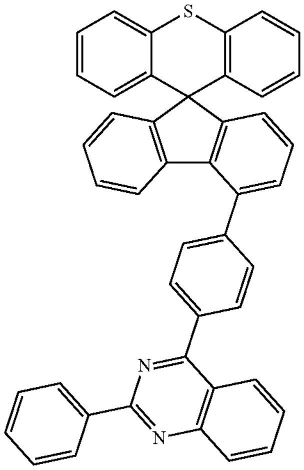
B-141
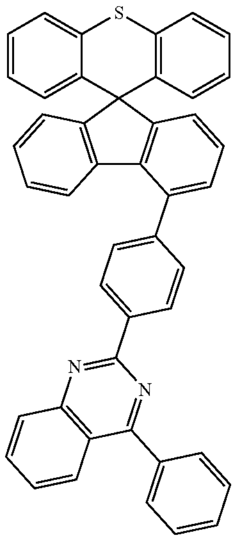
-continued
B-142
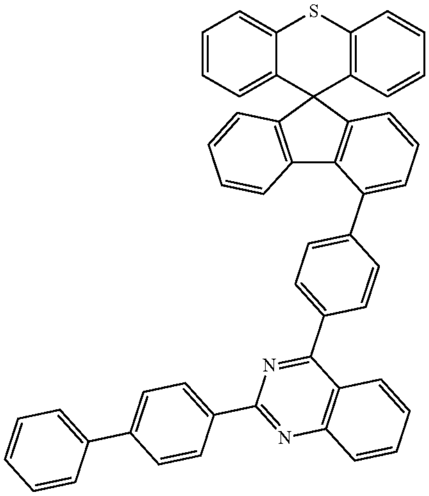
B-143
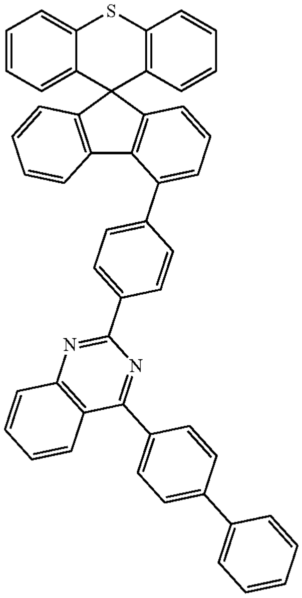
B-144
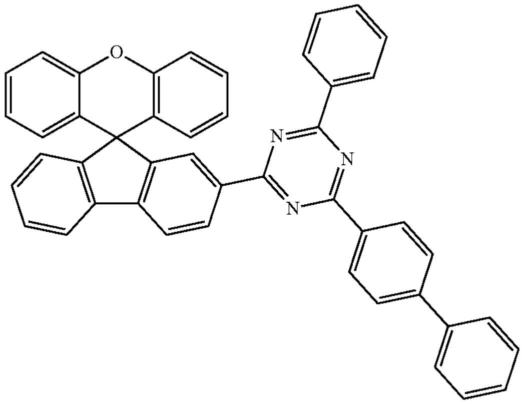

-continued
B-145
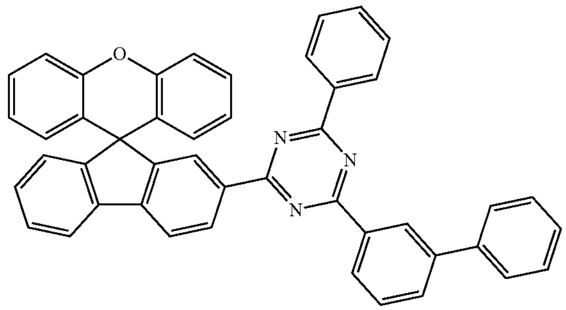
B-146
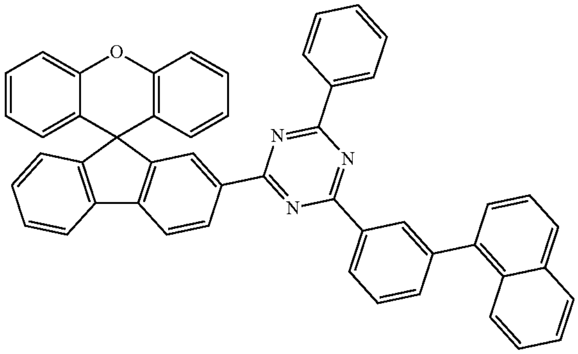
B-147
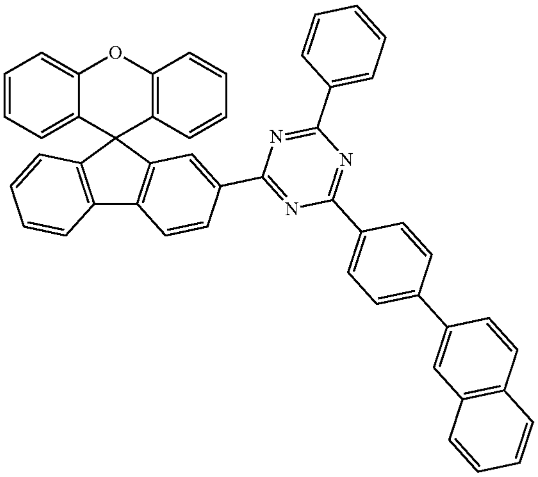
B-148
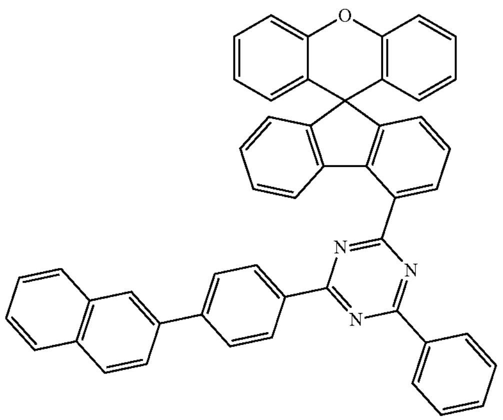
-continued
B-149
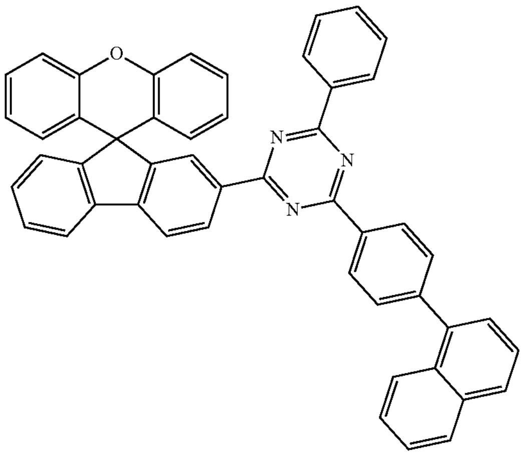
B-150
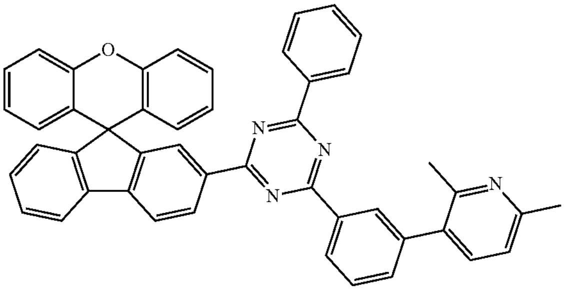
B-151
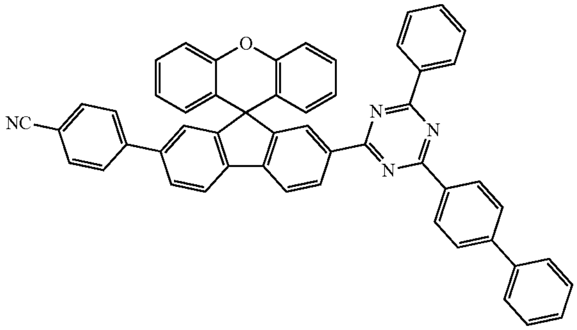
B-152
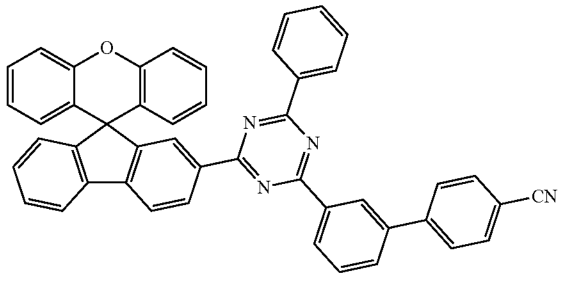

-continued
B-153
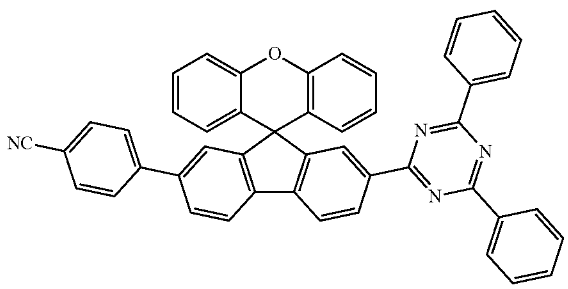
B-154
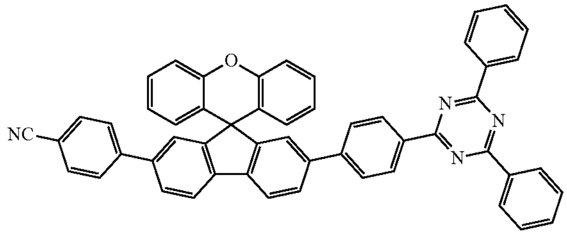
B-155
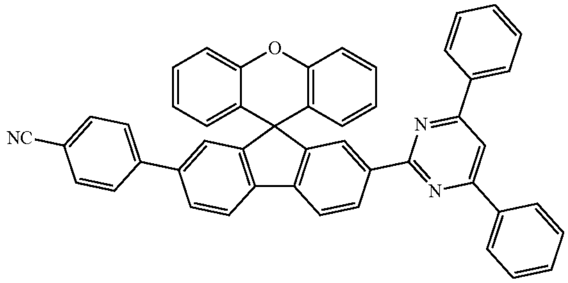
B-156
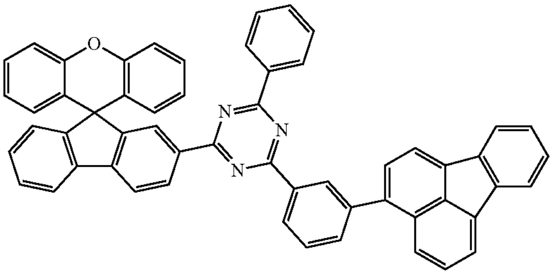
B-157
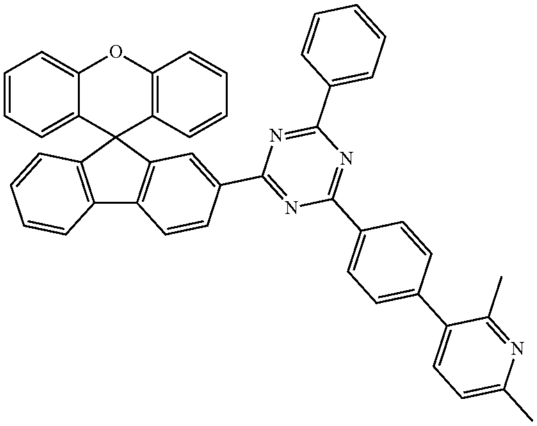
-continued
B-158
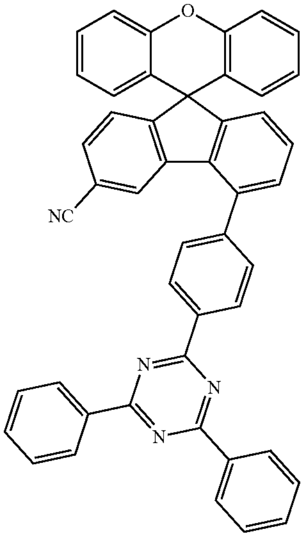
B-159
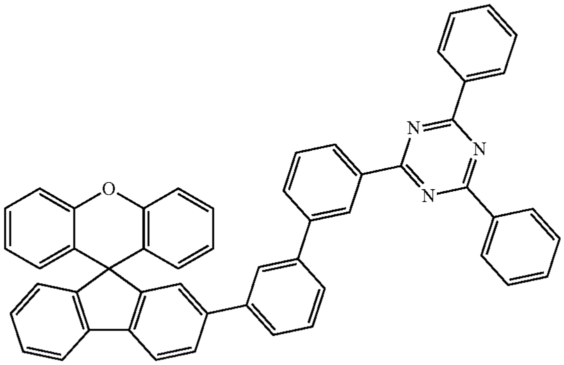
B-160
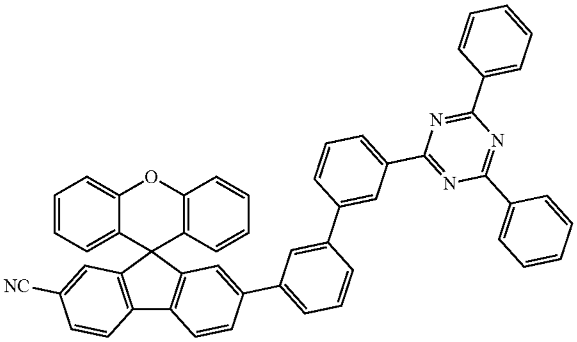

B-161
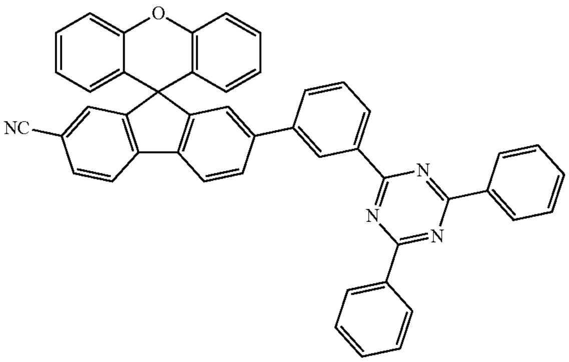
B-162
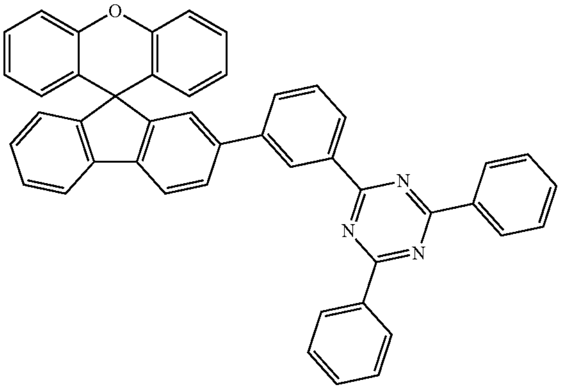
B-163
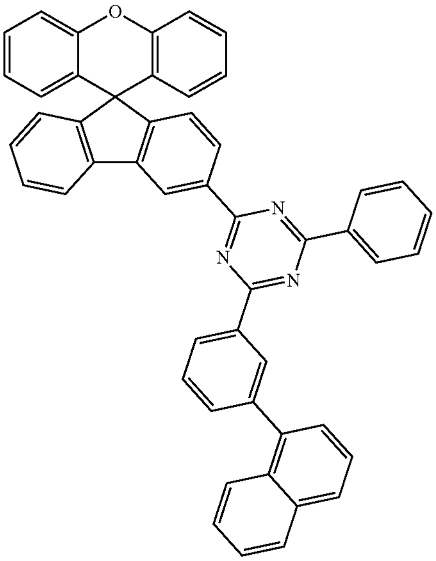
B-164
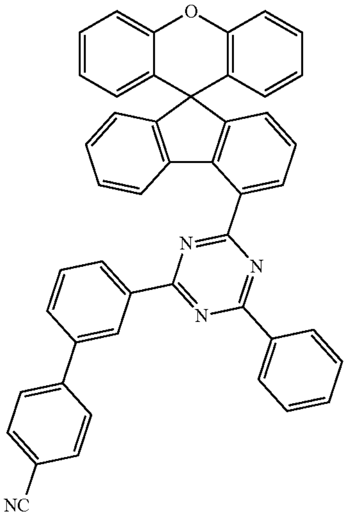
B-165
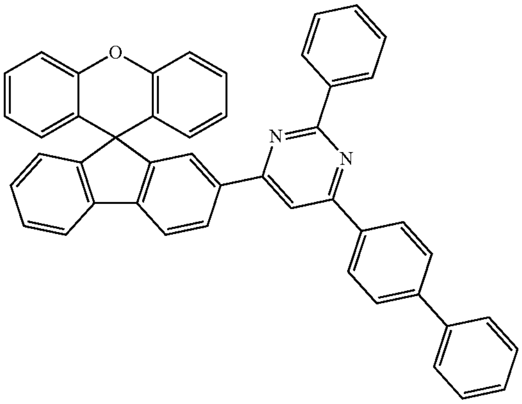
B-166
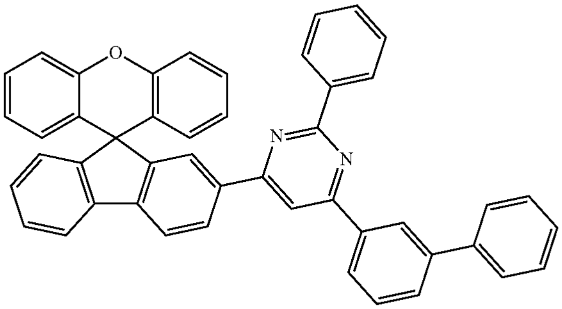
B-167
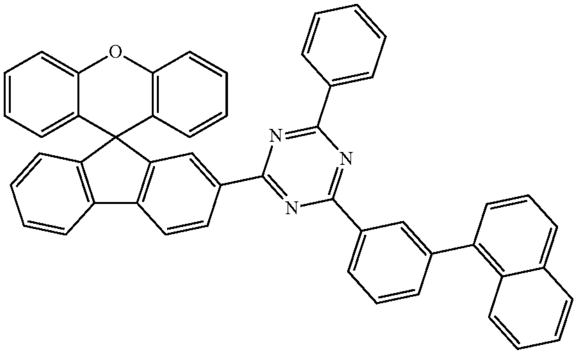

-continued
B-168
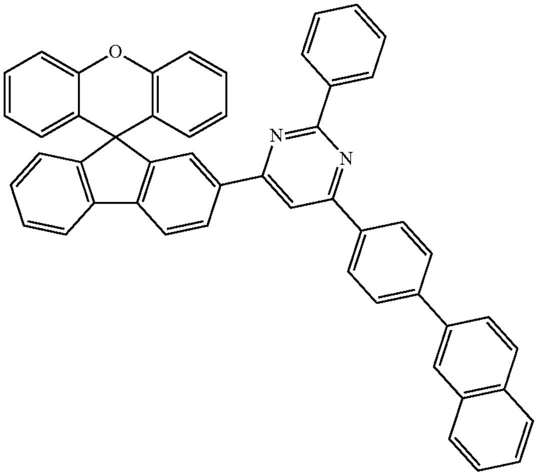
B-169
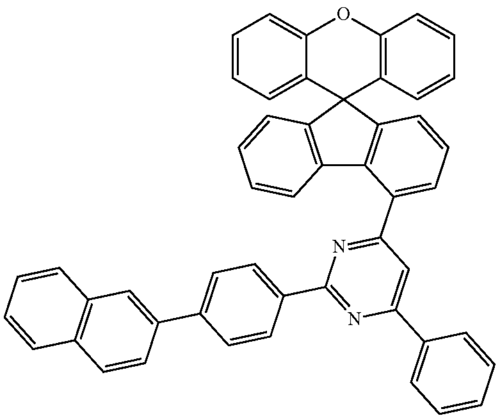
B-170
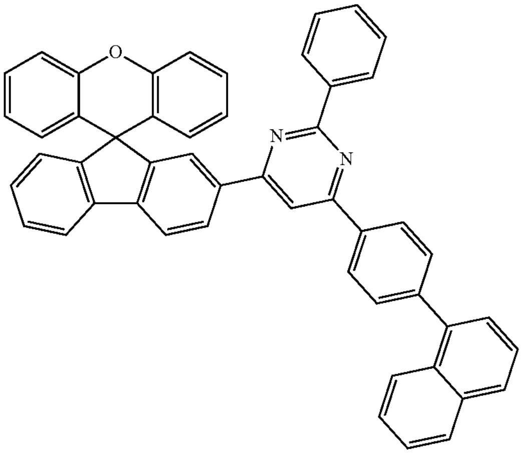
-continued
B-171
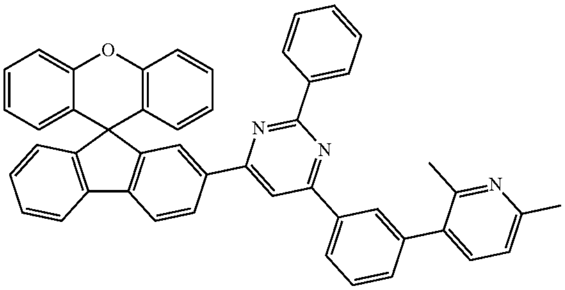
B-172
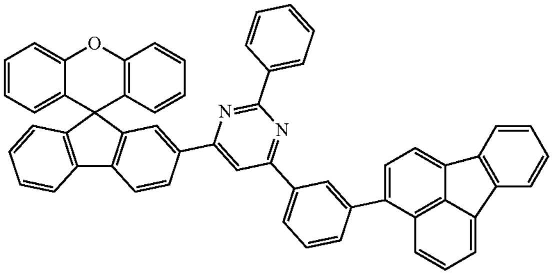
B-173
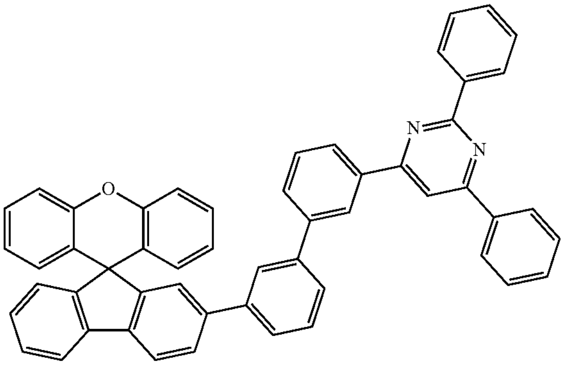
B-174
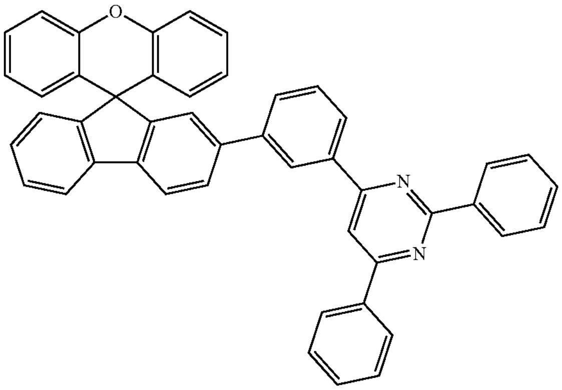

-continued
B-175
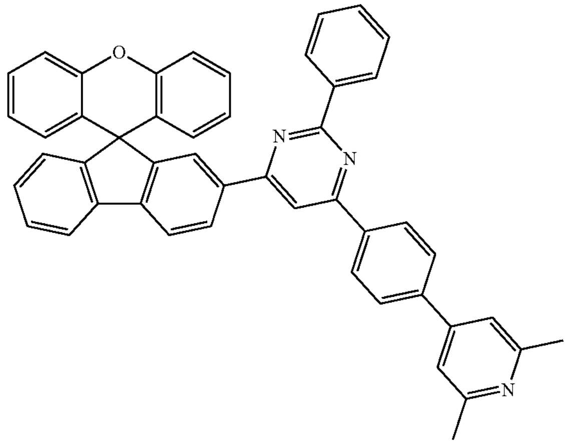
B-176
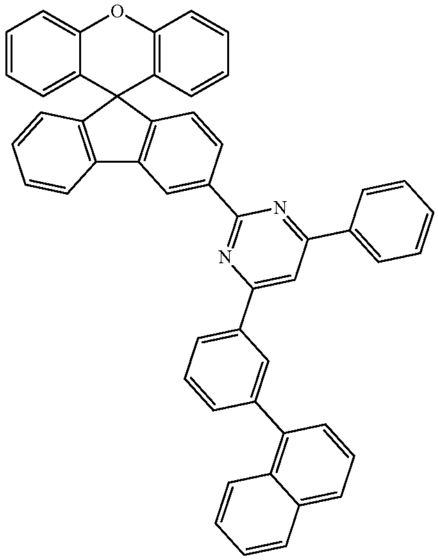
177
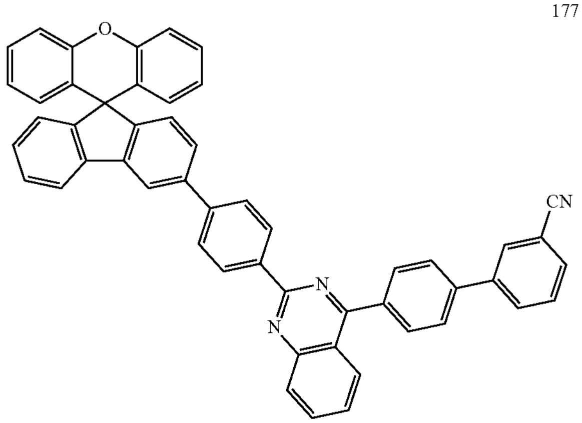 [SMILES: N#Cc1cccc(-c2ccc(-c3nc(-c4ccc(-c5ccc6c(c5)-c5ccccc5C65c6ccccc6Oc6ccccc65)cc4)nc4ccccc34)cc2)c1]
-continued
B-178
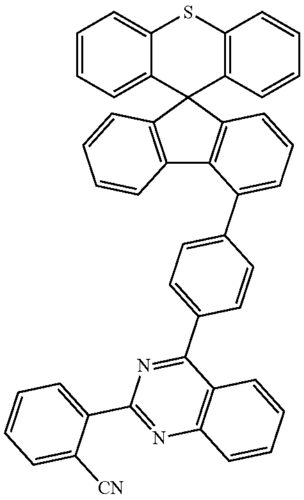
B-179
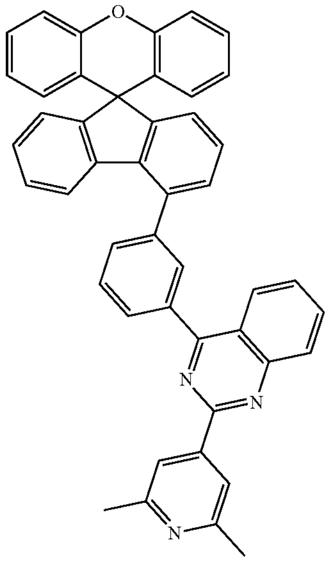
B-180
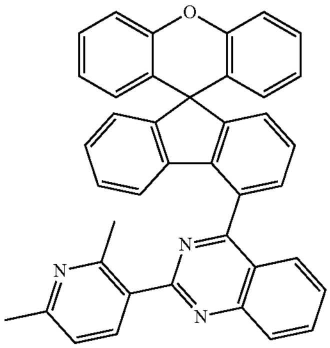

-continued
B-181
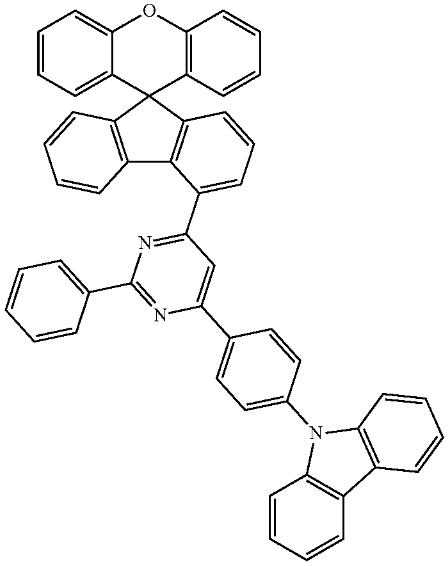
B-182
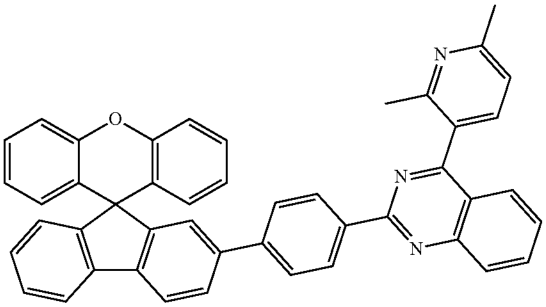
B-183
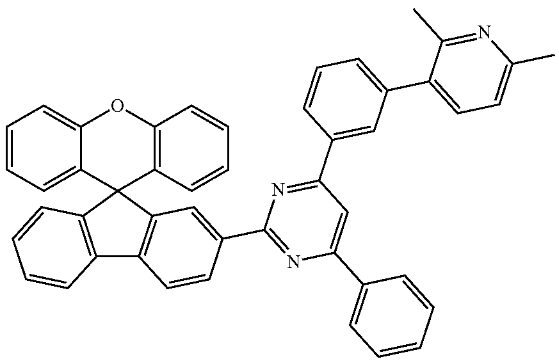
-continued
B-184
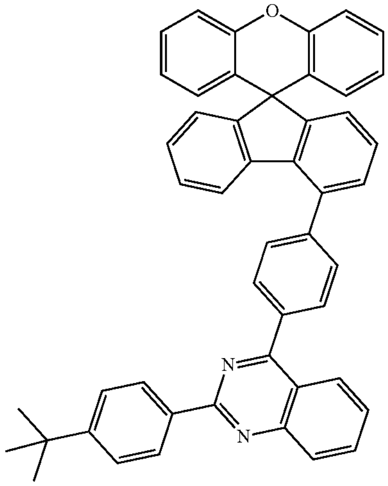
B-185
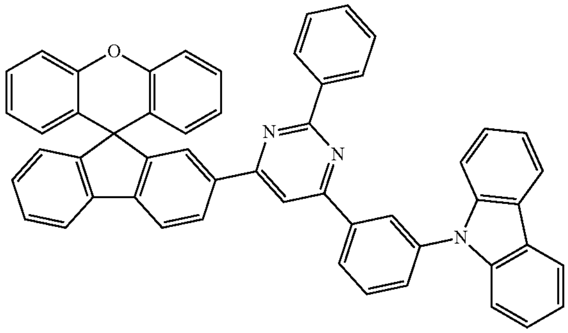
B-186
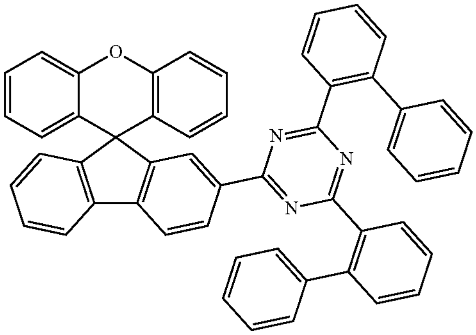
B-187
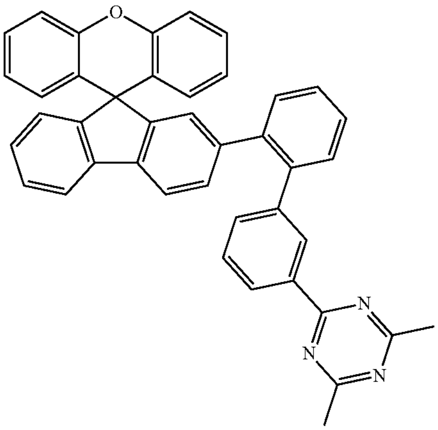

-continued
B-188
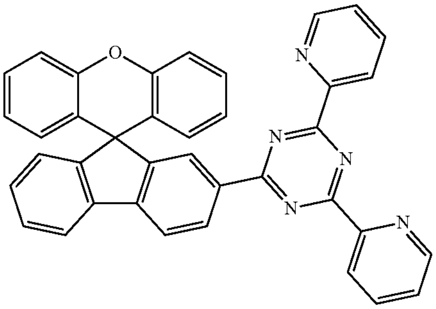
B-189
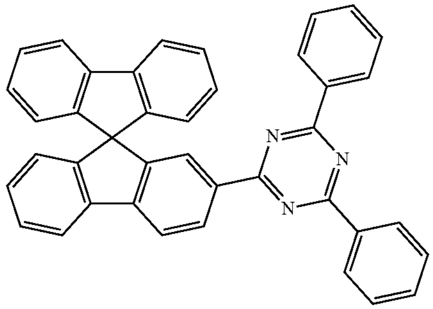
B-190
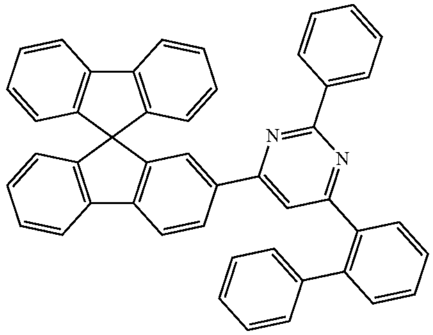
B-191
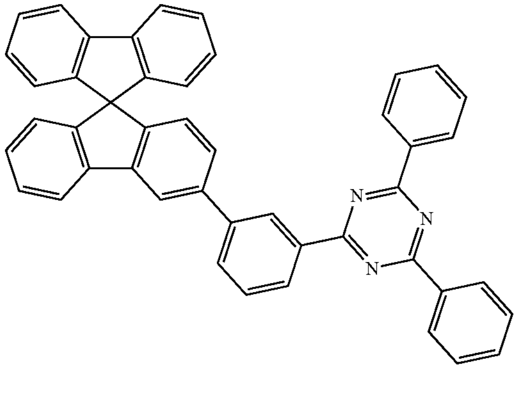
-continued
B-192
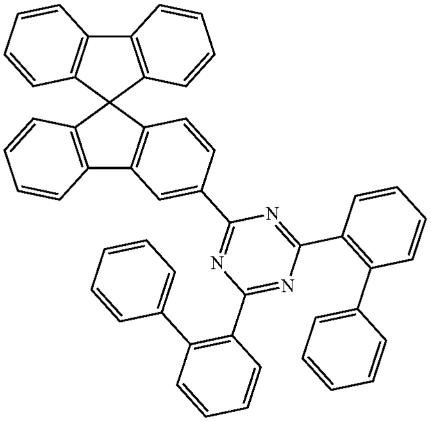
B-193
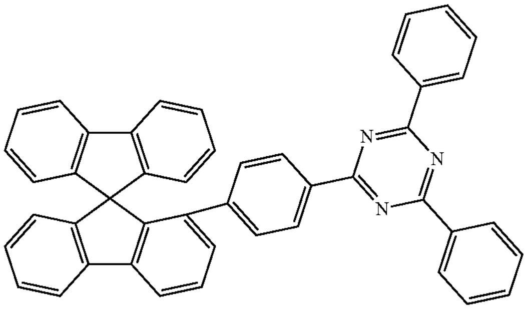
B-194
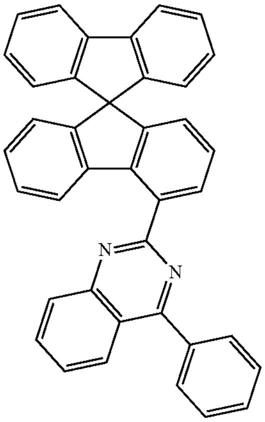
B-195
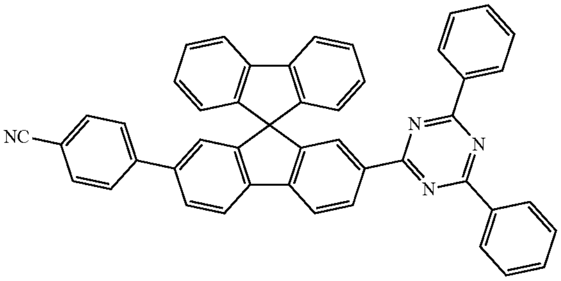

-continued
B-196
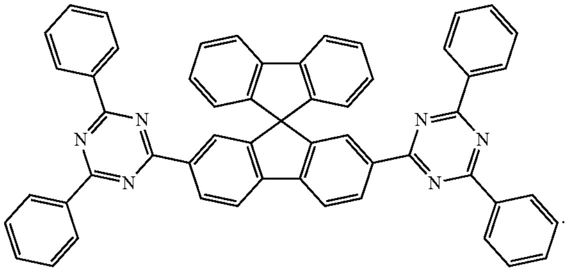
6. The organic light-emitting device according to claim 1, wherein the compound of [Formula B] is any one selected from the following compounds [B-201] to [B-344]:
B-201
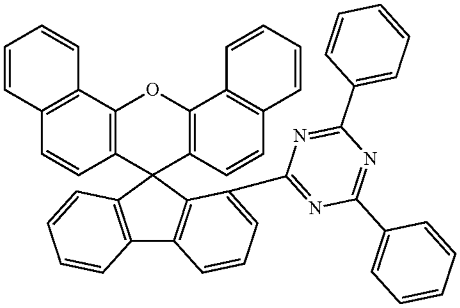
B-202
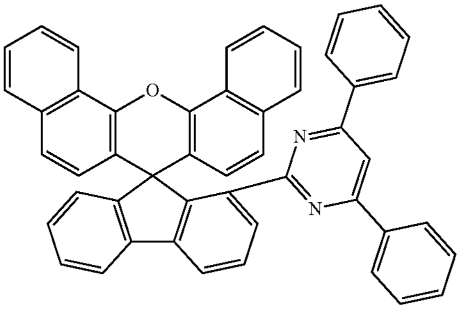
B-203
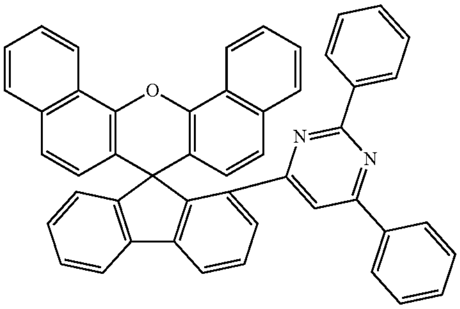
-continued
B-204
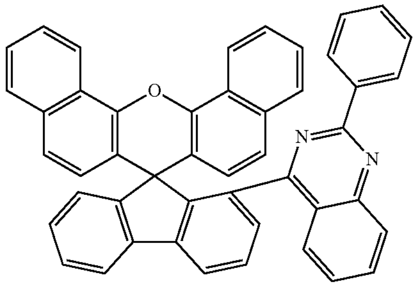
B-205
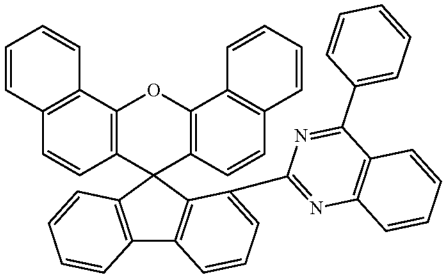
B-206
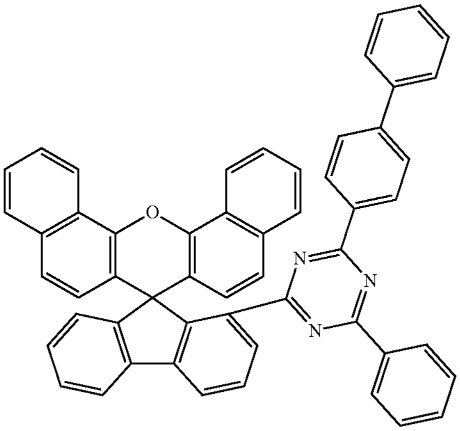
B-207
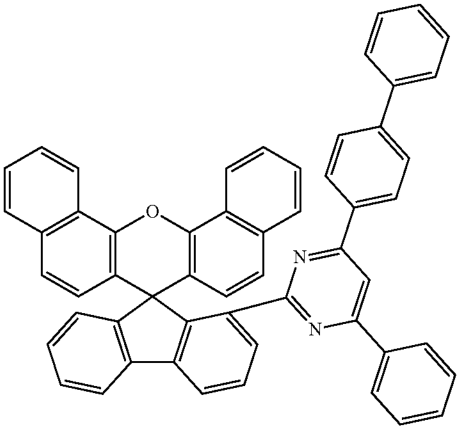

-continued
B-208
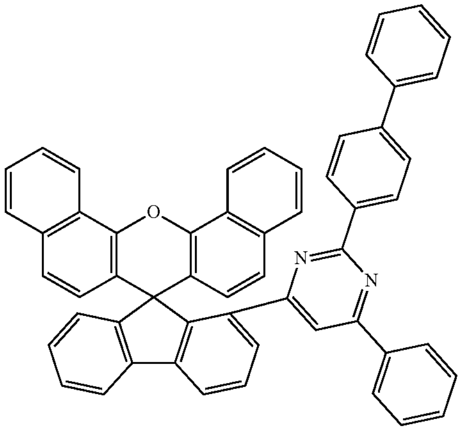
B-209
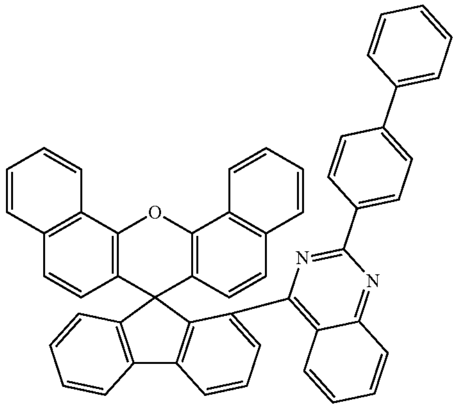
B-210
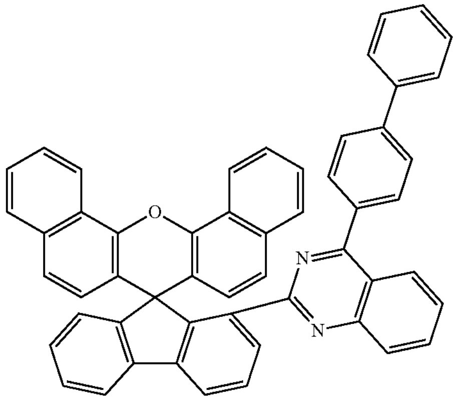
B-211
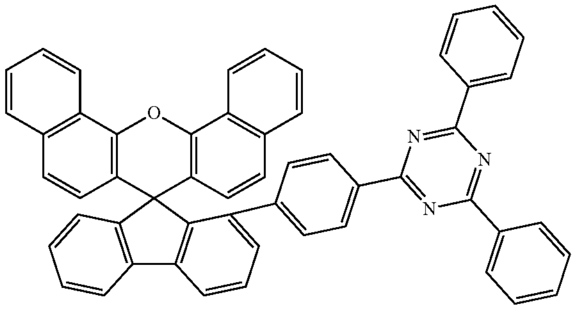
-continued
B-212
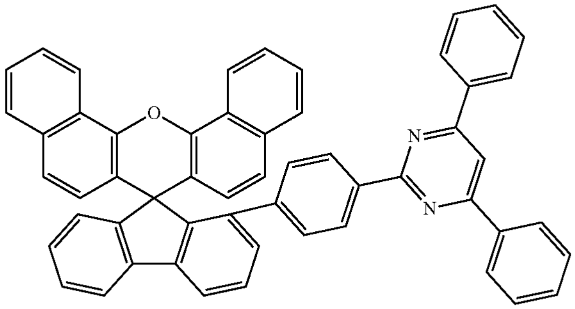
B-213
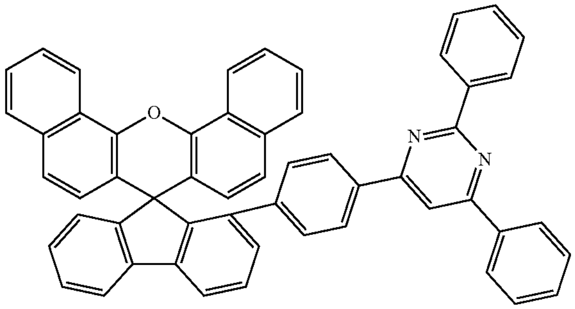
B-214
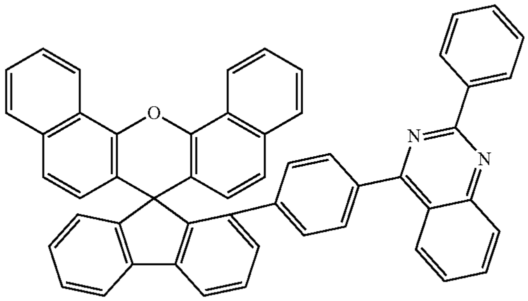
B-215
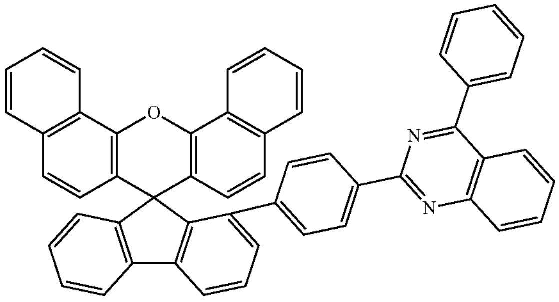

-continued
B-216
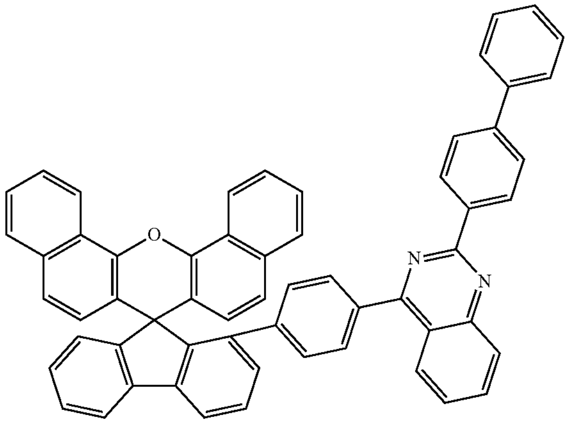
B-217
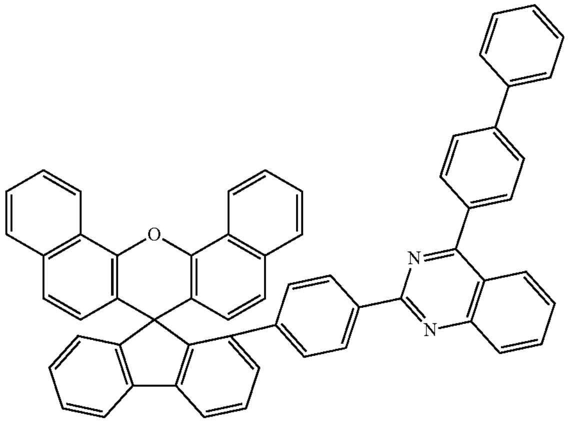
B-218
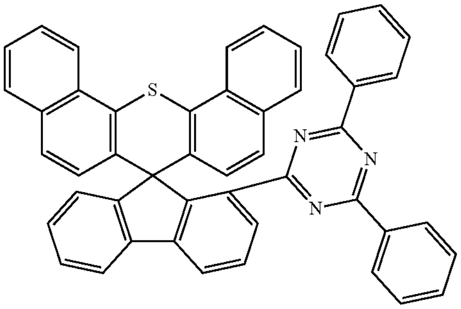
B-219
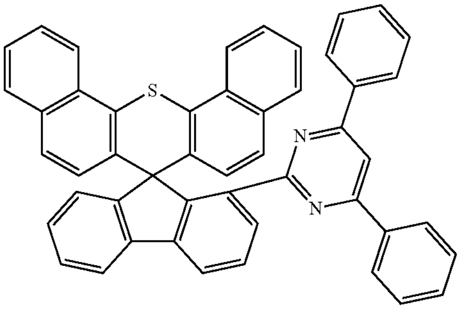
-continued
B-220
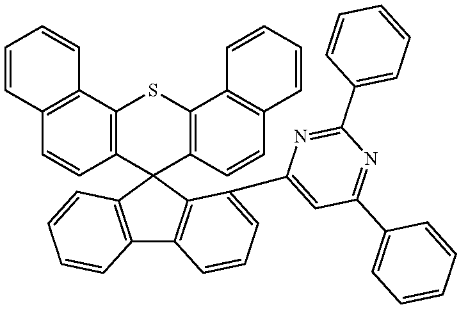
B-221
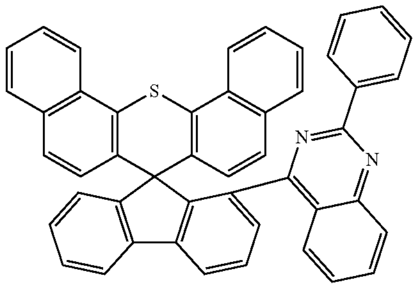
B-222
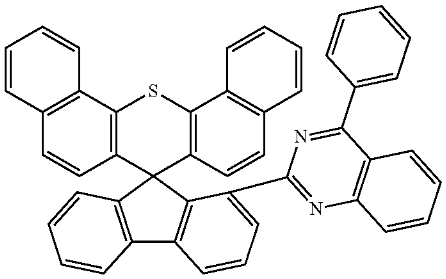
B-223
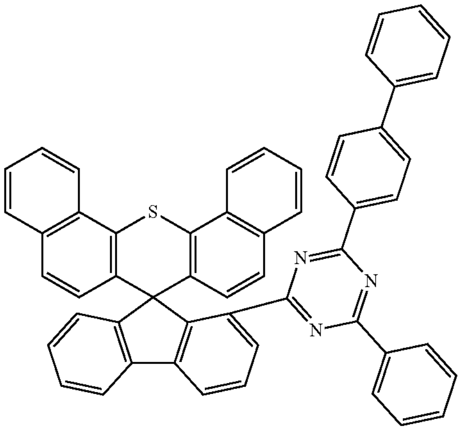

-continued
B-224
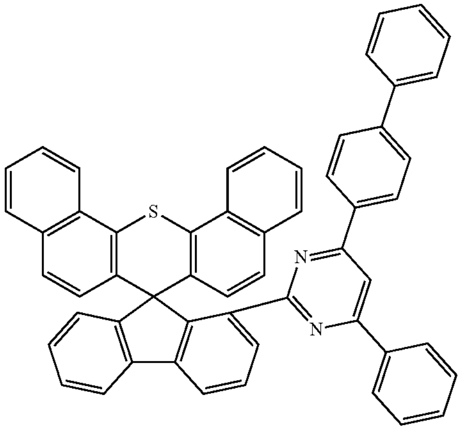
B-225
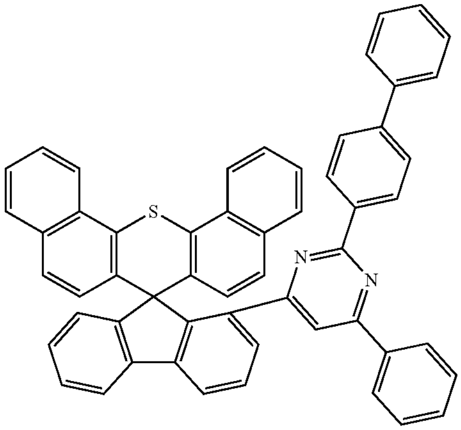
B-226
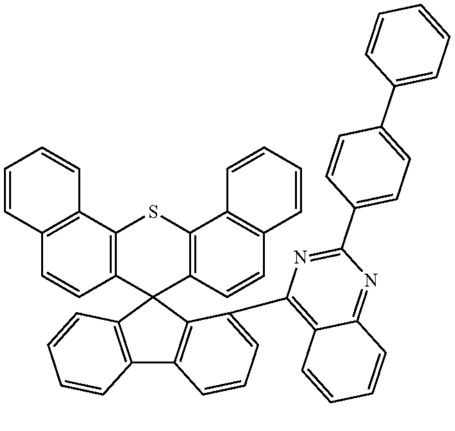
-continued
B-227
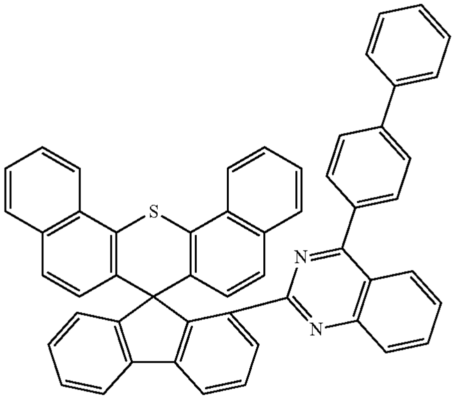
B-228
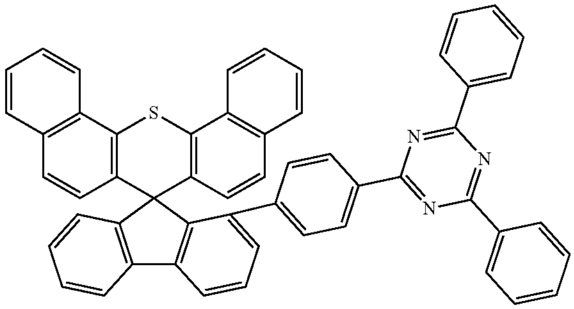
B-229
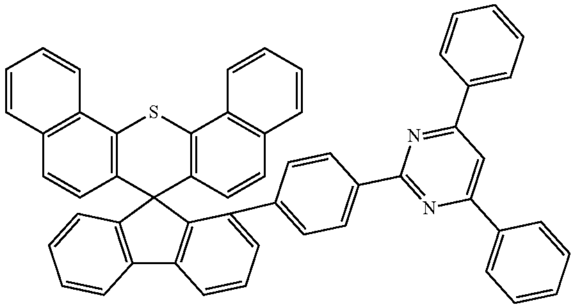
B-230
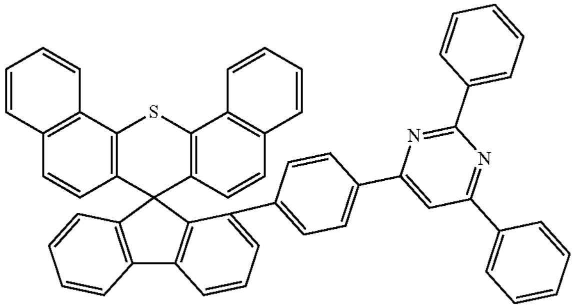

-continued
B-231
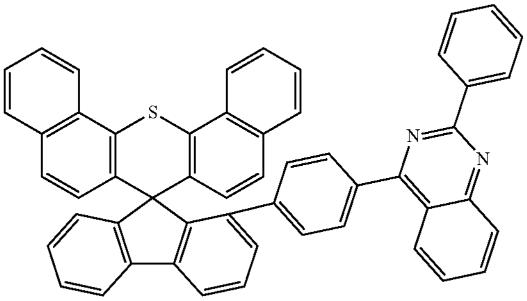
B-232
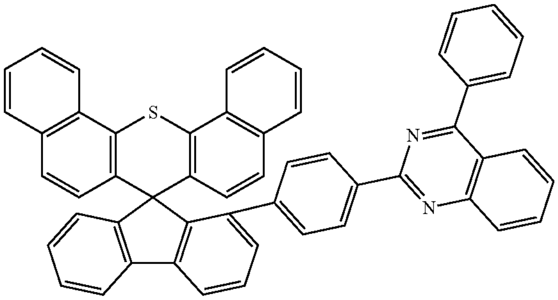
B-233
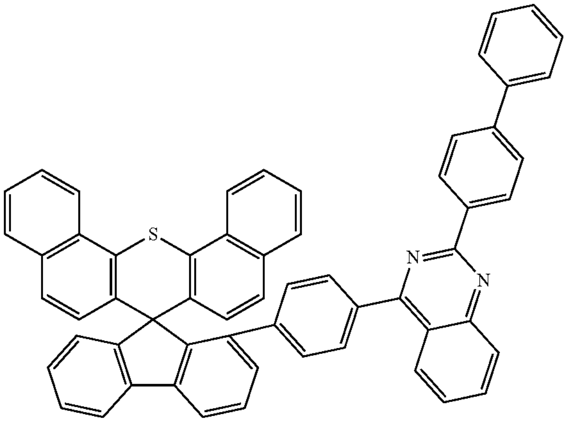
B-234
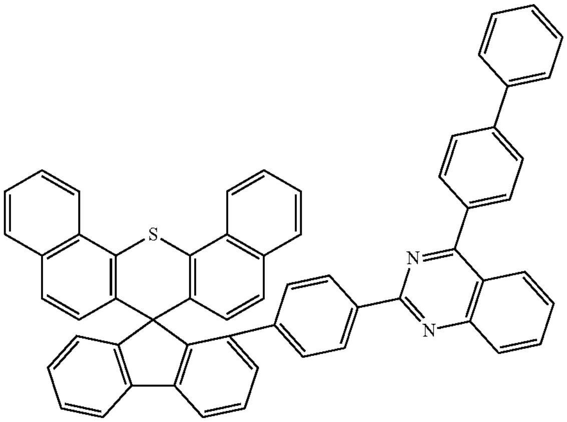
-continued
B-235
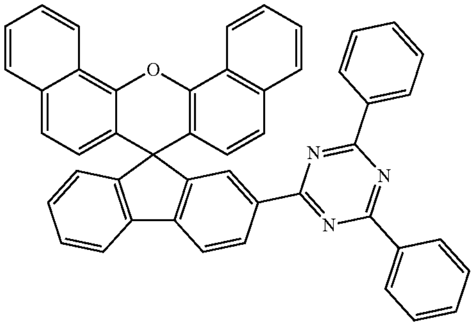
B-236
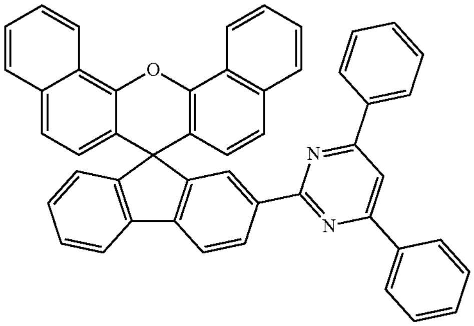
B-237
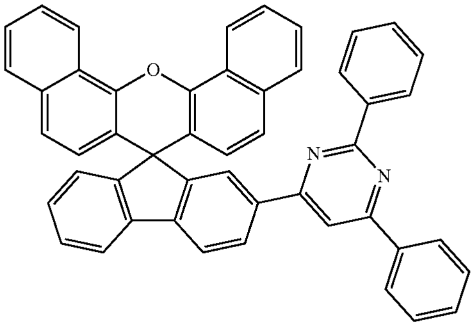
B-238
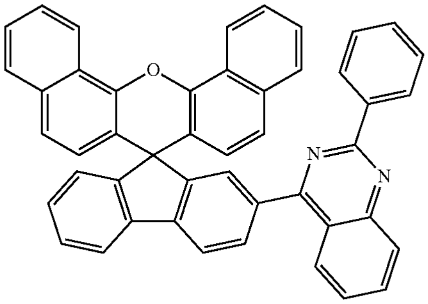
B-239
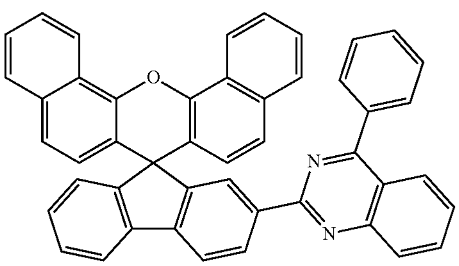

-continued
B-240
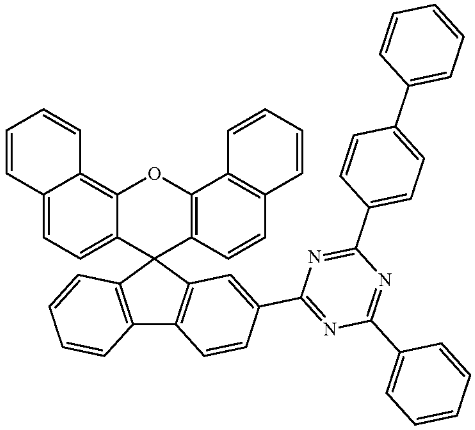
B-241
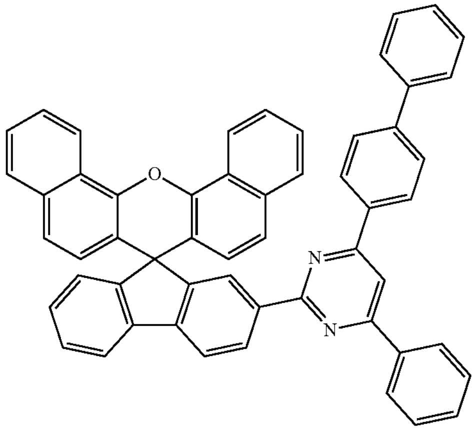
B-242
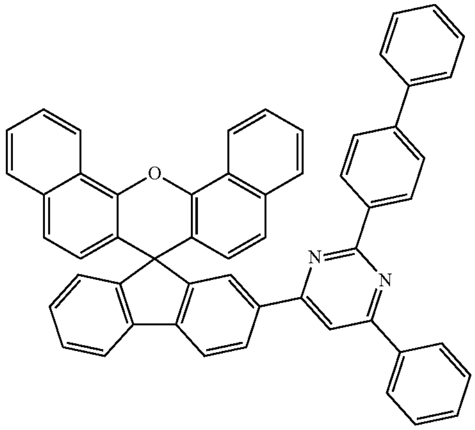
-continued
B-243
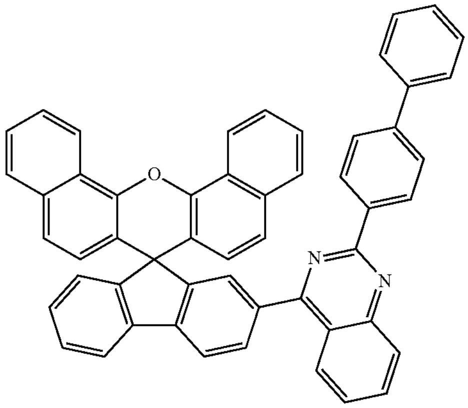
B-244
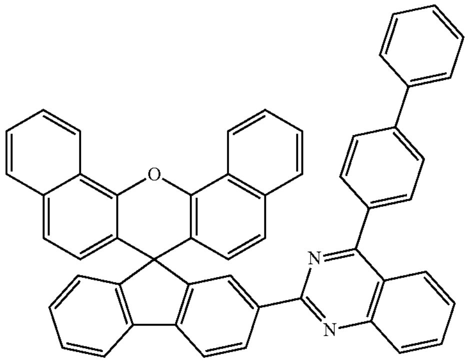
B-245
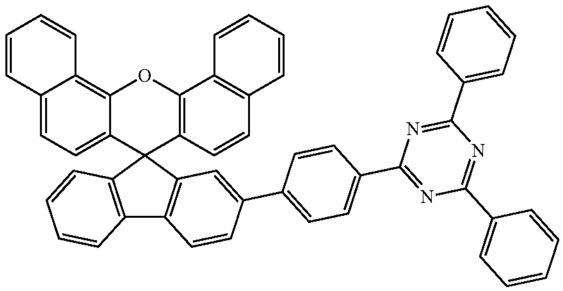
B-246
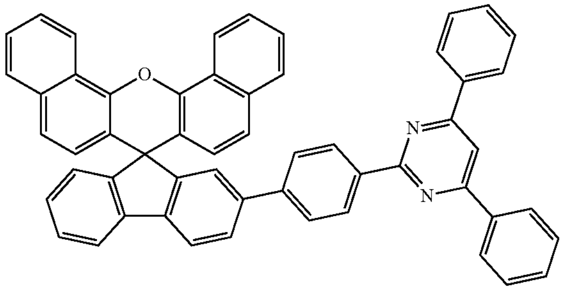

-continued
B-247
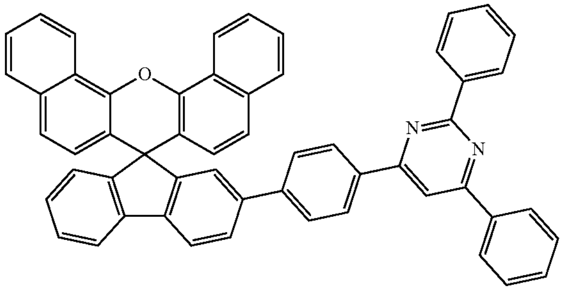
B-248
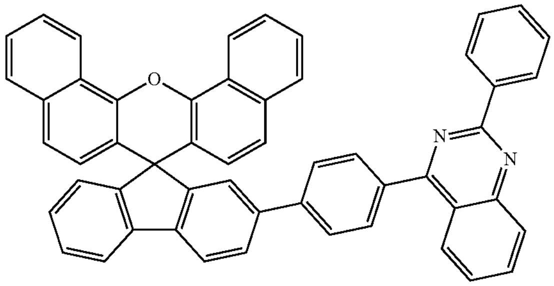
B-249
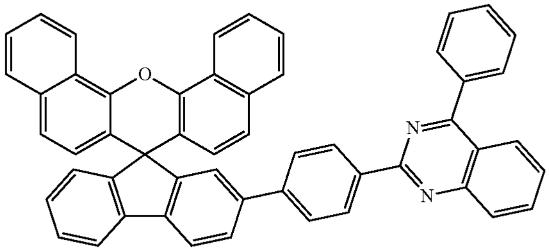
B-250
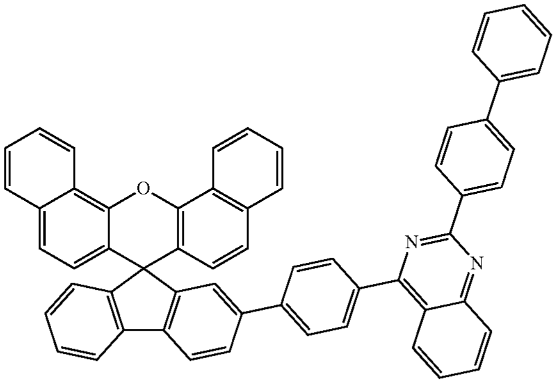
-continued
B-251
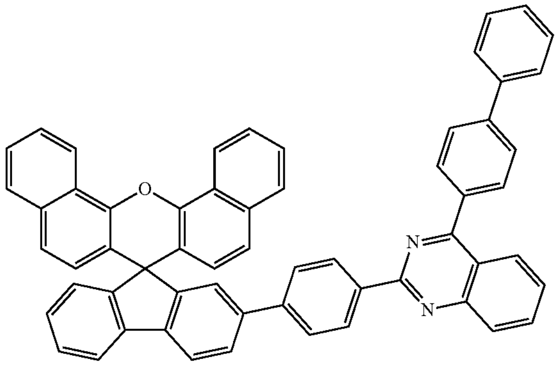
B-252
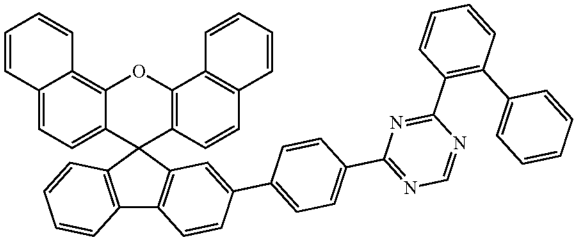
B-253
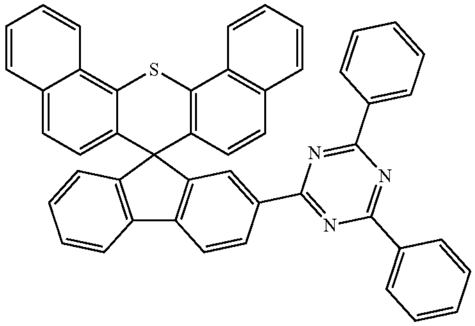
B-254
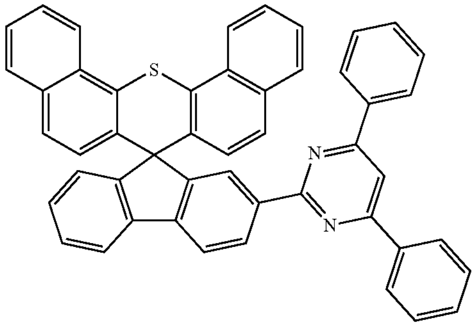
B-255
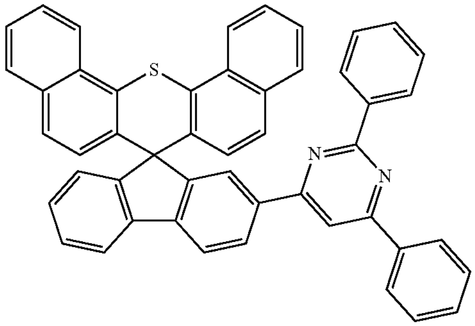

-continued
B-256
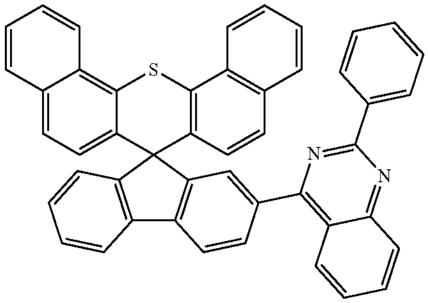
B-257
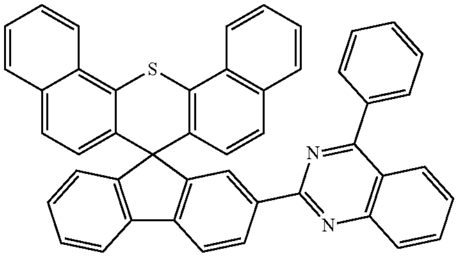
B-258
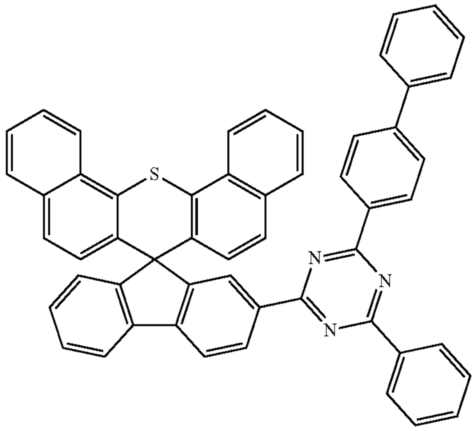
B-259
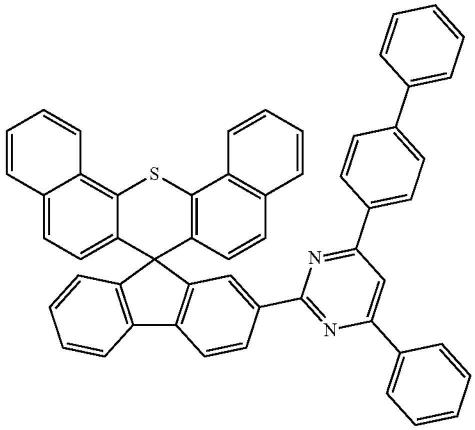
-continued
B-260
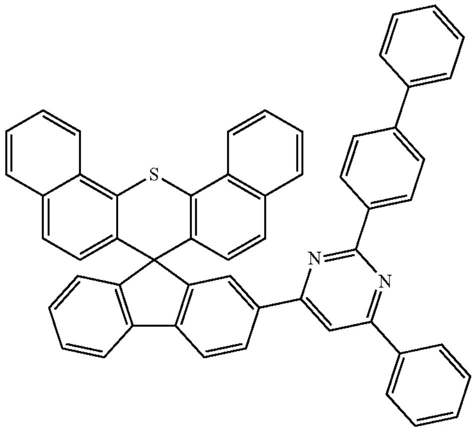
B-261
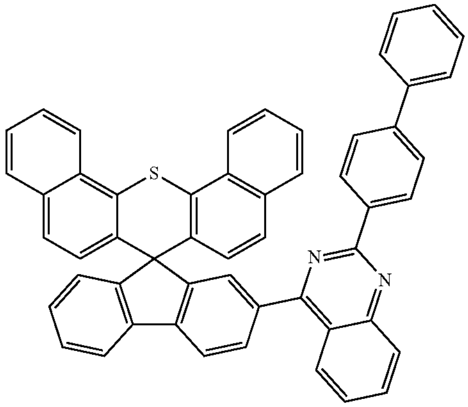
B-262
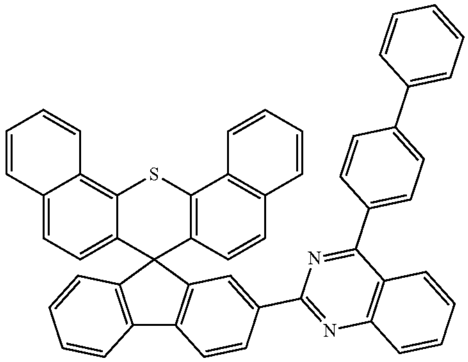
B-263
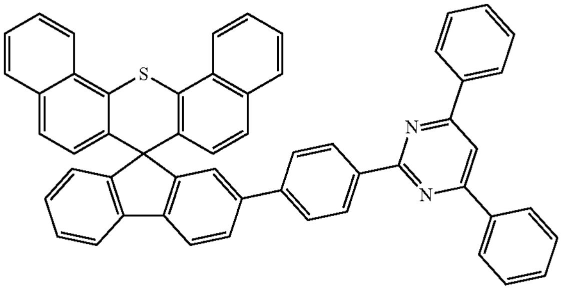

-continued
B-264
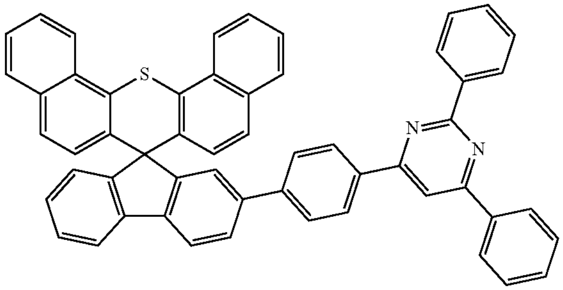
B-265
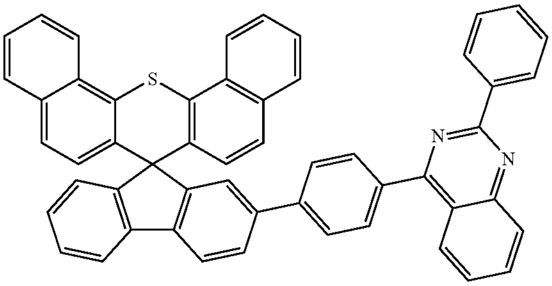
B-266
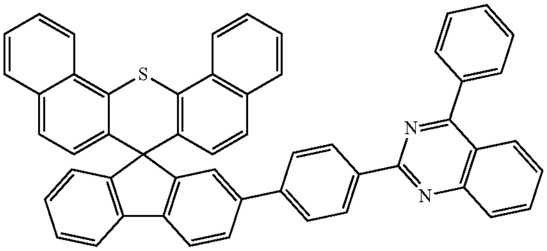
B-267
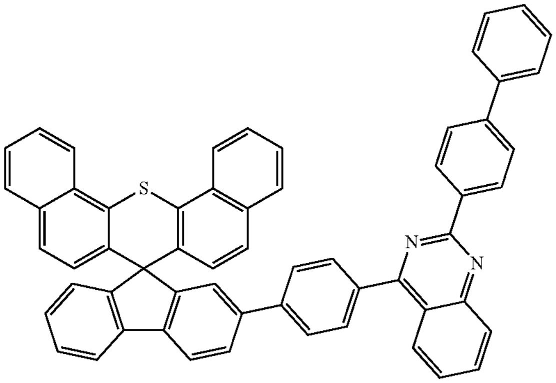
-continued
B-268
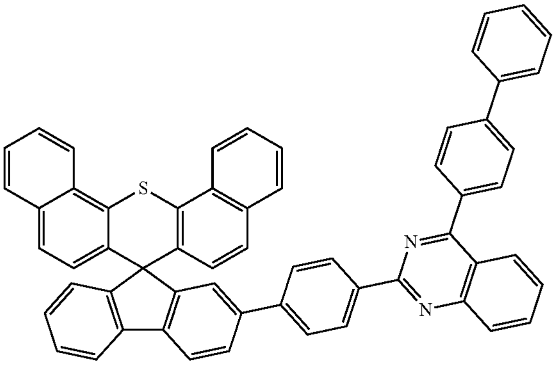
B-269
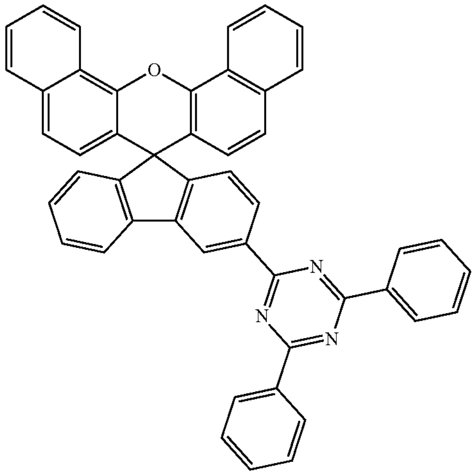
B-270
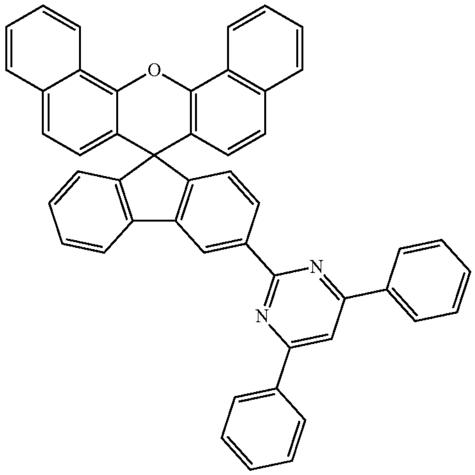

B-271
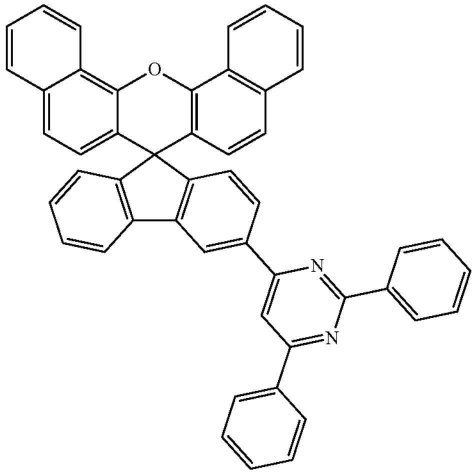
B-272
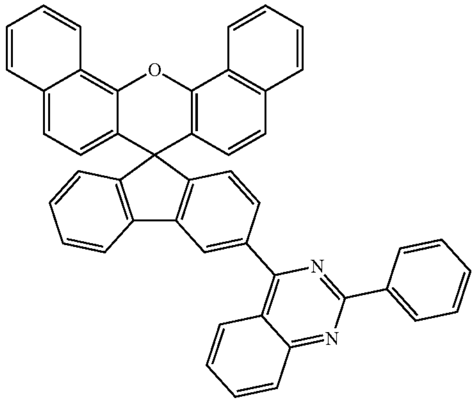
B-273
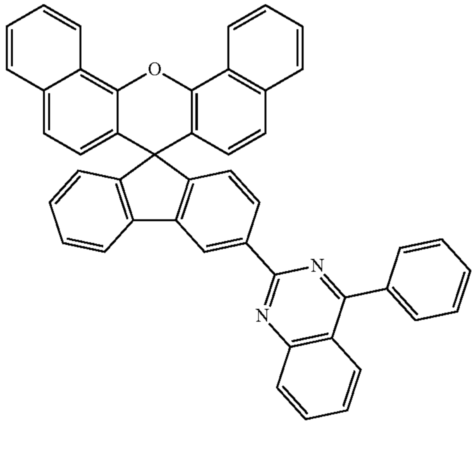
B-274
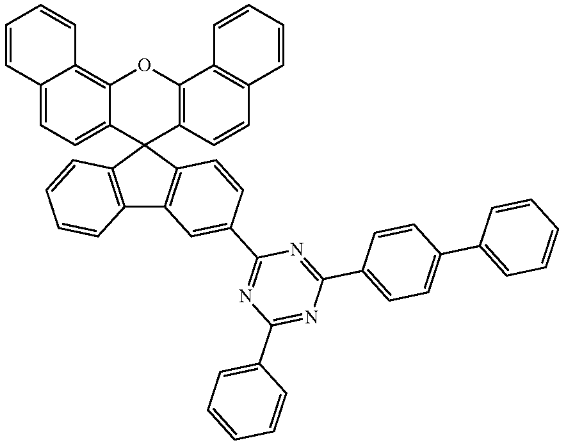
B-275
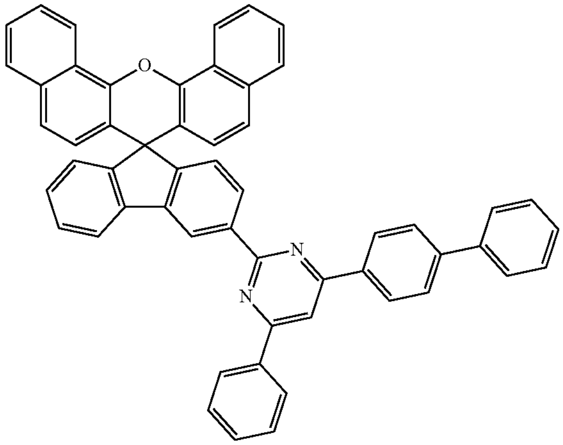
B-276
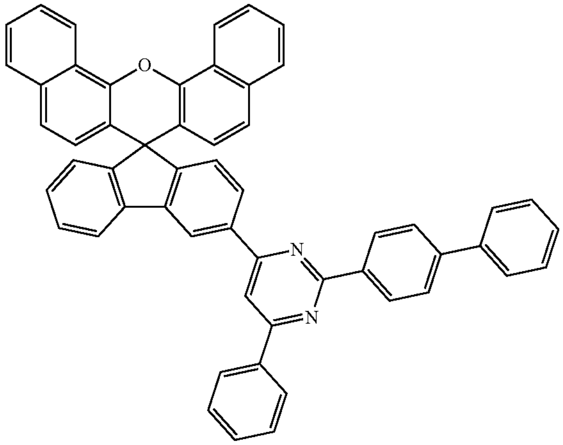

-continued
B-277
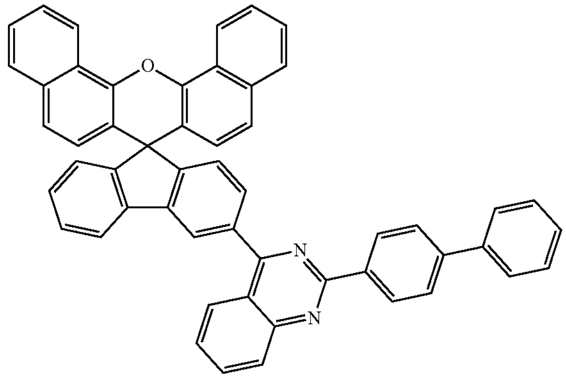
B-278
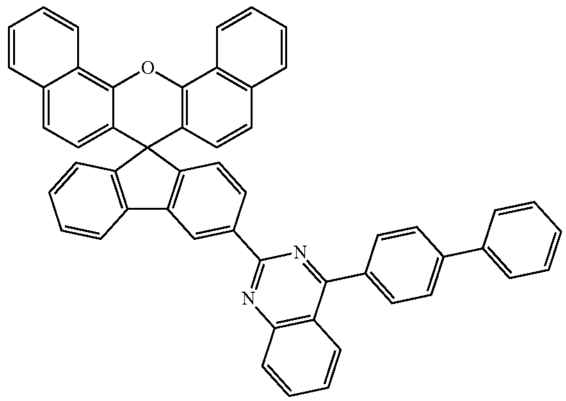
B-279
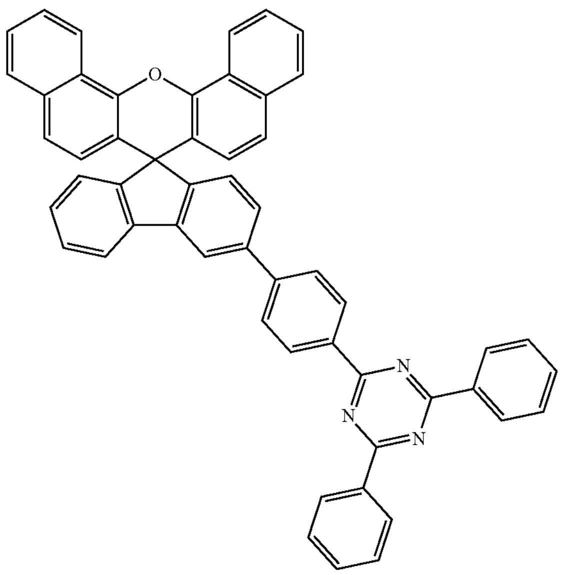
-continued
B-280
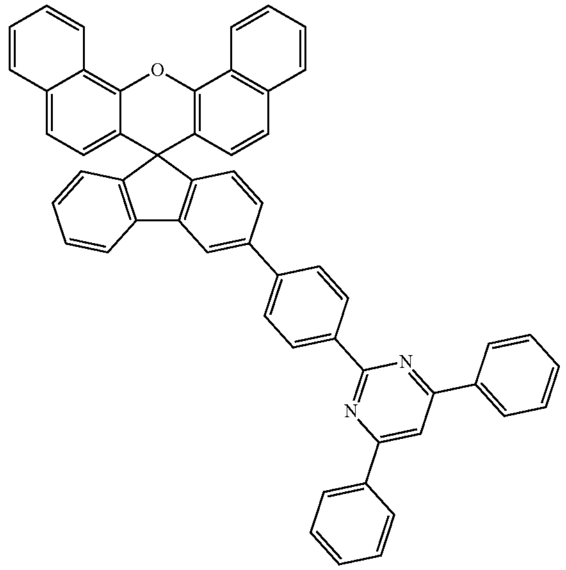
B-281
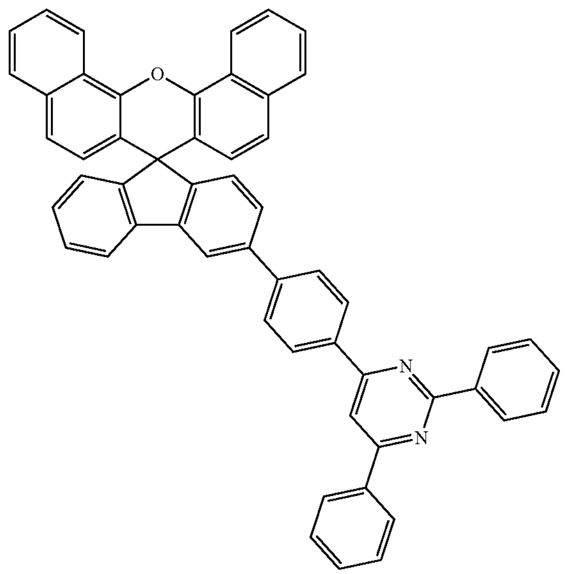

-continued
B-282
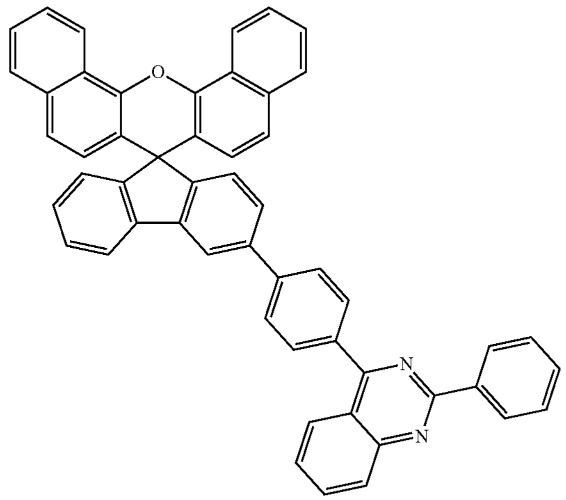
B-283
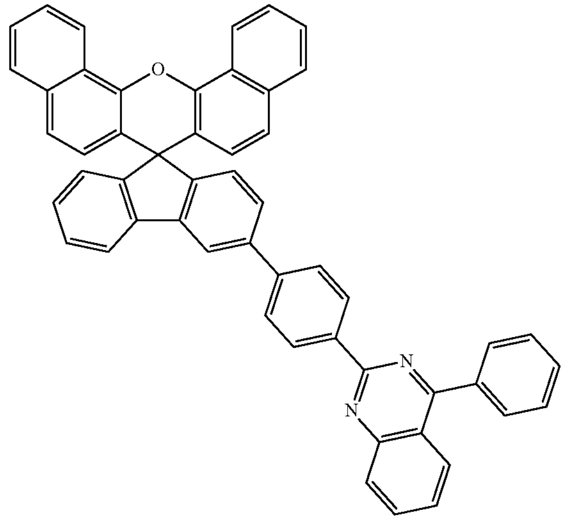
B-284
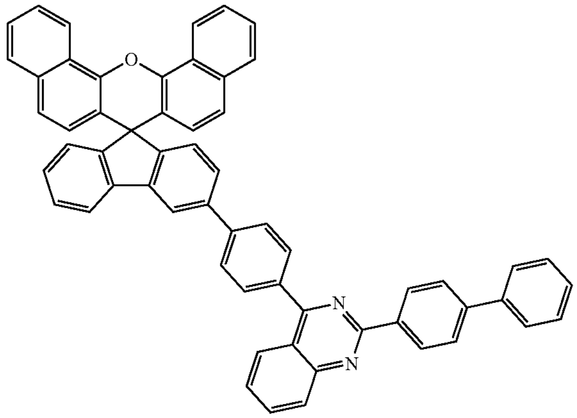
-continued
B-285
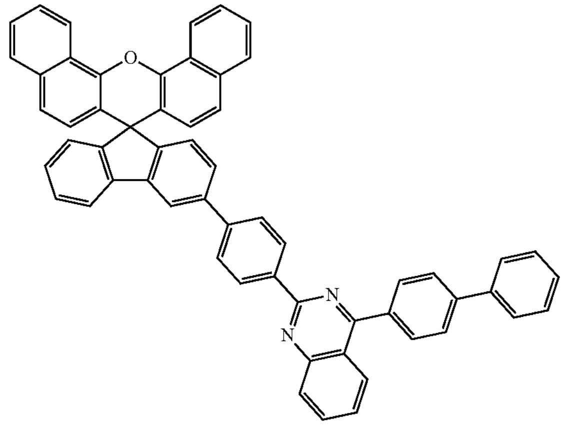
B-286
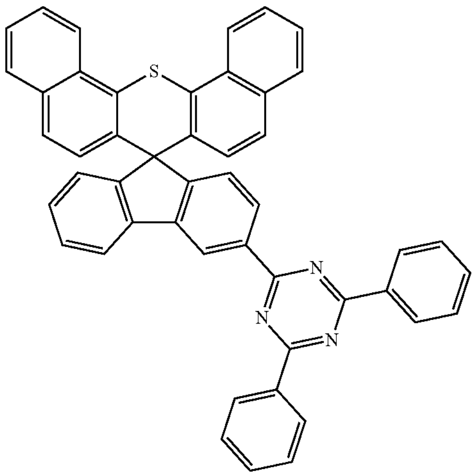
B-287
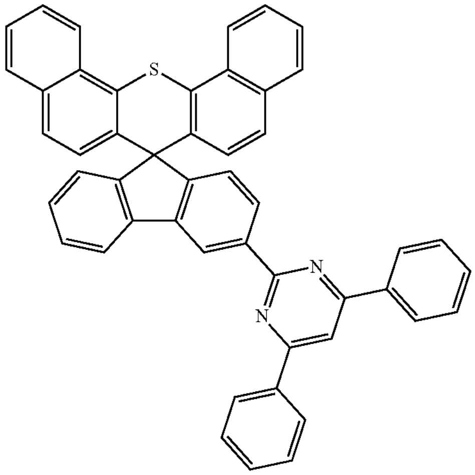

-continued
B-288
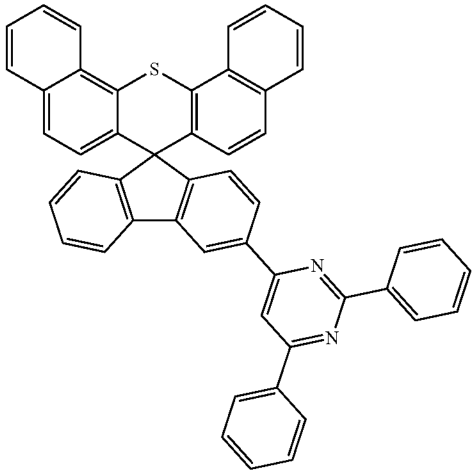
B-289
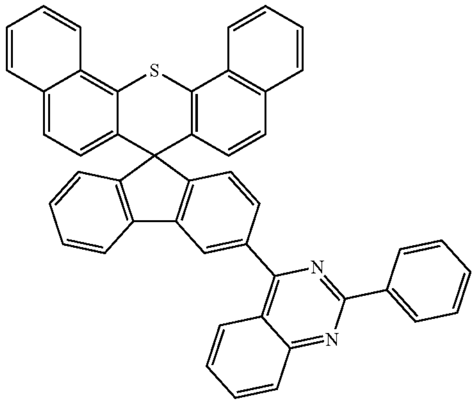
B-290
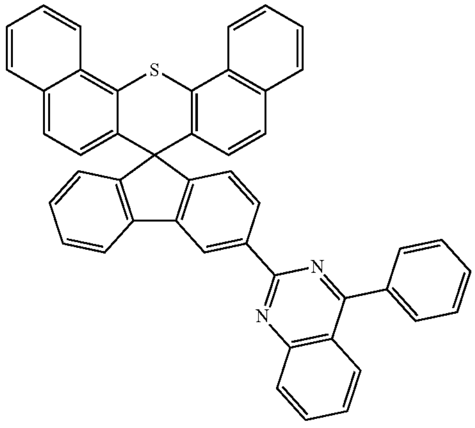
-continued
B-291
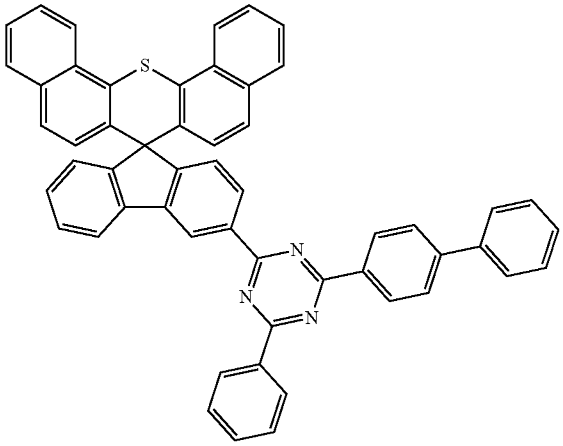
B-292
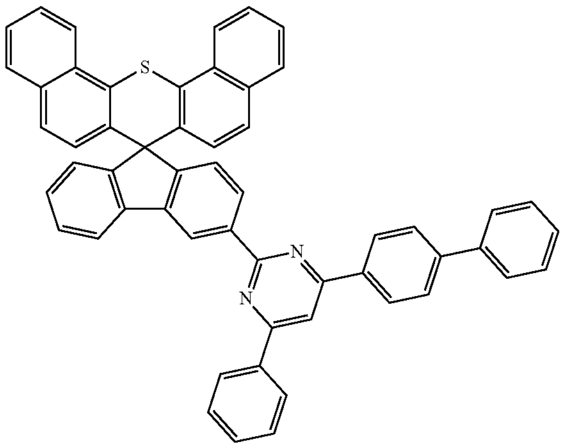
B-293
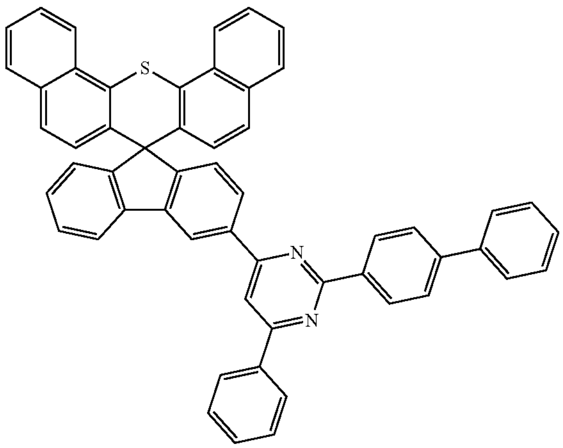

-continued
B-294
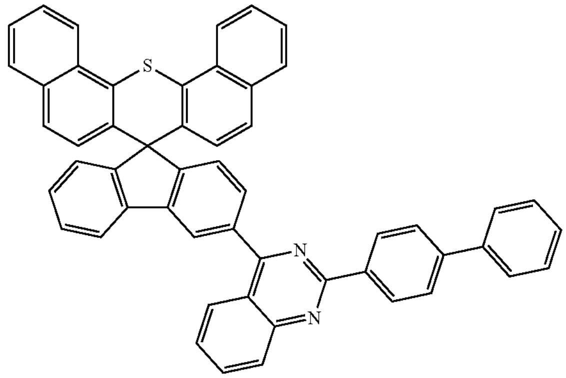
B-295
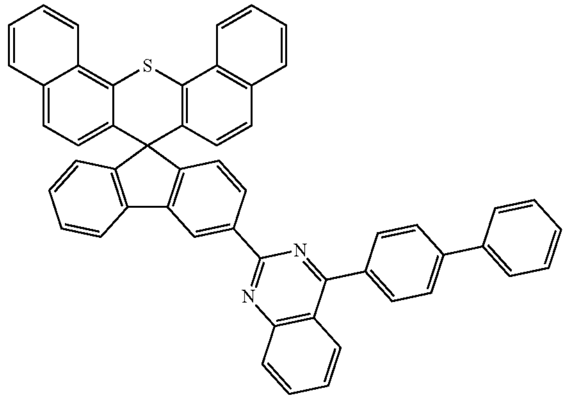
B-296
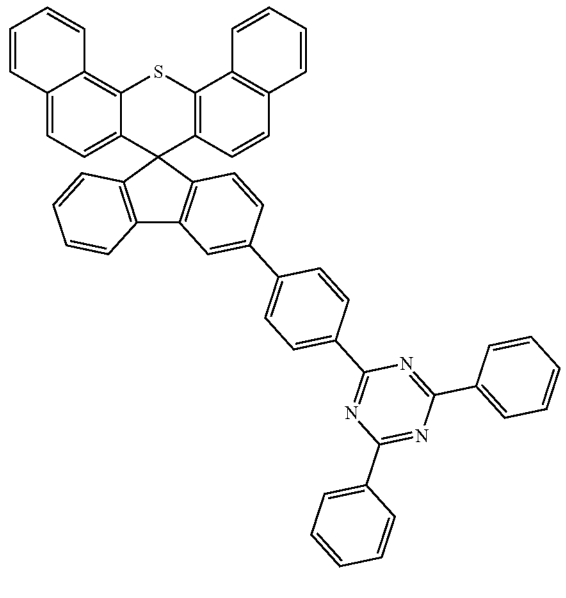
-continued
B-297
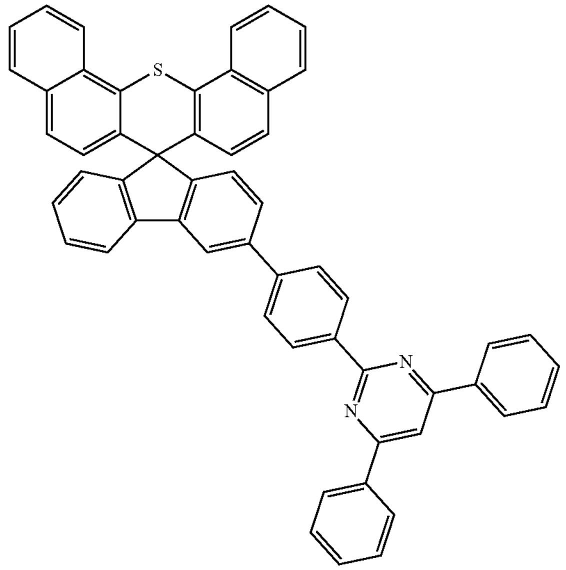
B-298
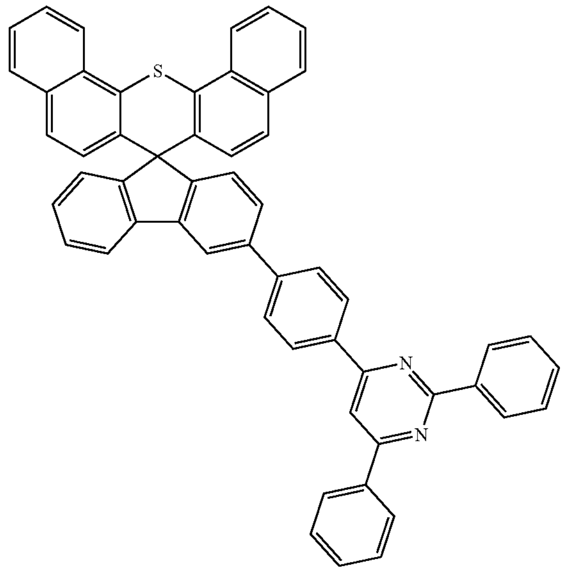

-continued
B-299
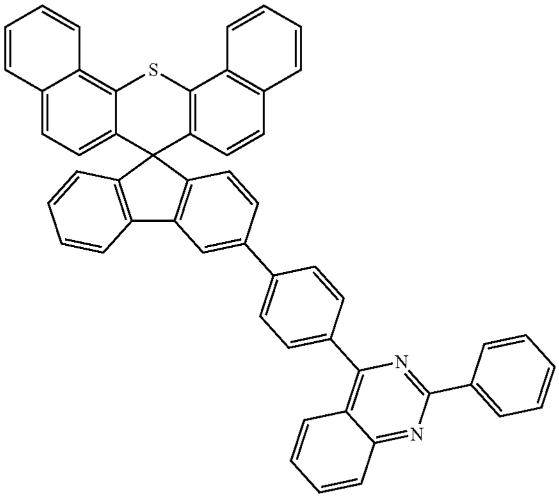
B-300
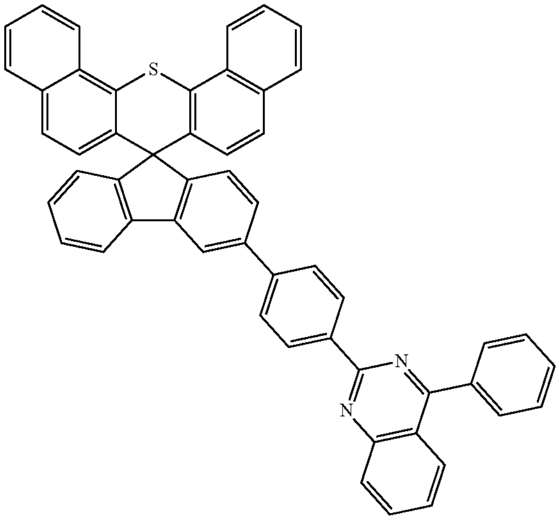
B-301
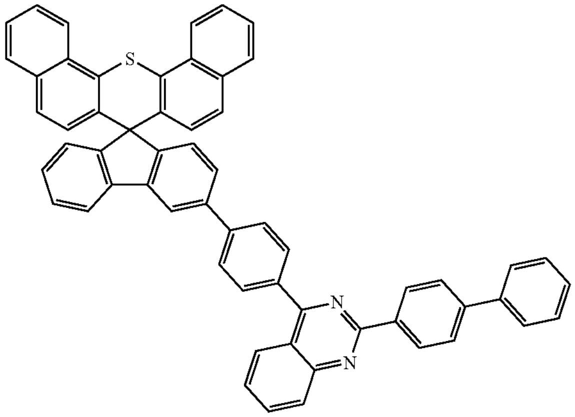
-continued
B-302
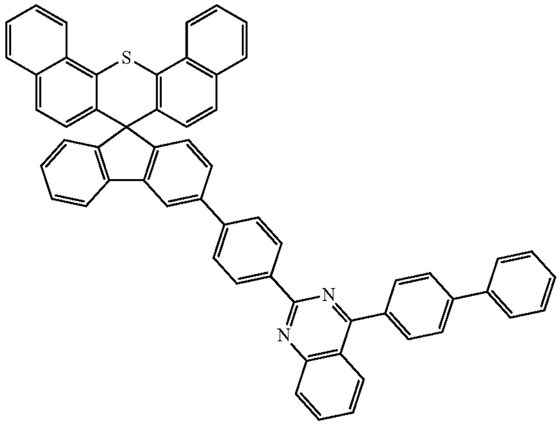
B-303
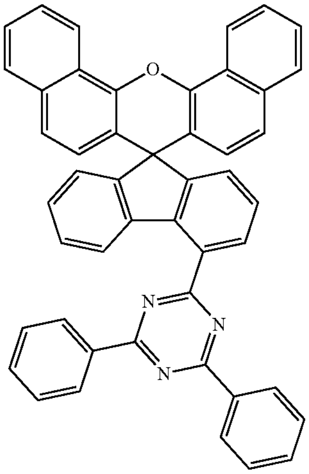
B-304
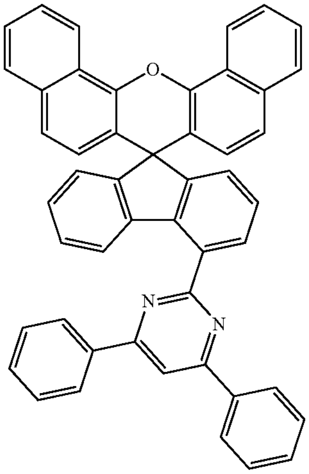

-continued
B-305
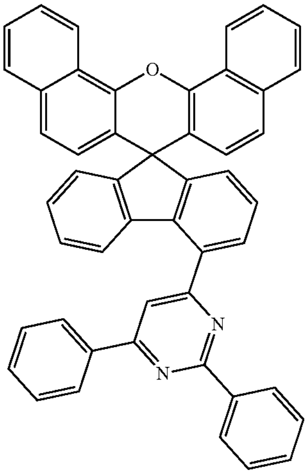
B-306
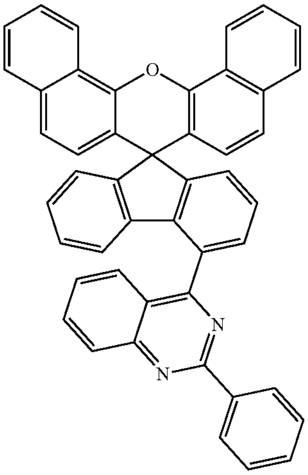
B-307
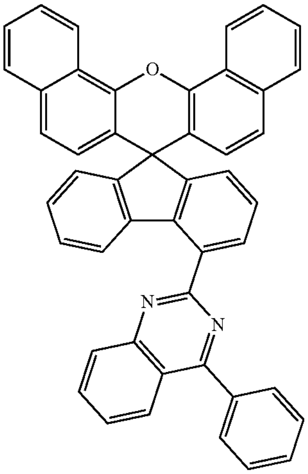
-continued
B-308
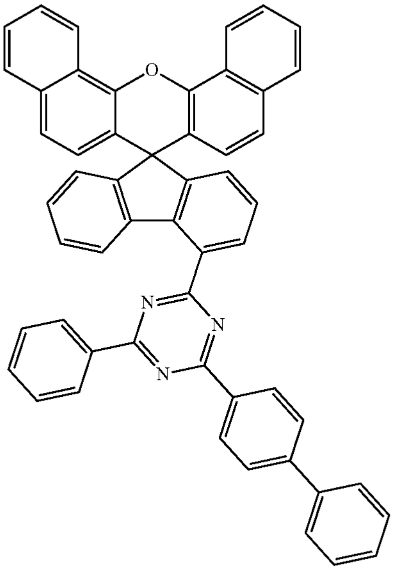
B-309
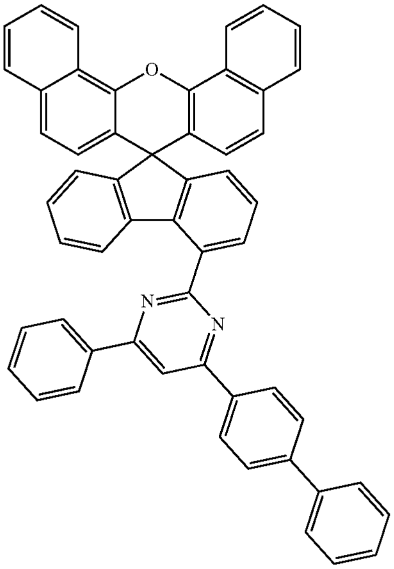

-continued
B-310
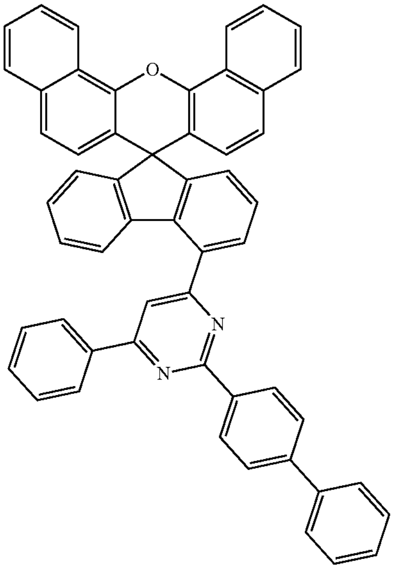
B-311
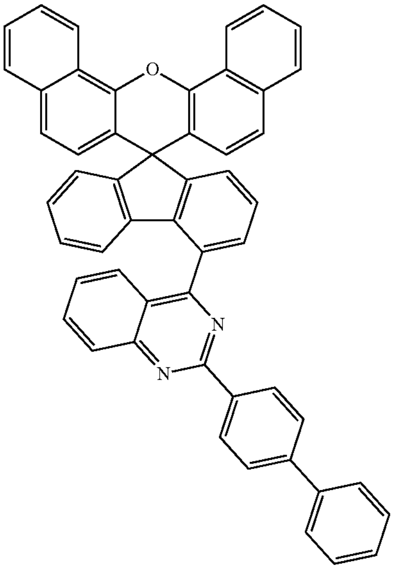
-continued
B-312
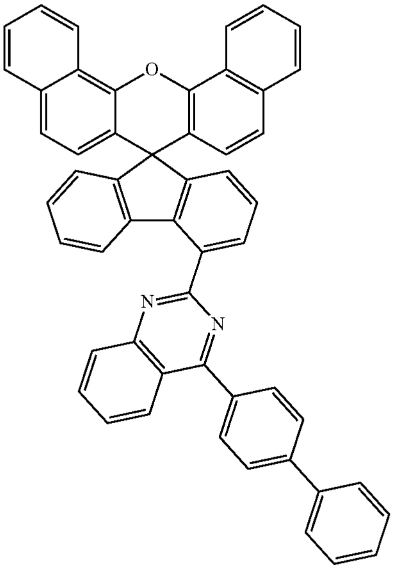
B-313
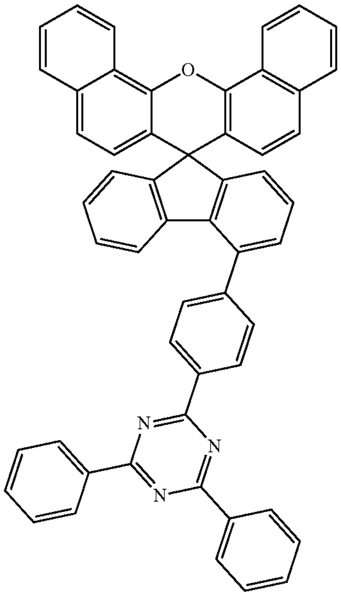

-continued
B-314
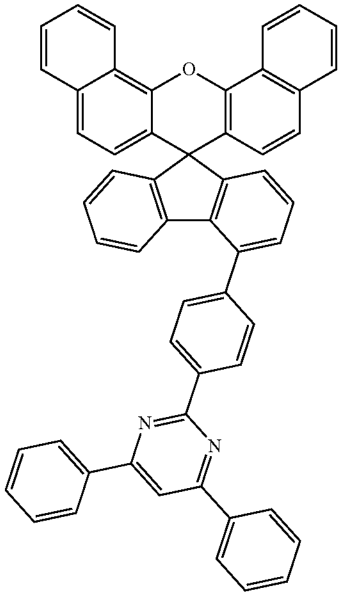
B-315
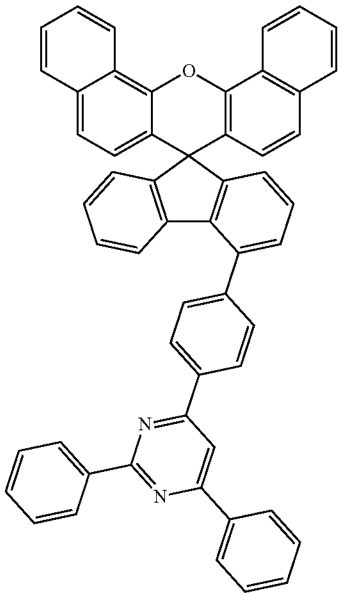
-continued
B-316
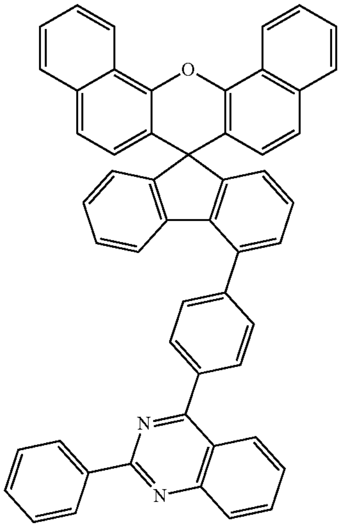
B-317
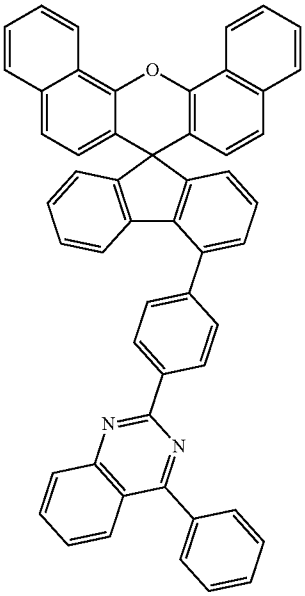

-continued
B-318
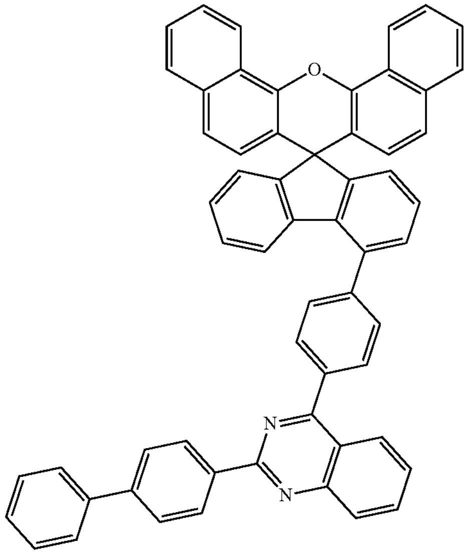
B-319
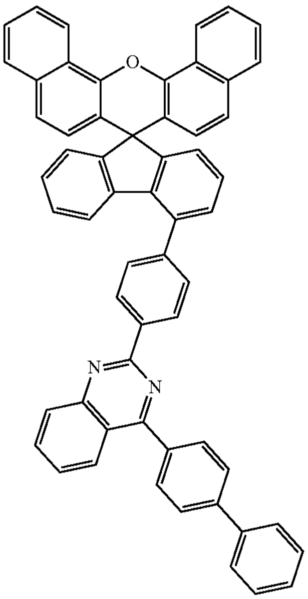
B-320
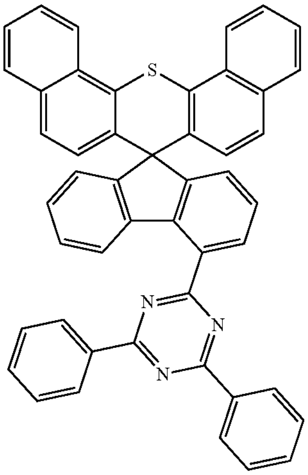
-continued
B-321
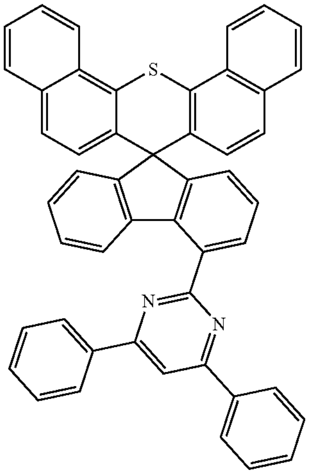
B-322
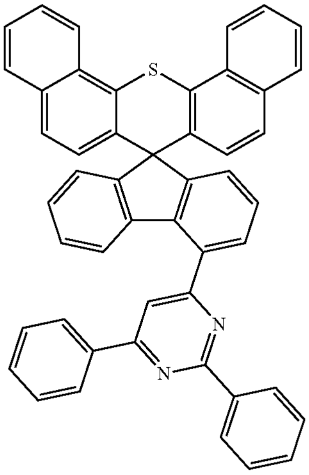
B-323
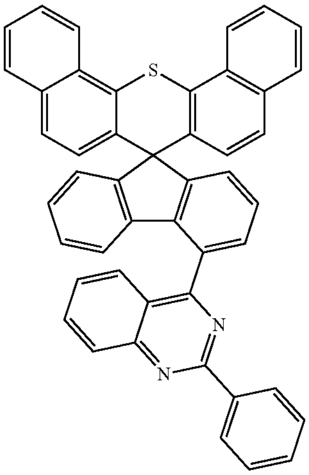

-continued
B-324
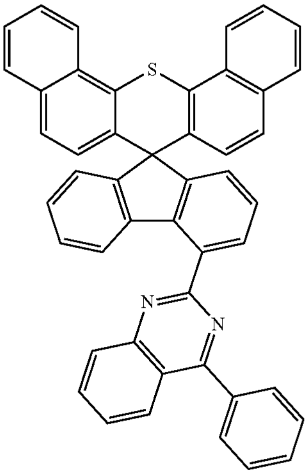
B-325
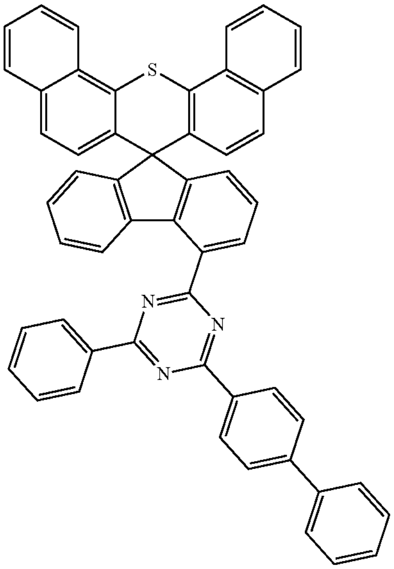
B-326
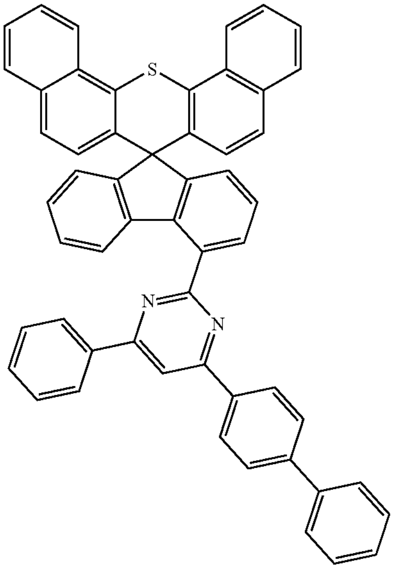
-continued
B-327
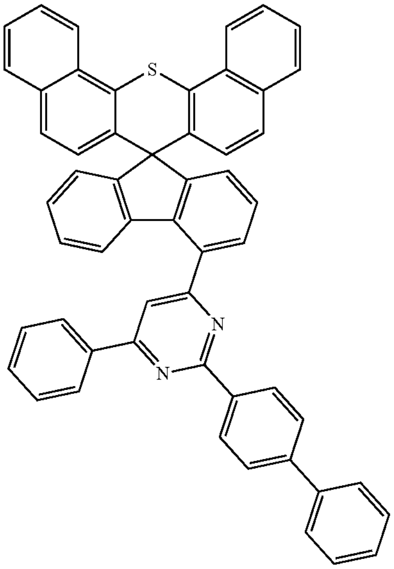
B-328
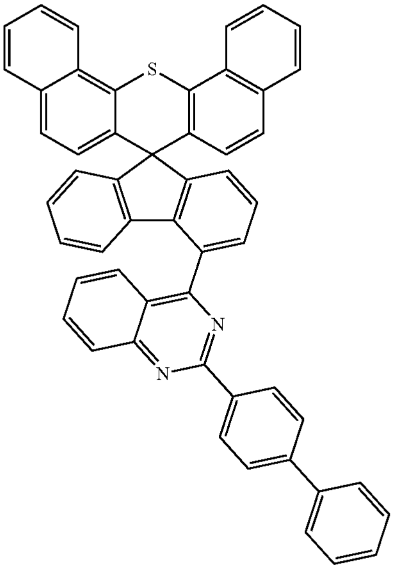

-continued
B-329
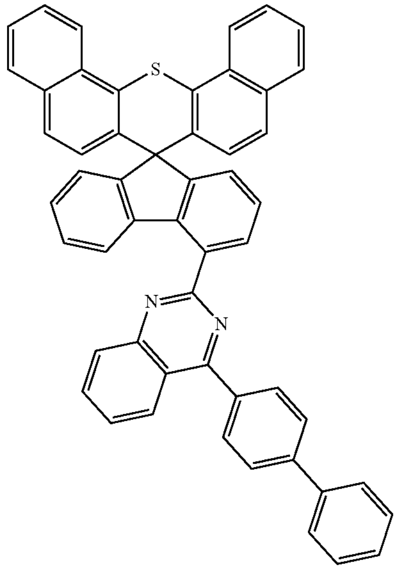
B-330
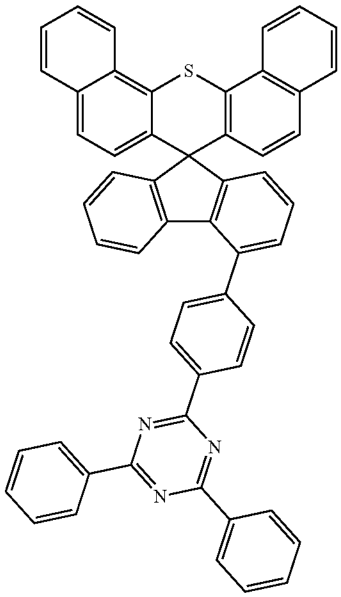
-continued
B-331
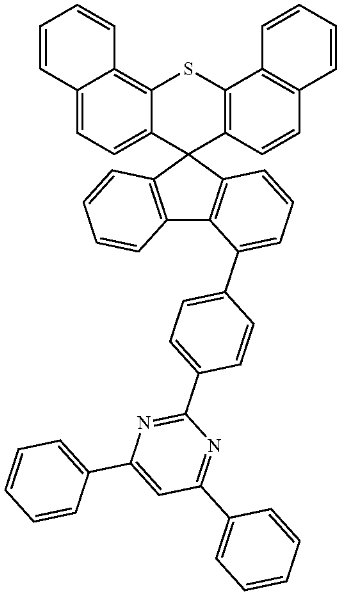
B-332
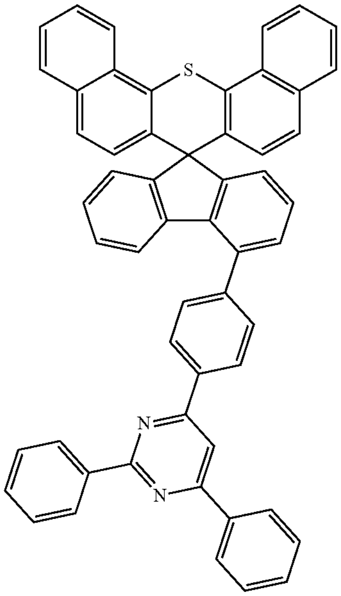

-continued
B-333
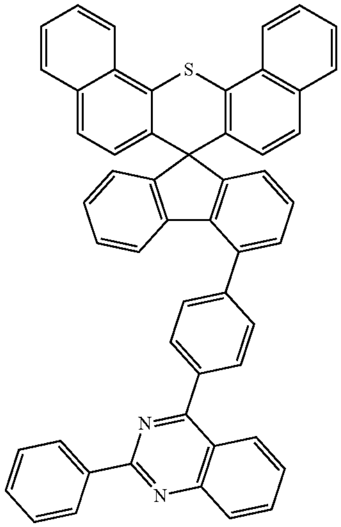
B-334
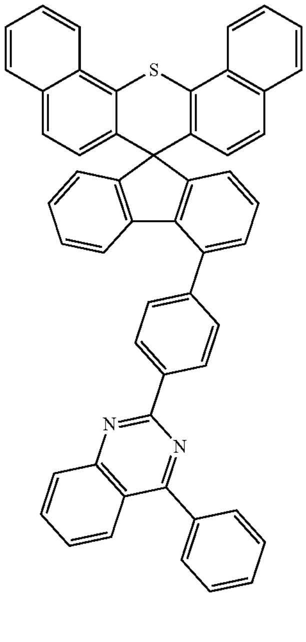
-continued
B-335
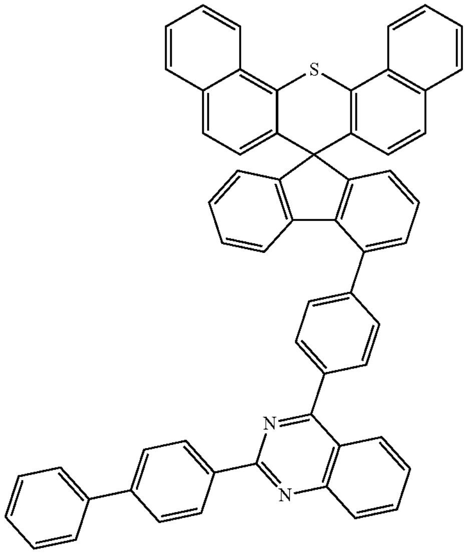
B-336
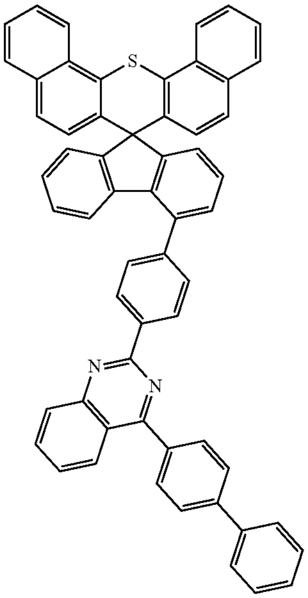
B-337
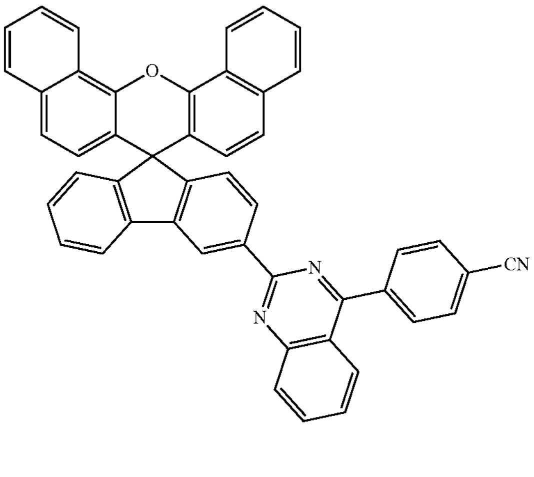

-continued
B-338
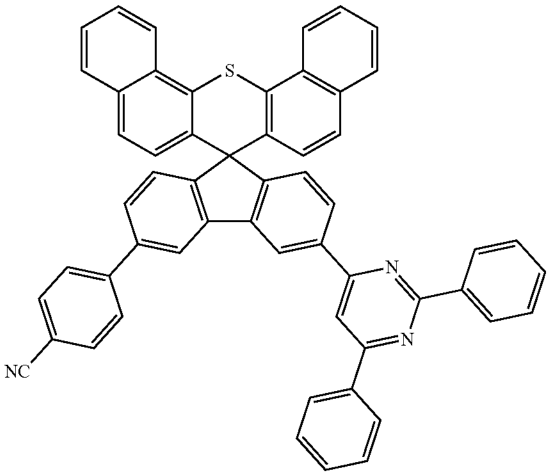
B-339
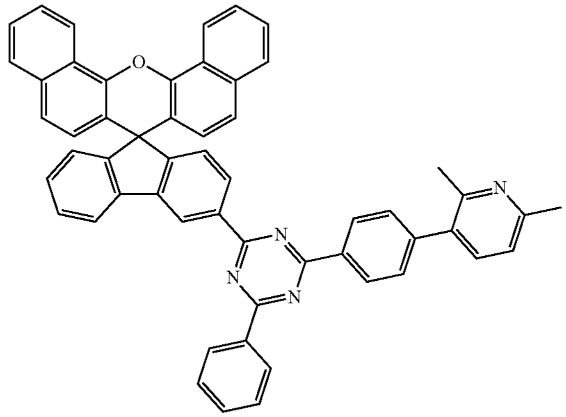
B-340
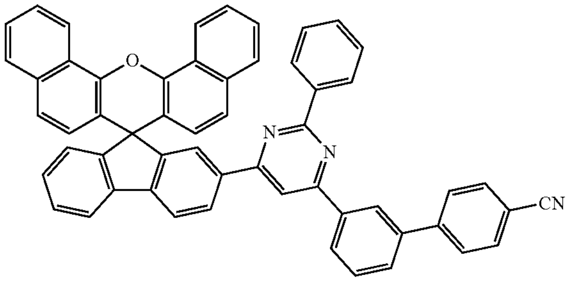
B-341
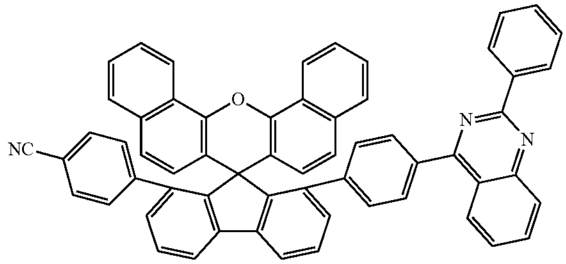
-continued
B-342
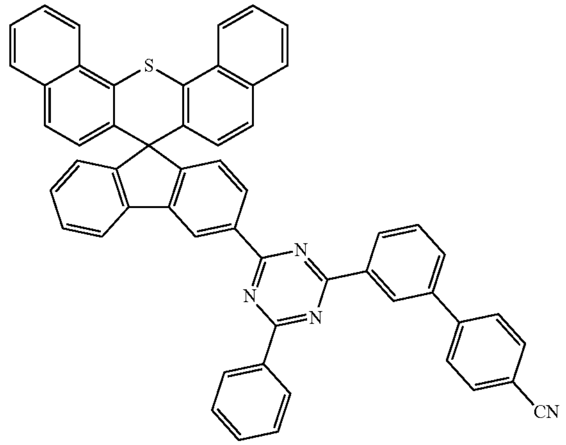
B-343
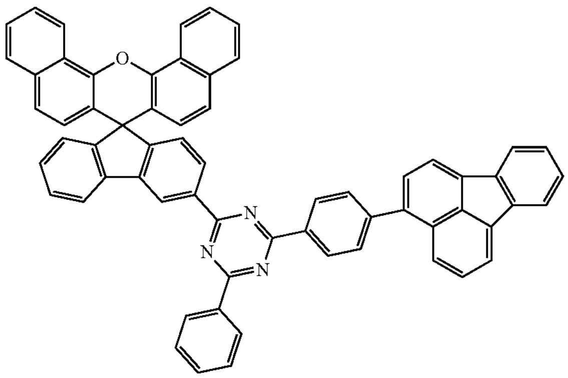
B-344
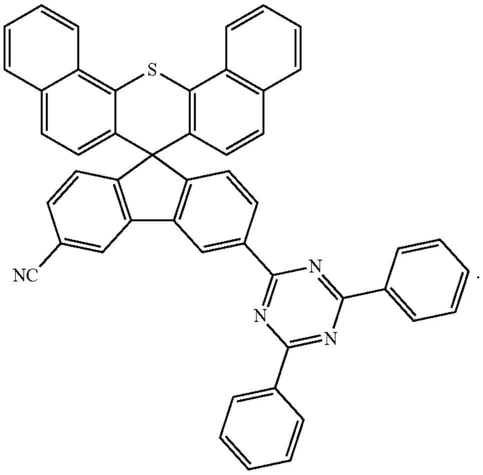
.

7. The organic light-emitting device according to claim 1, wherein the compound of [Formula C] is any one selected from the following compounds [C-1] to [C-60]:
C-1
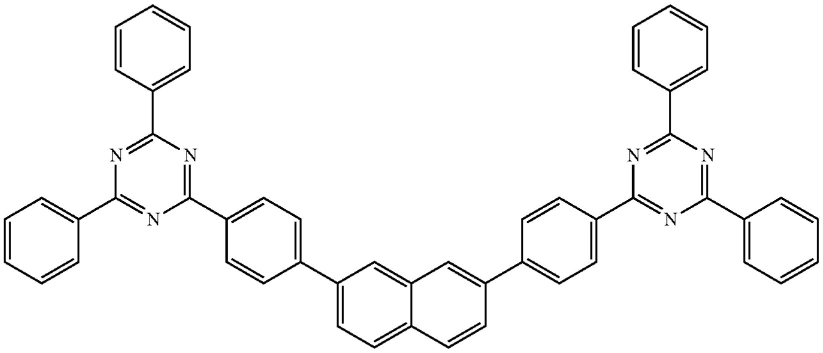
C-2
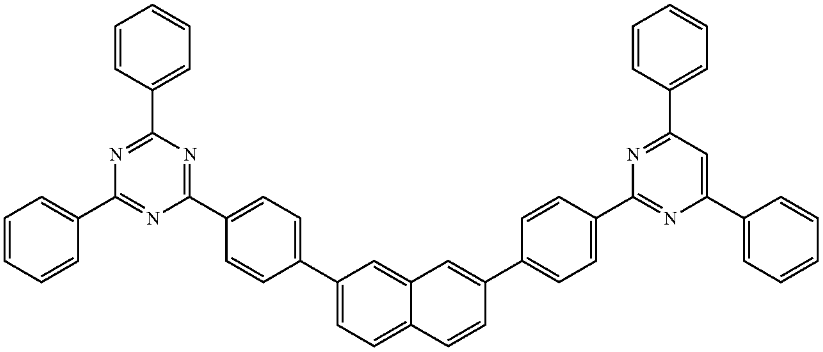
C-3
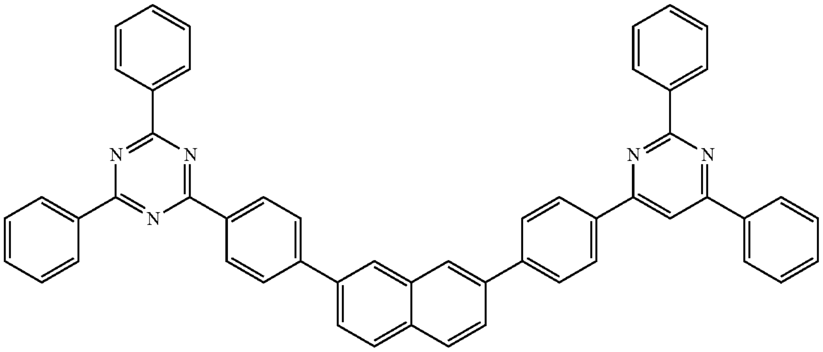
C-4
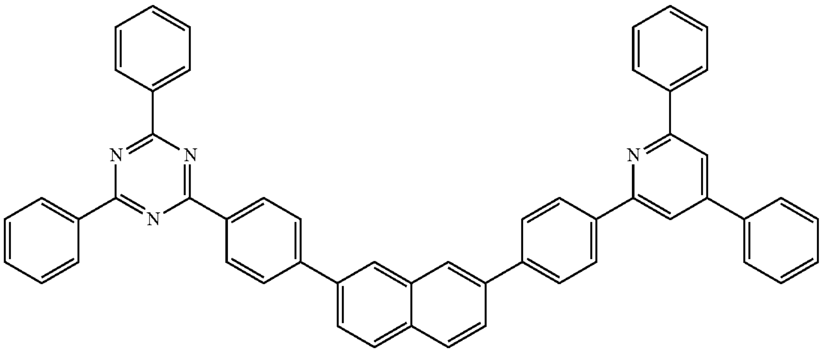

-continued
C-5
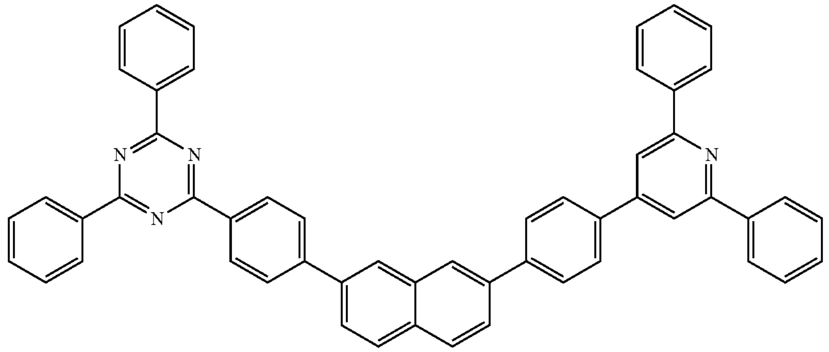
C-6
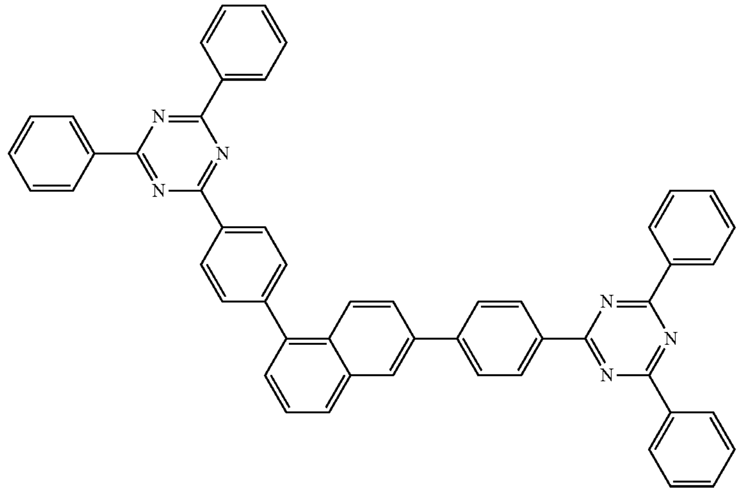
C-7
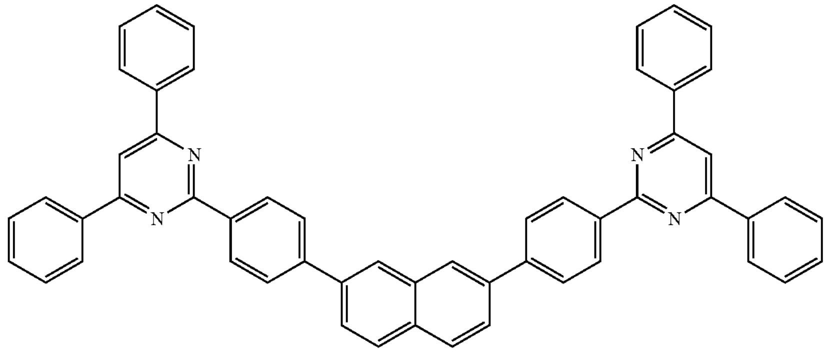
C-8
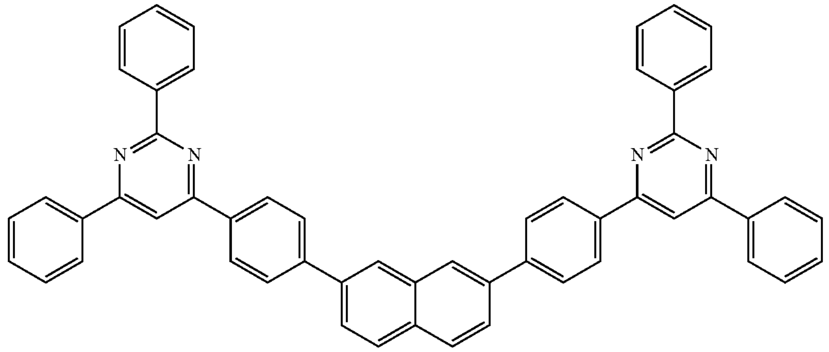

-continued
C-9
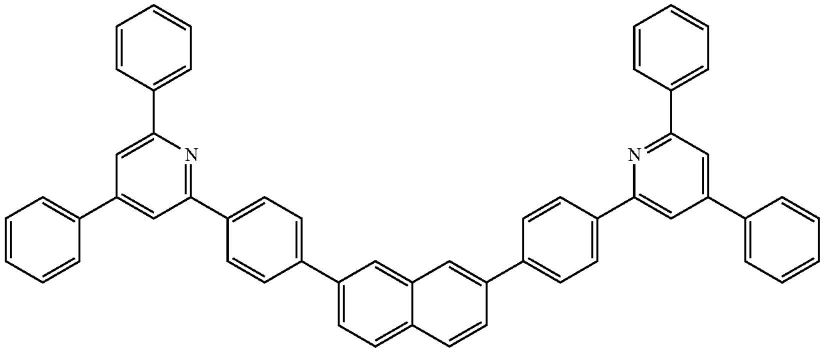
C-10
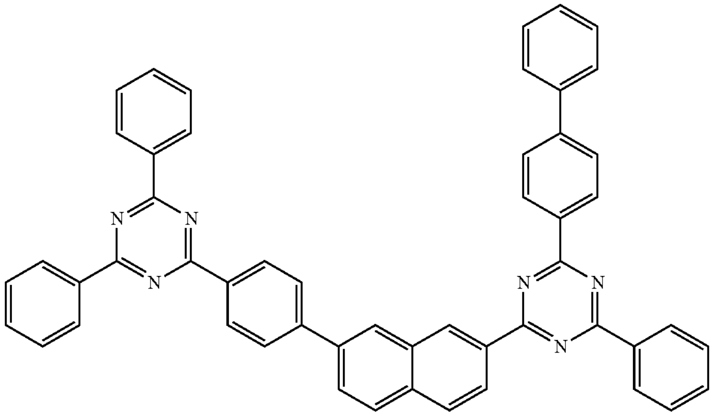
C-11
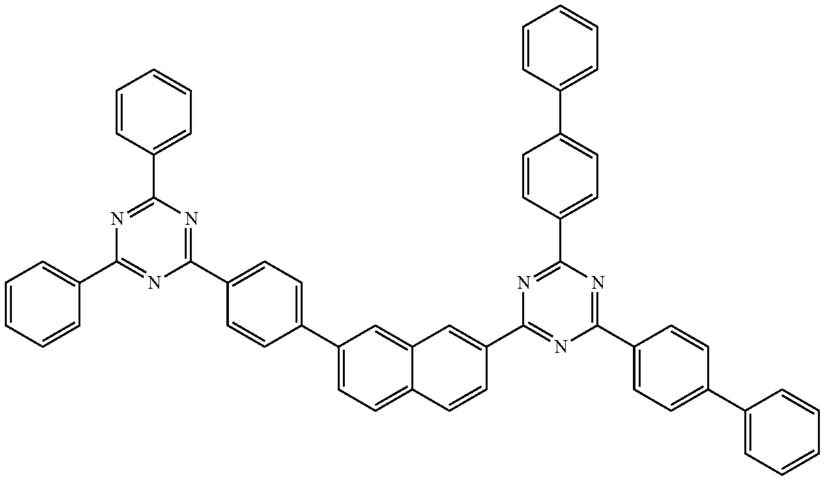
C-12
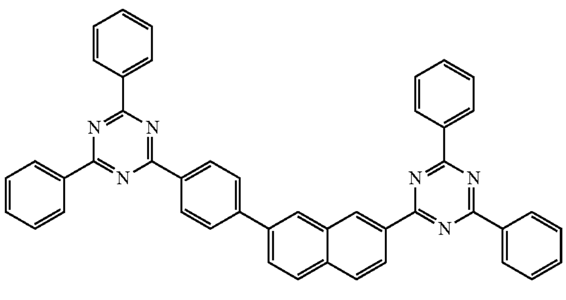
C-13
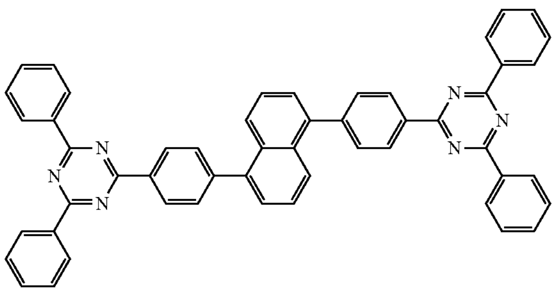

-continued
C-14
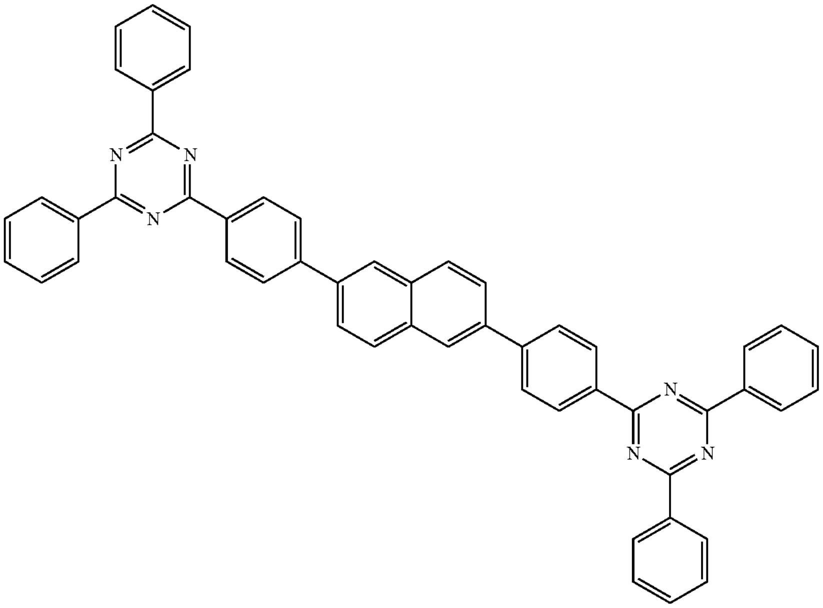
C-15
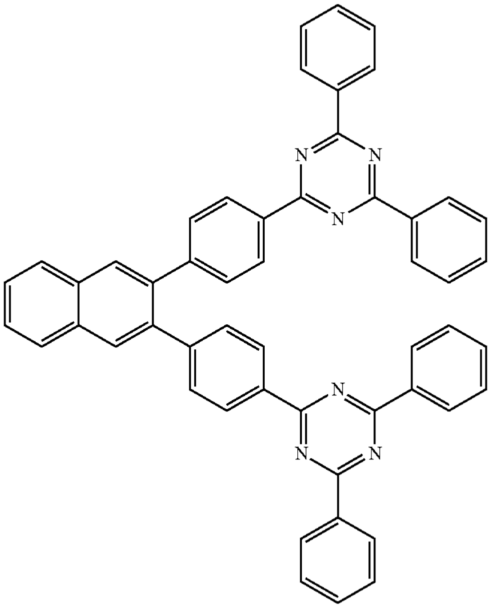
C-16
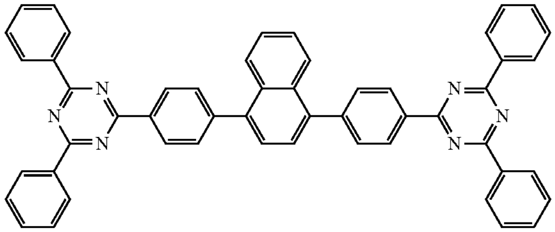
C-17
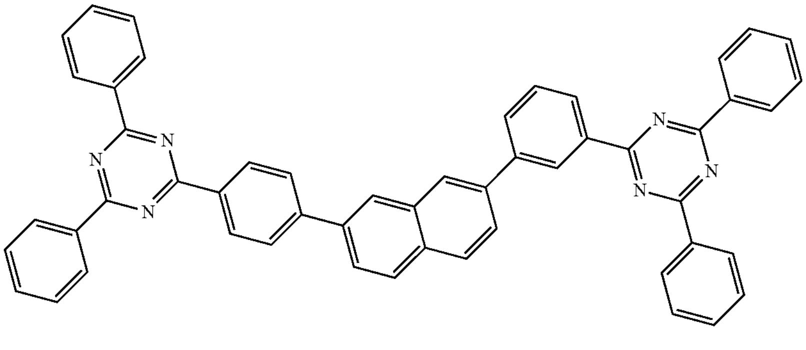

-continued
C-18
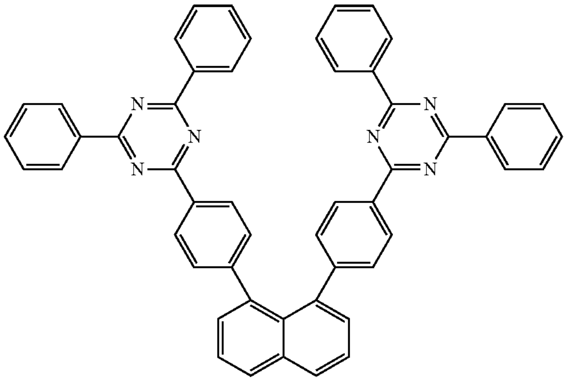
C-19
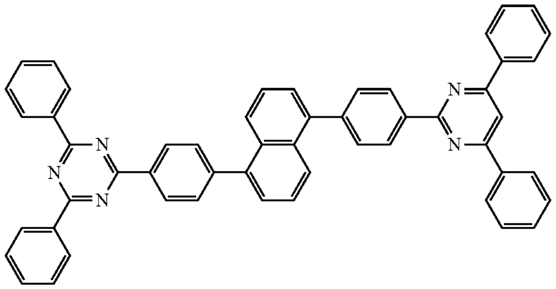
C-20
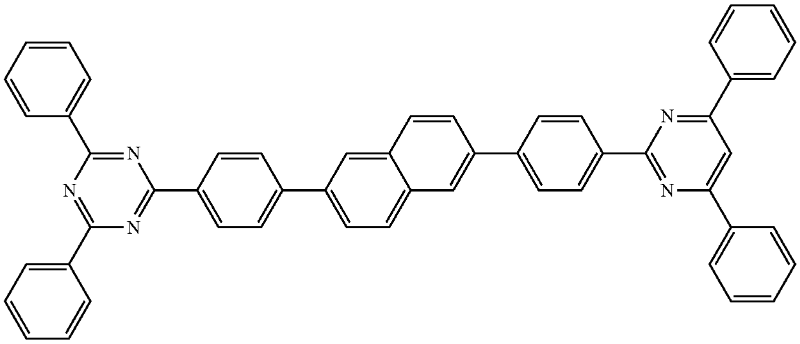
C-21
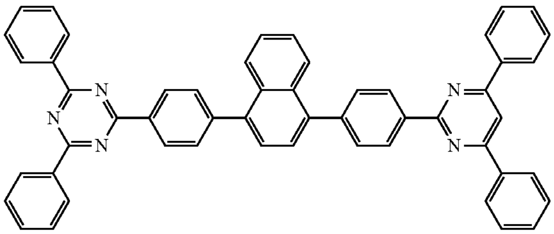
C-22
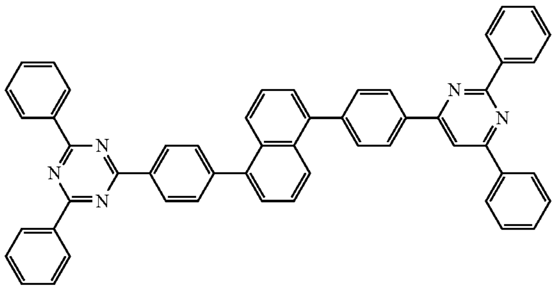
C-23
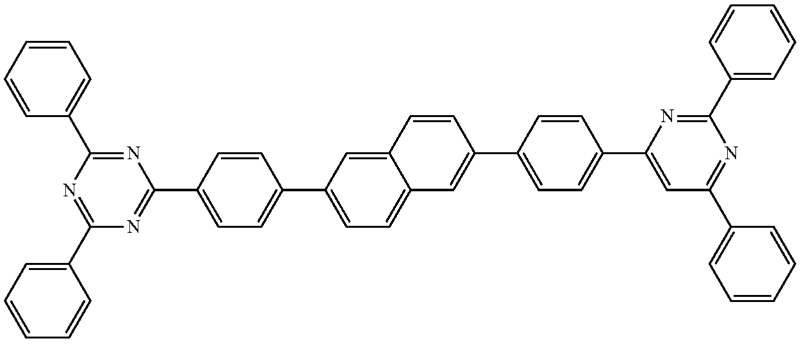

-continued
C-24
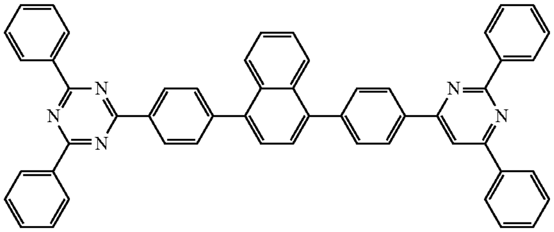
C-25
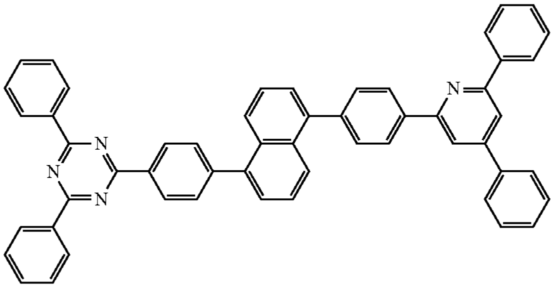
C-26
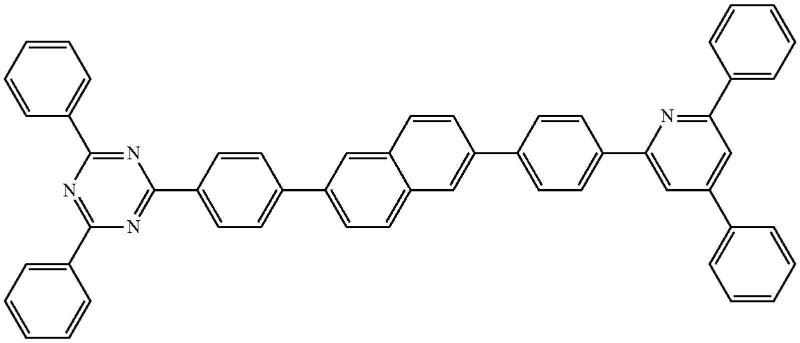
C-27
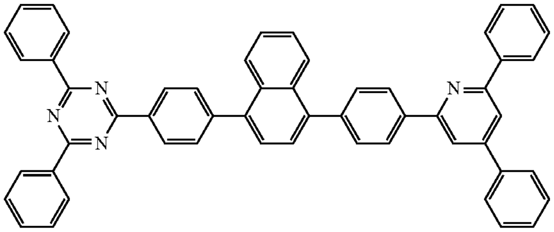
C-28
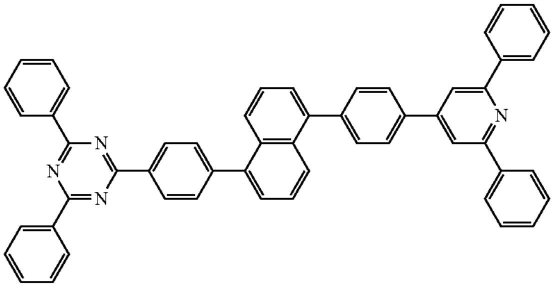
C-29
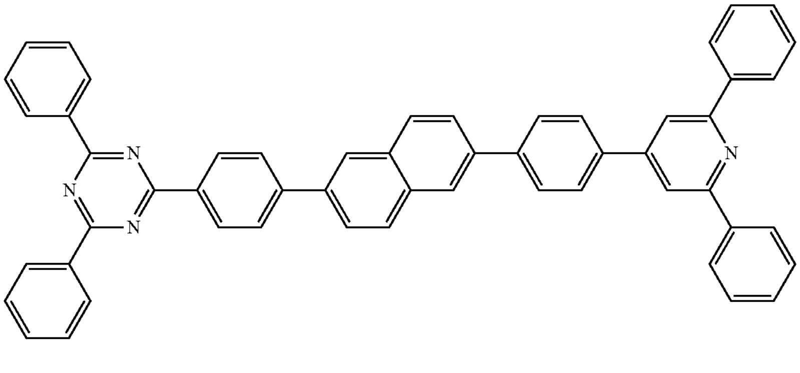

-continued
C-30
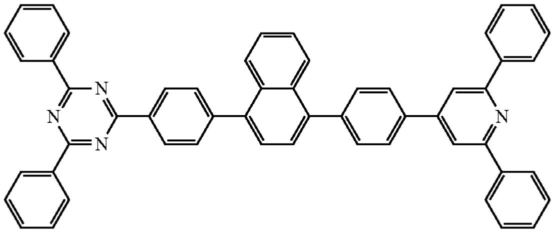
C-31
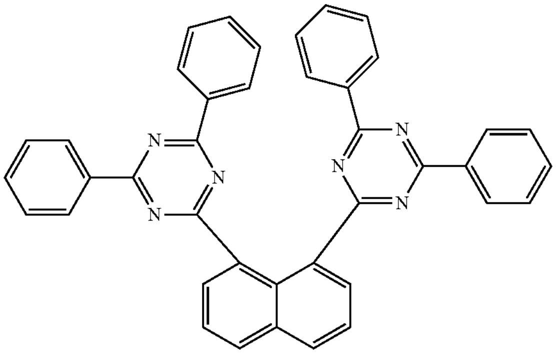
C-32
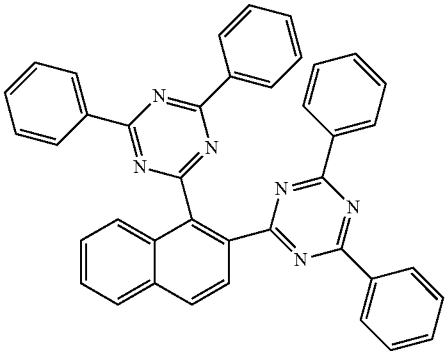
C-33
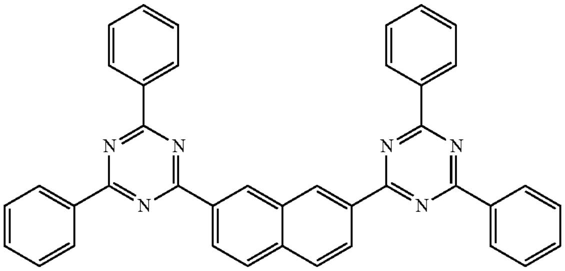
C-34
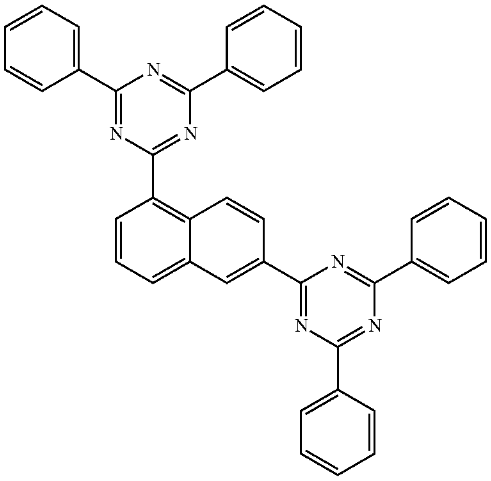
C-35
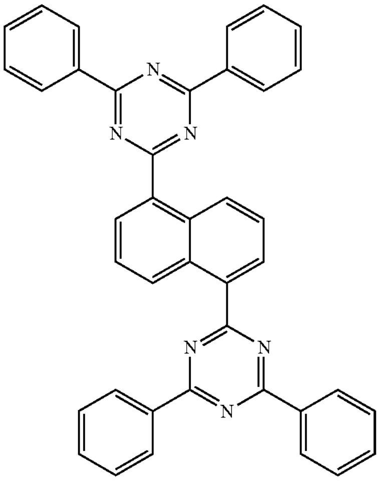

-continued
C-36
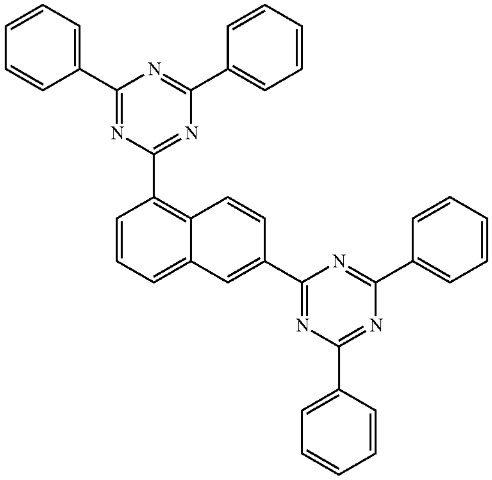
C-37
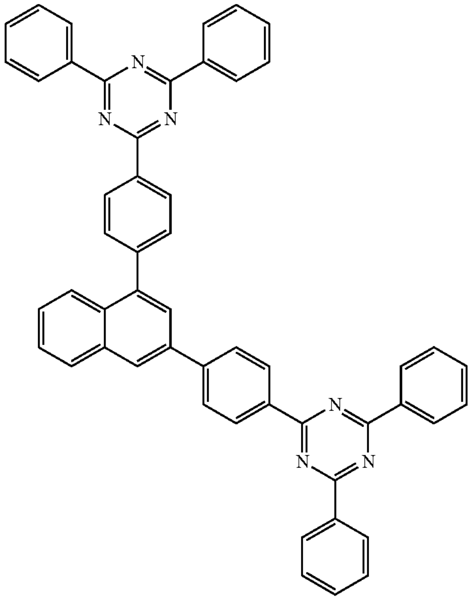
C-38
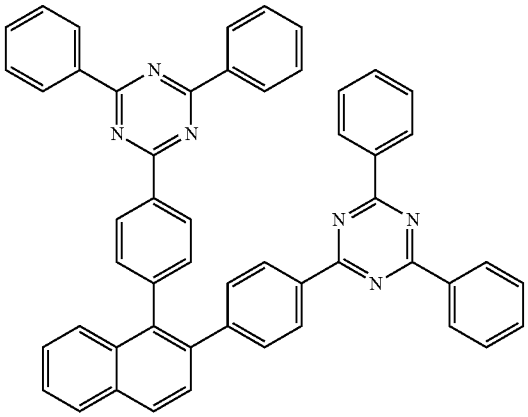
C-39
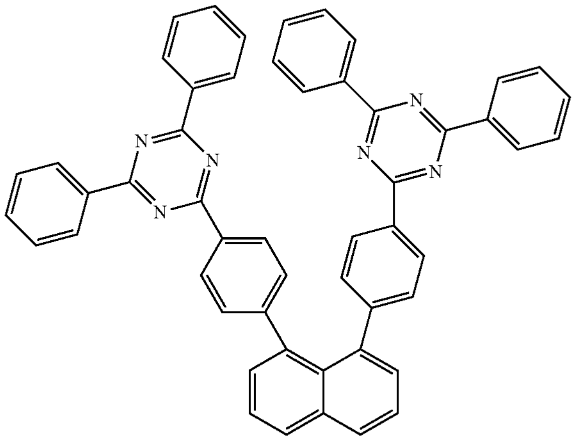
C-40
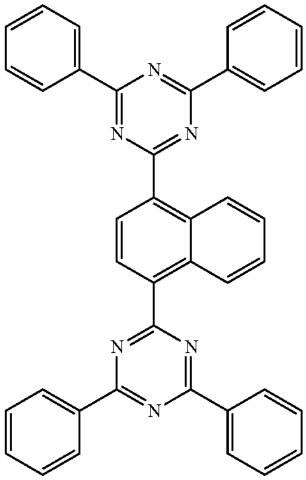
C-41
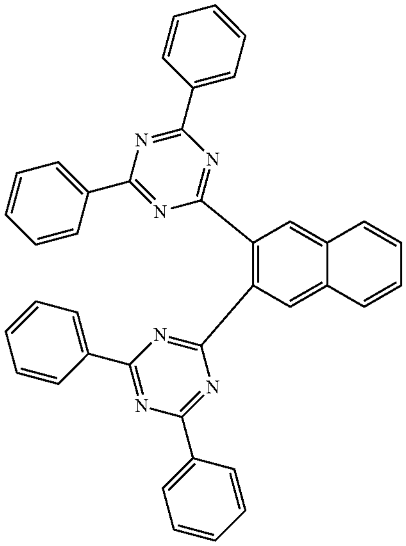

-continued
C-42
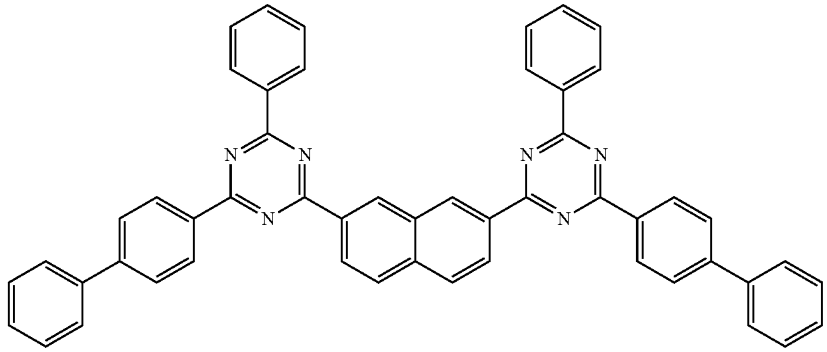
C-43
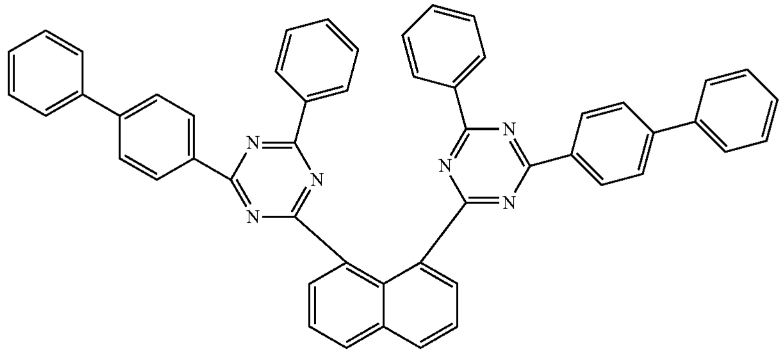
C-44
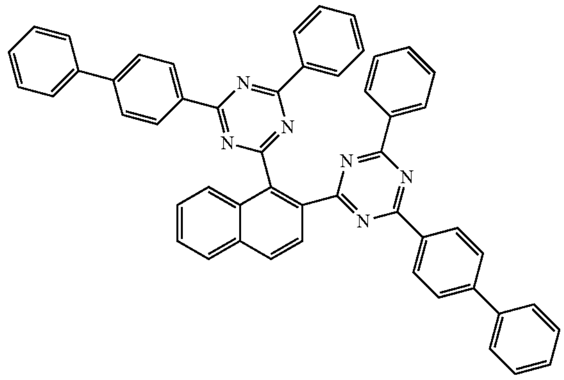
C-45
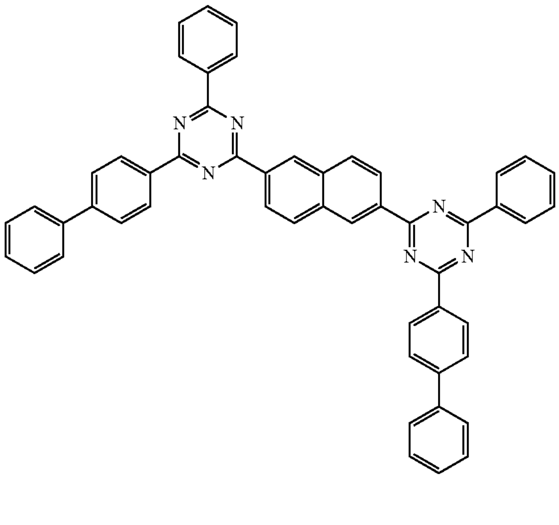

-continued
C-46
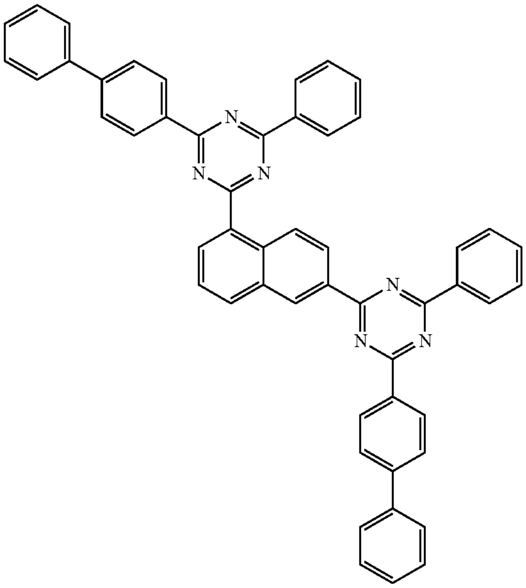
C-47
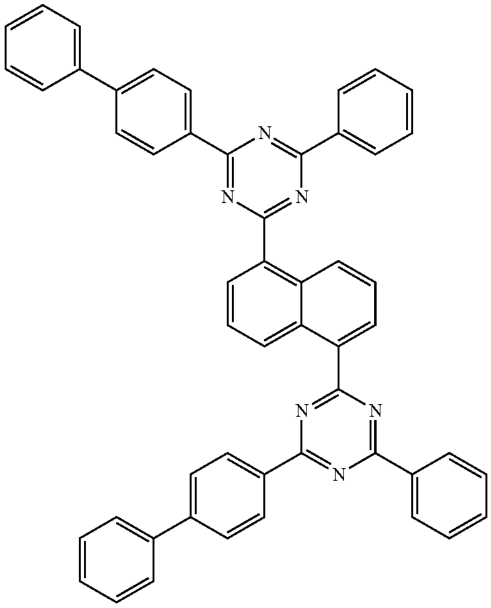
C-48
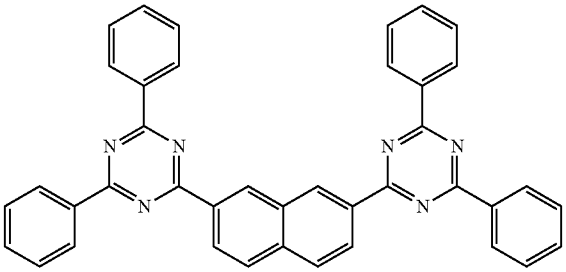
C-49
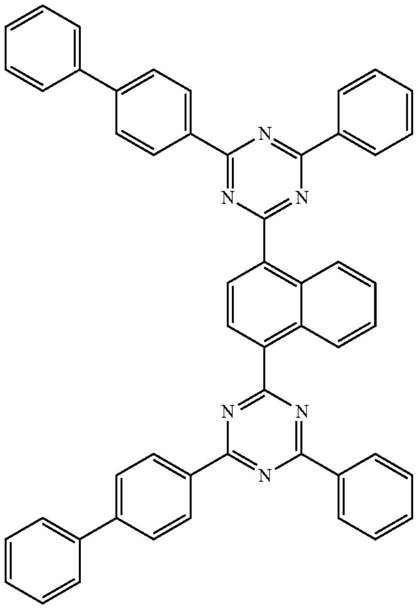

-continued
C-50
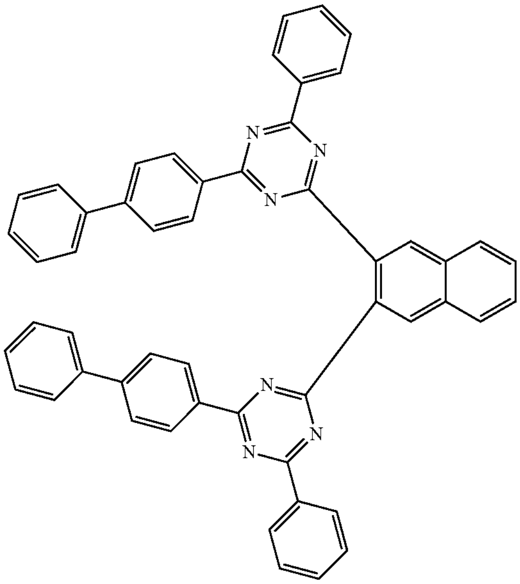
C-51
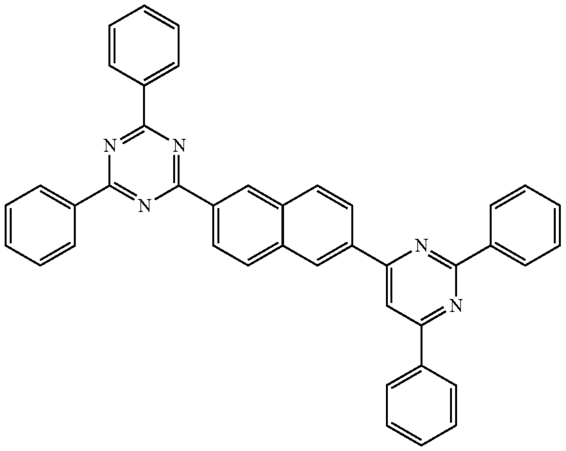
C-52
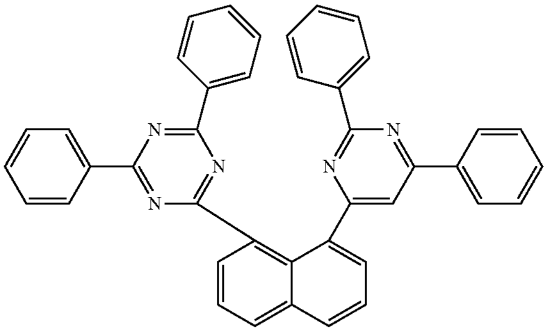
C-53
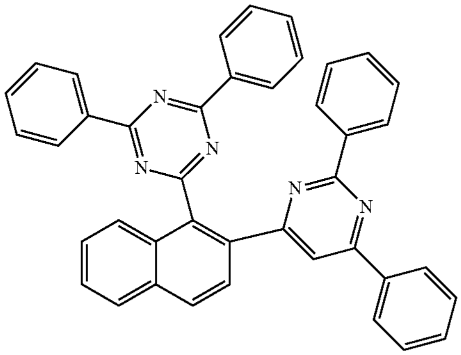
C-54
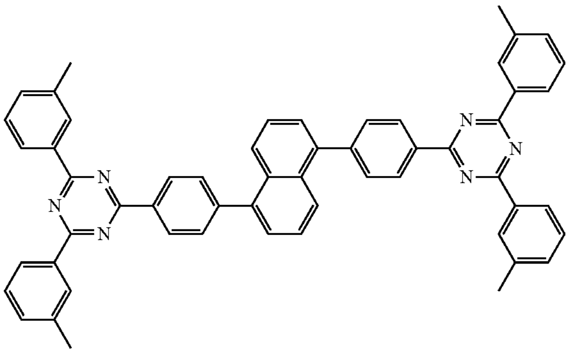
C-55
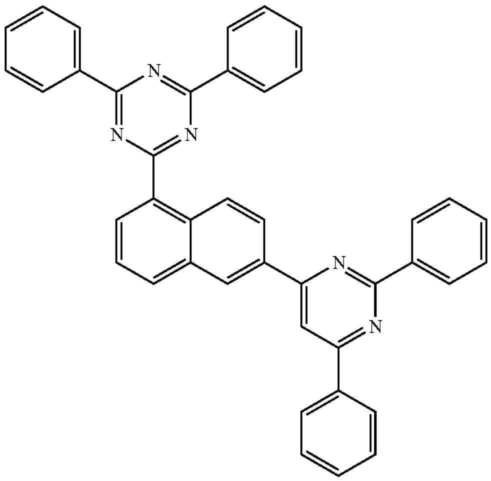

-continued
C-56
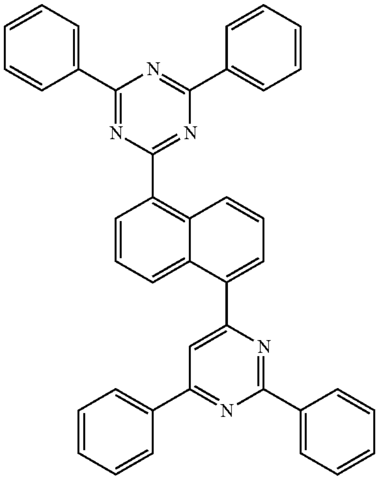
C-57
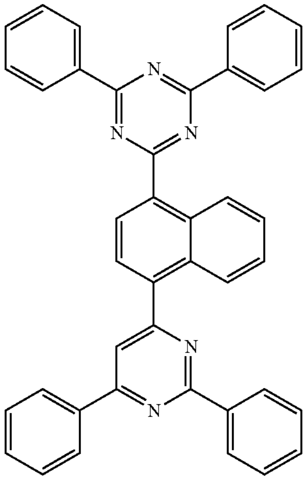
C-58
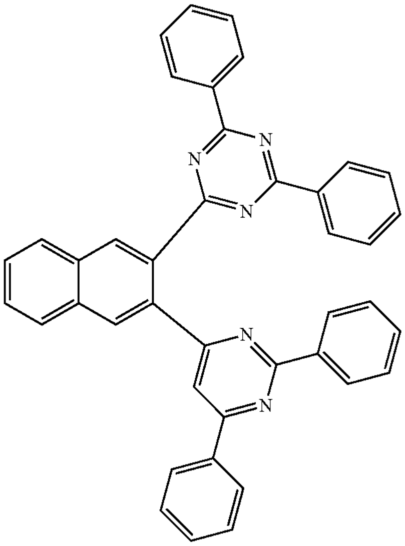
C-59
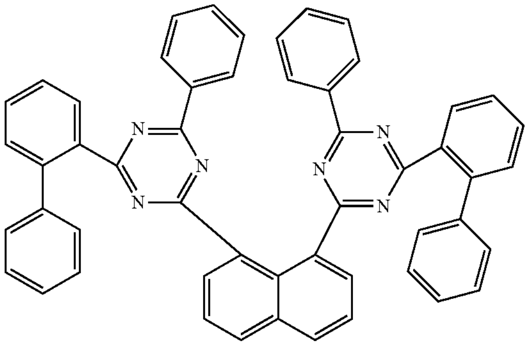
C-60
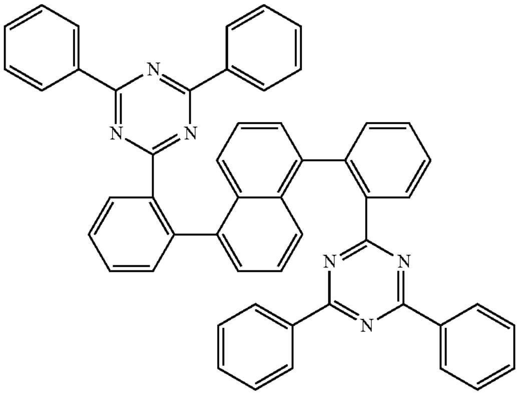
.

8. The organic light-emitting device according to claim 1, wherein the compound of [Formula D] is any one selected from the following compounds [D-1] to [D-90]:
D-1
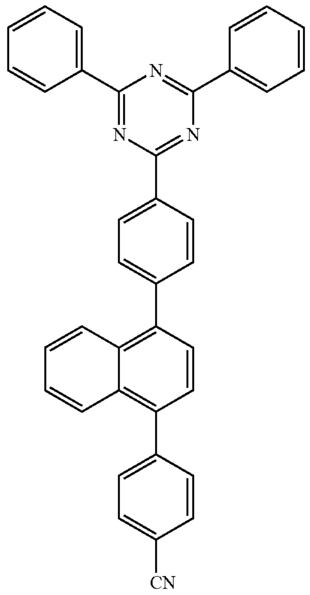
D-2
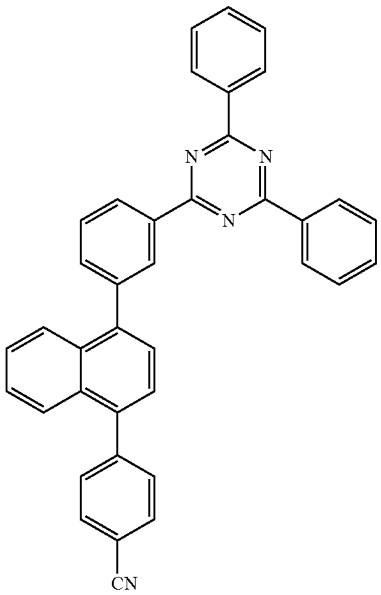
-continued
D-3
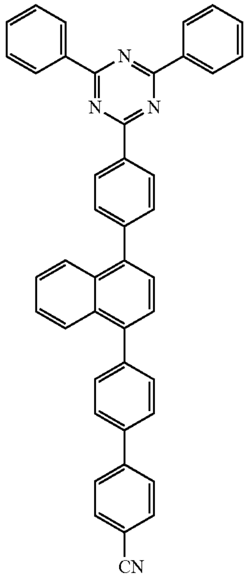
D-4
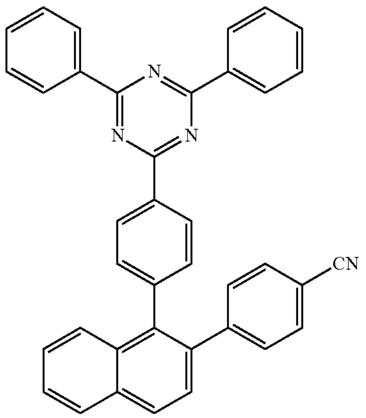
D-5
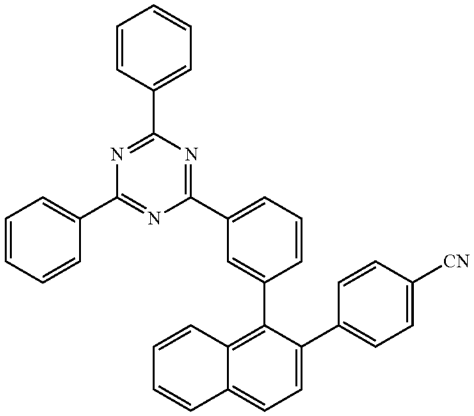

-continued
D-6
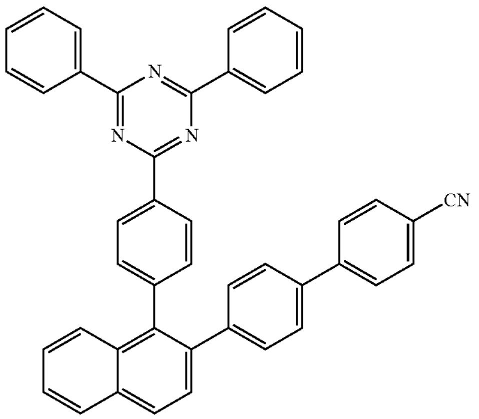
D-7
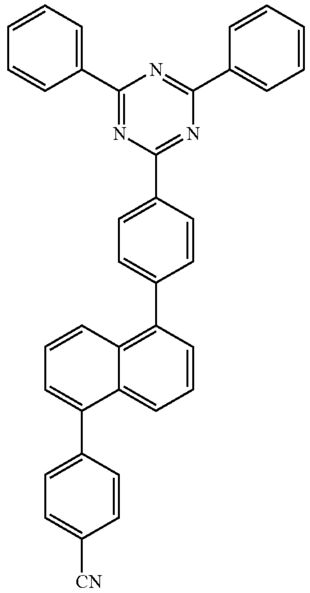
D-8
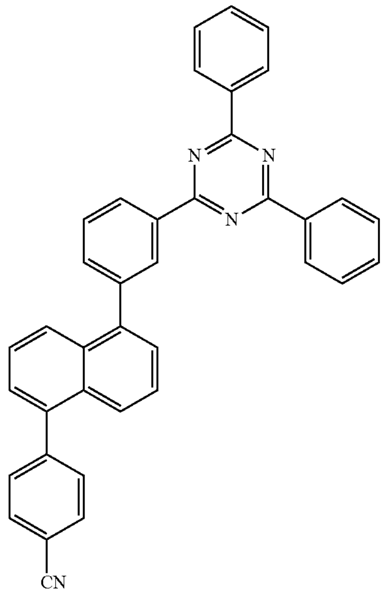
-continued
D-9
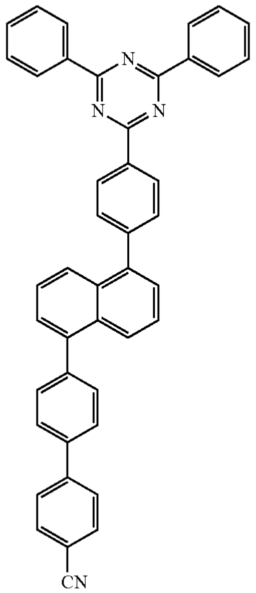
D-10
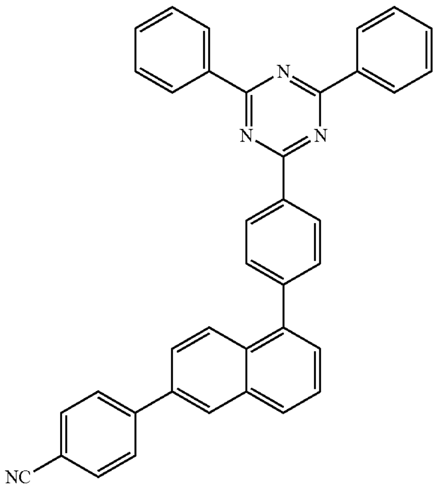
D-11
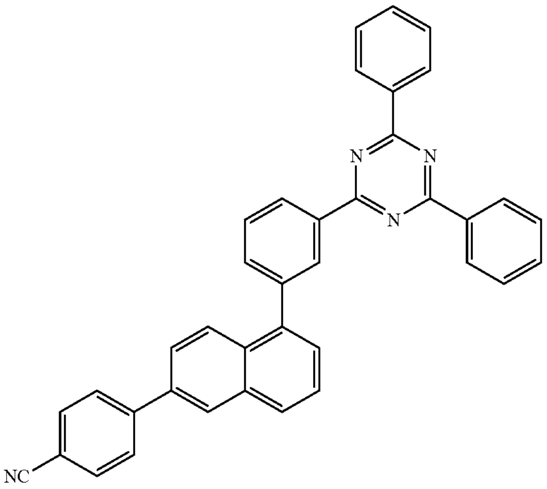

D-12
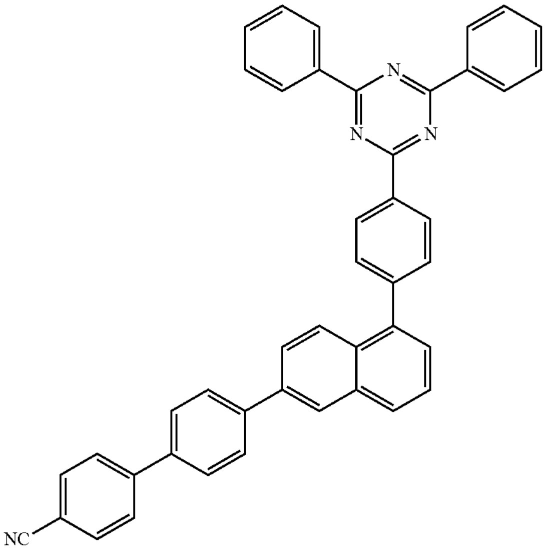
D-13
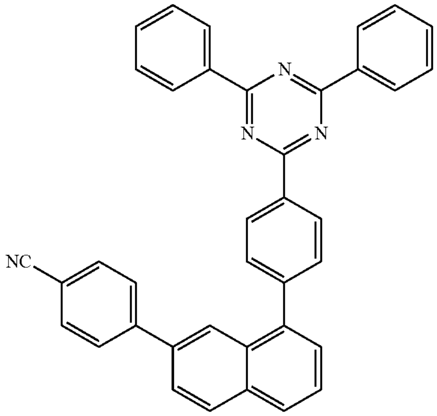
D-14
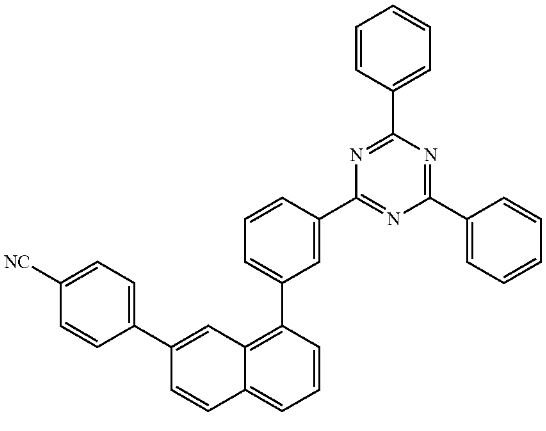
D-15
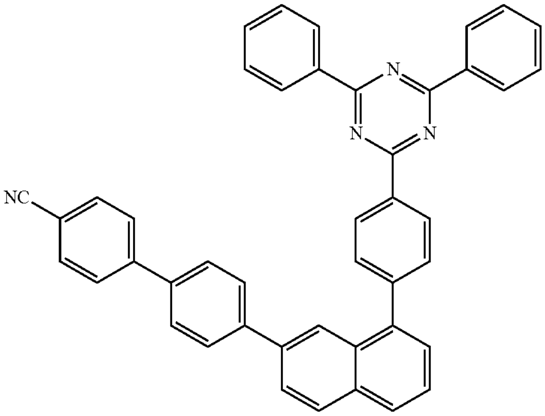
D-16
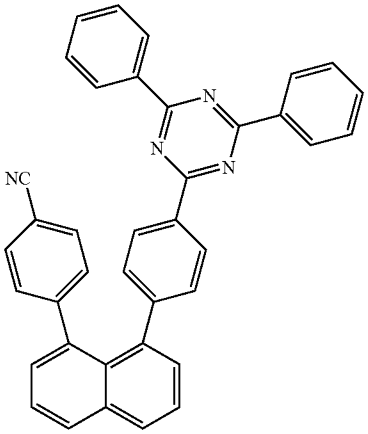
D-17
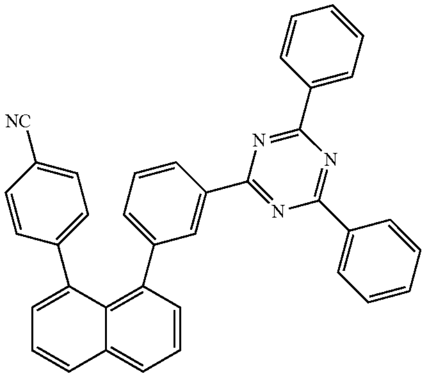

-continued
D-18
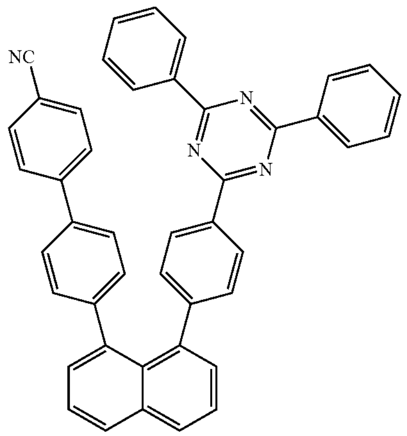
D-19
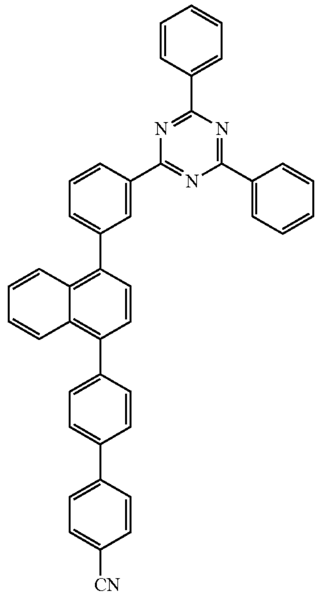
D-20
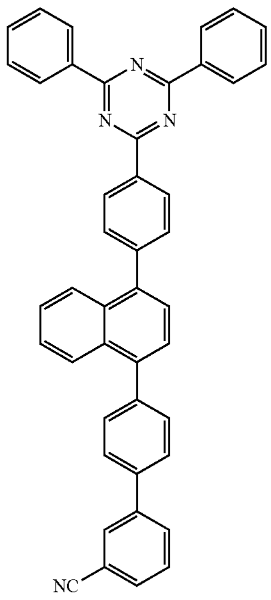
-continued
D-21
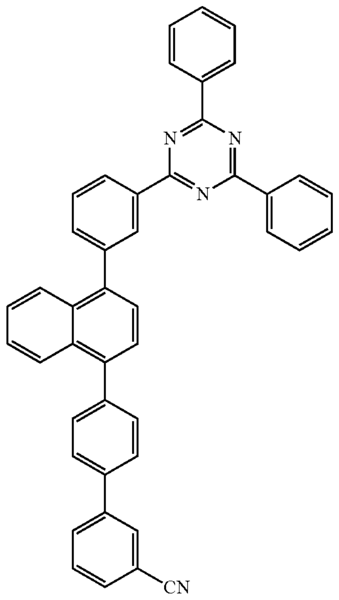
D-22
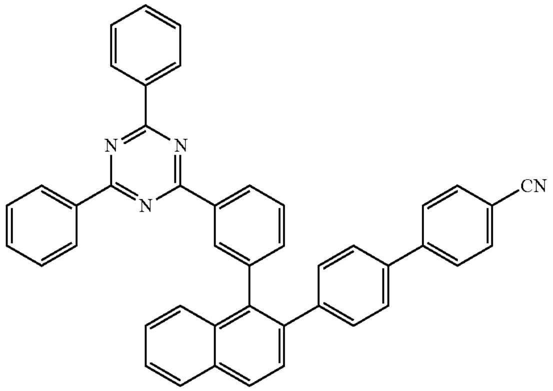
D-23
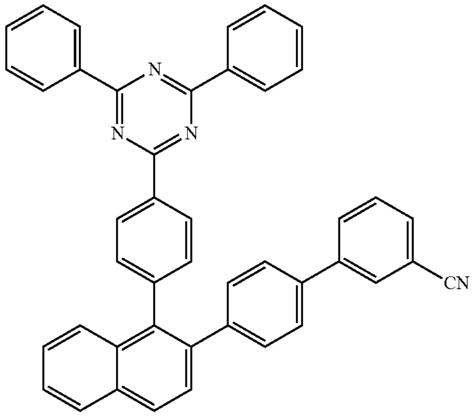

-continued
D-24
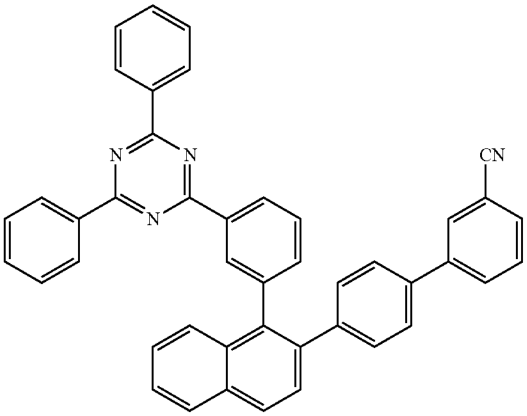
D-25
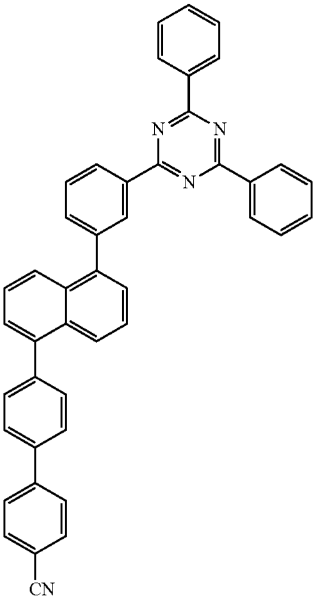
D-26
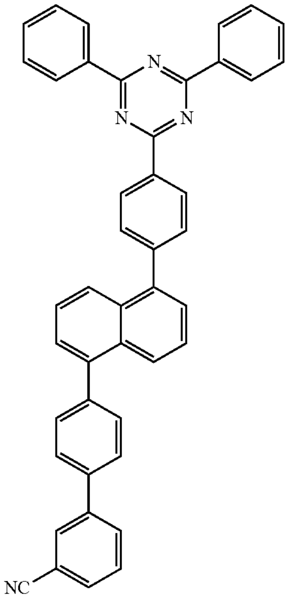
-continued
D-27
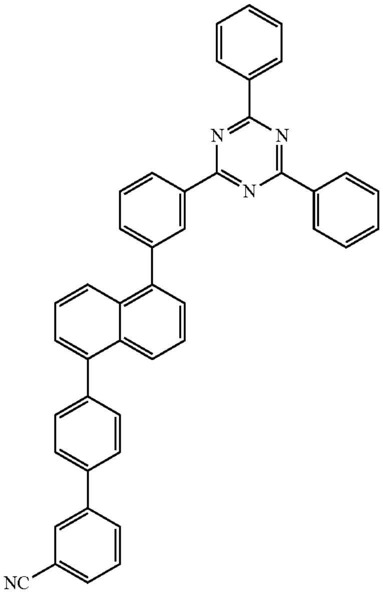
D-28
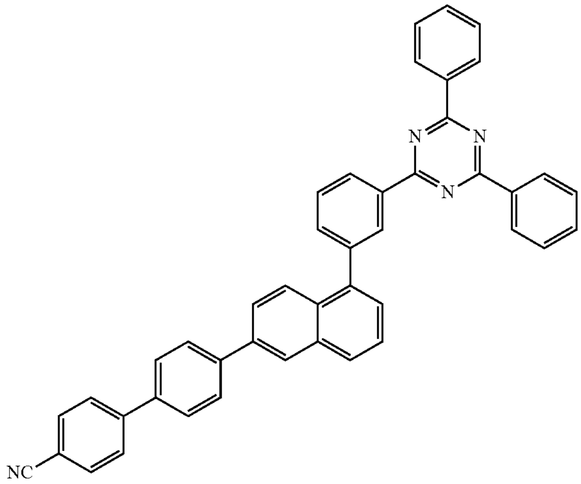
D-29
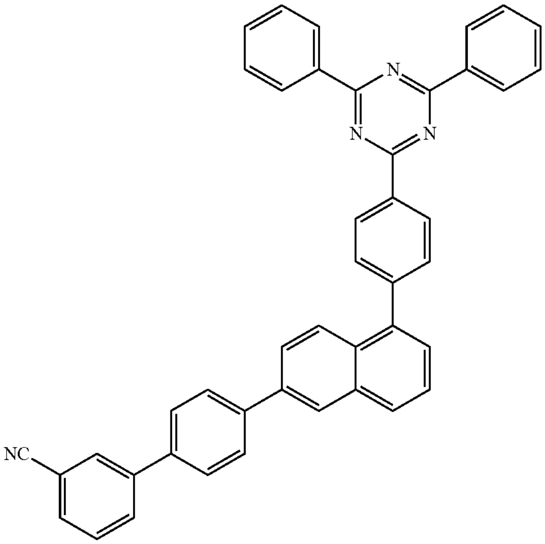

-continued
D-30
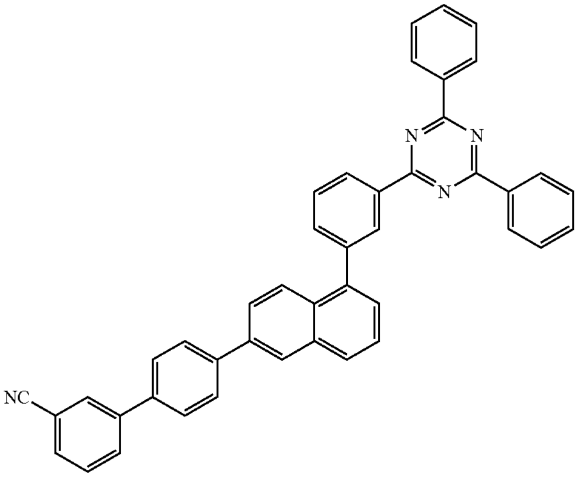
D-31
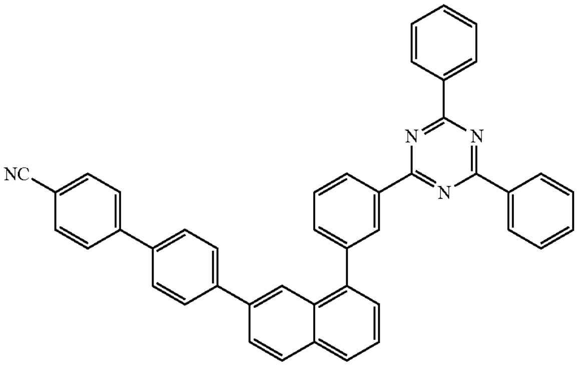
D-32
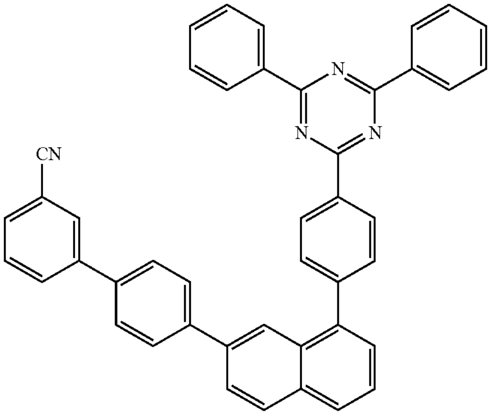
-continued
D-33
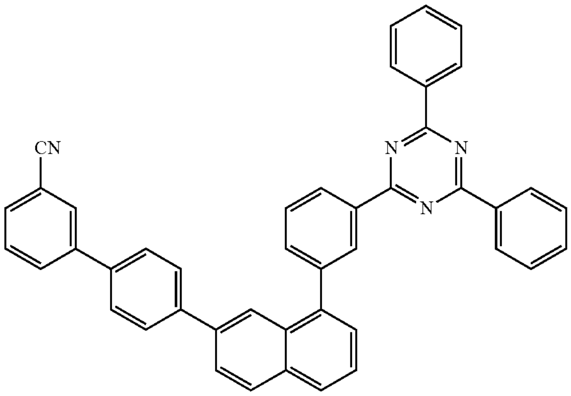
D-34
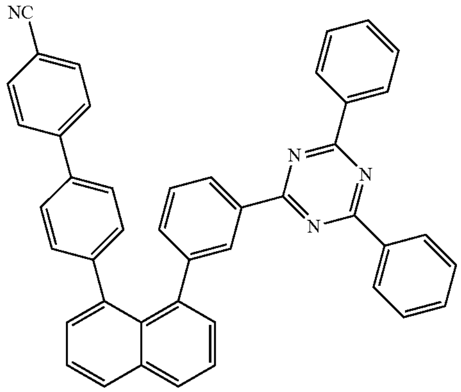
D-35
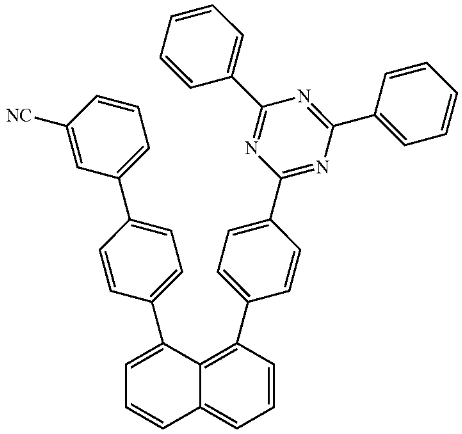
D-36
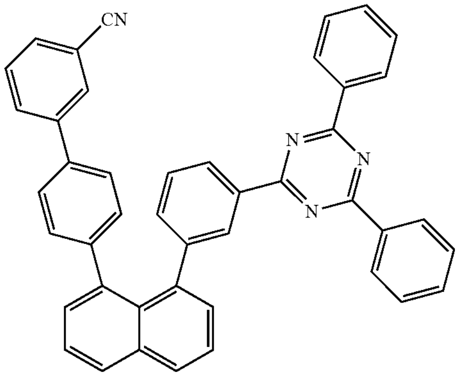

-continued
D-37
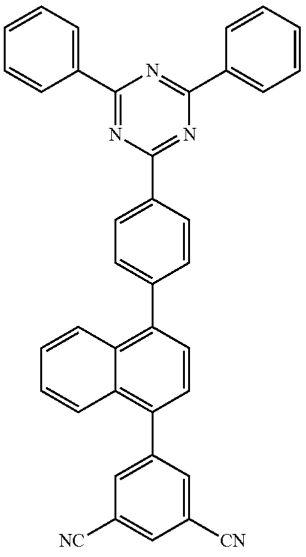
D-38
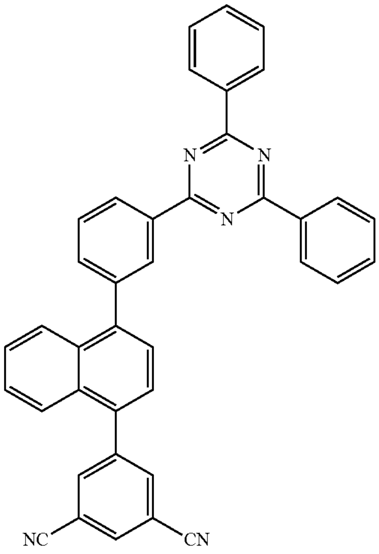
-continued
D-39
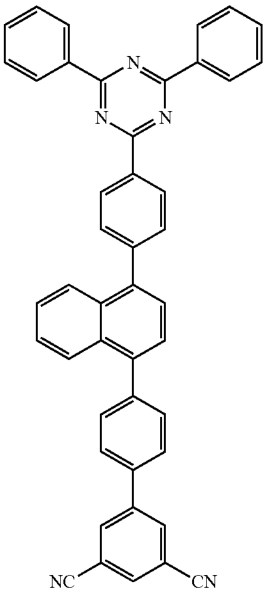
D-40
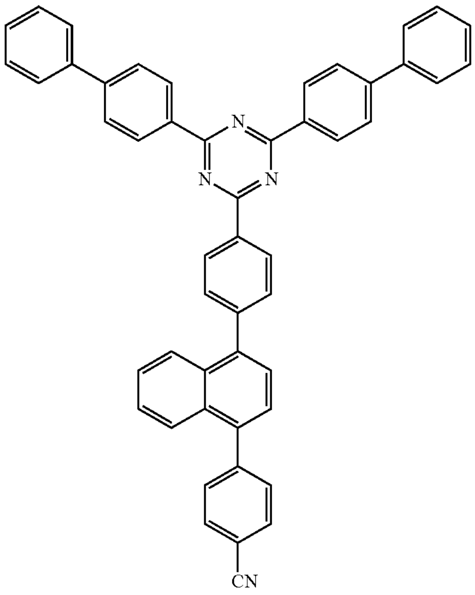

-continued
D-41
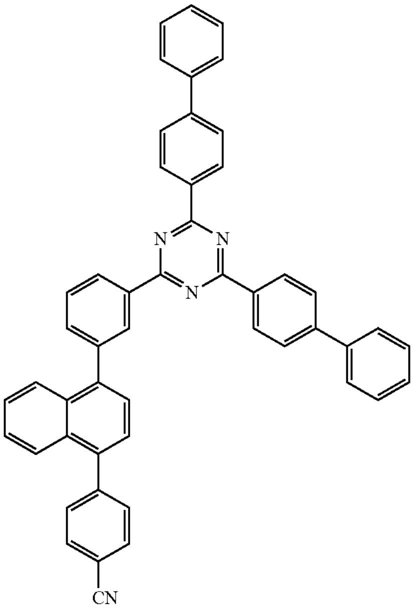
D-42
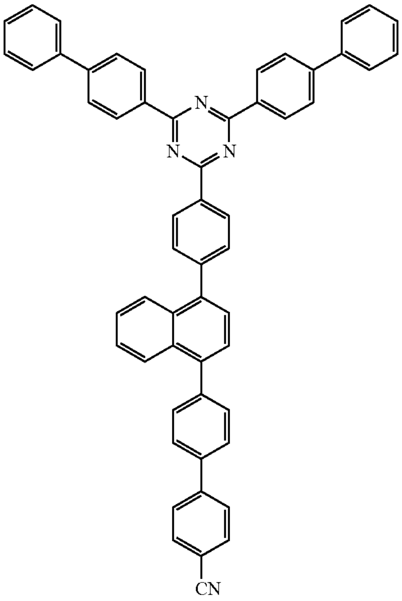
-continued
D-43
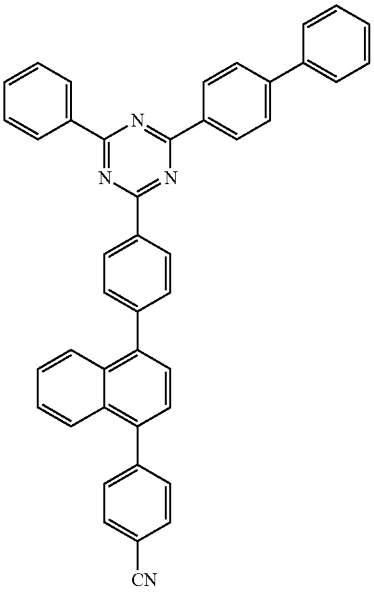
D-44
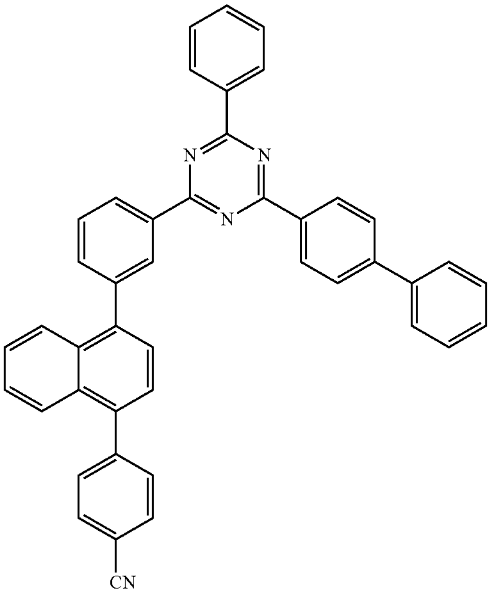

-continued
D-45
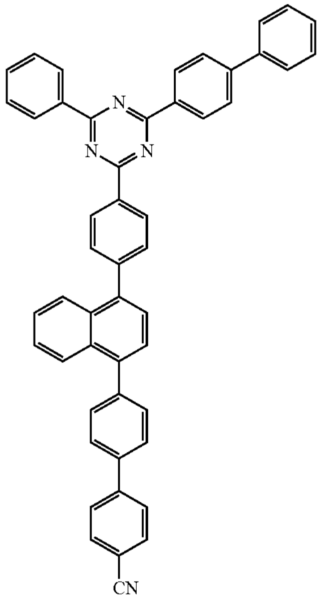
D-46
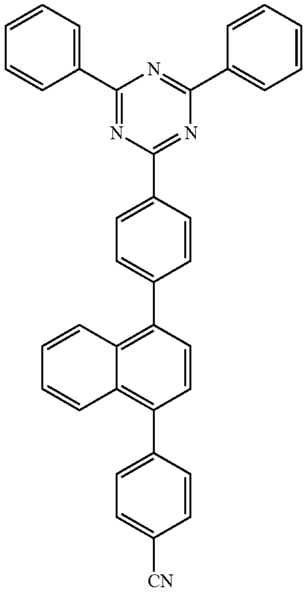
-continued
D-47
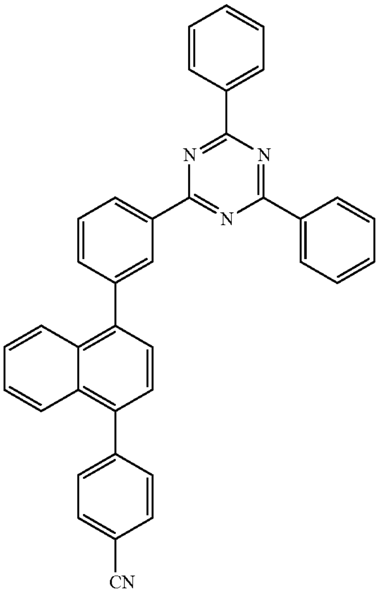
D-48
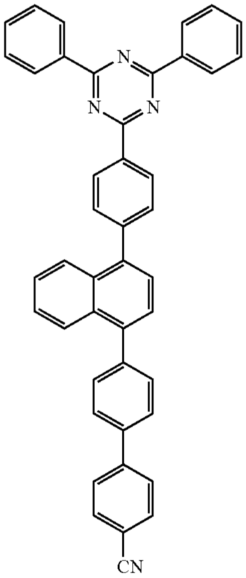

D-49
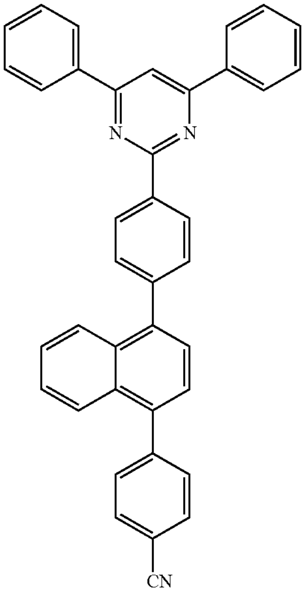
D-50
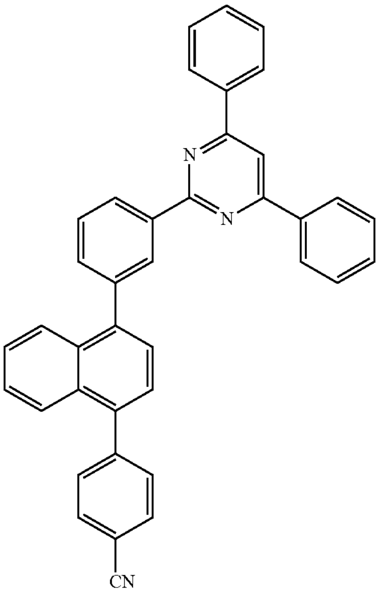
D-51
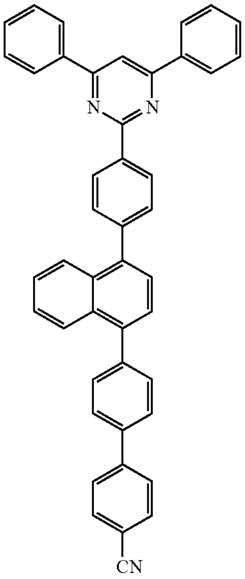
D-52
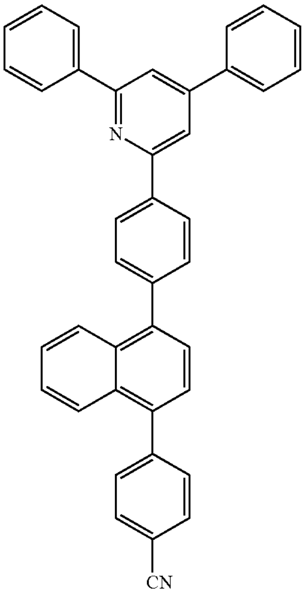

-continued
D-53
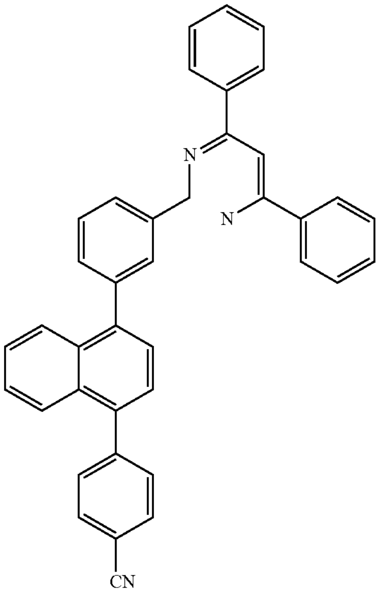
D-54
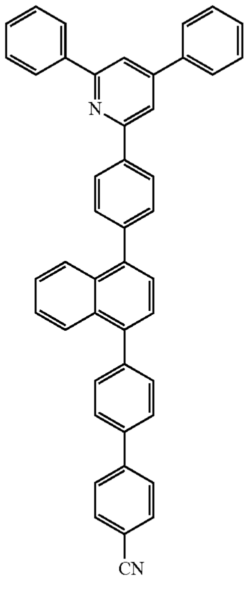
-continued
D-55
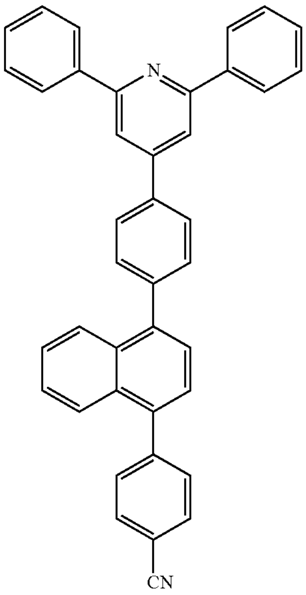
D-56
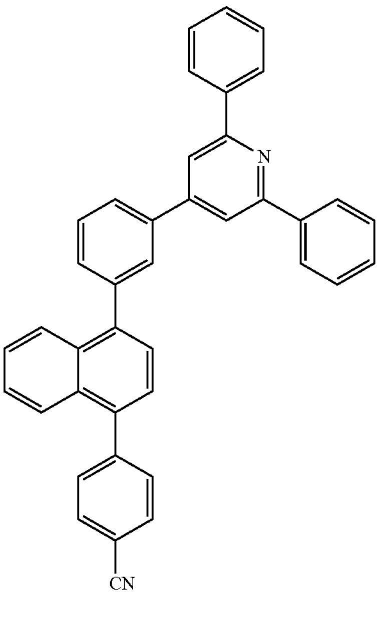

-continued
D-57
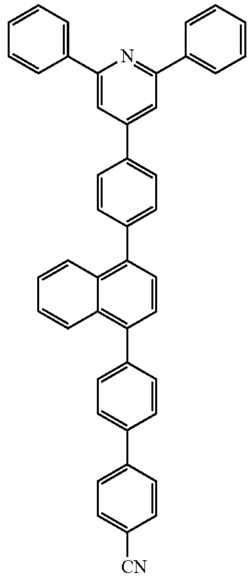
D-58
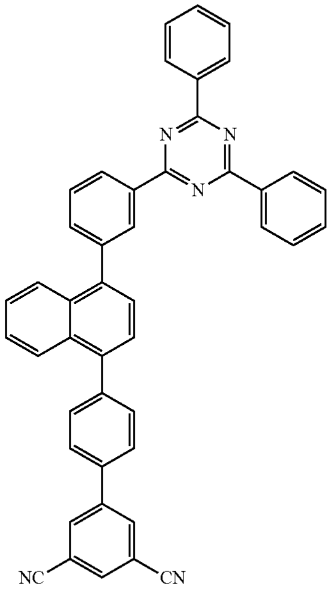
-continued
D-59
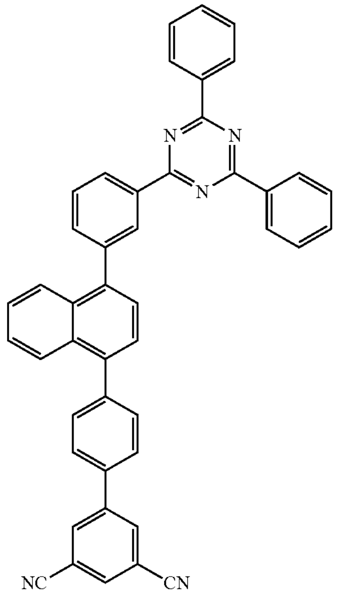
D-60
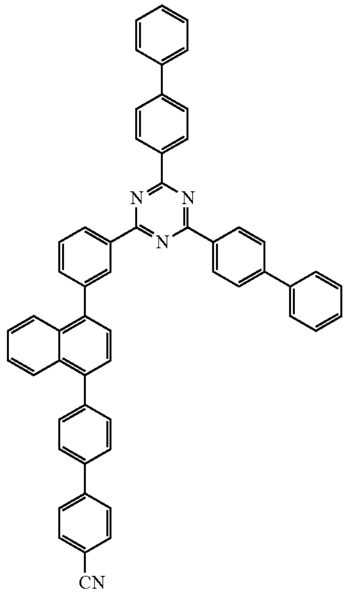

-continued
D-61
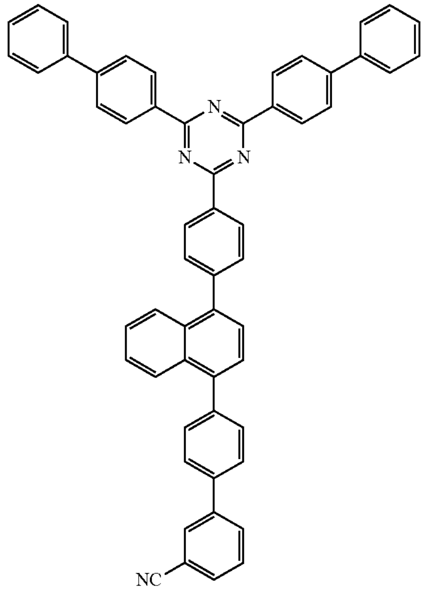
D-62
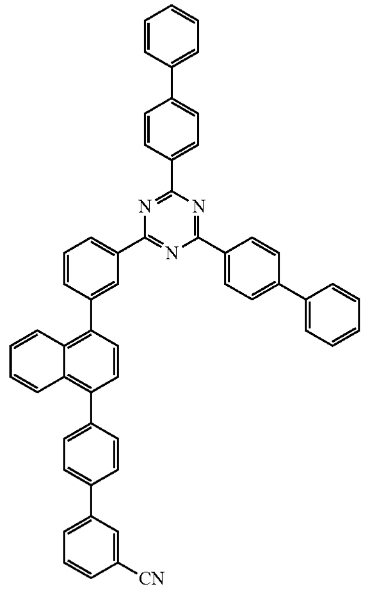
-continued
D-63
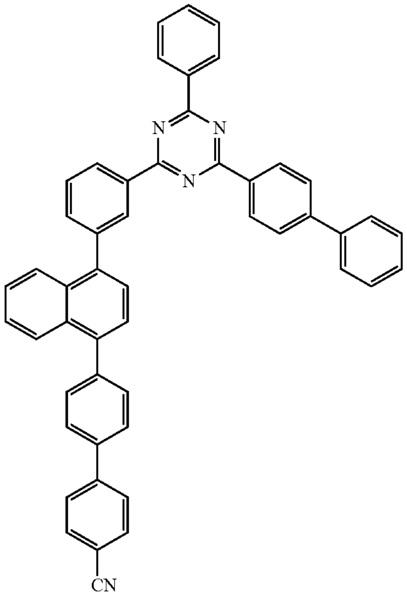
D-64
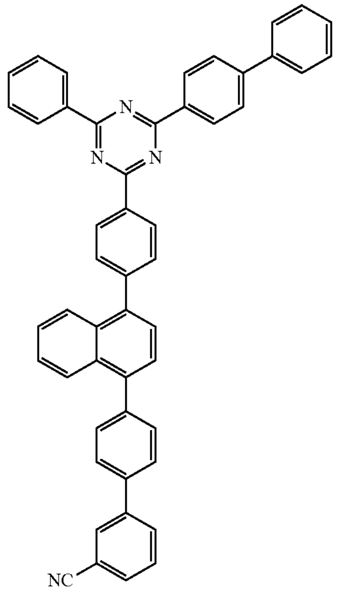

-continued
D-65
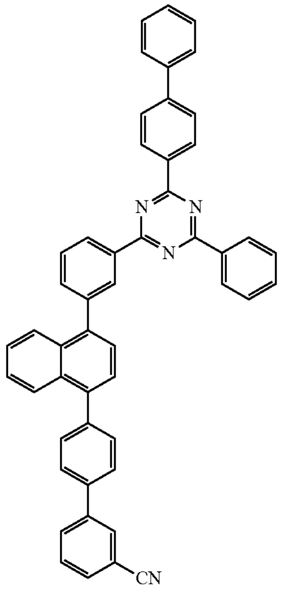
D-66
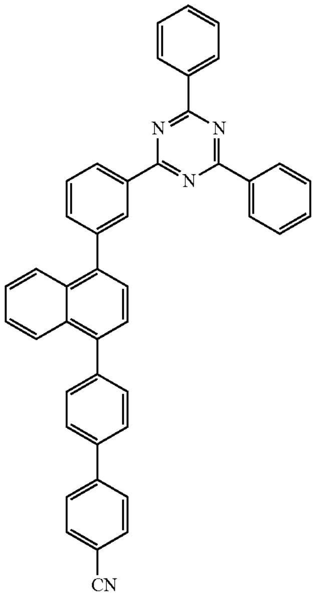
-continued
D-67
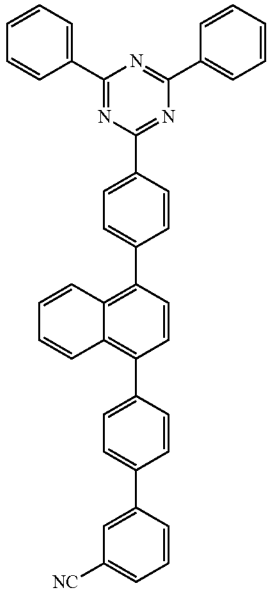
D-68
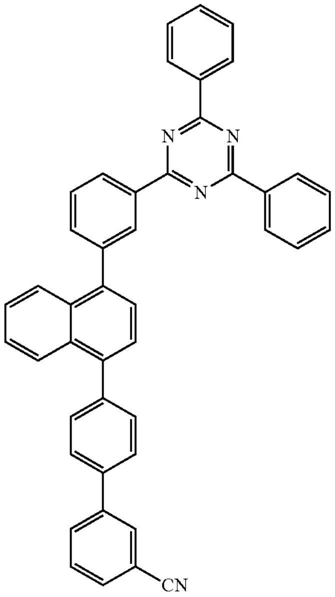

-continued
D-69
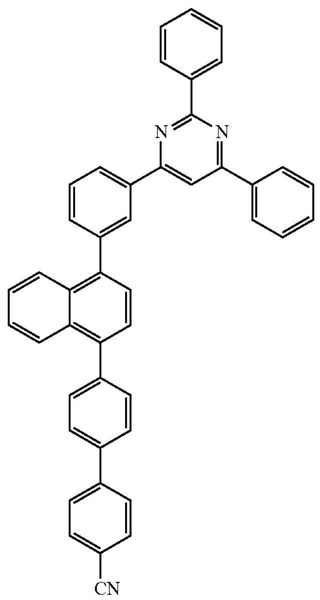
D-70
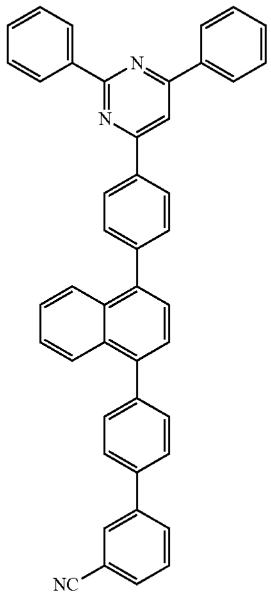
-continued
D-71
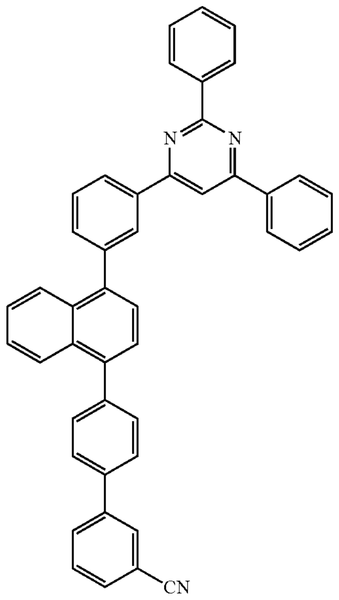
D-72
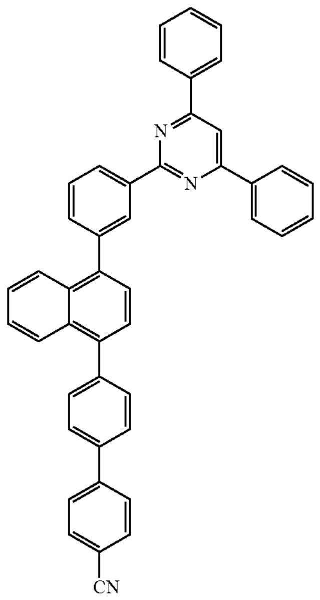

-continued
D-73
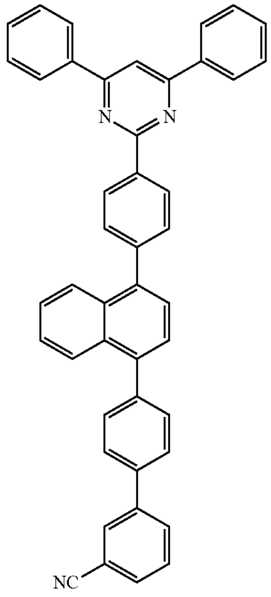
-continued
D-75
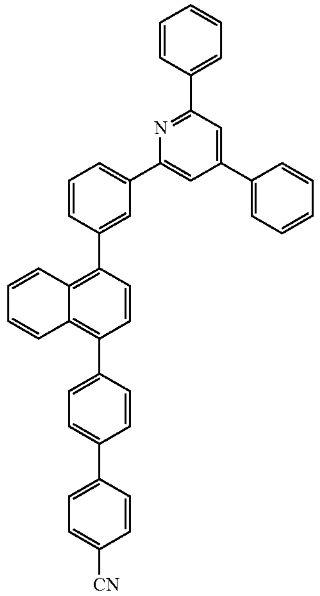
D-74
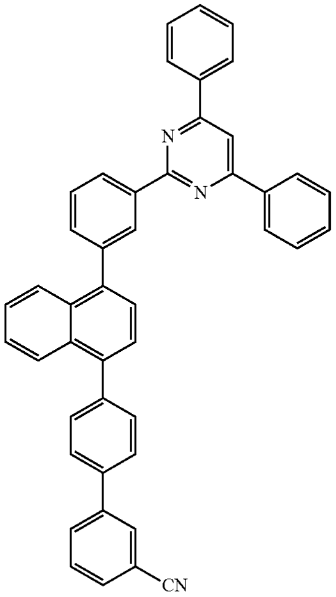
D-76
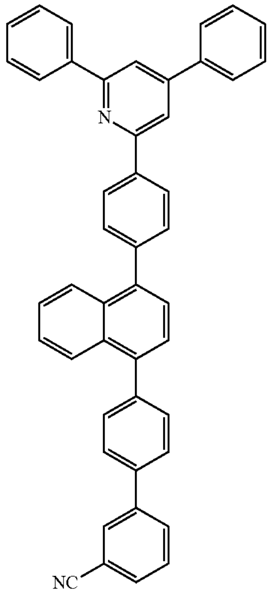

-continued
D-77
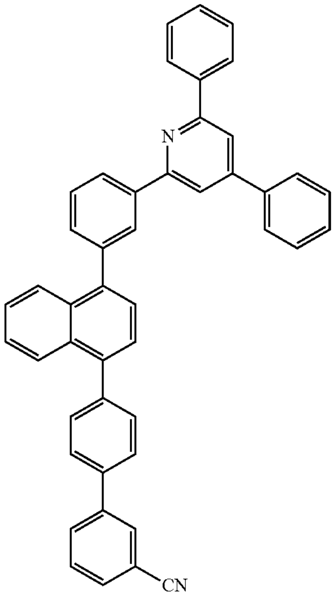
D-78
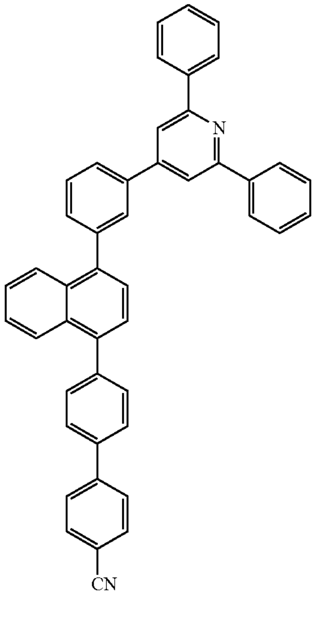
-continued
D-79
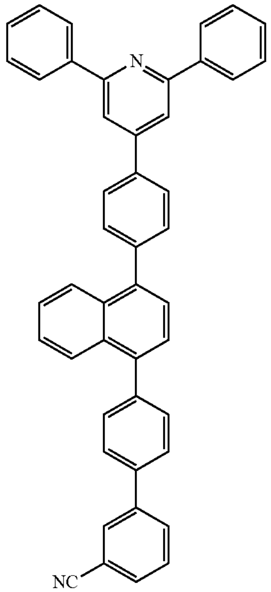
D-80
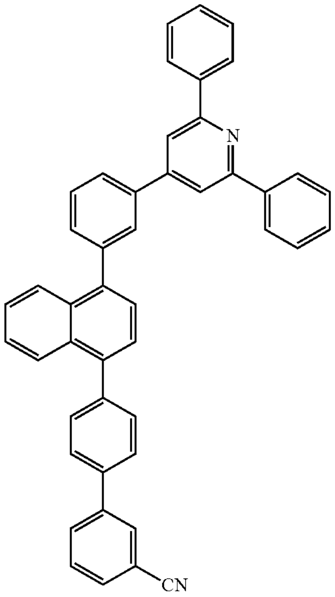
D-81
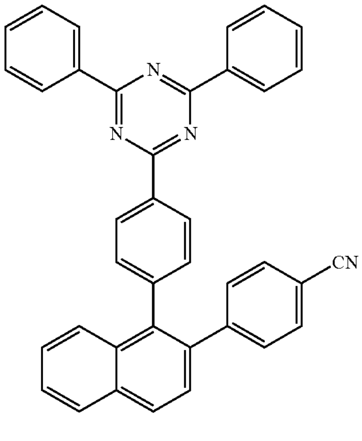

-continued
D-82
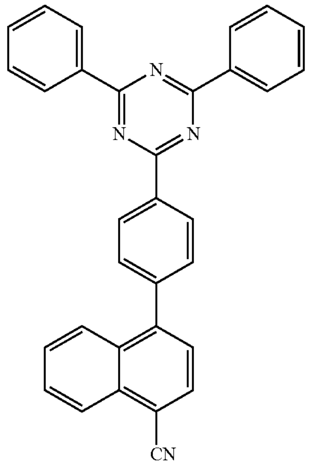
D-83
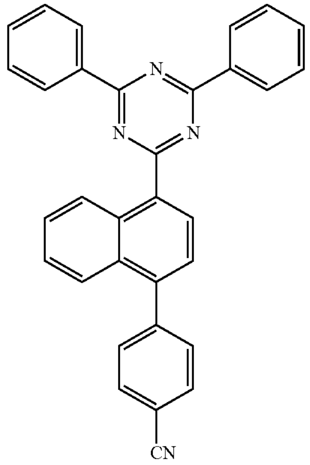
D-84
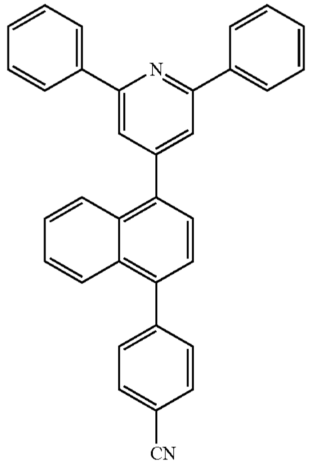
-continued
D-85
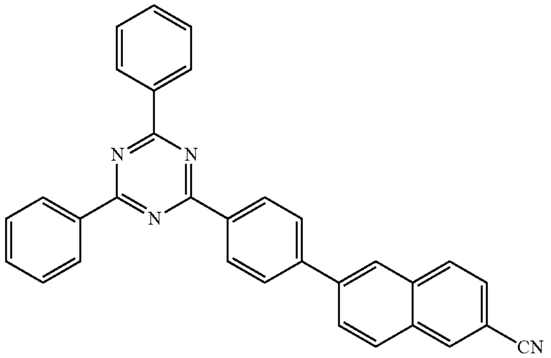
D-86
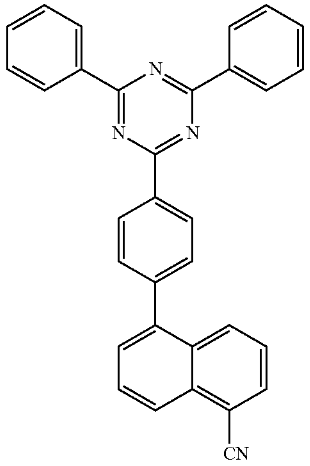
D-87
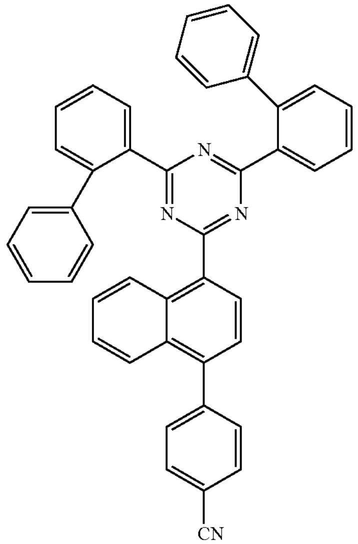

-continued

D-88

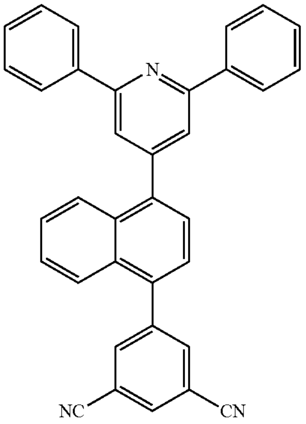

D-89

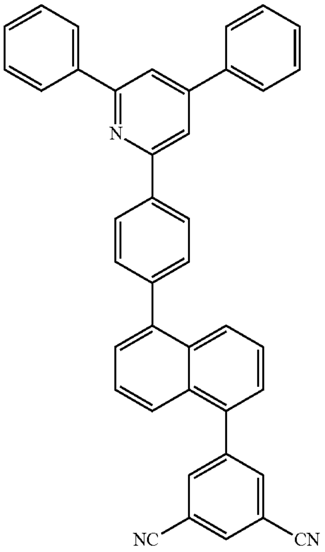

D-90

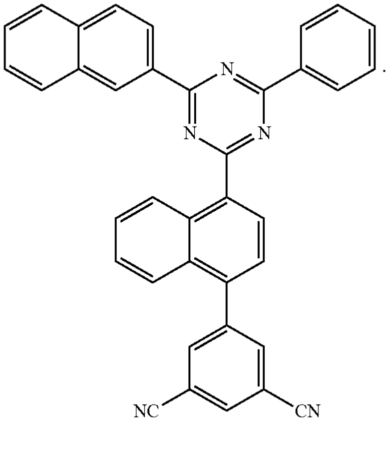

9. The organic light-emitting device according to claim 1, wherein the light-emitting layer comprises a host and a dopant, and the compound represented by [Formula A] is used as the host.

10. The organic light-emitting device according to claim 1, wherein the organic light-emitting device is used for a display or lighting system selected from flat panel displays, flexible displays, monochromatic or white flat panel lighting systems, monochromatic or white flexible lighting systems, vehicle displays, and displays for virtual or augmented reality.

11. An organic light-emitting device comprising:

a first electrode;

a second electrode facing the first electrode;

a light-emitting layer interposed between the first electrode and the second electrode; and an organic layer interposed between the second electrode and the light-emitting layer, wherein the light-emitting layer comprises at least one selected from compounds represented by the following [Formula A] and the organic layer comprises at least one selected from compounds represented by the following [Formula B], the organic layer comprises an electron injection layer, an electron transport layer, or a layer capable of injecting and transporting electrons,

[Formula A]

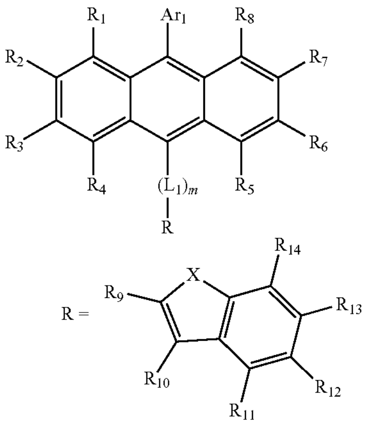

wherein $L_1$ is a divalent linker and is a single bond or is selected from a substituted or unsubstituted C6-C50 arylene group, a substituted or unsubstituted C2-C50 heteroarylene group, and a substituted or unsubstituted C3-C50 mixed aliphatic-aromatic ring group, m is an integer from 1 to 3, provided that when m is 2 or more, a plurality of $L_1$ are identical to or different from each other, X is an oxygen atom (O) or a sulfur atom(S), $Ar_1$ is selected from a substituted or unsubstituted C6-C50 aryl group, a substituted or unsubstituted C2-C50 heteroaryl group, and a substituted or unsubstituted C3-C50 mixed aliphatic-aromatic ring group, $R_1$ to $R_{14}$ are identical to or different from each other, and are each independently hydrogen, deuterium, a substituted or unsubstituted C1-C30 alkyl group, a substituted or unsubstituted C6-C50 aryl group, a substituted or unsubstituted C2-C30 alkenyl group, a substituted or unsubstituted C2-C30 alkynyl group, a substituted or unsubstituted C3-C30 cycloalkyl group, a substituted or unsubstituted C3-C30 cycloalkenyl group, a substituted or unsubstituted C2-C50 heteroaryl group, a substituted or unsubstituted C2-C30 heterocycloalkyl group, a substituted or unsubstituted C1-C30 alkoxy group, a substituted or unsubstituted C6-C50 aryloxy group, a substituted or unsubstituted C1-C30 alkylthioxy group, a substituted or unsubstituted C6-C50 arylthioxy group, a substituted or unsubstituted amine group, a substituted or unsubstituted silyl group, a substituted or unsubstituted C3-C50 mixed aliphatic-aromatic ring group, a cyano group, a nitro group and a halogen group, with the proviso that any one of $R_9$ to $R_{14}$ is bonded to the linker $L_1$,

[Formula B]

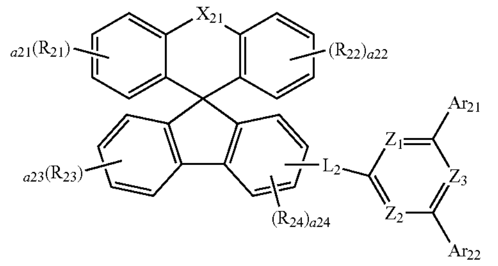

wherein $X_{21}$ is a single bond, $R_{21}$ to $R_{24}$ are identical to or different from each other, and are each independently selected from hydrogen, deuterium, a substituted or unsubstituted C1-C30 alkyl group, a substituted or unsubstituted C6-C50 aryl group, a substituted or unsubstituted C2-C30 alkenyl group, a substituted or unsubstituted C2-C30 alkynyl group, a substituted or unsubstituted C3-C30 cycloalkyl group, a substituted or unsubstituted C3-C30 cycloalkenyl group, a substituted or unsubstituted C2-C50 heteroaryl group, a substituted or unsubstituted C2-C30 heterocycloalkyl group, a substituted or unsubstituted C1-C30 alkoxy group, a substituted or unsubstituted C6-C50 aryloxy group, a substituted or unsubstituted C1-C30 alkylthioxy group, a substituted or unsubstituted C6-C50 arylthioxy group, a substituted or unsubstituted amine group, a substituted or unsubstituted silyl group, a substituted or unsubstituted C3-C50 mixed aliphatic-aromatic ring group, a cyano group, a nitro group, and a halogen group, with the proviso that one or more of $R_{21}$ to $R_{24}$ are bonded to each other to further form a substituted or unsubstituted alicyclic or aromatic monocyclic or polycyclic ring, at least one carbon atom of which is substituted with at least one heteroatom selected from nitrogen, oxygen, and sulfur, $L_2$ is a single bond, a substituted or unsubstituted C6-C50 arylene group, or a substituted or unsubstituted C2-C50 heteroarylene group, $Z_1$ to $Z_3$ are each independently N or CR, with the proviso that at least one of $Z_1$ to $Z_3$ is N, wherein R's are identical to or different from each other, and are each independently hydrogen, a substituted or unsubstituted C1-C30 alkyl group, or a substituted or unsubstituted C2-C30 alkenyl group, or each R is bonded to $Ar_{21}$ or $Ar_{22}$ to form a substituted or unsubstituted aromatic hydrocarbon or a substituted or unsubstituted aromatic heterocycle, $Ar_{21}$ and $Ar_{22}$ are identical to or different from each other, and are each independently hydrogen, a substituted or unsubstituted C1-C30 alkyl group, a substituted or unsubstituted C2-C30 alkenyl group, a substituted or unsubstituted C2-C30 alkynyl group, a substituted or unsubstituted C6-C50 aryl group, a substituted or unsubstituted C2-C50 heteroaryl group, or are bonded to R to form a substituted or unsubstituted aromatic hydrocarbon or a substituted or unsubstituted aromatic heterocycle, $a_{21}$ to $a_{23}$ are integers from 0 to 4, provided that when $a_{21}$ to $a_{23}$ are 2 or more, a plurality of $R_{21}$ to $R_{23}$ are identical to or different from each other, and $a_{24}$ is an integer from 0 to 3, provided that when $a_{24}$ is 2 or more, a plurality of $R_{24}$ are identical to or different from each other.

12. The organic light-emitting device according to claim 11, wherein the compound of [Formula A] is represented by any one selected from the following compounds [Formula A-1] to [Formula A-6]:

[Formula A-1]

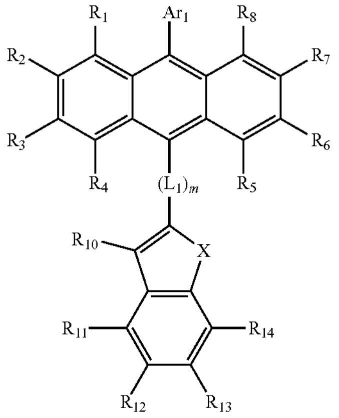

[Formula A-2]

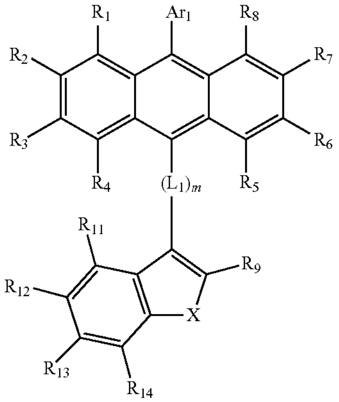

[Formula A-3]

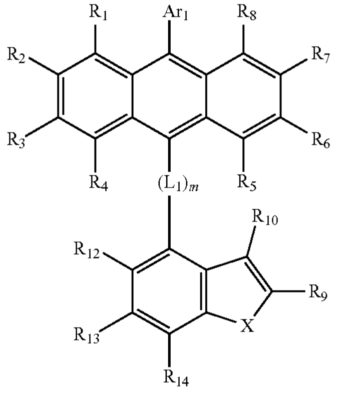

-continued

[Formula A-4]

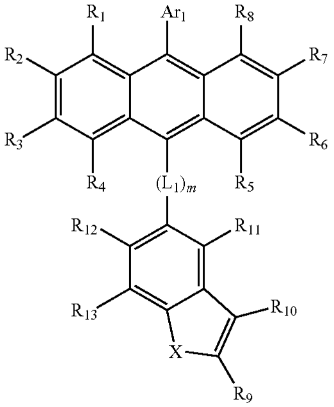

[Formula A-5]

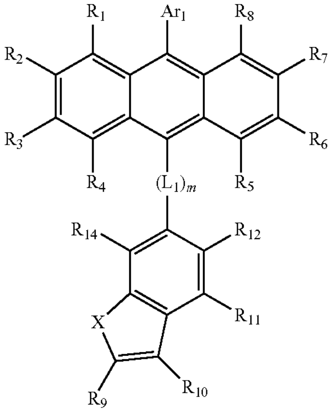

[Formula A-6]

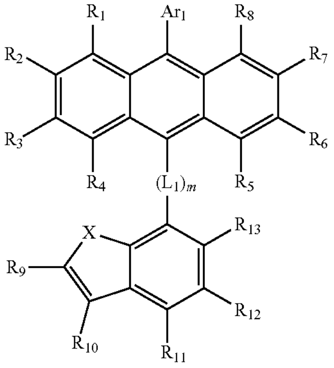

wherein $Ar_1$, $R_1$ to $R_{14}$, $L_1$, X and m are as defined in [Formula A] above.

13. The organic light-emitting device according to claim 12, wherein each of the compounds represented by [Formula A-1] to [Formula A-6] has a degree of deuteration of 10% or more.

14. The organic light-emitting device according to claim 12, wherein at least one of $R_{11}$ to $R_{14}$ in each of the compounds represented by [Formula A-1] to [Formula A-6] is selected from a substituted or unsubstituted C6-C20 aryl group, a substituted or unsubstituted C3-C20 cycloalkyl group, and a substituted or unsubstituted C3-C20 heteroaryl group.

15. The organic light-emitting device according to claim 11, wherein the compound of [Formula A] is any one selected from the following compounds [A-1] to [A-218]:

A-1

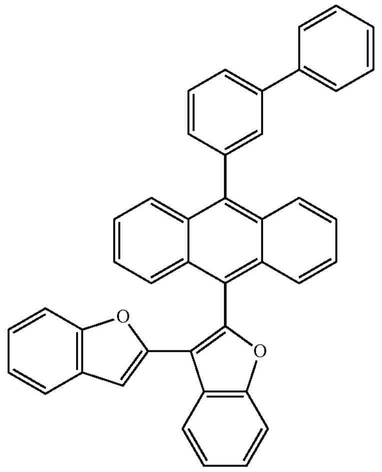

A-2

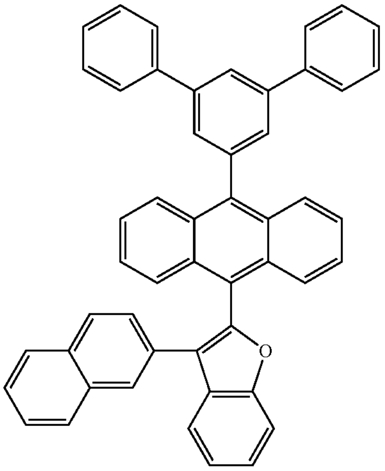

A-3

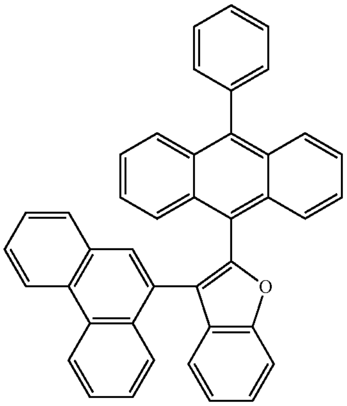

-continued
A-4
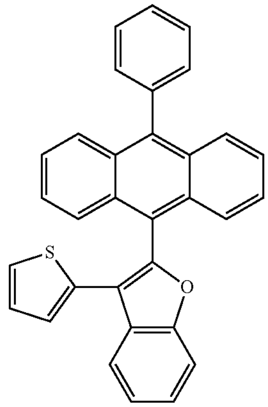
A-5
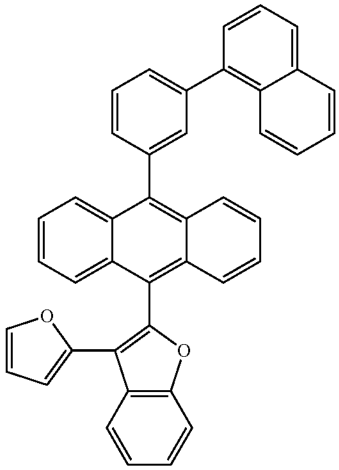
A-6
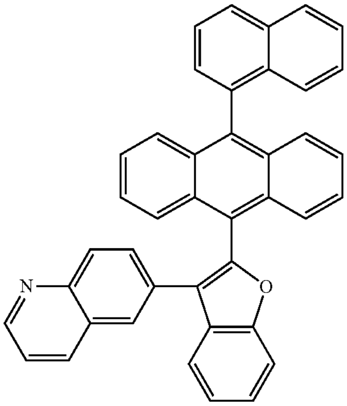
-continued
A-7
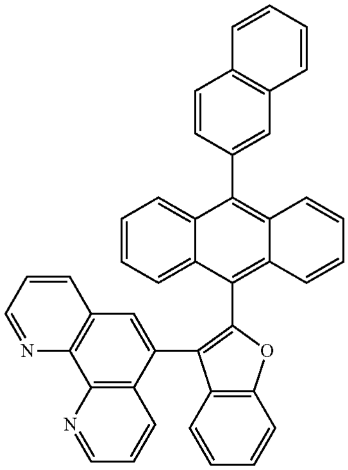
A-8
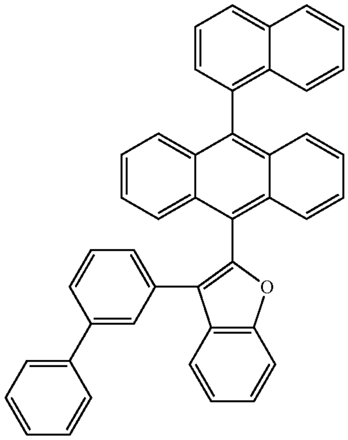
A-9
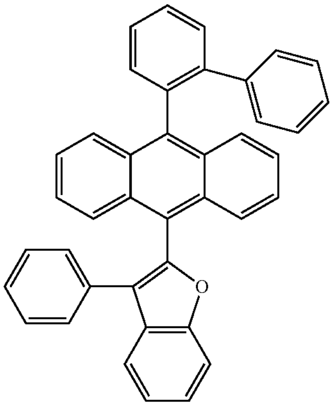

-continued
A-10
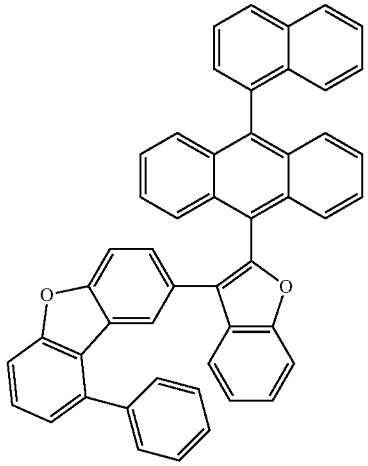
A-11
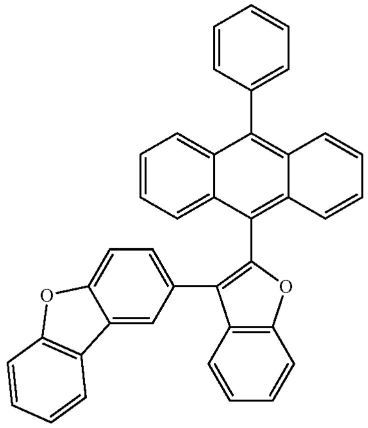
A-12
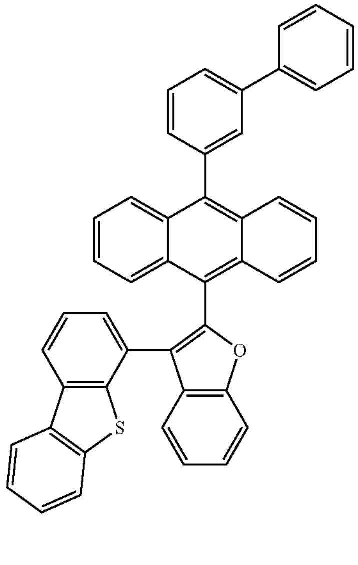
-continued
A-13
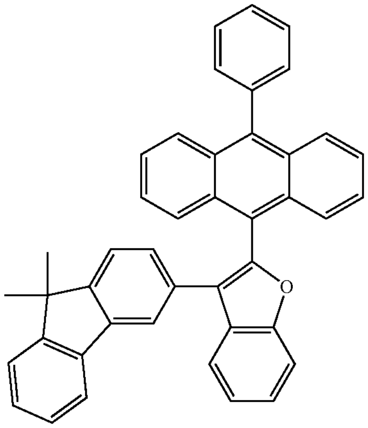
A-14
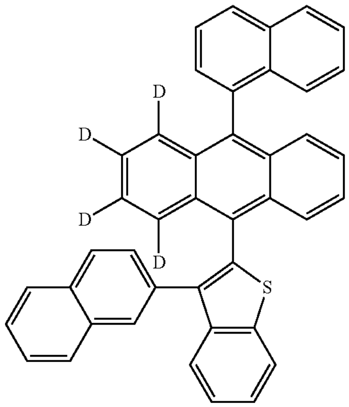
A-15
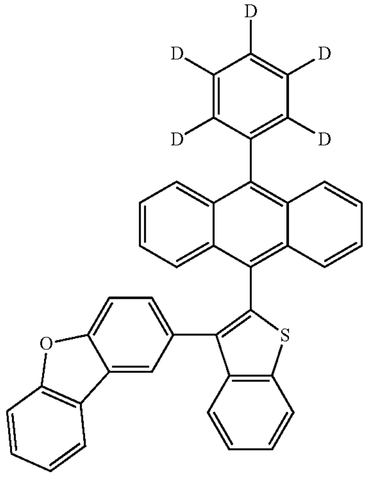

-continued
A-16
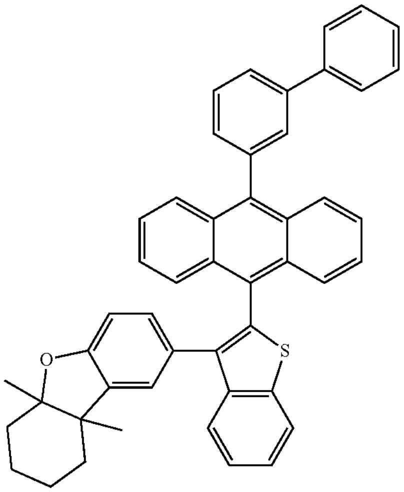
A-17
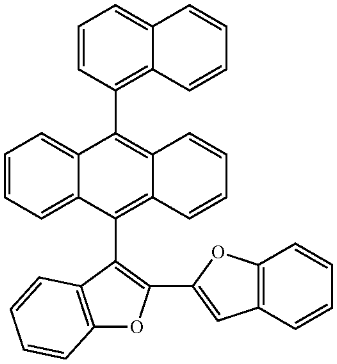
A-18
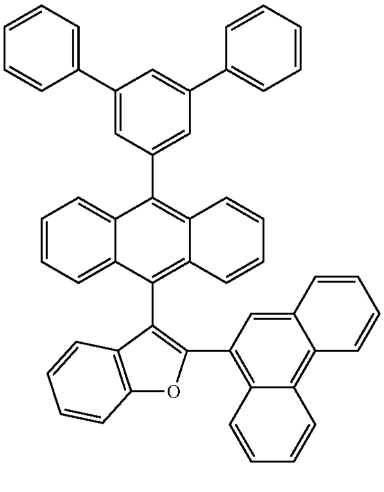
-continued
A-19
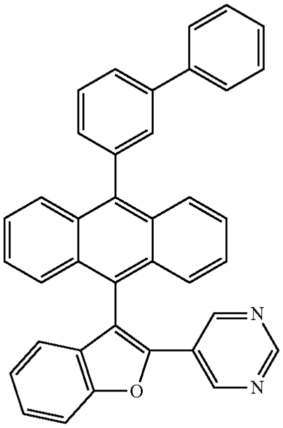
A-20
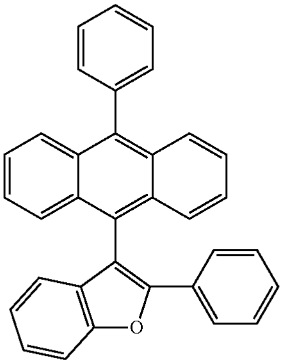
A-21
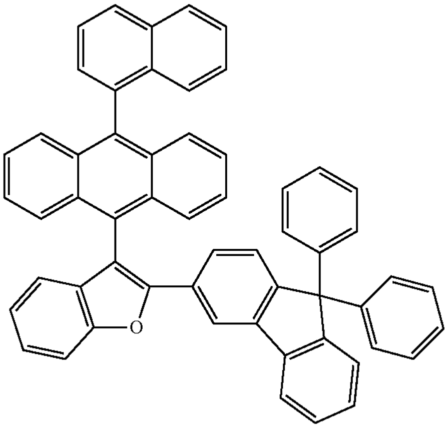
A-22
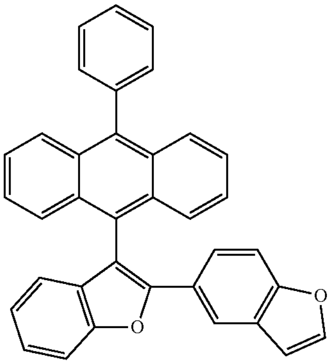

-continued
A-23
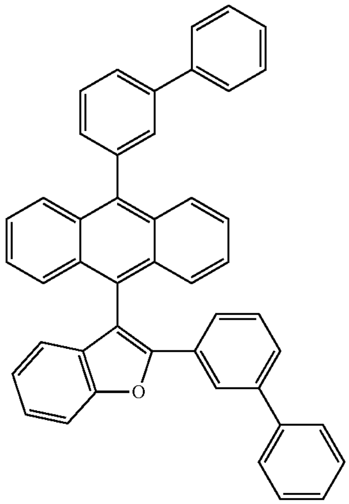
A-24
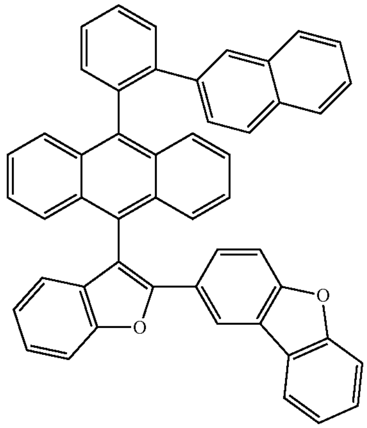
A-25
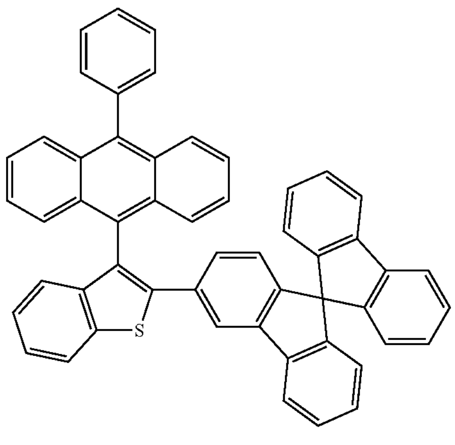
-continued
A-26
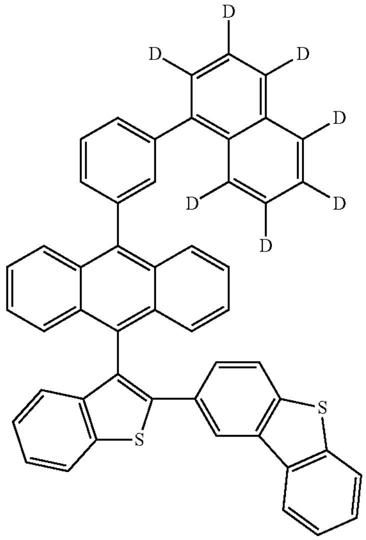
A-27
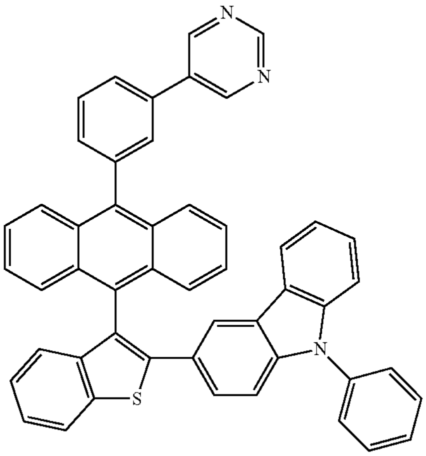
A-28
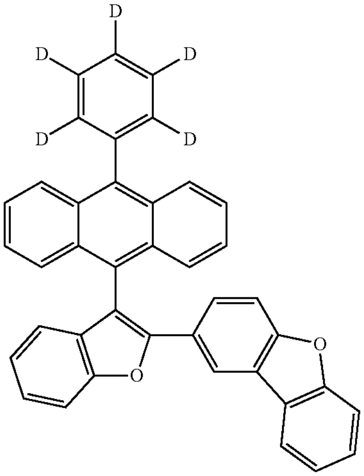

-continued
A-29
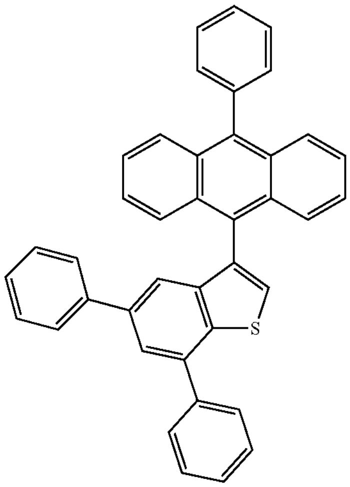
A-30
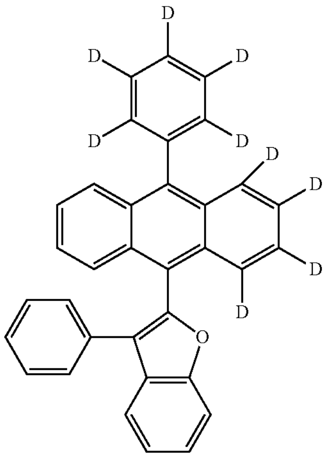
A-31
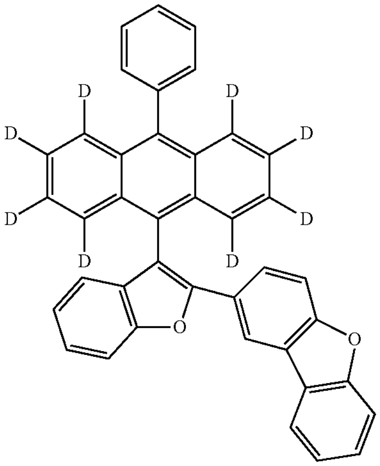
-continued
A-32
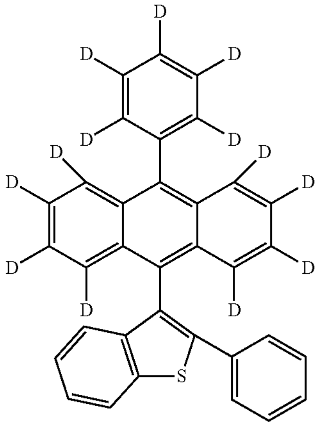
A-33
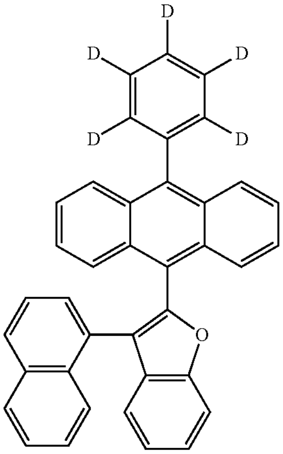
A-34
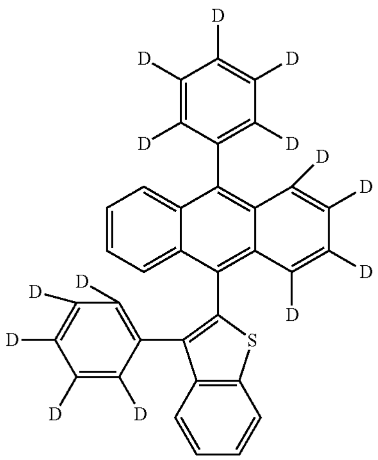

-continued
A-35
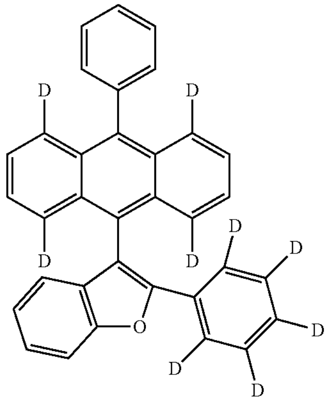
A-36
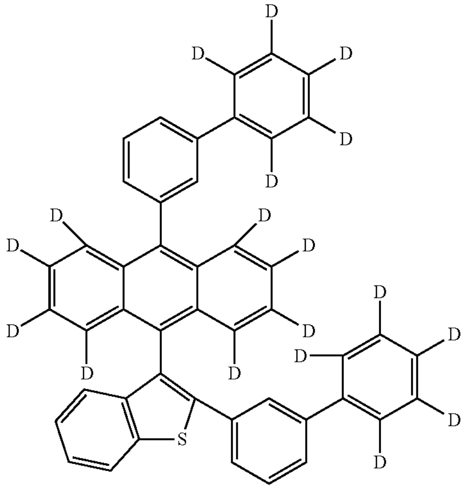
A-37
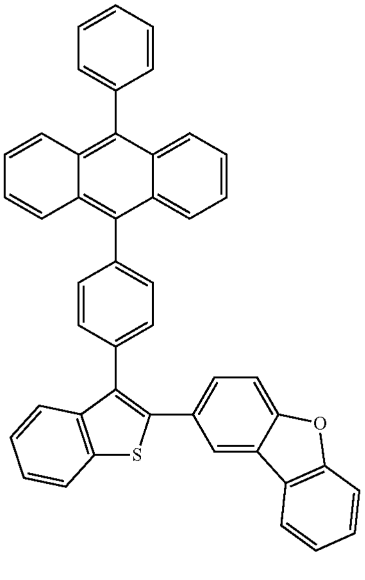
-continued
A-38
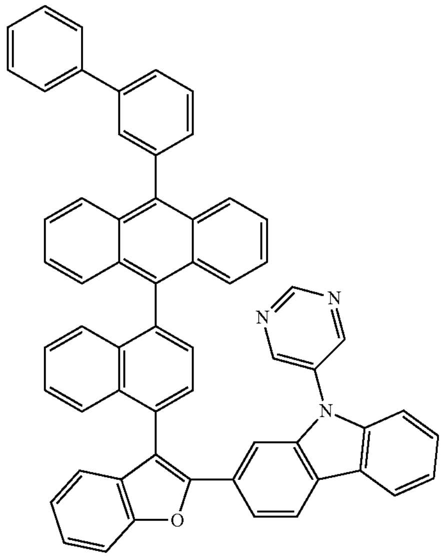
A-39
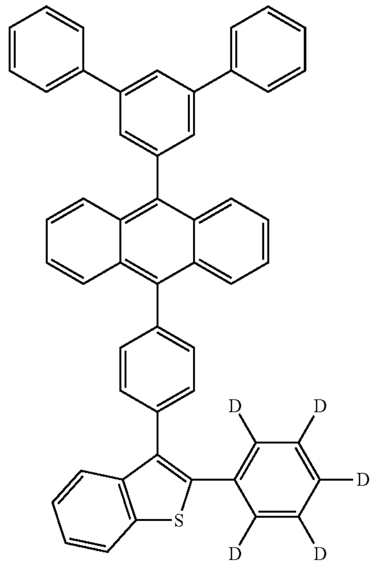
A-40
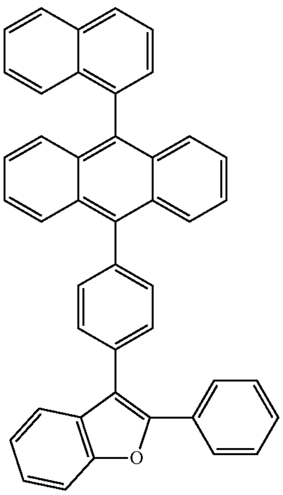

-continued
A-41
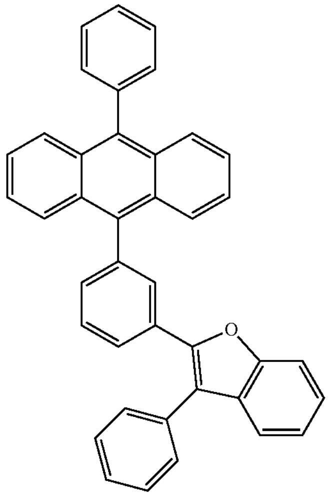
A-42
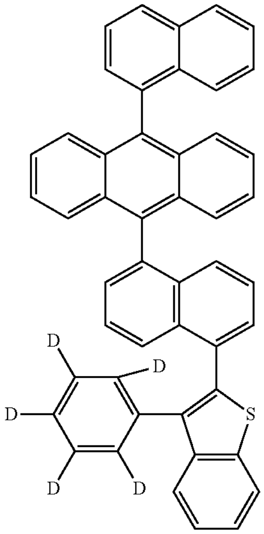
A-43
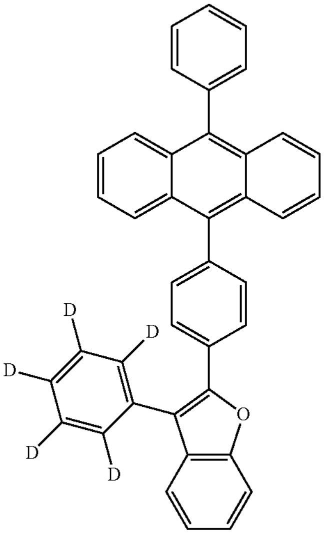
-continued
A-44
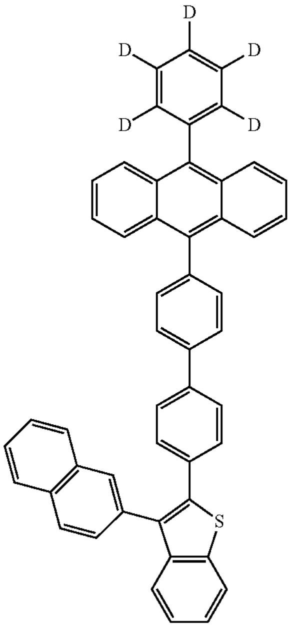
A-45
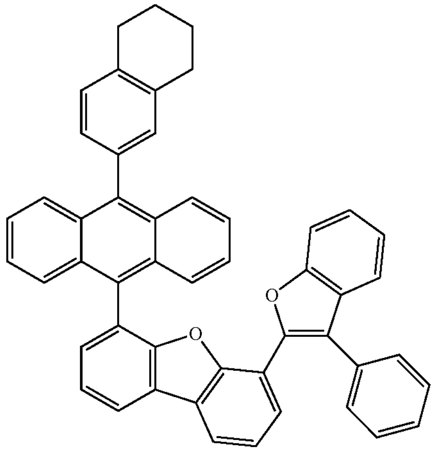
A-46
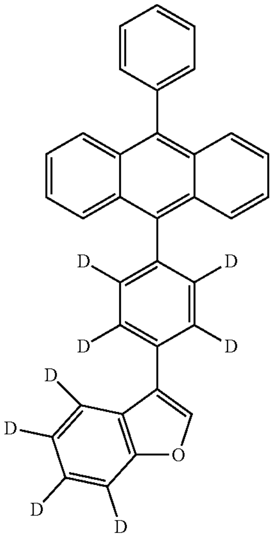

-continued
A-47
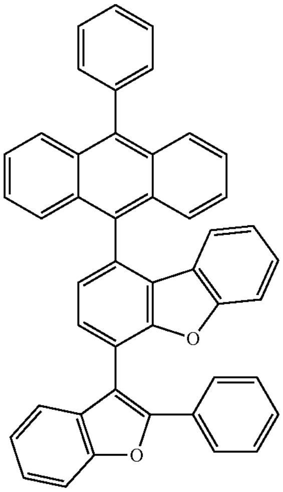
A-48
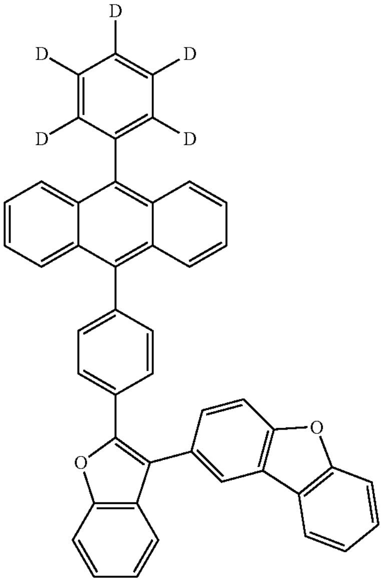
A-49
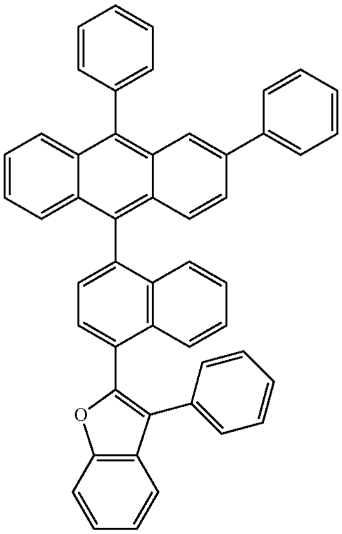
-continued
A-50
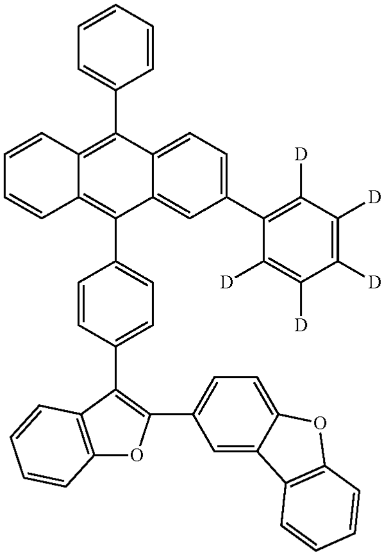
A-51
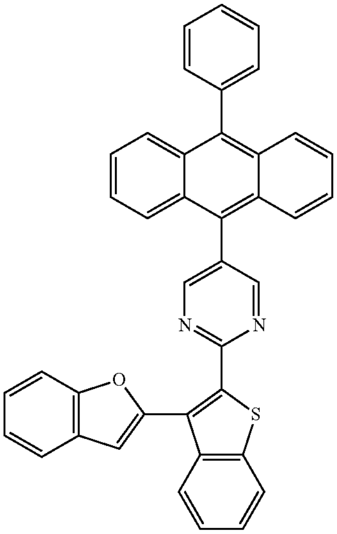

A-52
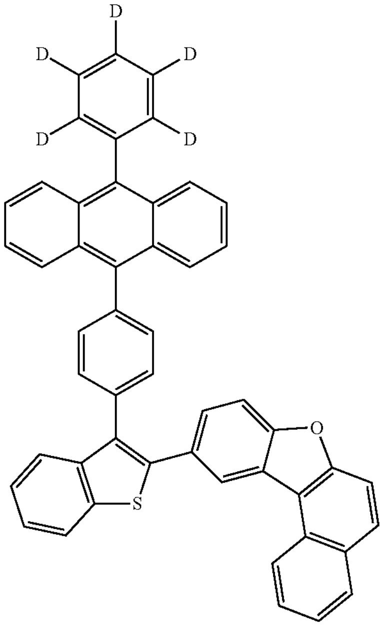
A-53
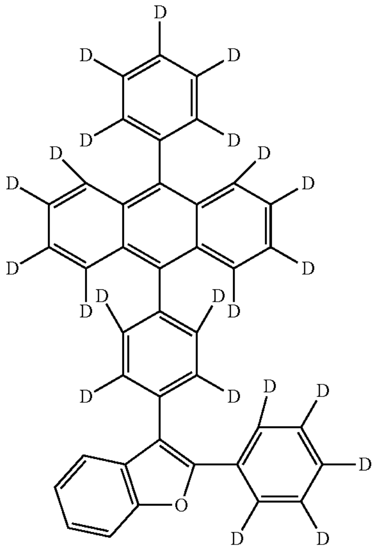
A-54
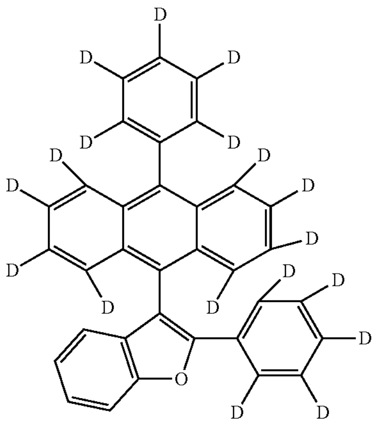
A-55
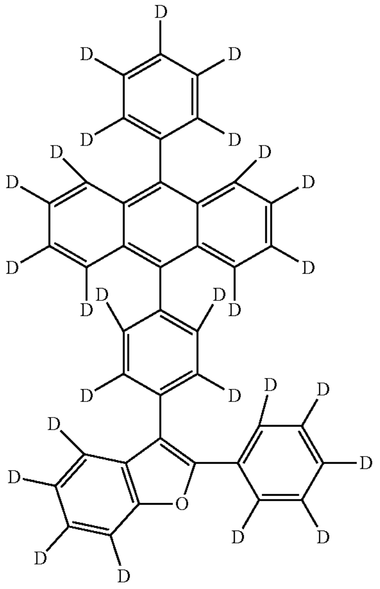
A-56
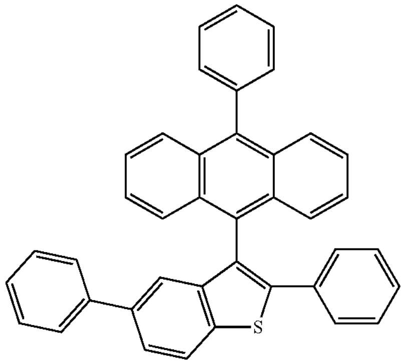
A-57
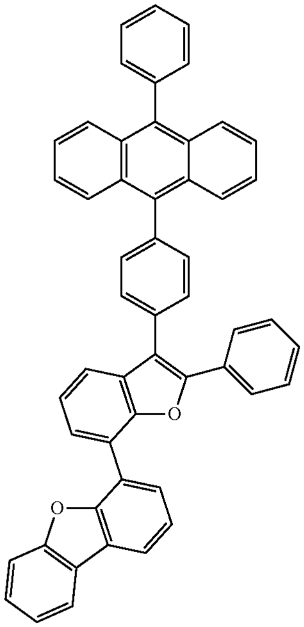

-continued
A-58
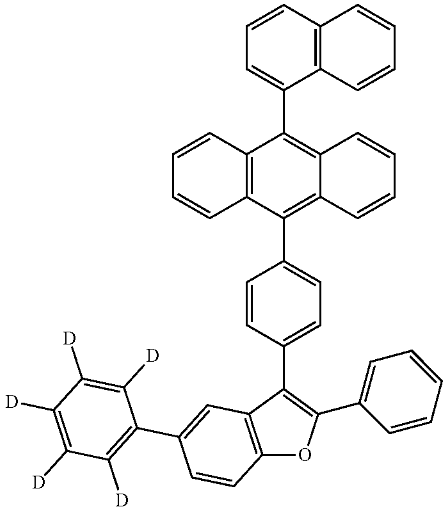
A-59
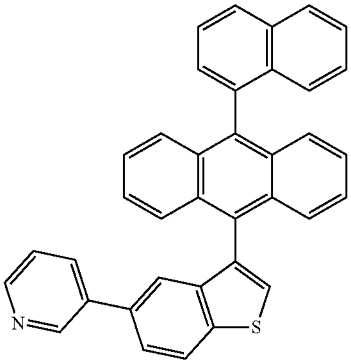
A-60
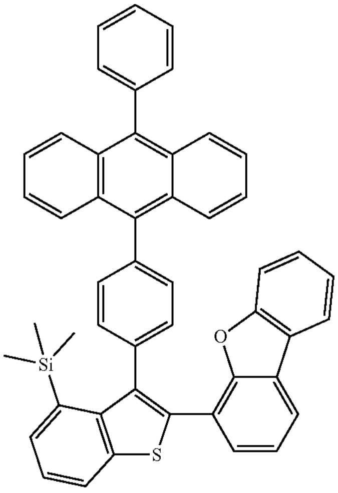
-continued
A-61
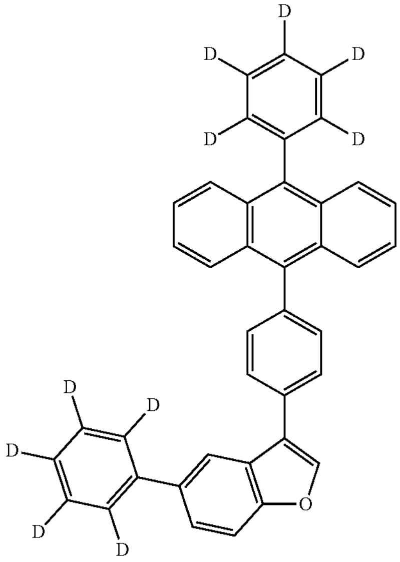
A-62
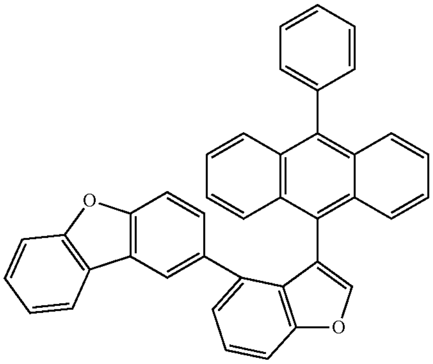
A-63
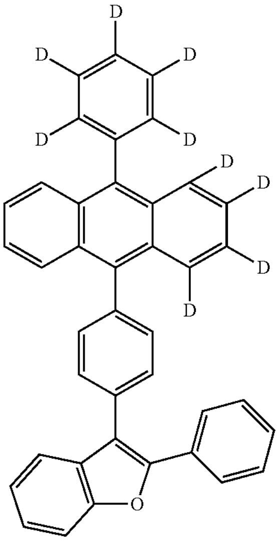

-continued
A-64
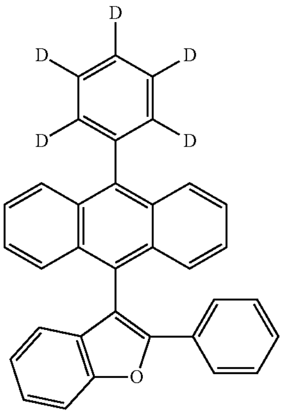
A-65
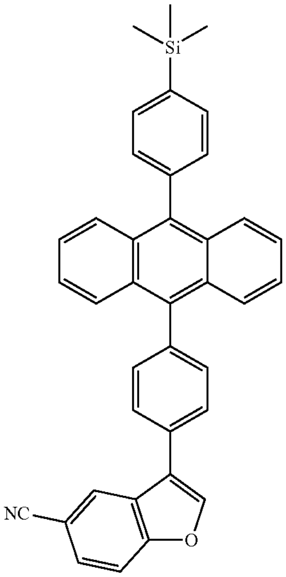
A-66
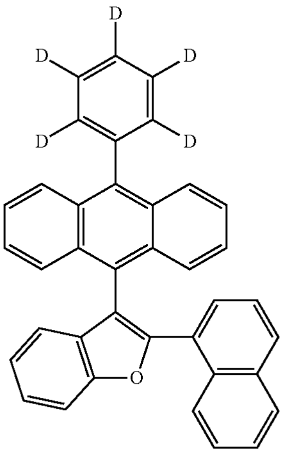
-continued
A-67
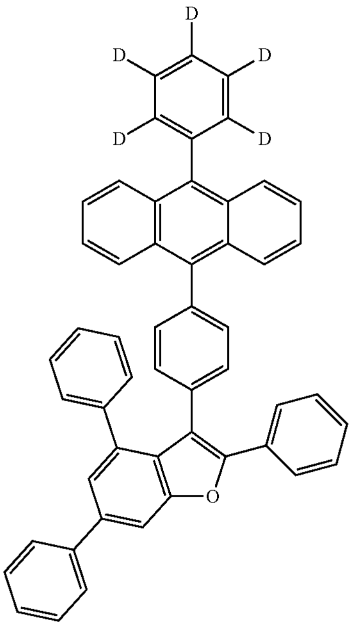
A-68
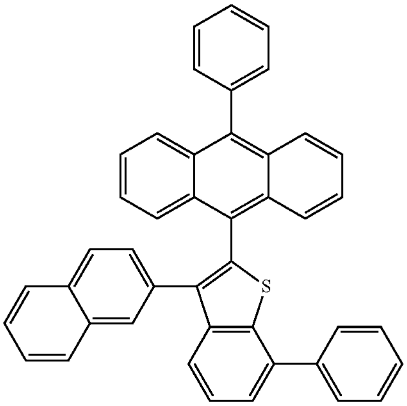
A-69
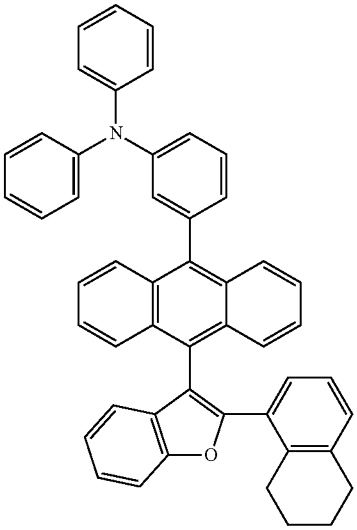

-continued
A-70
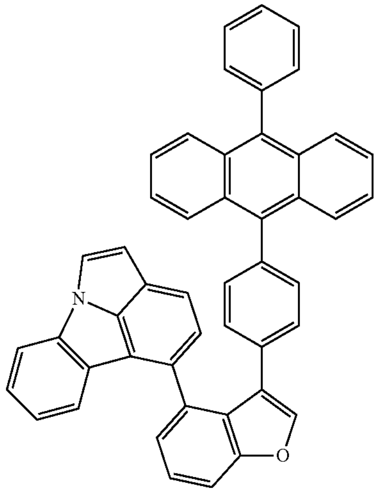
A-71
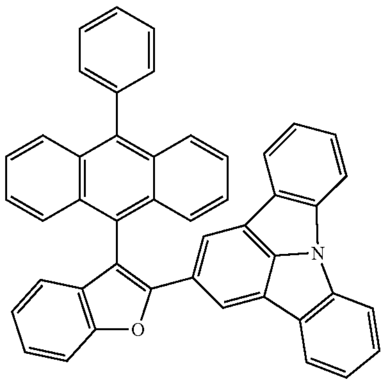
A-72
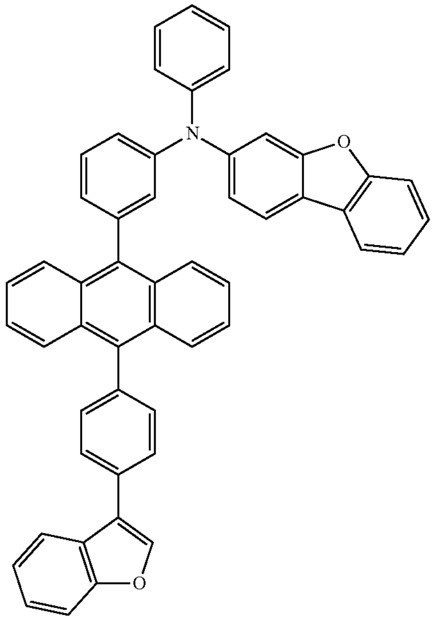
-continued
A-73
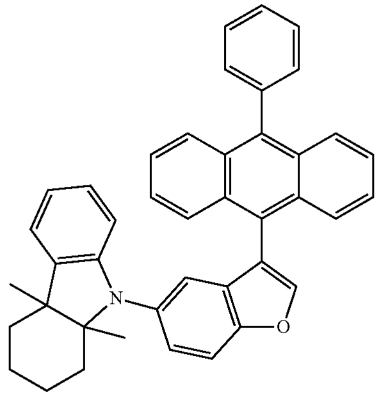
A-74
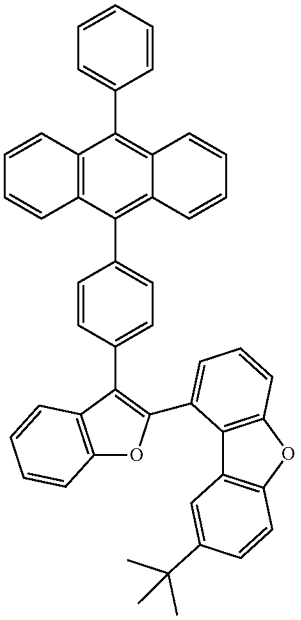
A-75
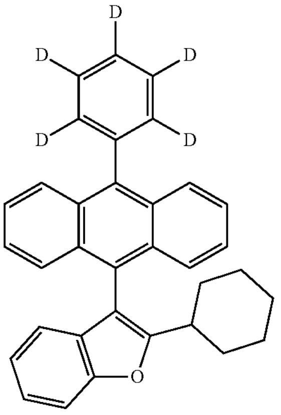

-continued
A-76
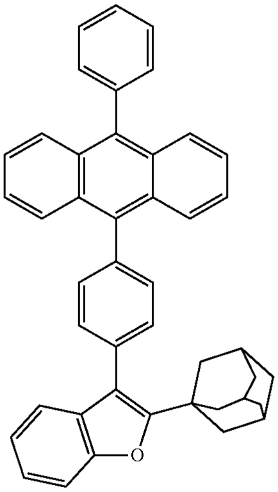
A-77
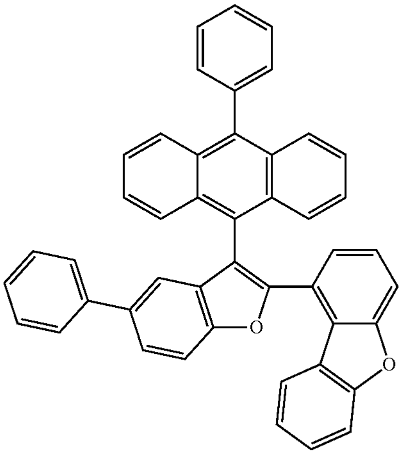
A-78
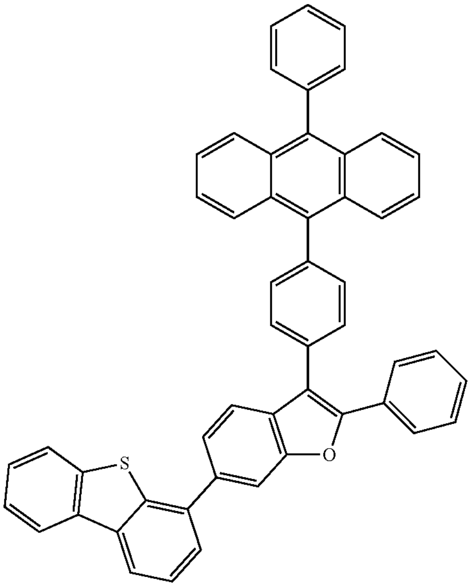
-continued
A-79
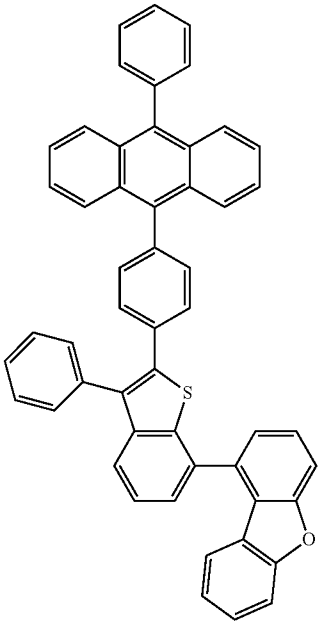
A-80
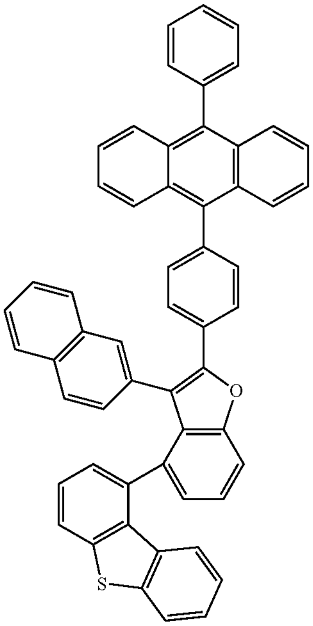

-continued
A-81
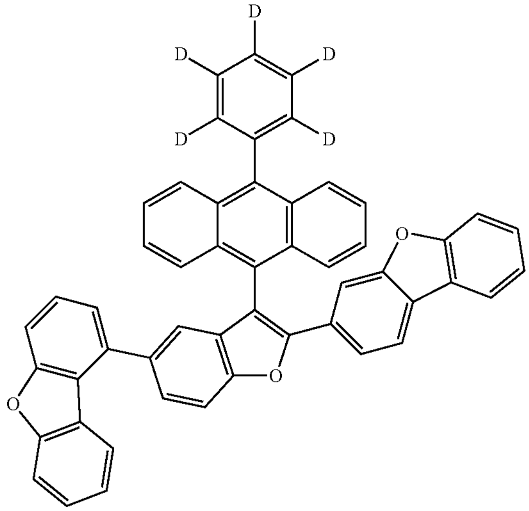
A-82
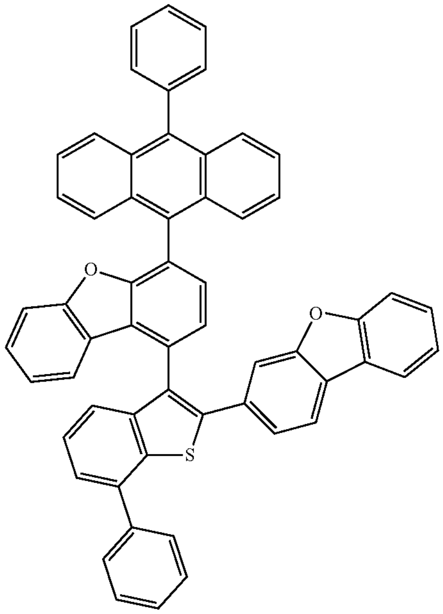
A-83
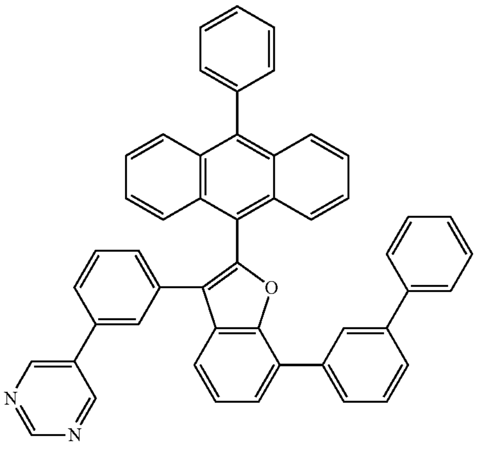
-continued
A-84
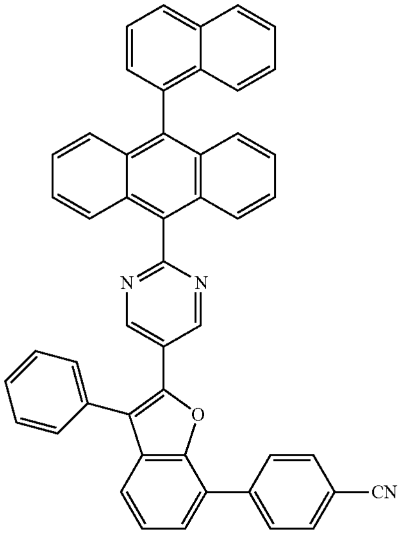
A-85
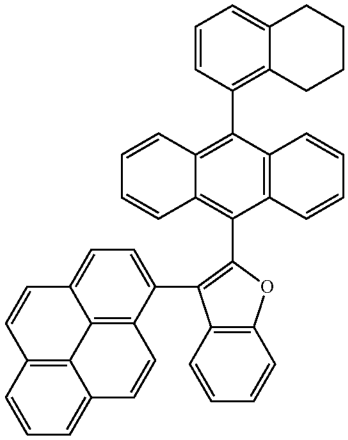
A-86
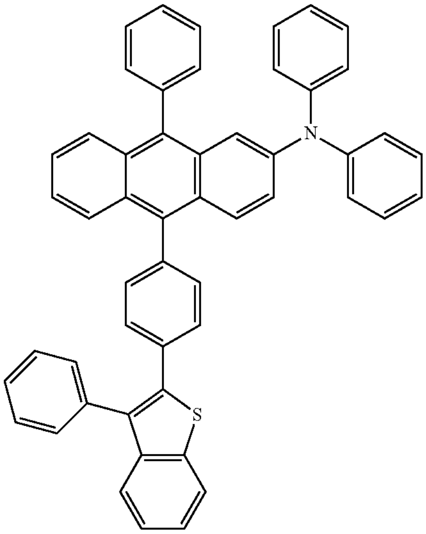

-continued
A-87
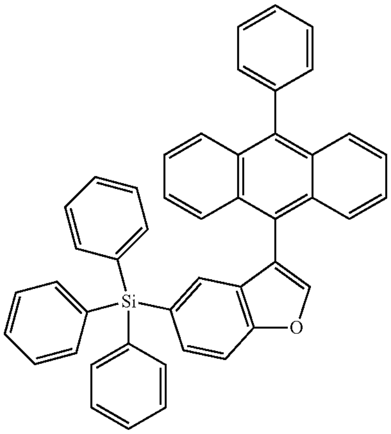
A-88
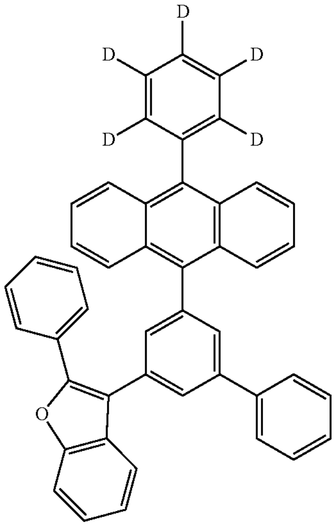
A-89
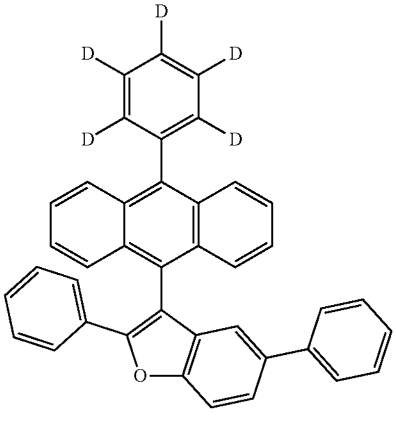
-continued
A-90
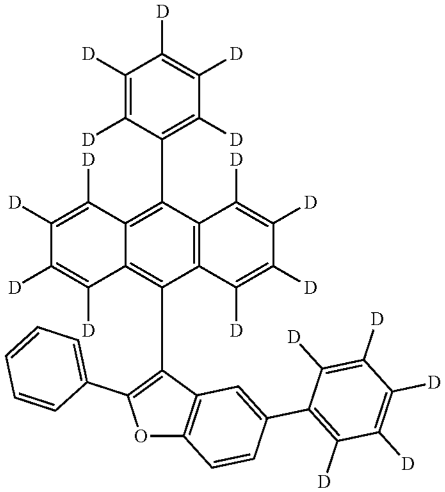
A-91
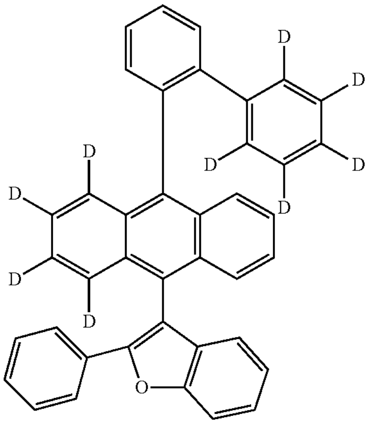
A-92
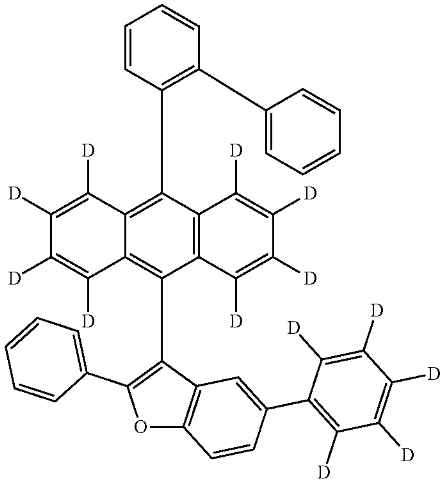

-continued
A-93
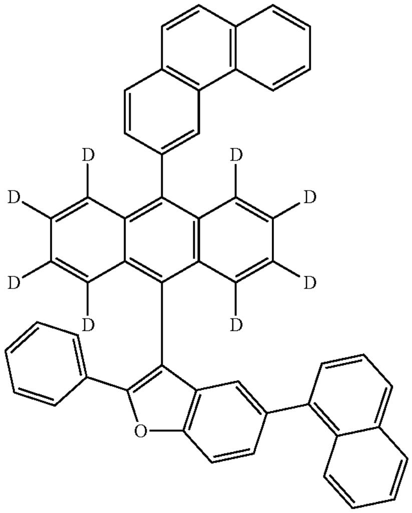
A-94
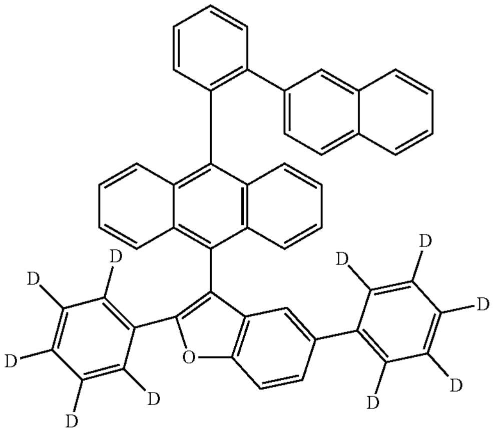
A-95
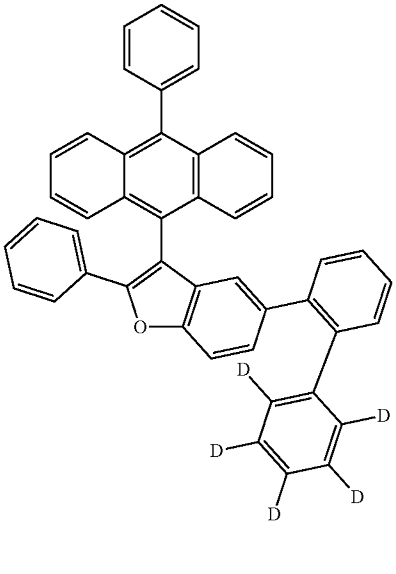
-continued
A-96
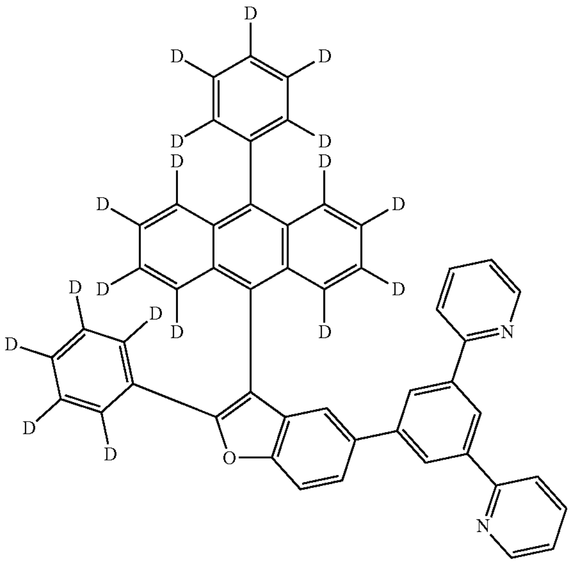
A-97
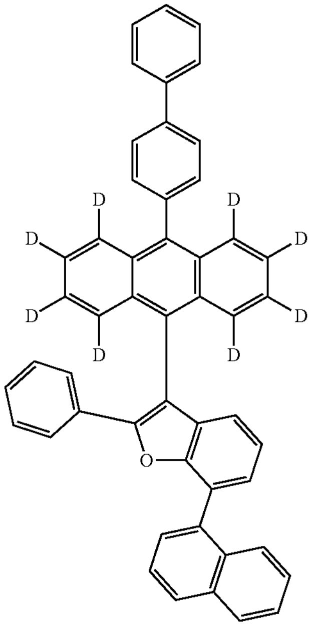

-continued
A-98
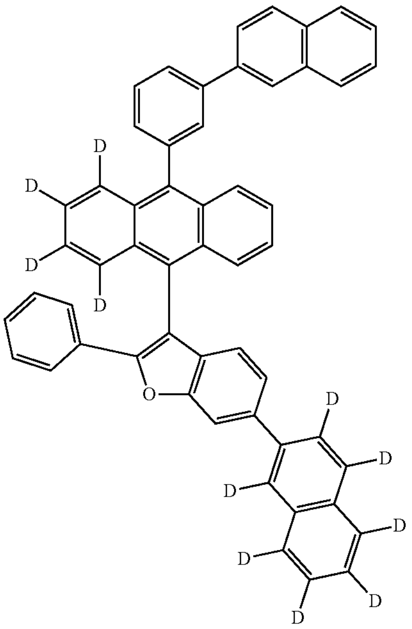
A-99
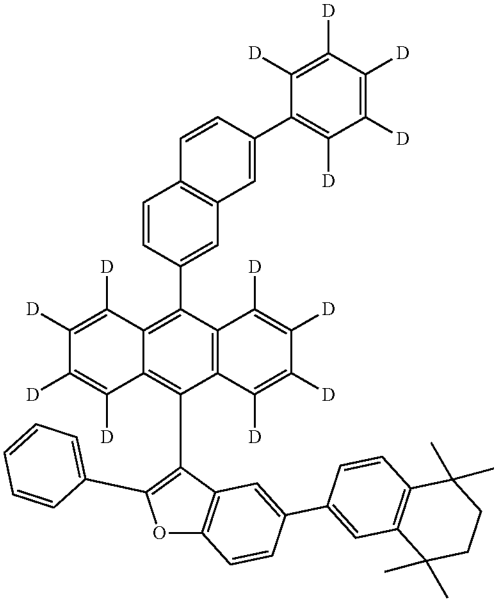
A-100
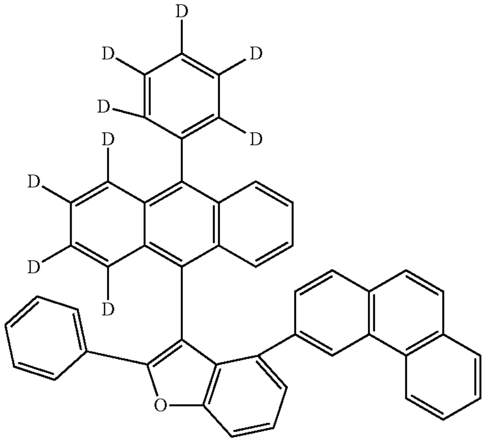
A-101
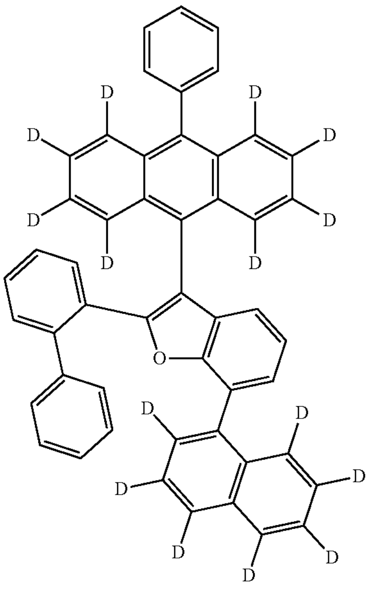
A-102
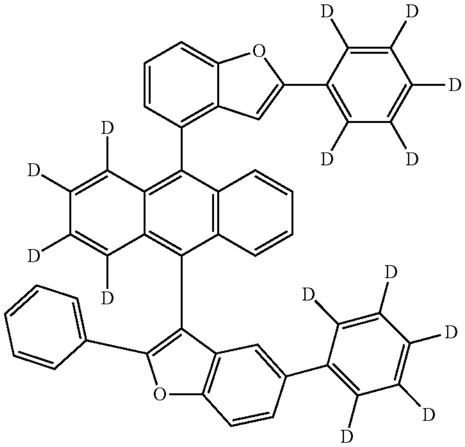

-continued
A-103
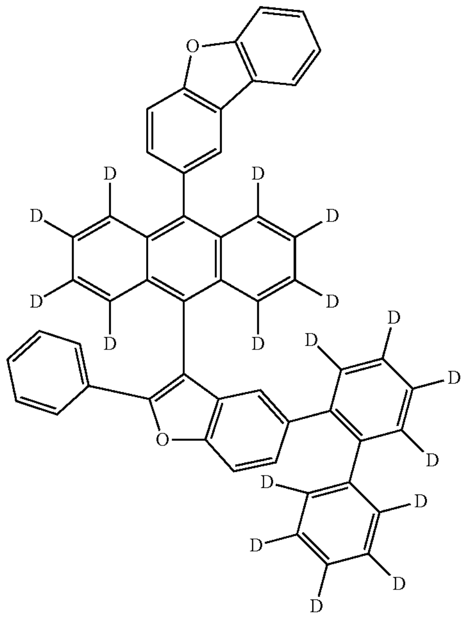
A-104
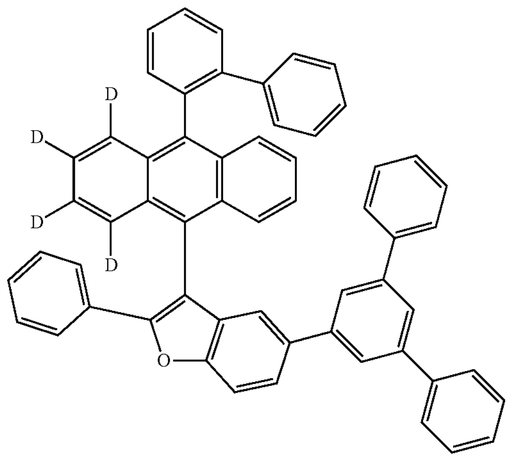
-continued
A-105
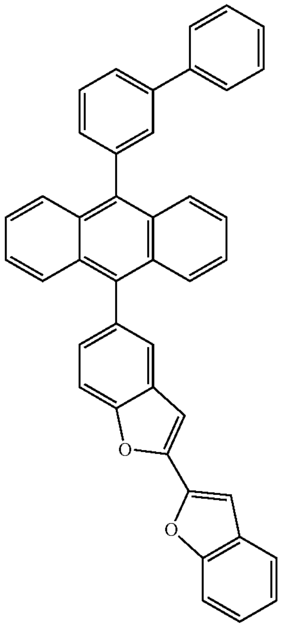
A-106
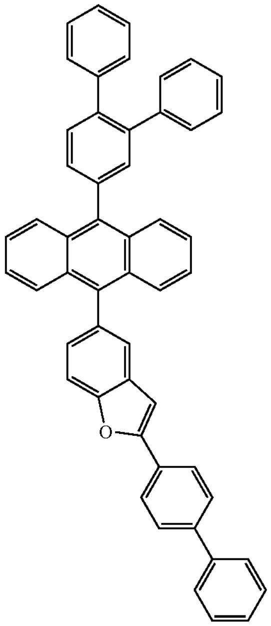

-continued
A-107
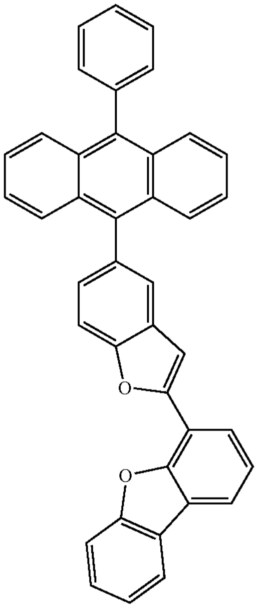
A-108
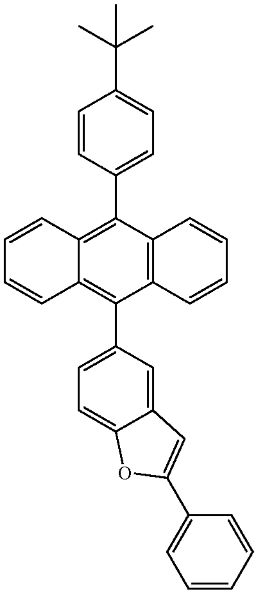
-continued
A-109
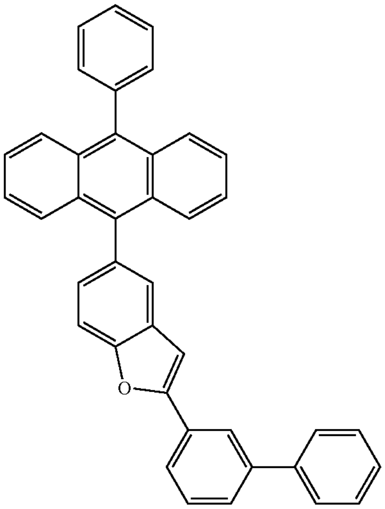
A-110
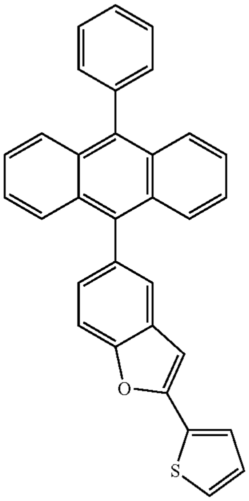
A-111
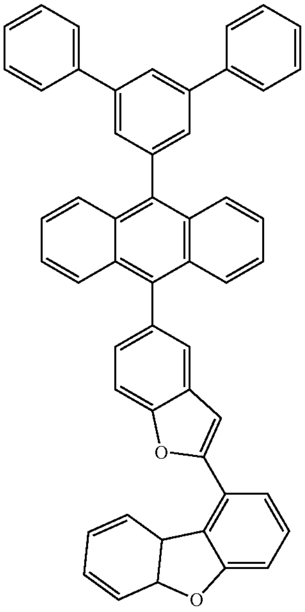

-continued
A-112
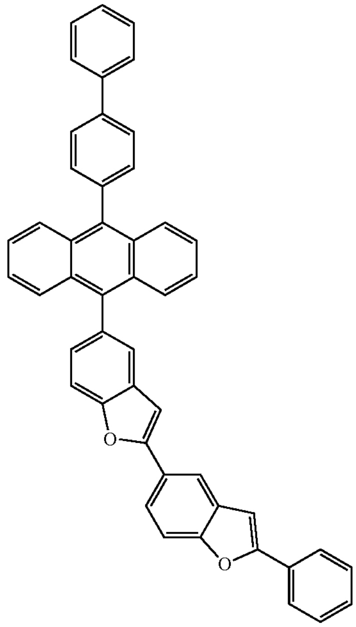
A-113
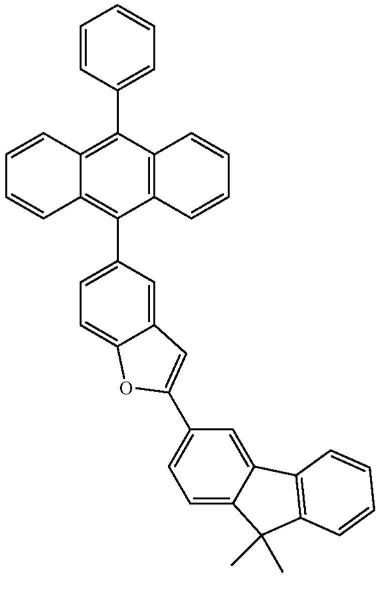
-continued
A-114
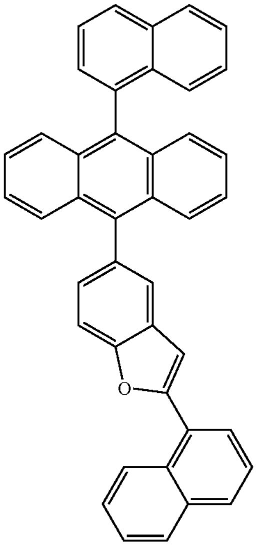
A-115
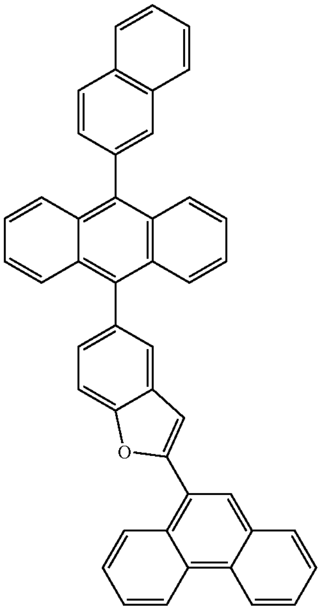
A-116
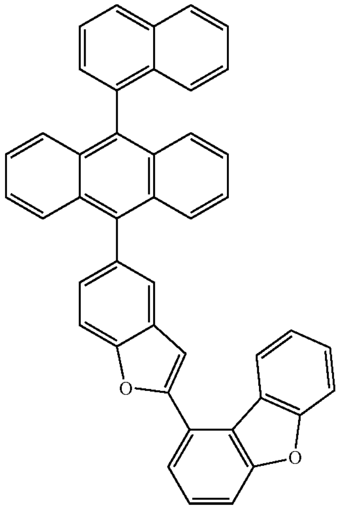

-continued
A-117
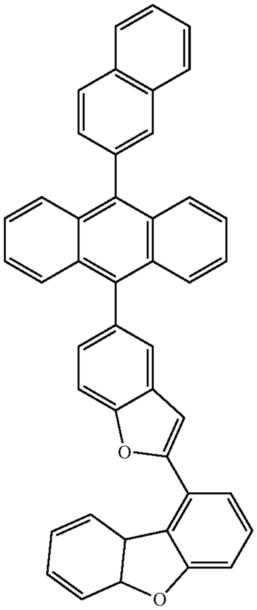
A-118
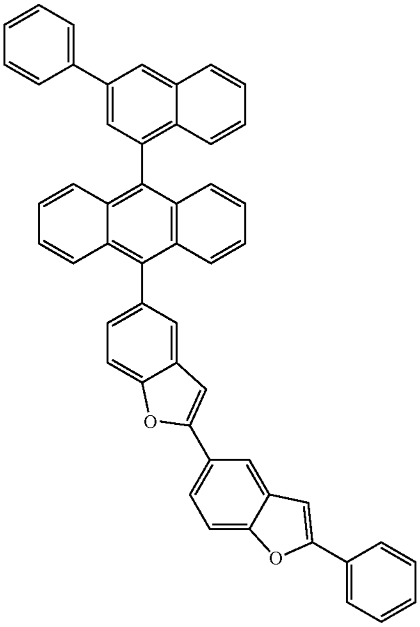
A-119
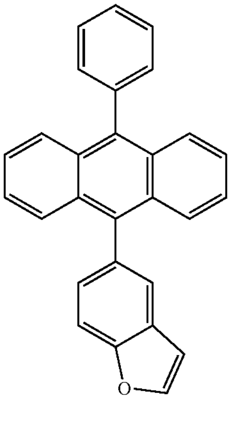
-continued
A-120
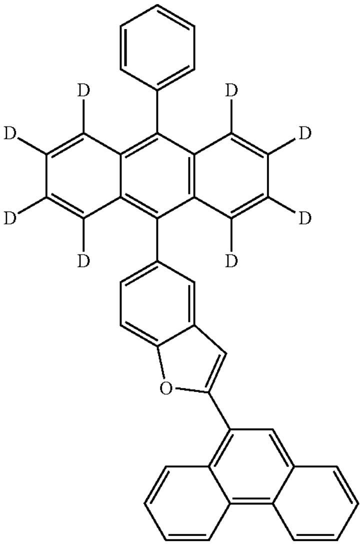
A-121
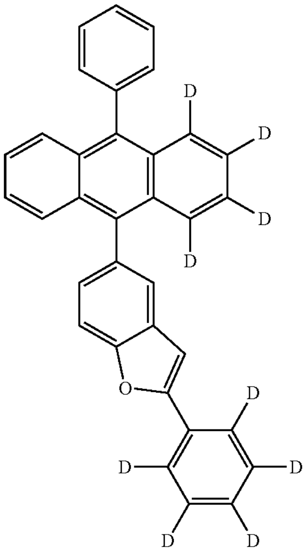

-continued
A-122
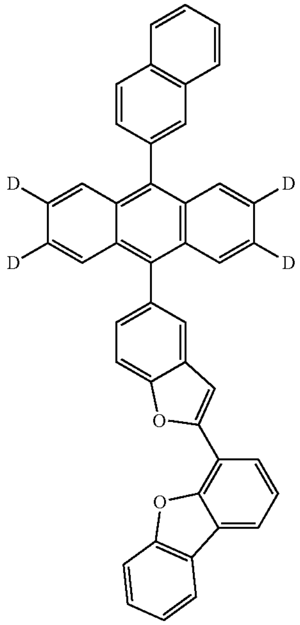
A-123
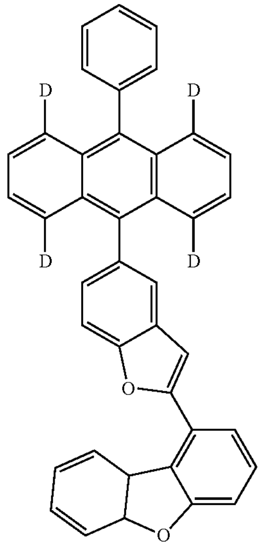
-continued
A-124
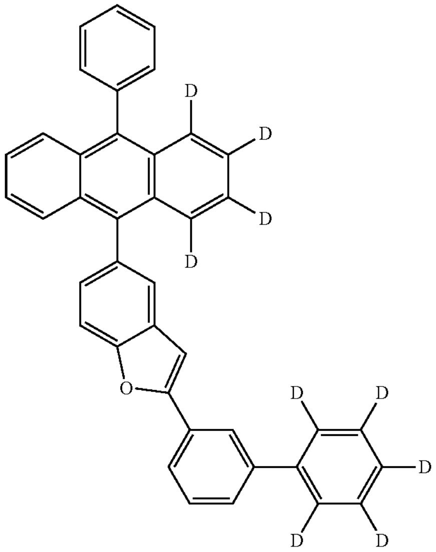
A-125
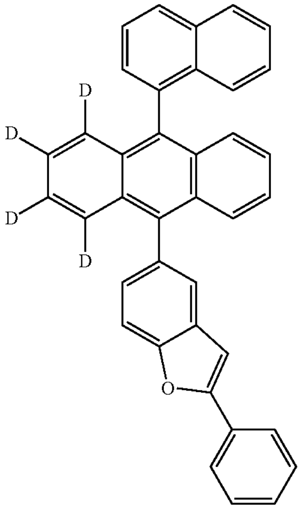
A-126
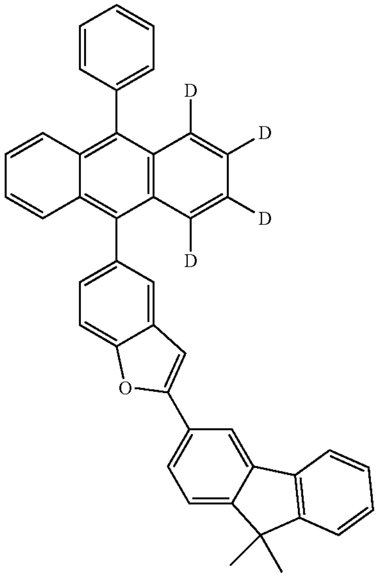

-continued
A-127
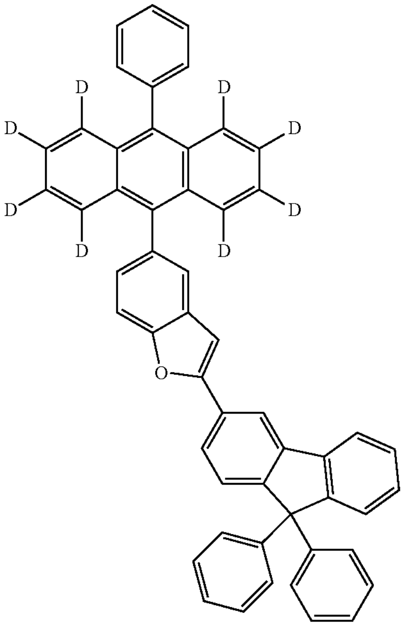
A-128
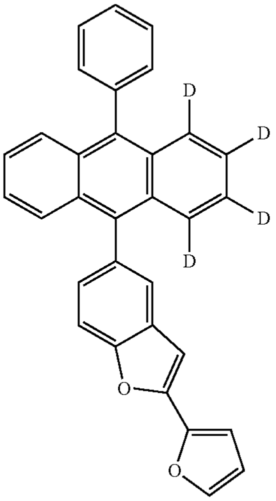
-continued
A-129
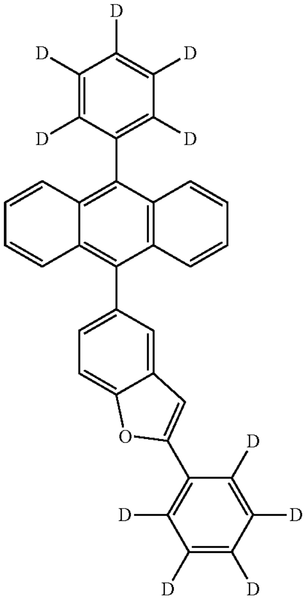
A-130
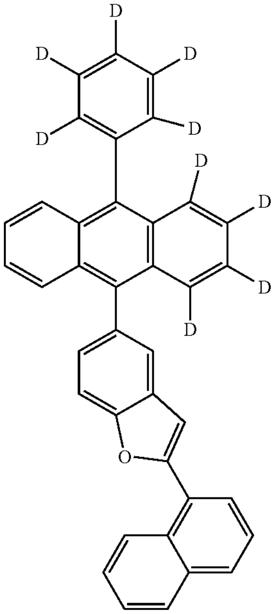

-continued
A-131
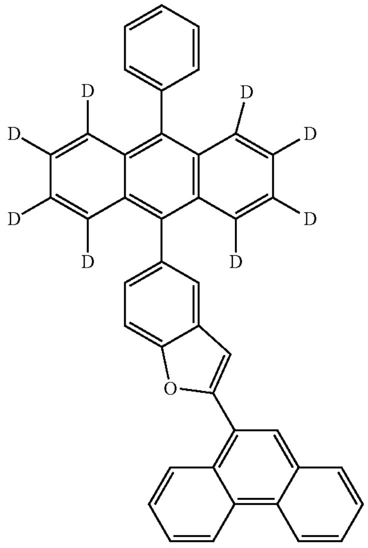
A-132
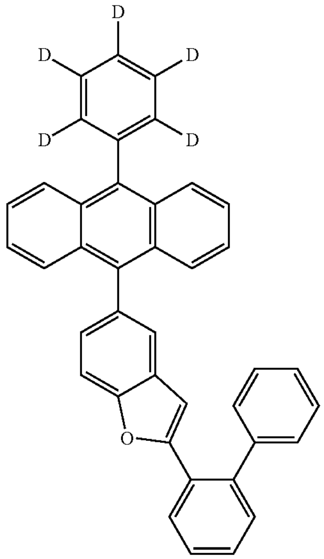
-continued
A-133
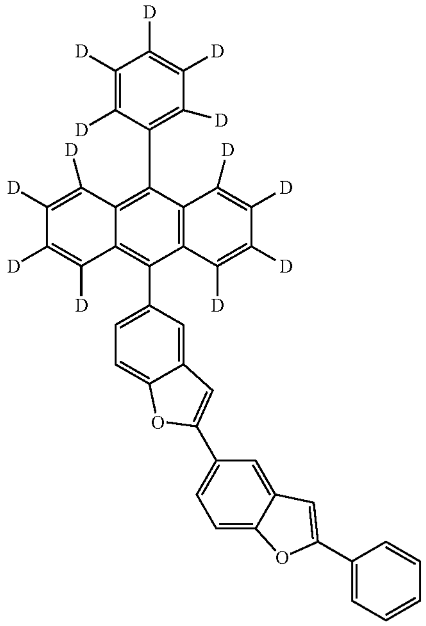
A-134
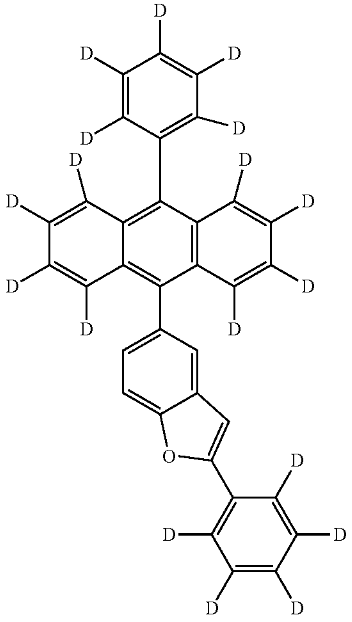

-continued
A-135
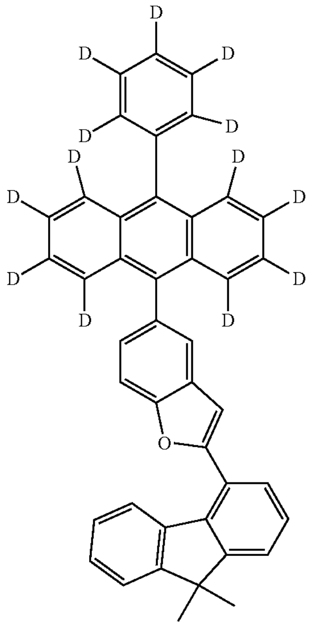
A-136
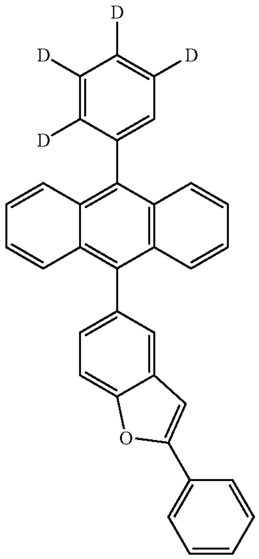
-continued
A-137
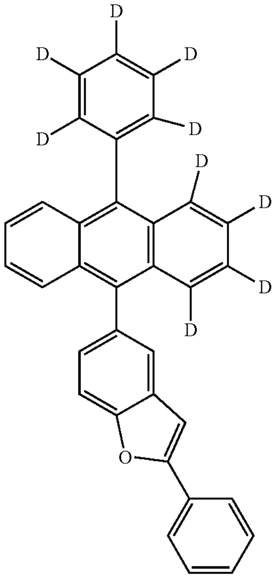
A-138
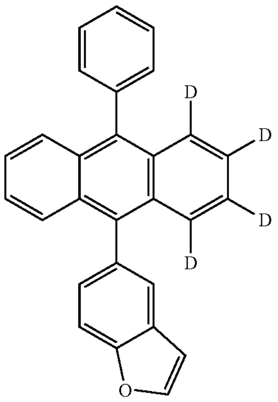
A-139
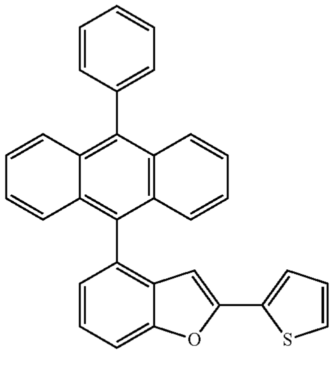

-continued
A-140
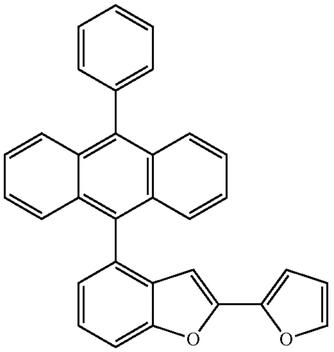
A-141
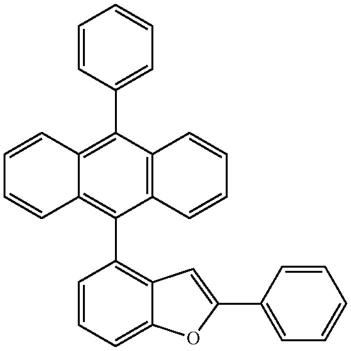
A-142
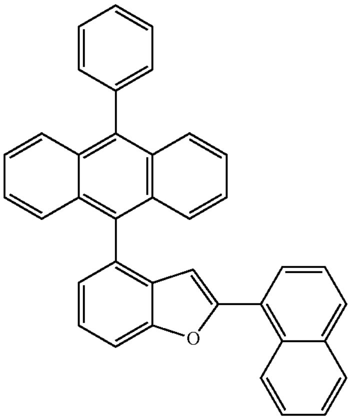
A-143
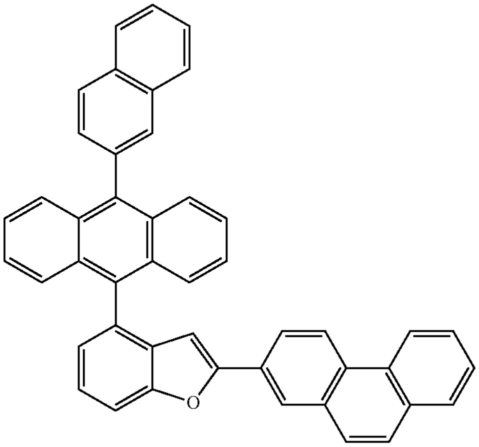
-continued
A-144
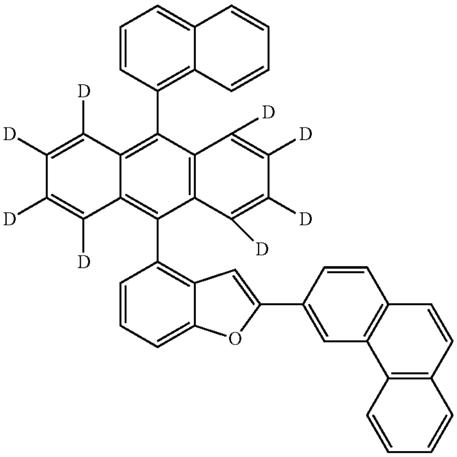
A-145
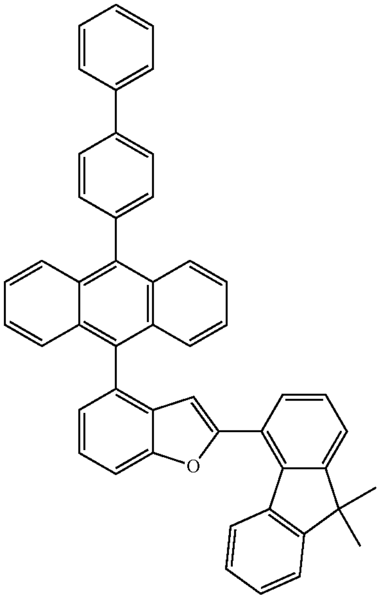
A-146
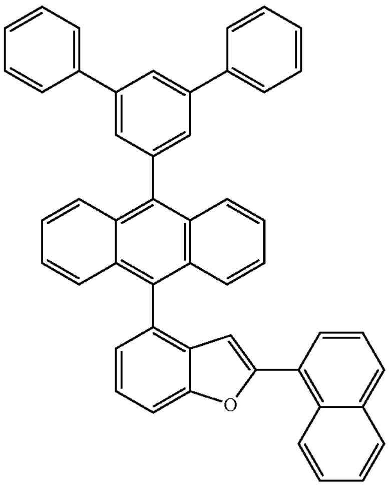

-continued
A-147
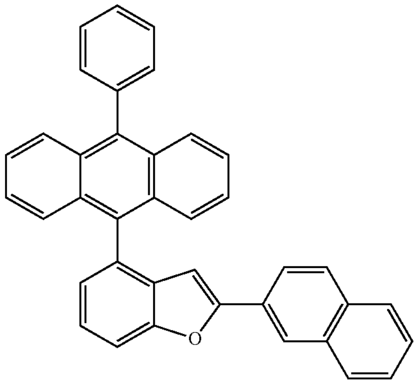
A-148
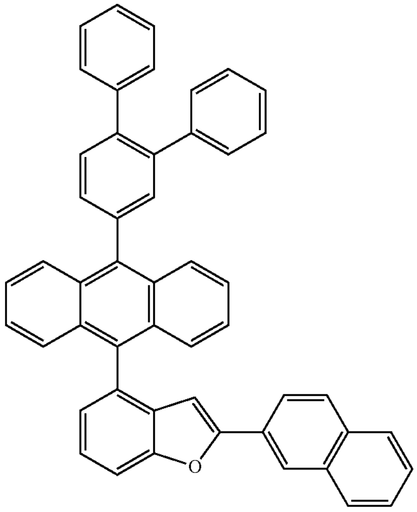
A-149
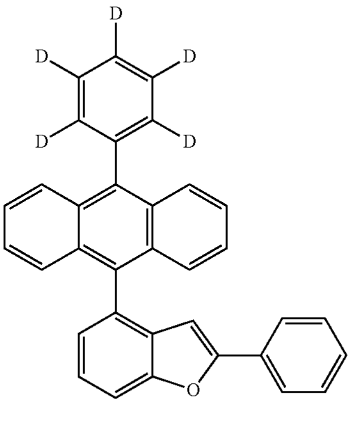
-continued
A-150
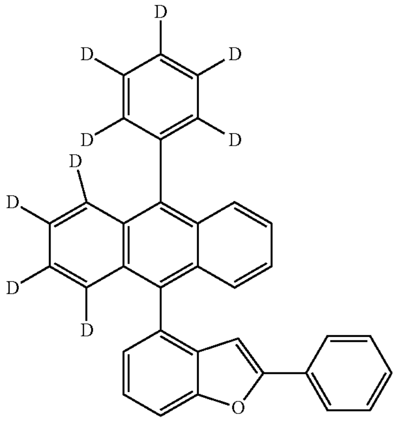
A-151
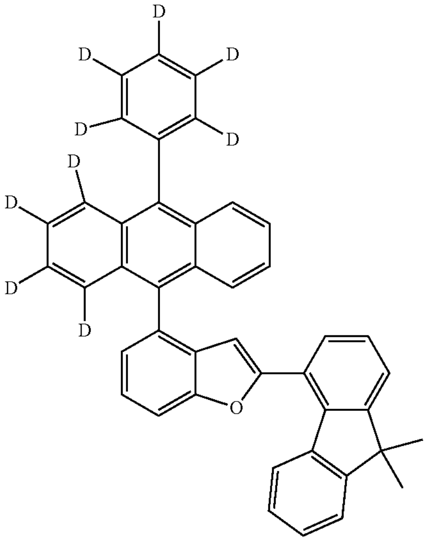
A-152
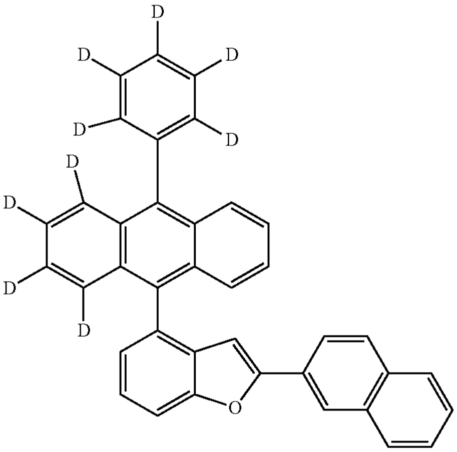

-continued
A-153
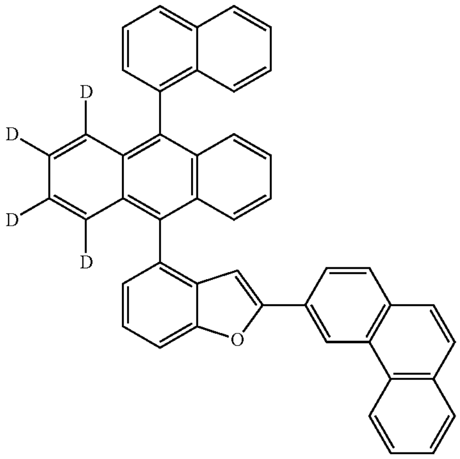
A-154
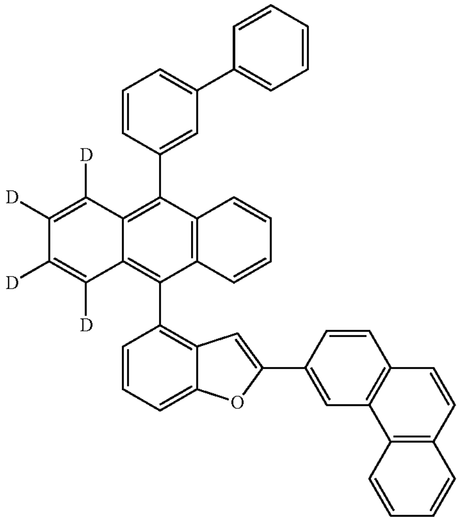
A-155
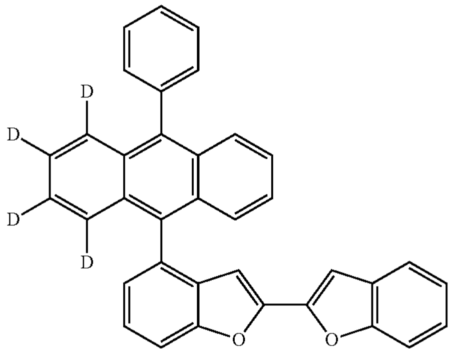
-continued
A-156
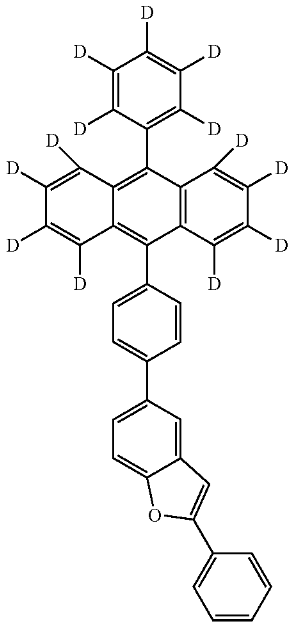
A-157
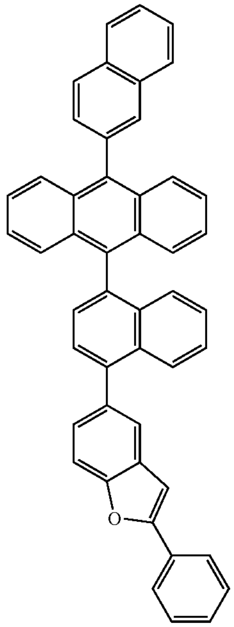

-continued
A-158
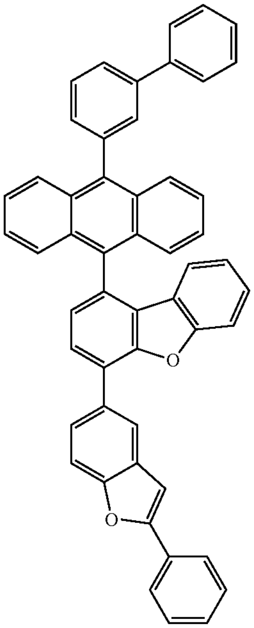
A-159
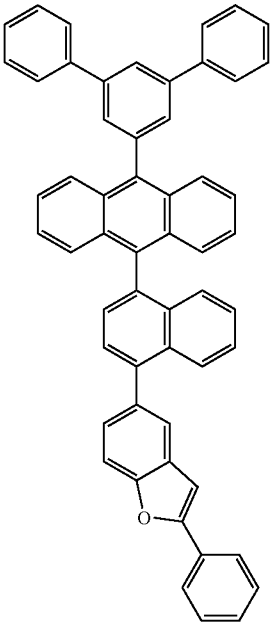
-continued
A-160
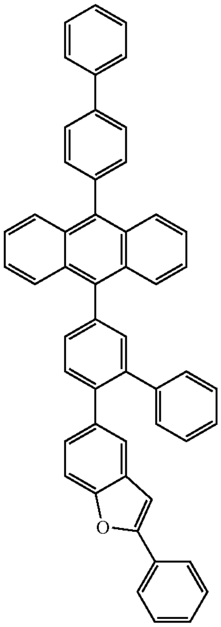
A-161
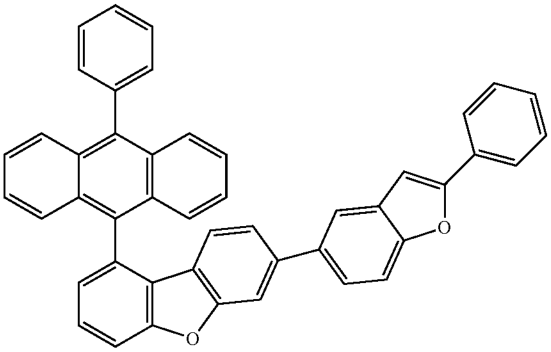
A-162
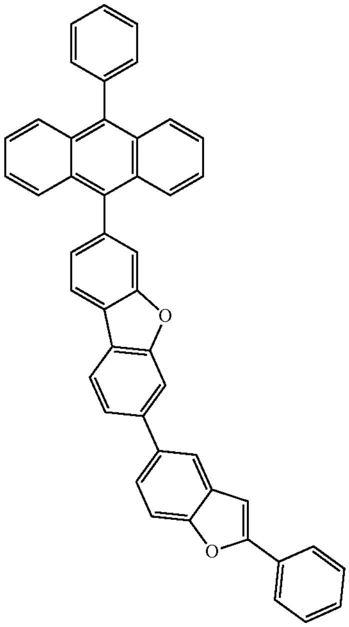

-continued
A-163
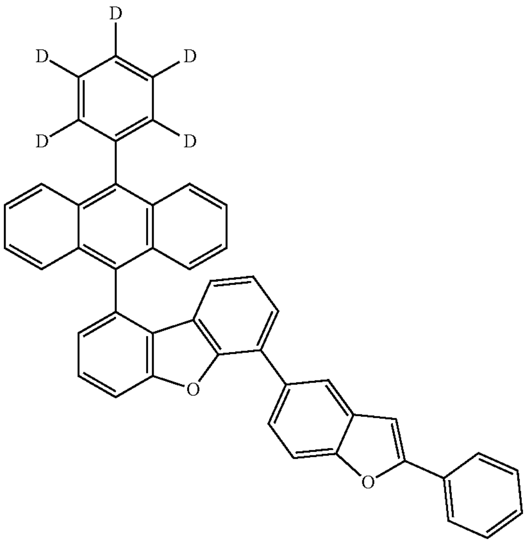
A-164
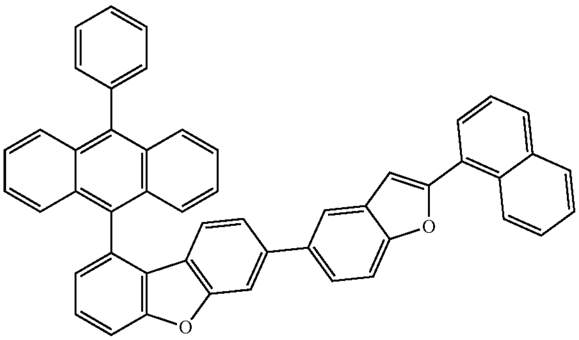
A-165
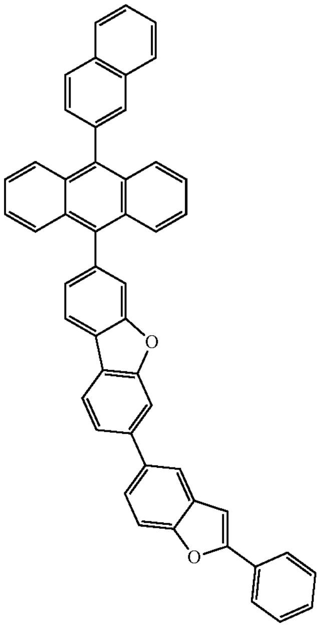
-continued
A-166
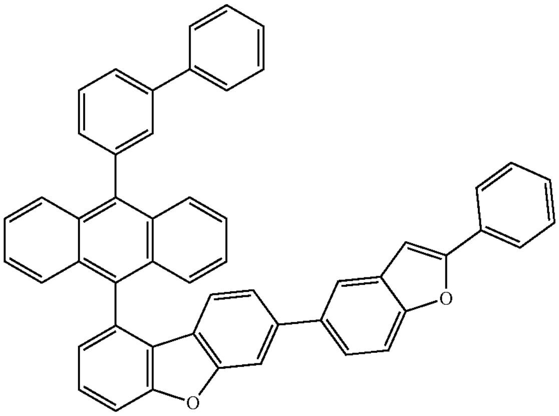
A-167
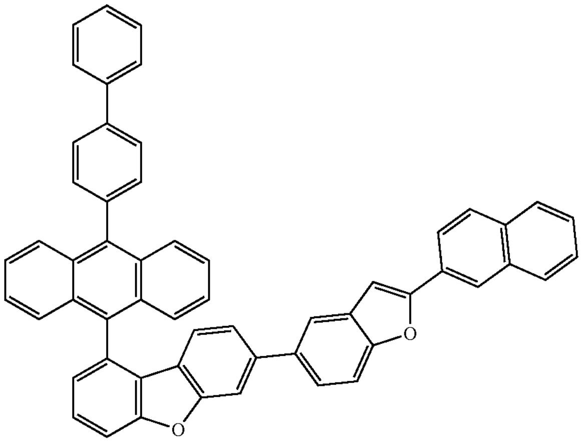
A-168
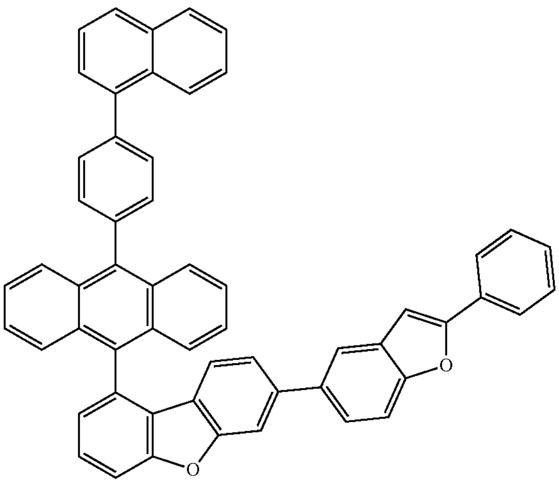

-continued
A-169
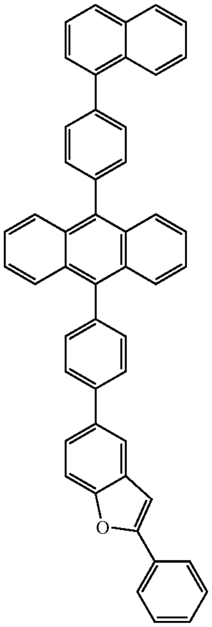
A-170
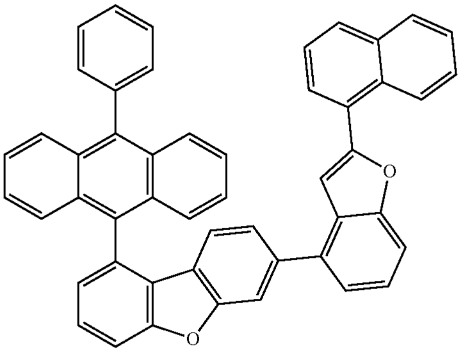
A-171
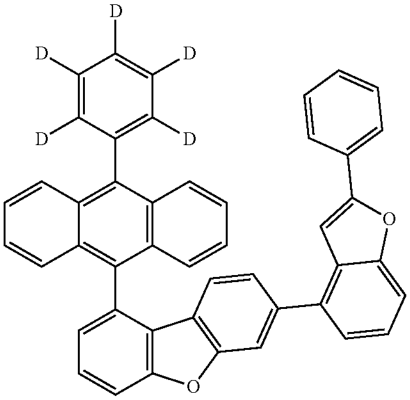
-continued
A-172
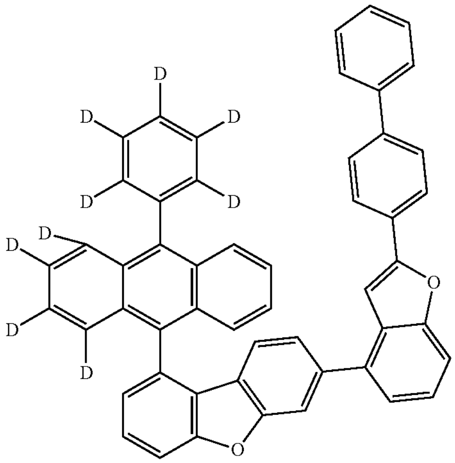
A-173
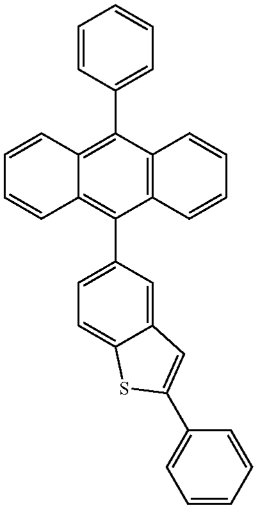
A-174
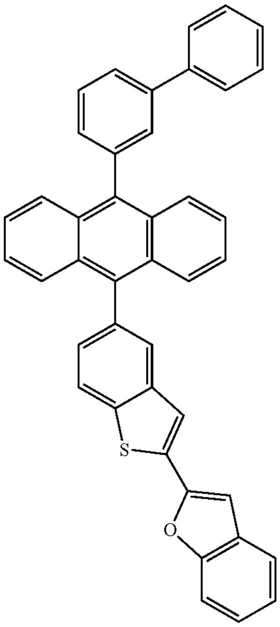

-continued
A-175
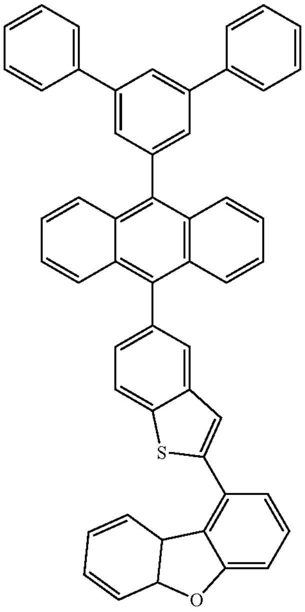
A-176
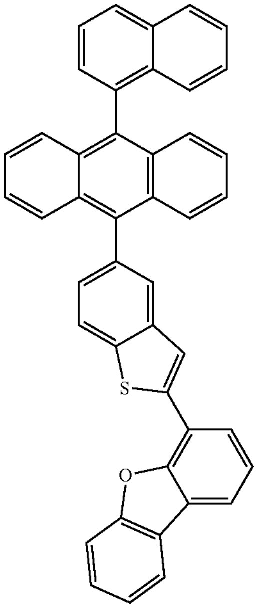
-continued
A-177
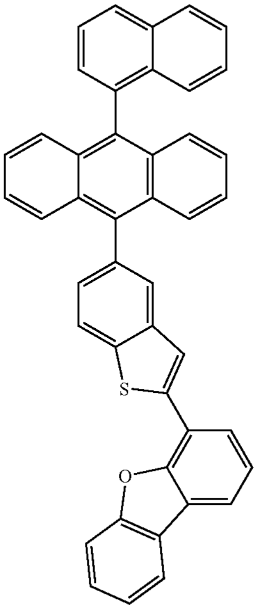
A-178
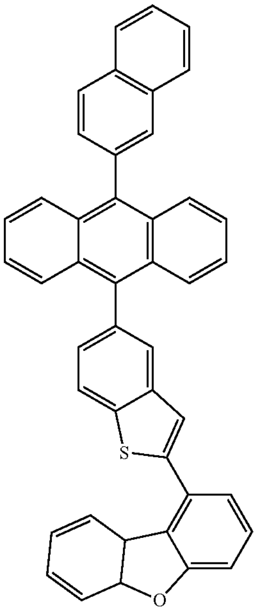

-continued
A-179
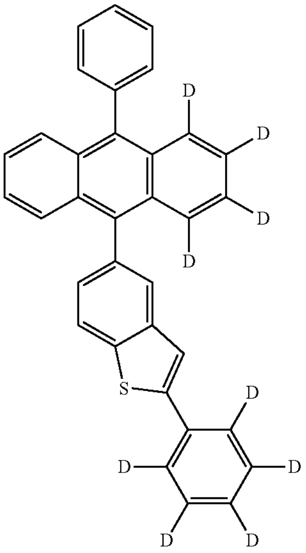
A-180
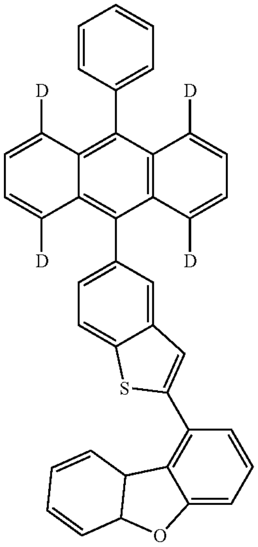
A-181
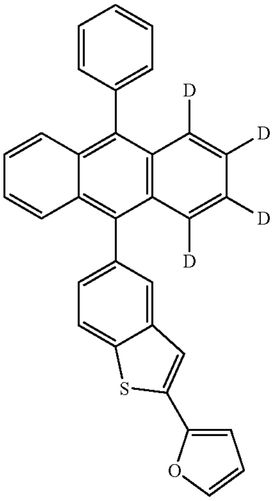
-continued
A-182
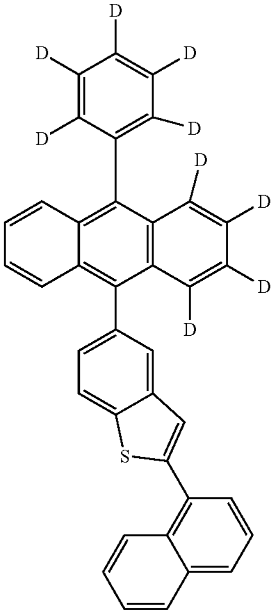
A-183
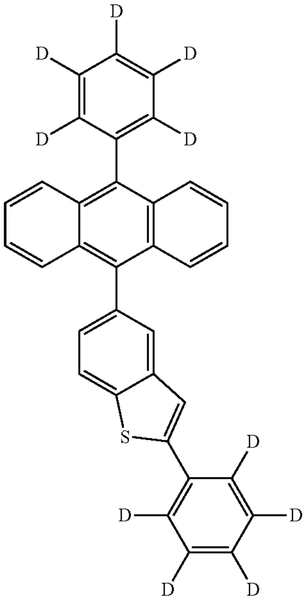

-continued
A-184
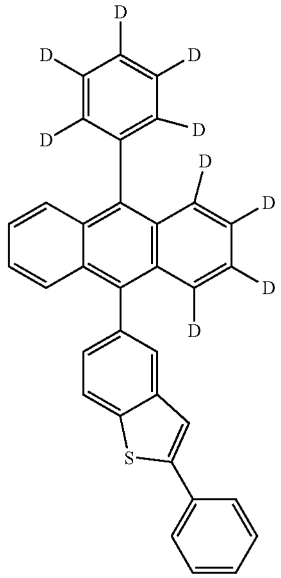
A-185
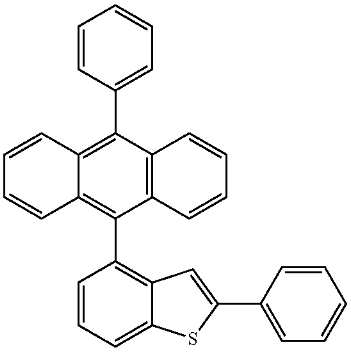
A-186
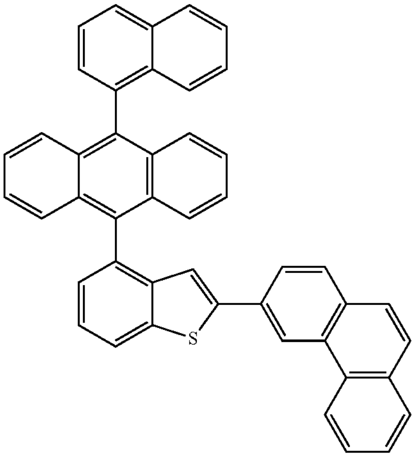
-continued
A-187
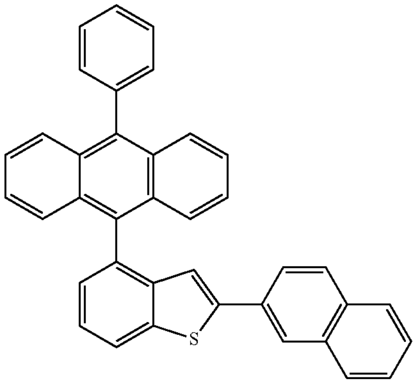
A-188
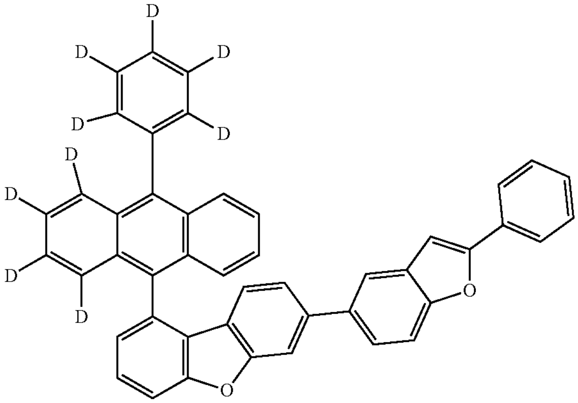
A-189
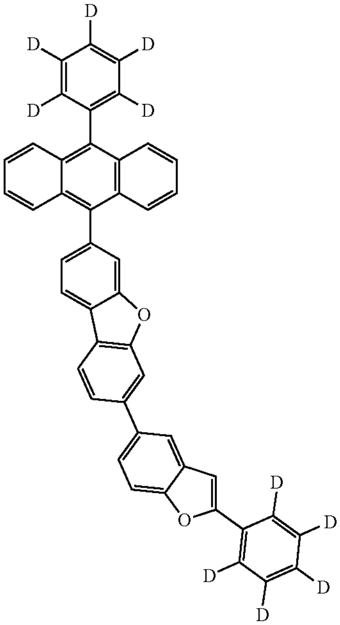

-continued
A-190
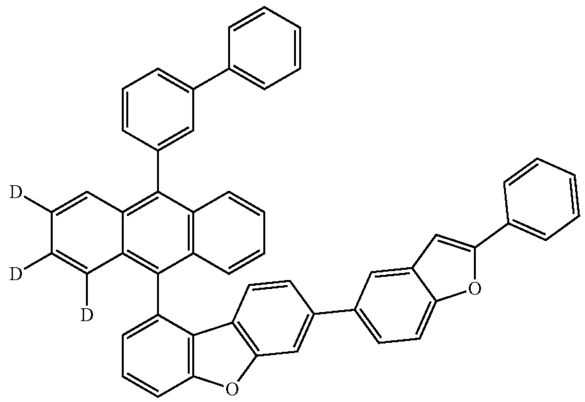
A-191
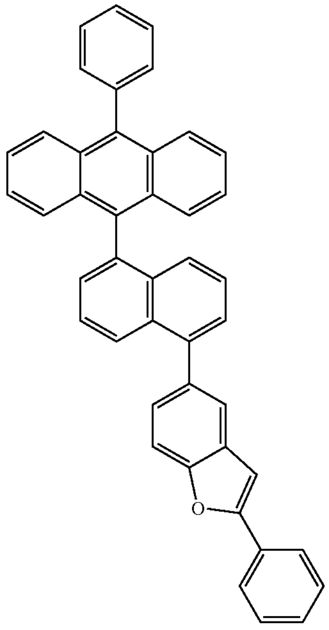
-continued
A-192
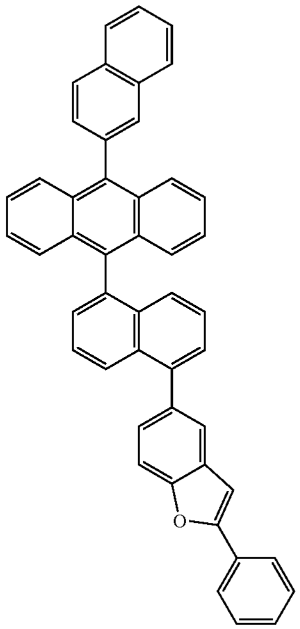
A-193
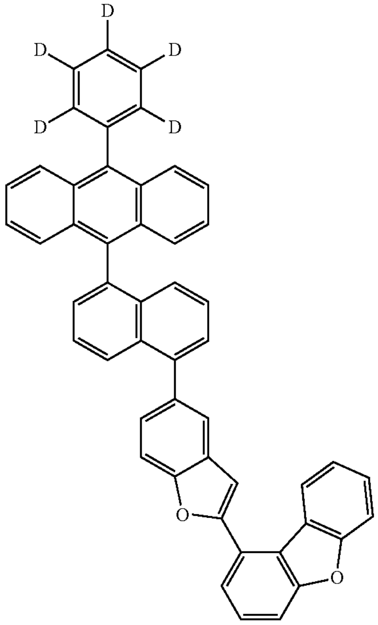

A-194
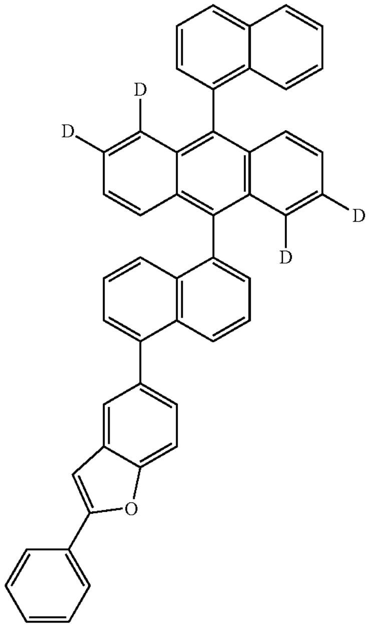
A-195
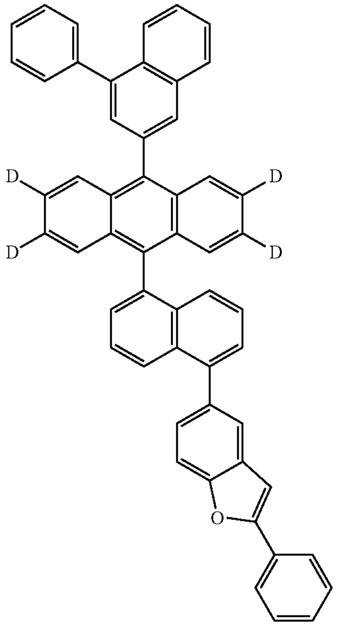
A-196
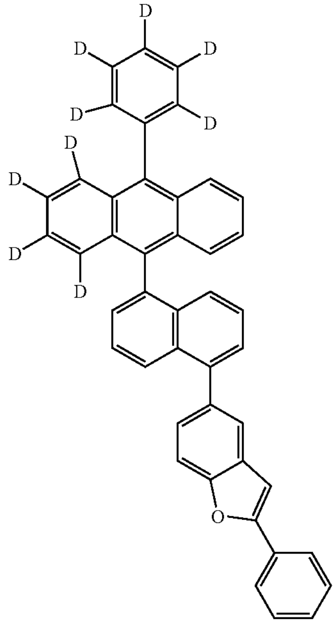
A-197
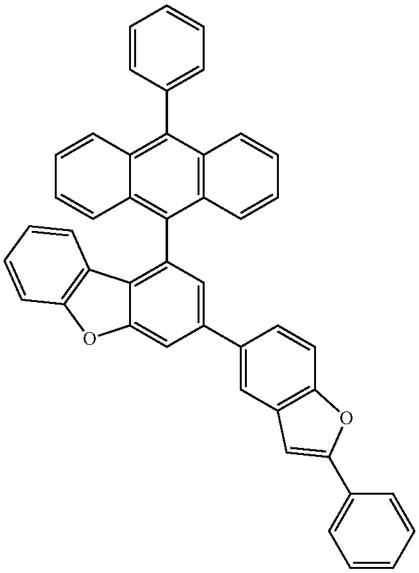

-continued
A-198
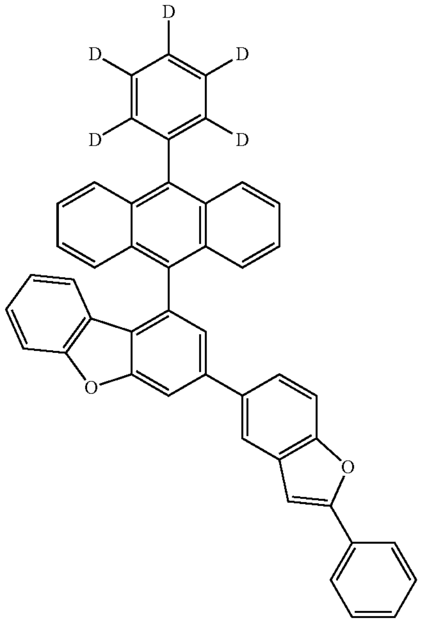
A-199
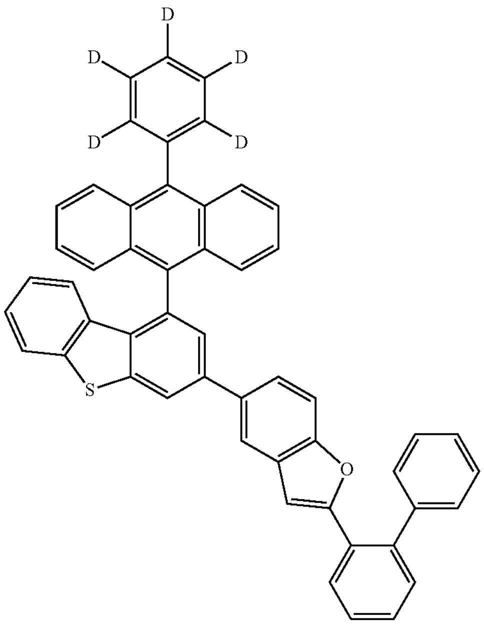
-continued
A-200
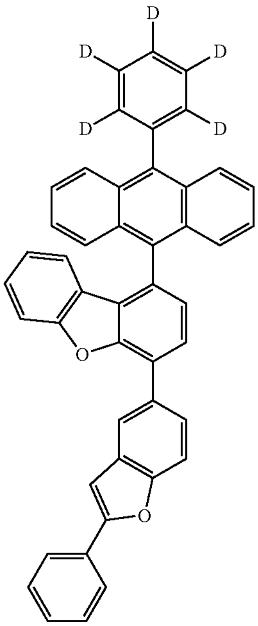
A-201
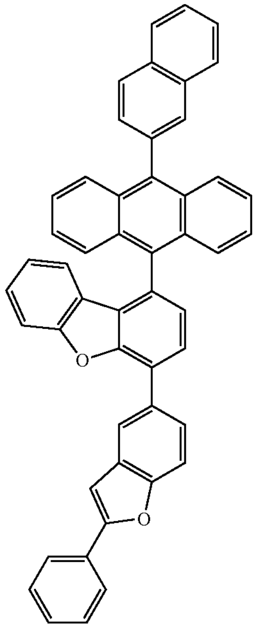

-continued
A-202
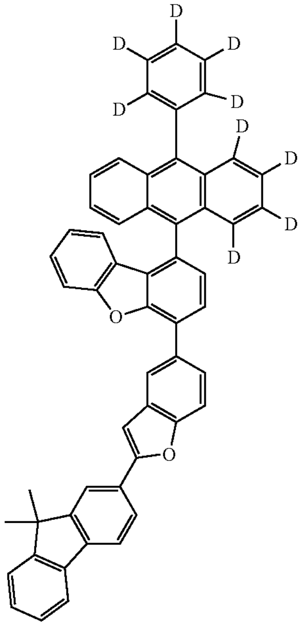
A-203
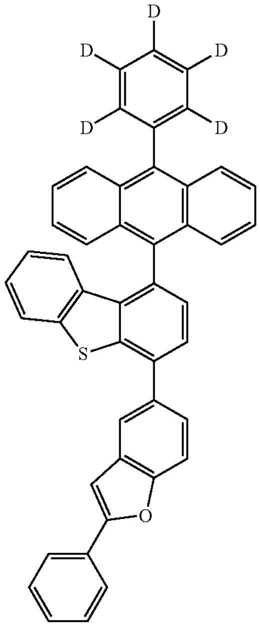
-continued
A-204
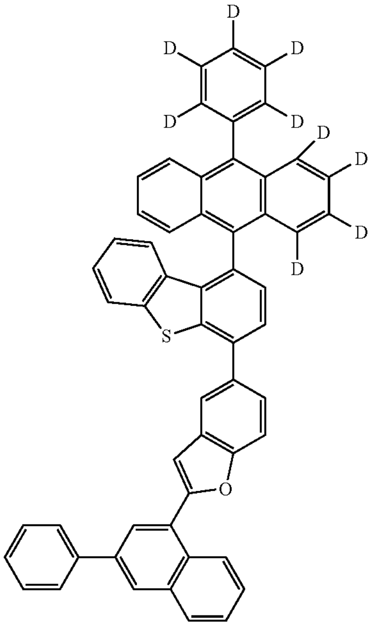
A-205
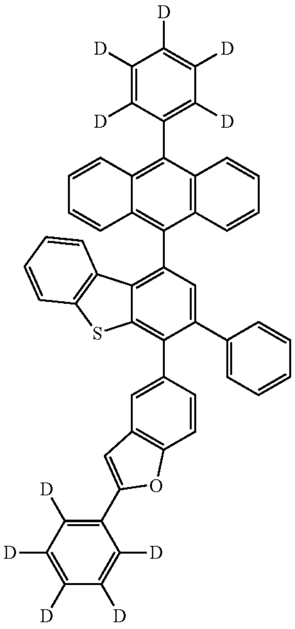

-continued
A-206
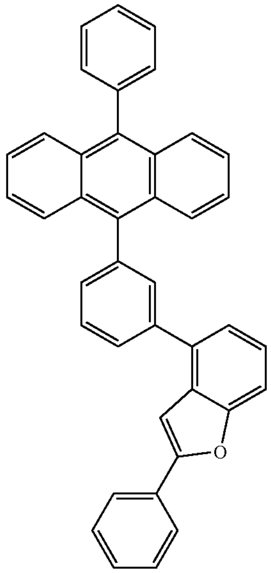
A-207
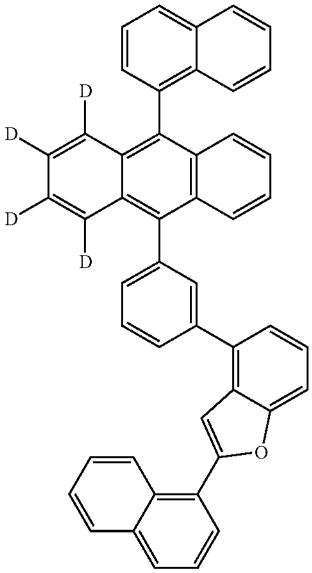
-continued
A-208
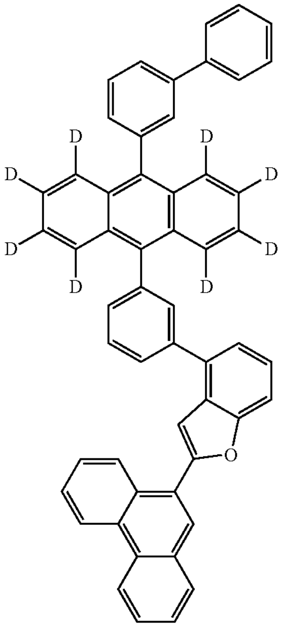
A-209
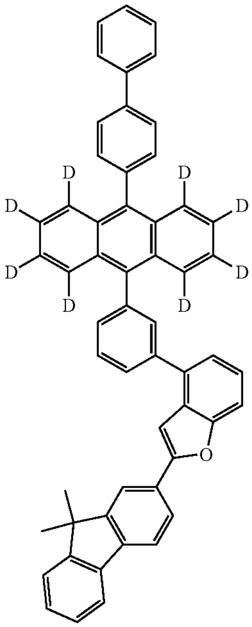

-continued
A-210
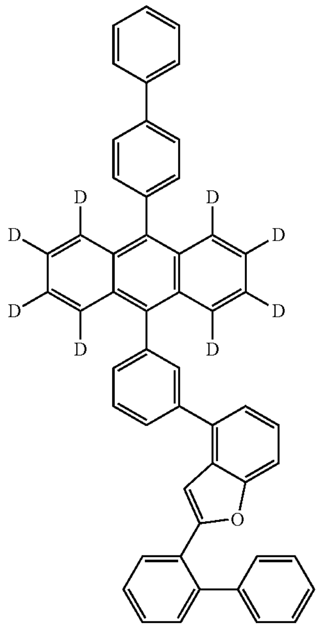
A-211
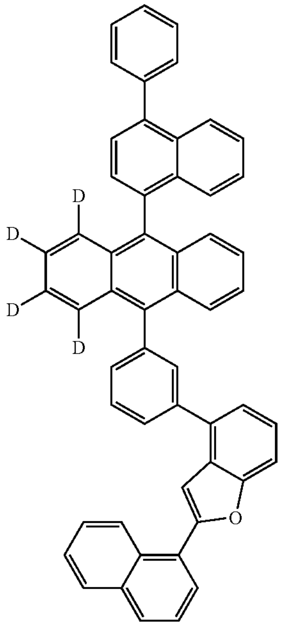
-continued
A-212
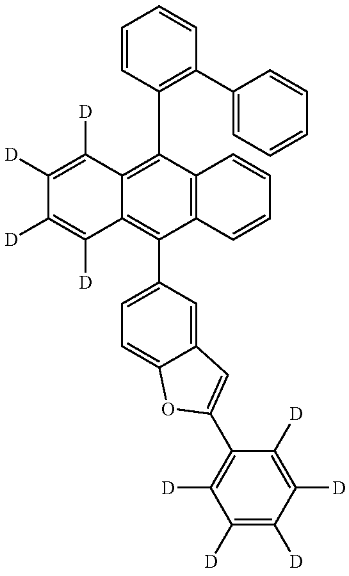
A-213
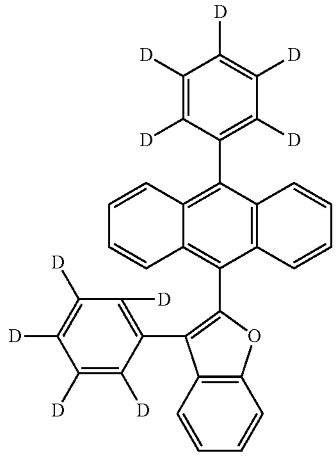
A-214
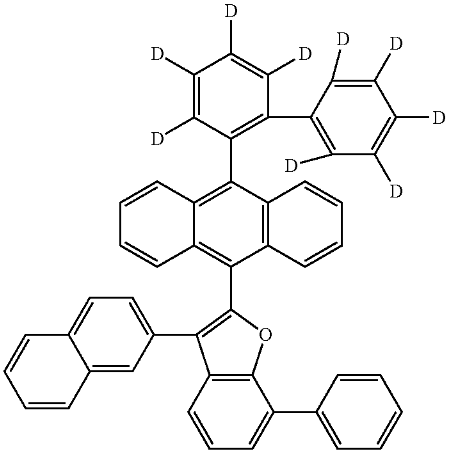

-continued

A-215

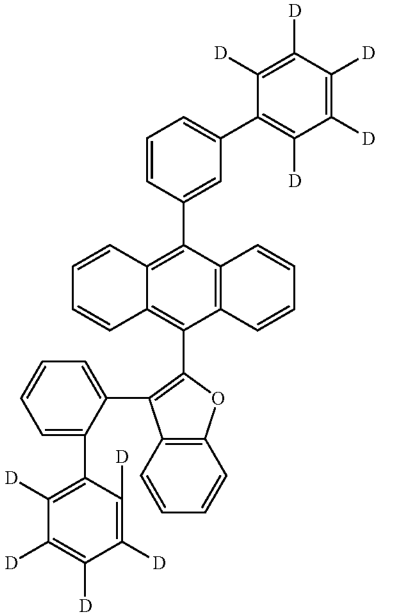

A-216

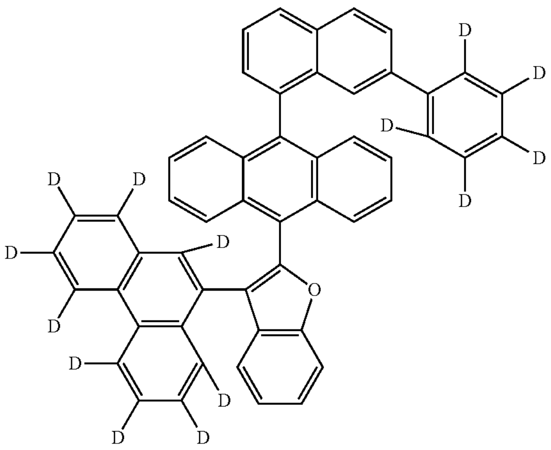

A-217

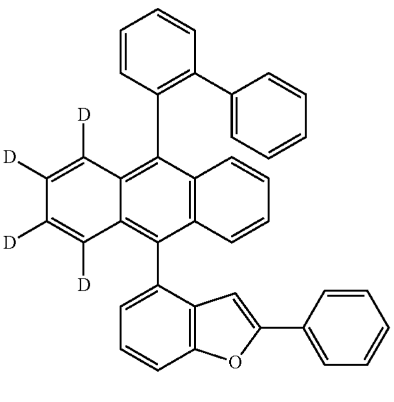

-continued

A-218

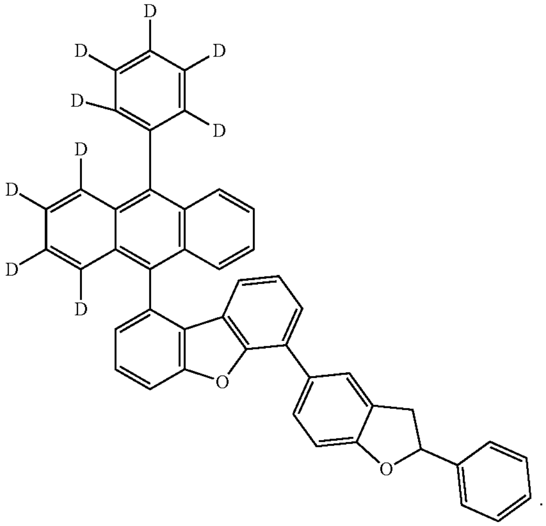

16. An organic light-emitting device comprising:

a first electrode;

a second electrode facing the first electrode;

a light-emitting layer interposed between the first electrode and the second electrode; and an organic layer interposed between the second electrode and the light-emitting layer, wherein the light-emitting layer comprises at least one selected from compounds represented by the following [Formula A] and the organic layer comprises at least one selected from compounds represented by the following [Formula C] or [Formula D], the organic layer comprises an electron injection layer, an electron transport layer, or a layer capable of injecting and transporting electrons,

[Formula A]

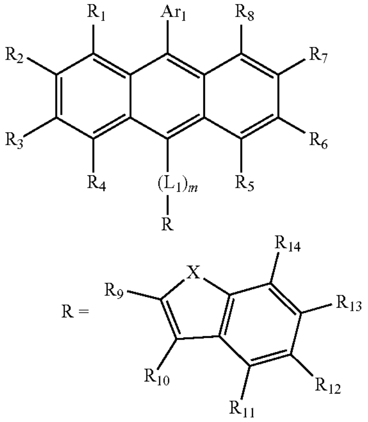

wherein $L_1$ is a divalent linker and is a single bond or is selected from a substituted or unsubstituted C6-C50 arylene group, a substituted or unsubstituted C2-C50 heteroarylene group, and a substituted or unsubstituted C3-C50 mixed aliphatic-aromatic ring group, m is an integer from 1 to 3, provided that when m is 2 or more, a plurality of $L_1$ are identical to or different from each other, X is an oxygen atom (O) or a sulfur atom(S), $Ar_1$ is selected from a substituted or unsubstituted C6-C50 aryl group, a substituted or unsubstituted C2-C50 heteroaryl group, and a substituted or unsubstituted C3-C50 mixed aliphatic-aromatic ring group, $R_1$ to $R_{14}$ are identical to or different from each other, and are each independently hydrogen, deuterium, a substituted or unsubstituted C1-C30 alkyl group, a substituted or unsubstituted C6-C50 aryl group, a substituted or unsubstituted C2-C30 alkenyl group, a substituted or unsubstituted C2-C30 alkynyl group, a substituted or unsubstituted C3-C30 cycloalkyl group, a substituted or unsubstituted C3-C30 cycloalkenyl group, a substituted or unsubstituted C2-C50 heteroaryl group, a substituted or unsubstituted C2-C30 heterocycloalkyl group, a substituted or unsubstituted C1-C30 alkoxy group, a substituted or unsubstituted C6-C50 aryloxy group, a substituted or unsubstituted C1-C30 alkylthioxy group, a substituted or unsubstituted C6-C50 arylthioxy group, a substituted or unsubstituted amine group, a substituted or unsubstituted silyl group, a substituted or unsubstituted C3-C50 mixed aliphatic-aromatic ring group, a cyano group, a nitro group and a halogen group, with the proviso that any one of $R_9$ to $R_{14}$ is bonded to the linker $L_1$,

[Formula C]

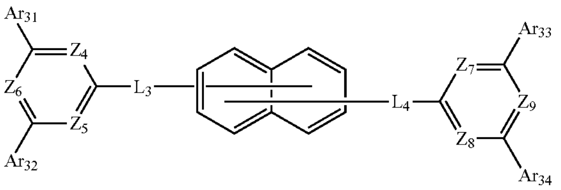

wherein at least one of $Z_4$ to $Z_6$ is N and the remainder is CH, and at least one of $Z_7$ to $Z_9$ is N and the remainder is CH, $L_3$ and $L_4$ are identical to or different from each other, and are each independently a single bond, a substituted or unsubstituted C6-C30 arylene group, or a substituted or unsubstituted C2-C30 heteroarylene group, where at least one of $L_3$ and $L_4$ is a substituted or unsubstituted C2-C30 heteroarylene group, and $Ar_{31}$ to $Ar_{34}$ are identical to or different from each other, and are each independently a substituted or unsubstituted C6-C30 aryl group or a substituted or unsubstituted C2-C30 heteroaryl group,

[Formula D]

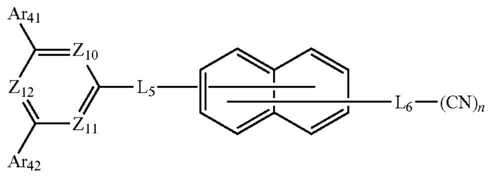

wherein at least one of $Z_{10}$ to $Z_{12}$ is N and the remainder is CH, $L_5$ and $L_6$ are identical to or different from each other, and are each independently a single bond, a substituted or unsubstituted C6-C30 arylene group, or a substituted or unsubstituted C2-C30 heteroarylene group, where at least one of $L_5$ and $L_6$ is a substituted or unsubstituted C2-C30 heteroarylene group, and $Ar_{41}$ and $Ar_{42}$ are identical to or different from each other, and are each independently a substituted or unsubstituted C6-C30 aryl group or a substituted or unsubstituted C2-C30 heteroaryl group, and n is 1 or 2.

17. The organic light-emitting device according to claim 16, wherein the compound of [Formula A] is represented by any one selected from the following compounds [Formula A-1] to [Formula A-6]:

[Formula A-1]

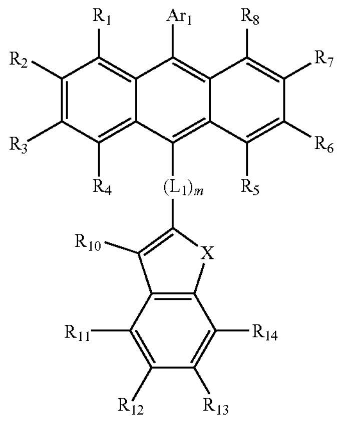

[Formula A-2]

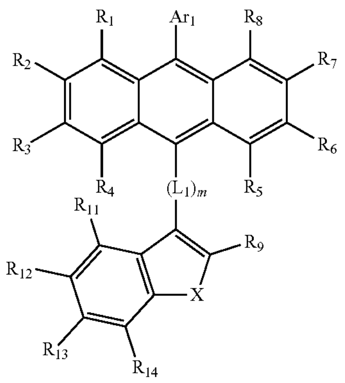

[Formula A-3]

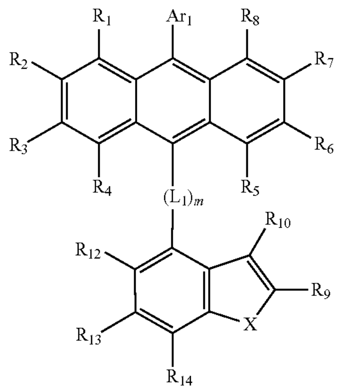

-continued

[Formula A-4]

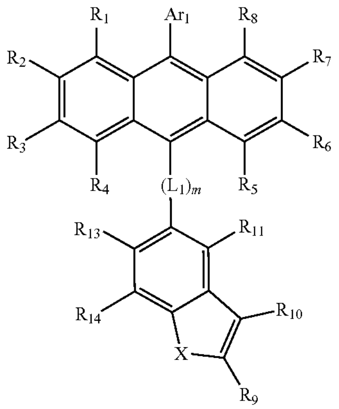

[Formula A-5]

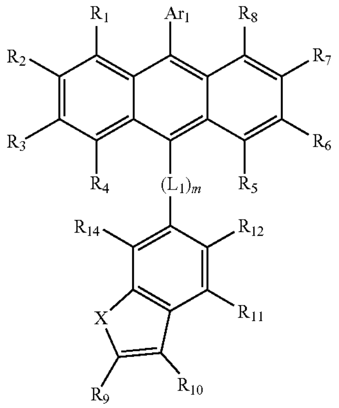

[Formula A-6]

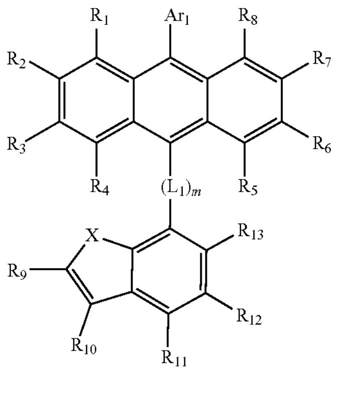

wherein $Ar_1$, $R_1$ to $R_{14}$, $L_1$, X and m are as defined in [Formula A] above.

18. The organic light-emitting device according to claim 17, wherein each of the compounds represented by [Formula A-1] to [Formula A-6] comprises at least one deuterium atom (D) as a substituent.

19. The organic light-emitting device according to claim 17, wherein each of the compounds represented by [Formula A-1] to [Formula A-6] has a degree of deuteration of 10% or more.

20. The organic light-emitting device according to claim 16, wherein the compound of [Formula A] is any one selected from the following compounds [A-1] to [A-218]:

A-1

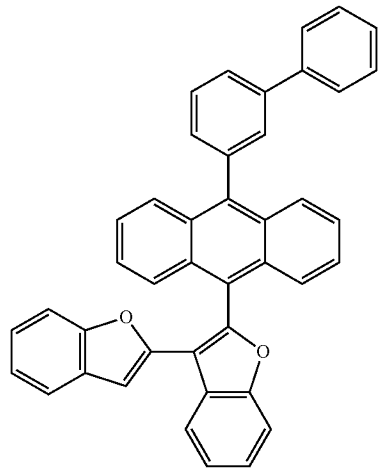

A-2

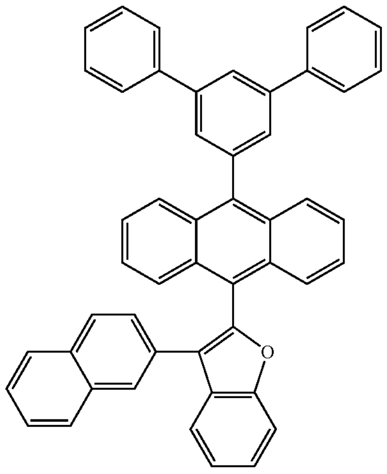

A-3

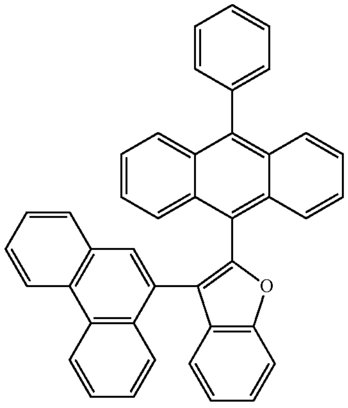

-continued
A-4
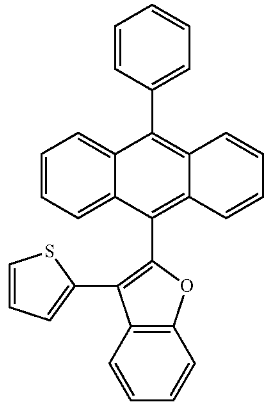
A-5
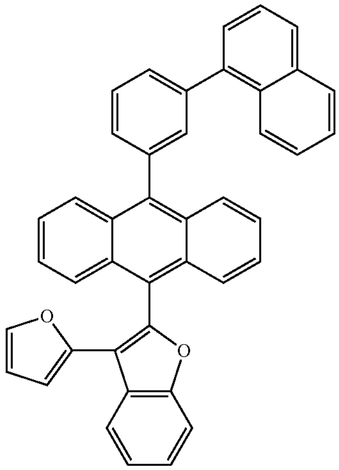
A-6
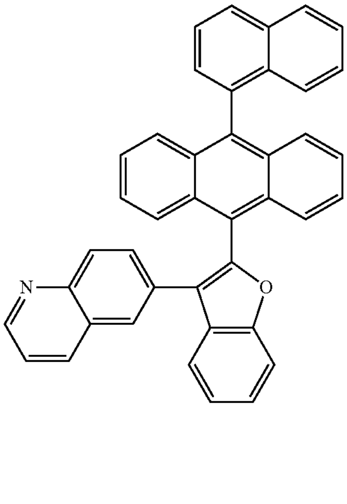
-continued
A-7
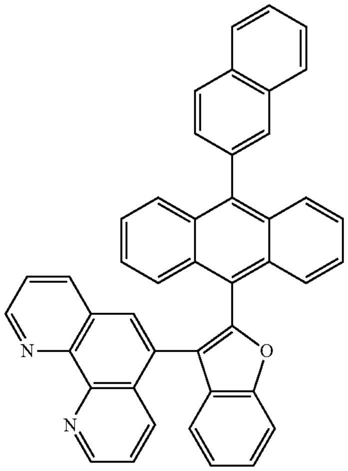
A-8
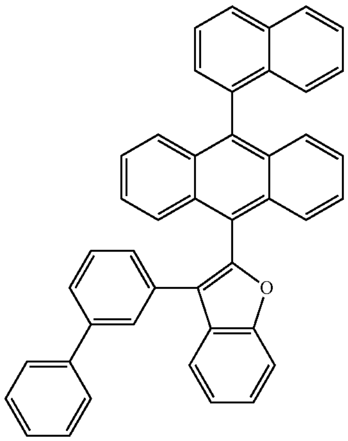
A-9
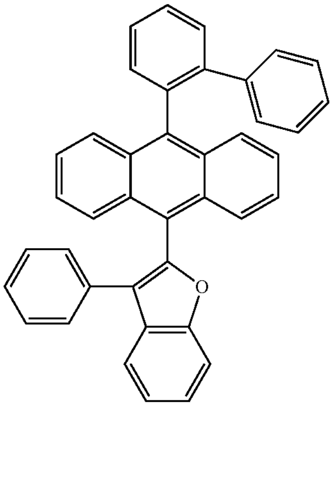

-continued
A-10
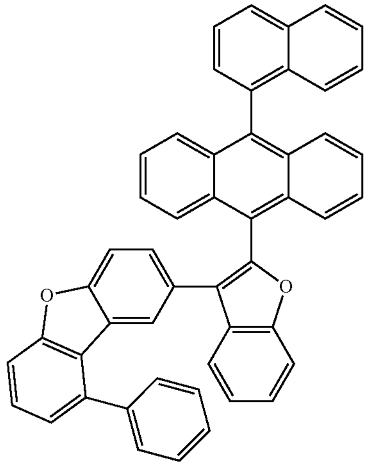
A-11
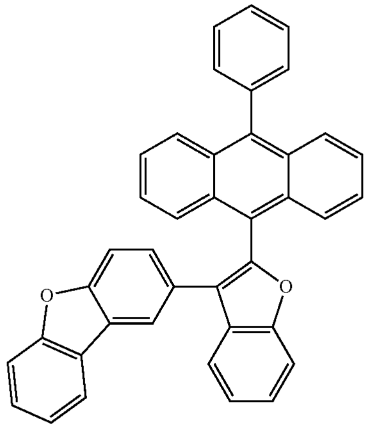
A-12
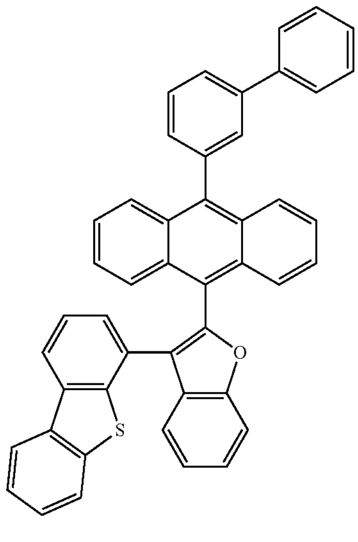
-continued
A-13
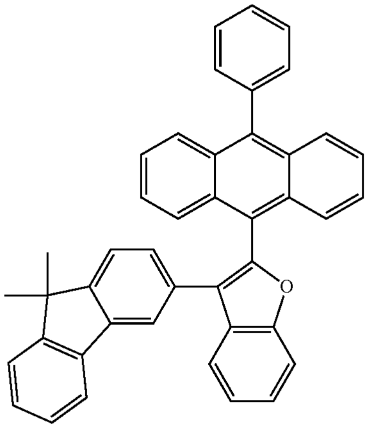
A-14
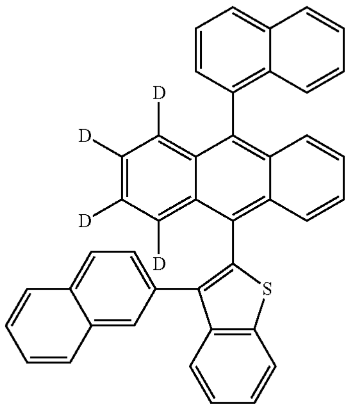
A-15
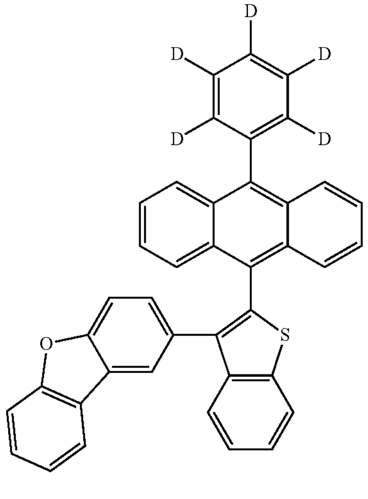

-continued
A-16
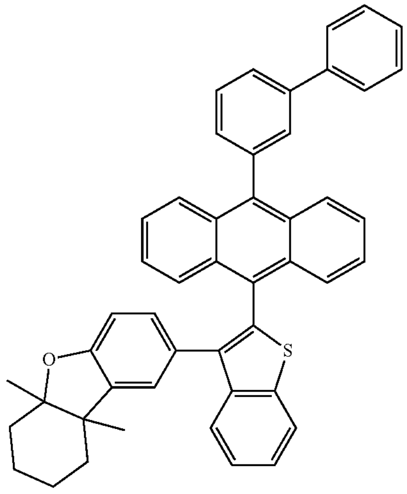
A-17
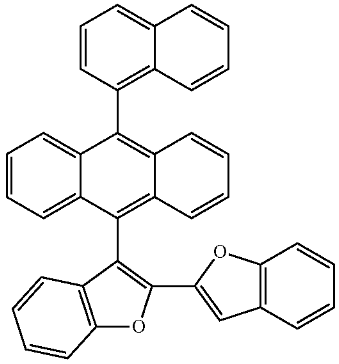
A-18
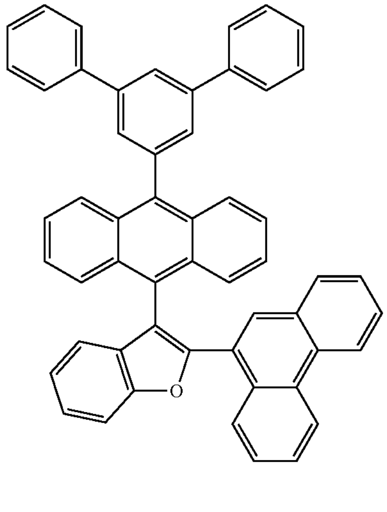
-continued
A-19
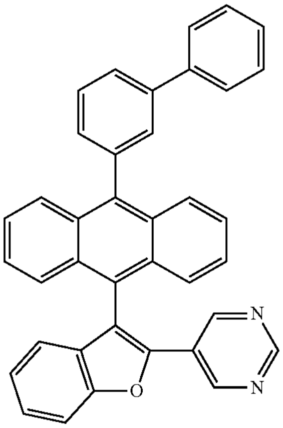
A-20
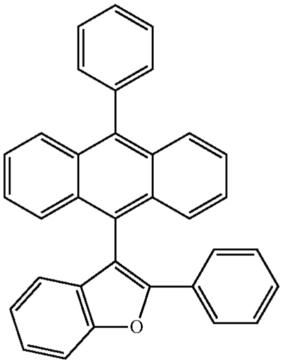
A-21
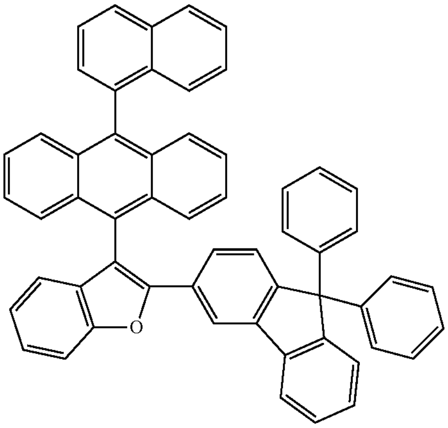
A-22
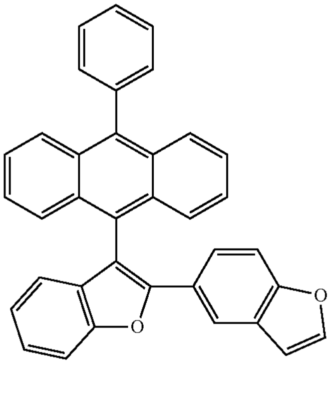

-continued
A-23
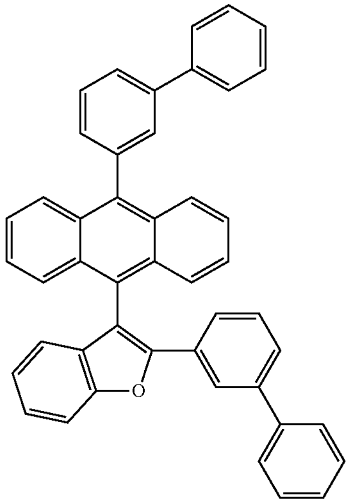
A-24
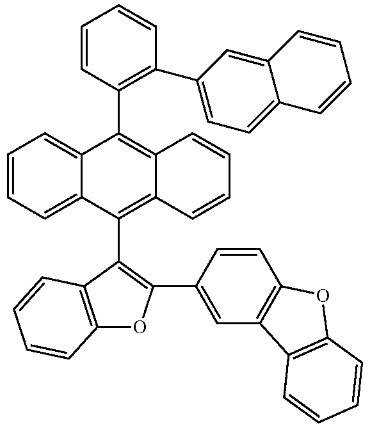
A-25
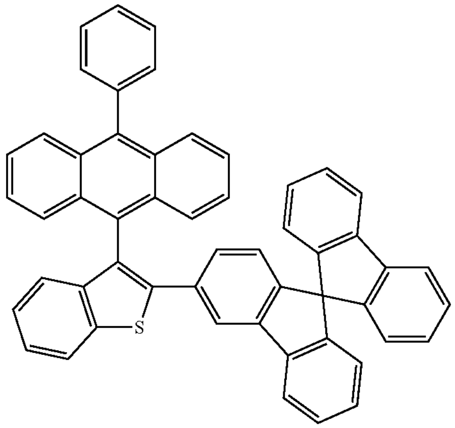
-continued
A-26
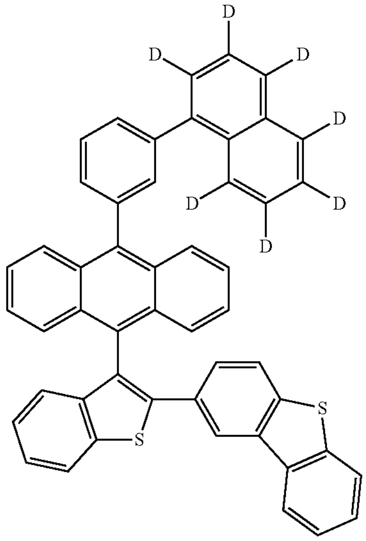
A-27
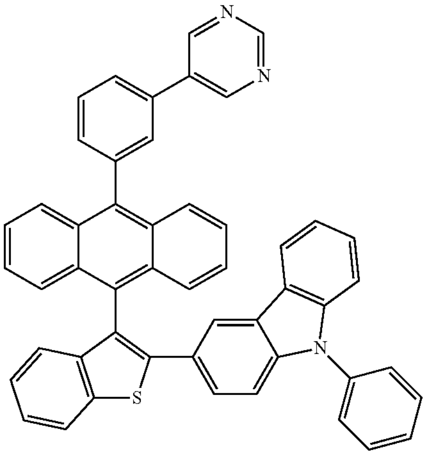
A-28
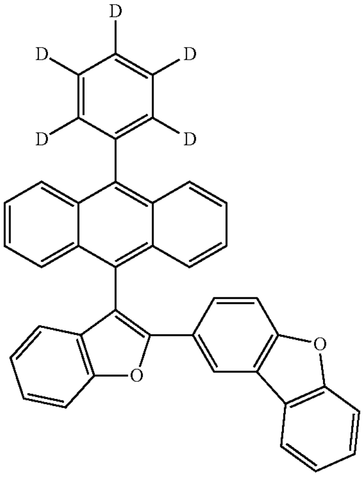

-continued
A-29
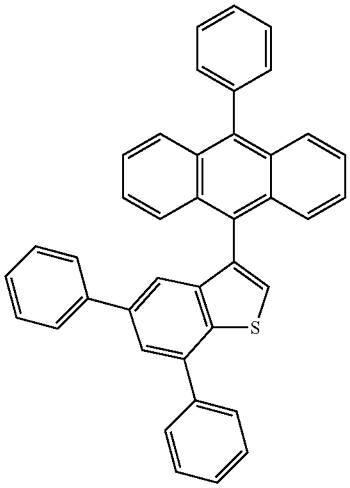
A-30
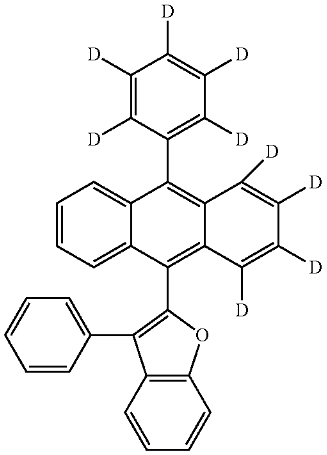
A-31
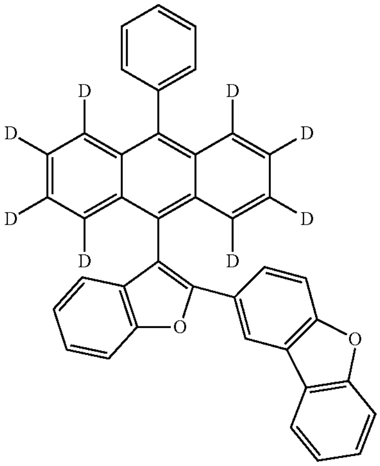
-continued
A-32
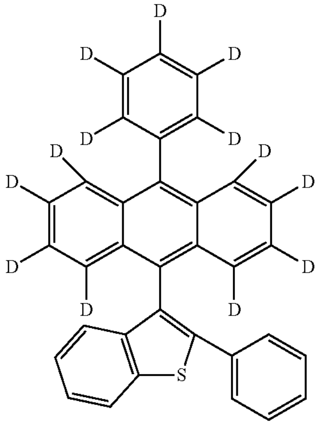
A-33
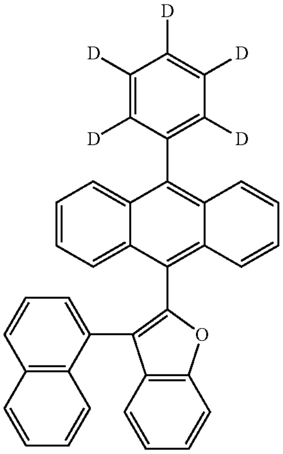
A-34
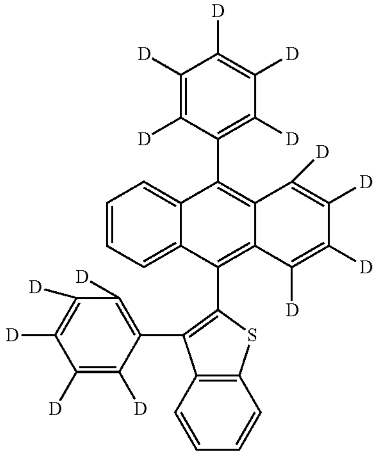

-continued
A-35
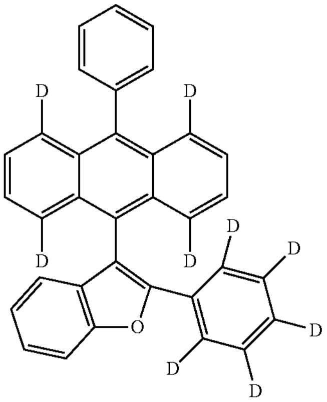
A-36
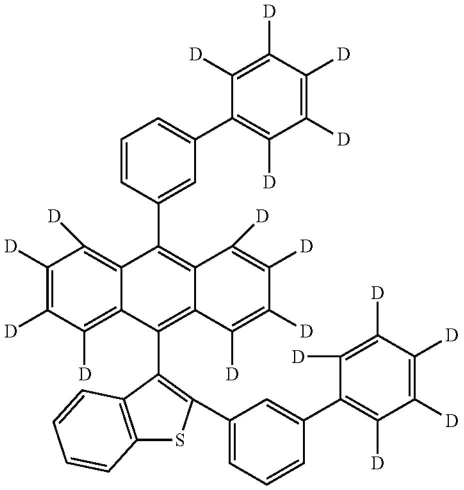
A-37
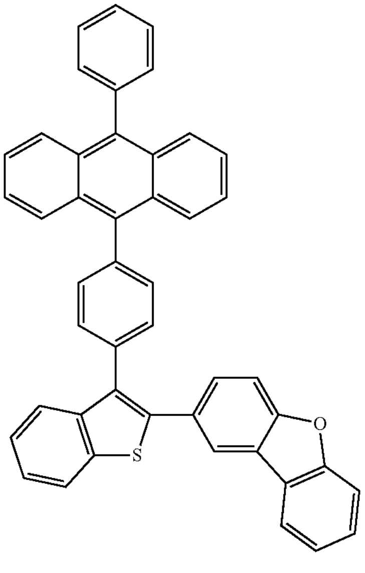
-continued
A-38
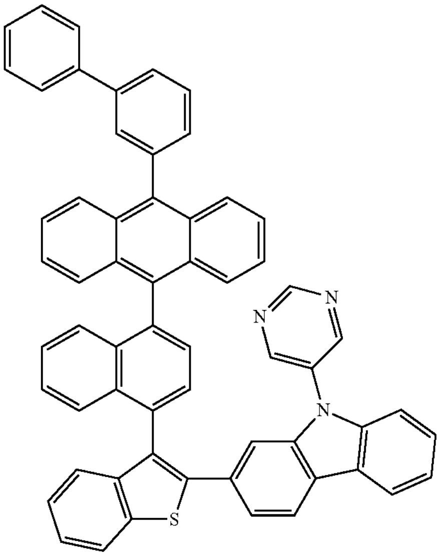
A-39
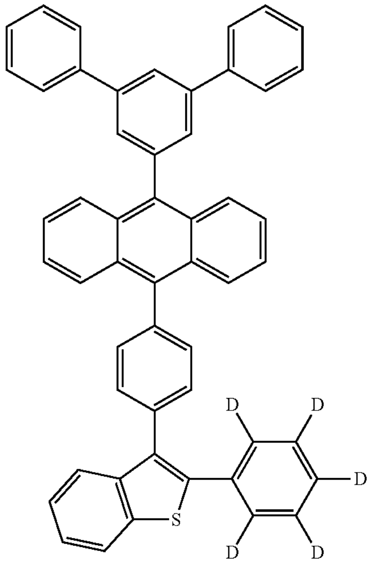
A-40
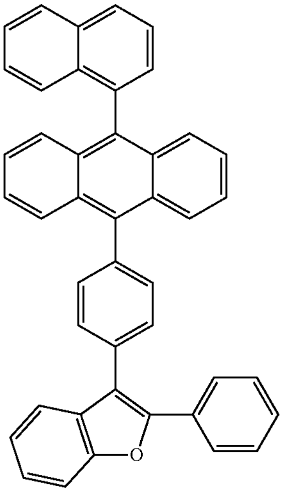

-continued
A-41
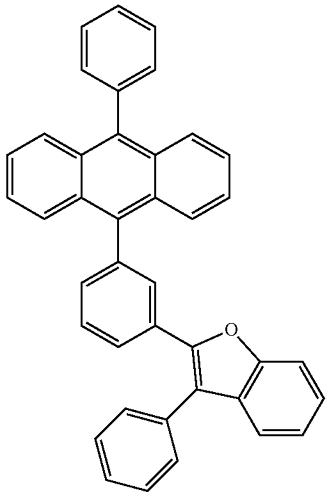
A-42
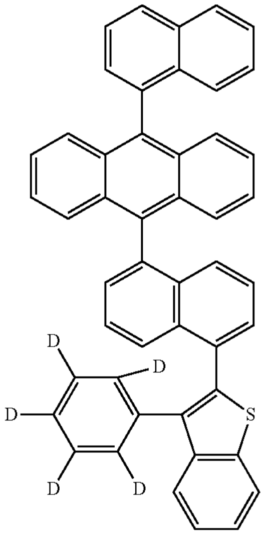
A-43
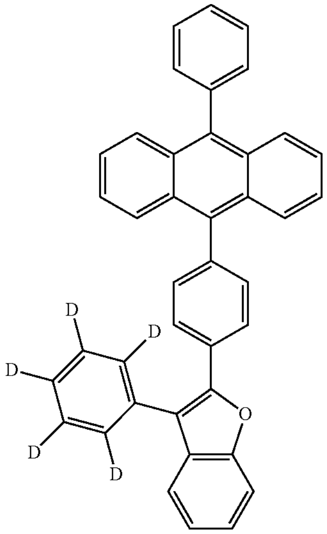
-continued
A-44
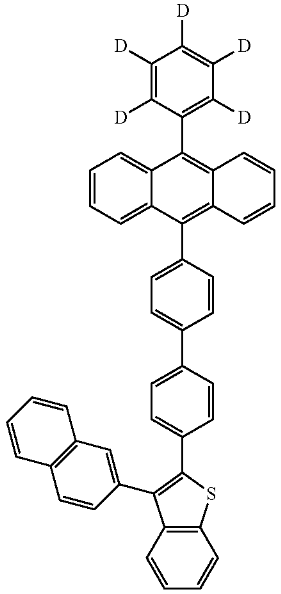
A-45
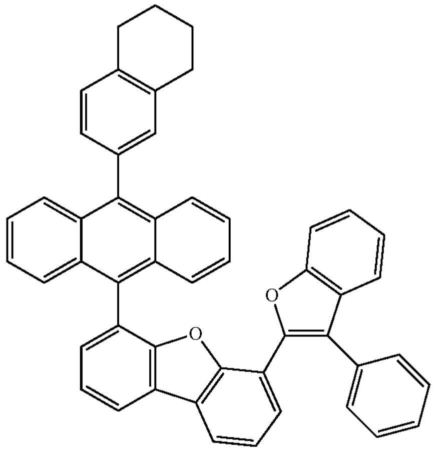
A-46
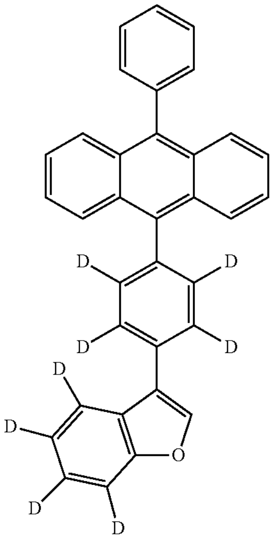

A-47
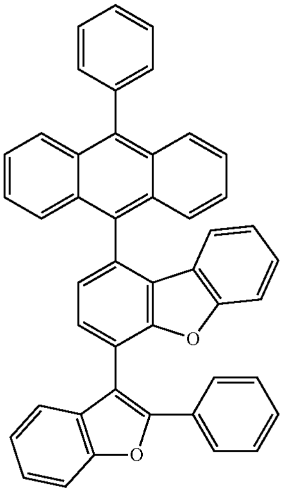
A-48
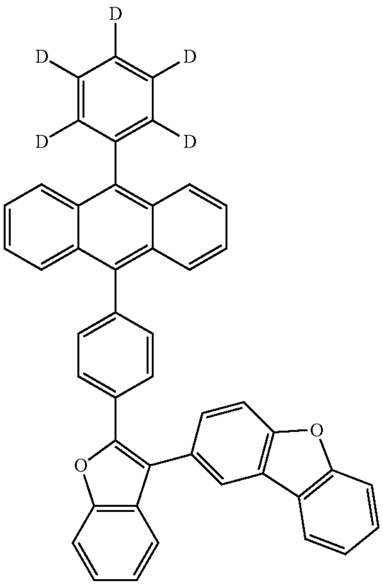
A-49
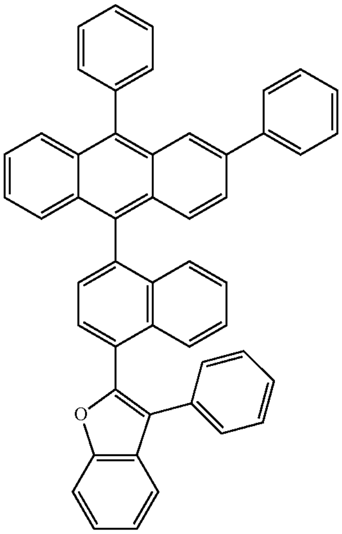
A-50
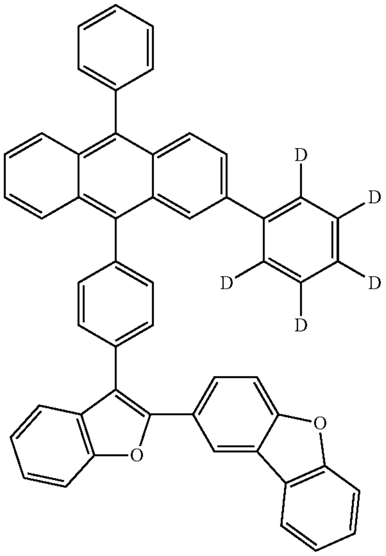
A-51
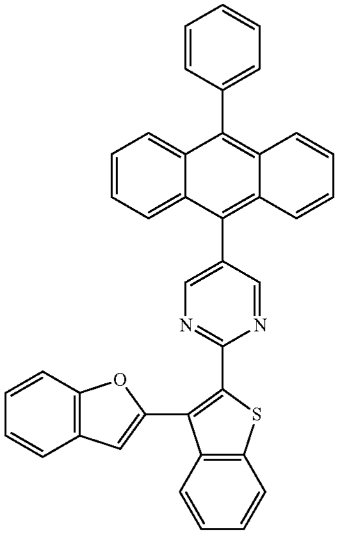

-continued
A-52
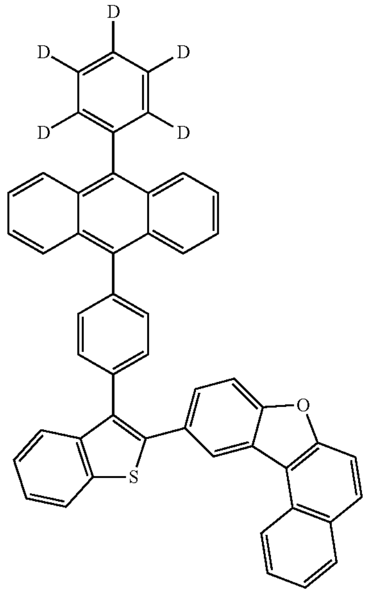
A-53
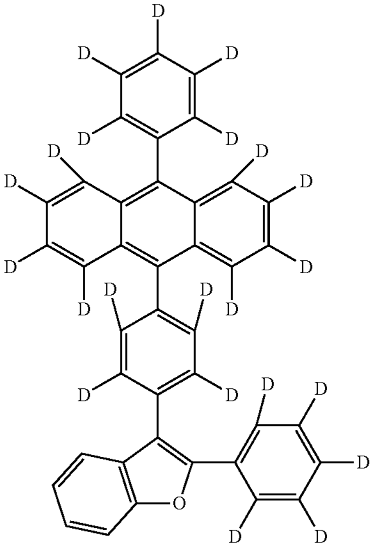
A-54
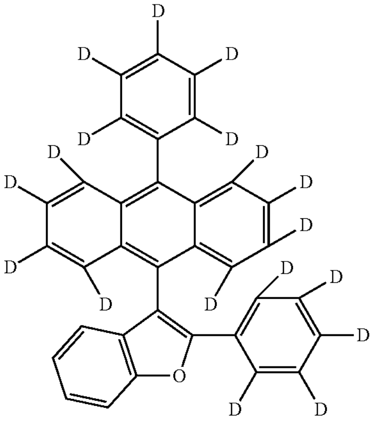
A-55
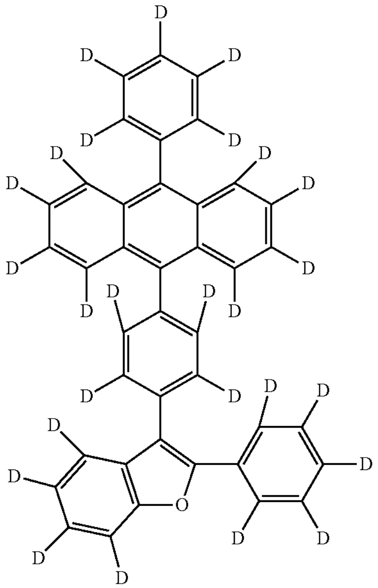
A-56
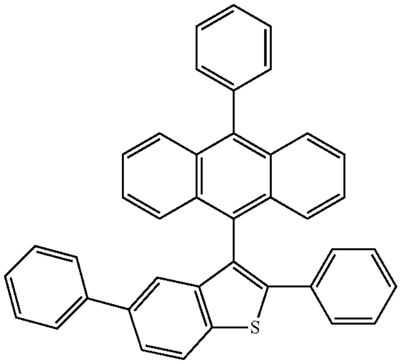
A-57
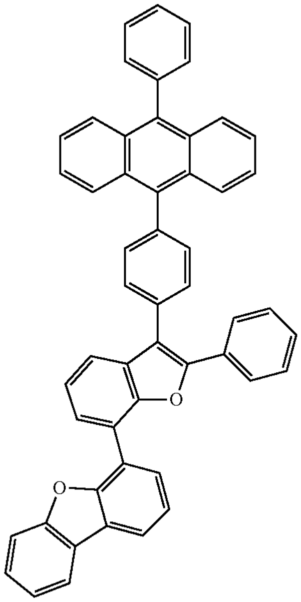

-continued
A-58
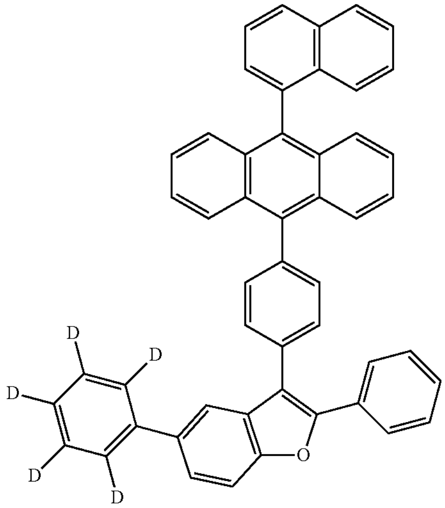
A-59
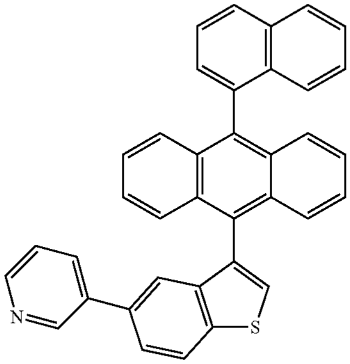
A-60
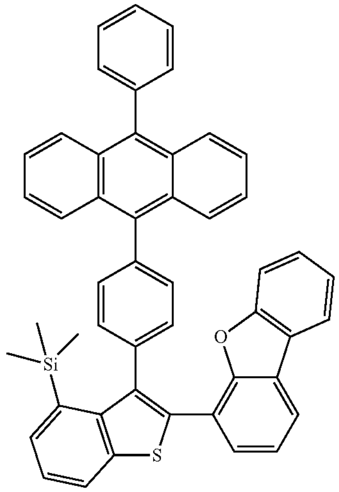
-continued
A-61
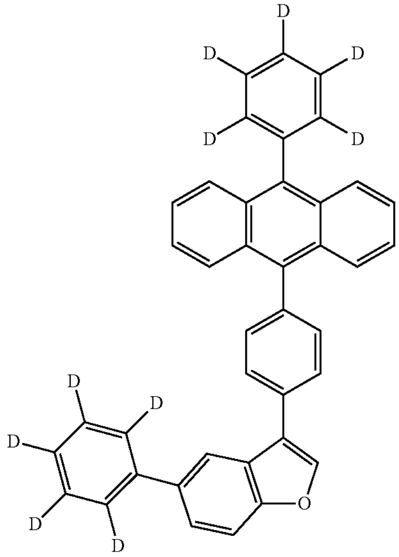
A-62
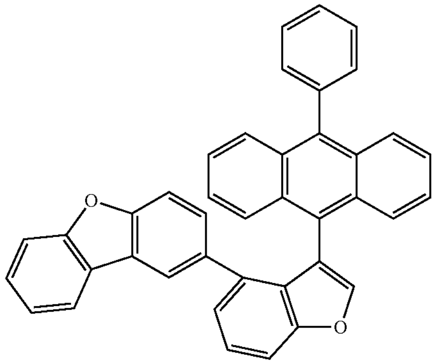
A-63
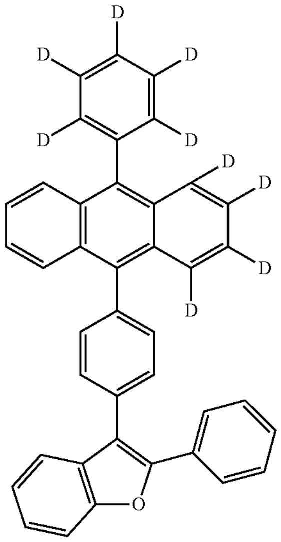

-continued
A-64
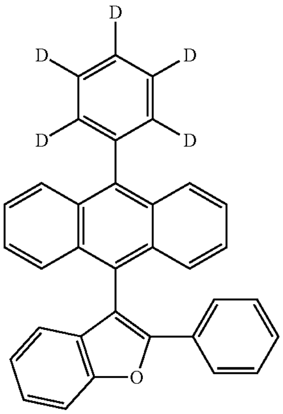
A-65
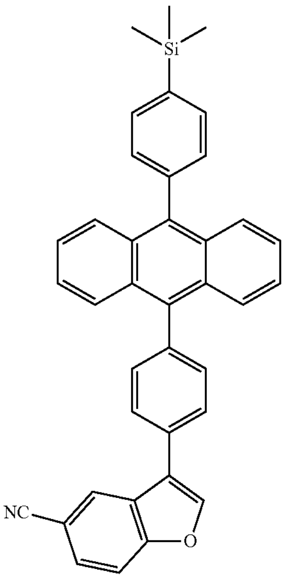
A-66
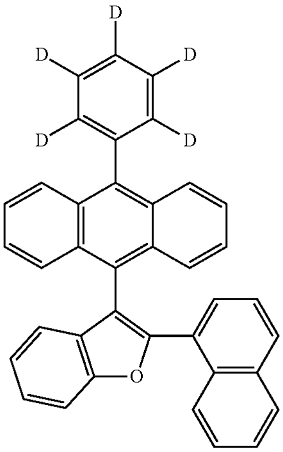
-continued
A-67
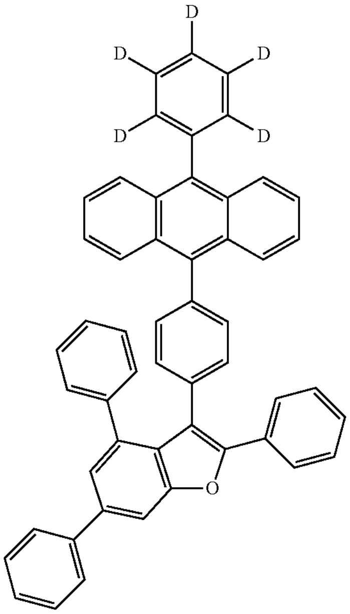
A-68
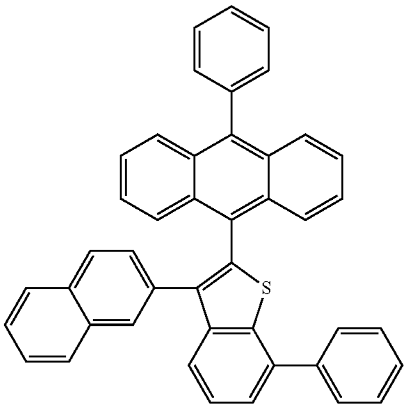
A-69
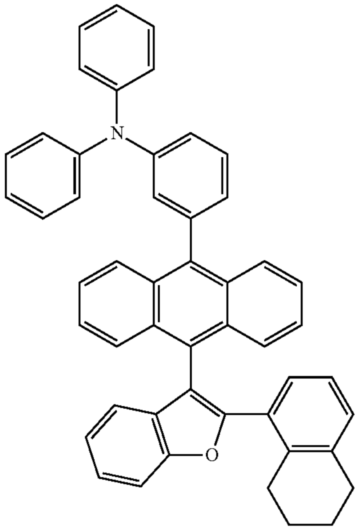

-continued
A-70
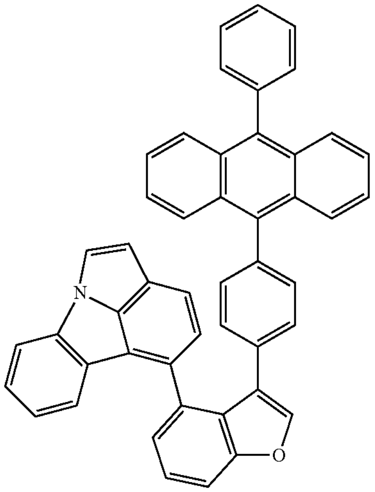
A-71
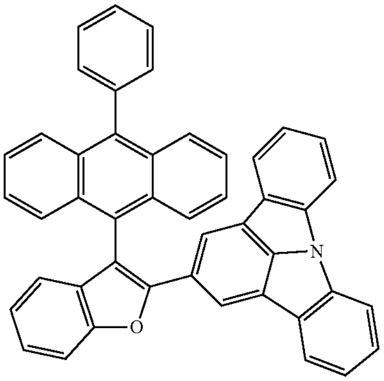
A-72
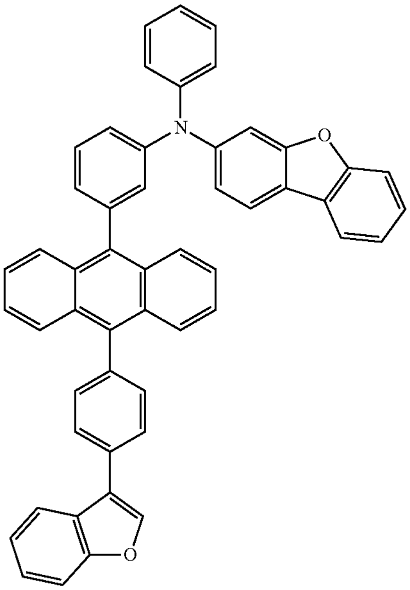
-continued
A-73
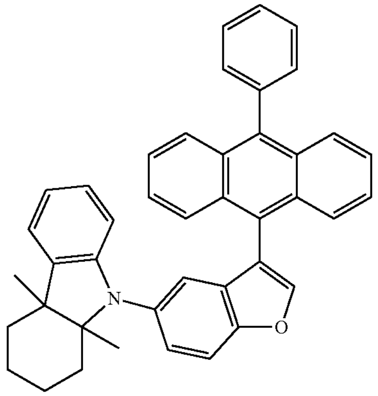
A-74
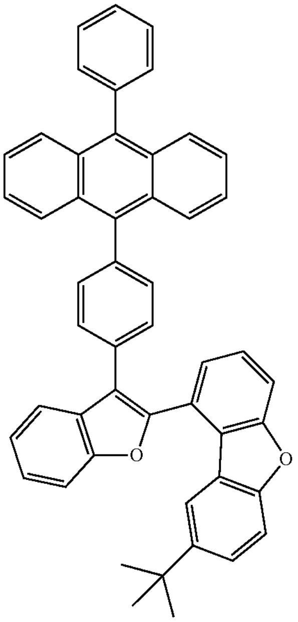
A-75
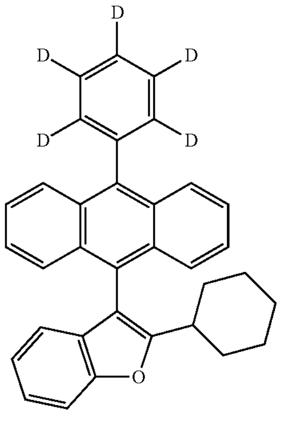

-continued
A-76
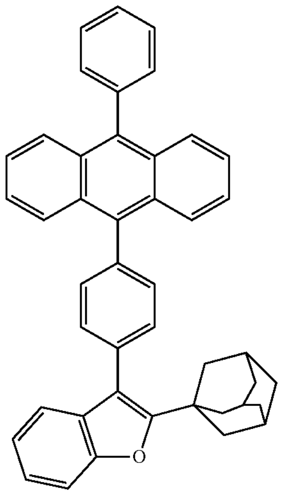
A-77
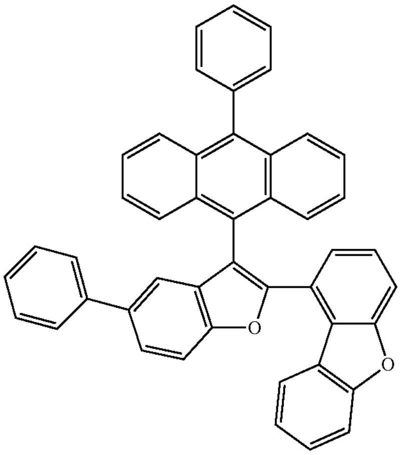
A-78
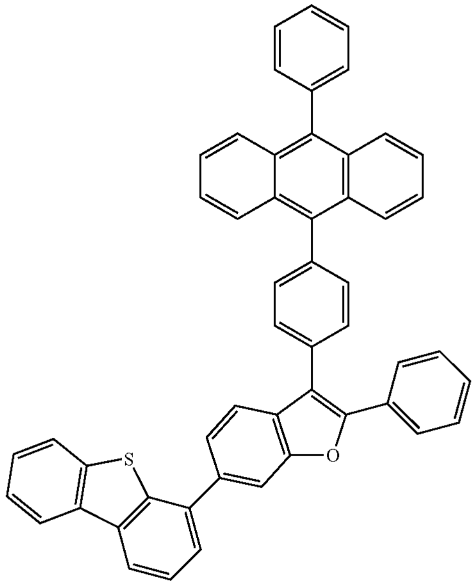
-continued
A-79
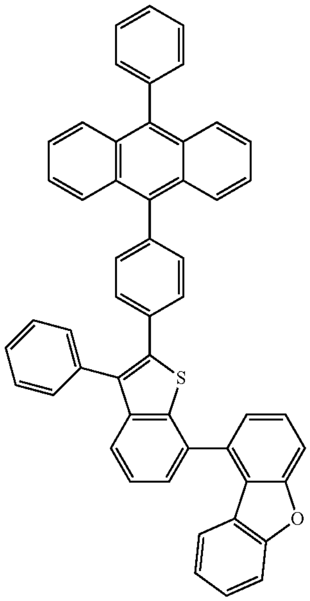
A-80
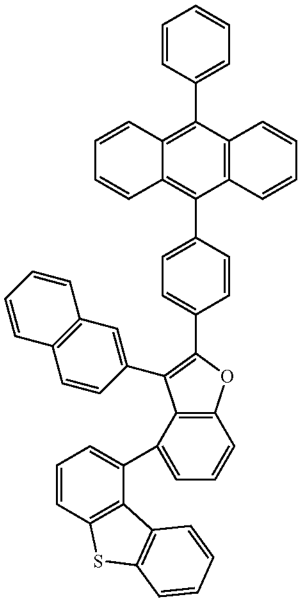

-continued
A-81
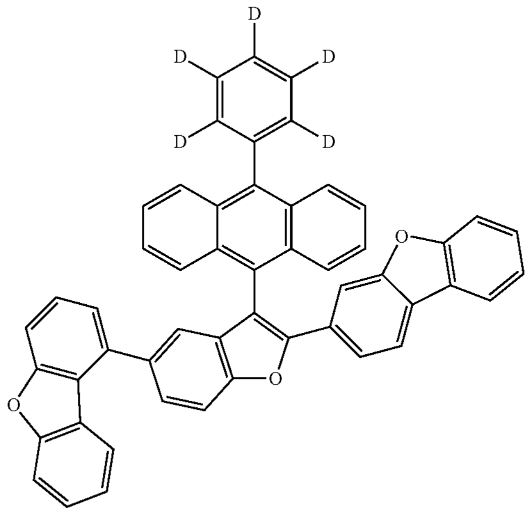
A-82
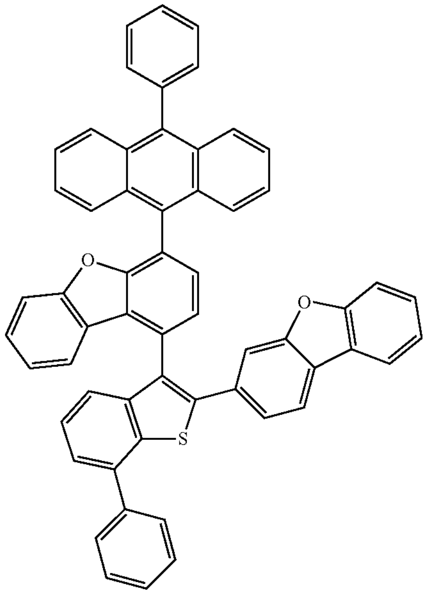
A-83
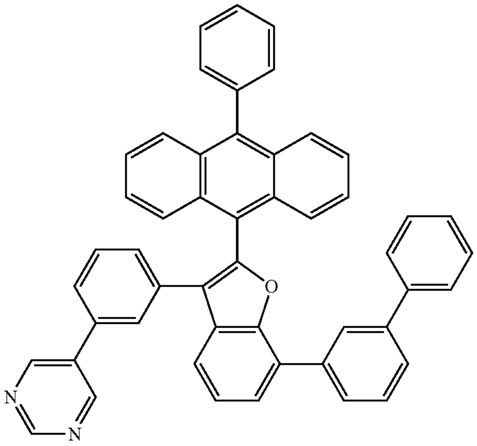
-continued
A-84
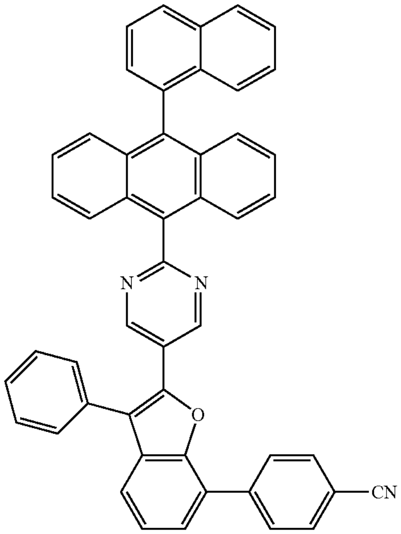
A-85
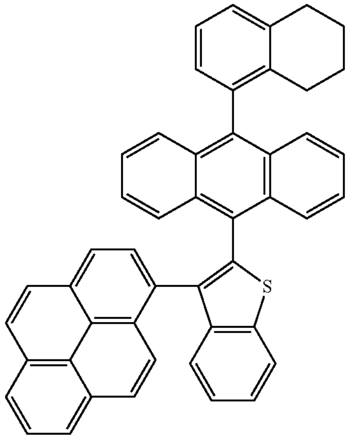
A-86
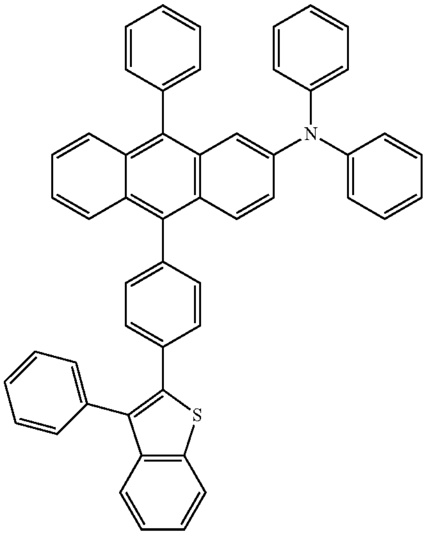

-continued
A-87
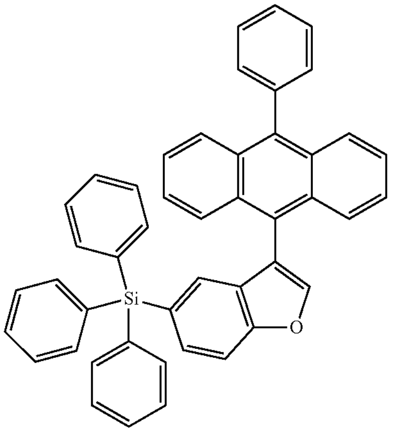
A-88
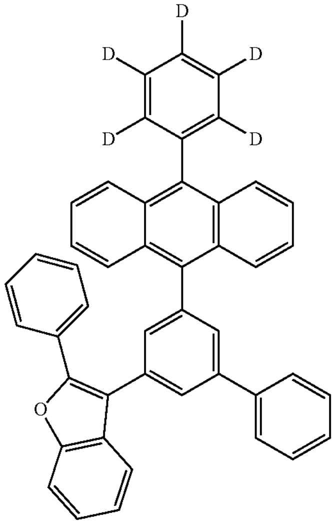
A-89
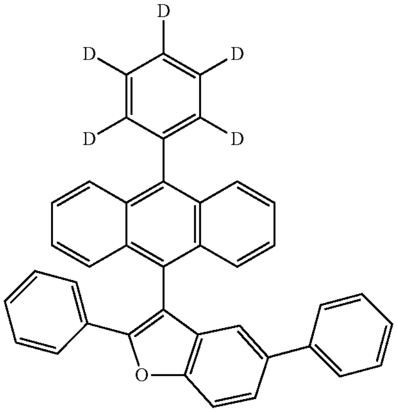
-continued
A-90
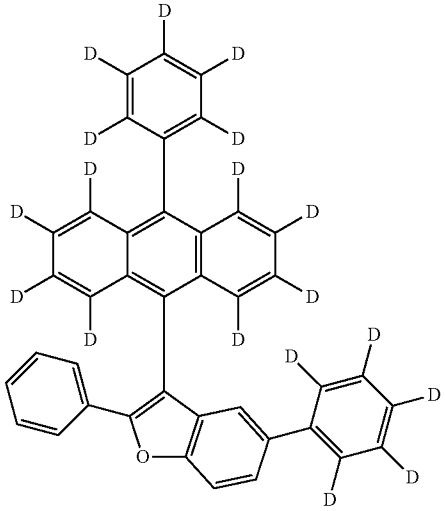
A-91
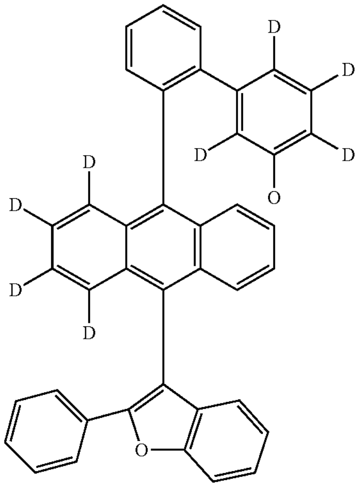
A-92
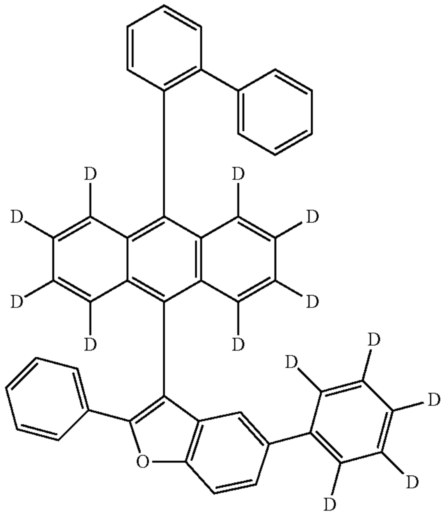

-continued
A-93
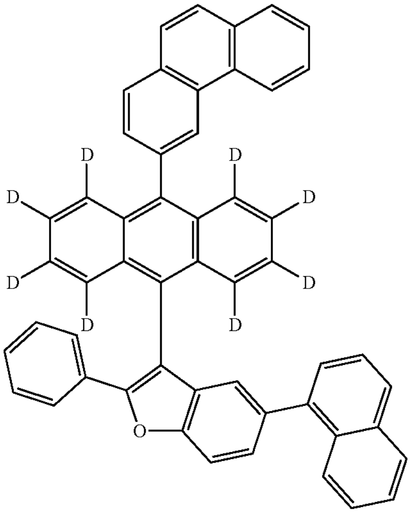
A-94
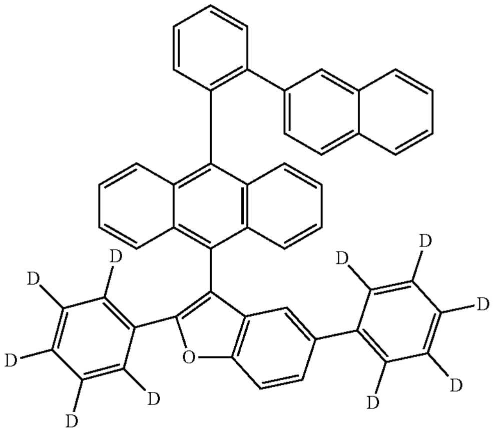
A-95
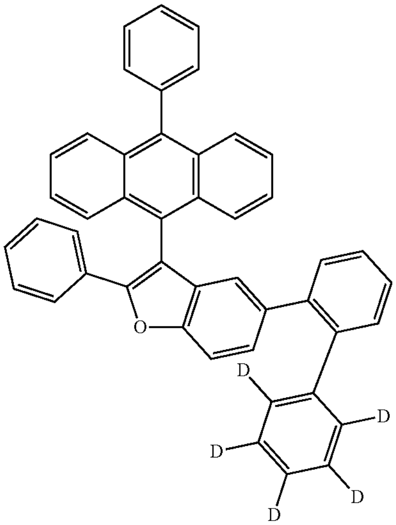
A-96
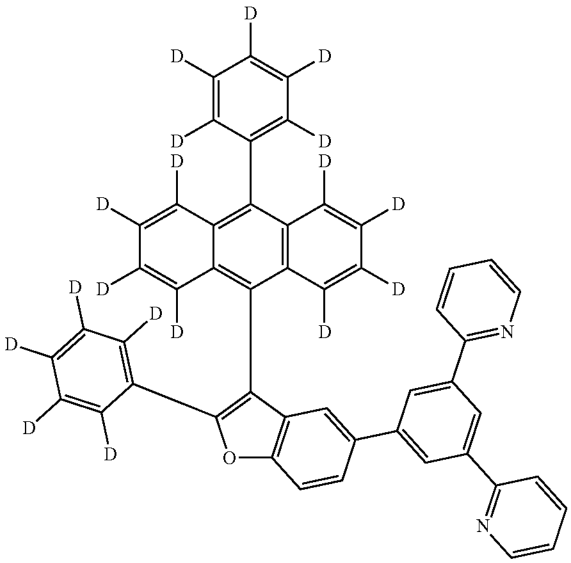
A-97
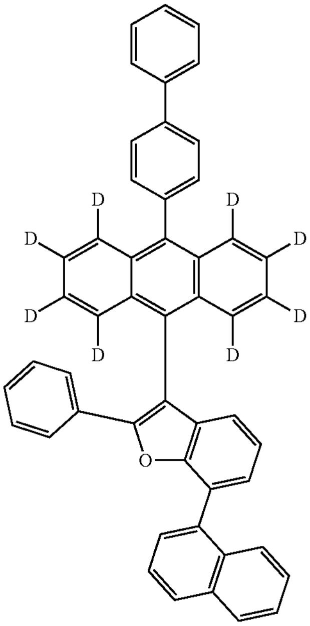

-continued
A-98
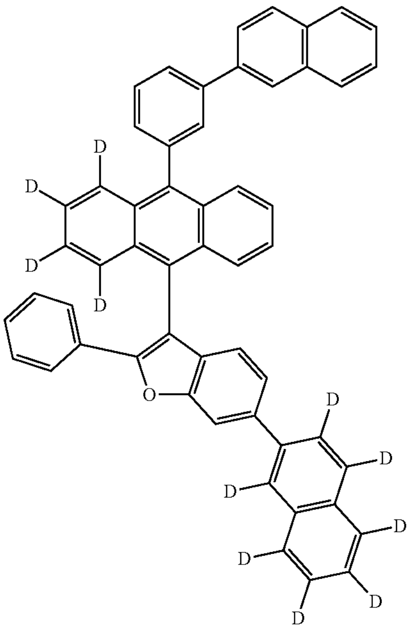
A-99
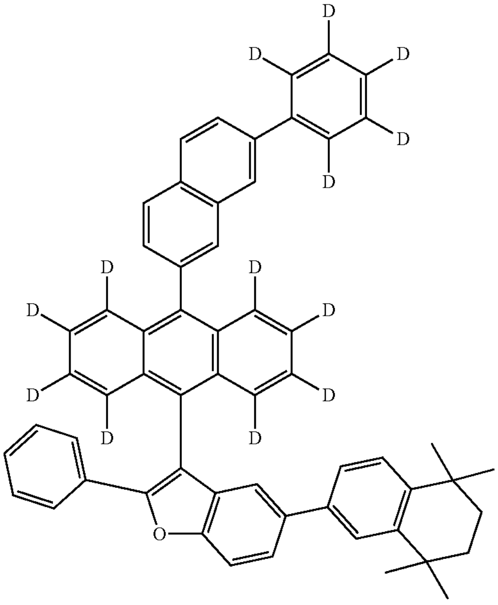
-continued
A-100
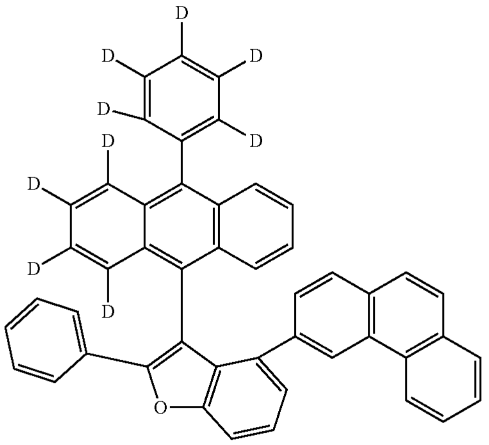
A-101
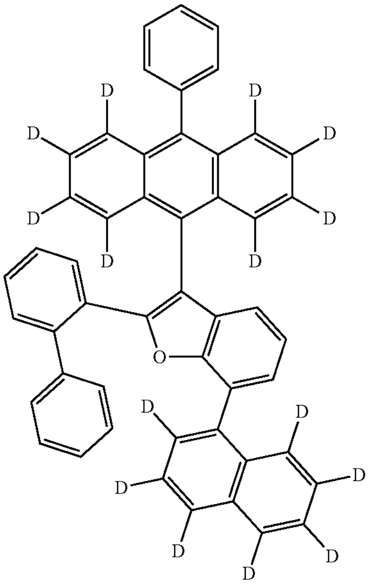
A-102
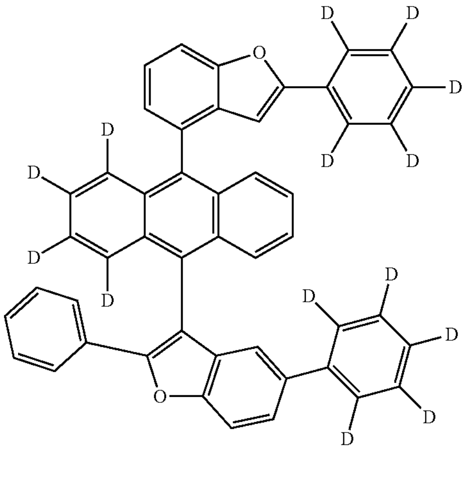

-continued
A-103
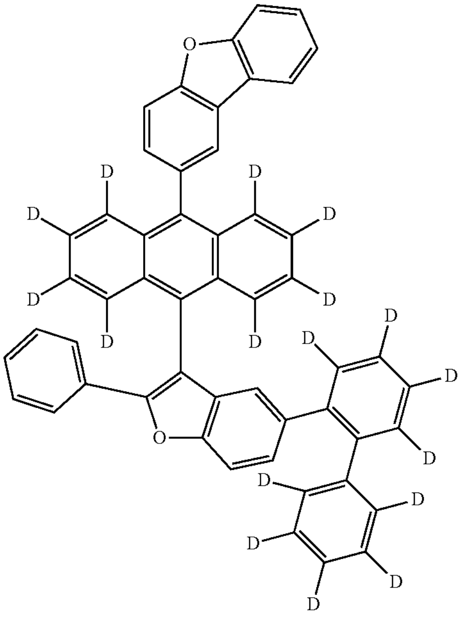
A-104
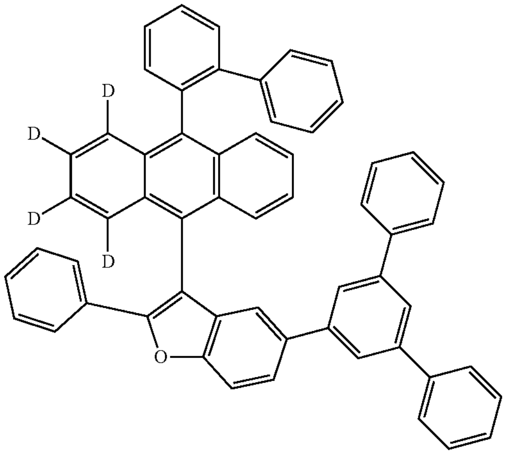
-continued
A-105
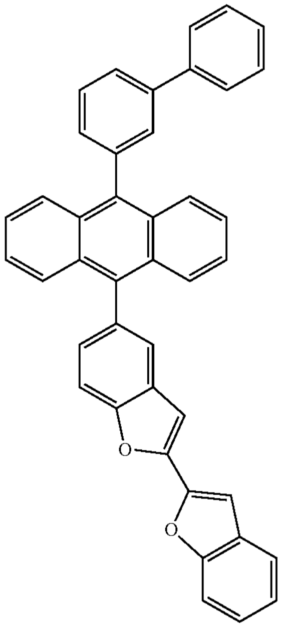
A-106
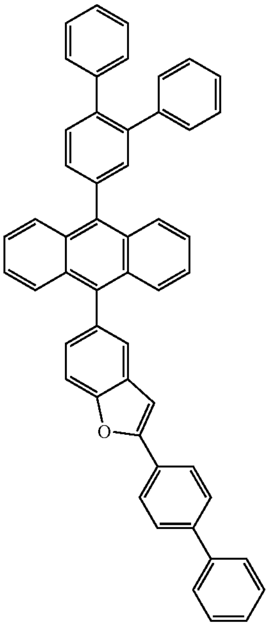

-continued
A-107
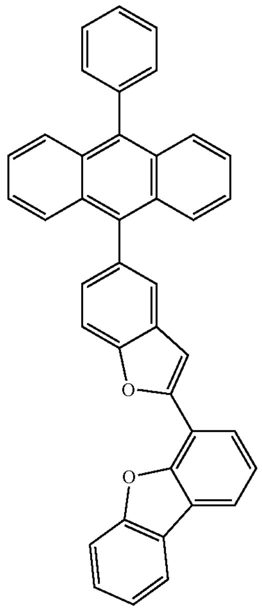
A-108
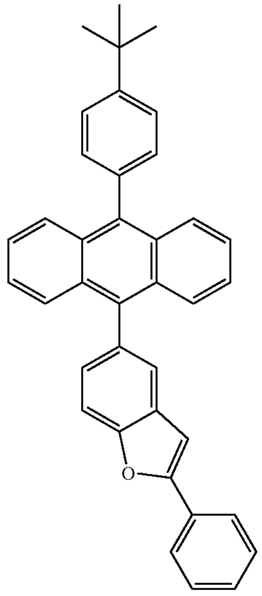
-continued
A-109
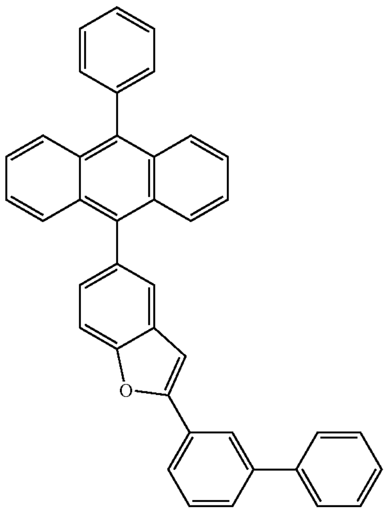
A-110
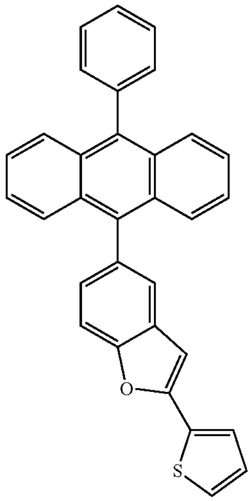
A-111
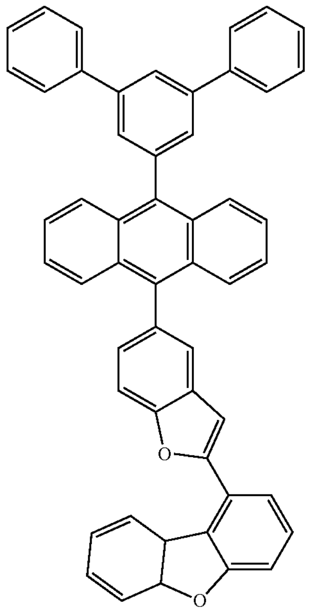

-continued
A-112
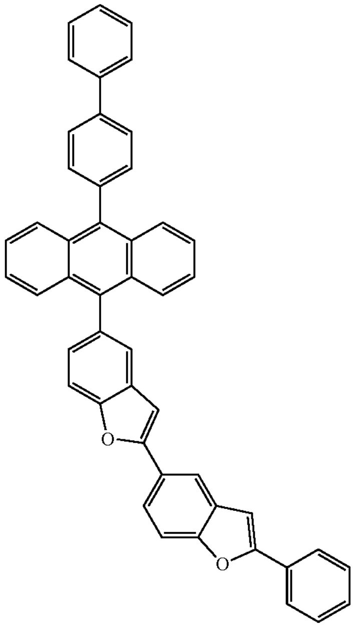
A-113
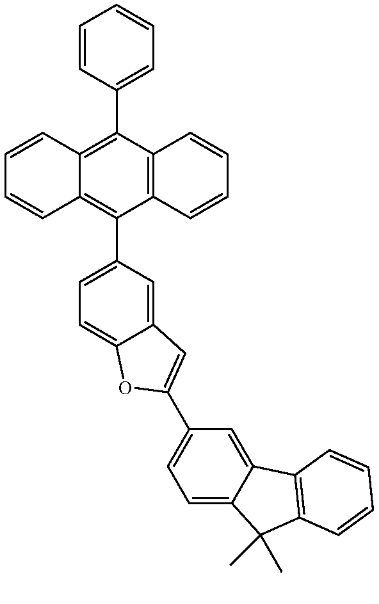
-continued
A-114
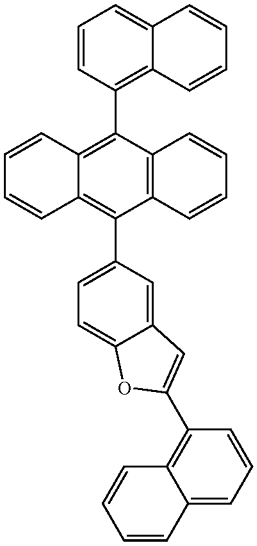
A-115
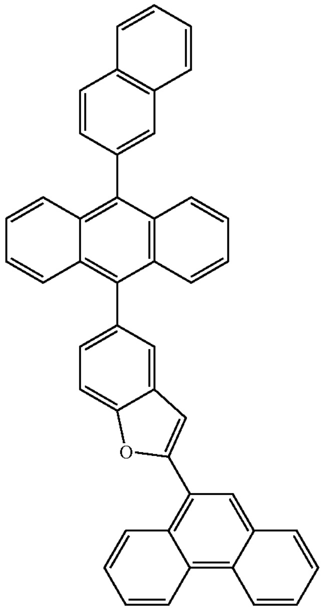
A-116
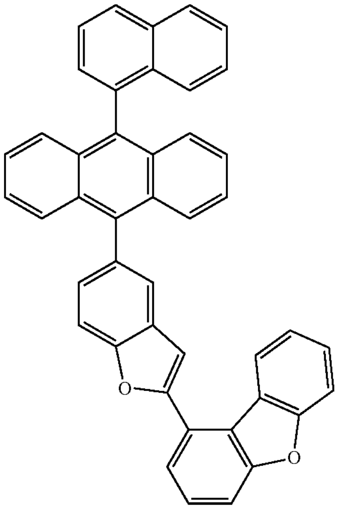

-continued
A-117
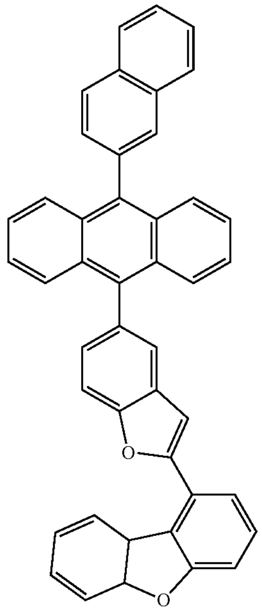
A-118
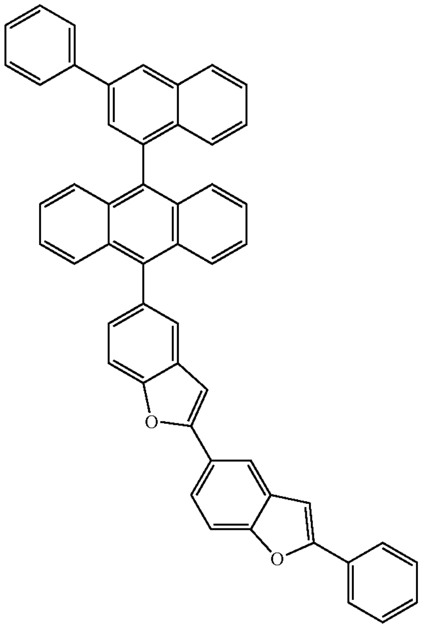
A-119
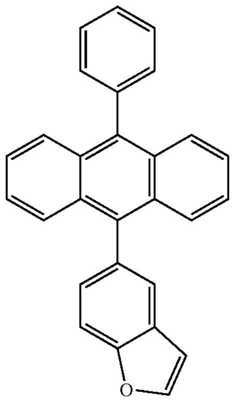
-continued
A-120
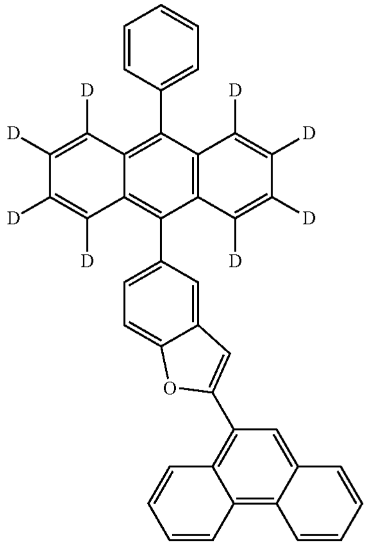
A-121
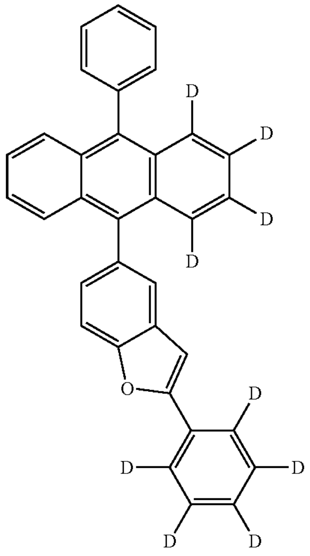

-continued
A-122
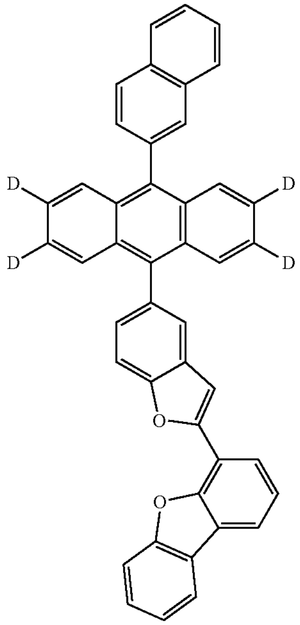
A-123
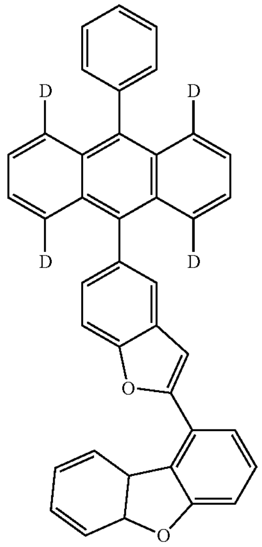
-continued
A-124
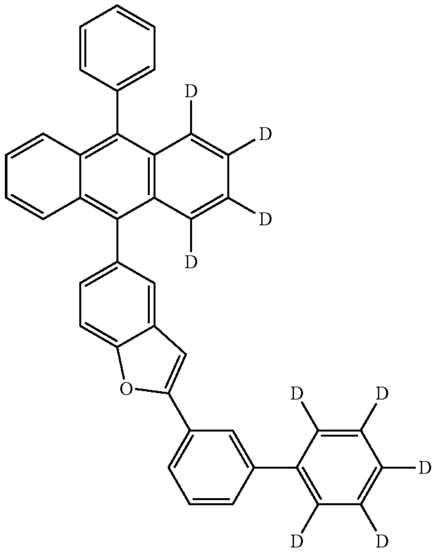
A-125
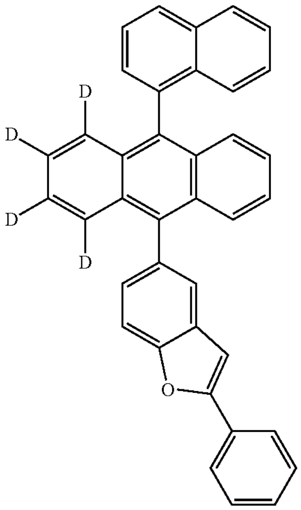
A-126
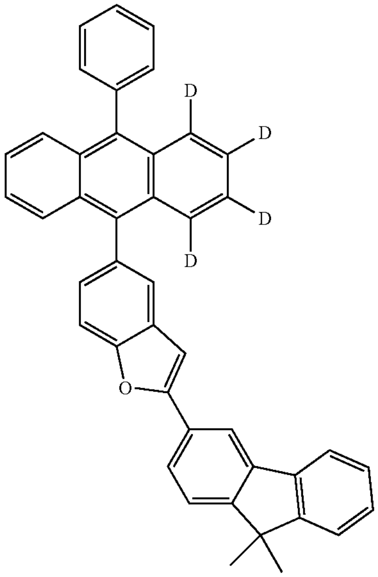

-continued
A-127
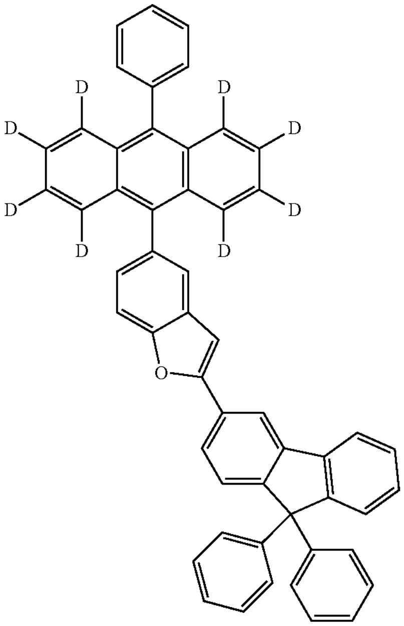
A-128
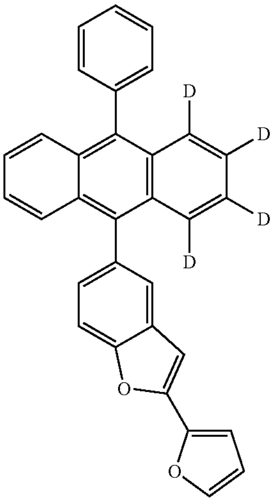
-continued
A-129
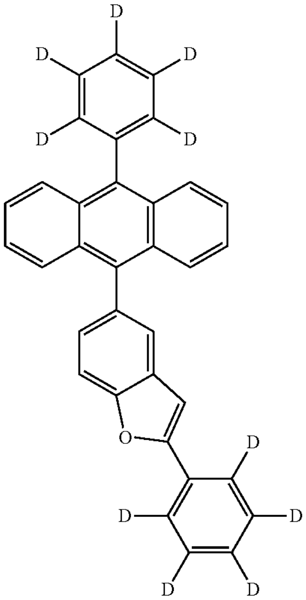
A-130
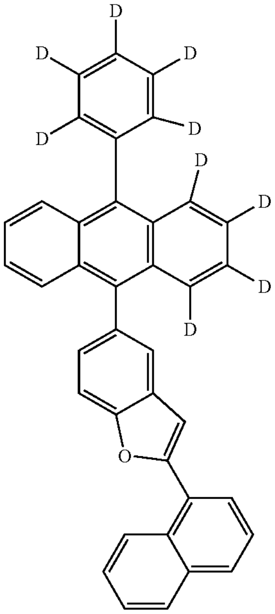

-continued
A-131
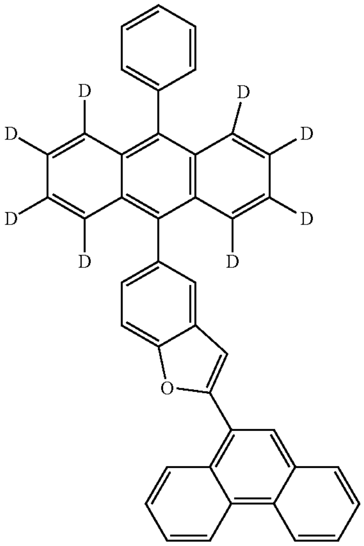
A-132
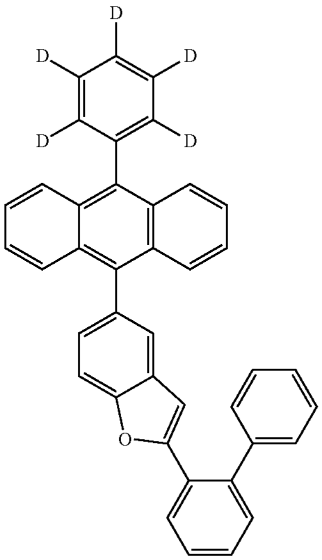
-continued
A-133
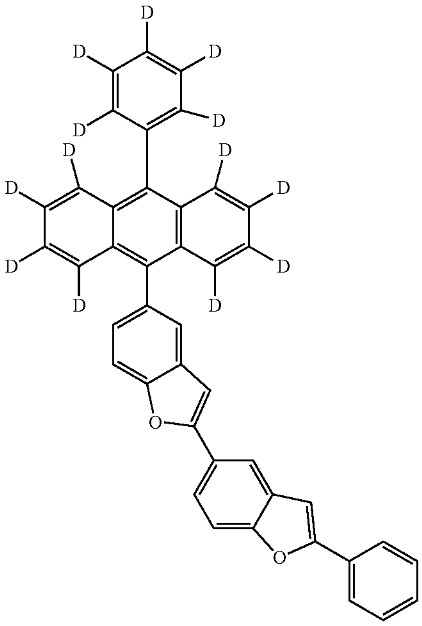
A-134
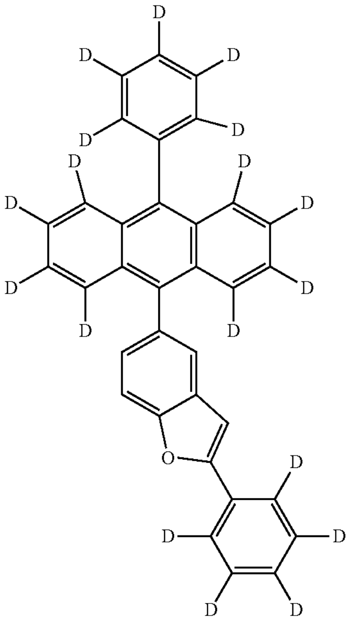

-continued
A-135
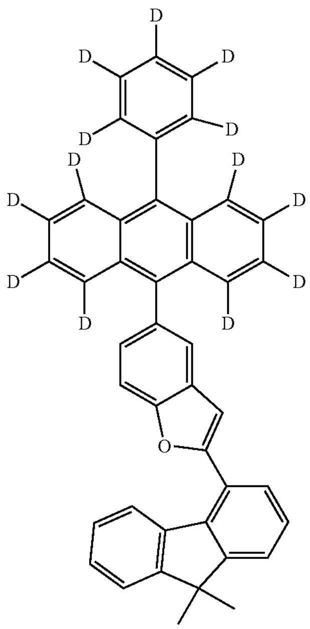
A-136
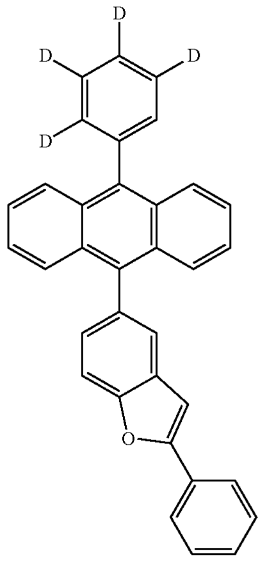
-continued
A-137
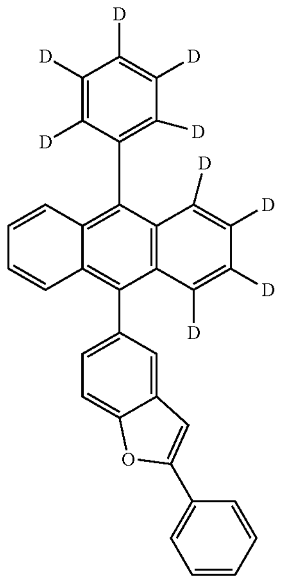
A-138
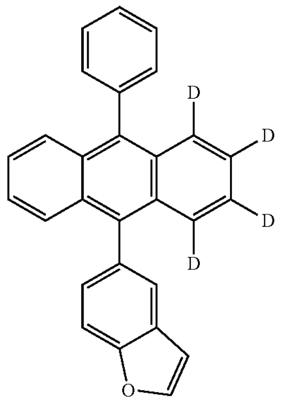
A-139
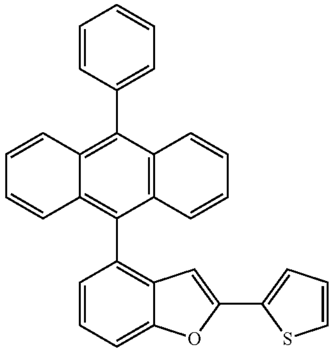

-continued
A-140
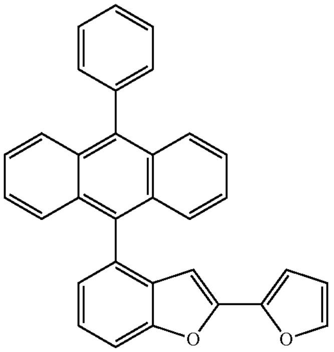
A-141
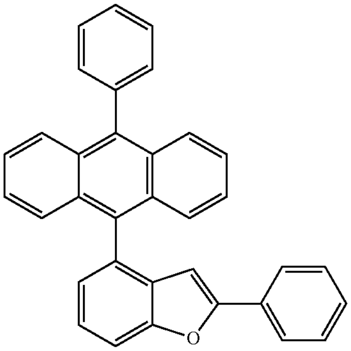
A-142
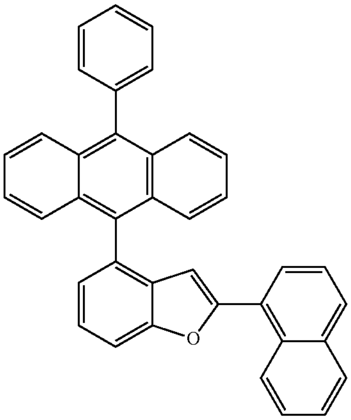
A-143
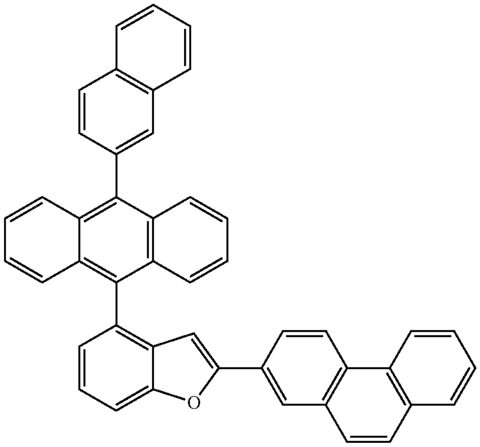
-continued
A-144
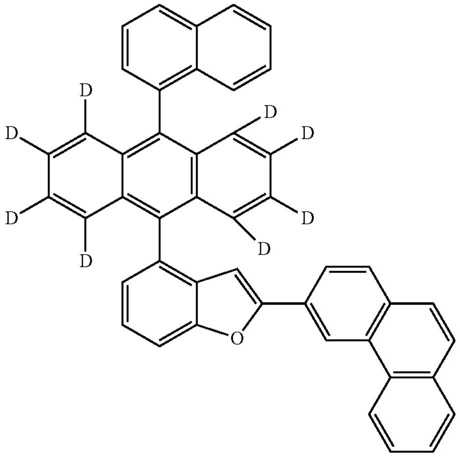
A-145
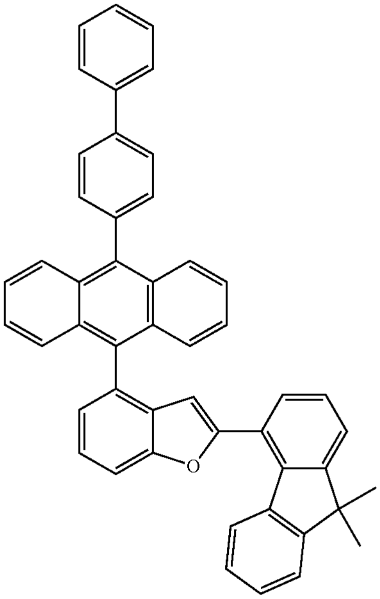
A-146
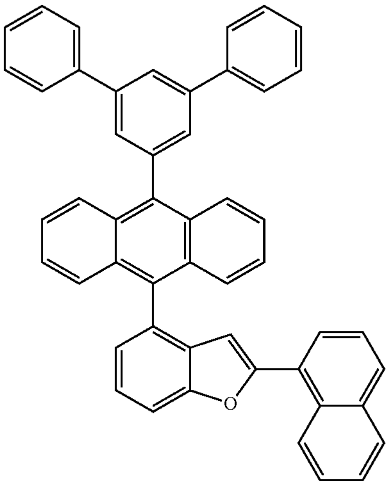

-continued
A-147
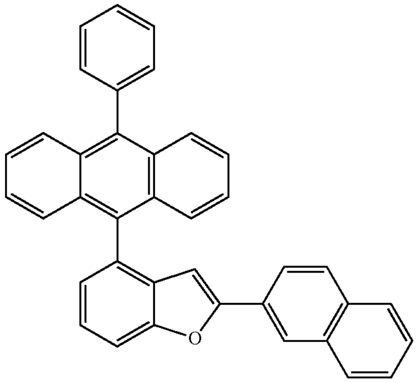
A-148
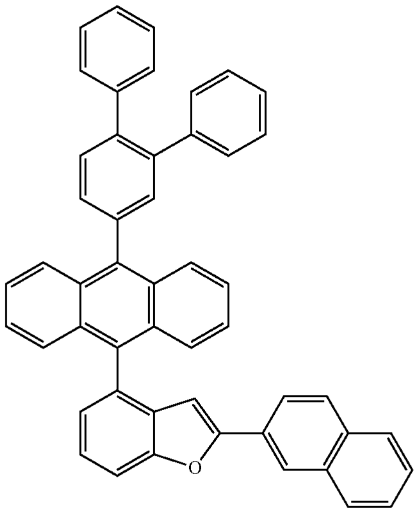
A-149
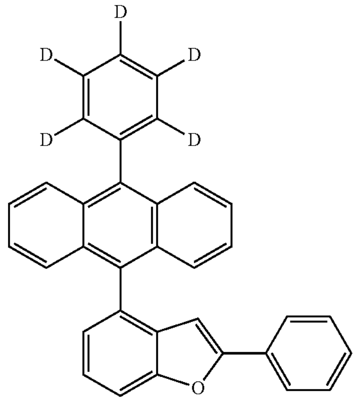
-continued
A-150
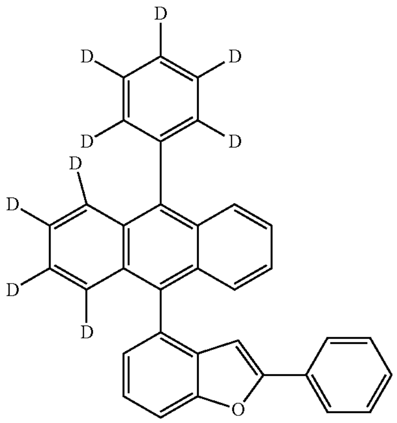
A-151
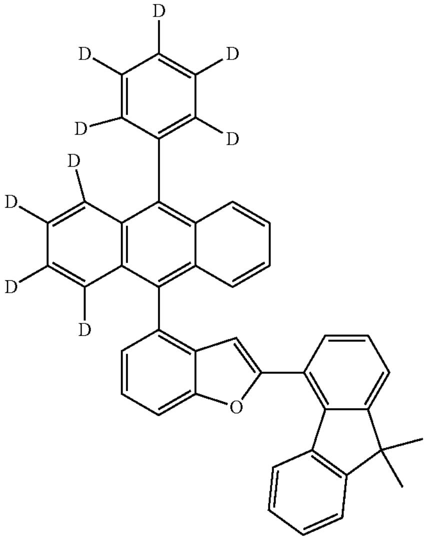
A-152
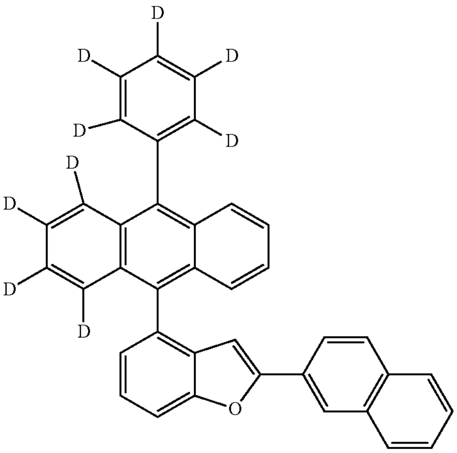

-continued
A-153
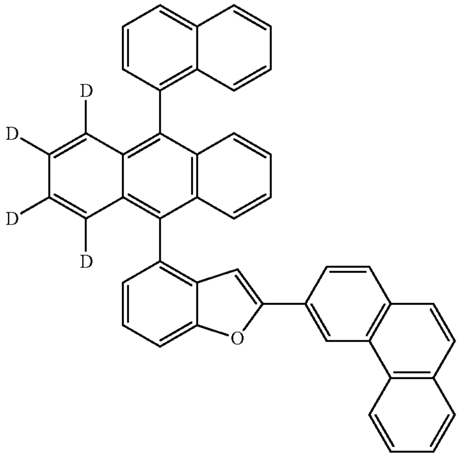
A-154
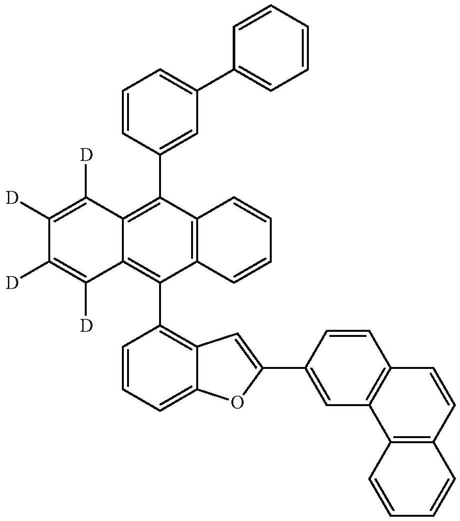
A-155
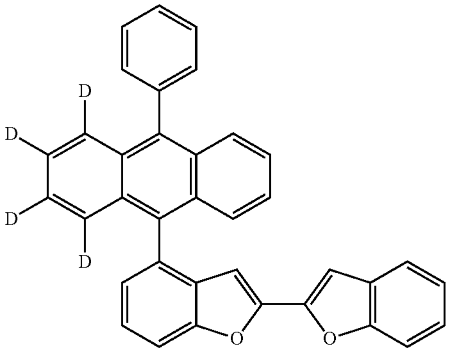
-continued
A-156
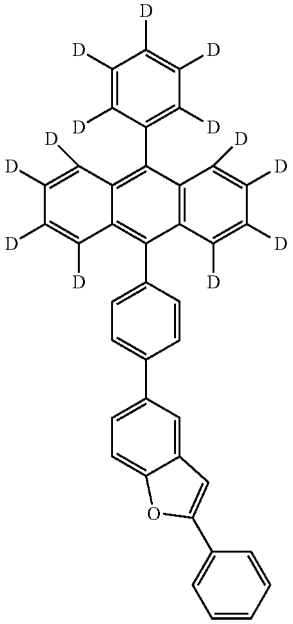
A-157
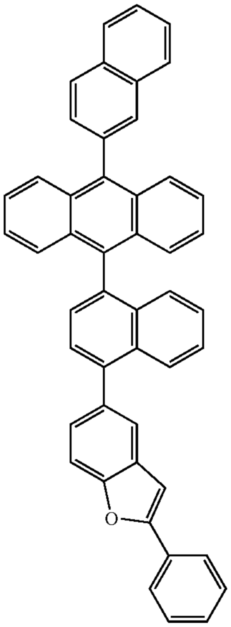

A-158
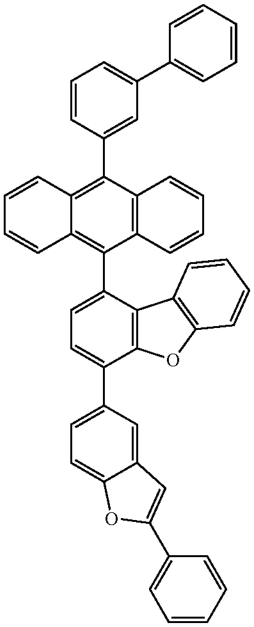
A-159
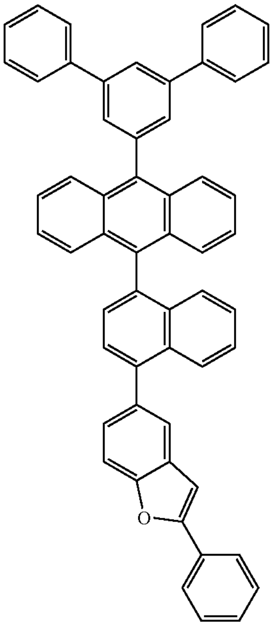
A-160
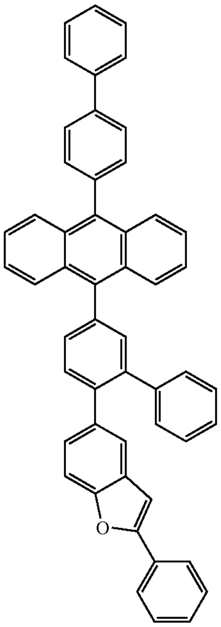
A-161
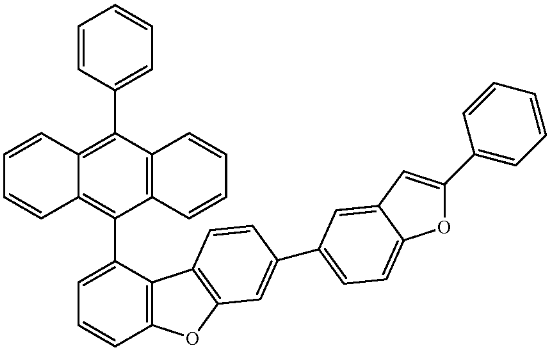
A-162
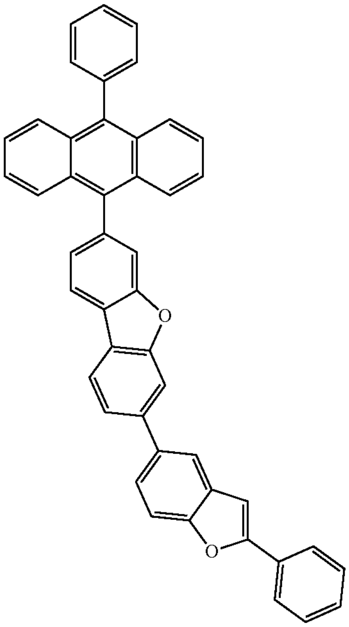

-continued
A-163
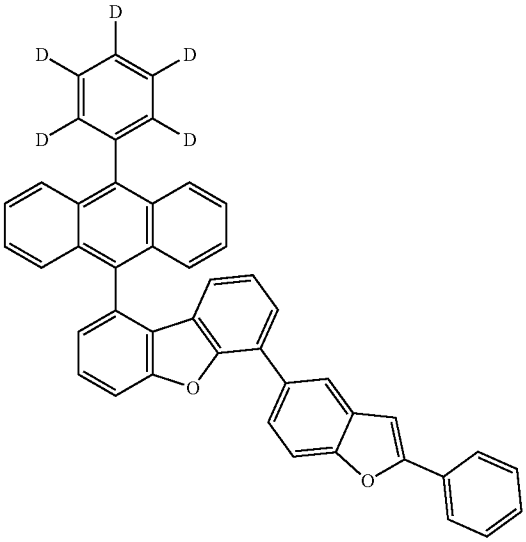
A-164
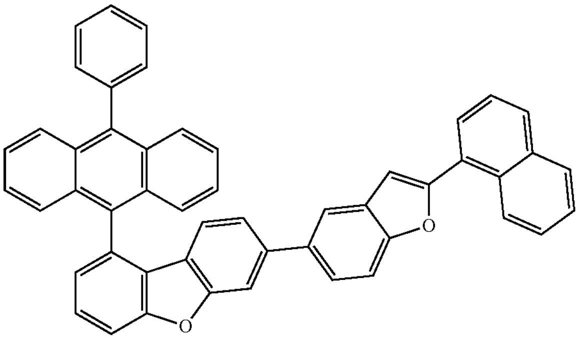
A-165
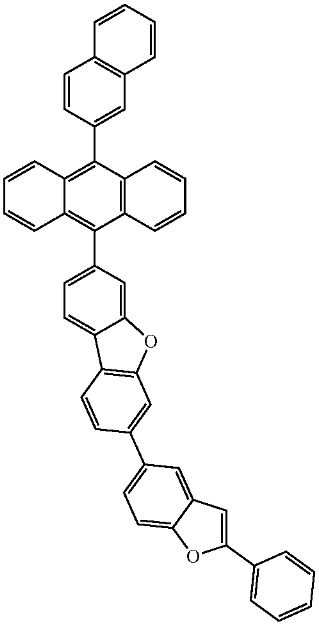
-continued
A-166
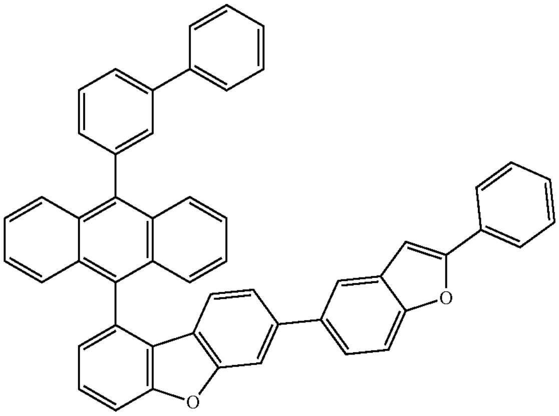
A-167
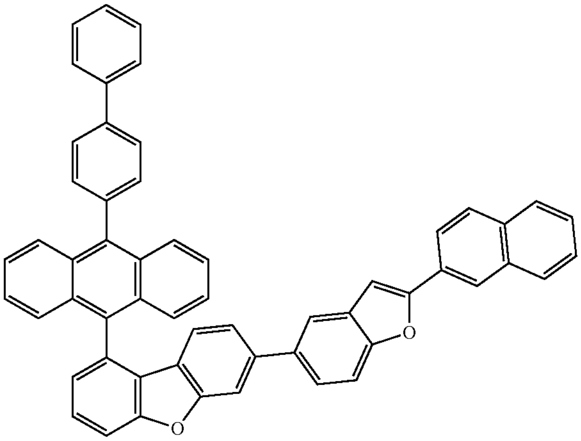
A-168
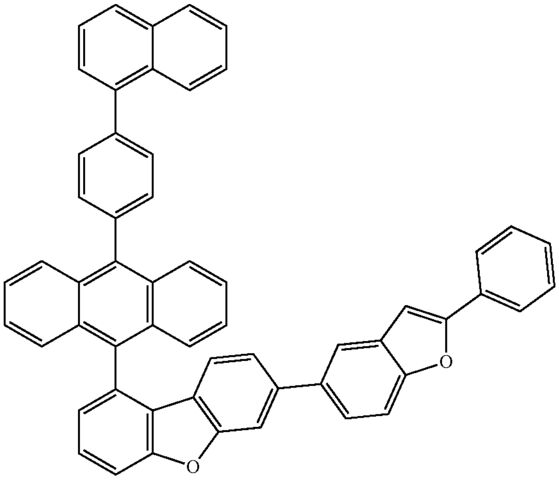

A-169
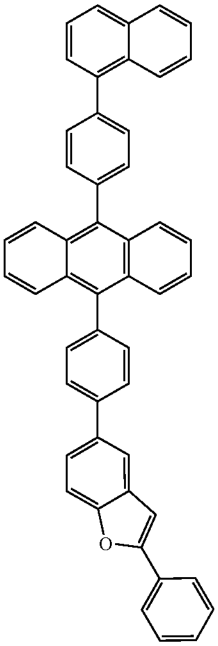
A-170
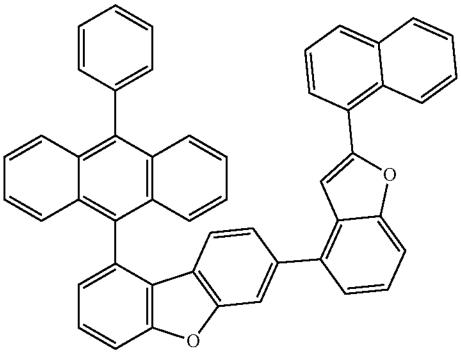
A-171
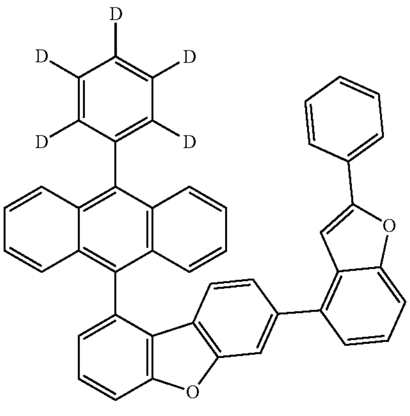
-continued
A-172
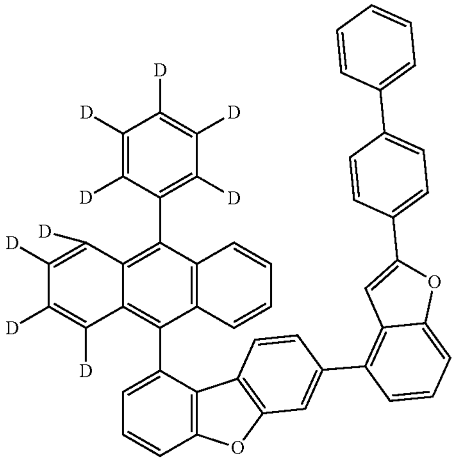
A-173
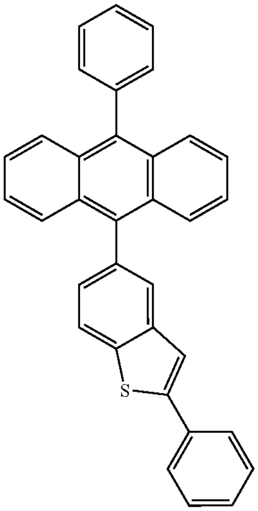
A-174
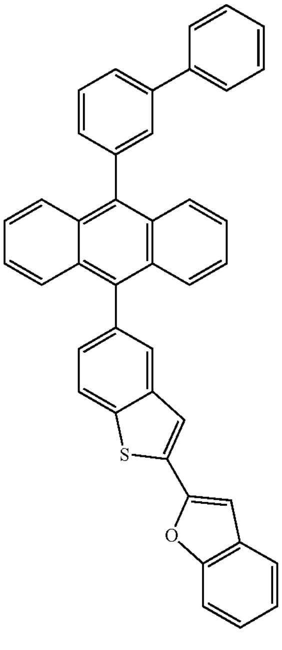

-continued
A-175
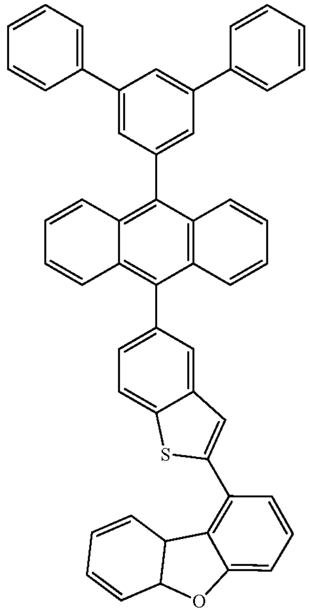
A-176
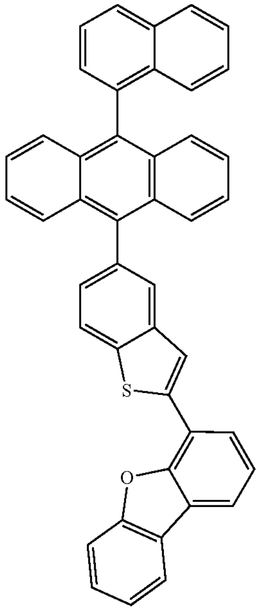
-continued
A-177
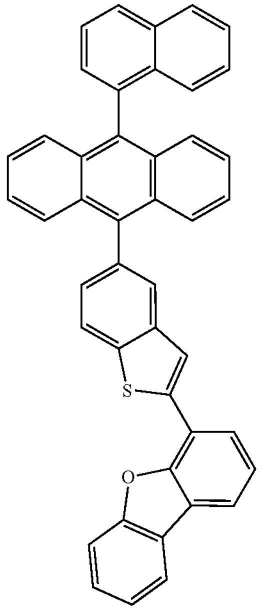
A-178
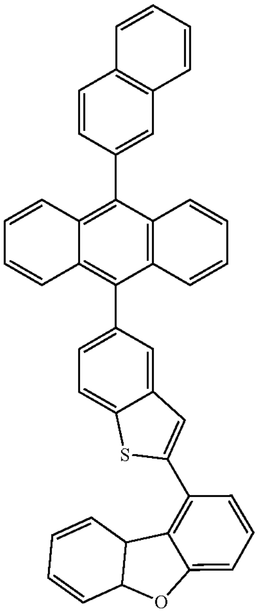

-continued
A-179
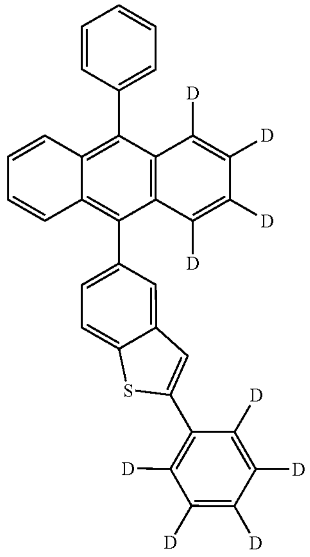
A-180
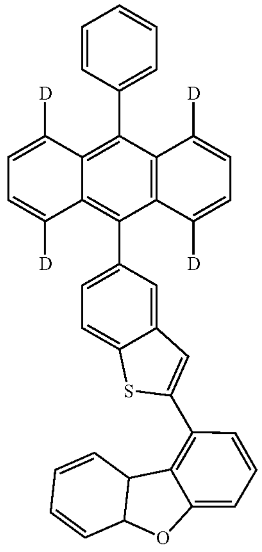
A-181
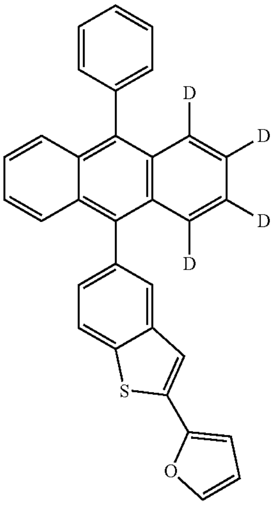
-continued
A-182
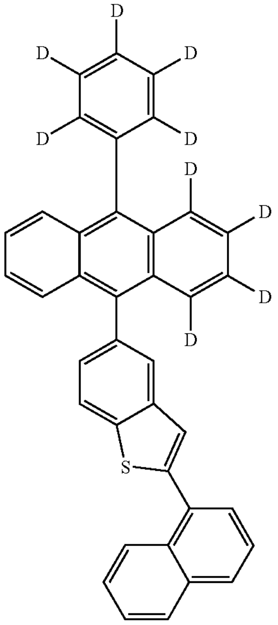
A-183
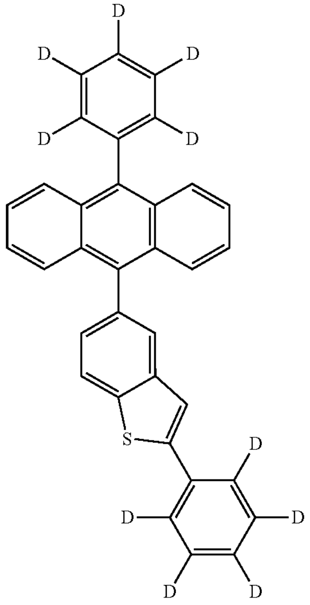

A-184
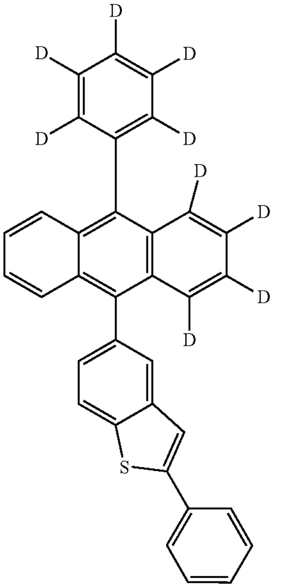
A-185
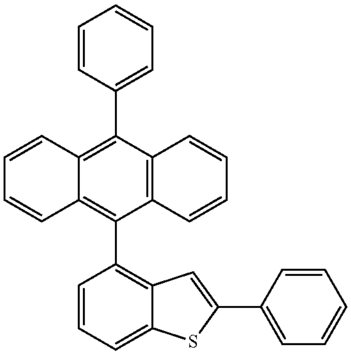
A-186
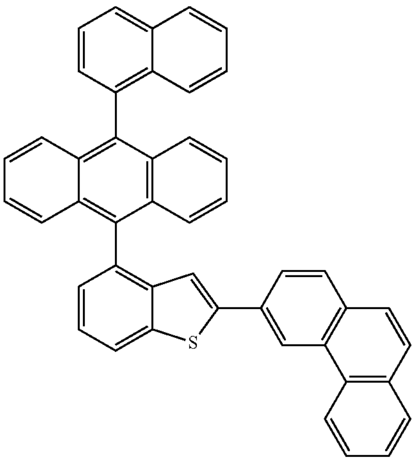
A-187
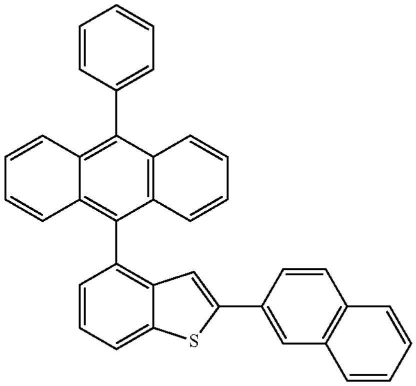
A-188
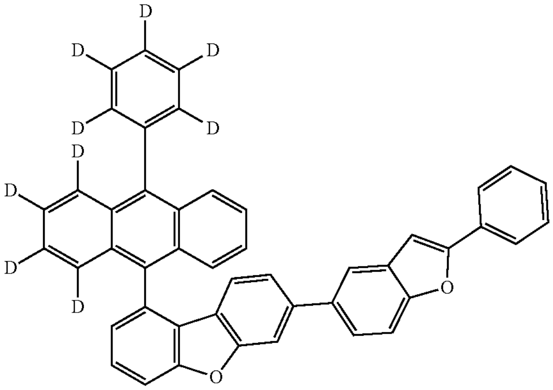
A-189
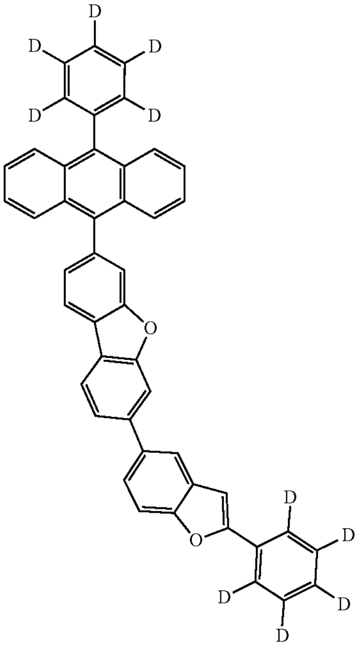

-continued
A-190
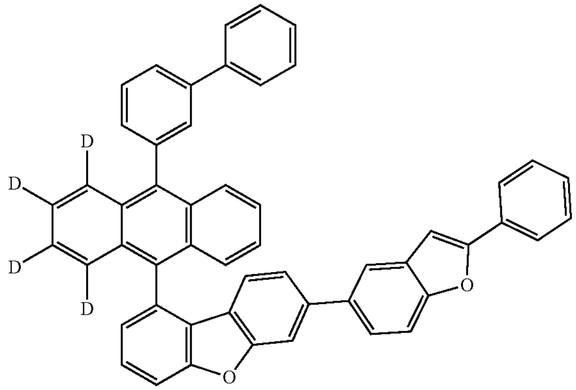
A-191
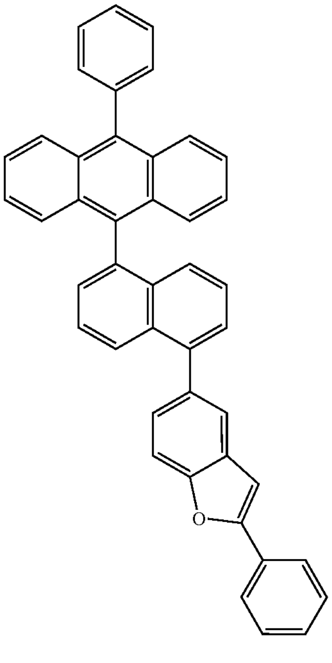
-continued
A-192
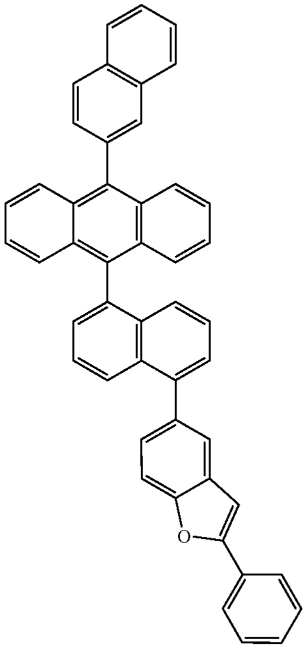
A-193
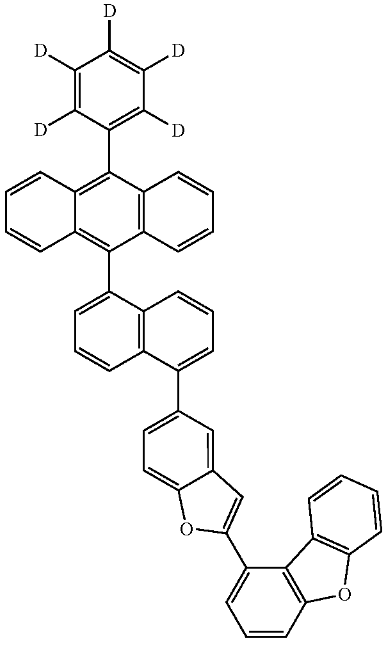

-continued
A-194
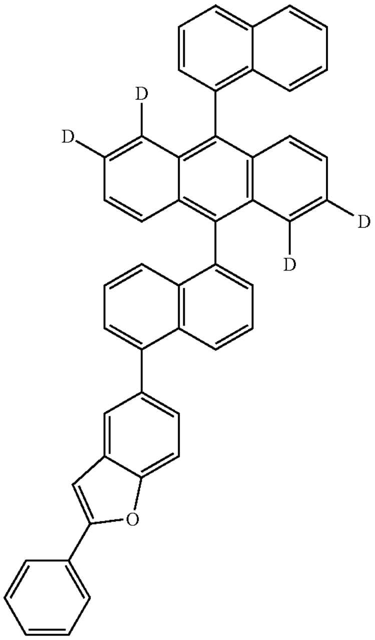
A-195
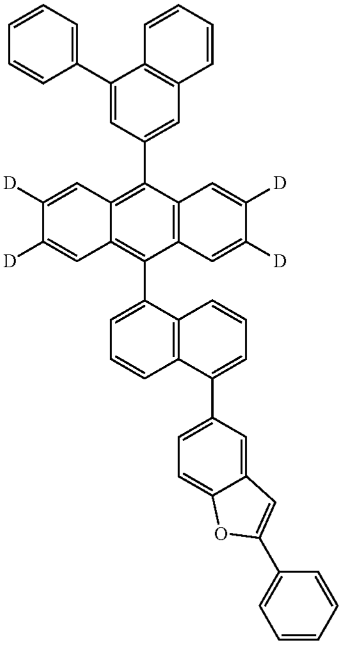
-continued
A-196
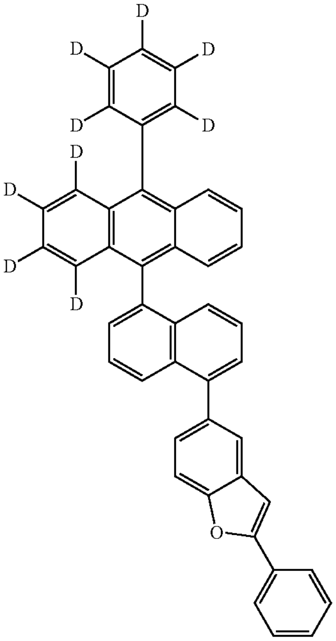
A-197
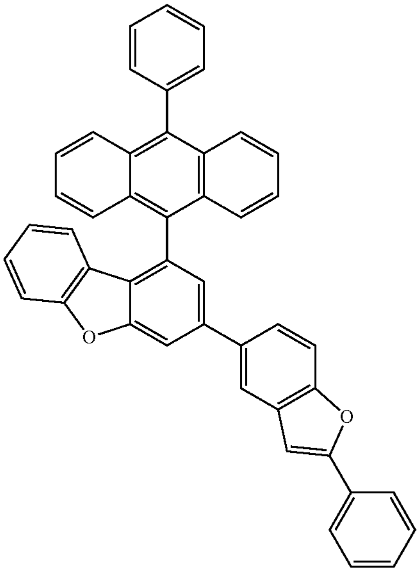

-continued
A-198
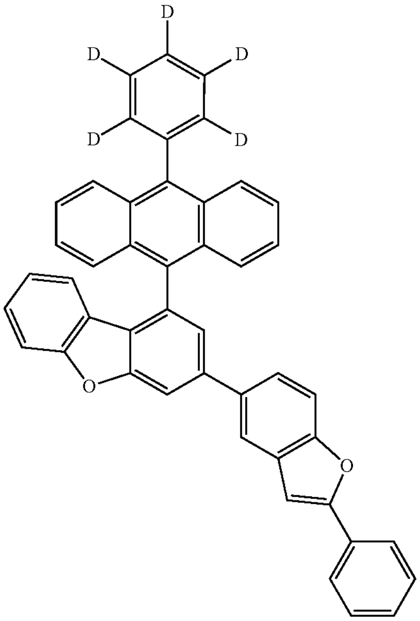
A-199
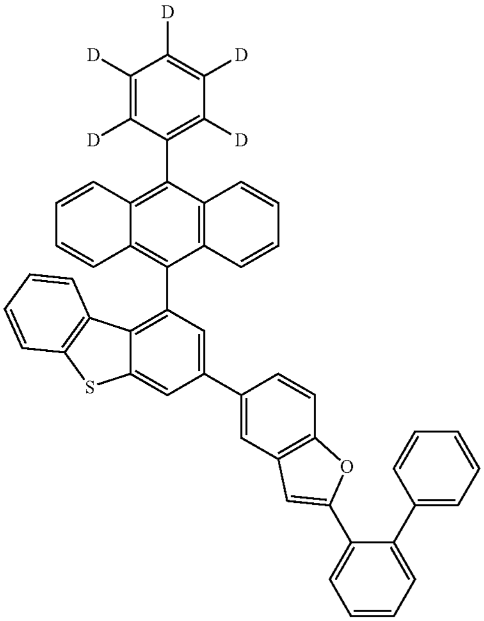
-continued
A-200
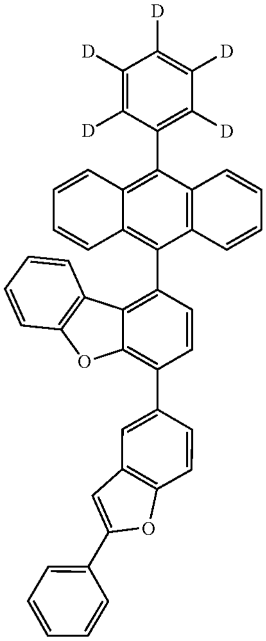
A-201
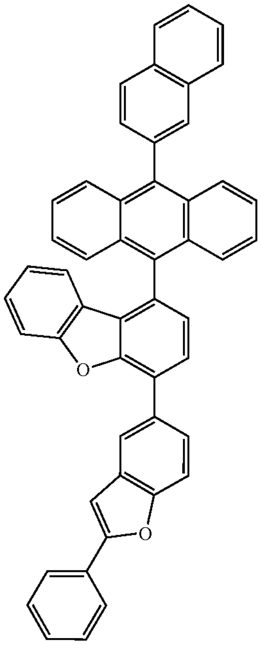

-continued
A-202
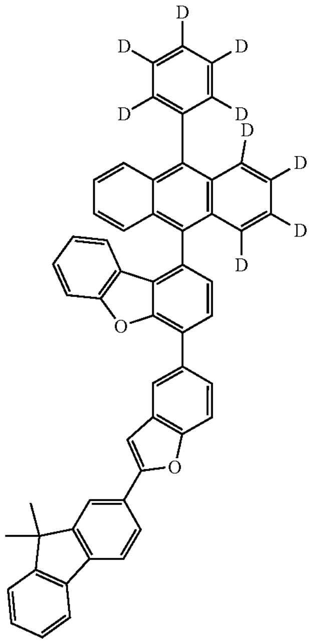
A-203
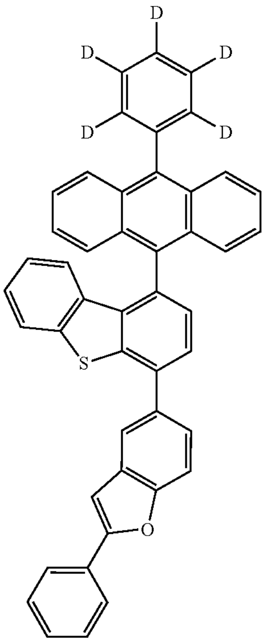
-continued
A-204
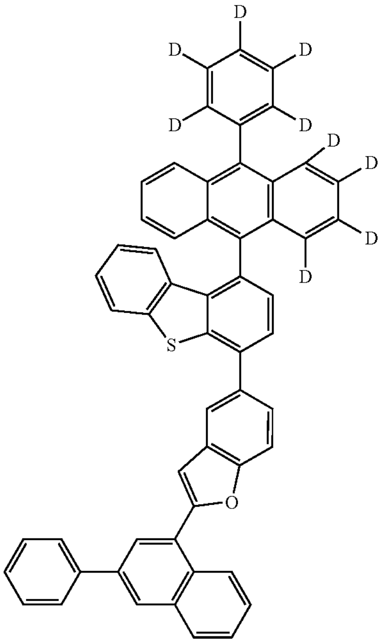
A-205
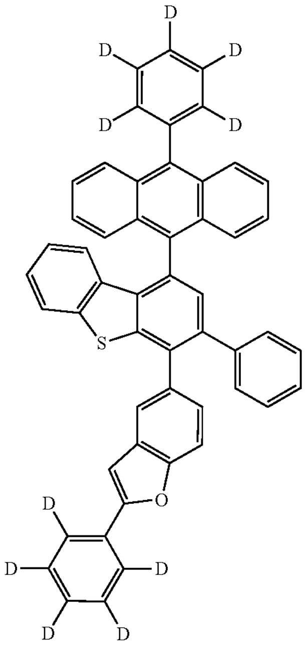

-continued
A-206
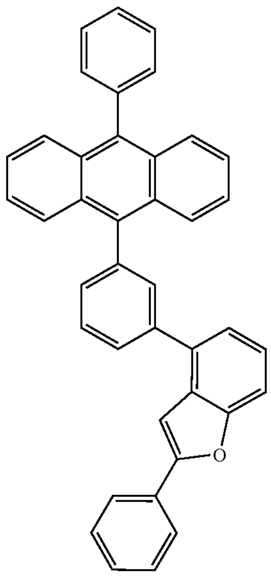
A-207
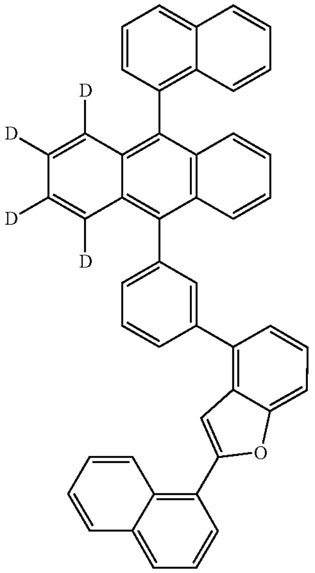
-continued
A-208
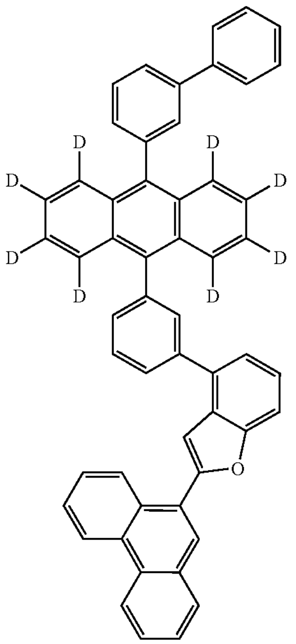
A-209
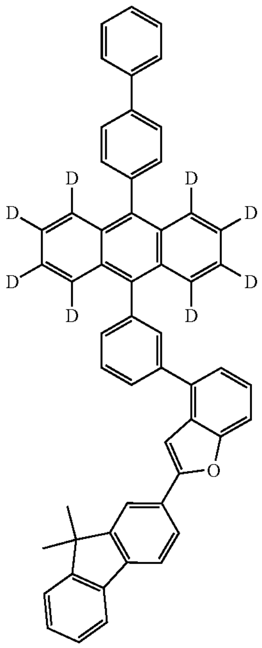

-continued
A-210
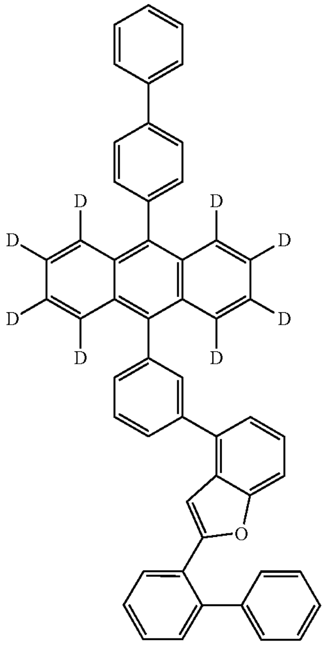
A-211
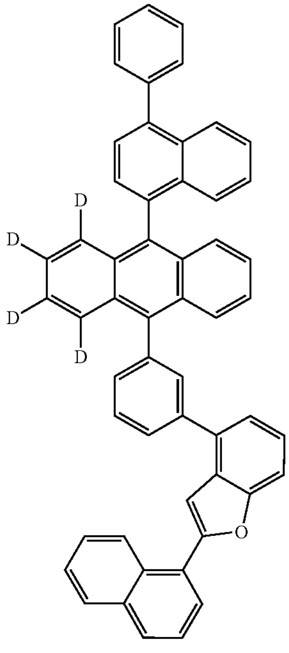
-continued
A-212
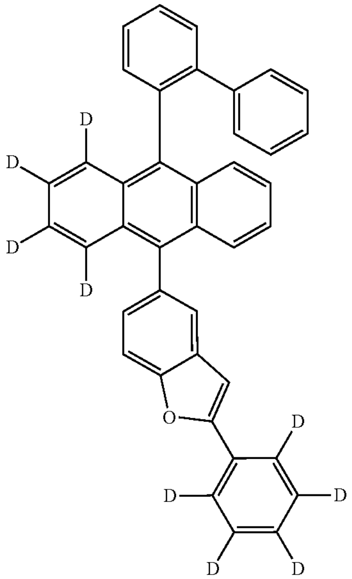
A-213
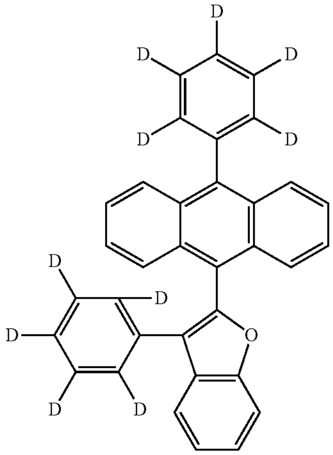
A-214
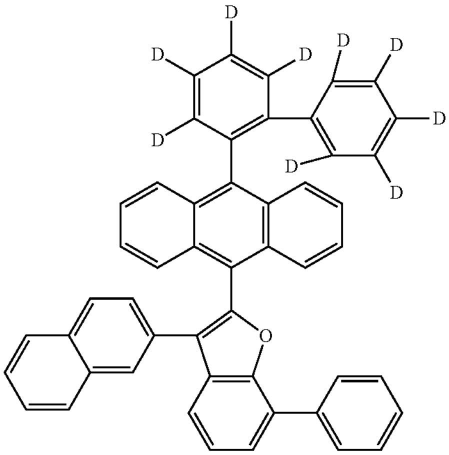

-continued
A-215
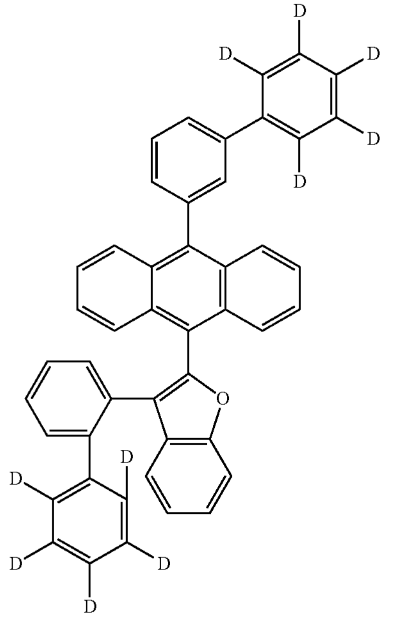
A-216
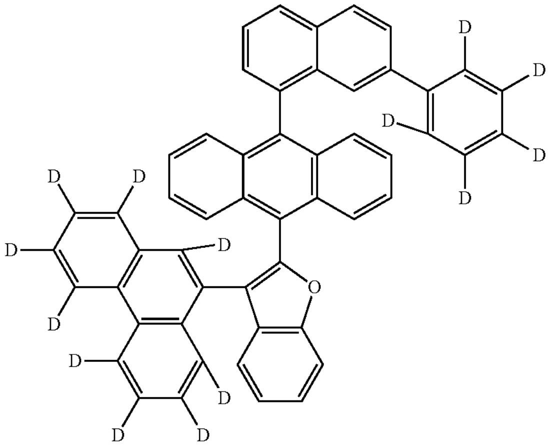
-continued
A-217
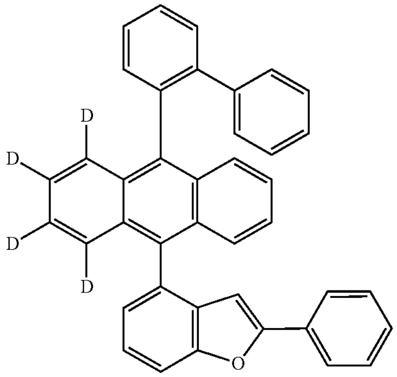
A-218
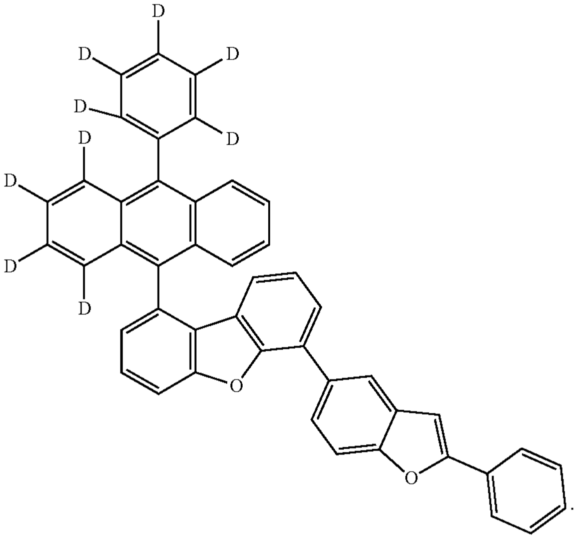
* * * * *